US010822363B2

(12) United States Patent
Li et al.

(10) Patent No.: US 10,822,363 B2
(45) Date of Patent: Nov. 3, 2020

(54) NARROW BAND RED PHOSPHORESCENT TETRADENTATE PLATINUM (II) COMPLEXES

(71) Applicants: Jian Li, Scottsdale, AZ (US); Qunbo Mei, Scottsdale, AZ (US)

(72) Inventors: Jian Li, Tempe, AZ (US); Qunbo Mei, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/341,514

(22) PCT Filed: Oct. 12, 2017

(86) PCT No.: PCT/US2017/056380

§ 371 (c)(1),
(2) Date: Apr. 12, 2019

(87) PCT Pub. No.: WO2018/071697

PCT Pub. Date: Apr. 19, 2018

(65) Prior Publication Data

US 2019/0367546 A1 Dec. 5, 2019

Related U.S. Application Data

(60) Provisional application No. 62/407,020, filed on Oct. 12, 2016.

(51) Int. Cl.
*C09K 11/06* (2006.01)
*H01L 51/00* (2006.01)
(Continued)

(52) U.S. Cl.
CPC .......... *C07F 15/0086* (2013.01); *C09K 11/06* (2013.01); *H01L 51/0087* (2013.01); *H01L 51/5016* (2013.01); *C09K 2211/185* (2013.01)

(58) Field of Classification Search
CPC ....... H01L 51/00; H01L 51/50; C07F 15/0086
(Continued)

(56) References Cited

U.S. PATENT DOCUMENTS

| | | |
|---|---|---|
| 4,769,292 A | 9/1988 | Tang |
| 5,451,674 A | 9/1995 | Silver |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

U.S. Appl. No. 16/668,010; Filed Oct. 30, 2019, has not yet published. Inventor: Li et al.

U.S. Appl. No. 16/739,480 Filed Jan. 10, 2020, has not yet published. Inventors: Li et al.

U.S. Appl. No. 16/751,561; Filed Jan. 24, 2020, has not yet published. Inventor: Li.

U.S. Appl. No. 16/751,586; Filed on Jan. 24, 2020, has not yet published. Inventor: Li et al.

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <D01:10.1063/1.1306639>.

Ayan Maity et al., "Room-temperature synthesis of cyclometalated iridium(III) complexes; kinetic isomers and reactive functionalities" Chem. Sci., vol. 4, pp. 1175-1181 (2013).

(Continued)

*Primary Examiner* — Niloofar Rahmani
(74) *Attorney, Agent, or Firm* — Riverside Law LLP

(57) ABSTRACT

A complex represented by Formula I:

Formula I

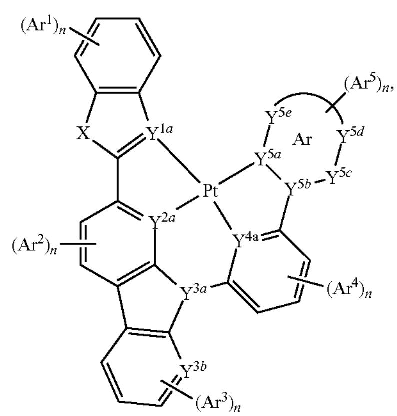

wherein:

each $Ar^1$, $Ar^2$, $Ar^3$, $Ar^4$, and $Ar^5$ present independently represents a substituted or unsubstituted aryl or heterocyclic aryl;

each n is independently an integer of 0 to 4, as limited by valence;

X represents O, S, $NR^{1a}$, $SiR^{1b}R^{1c}$, or $CR^{1d}R^{1e}$, where each of $R^{1a}$, $R^{1b}$, $R^{1c}$, $R^{1d}$, and $R^{1e}$ independently represents substituted or unsubstituted $C_1$-$C_4$ alkyl;

$Y^{1a}$, $Y^{2a}$, $Y^{3b}$, and $Y^{4a}$ each independently represents N or C;

$Y^{3a}$ represents N, $CR^{2a}$, or $SiR^{2b}$, where $R^{2a}$ and $R^{2b}$ represent hydrogen or substituted or unsubstituted $C_1$-$C_4$ alkyl, aryl, or heterocyclic aryl;

$Y^{5a}$ and $Y^{5b}$ each independently represents C or N; and $Y^{5c}$, $Y^{5d}$, and $Y^{5e}$ each independently represents C, N, O, or S.

Light emitting devices for full color displays may include a complex represented by Formula I.

15 Claims, 2 Drawing Sheets

(51) Int. Cl.
*H01L 51/50* (2006.01)
*C07F 15/00* (2006.01)

(58) Field of Classification Search
USPC ........................................................ 546/10
See application file for complete search history.

(56) References Cited

U.S. PATENT DOCUMENTS

| | | | |
|---|---|---|---|
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 7,002,013 | B1 | 2/2006 | Chi |
| 7,037,599 | B2 | 5/2006 | Culligan |
| 7,064,228 | B1 | 6/2006 | Yu |
| 7,268,485 | B2 | 9/2007 | Tyan |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,635,792 | B1 | 12/2009 | Cella |
| 7,655,322 | B2 | 2/2010 | Forrest |
| 7,854,513 | B2 | 12/2010 | Quach |
| 7,947,383 | B2 | 5/2011 | Ise |
| 8,106,199 | B2 | 1/2012 | Jabbour |
| 8,133,597 | B2 | 3/2012 | Yasukawa |
| 8,389,725 | B2 | 3/2013 | Li |
| 8,617,723 | B2 | 12/2013 | Stoessel |
| 8,669,364 | B2 | 3/2014 | Li |
| 8,778,509 | B2 | 7/2014 | Yasukawa |
| 8,816,080 | B2 | 8/2014 | Li |
| 8,846,940 | B2 | 9/2014 | Li |
| 8,871,361 | B2 | 10/2014 | Xia |
| 8,927,713 | B2 | 1/2015 | Li |
| 8,946,417 | B2 | 2/2015 | Li |
| 8,987,451 | B2 | 3/2015 | Tsai |
| 9,059,412 | B2 | 6/2015 | Zeng |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li |
| 9,224,963 | B2 | 12/2015 | Li |
| 9,238,668 | B2 | 1/2016 | Li |
| 9,312,502 | B2 | 4/2016 | Li |
| 9,312,505 | B2 | 4/2016 | Brooks |
| 9,318,725 | B2 | 4/2016 | Li |
| 9,324,957 | B2 | 4/2016 | Li |
| 9,382,273 | B2 | 7/2016 | Li |
| 9,385,329 | B2 | 7/2016 | Li |
| 9,425,415 | B2 | 8/2016 | Li |
| 9,461,254 | B2 | 10/2016 | Tsai |
| 9,493,698 | B2 | 11/2016 | Beers |
| 9,502,671 | B2 | 11/2016 | Li |
| 9,550,801 | B2 | 1/2017 | Li |
| 9,598,449 | B2 | 3/2017 | Li |
| 9,617,291 | B2 | 4/2017 | Li |
| 9,666,822 | B2 | 5/2017 | Forrest |
| 9,673,409 | B2 | 6/2017 | Li |
| 9,698,359 | B2 | 7/2017 | Li |
| 9,711,739 | B2 | 7/2017 | Li |
| 9,711,741 | B2 | 7/2017 | Li |
| 9,711,742 | B2 | 7/2017 | Li |
| 9,735,397 | B2 | 8/2017 | Riegel |
| 9,755,163 | B2 | 9/2017 | Li |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 1,021,141 | A1 | 2/2019 | Li |
| 10,211,414 | B2 | 2/2019 | Li |
| 10,263,197 | B2 | 4/2019 | Li |
| 10,294,417 | B2 | 5/2019 | Li |
| 1,039,238 | A1 | 8/2019 | Li |
| 1,041,120 | A1 | 9/2019 | Li |
| 1,041,478 | A1 | 9/2019 | Li |
| 1,051,611 | A1 | 12/2019 | Li |
| 1,056,655 | A1 | 2/2020 | Li |
| 2001/0019782 | A1 | 9/2001 | Igarashi |
| 2002/0068190 | A1 | 6/2002 | Tsuboyama |
| 2003/0062519 | A1 | 4/2003 | Yamazaki |
| 2003/0186077 | A1 | 10/2003 | Chen |
| 2004/0230061 | A1 | 11/2004 | Se0 Satoshi |
| 2005/0037232 | A1 | 2/2005 | Tyan |
| 2005/0139810 | A1 | 6/2005 | Kuehl |
| 2005/0170207 | A1 | 8/2005 | Ma |
| 2005/0260446 | A1 | 11/2005 | MacKenzie |
| 2006/0024522 | A1 | 2/2006 | Thompson |
| 2006/0032528 | A1 | 2/2006 | Wang |
| 2006/0066228 | A1 | 3/2006 | Antoniadis |
| 2006/0073359 | A1 | 4/2006 | Ise |
| 2006/0094875 | A1 | 5/2006 | Itoh |
| 2006/0127696 | A1 | 6/2006 | Stossel |
| 2006/0182992 | A1 | 8/2006 | Nii |
| 2006/0202197 | A1 | 9/2006 | Nakayama |
| 2006/0210831 | A1 | 9/2006 | Sano |
| 2006/0255721 | A1 | 11/2006 | Igarashi |
| 2006/0263635 | A1 | 11/2006 | Ise |
| 2006/0286406 | A1 | 12/2006 | Igarashi |
| 2007/0057630 | A1 | 3/2007 | Nishita |
| 2007/0059551 | A1 | 3/2007 | Yamazaki |
| 2007/0082284 | A1 | 4/2007 | Stoessel |
| 2007/0103060 | A1 | 5/2007 | Itoh |
| 2007/0160905 | A1 | 7/2007 | Morishita |
| 2007/0252140 | A1 | 11/2007 | Limmert |
| 2008/0001530 | A1 | 1/2008 | Ise |
| 2008/0036373 | A1 | 2/2008 | Itoh |
| 2008/0054799 | A1 | 3/2008 | Satou |
| 2008/0079358 | A1 | 4/2008 | Satou |
| 2008/0102310 | A1 | 5/2008 | Thompson |
| 2008/0111476 | A1 | 5/2008 | Choi |
| 2008/0241518 | A1 | 10/2008 | Satou |
| 2008/0241589 | A1 | 10/2008 | Fukunaga |
| 2008/0269491 | A1 | 10/2008 | Jabbour |
| 2008/0315187 | A1 | 12/2008 | Bazan |
| 2009/0026936 | A1 | 1/2009 | Satou |
| 2009/0026939 | A1 | 1/2009 | Kinoshita |
| 2009/0032989 | A1 | 2/2009 | Karim |
| 2009/0039768 | A1 | 2/2009 | Igarashi |
| 2009/0079340 | A1 | 3/2009 | Kinoshita |
| 2009/0126796 | A1 | 5/2009 | Yang |
| 2009/0128008 | A1 | 5/2009 | Ise |
| 2009/0136779 | A1 | 5/2009 | Cheng |
| 2009/0153045 | A1 | 6/2009 | Kinoshita |
| 2009/0167167 | A1 | 7/2009 | Aoyama |
| 2009/0205713 | A1 | 8/2009 | Mitra |
| 2009/0218561 | A1 | 9/2009 | Kitamura |
| 2009/0261721 | A1 | 10/2009 | Murakami |
| 2009/0267500 | A1 | 10/2009 | Kinoshita |
| 2010/0000606 | A1 | 1/2010 | Thompson |
| 2010/0013386 | A1 | 1/2010 | Thompson |
| 2010/0043876 | A1 | 2/2010 | Tuttle |
| 2010/0093119 | A1 | 4/2010 | Shimizu |
| 2010/0127246 | A1 | 5/2010 | Nakayama |
| 2010/0141127 | A1 | 6/2010 | Xia |
| 2010/0147386 | A1 | 6/2010 | Benson-Smith |
| 2010/0171111 | A1 | 7/2010 | Takada |
| 2010/0171418 | A1 | 7/2010 | Kinoshita |
| 2010/0200051 | A1 | 8/2010 | Triani |
| 2010/0204467 | A1 | 8/2010 | Lamarque |
| 2010/0270540 | A1 | 10/2010 | Chung |

(56) References Cited

U.S. PATENT DOCUMENTS

2010/0288362 A1 11/2010 Hatwar
2010/0297522 A1 11/2010 Creeth
2010/0307594 A1 12/2010 Zhu
2011/0028723 A1 2/2011 Li
2011/0049496 A1 3/2011 Fukuzaki
2011/0062858 A1 3/2011 Yersin
2011/0132440 A1 6/2011 Sivarajan
2011/0217544 A1 9/2011 Young
2011/0227058 A1 9/2011 Masui
2011/0301351 A1 12/2011 Li
2012/0024383 A1 2/2012 Kaiho
2012/0025588 A1 2/2012 Humbert
2012/0039323 A1 2/2012 Hirano
2012/0095232 A1 4/2012 Li
2012/0108806 A1 5/2012 Li
2012/0146012 A1 6/2012 Limmert
2012/0181528 A1 7/2012 Takada
2012/0199823 A1 8/2012 Molt
2012/0202997 A1 8/2012 Parham
2012/0204960 A1 8/2012 Kato
2012/0215001 A1 8/2012 Li
2012/0223634 A1 9/2012 Xia
2012/0264938 A1 10/2012 Li
2012/0273736 A1 11/2012 James
2012/0302753 A1 11/2012 Li
2013/0048963 A1 2/2013 Beers
2013/0082245 A1 4/2013 Kottas
2013/0137870 A1 5/2013 Li
2013/0168656 A1 7/2013 Tsai
2013/0172561 A1 7/2013 Tsai
2013/0200340 A1 8/2013 Otsu
2013/0203996 A1 8/2013 Li
2013/0237706 A1 9/2013 Li
2013/0341600 A1 12/2013 Lin
2014/0014922 A1 1/2014 Lin
2014/0014931 A1 1/2014 Riegel
2014/0027733 A1 1/2014 Zeng
2014/0042475 A1 2/2014 Park
2014/0066628 A1 3/2014 Li
2014/0073798 A1 3/2014 Li
2014/0084261 A1 3/2014 Brooks
2014/0114072 A1 4/2014 Li
2014/0147996 A1 5/2014 Vogt
2014/0148594 A1 5/2014 Li
2014/0191206 A1 7/2014 Cho
2014/0203248 A1 7/2014 Zhou
2014/0249310 A1 9/2014 Li
2014/0326960 A1 11/2014 Kim
2014/0330019 A1 11/2014 Li
2014/0364605 A1 12/2014 Li
2015/0008419 A1 1/2015 Li
2015/0018558 A1 1/2015 Li
2015/0028323 A1 1/2015 Xia
2015/0060804 A1 3/2015 Kanitz
2015/0069334 A1 3/2015 Xia
2015/0105556 A1 4/2015 Li
2015/0123047 A1 5/2015 Maltenberger
2015/0162552 A1* 6/2015 Li ...................... H01L 51/0087
546/4
2015/0194616 A1 7/2015 Li
2015/0207086 A1 7/2015 Li
2015/0228914 A1 8/2015 Li
2015/0274762 A1 10/2015 Li
2015/0287938 A1 10/2015 Li
2015/0311456 A1 10/2015 Li
2015/0318500 A1 11/2015 Li
2015/0349279 A1 12/2015 Li
2015/0380666 A1 12/2015 Szigethy
2016/0028028 A1 1/2016 Li
2016/0028029 A1 1/2016 Li
2016/0043331 A1 2/2016 Li
2016/0072082 A1 3/2016 Brooks
2016/0133861 A1 5/2016 Li
2016/0133862 A1 5/2016 Li
2016/0181529 A1 6/2016 Tsai
2016/0194344 A1 7/2016 Li
2016/0197285 A1 7/2016 Zeng
2016/0197291 A1 7/2016 Li
2016/0285015 A1 9/2016 Li
2016/0359120 A1 12/2016 Li
2016/0359125 A1 12/2016 Li
2017/0005278 A1 1/2017 Li
2017/0012224 A1 1/2017 Li
2017/0040555 A1 2/2017 Li
2017/0047533 A1 2/2017 Li
2017/0066792 A1 3/2017 Li
2017/0069855 A1 3/2017 Li
2017/0077420 A1 3/2017 Li
2017/0125708 A1 5/2017 Li
2017/0267923 A1 9/2017 Li
2017/0271611 A1 9/2017 Li
2017/0301871 A1 10/2017 Li
2017/0305881 A1 10/2017 Li
2017/0309943 A1 10/2017 Angell
2017/0331056 A1 11/2017 Li
2017/0342098 A1 11/2017 Li
2017/0373260 A1 12/2017 Li
2018/0006246 A1 1/2018 Li
2018/0013096 A1 1/2018 Hamada
2018/0053904 A1 2/2018 Li
2018/0130960 A1 5/2018 Li
2018/0138428 A1 5/2018 Li
2018/0148464 A1 5/2018 Li
2018/0159051 A1 6/2018 Li
2018/0166655 A1 6/2018 Li
2018/0175329 A1 6/2018 Li
2018/0194790 A1 7/2018 Li
2018/0219161 A1 8/2018 Li
2018/0226592 A1 8/2018 Li
2018/0226593 A1 8/2018 Li
2018/0277777 A1 9/2018 Li
2018/0301641 A1 10/2018 Li
2018/0312750 A1 11/2018 Li
2018/0331307 A1 11/2018 Li
2018/0334459 A1 11/2018 Li
2018/0337345 A1 11/2018 Li
2018/0337349 A1 11/2018 Li
2018/0337350 A1 11/2018 Li
2019/0013485 A1 1/2019 Li
2019/0067602 A1 2/2019 Li
2019/0109288 A1 4/2019 Li
2019/0119312 A1 4/2019 Chen
2019/0194536 A1 6/2019 Li
2019/0259963 A1 8/2019 Li
2019/0276485 A1 9/2019 Li
2019/0312217 A1 10/2019 Li
2019/0367546 A1 12/2019 Li
2019/0389893 A1 12/2019 Li
2020/0006678 A1 1/2020 Li
2020/0071330 A1 3/2020 Li
2020/0075868 A1 3/2020 Li
2020/0119288 A1 4/2020 Li
2020/0119289 A1 4/2020 Lin
2020/0140471 A1 5/2020 Chen
2020/0152891 A1 5/2020 Li

FOREIGN PATENT DOCUMENTS

CN 1894267 1/2007
CN 1894269 A 1/2007
CN 101142223 A 3/2008
CN 101667626 3/2010
CN 102449108 A 5/2012
CN 102892860 A 1/2013
CN 102971396 A 3/2013
CN 103102372 5/2013
CN 104232076 A 12/2014
CN 104377231 2/2015
CN 104576934 4/2015
CN 104693243 A 6/2015
CN 105367605 A 3/2016
CN 105418591 A 3/2016
CN 106783922 5/2017
EP 1617493 1/2006

(56) References Cited

FOREIGN PATENT DOCUMENTS

| | | | |
|---|---|---|---|
| EP | 1808052 | A1 | 7/2007 |
| EP | 1874893 | A1 | 1/2008 |
| EP | 1874894 | A1 | 1/2008 |
| EP | 1919928 | A1 | 5/2008 |
| EP | 1968131 | | 9/2008 |
| EP | 2020694 | | 2/2009 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2684932 | | 1/2014 |
| EP | 2711999 | A2 | 3/2014 |
| EP | 3032293 | | 6/2016 |
| JP | 2002010505 | | 1/2002 |
| JP | 2002105055 | | 4/2002 |
| JP | 2003342284 | | 12/2003 |
| JP | 2005031073 | | 2/2005 |
| JP | 2005267557 | | 9/2005 |
| JP | 2005310733 | A | 11/2005 |
| JP | 2006047240 | A | 2/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 200705124362 | | 3/2007 |
| JP | 2007088105 | | 4/2007 |
| JP | 2007088164 | A | 4/2007 |
| JP | 2007096259 | A | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | A | 12/2007 |
| JP | 2008010353 | A | 1/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | A | 7/2008 |
| JP | 2008198801 | A | 8/2008 |
| JP | 2008270729 | A | 11/2008 |
| JP | 2008270736 | | 11/2008 |
| JP | 2008310220 | A | 12/2008 |
| JP | 2009016184 | A | 1/2009 |
| JP | 2009016579 | | 1/2009 |
| JP | 2009032977 | A | 2/2009 |
| JP | 2009032988 | A | 2/2009 |
| JP | 2009059997 | | 3/2009 |
| JP | 2009076509 | | 4/2009 |
| JP | 200916152462 | | 7/2009 |
| JP | 2009247171 | | 10/2009 |
| JP | 2009266943 | A | 11/2009 |
| JP | 2009267171 | A | 11/2009 |
| JP | 2009267244 | A | 11/2009 |
| JP | 2009272339 | A | 11/2009 |
| JP | 2009283891 | A | 12/2009 |
| JP | 2010135689 | A | 6/2010 |
| JP | 201017120562 | | 8/2010 |
| JP | 201107145262 | | 4/2011 |
| JP | 201207989562 | | 4/2012 |
| JP | 201207989862 | | 4/2012 |
| JP | 5604505 | | 9/2012 |
| JP | 2012522843 | | 9/2012 |
| JP | 201220723162 | | 10/2012 |
| JP | 2012222255 | A | 11/2012 |
| JP | 201223113562 | | 11/2012 |
| JP | 201302350062 | | 2/2013 |
| JP | 201304825662 | | 3/2013 |
| JP | 201305314962 | | 3/2013 |
| JP | 2013525436 | | 6/2013 |
| JP | 201401970162 | | 2/2014 |
| JP | 201405850462 | | 4/2014 |
| JP | 2014520096 | | 8/2014 |
| JP | 2012709899 | | 11/2014 |
| JP | 2014221807 | A | 11/2014 |
| JP | 201423922562 | | 12/2014 |
| JP | 2015081257 | A | 4/2015 |
| KR | 20060011537 | | 2/2006 |
| KR | 20060015371 | | 2/2006 |
| KR | 20060115371 | | 11/2006 |
| KR | 20070061830 | | 6/2007 |
| KR | 20070112465 | | 11/2007 |
| KR | 20130043460 | | 4/2013 |
| KR | 101338250 | | 12/2013 |
| KR | 20140052501 | | 5/2014 |
| TW | 200701835 | | 1/2007 |
| TW | 201249851 | | 12/2012 |
| TW | 201307365 | A | 2/2013 |
| TW | 201710277 | | 3/2017 |
| WO | 0070655 | A2 | 11/2000 |
| WO | 2000070655 | | 11/2000 |
| WO | 2004003108 | | 1/2004 |
| WO | 2004070655 | | 8/2004 |
| WO | 2004085450 | | 10/2004 |
| WO | 2004108857 | | 12/2004 |
| WO | 2005042444 | A2 | 5/2005 |
| WO | 2005042550 | A1 | 5/2005 |
| WO | 2005113704 | | 12/2005 |
| WO | 2006033440 | A1 | 3/2006 |
| WO | 2006067074 | | 6/2006 |
| WO | 2006081780 | | 8/2006 |
| WO | 2006098505 | A1 | 9/2006 |
| WO | 2006113106 | | 10/2006 |
| WO | 2006115299 | A1 | 11/2006 |
| WO | 2006115301 | | 11/2006 |
| WO | 2007034985 | A1 | 3/2007 |
| WO | 2007069498 | A1 | 6/2007 |
| WO | 2008054578 | | 5/2008 |
| WO | 2008066192 | A1 | 6/2008 |
| WO | 2008066195 | A1 | 6/2008 |
| WO | 2008066196 | A1 | 6/2008 |
| WO | 2008101842 | A1 | 8/2008 |
| WO | 2008117889 | | 10/2008 |
| WO | 2008123540 | | 10/2008 |
| WO | 2008131932 | A1 | 11/2008 |
| WO | 2009003455 | | 1/2009 |
| WO | 2009008277 | | 1/2009 |
| WO | 2009011327 | | 1/2009 |
| WO | 2009017211 | A1 | 2/2009 |
| WO | 2009023667 | | 2/2009 |
| WO | 2009086209 | | 7/2009 |
| WO | 2009111299 | | 9/2009 |
| WO | 2010007098 | A1 | 1/2010 |
| WO | 2010056669 | | 5/2010 |
| WO | 2010093176 | | 8/2010 |
| WO | 2010105141 | | 9/2010 |
| WO | 2010118026 | | 10/2010 |
| WO | 2011064335 | A1 | 6/2011 |
| WO | 2011070989 | A1 | 6/2011 |
| WO | 2011089163 | | 7/2011 |
| WO | 2011137429 | | 11/2011 |
| WO | 2011137431 | | 11/2011 |
| WO | 2012074909 | | 6/2012 |
| WO | 2012112853 | | 8/2012 |

(56) References Cited

FOREIGN PATENT DOCUMENTS

| | | | |
|---|---|---|---|
| WO | 2012116231 | | 8/2012 |
| WO | 2012142387 | | 10/2012 |
| WO | 201216248 | A1 | 11/2012 |
| WO | 2012162488 | | 11/2012 |
| WO | 2012163471 | A1 | 12/2012 |
| WO | 2013130483 | | 9/2013 |
| WO | 2014009310 | | 1/2014 |
| WO | 2014016611 | | 1/2014 |
| WO | 2014031977 | | 2/2014 |
| WO | 2014047616 | | 3/2014 |
| WO | 2014109814 | | 7/2014 |
| WO | 2014208271 | | 12/2014 |
| WO | 2015027060 | | 2/2015 |
| WO | 2015131158 | | 9/2015 |
| WO | 2016025921 | | 2/2016 |
| WO | 2016029137 | | 2/2016 |
| WO | 2016029186 | | 2/2016 |
| WO | 2016197019 | | 12/2016 |
| WO | 2017117935 | | 7/2017 |
| WO | 2018071697 | | 4/2018 |
| WO | 2018140765 | | 8/2018 |
| WO | 2019079505 | | 4/2019 |
| WO | 2019079508 | | 4/2019 |
| WO | 2019079509 | | 4/2019 |
| WO | 2019236541 | | 12/2019 |
| WO | 2020018476 | | 1/2020 |

OTHER PUBLICATIONS

Baldo et al., "Highly Efficient Phosphorescent Emission from Organic Electroluminescent Devices," Nature, vol. 395, Sep. 10, 1998, pp. 151-154.

Baldo et al., "Very high-efficiency green organic light-emitting devices based on electrophosphorescence," Appl. Phys. Lett., vol. 75, No. 3, 4-6 (1999).

Baldo et al., "Very high-efficiency green organic light-emitting devices based on electrophosphorescence," Applied Physics Letters, vol. 75, No. 1, Jul. 5, 1999, pp. 4-6.

Baldo et al., Very High-Efficiency Green Organic Light-Emitting Devices Based on Electrophosphorescence, Appl Phys Lett, 75(3):4-6 (1999).

Baldo, M. et al., "Excitonic singlet-triplet ratio in a semiconducting organic thin film", Physical Review B, Nov. 1999, vol. 60, No. 20, pp. 14422-14428 <D01:10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. Spie, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1 - 8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; Dalton Trans., 2010, 39, 180-184. DOI: 10.1039/b908424j (Year: 2010).

Brooks, J. et al., "Synthesis and Characterization of Phosphorescent Cyclometalated Platinum Complexes", Inorganic Chemistry, May 2002, vol. 41, No. 12, pp. 3055-3066 <D01:10.1021/ ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <D01:10.1016/0009-2614(93)89100-V>.

Burroughes, J. et al., "Light-emitting diodes based on conjugated polymers", Nature, Oct. 1990, vol. 347, pp. 539-541.

Campbell et al. (2008). "Low-temperature control of nanoscale morphology for high performance polymer photovoltaics," Nano Lett., 8, 3942-47.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <D01:10.1021/cr200201z>.

Chew, S. et al: Photoluminescence and electroluminescence of a new blue-emitting homoleptic iridium complex. Applied Phys. Letters; vol. 88, pp. 093510-1-093510-3, 2006.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and Oleo Applications of Phosphorescent Platinum(Ii) Schiff Base Complexes," Chem. Eur. J., vol. 16, 2010, pp. 233-247.

Chow; Angew. Chem. Int. Ed. 2013, 52, 11775 -11779. Doi: 10.1002/anie.201305590 (Year: 2013).

Christoph Ulbricht et al., "Synthesis and Characterization of Oxetane-Functionalized Phosphorescent 1010-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyppyridinato-C3,1q(2,2'-bipyridine)iridium(111)", Inorganic Chemistry, Jul. 1993, vol. 32, No. 14, pp. 3081-3087 <D01:10.1021/ic00066a019>.

D.F. O'Brien et al., "Improved energy transfer in electrophosphorescent devices," Appl. Phys. Lett., vol. 74, No. 3, Jan. 18, 1999, pp. 442-44.

D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/ 1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep a. K. Vezzu et al., "Highly Luminescent Tetradentate Bis-Cyclometalated Platinum Complexes: Design, Synthesis, Structure, Photophysics, and Electroluminescence Application," lnorg. Chem., vol. 49, 2010, pp. 5107-5119.

Dorwald, Side Reactions in Organic Synthesis 2005, Wiley:Vch Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag GmbH & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI:10.1021/ cr200213s>.

Eric Turner et al., "Cyclometalated Platinum Complexes with Luminescent Quantum Yields Approaching 100%," lnorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova,M.A. et al., New Selective Synthesis of Substituted Tetrabenzoporphyris, Doklady Chemistry, 2003, vol. 391, no. 4-6, pp. 222-224.

Fuchs, C. et al., "Enhanced light emission from top-emitting organic light-emitting diodes by optimizing surface plasmon polariton losses", arXiv, submitted Mar. 2015, 11 pages, arXiv:1503.01309.

Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <D01:10.1103/PhysRevB.92.245306>.

(56) References Cited

OTHER PUBLICATIONS

Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.

Gather, M. et al., "Recent advances in light outcoupling from white organic light-emitting diodes," Journal of Photonics for Energy, May 2015, vol. 5, No. 1, 057607-1-057607-20 <D01:10.1117/1.Jpe.5.057607>.

Glauco Ponterini et al., "Comparison of Radiationless Decay Processes in Osmium and Platinum Porphyrins," J. Am. Chem. Soc., vol. 105, No. 14, 1983, pp. 4639-4645.

Gong et al., Highly Selective Complexation of Metal Ions by the Self-Tuning Tetraazacalixpyridine macrocycles, Tetrahedron, 65(1): 87-92 (2009).

Gottumukkala,V. et al., Synthesis, cellular uptake and animal toxicity of a tetra carboranylphenyl N-tetrabenzoporphyr in, Bioorganic &Medicinal Chemistry, 2006, vol. 14, pp. 1871-1879.

Graf, a. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI:10.1039/c4tc00997e>.

Guijie Li et al., "Efficient and stable red organic light emitting devices from a tetradentate cyclometalated platinum complex," Organic Electronics, 2014, vol. 15 pp. 1862-1867.

Guijie Li et al., "Modifying Emission Spectral Bandwidth of Phosphorescent Platinum(Ii) Complexes Through Synthetic Control," Inorg. Chem. 2017, 56, 8244-8256.

Guijie Li et al., Efficient and Stable White Organic Light-Emitting Diodes Employing a Single Emitter, Adv. Mater., 2014, vol. 26, pp. 2931-2936.

Hansen (1969). "The universality of the solubility parameter," I & Ec Product Research and Development, 8, 2-11.

Hatakeyama, T. et al., "Ultrapure Blue Thermally Activated Delayed Fluorescence Molecules: Efficient Homo-Lumo Separation by the Multiple Resonance Effect", Advanced Materials, Apr. 2016, vol. 28, No. 14, pp. 2777-2781, <DOI:10.1002/adma.201505491>.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

Hoe-Joo Seo et al., "Blue phosphorescent iridium(Iii) complexes containing carbazole-functionalized phenyl pyridine for organic light-emitting diodes: energy transfer from carbazolyl moieties to iridium(Iii) cores", Rsc Advances, 2011, 1, pp. 755-757.

Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <D01:10.1063/1.1624639>.

Huaijun Tang et al., "Novel yellow phosphorescent iridium complexes containing a carbazoleeoxadiazole unit used in polymeric light-emitting diodes", Dyes and Pigments 91 (2011) pp. 413-421.

Imre et al (1996). "Liquid-liquid demixing ffrom solutions of polystyrene. 1. A review. 2. Improved correlation with solvent properties," J. Phys. Chem. Ref. Data, 25, 637-61.

Ivaylo Ivanov et al., "Comparison of the Indo band structures of polyacetylene, polythiophene, polyfuran, and polypyrrole," Synthetic Metals, vol. 116, Issues 1-3, Jan. 1, 2001, pp. 111-114.

Jack W. Level! et al., "Carbazole/iridium dendrimer side-chain phosphorescent copolymers for efficient light emitting devices", New J. Chem., 2012, vol. 36, pp. 407-413.

Jan Kalinowski et al., "Light-emitting devices based on organometallic platinum complexes as emitters," Coordination Chemistry Reviews, vol. 255, 2011, pp. 2401- 2425.

Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett.. 96, 183305. (3 pages).

Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.

Ji Hyun Seo et al., "Efficient blue-green organic light-emitting diodes based on heteroleptic tris-cyclometalated iridium (111) complexes". Thin Solid Films, vol. 517, pp. 1807-1810 (2009).

JP2009267244, English Translation from EPO, Nov. 2009, 80 pages.

JP2010135689, English translation from EPO, dated Jun. 2010, 95 pages.

Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.

Ke Feng et al., "Norbornene-Based Copolymers Containing Platinum Complexes and Bis(carbazolyl)benzene Groups in Their Side-Chains," Macromolecules, vol. 42, 2009, pp. 6855-6864.

Kim et al (2009). "Altering the thermodynamics of phase separation in inverted bulk-heterojunction organic solar cells," Adv. Mater., 21, 3110-15.

Kim et al. (2005). "Device annealing effect in organic solar cells with blends of regioregular poly (3-hexylthiophene) and soluble fullerene," Appl. Phys. Lett. 86, 063502. (3 pages).

Kim, Hy. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.

Kim, JJ., "Setting up the new efficiency limit of OLEDs; Abstract" [online], Electrical Engineering-Princeton University, Aug. 2014 [retrieved on Aug. 24, 2016], retrieved from the internet: <URL:http://ee.princeton.edu/events/setting-new-efficiency-limit-oled> 2 pages.

Kim, Sy. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.

Kroon et al. (2008). "Small bandgap olymers for organic solar cells," Polymer Reviews, 48, 531 -82.

Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.

Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.

Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.

Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.

Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ ic0008969>.

Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/ acs.chemmater.5b04607>.

Lee et al. (2008). "Processing additives for inproved efficiency from bulk heterojunction solar cells," J. Am. Chem. Soc, 130, 3619-23.

Li et al. (2005). "Investigation of annealing effects and film thickness dependence of polymer solar cells based on poly (3-hexylthiophene)," J. Appl. Phys., 98, 043704. (5 pages).

Li et al. (2007). "Solvent annealing effect in polymer solar cells based on poly(3-hexylthiophene) and methanofullerenes," Adv. Funct. Mater, 17, 1636-44.

Li, J. et al., "Synthesis and characterization of cyclometalated Ir(111) complexes with pyrazolyl ancillary ligands", Polyhedron, Jan. 2004, vol. 23, No. 2-3, pp. 419-428 <DOI:10.1016/ j.poly.2003.11.028>.

Li, J., "Efficient and Stable OLEDs Employing Square Planar Metal Complexes and Inorganic Nanoparticles", in Doe Ssl R&D Workshop (Raleigh, North Carolina, 2016), Feb. 2016, 15 pp.

(56) References Cited

OTHER PUBLICATIONS

Li, J., et al., "Synthetic Control of Excited-State Properties in Cyclometalated 1011) Complexes Using Ancillary Ligands", Inorganic Chemistry, Feb. 2005, vol. 44, No. 6, pp. 1713-1727 <DOI:10.1021/ ic048599h>.
Liang, et al. (2010). "For the bright future-bulk heterojunction polymer solar cells with power conversion efficiency of 7.4%, "Adv. Mater. 22, E135-38.
Lin, Ta et al., " Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/adma.201601675>.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes ", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light-emitting materials", Nature Materials, vol. 15, Jan. 2016, pp. 85-93.
Galanin et al., meso-Phenyltetrabenzoazaporphyrins and their zinc complexes. Synthesis and spectral properties, Russian Journal of General Chemistry (2005), 75(4), 651-655.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <D01:10.1021/cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; Jp 2007324309, English machine translation from Epo, dated Dec. 13, 2007, 89 pp.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <D01:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spin-casted films of polyfluorene/Pcbm Blends," Macromolecules, 40, 8291-8301.
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(Ii) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(Ii) complexes with sub-millisecond blue to green phosphorescent excited states. Photocatalysis and highly efficient Psf-OLEDs," Chem. Sci., 2016, 7, 6083-6098.
Results from SciFinder Compound Search on Dec. 8, 2016. (17 pp.).
Rui Zhu et al., "Color tuning based on a six-membered chelated iridium (111) complex with aza-aromatic ligand,", Chemistry Letters, vol. 34, No. 12, 2005, pp. 1668-1669.
Russell J. Holmes et al., "Blue and Near-Uv Phosphorescence from Iridium Complexes with Cyclometalated Pyrazolyl or N-Heterocyclic Carbene Ligands," Inorganic Chemistry, 2005, vol. 44, No. 22, pp. 7995-8003.
Sajoto, T. et al., "Temperature Dependence of Blue Phosphorescent Cyclometalated 1011) Complexes", Journal of the American Chemical Society, Jun. 2009, vol. 131, No. 28, pp. 9813-9822 <D01:10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <D01:10.7567/Apex.8.096601>.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole q3-Allylpalladium Complexes. Structural Assignment by 1H, 13C, and 15N Nmr and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Senes, a. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <D01:10.1039/c5tc03481g>.
Shih-Chun Lo et al. "High-Triplet-Energy Dendrons: Enhancing the Luminescence of Deep Blue Phosphorescent Indium(Iii) Complexes" J. Am. Chem. Soc.,vol. 131, 2009, pp. 16681-16688.
Shin et al. (2010). "Abrupt morphology change upon thermal annealing in Poly(3-hexathiophene)/ soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly- efficient organic blue-light-emitting devices" Applied Physics Letters, vol. 83, No. 3, Jul. 21 2003, pp. 569-571.
Stefan Bernhard, "The First Six Years: a Report," Department of Chemistry, Princeton University, May 2008, 11 pp.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(Ii) complexes with tetradentate Oanacan ligands: high efficiency OLEDs with excellent efficiency stability," Chem. Commun., 2013, vol. 49, pp. 1497-1499.
Steven C. F. Kui et al., "Robust Phosphorescent Platinum(Ii) Complexes Containing Tetradentate Oanacan Ligands: Excimeric Excited State and Application in Organic White-Light-Emitting Diodes," Chem. Eur. J., 2013, vol. 19, pp. 69-73.
Strouse, G. et al., "Optical Spectroscopy of Single Crystal [Re(bpy)(Co)4](PF6): Mixing between Charge Transfer and Ligand Centered Excited States", Inorganic Chemistry, Oct. 1995, vol. 34, No. 22, pp. 5578-5587 <D01:10.1021/ic00126a031>.
Supporting Information: Xiao-Chun Hang et al., "Highly Efficient Blue-Emitting Cyclometalated Platinum(Ii) Complexes by Judicious Molecular Design," Wiley-Vch 2013, 7 pages.
Sylvia Bettington et al. "Tris-Cyclometalated Iridium(111) Complexes of Carbazole(fluorenyl)pyridine Ligands: Synthesis, Redox and Photophysical Properties, and Electrophosphorescent Light-Emitting Diodes" Chemistry: a European Journal, 2007, vol. 13, pp. 1423-1431.

(56) References Cited

OTHER PUBLICATIONS

Tang, C. et al., "Organic electroluminescent diodes", Applied Physics Letters, Jul. 1987, vol. 51, No. 12, pp. 913-915 <D01:10.1063/1.98799>.
Tsuoboyama, a. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <D01:10.1021/ja034732d>.
Turro, N., "Modern Molecular Photochemistry" (Sausalito, California, University Science Books, 1991), p. 48.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," Acs Appl. Mater. Interfaces 2015, 7, 16240-16246.
U.S. Application No. 16/668,010; filed Oct. 30, 2019.
U.S. Application No. 16/739,480; filed Jan. 10, 2020.
US Provisional Application No. 61/692937.
US Provisional Application No. 61/719077.
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(Iii) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(CI04)2-mediated oxidative cross coupling reaction between arenes and alkyllithium reagents through structurally well-defined Ar-Cu(Iii) intermediates, Chem Commun, 48: 9418-9420 (2012).
Williams, E. et al., "ExcimerBased White Phosphorescent Organic LightEmitting Diodes with Nearly 100 % Internal Quantum Efficiency", Advanced Materials, Jan. 2007, vol. 19, No. 2, pp. 197-202 <D01:10.1002/adma.200602174>.
Williams, E. et al., "Organic light-emitting diodes having exclusive near-infrared electrophosphorescence", Applied Physics Letters, Aug. 2006, vol. 89, No. 8, pp. 083506-1-083506-3 <D01:10.1063/1.2335275>.
Wong. Challenges in organometallic research—Great opportunity for solar cells and OLEDs. Journal of Organometallic Chemistry 2009, vol. 694, pp. 2644-2647.
Xiao-Chu Hang et al., "Highly Efficient Blue-Emitting Cyclometalated Platinum(Ii) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (111) complexes with phenylisoquinoline and phenylpyridine ligands", the Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, no. 5, pp. 755-760.
Yang et al. (2005). "Nanoscale morphology of high-performance polymer solar cells," Nano Lett., 5, 579-83.
Yang, X. et al., "Efficient Blue and WhiteEmitting Electrophosphorescent Devices Based on Platinum(Ii) [1,3Difluoro4,6di(2pyridinyl)benzene] Chloride", Advanced Materials, Jun. 2008, vol. 20, No. 12, pp. 2405-2409 <D01:10.1002/adma.200702940>.
Yao et al. (2008). "Effect of solvent mixture on nanoscale phase separation in polymer solar cells," Adv. Fund. Mater.,18, 1783-89.
Yao et al., Cu(C104)2-Mediated Arene C-H Bond Halogenations of Azacalixaromatics Using Alkali Metal Halides as Halogen Sources, the Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z Xu et al., "Synthesis and properties of iridium complexes based 1,3,4-oxadiazoles derivatives", Tetrahedron 64 (2008) pp. 1860-1867.
Zhi-Qiang Zhu et. al., "Efficient Cyclometalated Platinum(Ii) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <D01:10.1063/1.1461418>.

* cited by examiner

NARROW BAND RED PHOSPHORESCENT TETRADENTATE PLATINUM (II) COMPLEXES

CROSS-REFERENCE TO RELATED APPLICATION

The present application is a 35 U.S.C. § 371 national phase application from, and claiming priority to, International Patent Application No. PCT/US2017/056380, filed Oct. 12, 2017, which claims priority under 35 U.S.C. § 119(e) to U.S. Provisional Patent Application No. 62/407,020, filed Oct. 12, 2016, all of which are incorporated by reference herein in their entireties.

TECHNICAL FIELD

This invention relates to narrow band red phosphorescent tetradentate platinum (II) complexes and light emitting devices including these emitters.

BACKGROUND

Cyclometalated metal complexes have found wide applications as emitters for OLEDs in recent decades. Much attention has been paid to the development of new improved materials for both display and solid state lighting applications. Through diligent device and materials design, OLEDs emitting efficiently across the visible spectrum have been achieved. However, one major drawback is that they exhibit relatively broad emission spectra. Particularly, the development of stable and efficient narrow band red phosphorescent emitters remains a substantial deficit for the on-going efforts. Thus, to fully realize the benefits of phosphorescent materials, greater spectral purity is needed.

SUMMARY

As described herein, with the aim of further improving the color purity and enhancing the operational stability as well as eliminating the potential intermolecular interaction, a series of narrow band red platinum (II) complexes has been designed and synthesized. This class of emitters is suitable for full color displays and lighting applications.

In particular, complexes represented by Formula I are disclosed:

Formula I

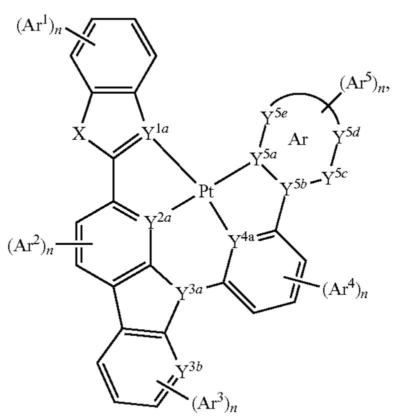

wherein:

each $Ar^1$, $Ar^2$, $Ar^3$, $Ar^4$, and $Ar^5$ present independently represents a substituted or unsubstituted aryl or heterocyclic aryl;

each n is independently an integer of 0 to 4, as limited by valence;

X represents O, S, $NR^{1a}$, $SiR^{1b}R^{1c}$, or $CR^{1d}R^{1e}$, where each of $R^{1a}$, $R^{1b}$, $R^{1c}$, $R^{1d}$, and $R^{1e}$ independently represents substituted or unsubstituted $C_1$-$C_4$ alkyl;

$Y^{1a}$, $Y^{2a}$, $Y^{3b}$, and $Y^{4a}$ each independently represents N or C;

$Y^{3a}$ represents N, $CR^{2a}$, or $SiR^{2b}$, where $R^{2a}$ and $R^{2b}$ represent hydrogen or substituted or unsubstituted $C_1$-$C_4$ alkyl, aryl, or heterocyclic aryl;

$Y^{5a}$ and $Y^{5b}$ each independently represents C or N; and $Y^{5c}$, $Y^{5d}$, and $Y^{5e}$ each independently represents C, N, O, or S.

Light emitting devices including a complex represented by Formula I are also disclosed. These light emitting devices are suitable for full color displays.

DETAILED DESCRIPTION

Figure 1:
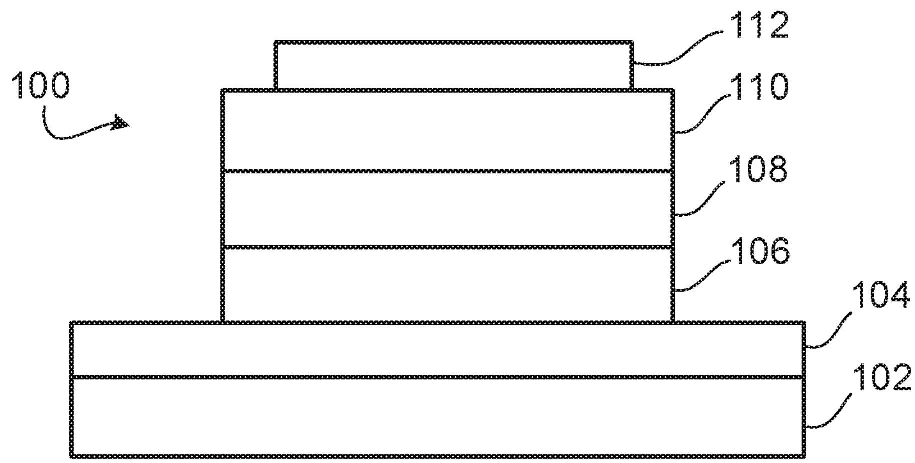
FIG. 1 depicts a cross section of an exemplary OLED.

This disclosure relates to complexes represented by Formula I:

Formula I

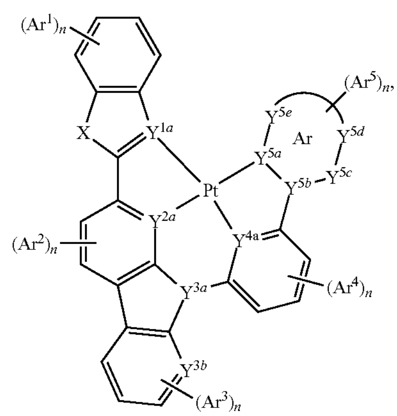

wherein:

each $Ar^1$, $Ar^2$, $Ar^3$, $Ar^4$, and $Ar^5$ present independently represents a substituted or unsubstituted aryl or heterocyclic aryl;

each n is independently an integer of 0 to 4, as limited by valence;

X represents O, S, $NR^{1a}$, $SiR^{1b}R^{1c}$, or $CR^{1d}R^{1e}$, where each of $R^{1a}$, $R^{1b}$, $R^{1c}$, $R^{1d}$, and $R^{1e}$ independently represents substituted or unsubstituted $C_1$-$C_4$ alkyl;

$Y^{1a}$, $Y^{2a}$, $Y^{3b}$, and $Y^{4a}$ each independently represents N or C;

$Y^{3a}$ represents N, $CR^{2a}$, or $SiR^{2b}$, where $R^{2a}$ and $R^{2b}$ represent hydrogen or substituted or unsubstituted $C_1$-$C_4$ alkyl, aryl, or heterocyclic aryl;

$Y^{5a}$ and $Y^{5b}$ each independently represents C or N; and $Y^{5c}$, $Y^{5d}$, and $Y^{5e}$ each independently represents C, N, O, or S.

In some aspects, a portion of a complex of Formula I can be represented by a formula:

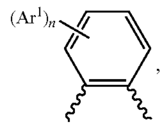

which is understood to be equivalent to a formula:

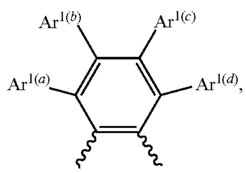

where n is an integer from 0 to 4. That is, $Ar^1$ may be absent, or $(Ar^1)_n$ may represent up to four independent substituents, $Ar^{1(a)}$, $Ar^{1(b)}$, $Ar^{1(c)}$, and $Ar^{1(d)}$. By "independent substituents," it is meant that each $Ar^1$ can be independently defined. For example, if in one instance $Ar^{1(a)}$ is phenyl, then $Ar^{1(b)}$ is not necessarily phenyl in that instance. In addition,

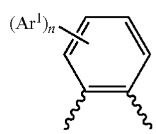

may represent one of the following chemical moieties:

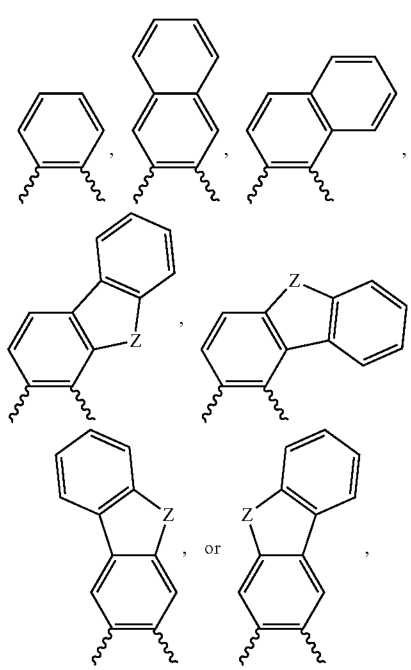

where Z represents O, S, NR, PR, CRR', or Si RR', where R and R' each independently represents substituted or unsubstituted $C_1$-$C_4$ alkyl, aryl, or heterocyclic aryl.

In some aspects, a portion of a complex of Formula I may be represented by a formula:

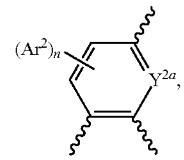

which is understood to be equivalent to a formula:

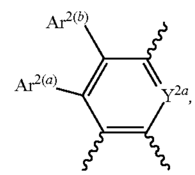

That is, $Ar^2$ may be absent or may represent up to two independent substituents, $Ar^{2(a)}$ and $Ar^{2(b)}$. By "independent substituents," it is meant that each $Ar^2$ may be independently defined. For example, if in one instance $Ar^{2(a)}$ is phenyl, then $Ar^{2(b)}$ is not necessarily phenyl in that instance.

In some aspects, a portion of a complex of Formula I may be represented by a formula:

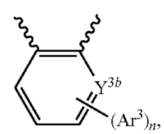

which is understood to be equivalent to a formula:

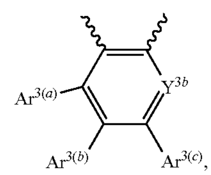

That is, $Ar^3$ may be absent, or $(Ar^3)_n$ may represent up to four independent substituents, $Ar^{3(a)}$, $Ar^{3(b)}$, $Ar^{3(c)}$, and $Ar^{3(d)}$, not shown, bonded to $Y^{3b}$. By "independent substituents," it is meant that each $Ar^3$ may be independently defined. For example, if in one instance $Ar^{3(a)}$ is phenyl, then $Ar^{3(b)}$ is not necessarily phenyl in that instance. In some cases,

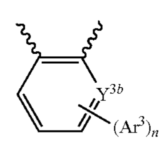

represents one of the following chemical moieties:

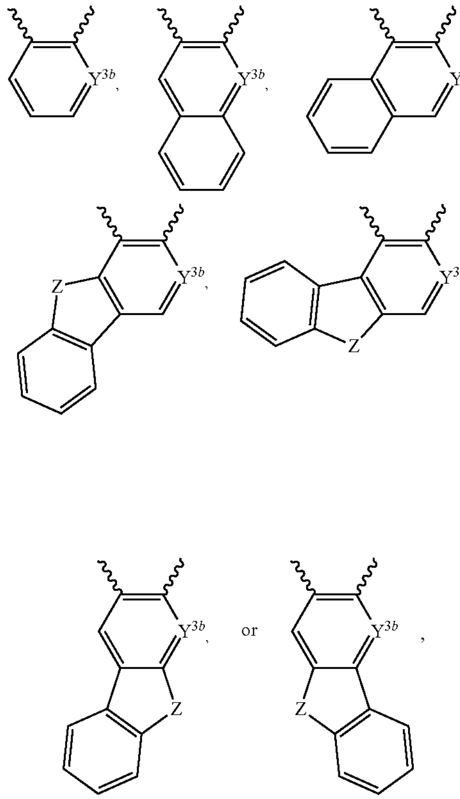

where Z represents O, S, NR, PR, CRR', or Si RR', where R and R' each independently represents substituted or unsubstituted $C_1$-$C_4$ alkyl, aryl, or heterocyclic aryl.

In some aspects, a portion of a complex of Formula I may be represented by a formula:

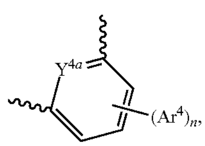

which is understood to be equivalent to a formula:

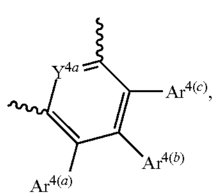

That is, $Ar^4$ may be absent, or $(Ar^4)_n$ may represent up to three independent substituents, $Ar^{4(a)}$, $Ar^{4(b)}$, $Ar^{4(c)}$, and $Ar^{4(d)}$, not shown, bonded to $Y^{4a}$. By "independent substituents," it is meant that each $Ar^4$ substituent can be independently defined. For example, if in one instance $Ar^{4(a)}$ is phenyl, then $Ar^{4(b)}$ is not necessarily phenyl in that instance.

In some aspects, a portion of a complex of Formula I may be represented by a formula:

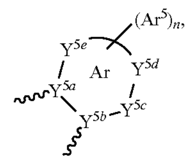

which is understood to be equivalent to a formula:

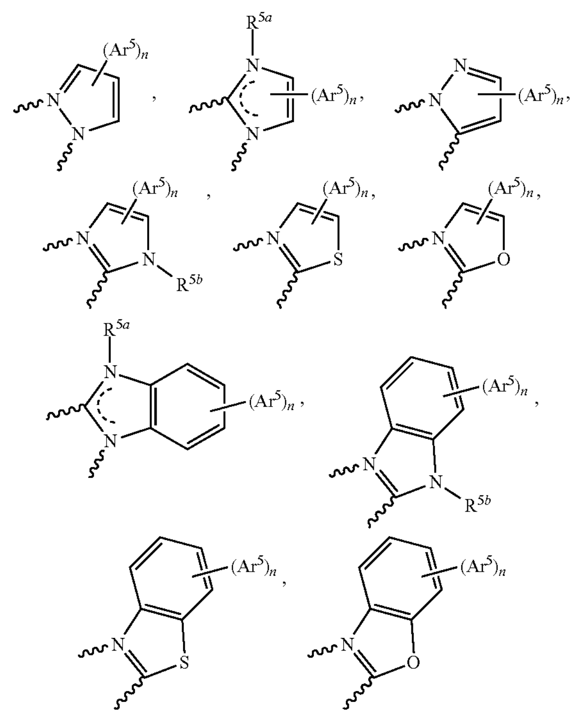

$Ar^5$ may be absent, or $(Ar^5)_n$ may represent up to four independent substituents, $Ar^{5(a)}$, $Ar^{5(b)}$, $Ar^{5(c)}$, and $Ar^{5(d)}$. By "independent substituents," it is meant that each $Ar^5$ may be independently defined. For example, if in one instance $Ar^{5(a)}$ is phenyl, then $Ar^{5(b)}$ is not necessarily phenyl in that instance.

In some cases, none of $Ar^1$, $Ar^2$, $Ar^3$, $Ar^4$, and $Ar^5$ is present. In some cases, one of $Ar^1$, $Ar^2$, $Ar^3$, $Ar^4$, and $Ar^5$ is present. In other cases, two, three, four, or five of $Ar^1$, $Ar^2$, $Ar^3$, $Ar^4$, and $Ar^5$ are present in any permutation. In one example, when two of $Ar^1$, $Ar^2$, $Ar^3$, $Ar^4$, and $Ar^5$ are present, the two may be $Ar^1$ and $Ar^2$; $Ar^1$ and $Ar^3$; $Ar^1$ and $Ar^4$; $Ar^1$ and $Ar^5$; $Ar^2$ and $Ar^3$; $Ar^2$ and $Ar^4$; $Ar^1$, $Ar^2$ and $Ar^5$; $Ar^3$ and $Ar^4$; $Ar^3$ and $Ar^5$; or $Ar^4$ and $Ar^5$. In another example, when three of $Ar^1$, $Ar^2$, $Ar^3$, $Ar^4$, and $Ar^5$ are present, $Ar^1$, $Ar^2$, and $Ar^3$; $Ar^1$, $Ar^2$, and $Ar^4$; $Ar^1$, $Ar^2$, and $Ar^5$; $Ar^1$, $Ar^3$, and $Ar^4$; $Ar^1$, $Ar^3$, and $Ar^5$; $Ar^1$, $Ar^4$, and $Ar^5$; $Ar^2$, $Ar^3$, and $Ar^4$; $Ar^2$, $Ar^3$, and $Ar^5$; $Ar^2$, $Ar^4$, and $Ar^5$; or $Ar^3$, $Ar^4$, and $Ar^5$ are present. In yet another example, when four of $Ar^1$, $Ar^2$, $Ar^3$, $Ar^4$, and $Ar^5$ are present, $Ar^1$, $Ar^2$, $Ar^3$, and $Ar^4$; $Ar^1$, $Ar^3$, $Ar^4$, and $Ar^5$; or $Ar^2$, $Ar^3$, $Ar^4$, and $Ar^5$ are present.

In some cases, $Ar^1$, $Ar^2$, $Ar^3$, $Ar^4$, and $Ar^5$ may be one of the following: pyrrolyl, furanyl, thiophenyl, imidazolyl, pyrazolyl, oxazolyl, isooxazolyl, thiazolyl, isothiazolyl, trazolyl, furazanyl, oxadiazolyl, thidiazolyl, dithiazolyl, tetrazolyl, phenyl, pyridinyl, pyranyl, thiopyranyl, diazinyls, oxazinyls, thiazinyls, dioxinyls, dithiinyls, triazinyls, tetrazinyls, pentazinyls, pyrimidyl, pyridazinyl, pyrazinyl, biphenyl, naphthyl, fluorenyl, carbazolyl, phenothiazinyl, acridinyl and dihydroacridinyl.

Examples of complexes having the structure of Formula I provided below, where Z represents O, S, NR, PR, CRR', or Si RR', where R and R' each independently represents substituted or unsubstituted $C_1$-$C_4$ alkyl, aryl, or heterocyclic aryl.

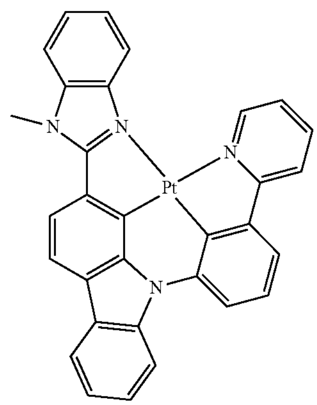

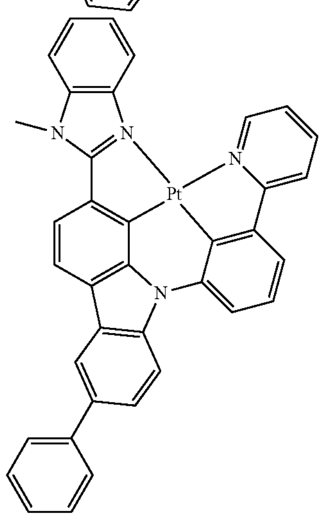

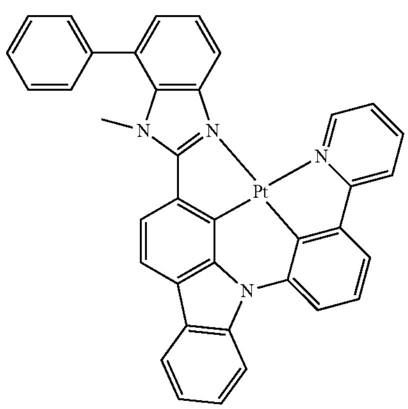

-continued

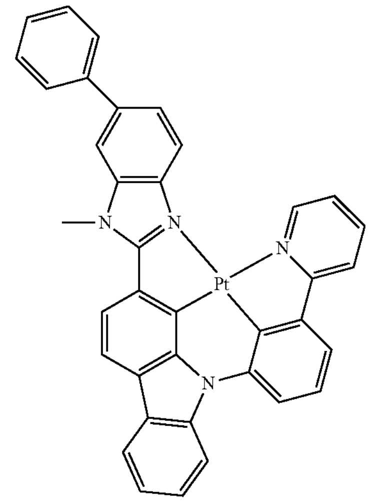

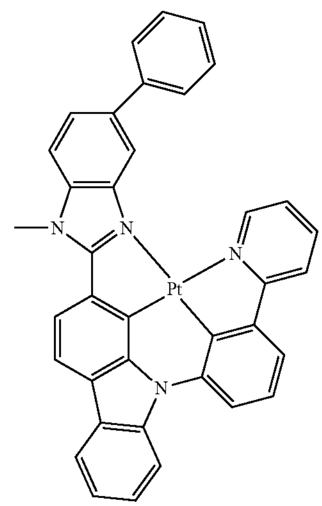

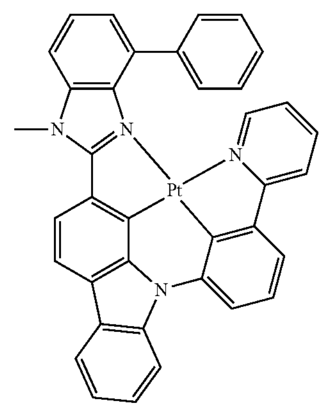

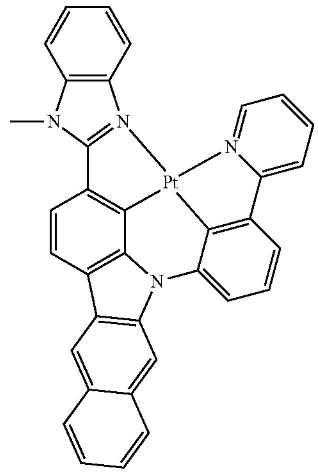
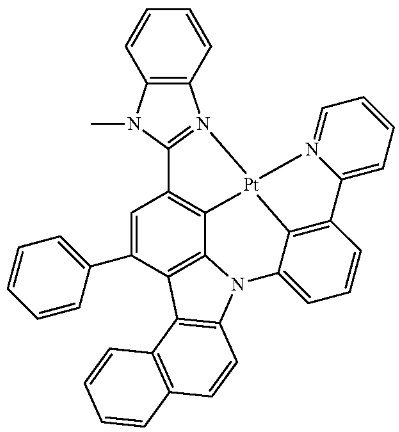
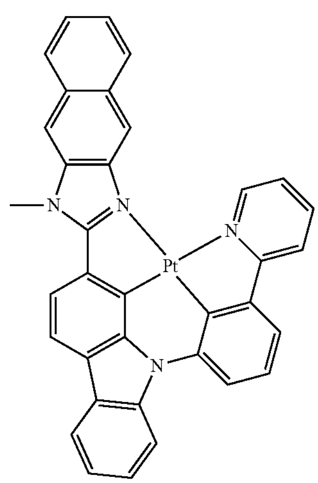
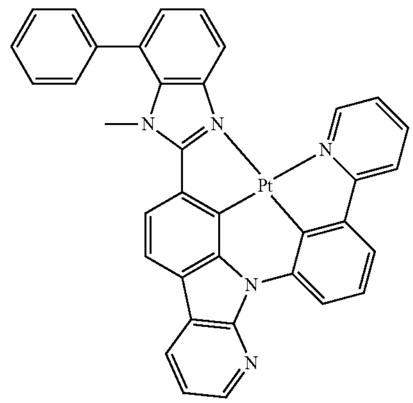
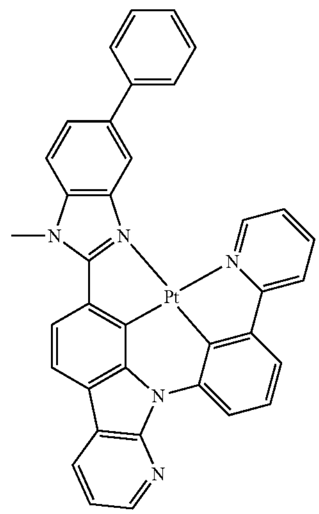
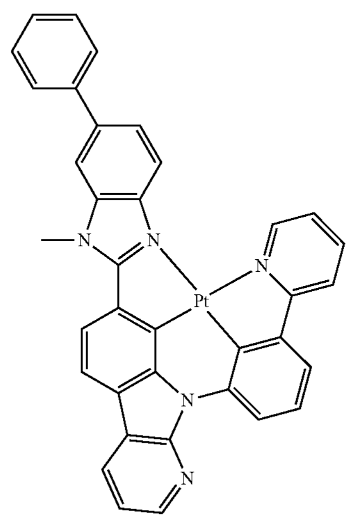

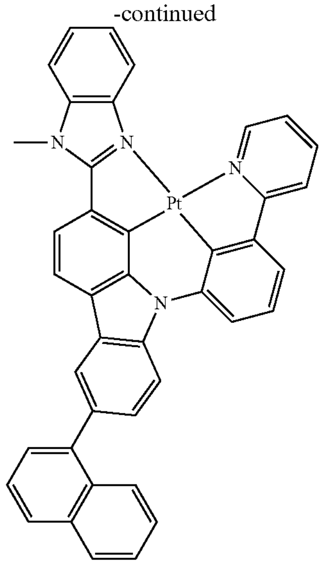
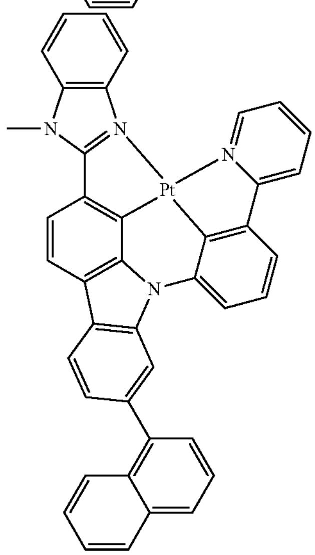
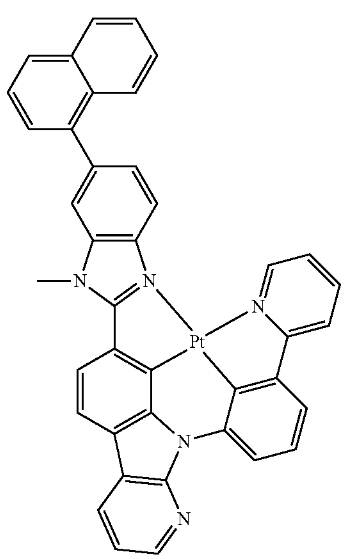
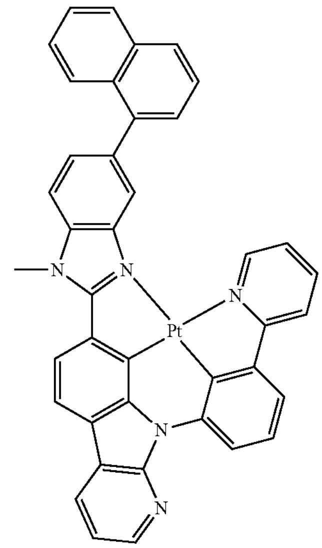
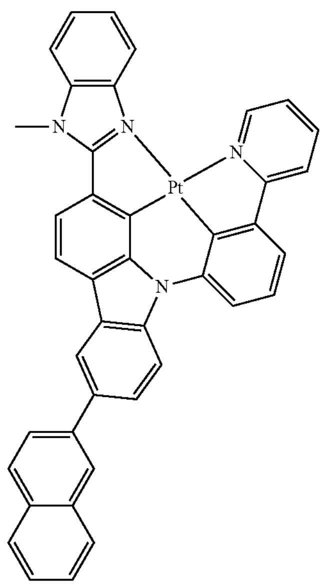
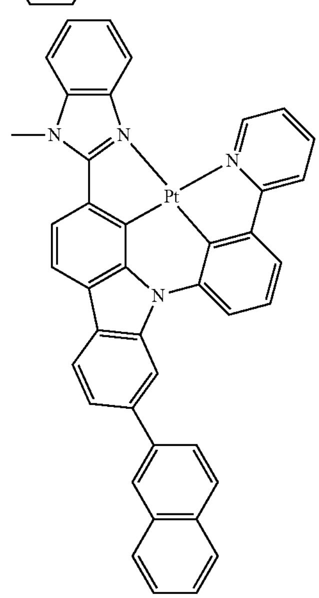

-continued
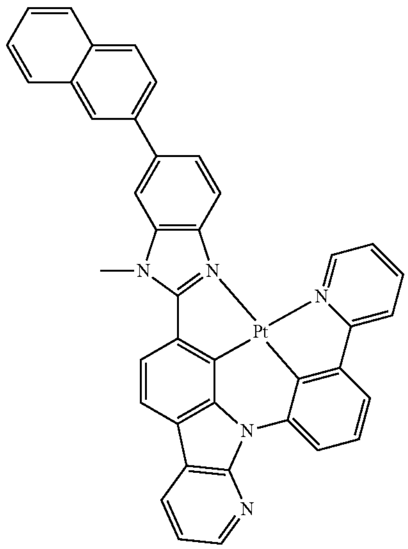
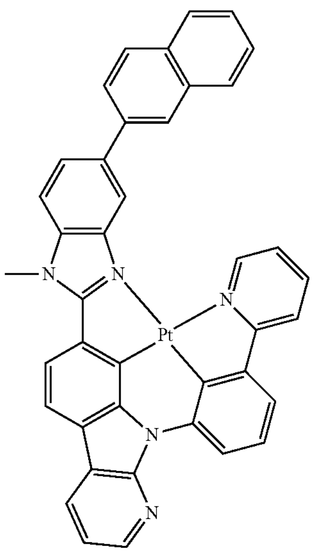
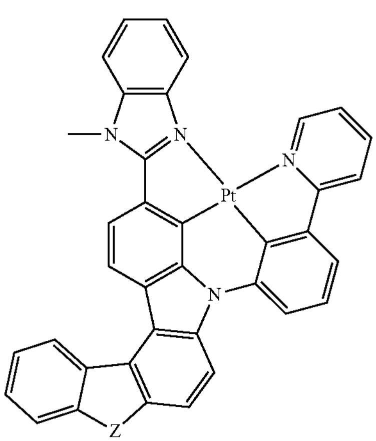
-continued
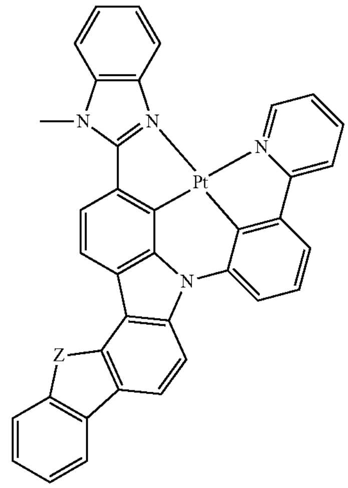
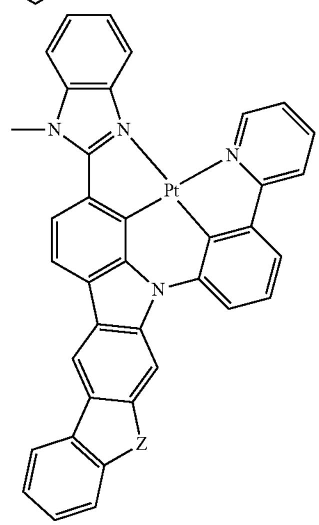
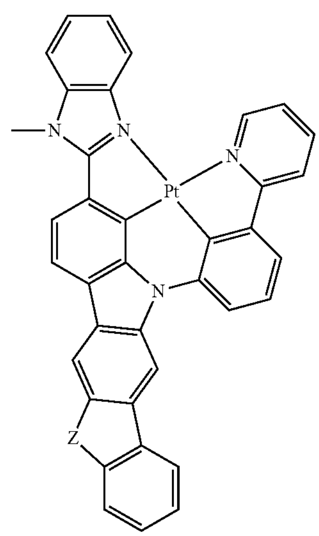

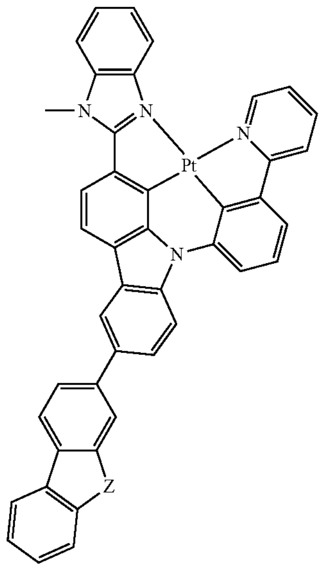
N
N
Pt
N
N
Z
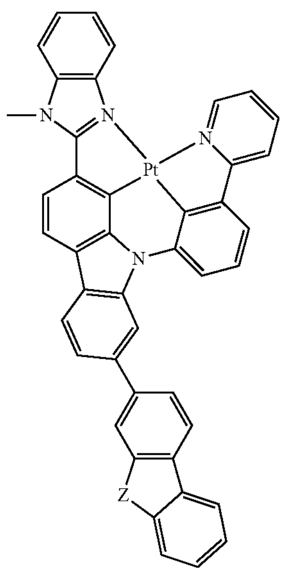
N
N
Pt
N
N
Z
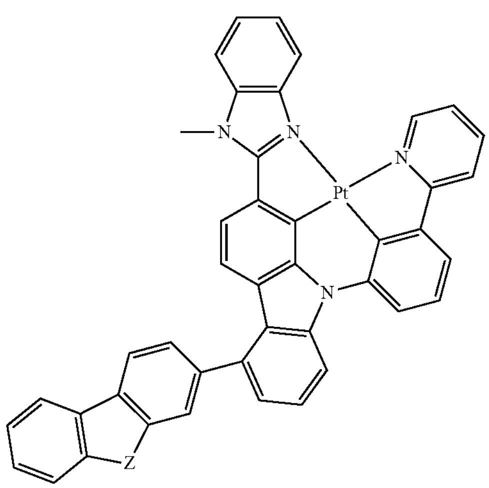
N
N
Pt
N
N
Z
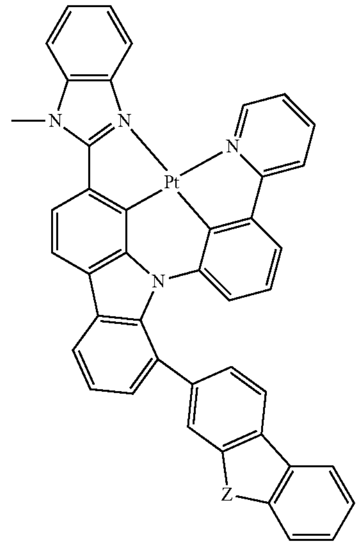
N
N
Pt
N
N
Z
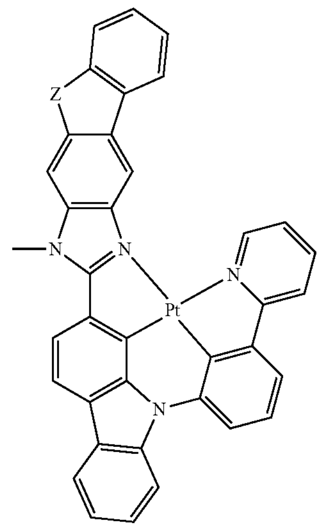
Z
N
N
Pt
N
N
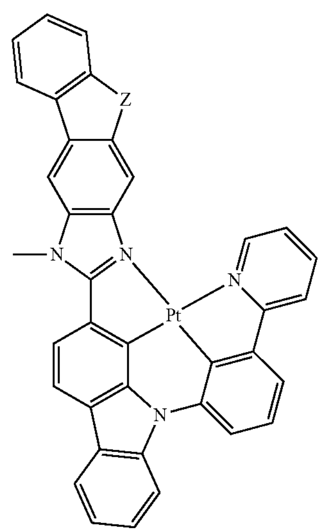
Z
N
N
Pt
N
N -continued
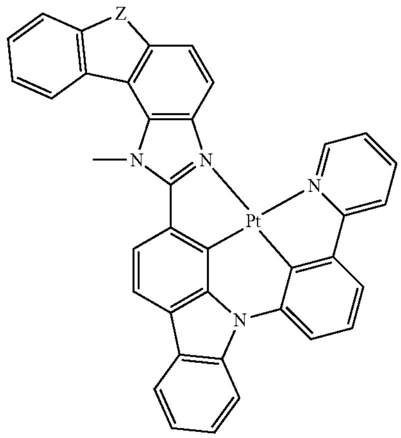
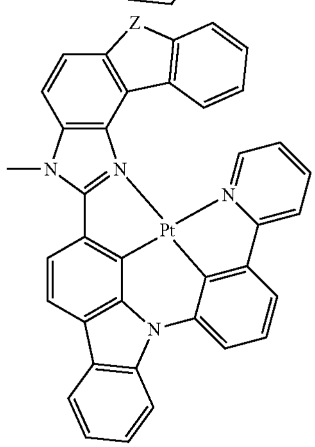
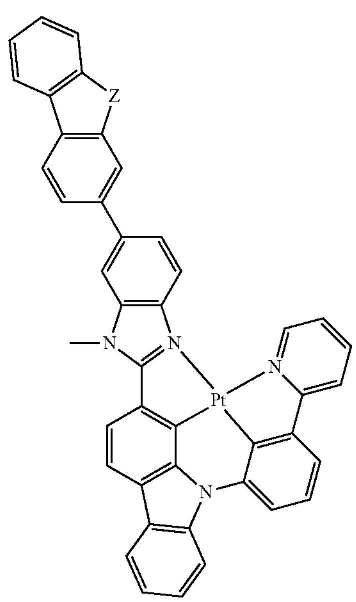
-continued
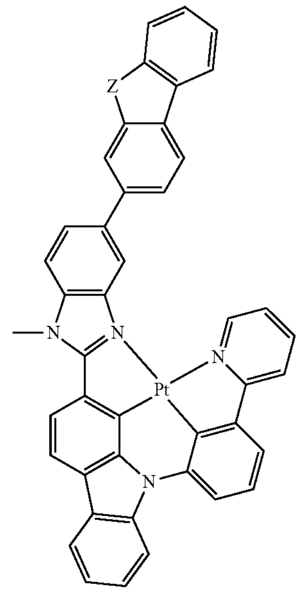
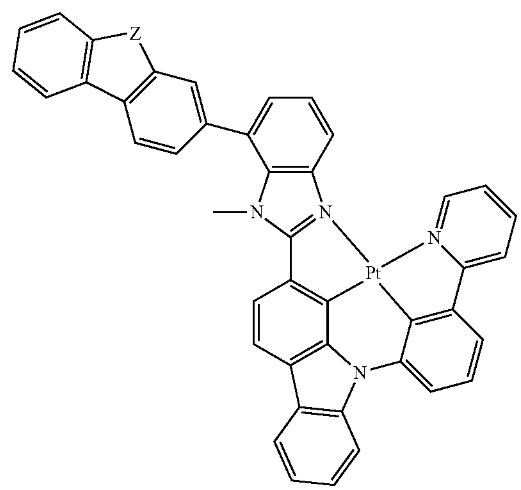
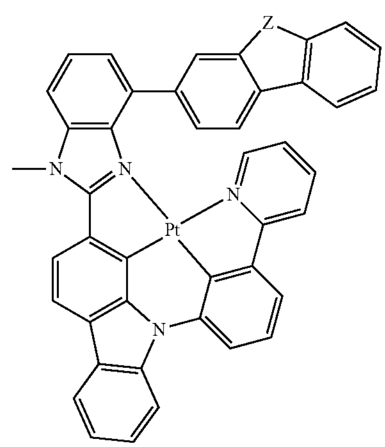

-continued
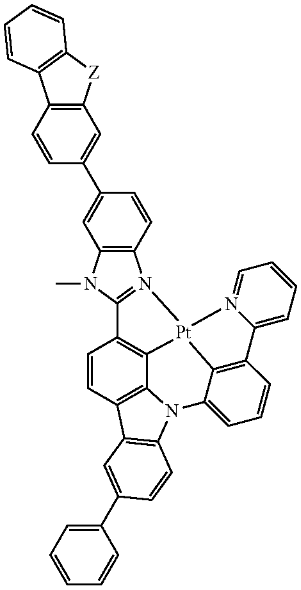
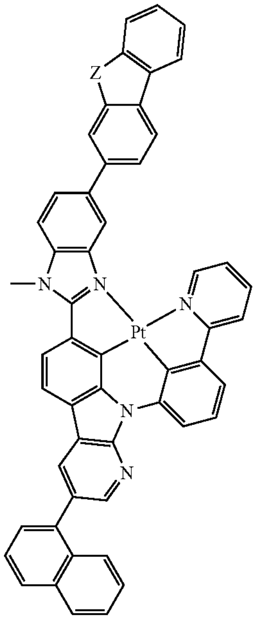
-continued
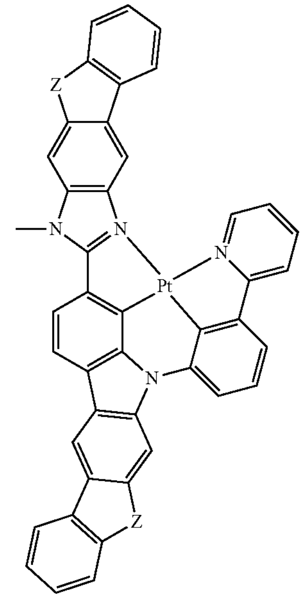
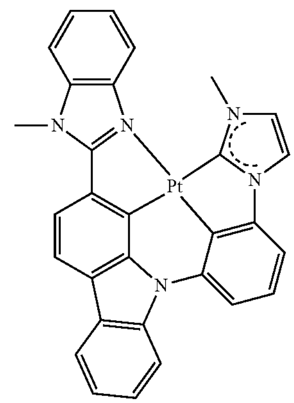
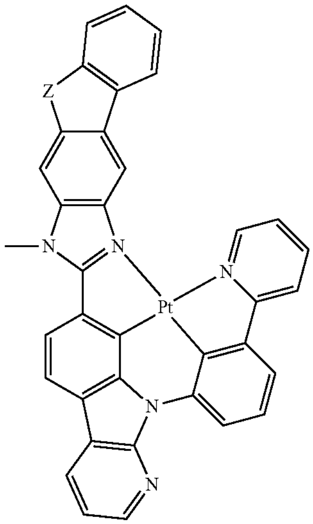
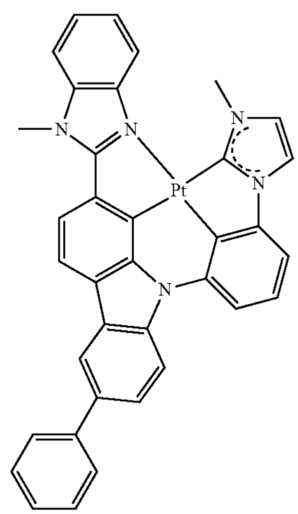

-continued
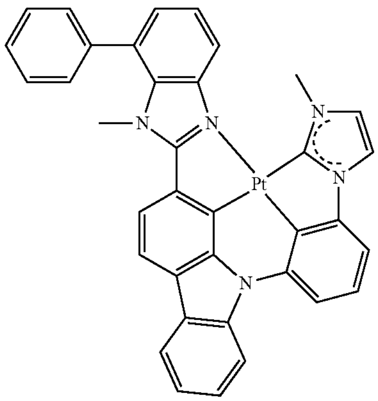
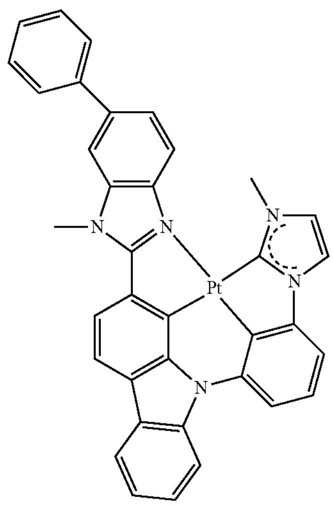
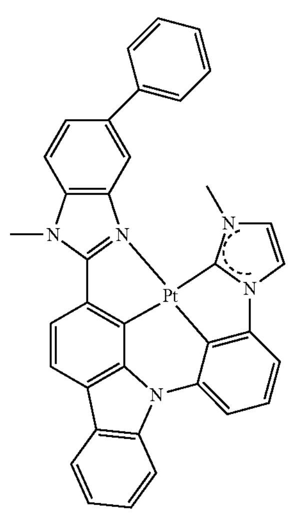
-continued
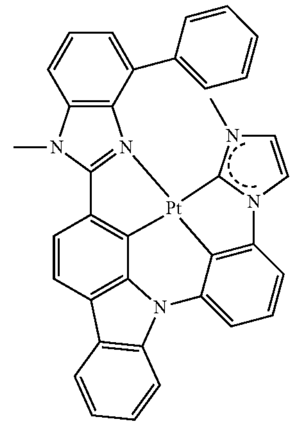
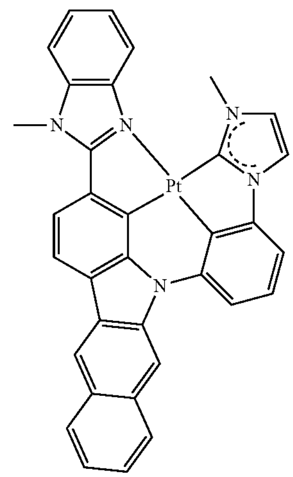
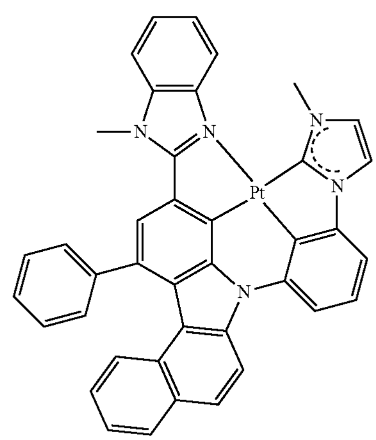

-continued
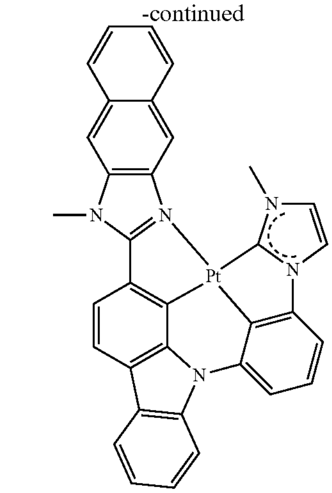
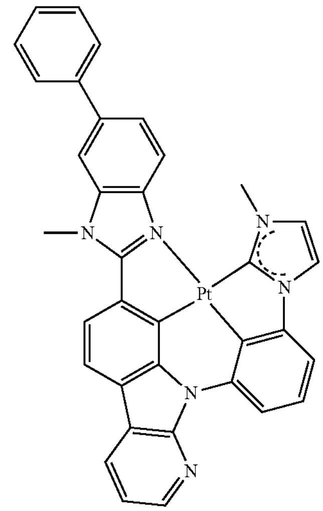
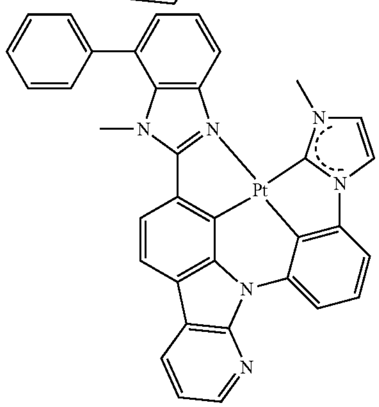
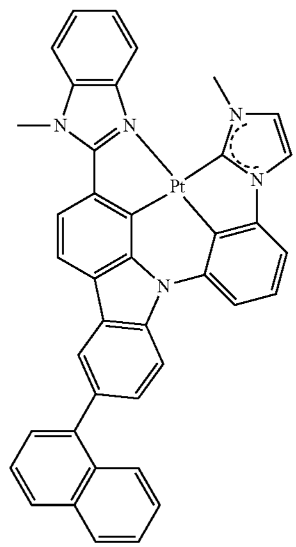
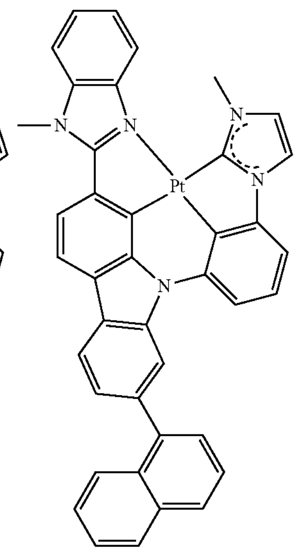
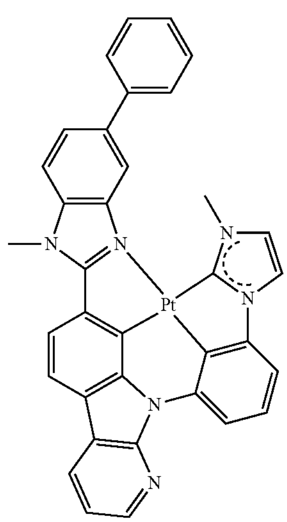
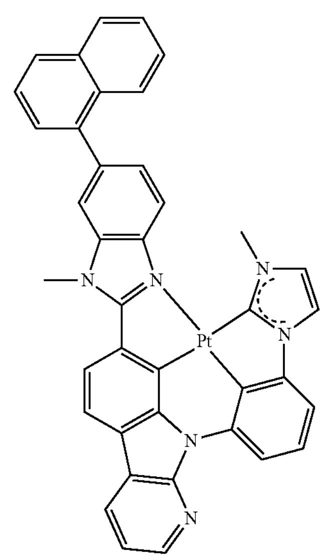

-continued
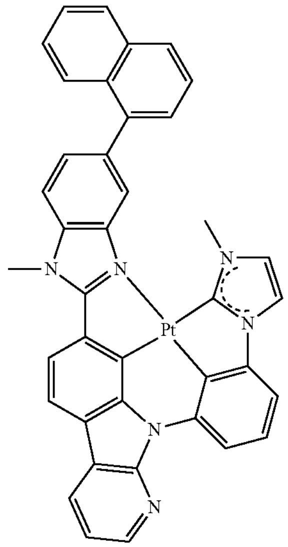
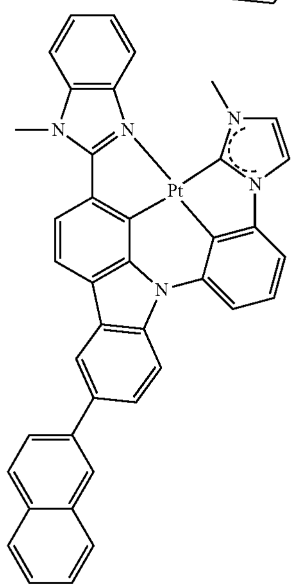
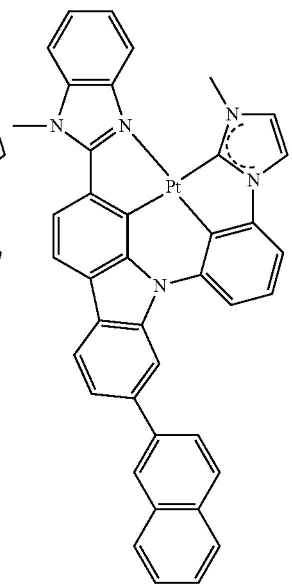
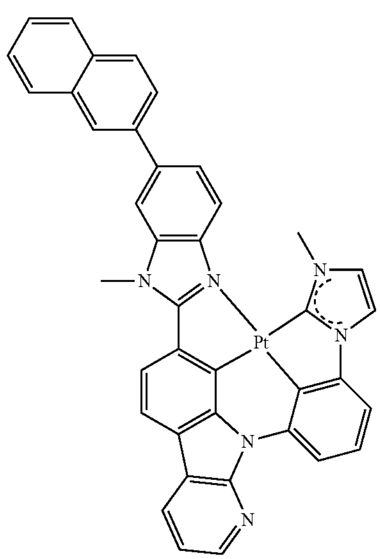
-continued
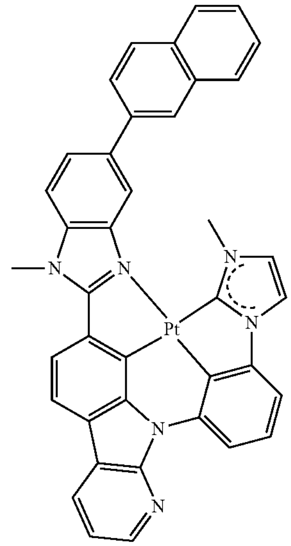
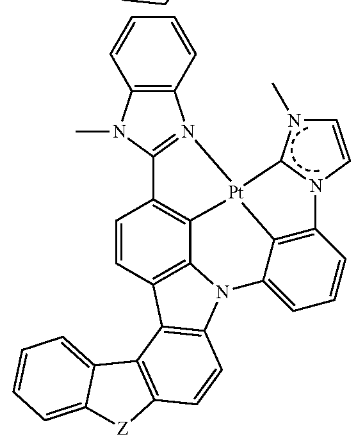
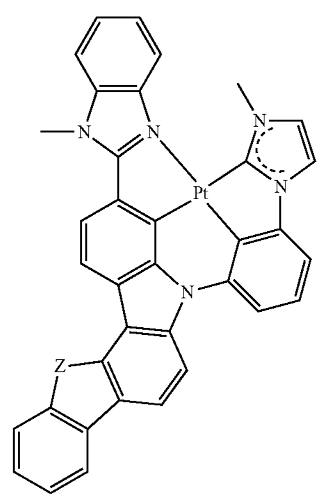

-continued
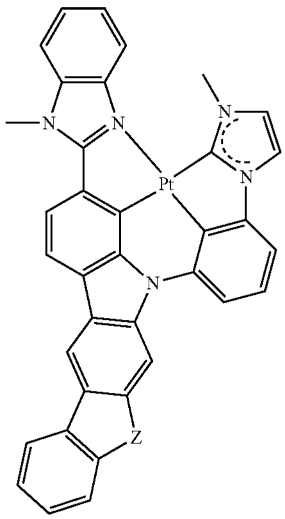
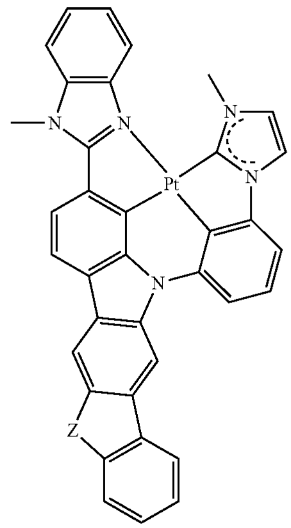
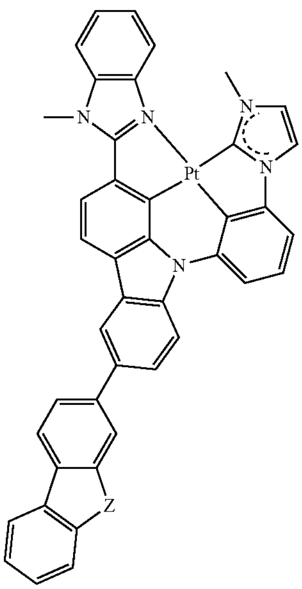
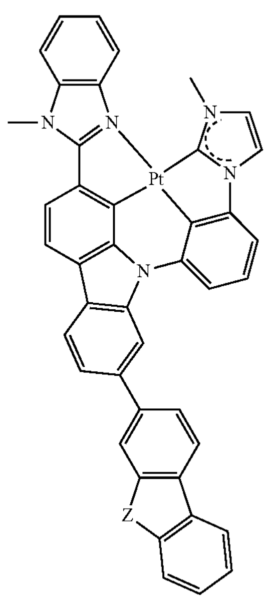
-continued
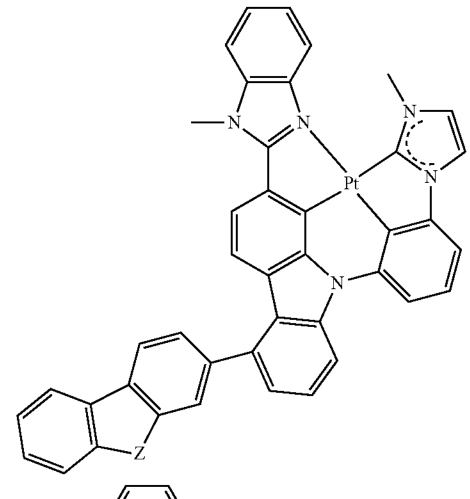
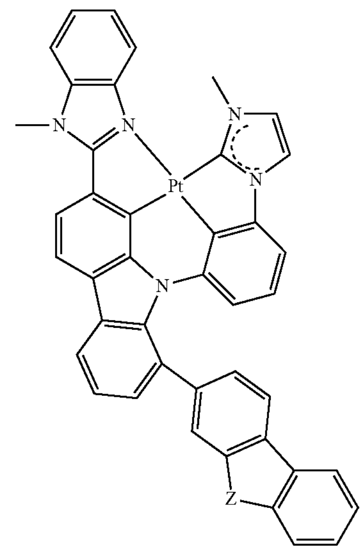
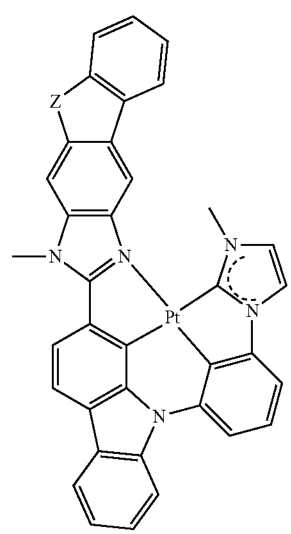
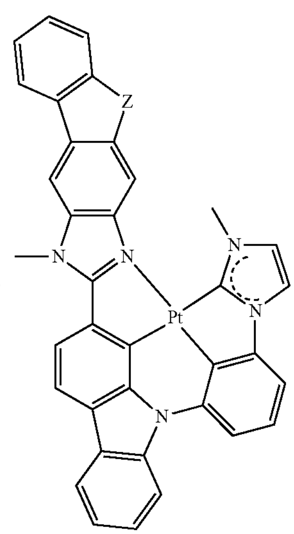

-continued
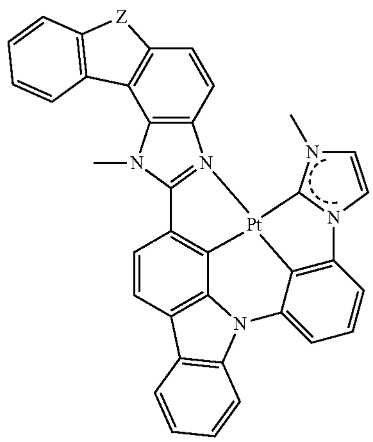
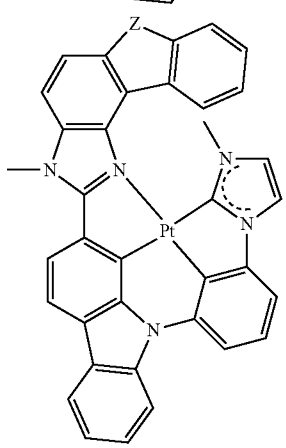
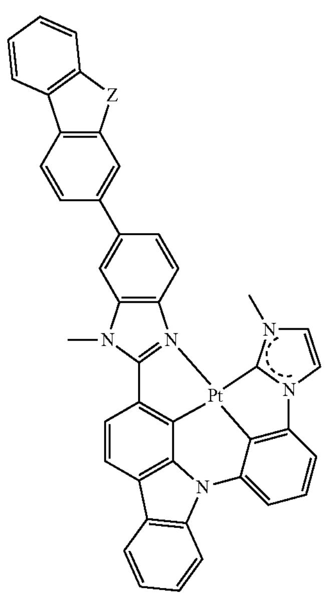
-continued
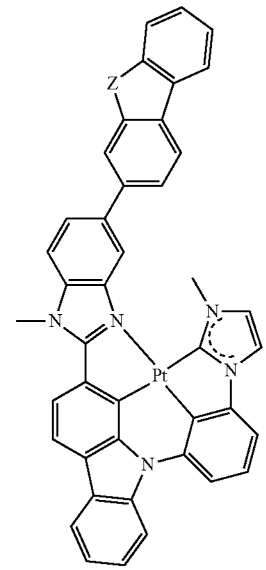
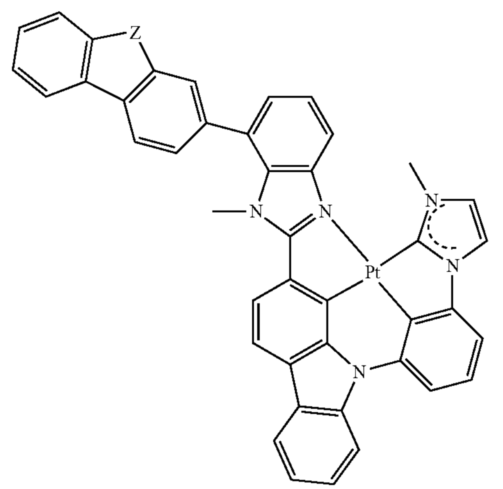
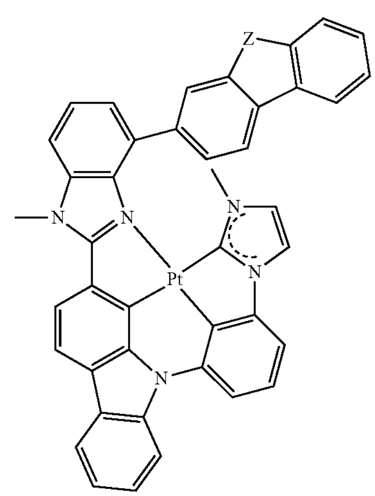

-continued
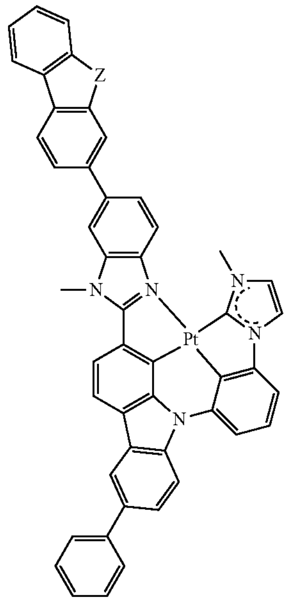
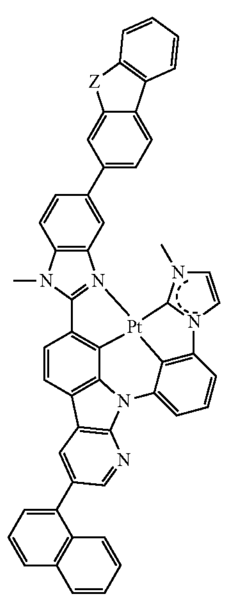
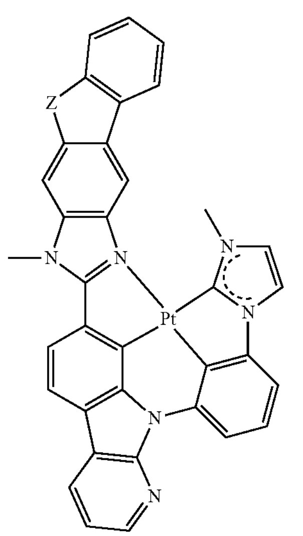
-continued
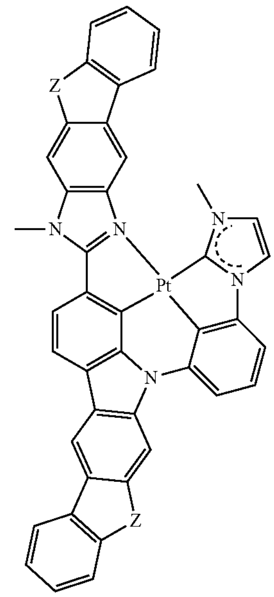
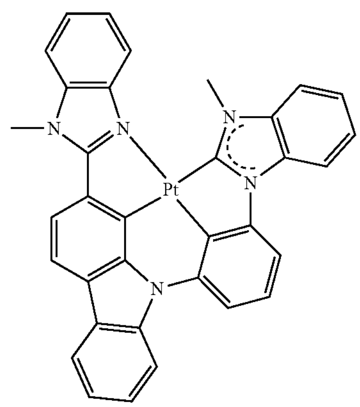
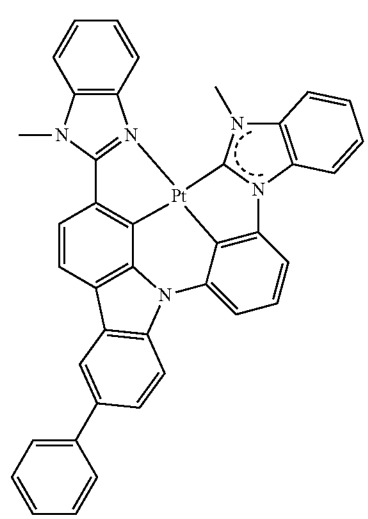

-continued
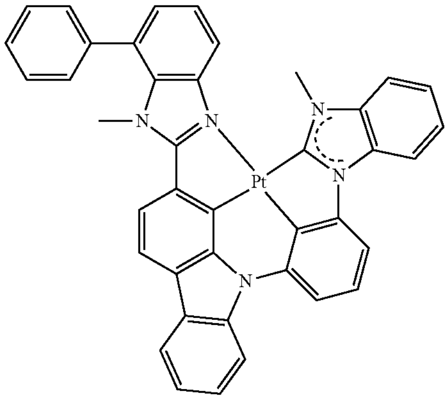
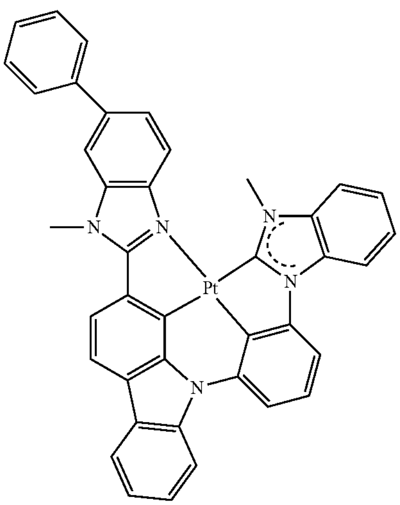
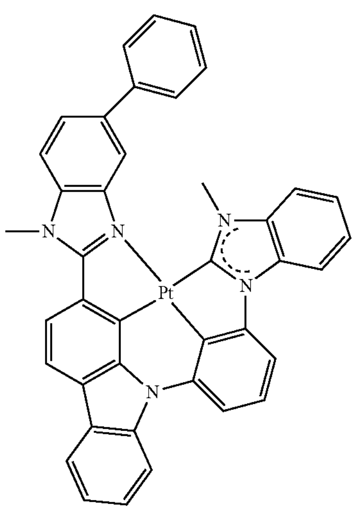
-continued
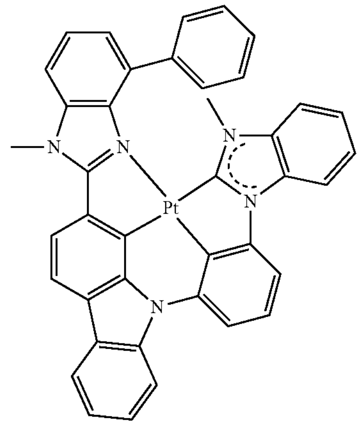
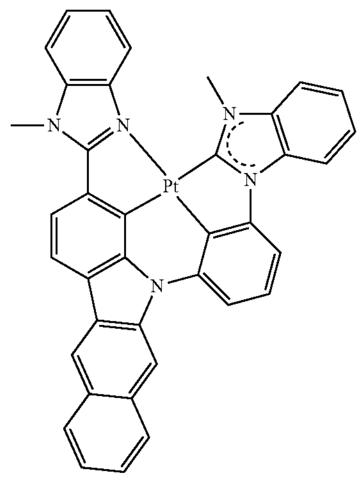
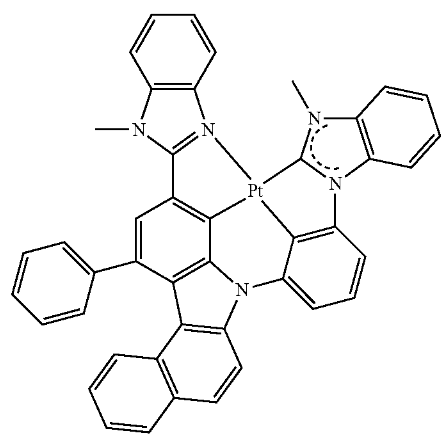

-continued
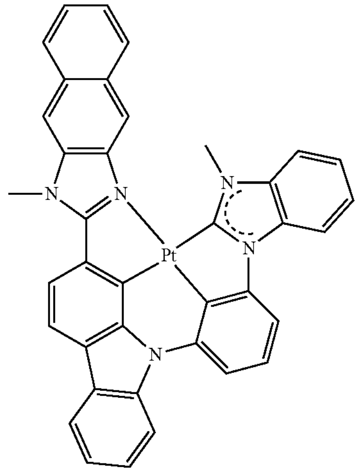
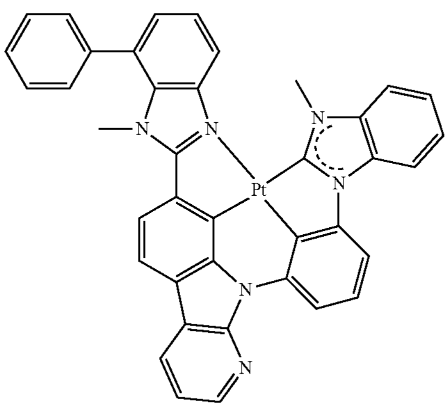
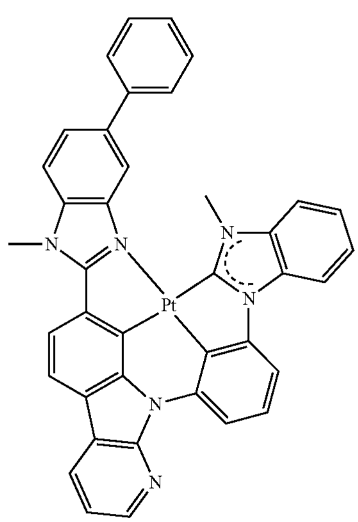
-continued
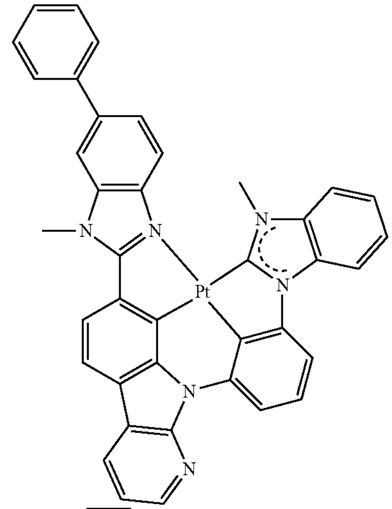
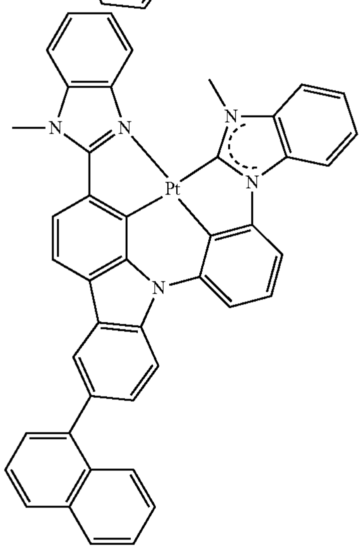
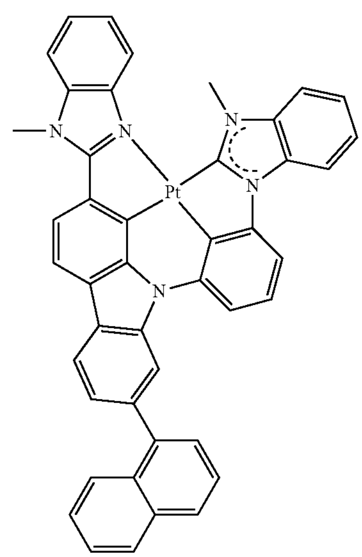

-continued
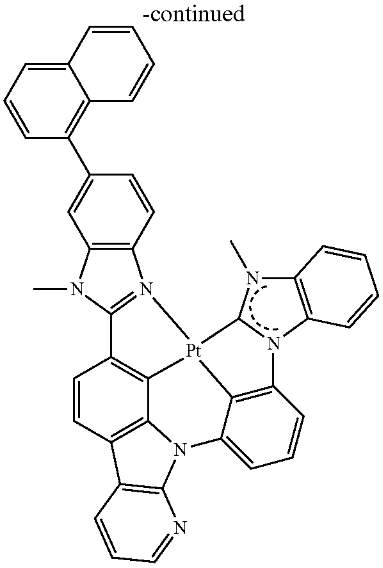
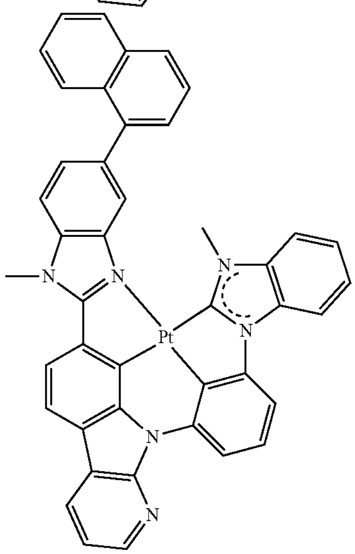
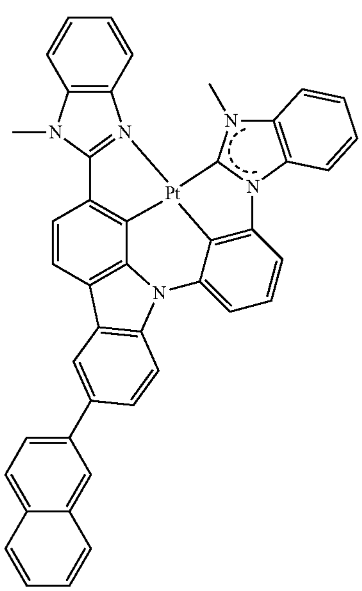
-continued
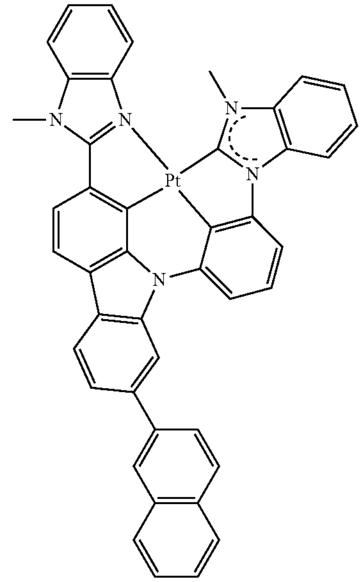
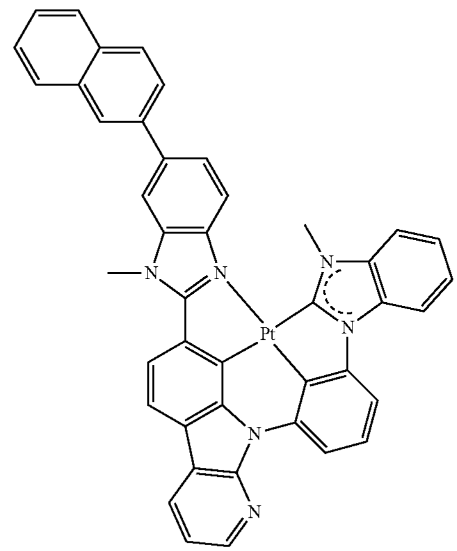
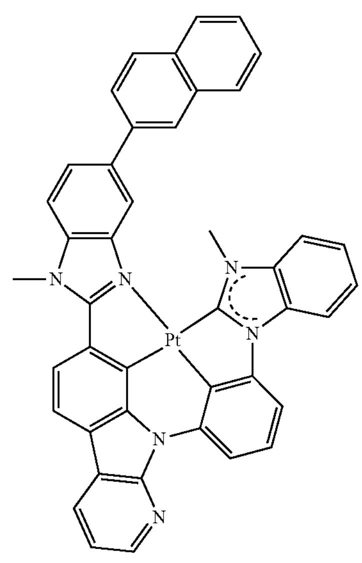

-continued
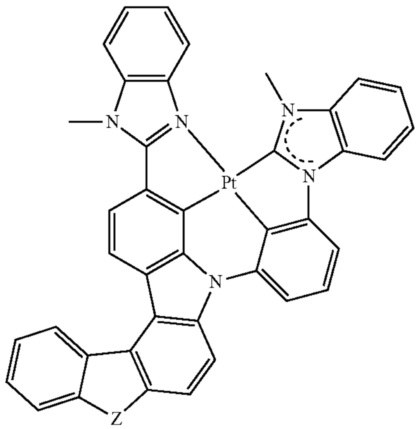
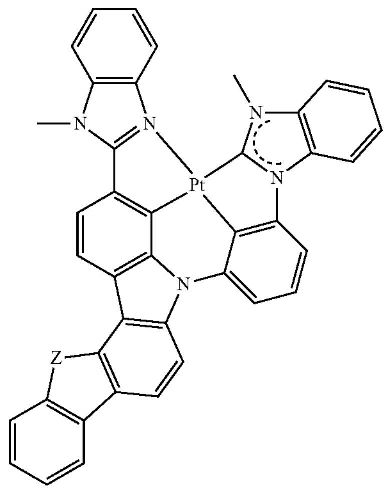
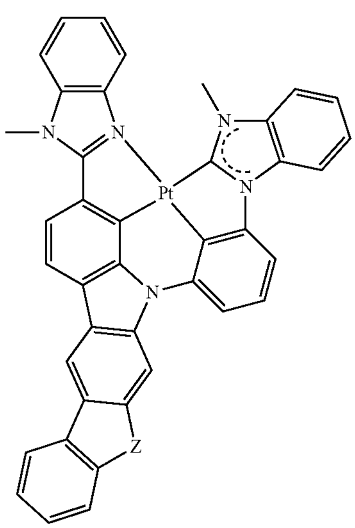
-continued
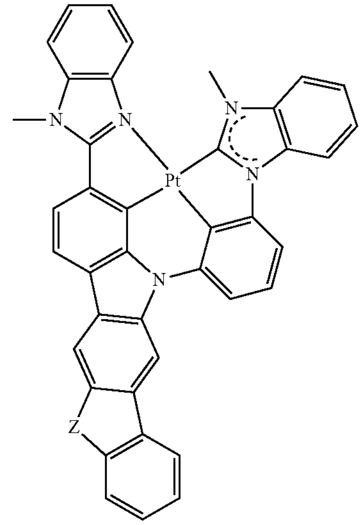
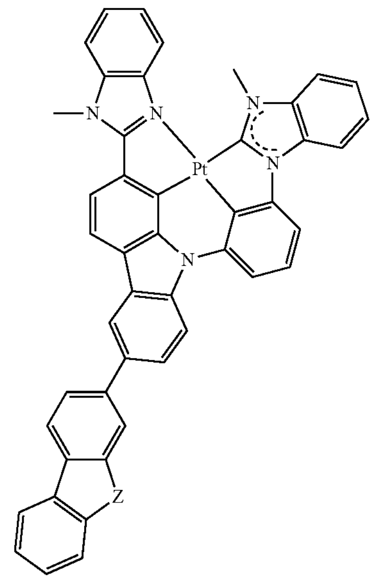
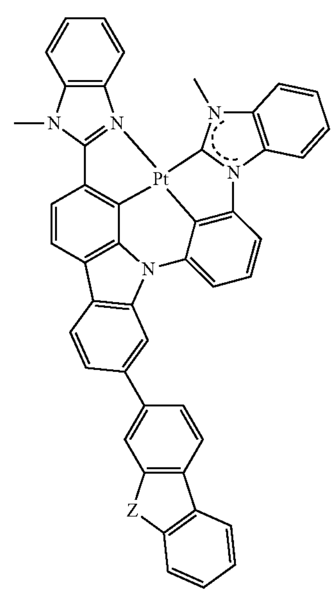

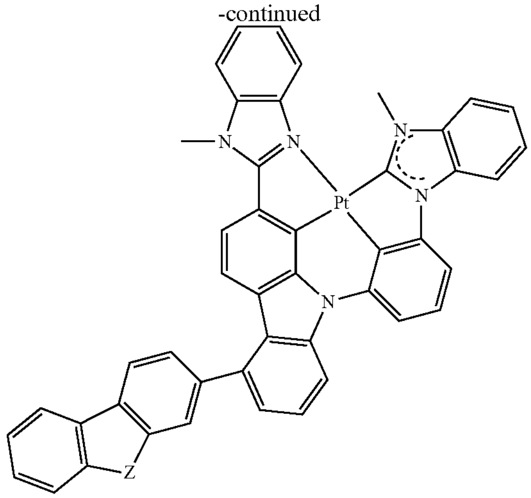
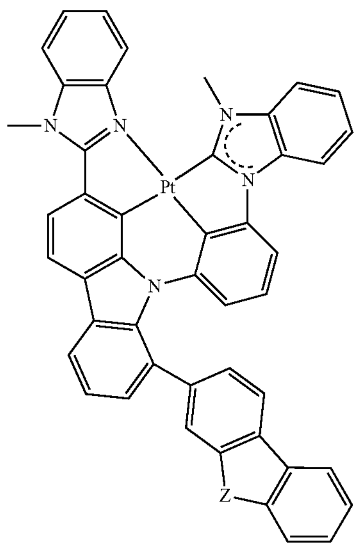
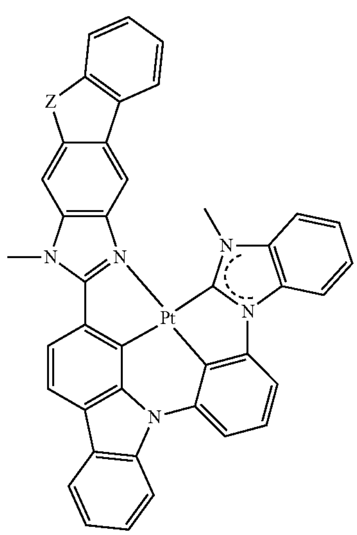
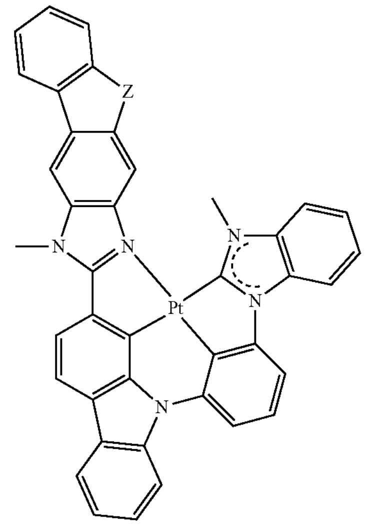
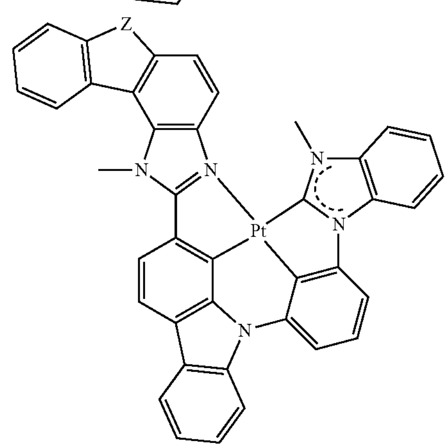
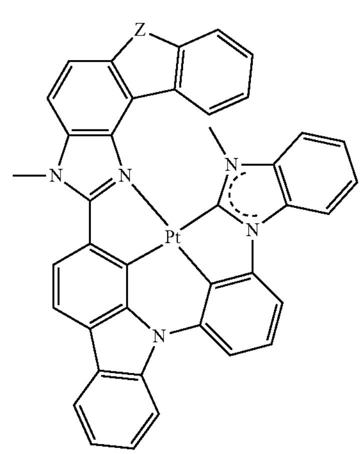

-continued
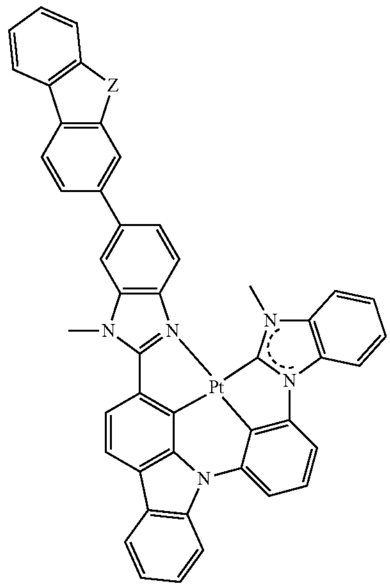
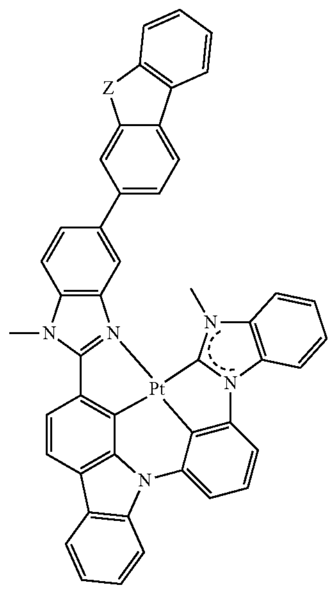
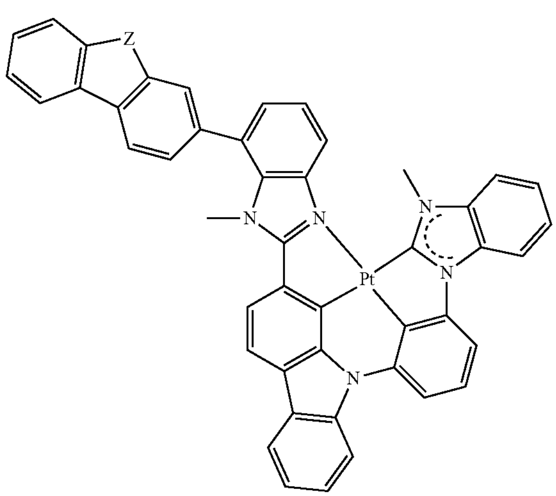
-continued
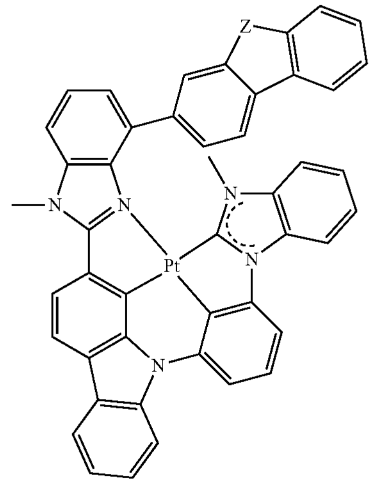
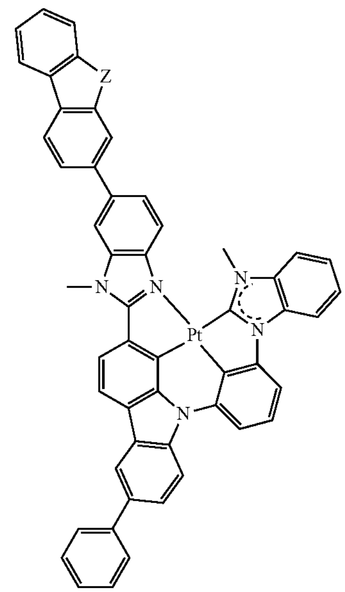
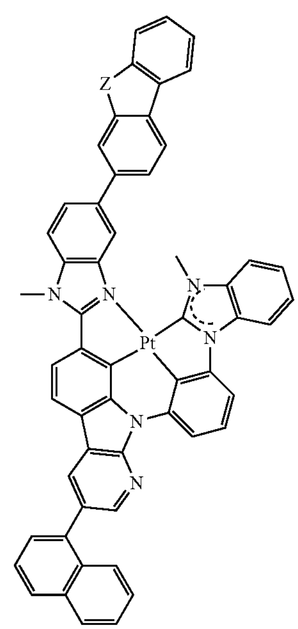

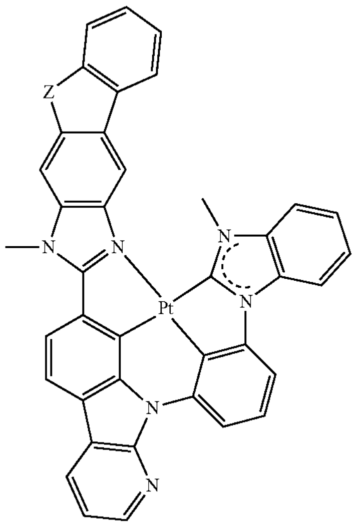
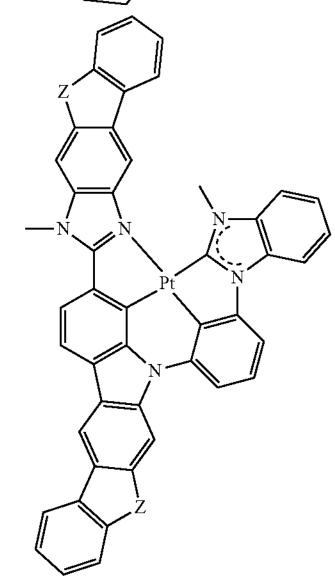
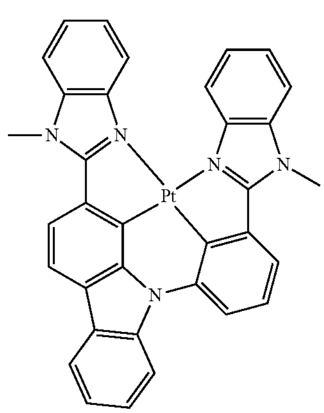
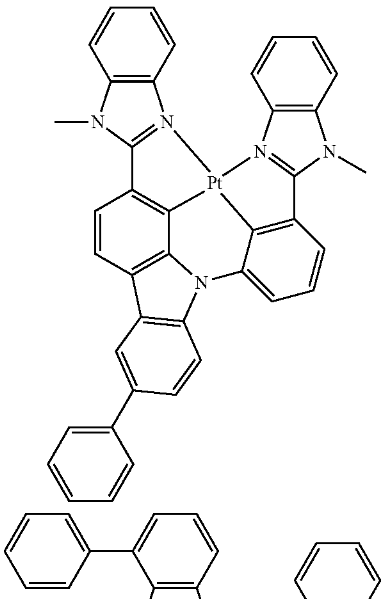
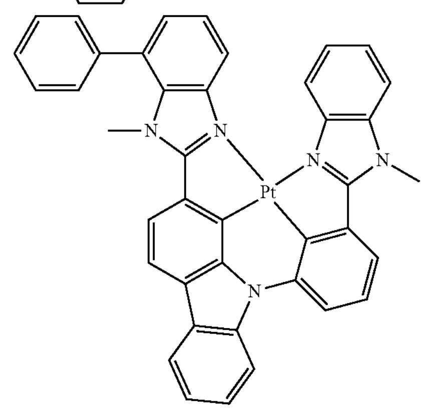
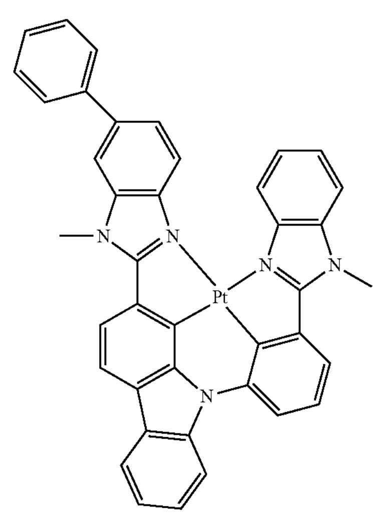

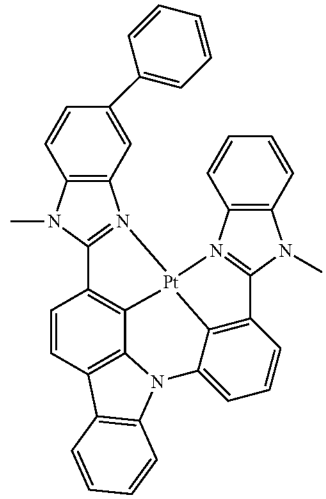
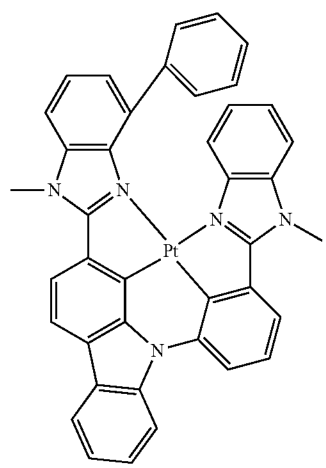
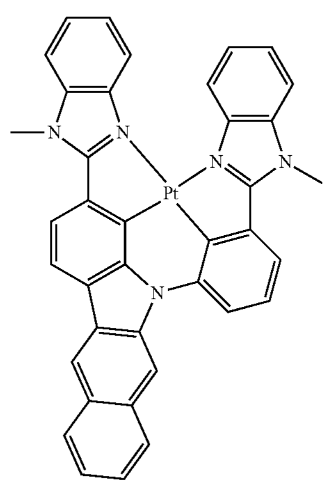
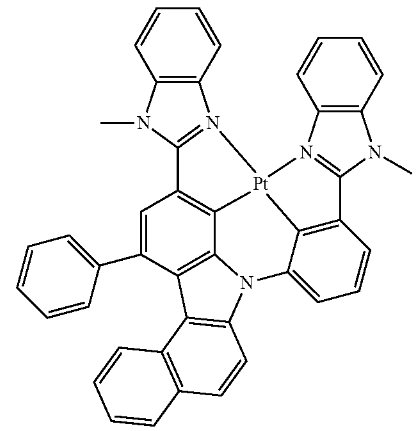
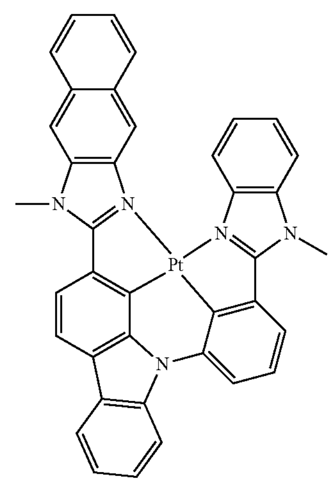
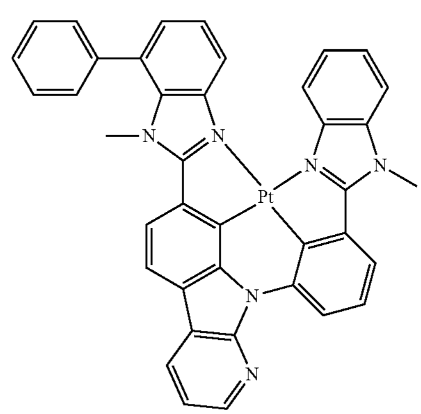

-continued
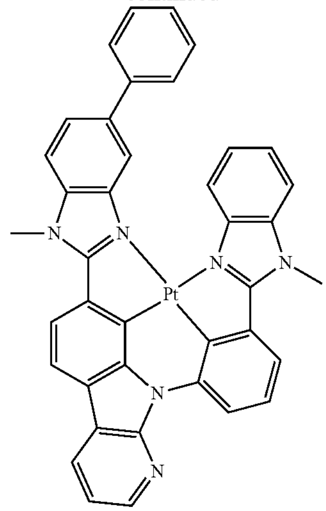
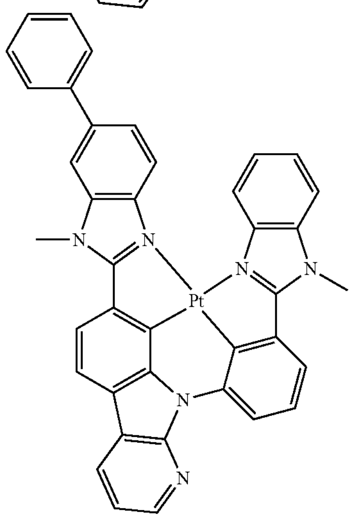
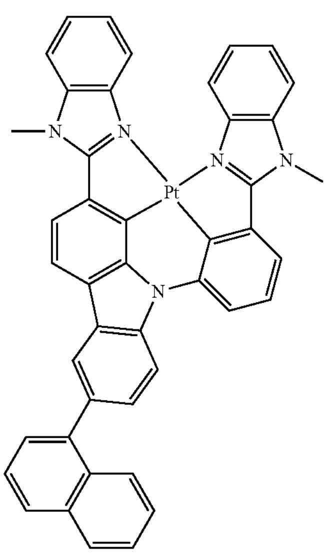
-continued
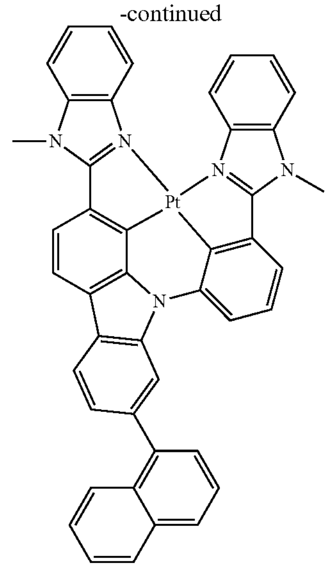
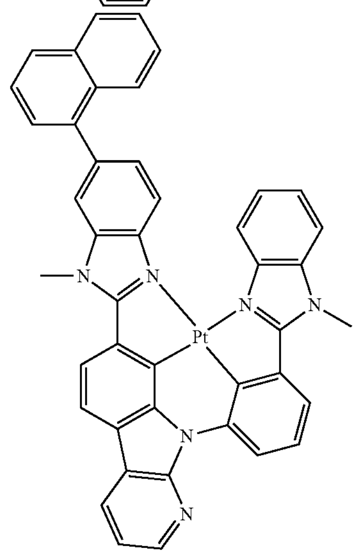
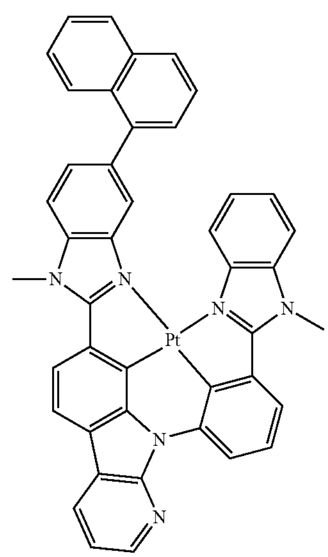

-continued
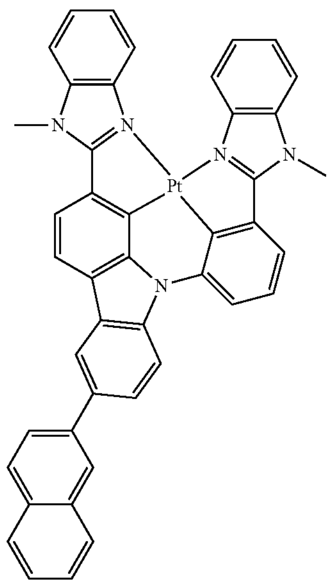
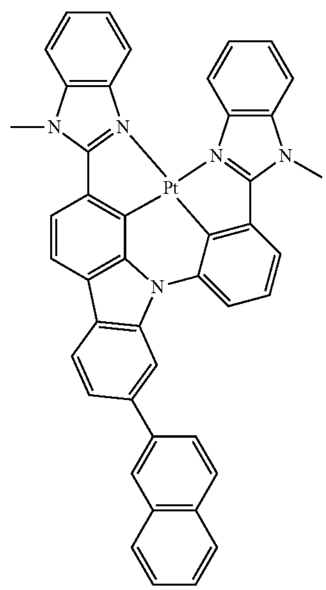
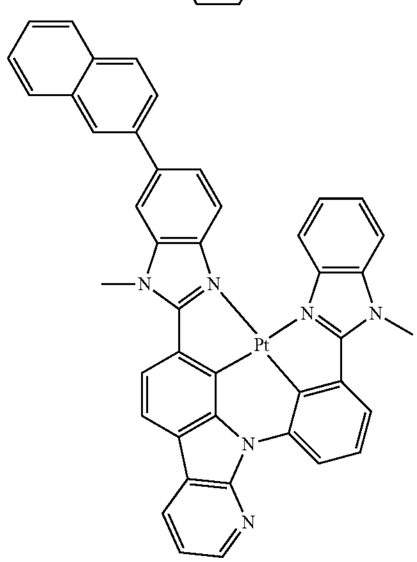
-continued
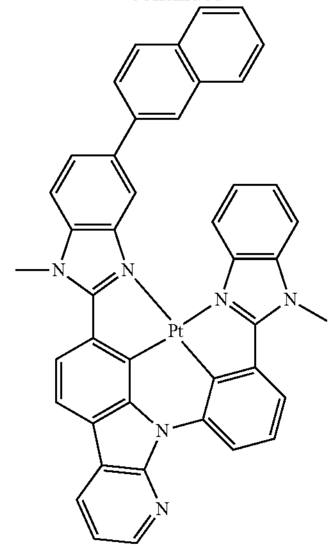
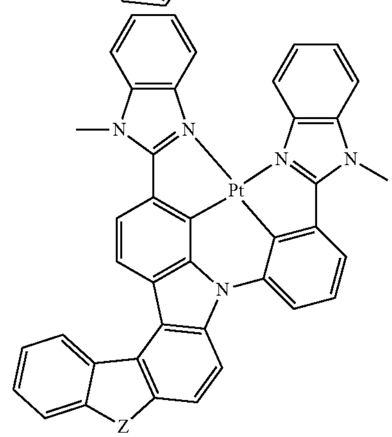
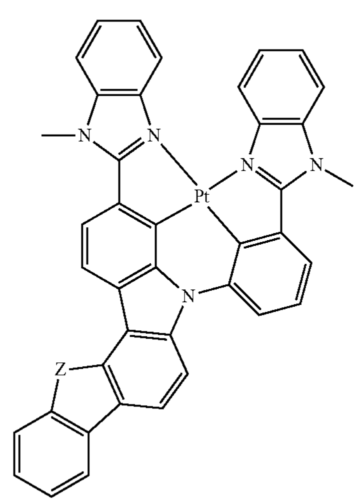

-continued
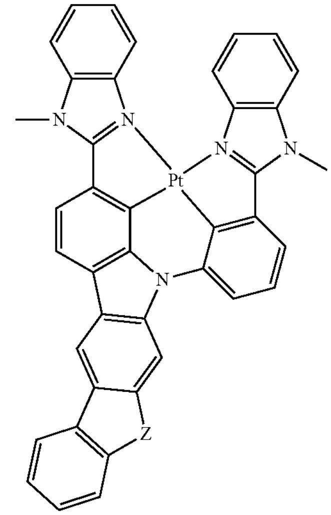
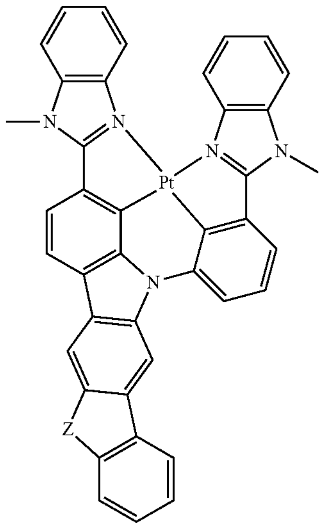
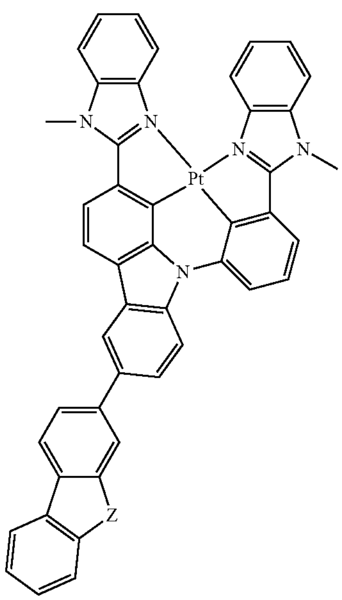
-continued
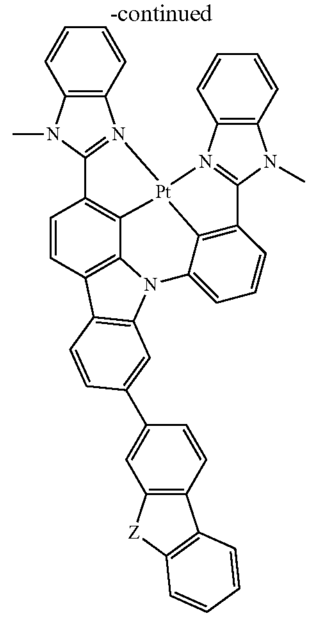
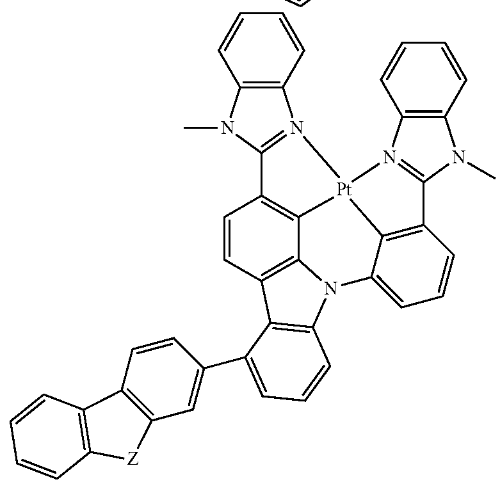
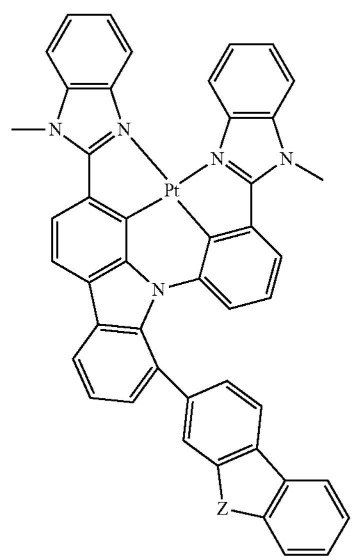

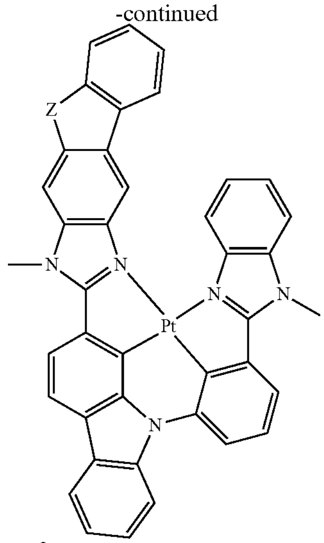
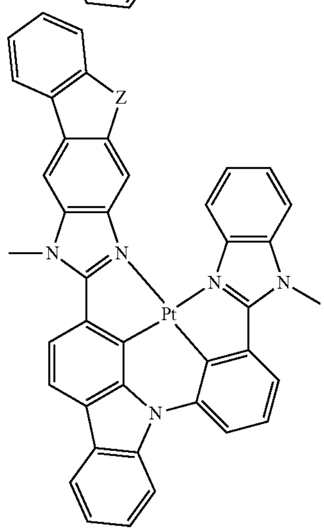
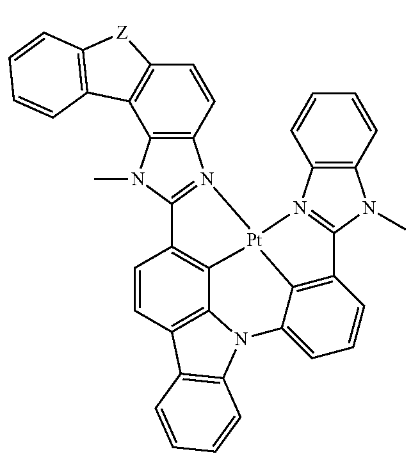
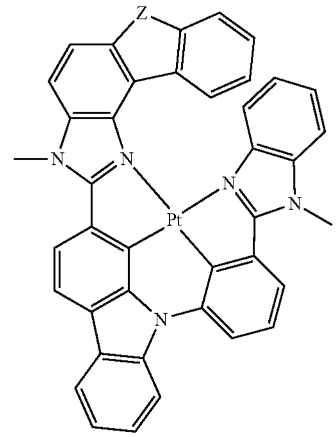
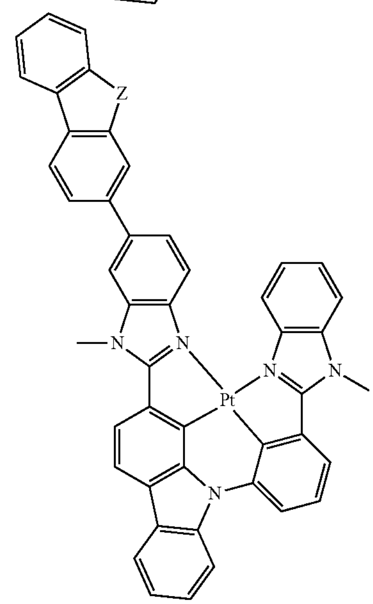
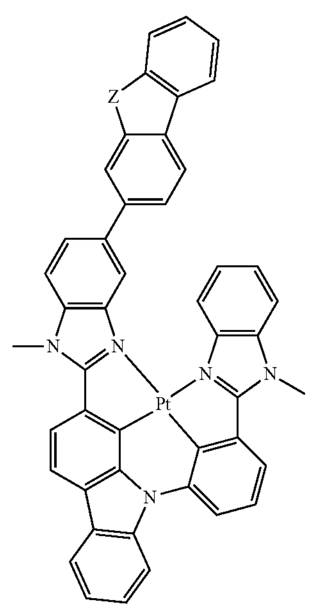

-continued
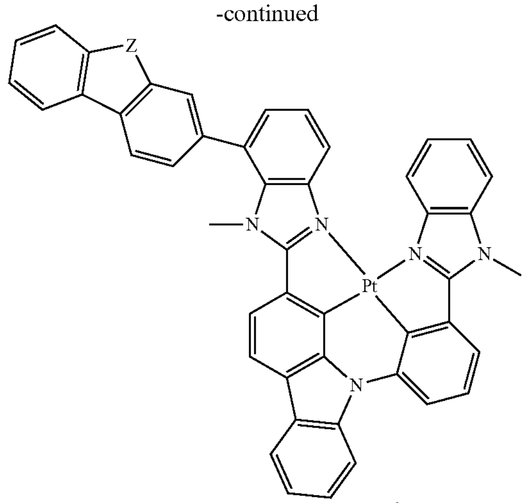
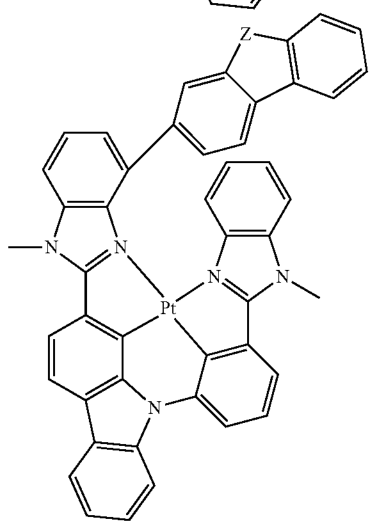
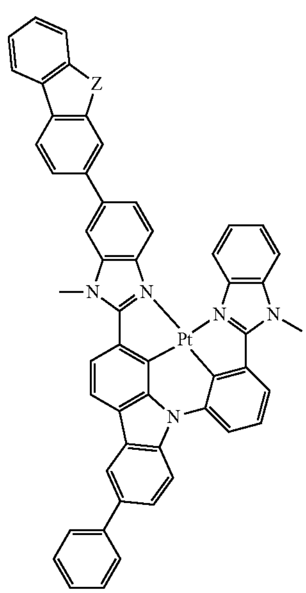
-continued
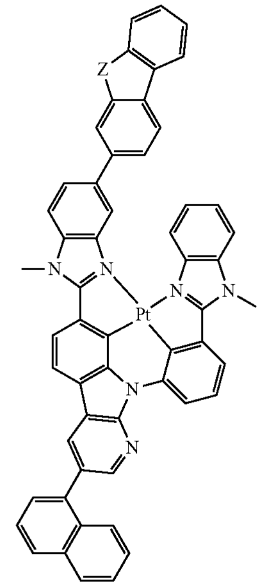
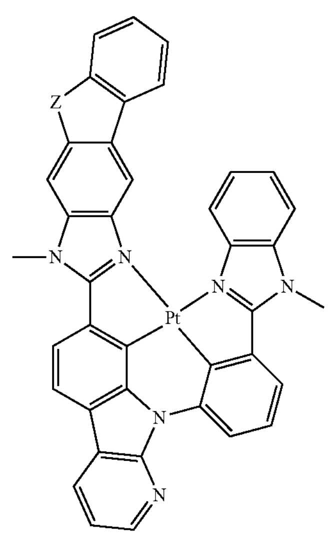

-continued
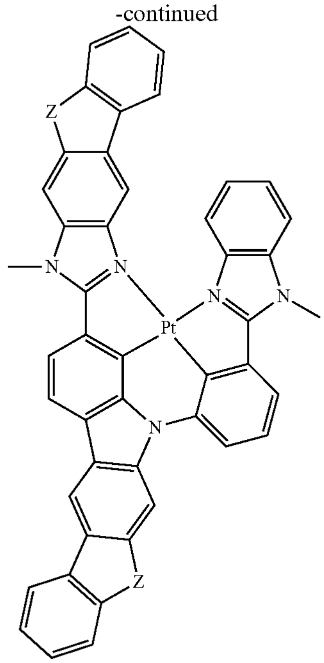
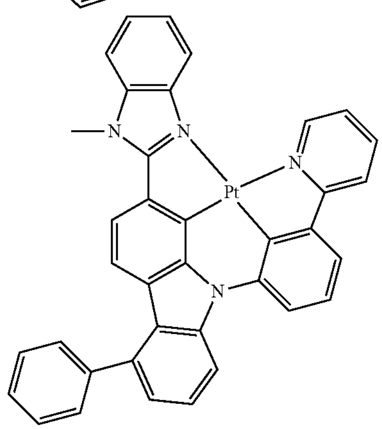
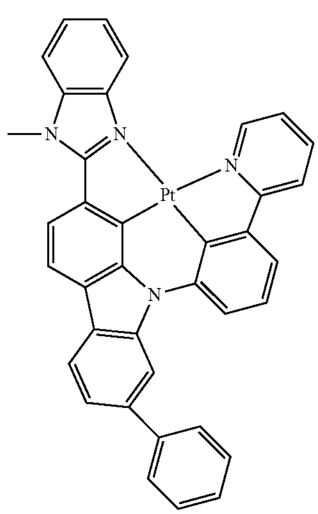
-continued
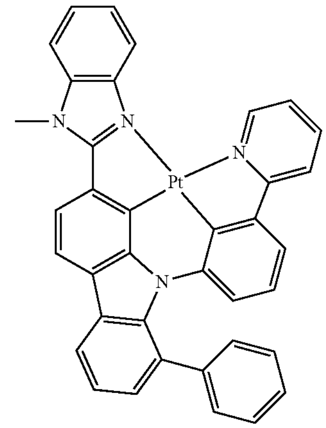
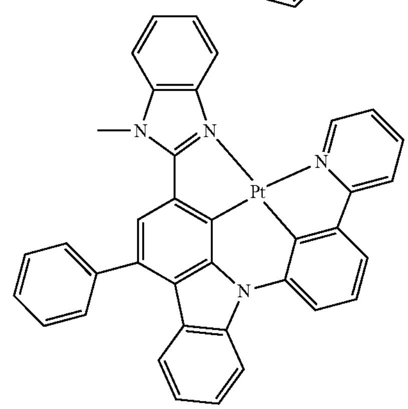
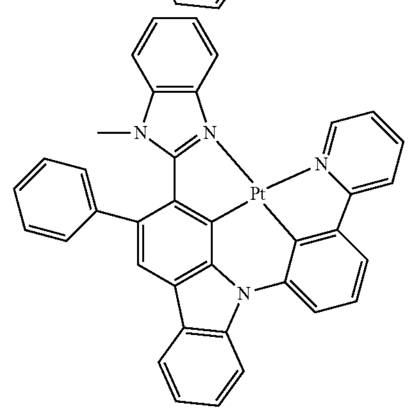
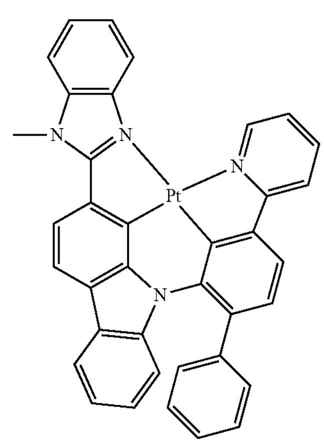

-continued
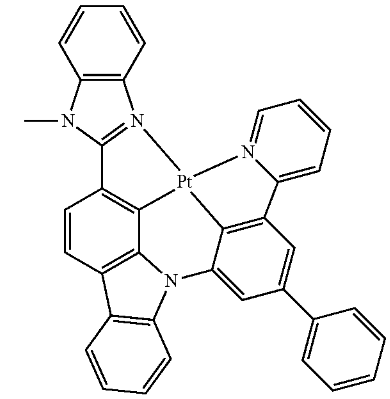
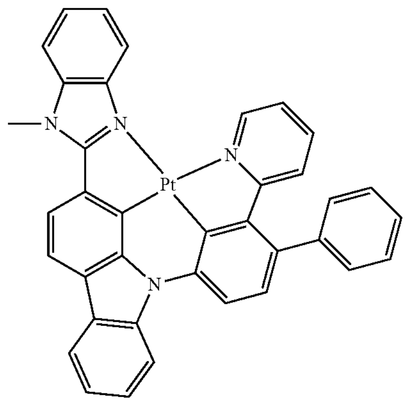
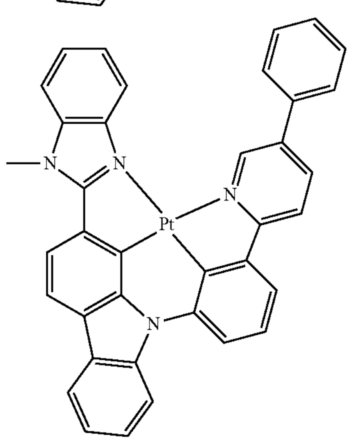
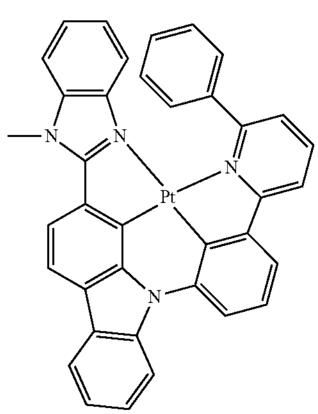
-continued
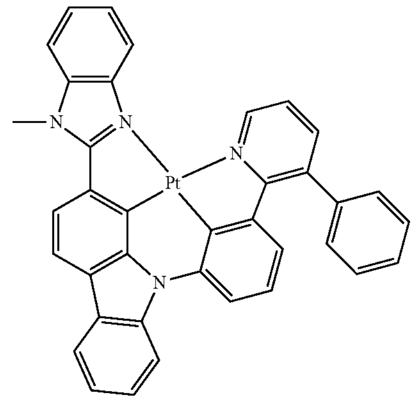
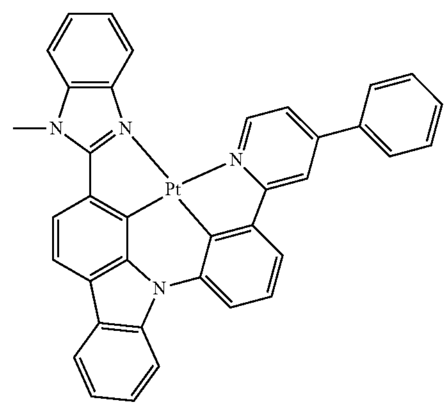
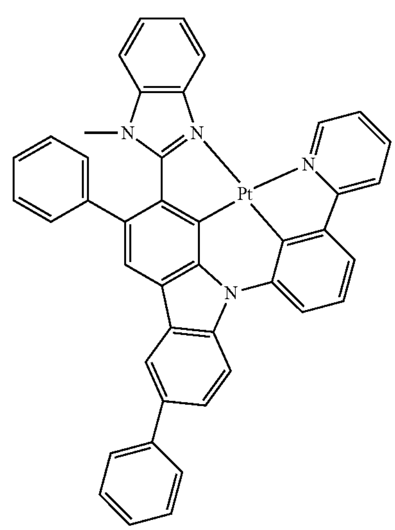

-continued
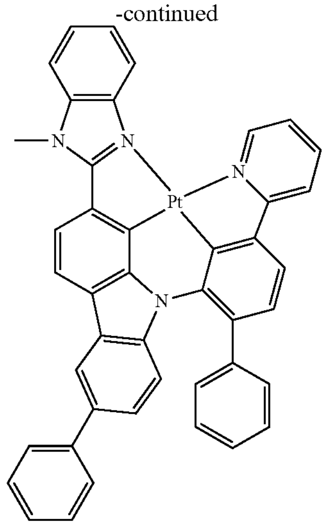
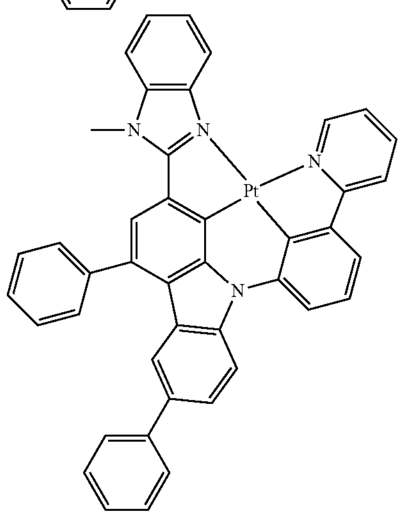
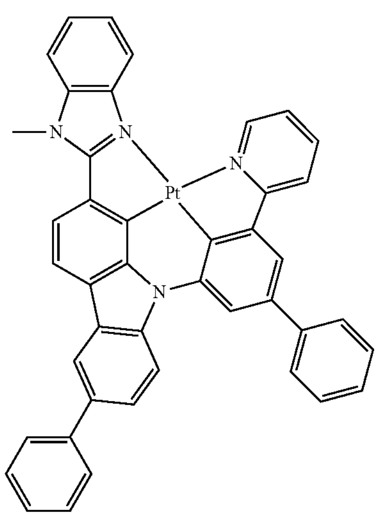
-continued
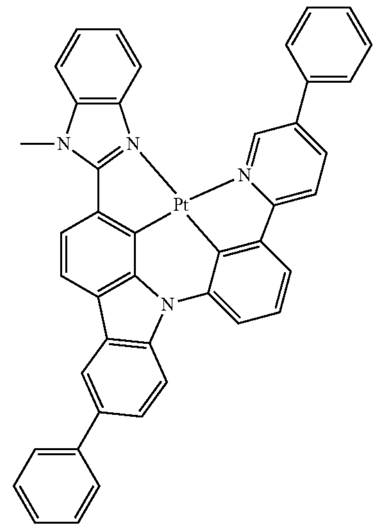
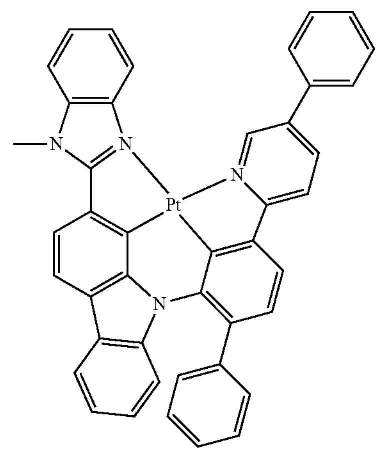
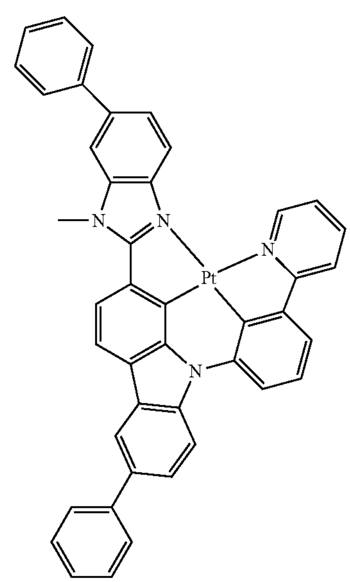

-continued
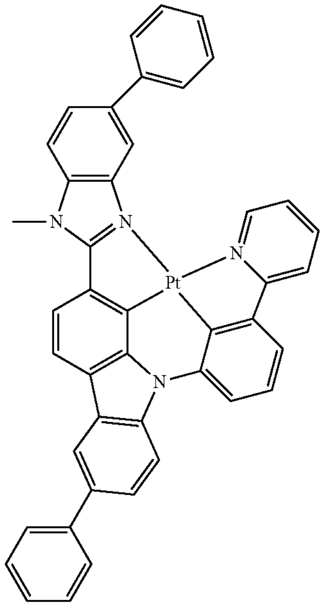
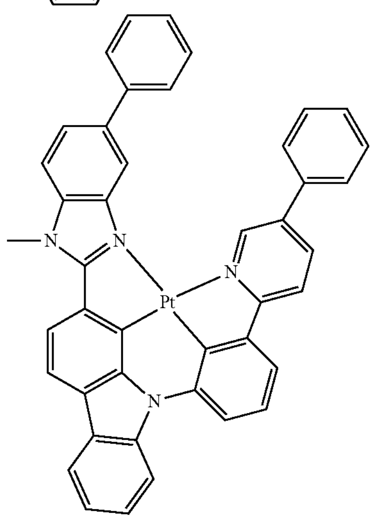
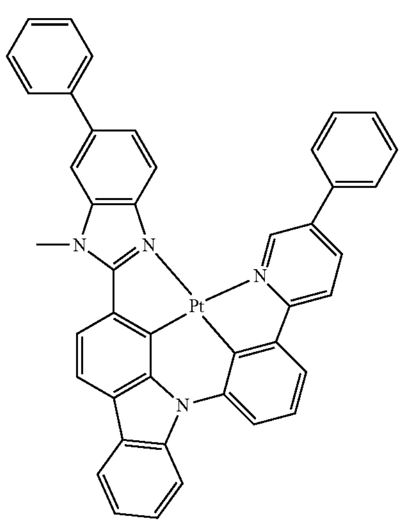
-continued
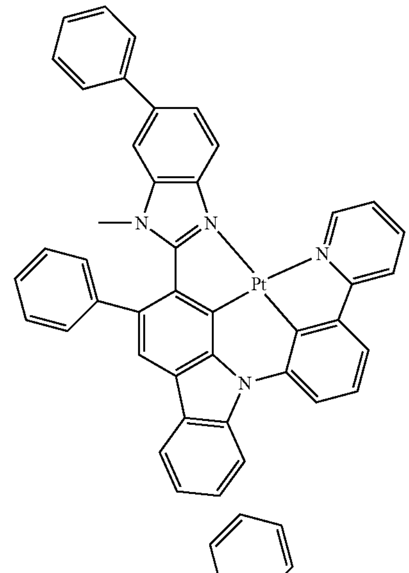
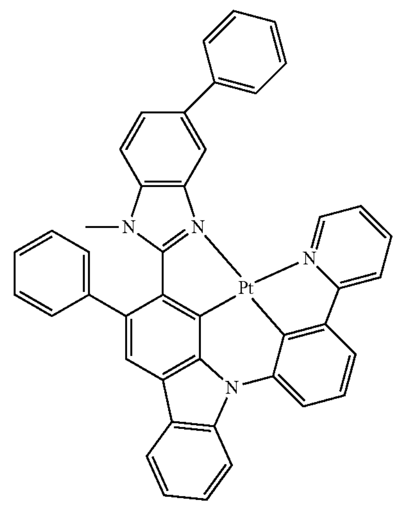
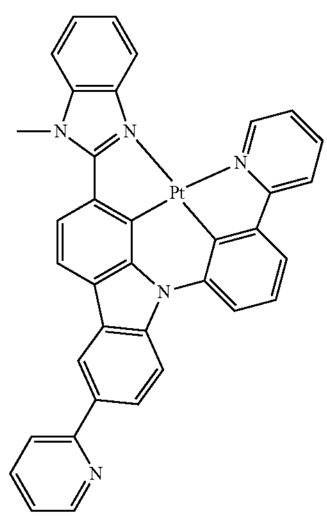

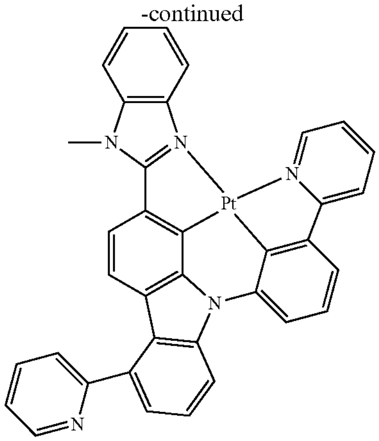
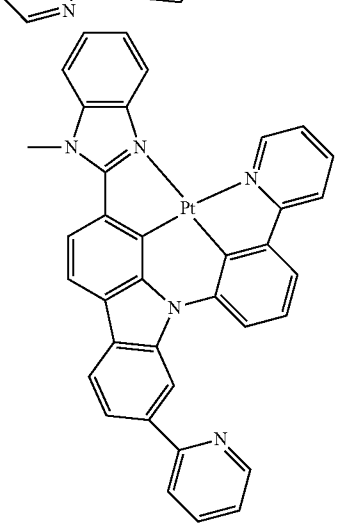
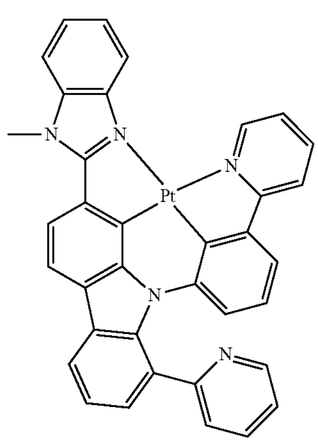
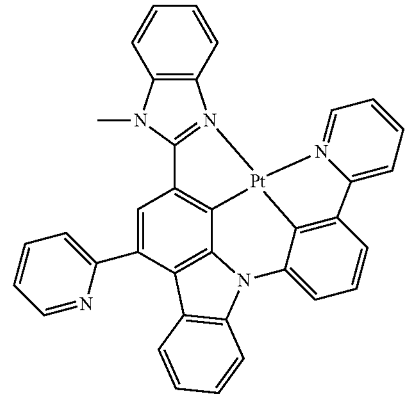
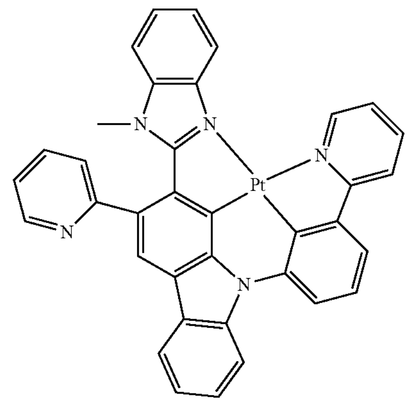
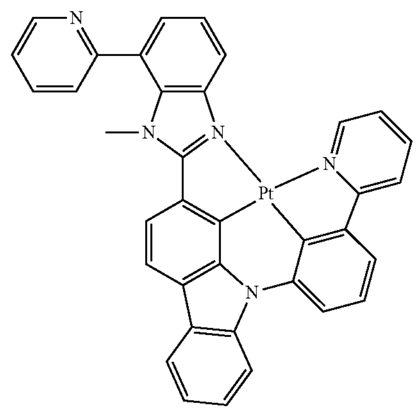
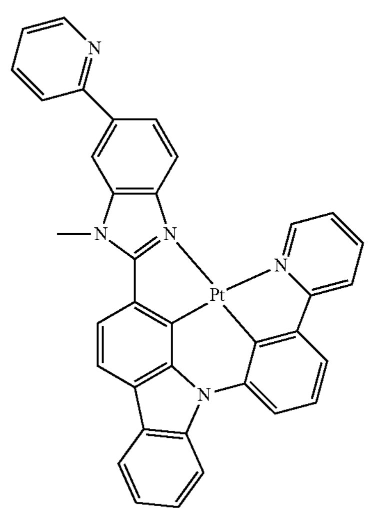

-continued
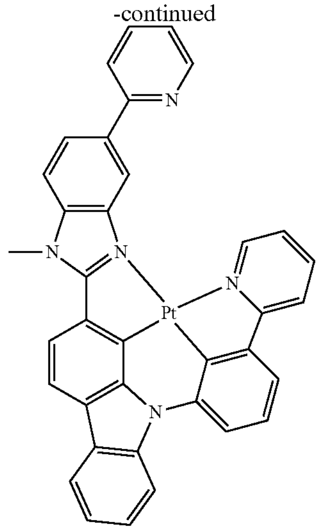
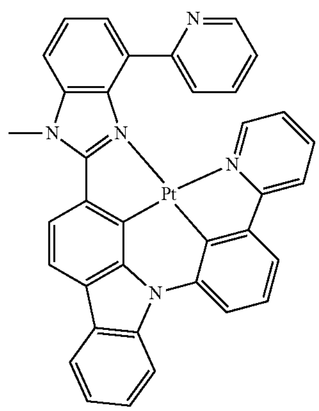
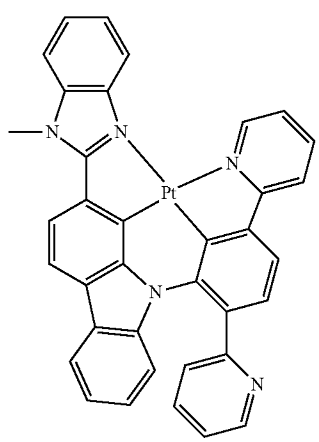
-continued
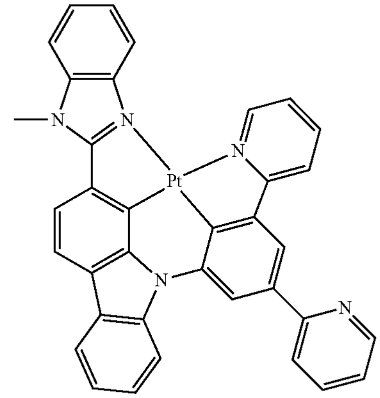
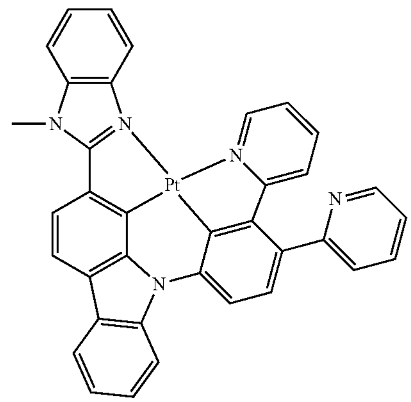
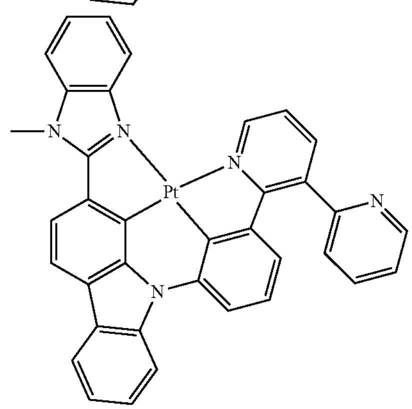
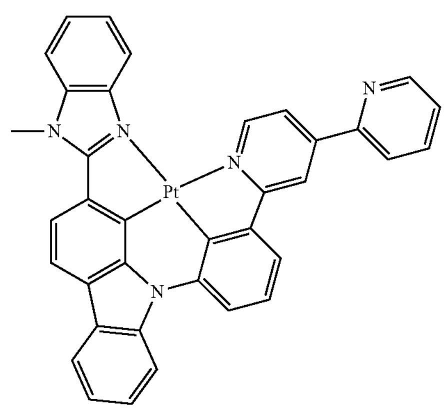

-continued
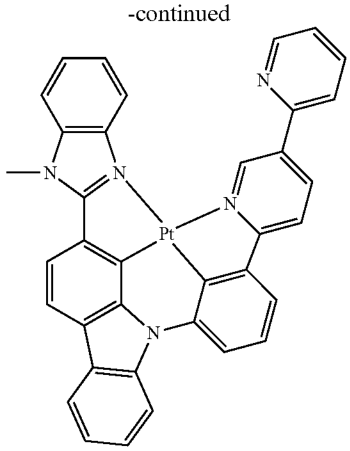
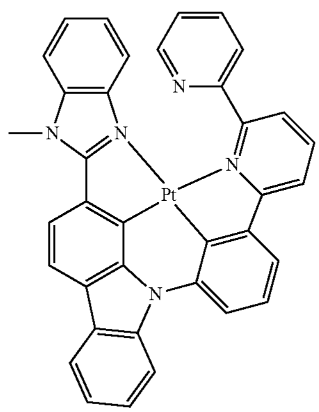
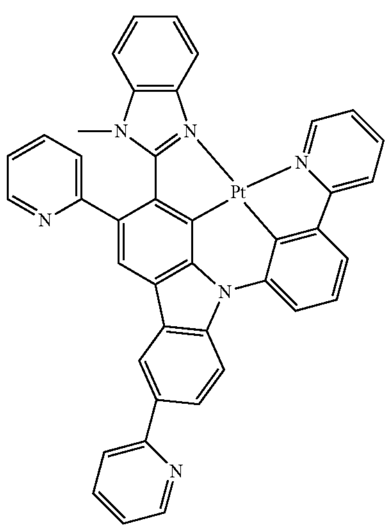
-continued
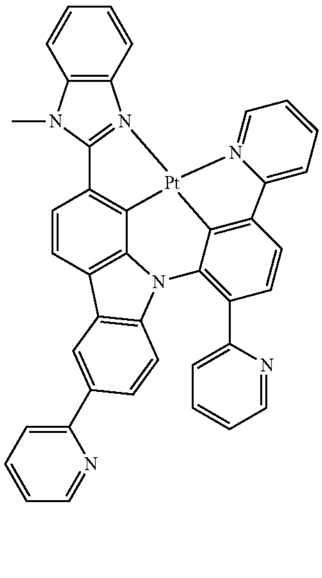
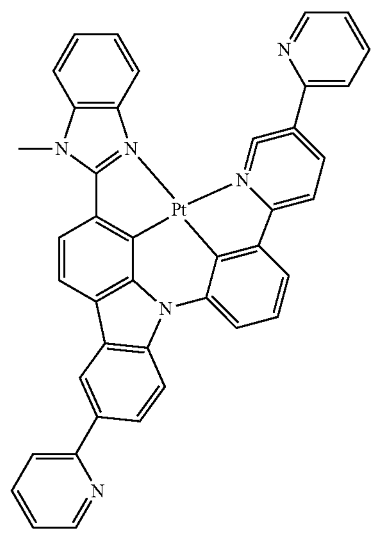
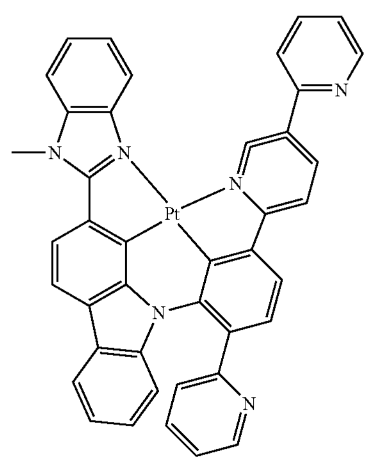

-continued
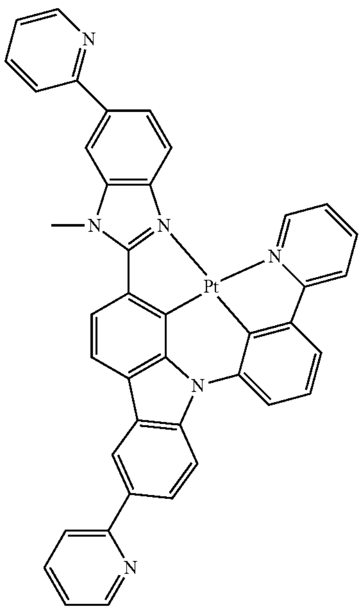
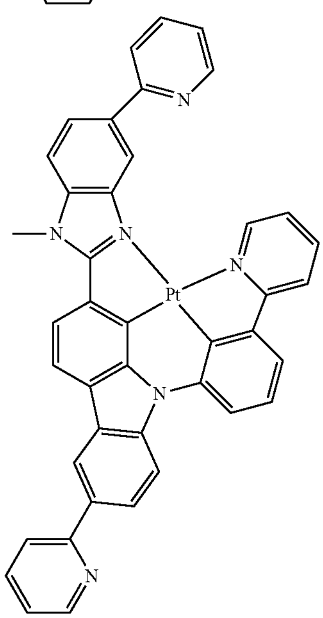
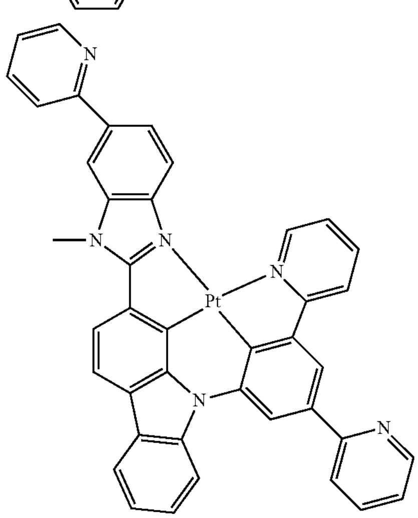
-continued
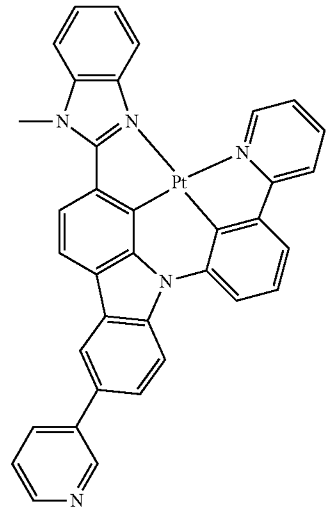
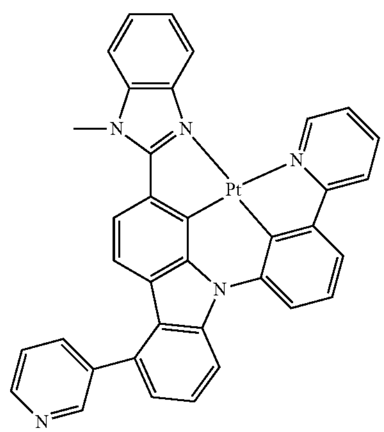
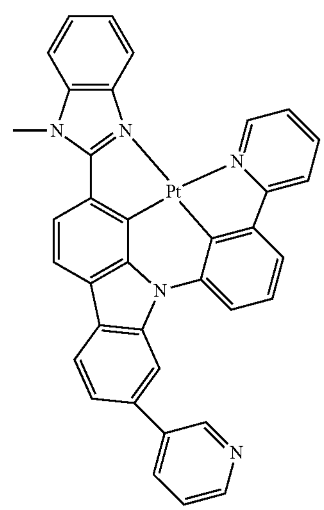

-continued
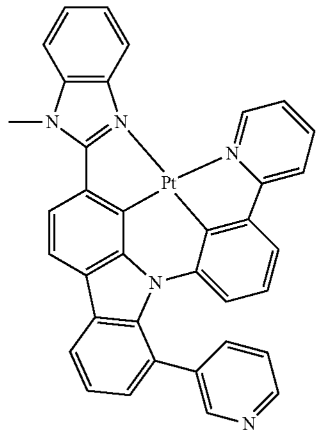
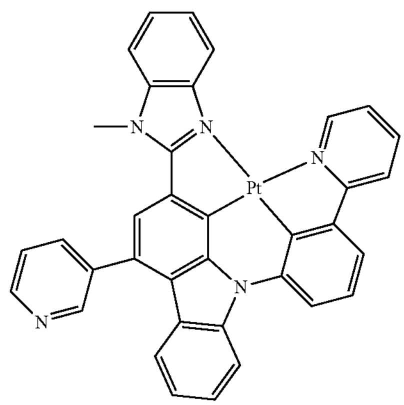
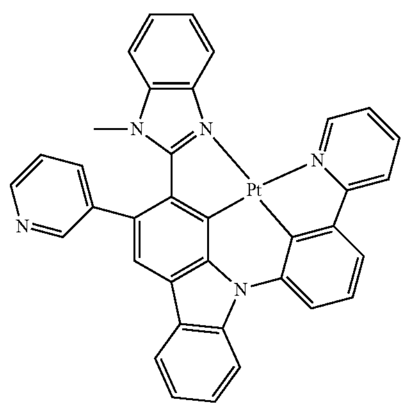
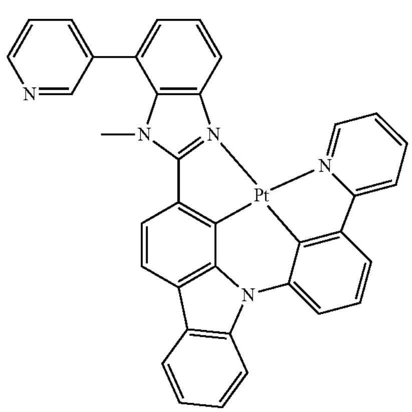
-continued
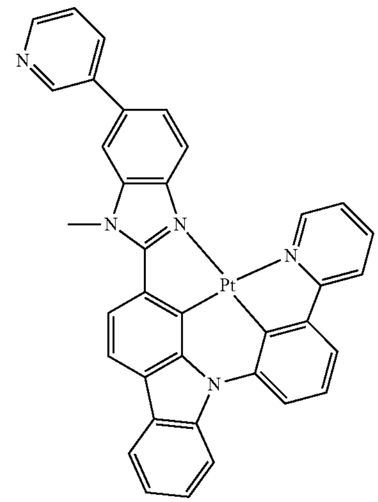
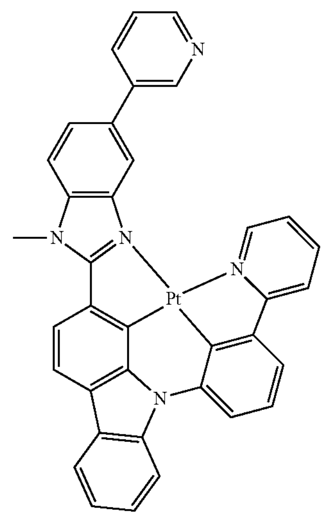
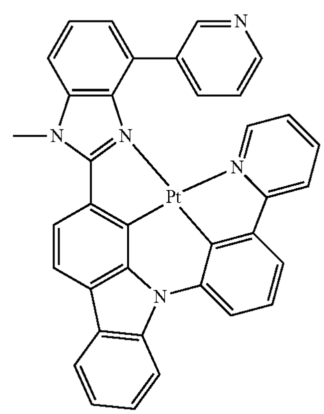

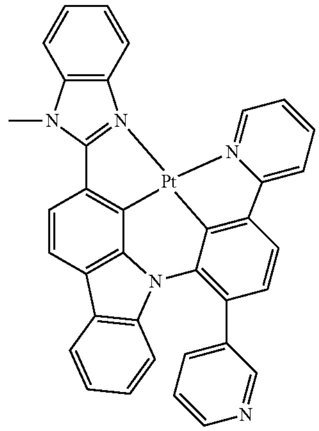
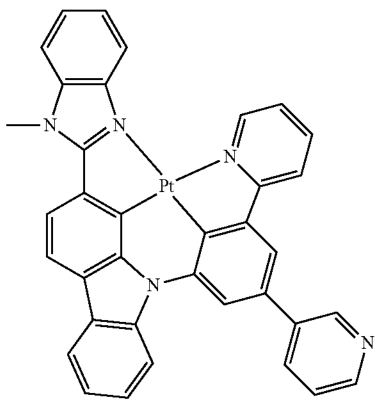
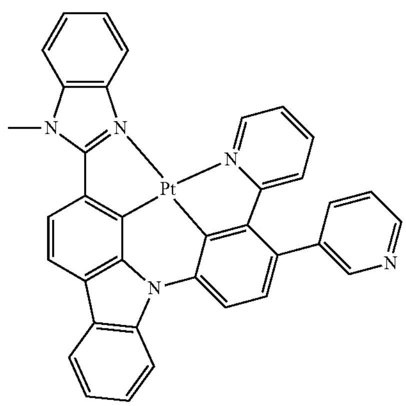
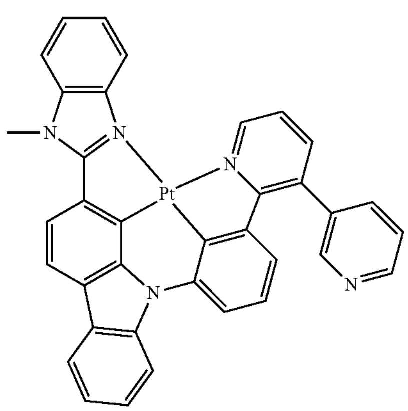
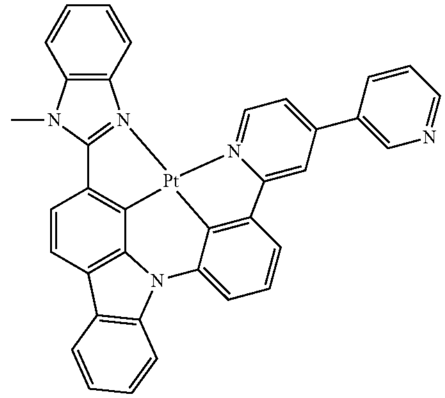
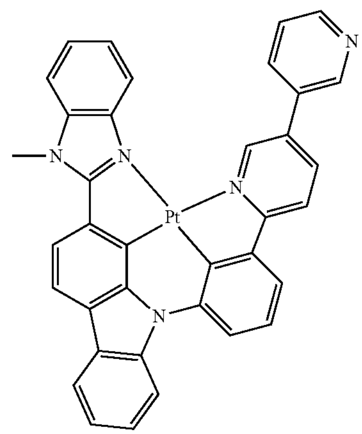
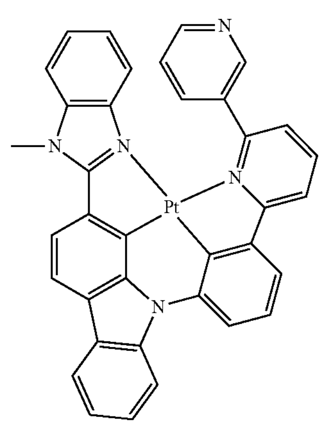

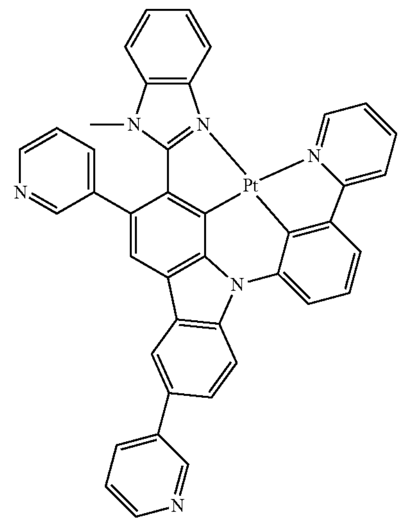
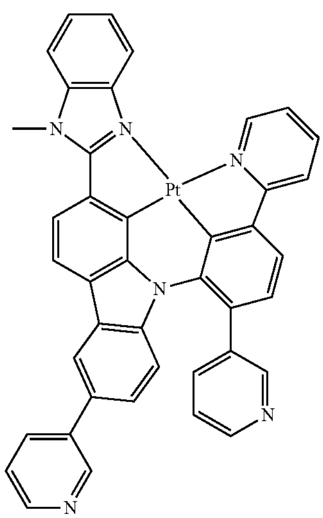
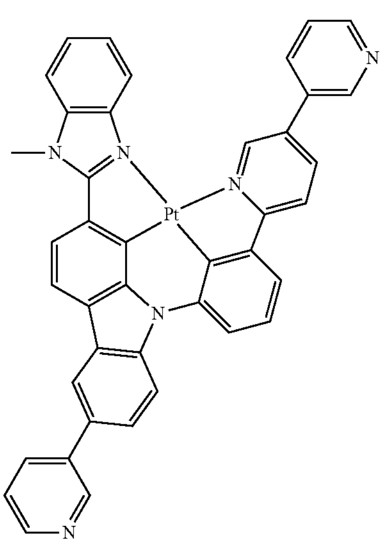
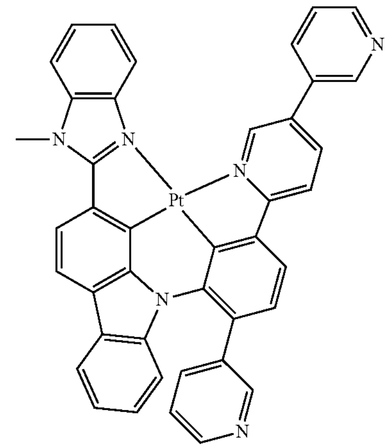
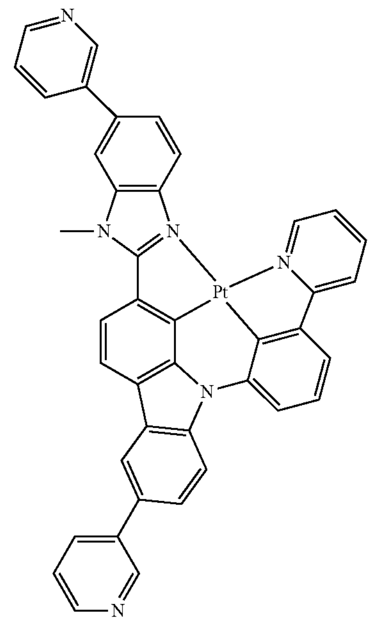
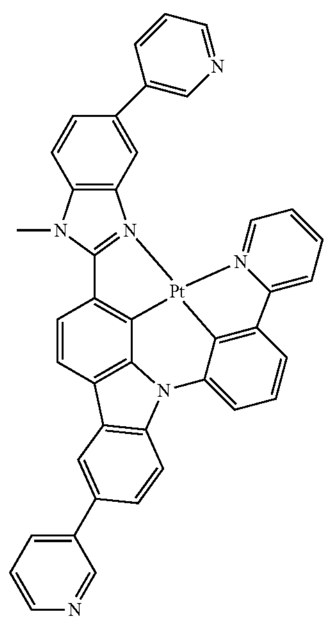

-continued
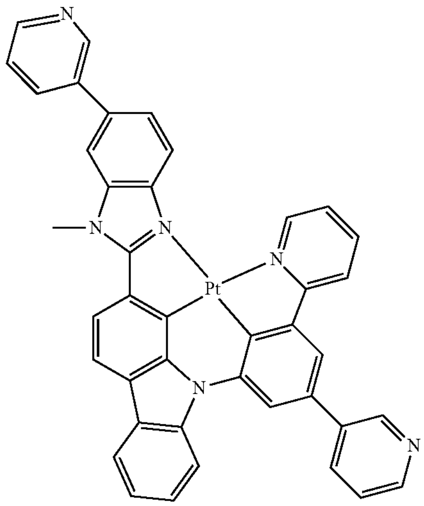
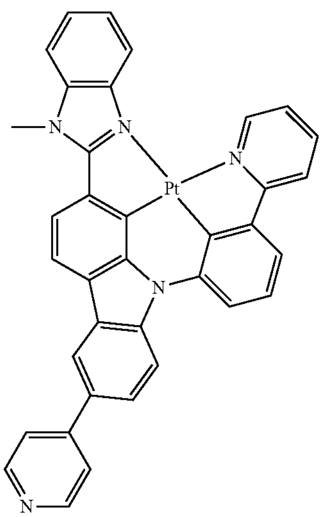
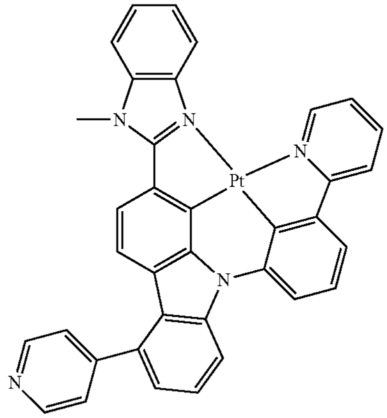
-continued
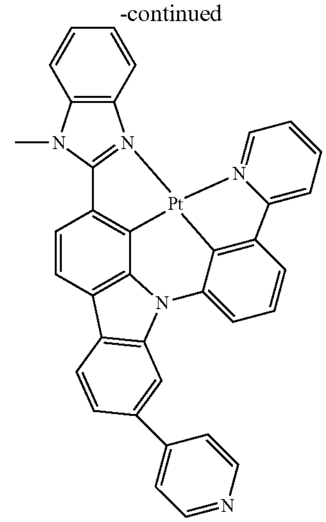
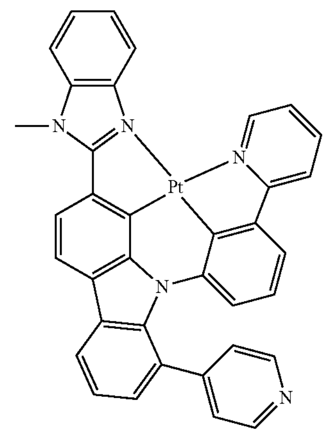
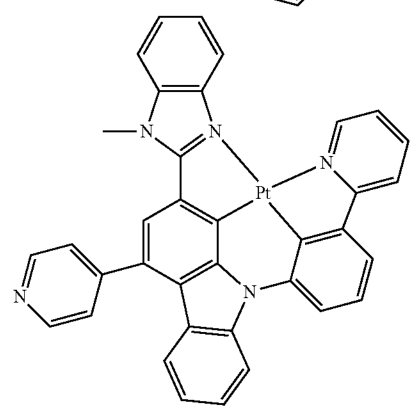
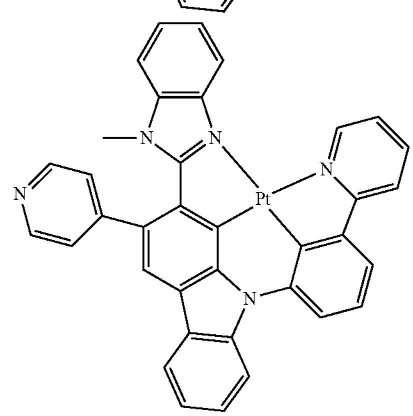

-continued
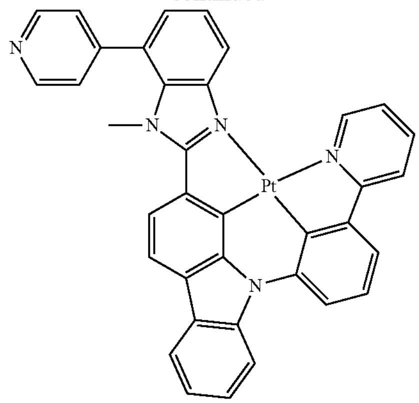
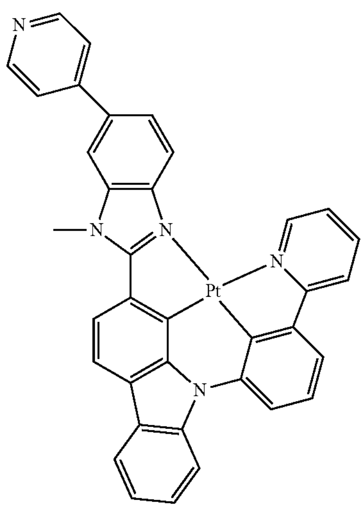
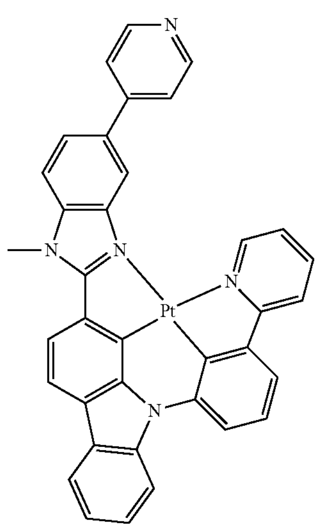
-continued
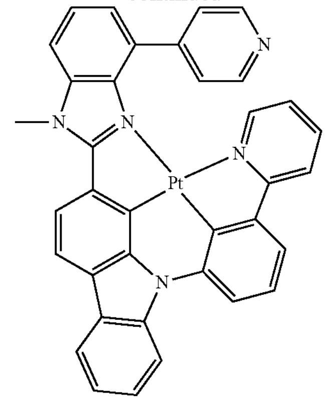
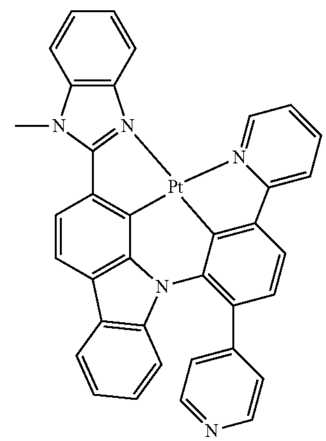
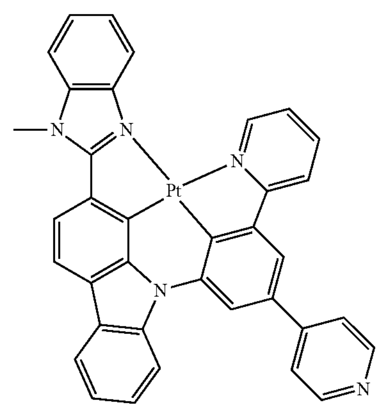
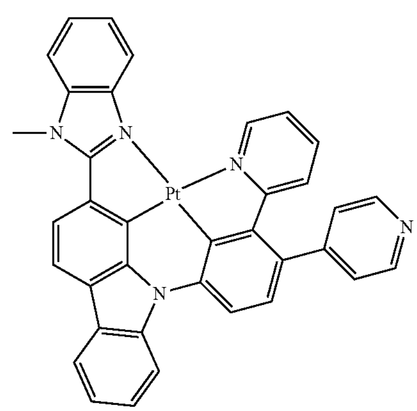

-continued
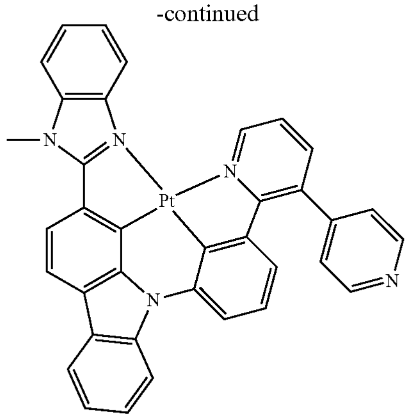
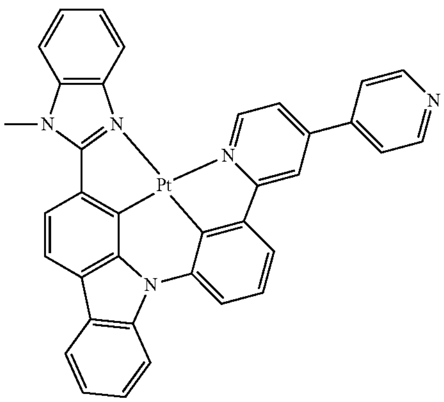
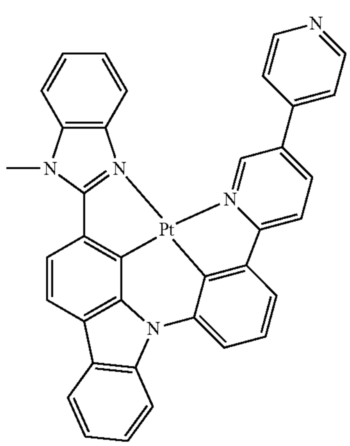
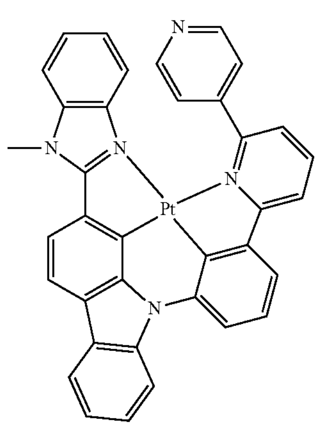
-continued
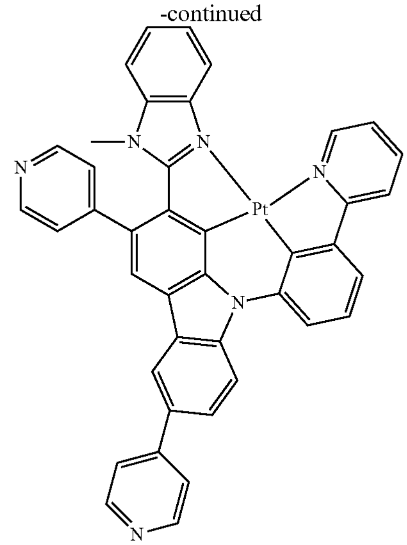
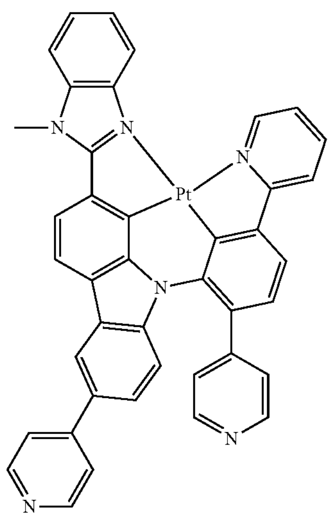
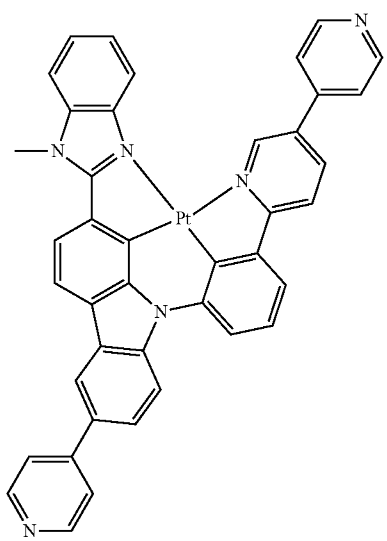

-continued
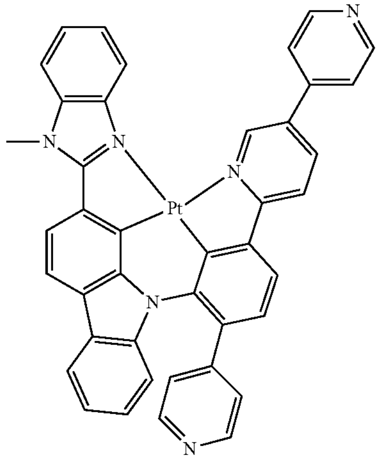
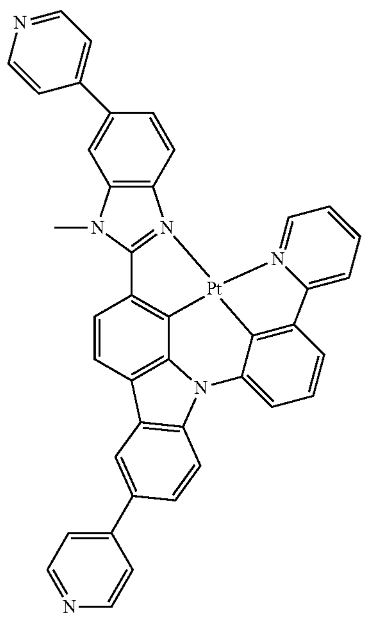
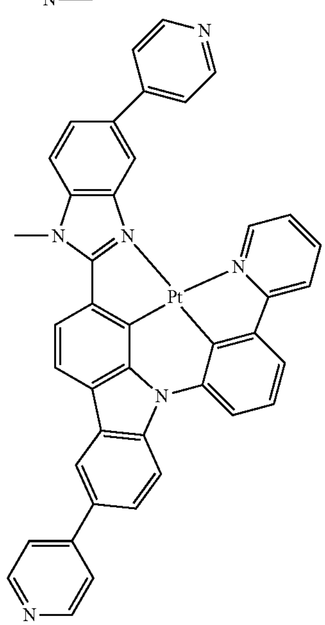
-continued
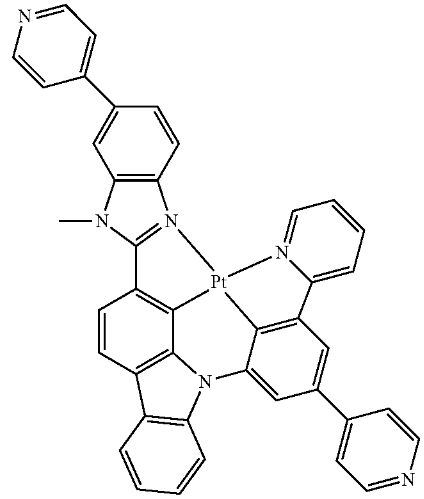
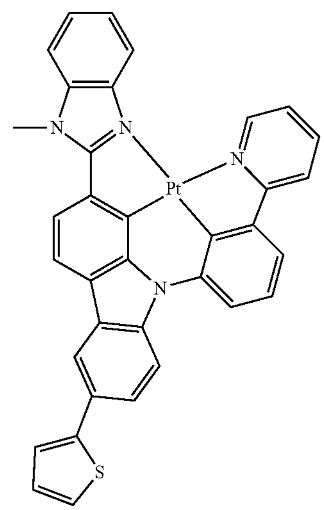
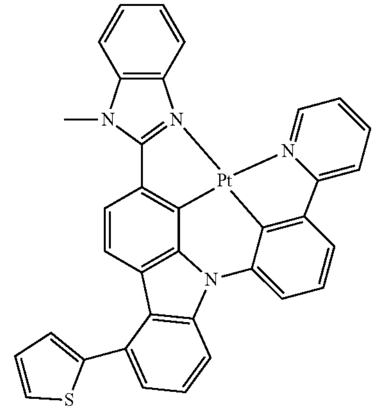

-continued
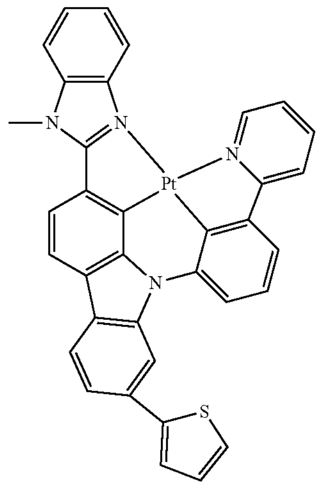
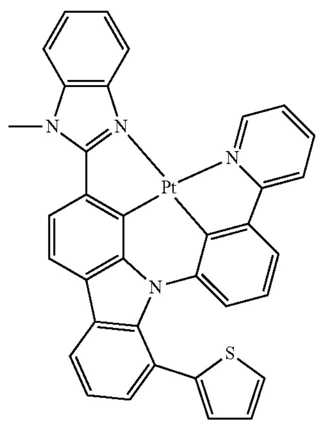
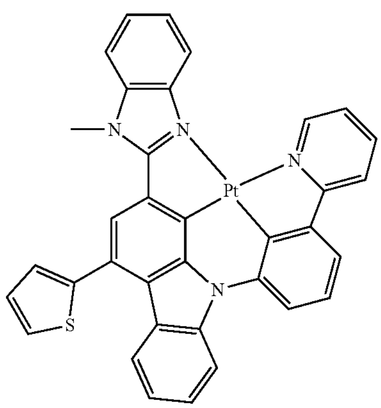
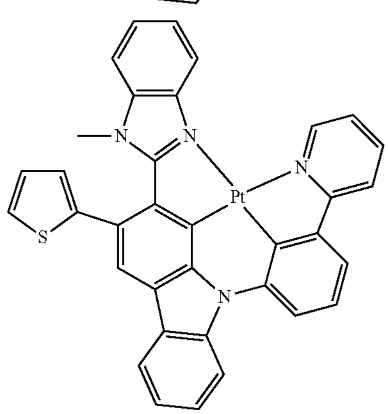
-continued
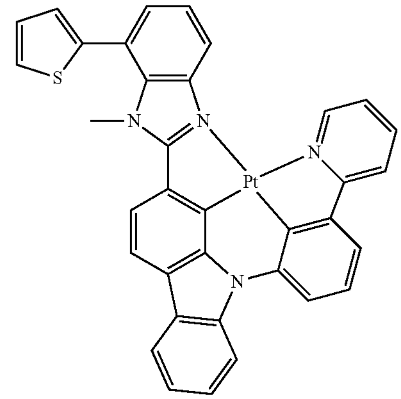
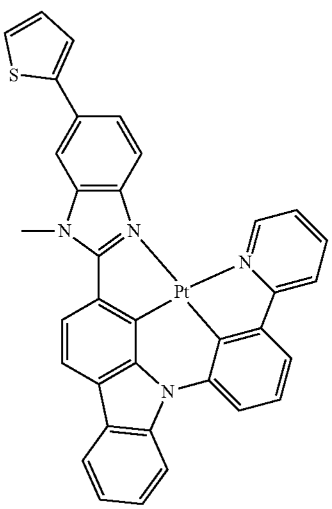
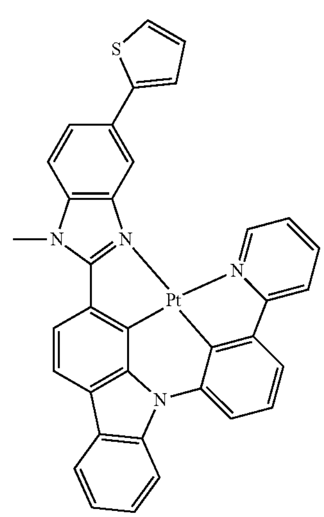

-continued
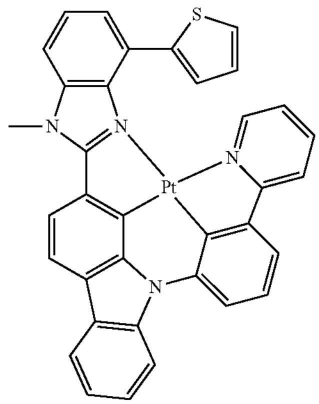
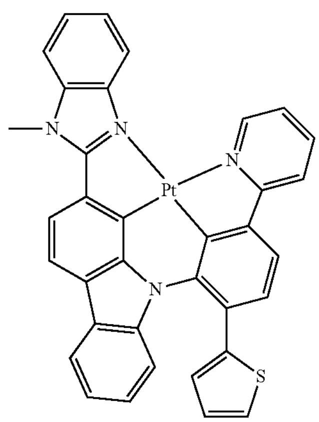
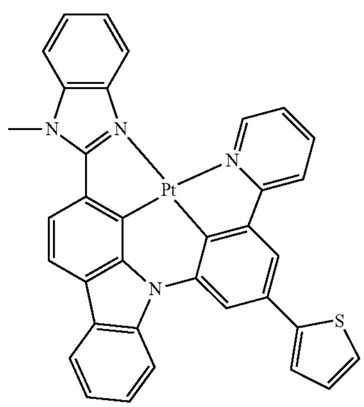
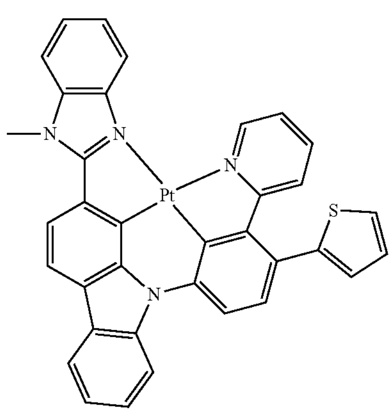
-continued
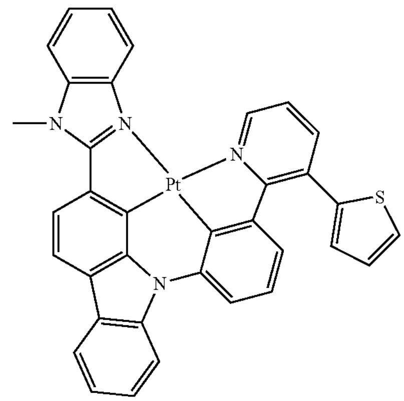
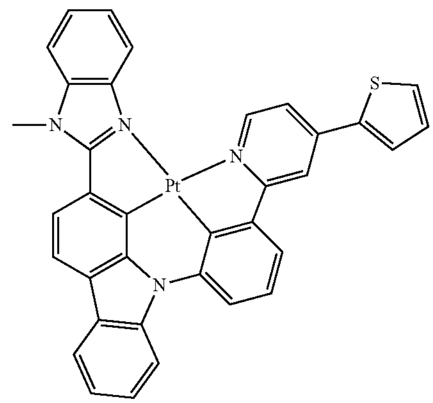
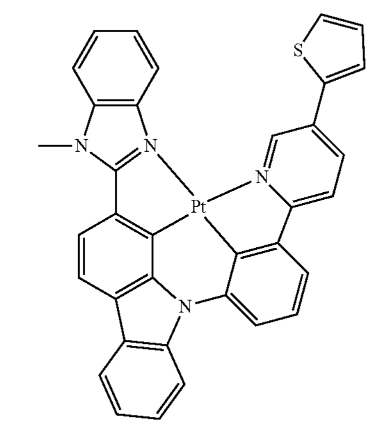
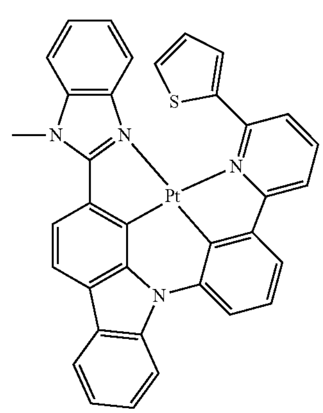

-continued
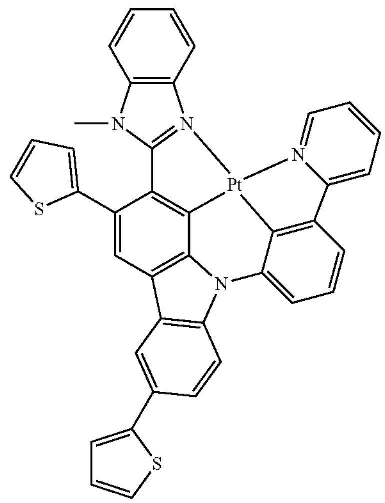
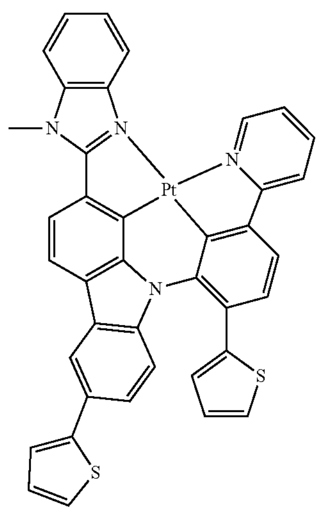
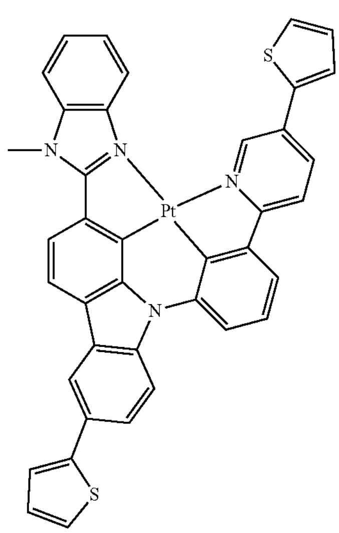
-continued
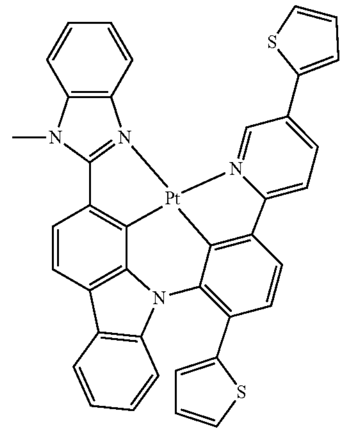
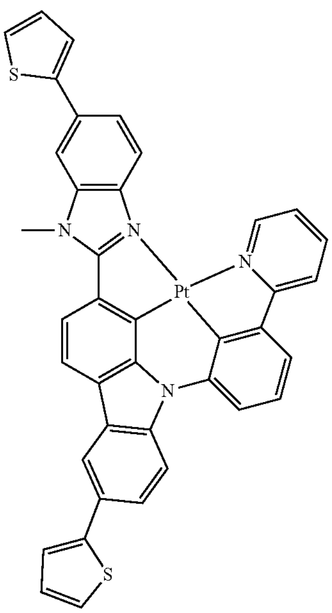
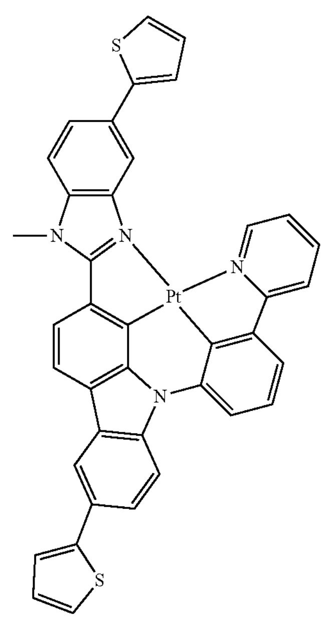

-continued
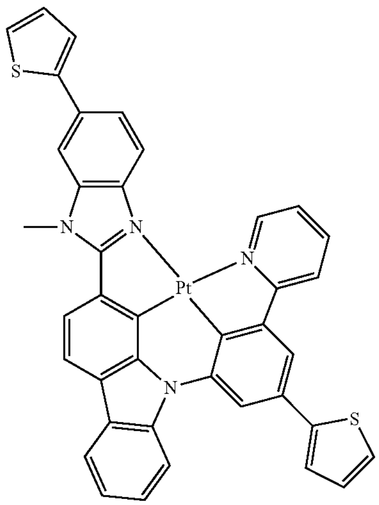
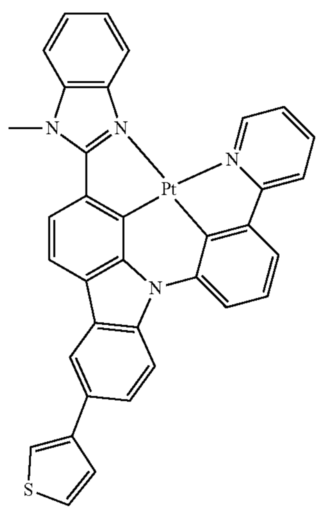
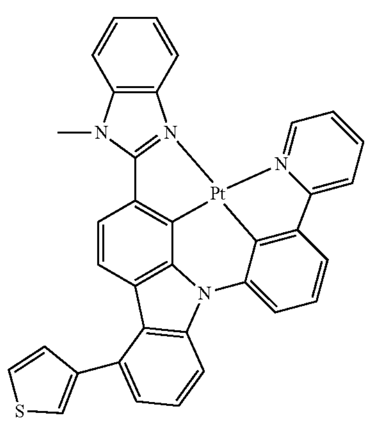
-continued
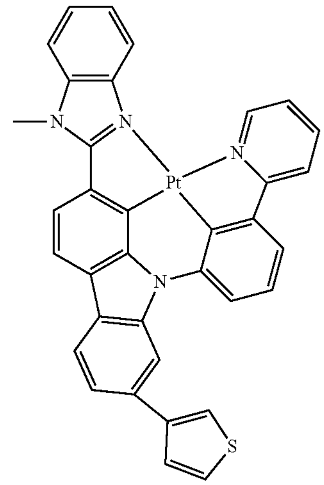
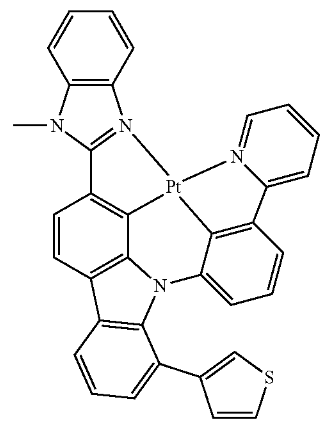
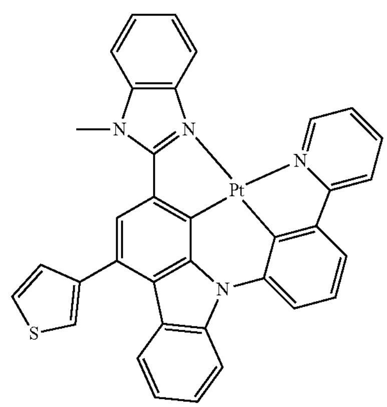
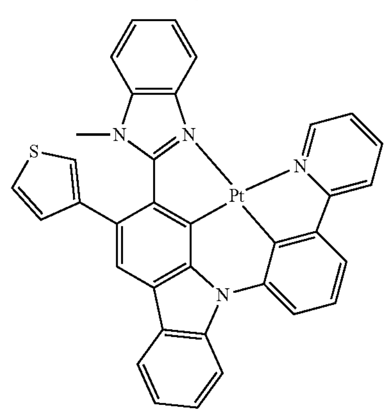

-continued
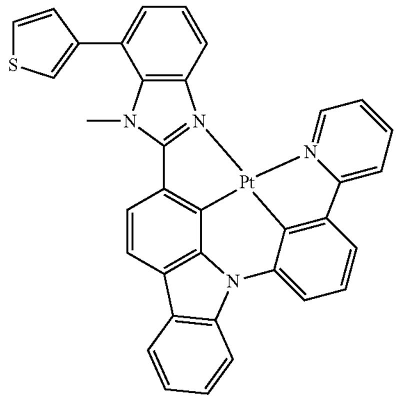
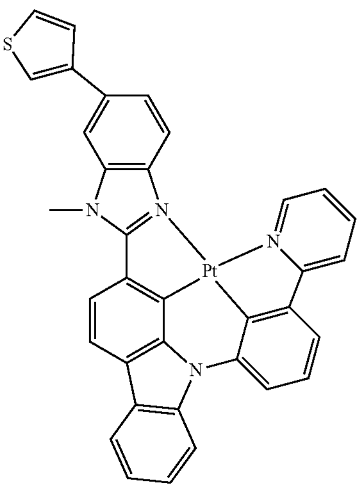
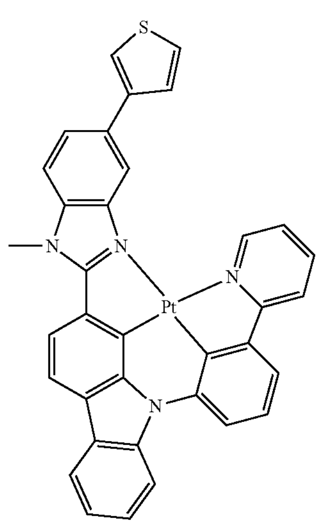
-continued
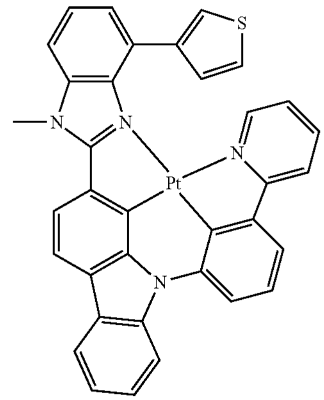
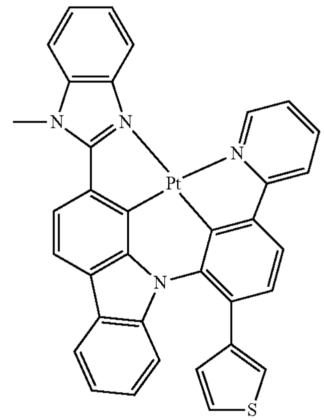
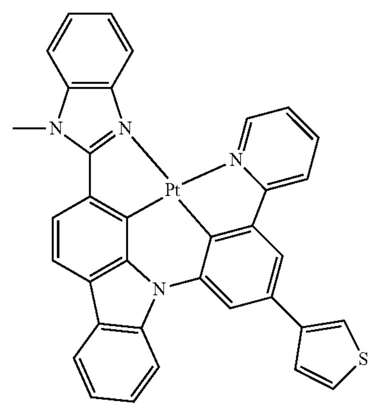

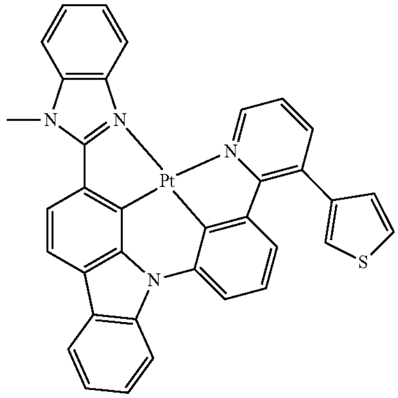
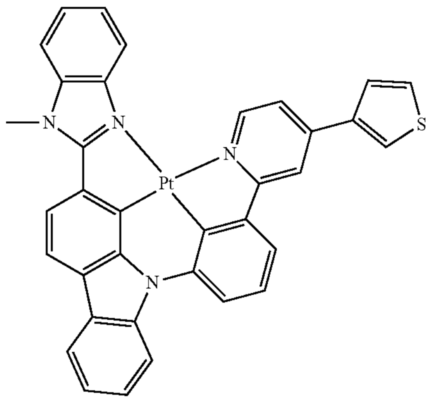
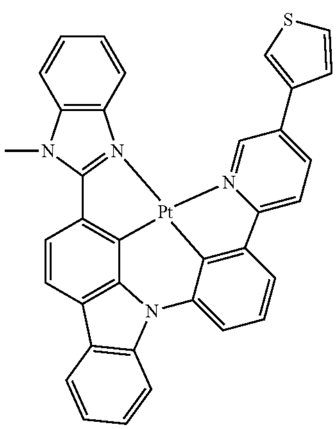
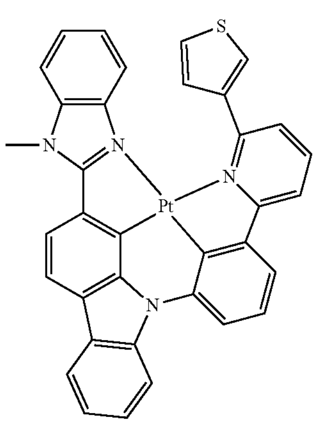
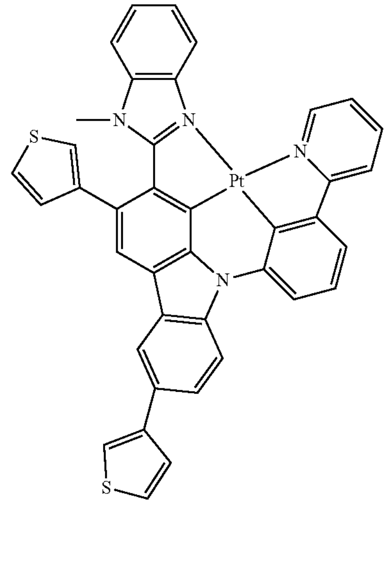
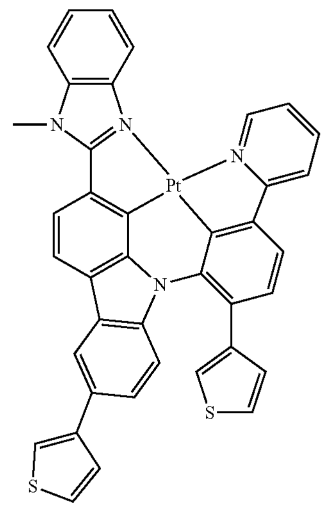
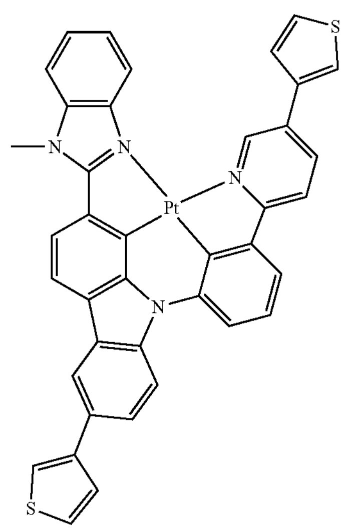

-continued
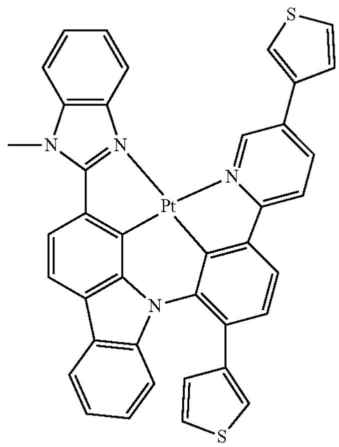
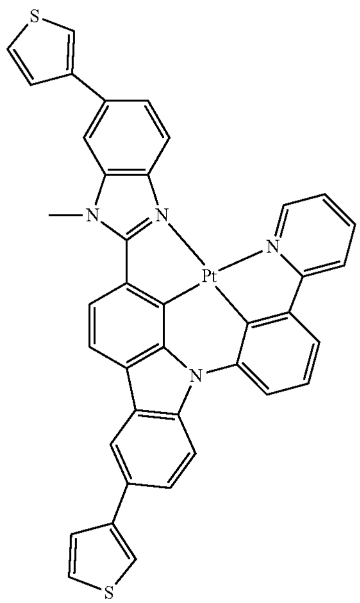
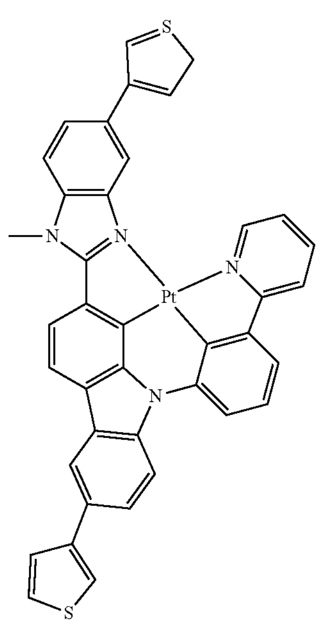
-continued
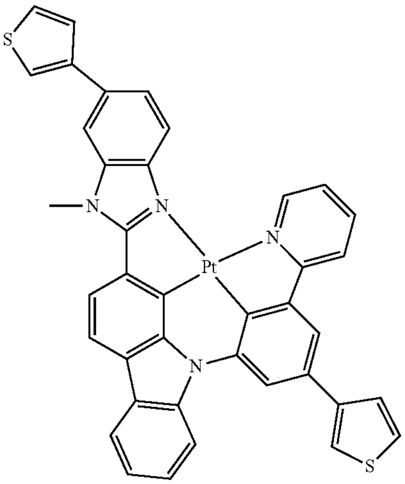
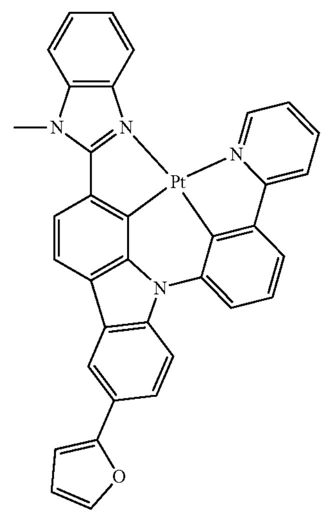
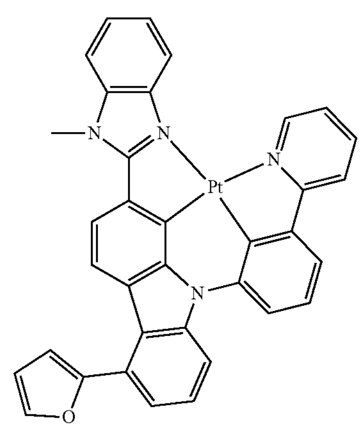

-continued
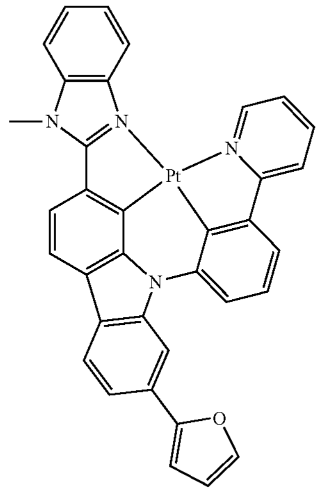
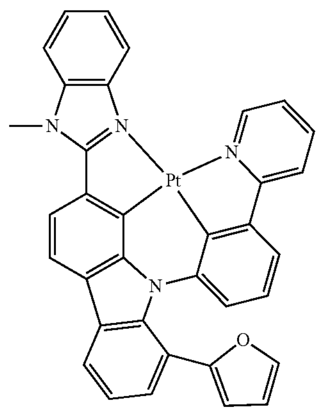
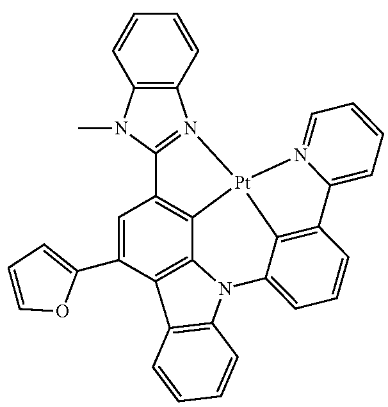
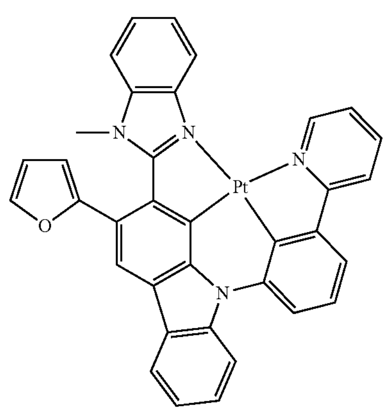
-continued
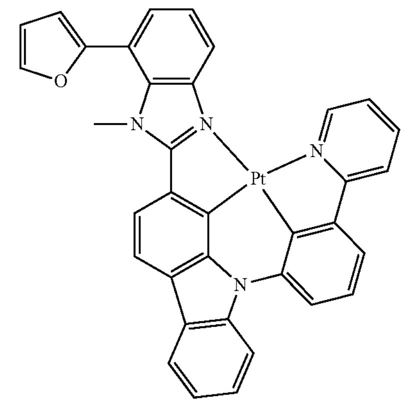
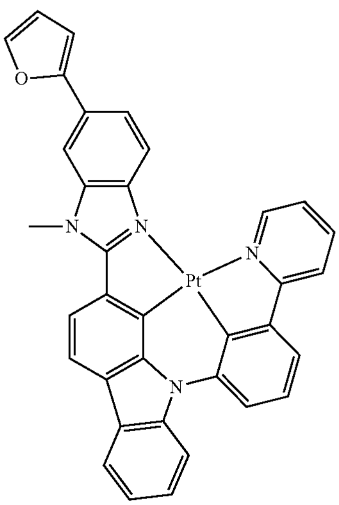
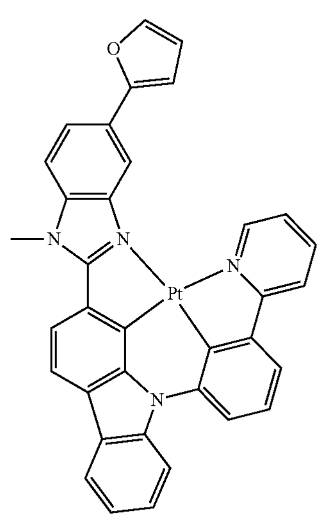

-continued
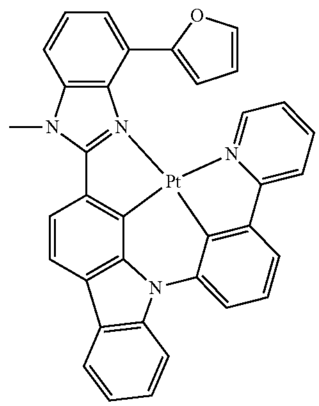
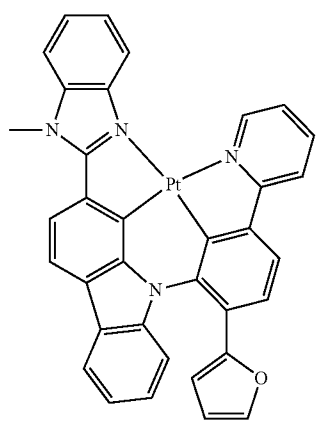
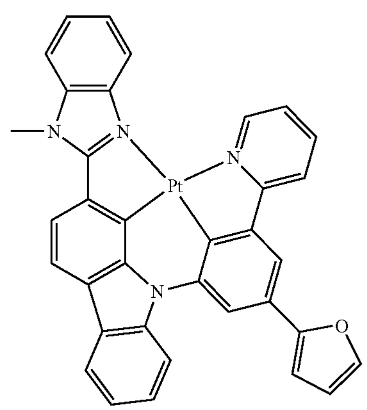
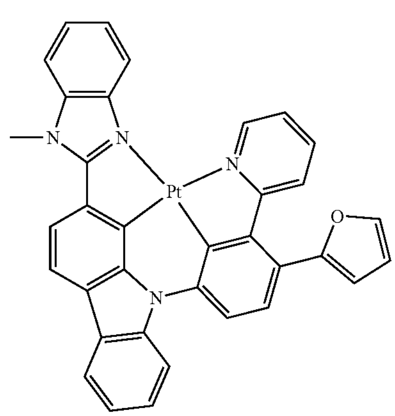
-continued
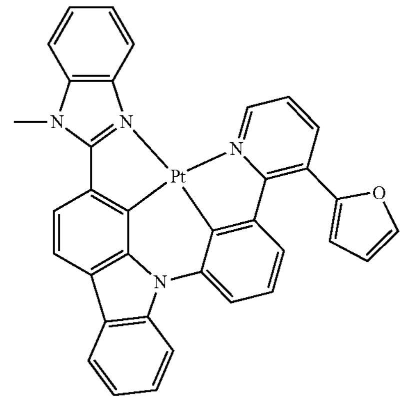
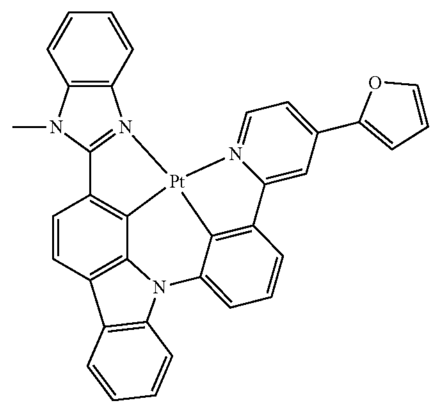
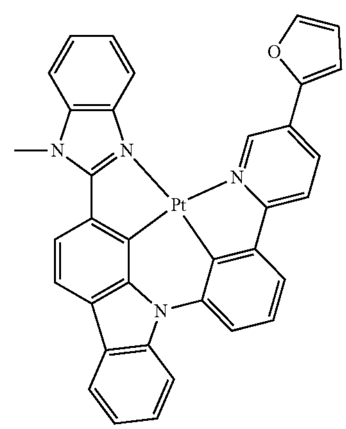
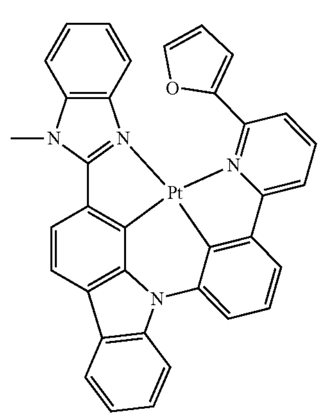

-continued
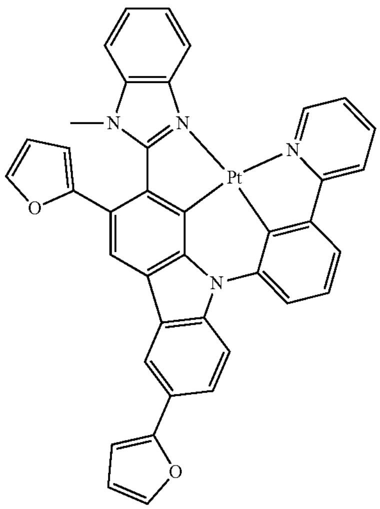
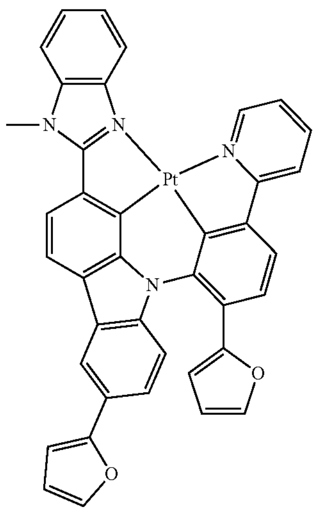
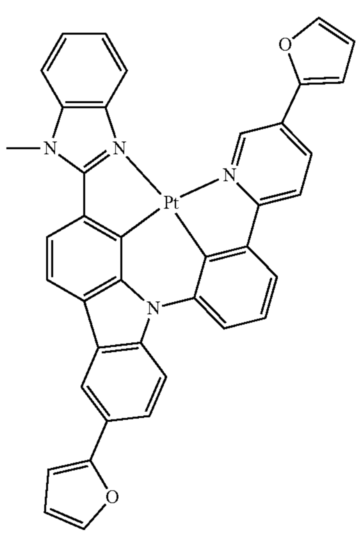
-continued
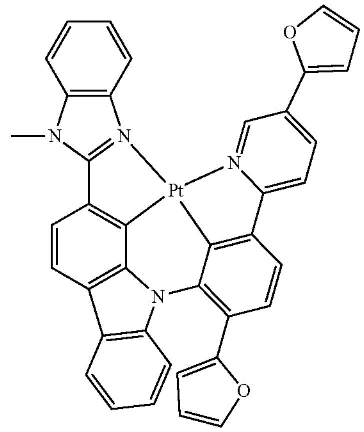
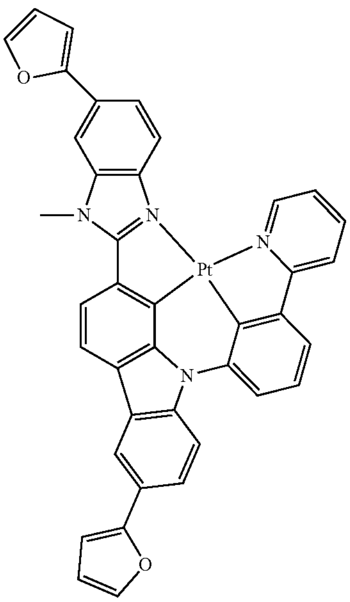
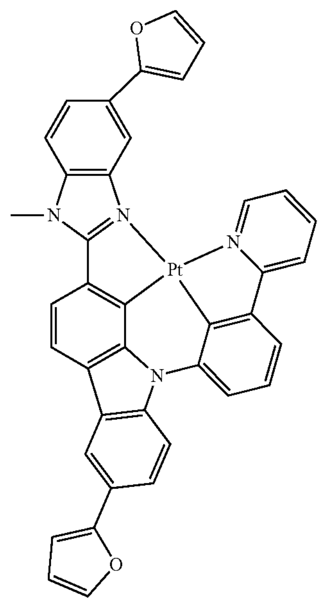

-continued
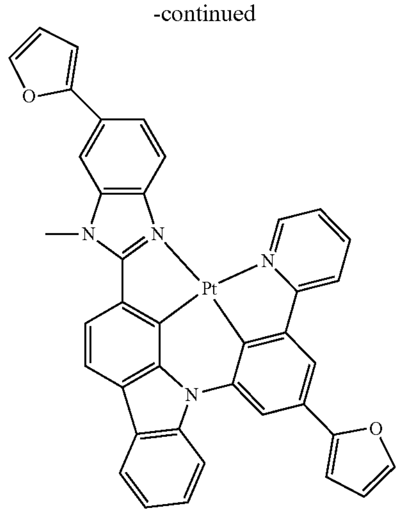
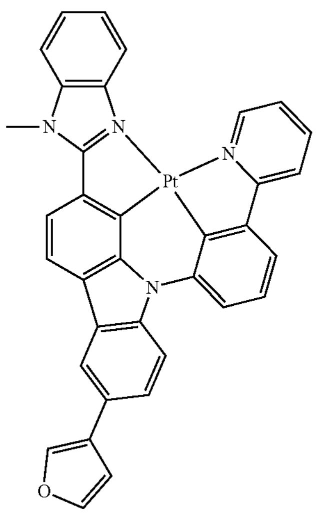
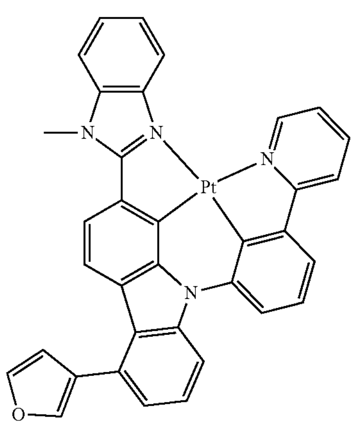
-continued
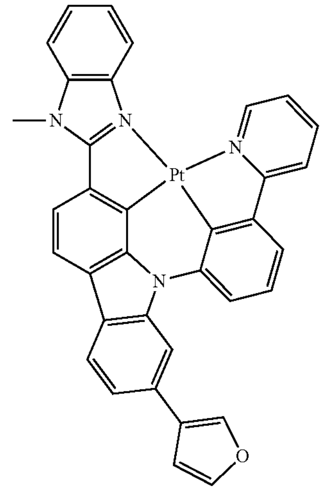
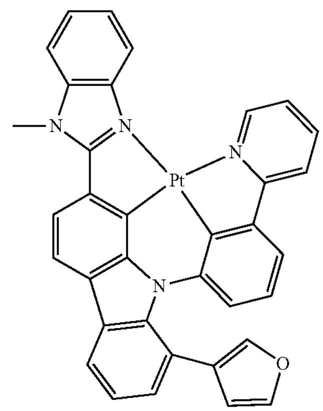
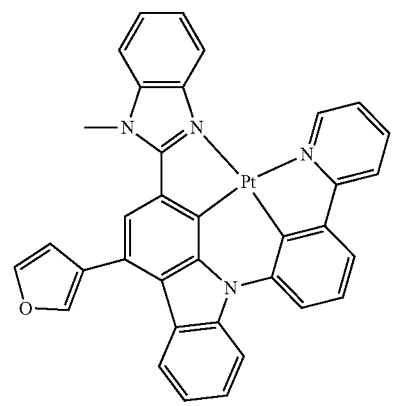
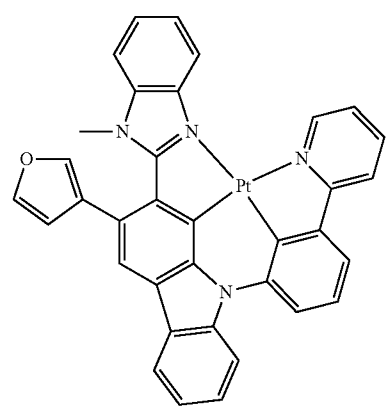

-continued
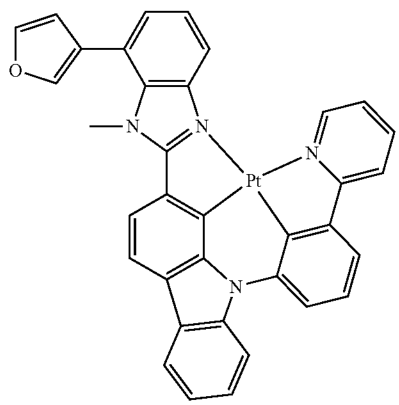
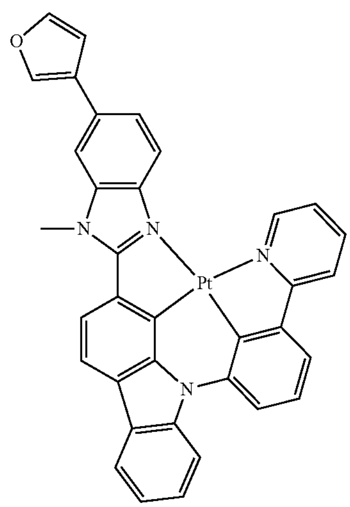
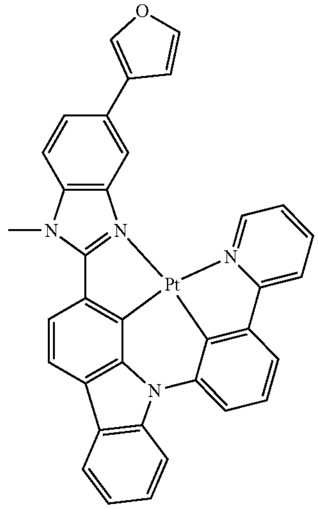
-continued
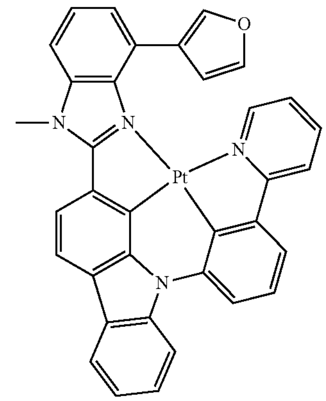
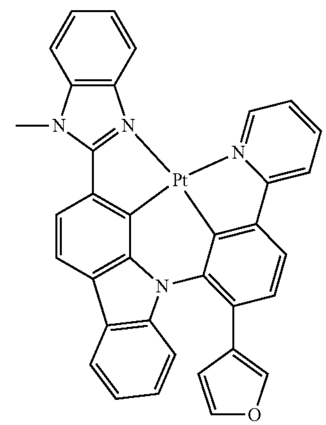
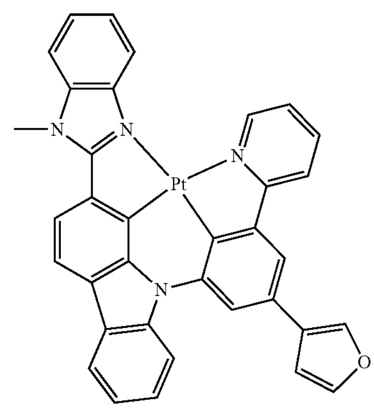
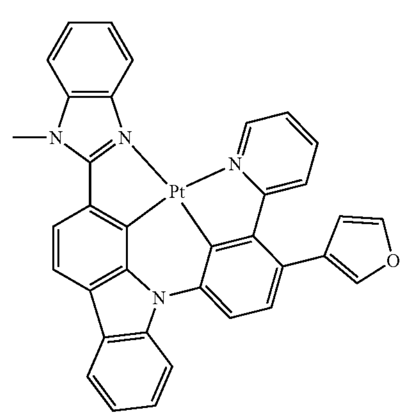

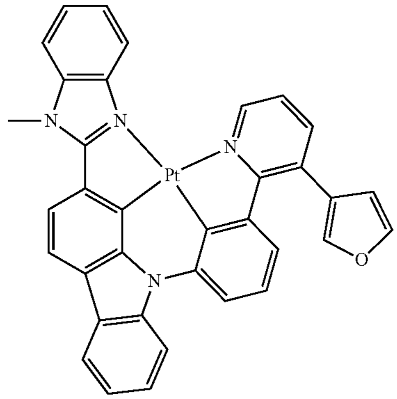
N
N
Pt
N
N
O
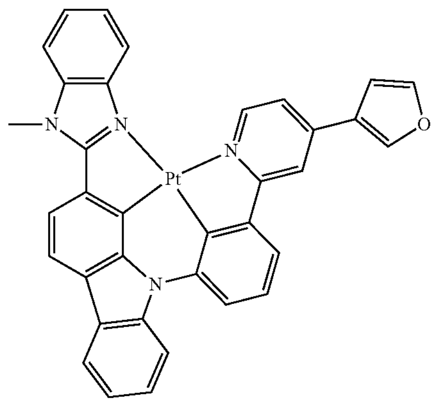
N
N
Pt
N
N
O
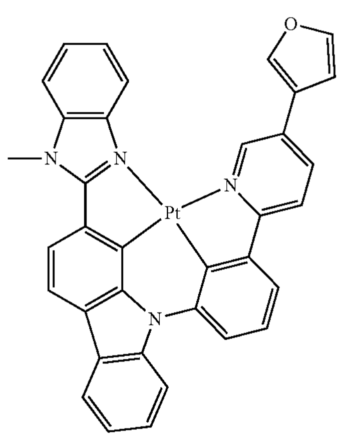
N
N
Pt
N
N
O
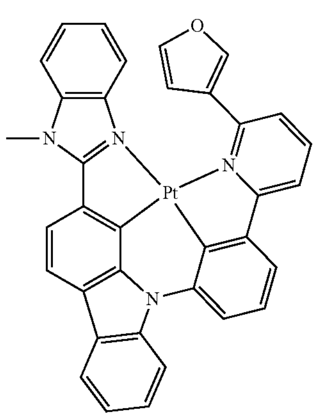
N
N
Pt
N
N
O
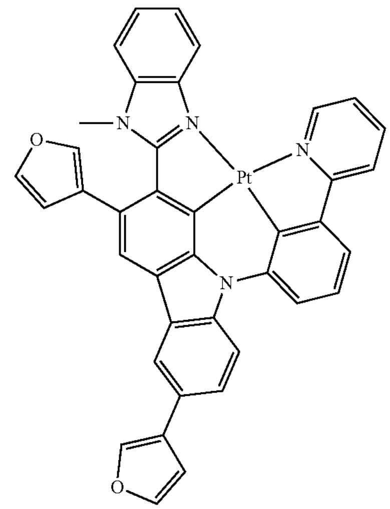
N
N
Pt
N
N
O
O
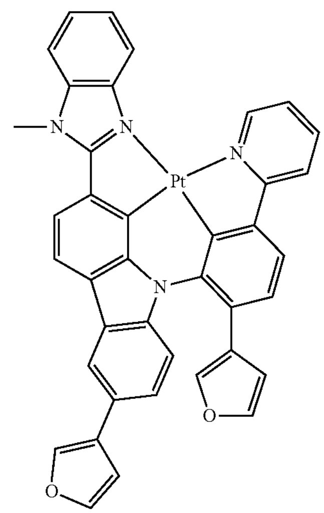
N
N
Pt
N
N
O
O
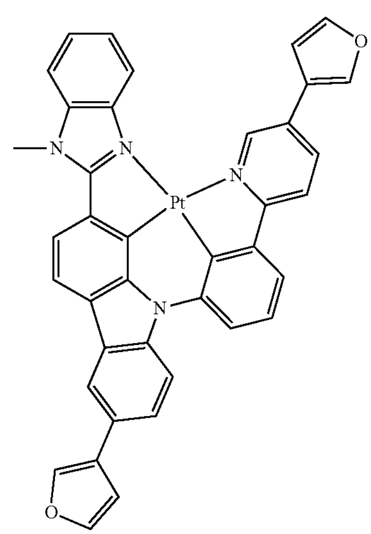
N
N
Pt
N
N
O
O -continued
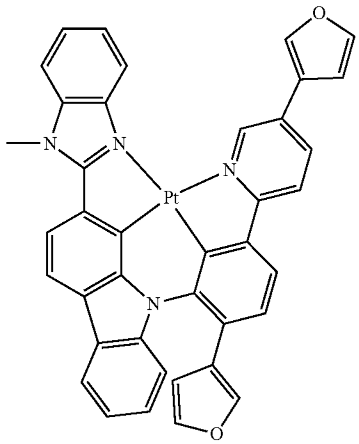
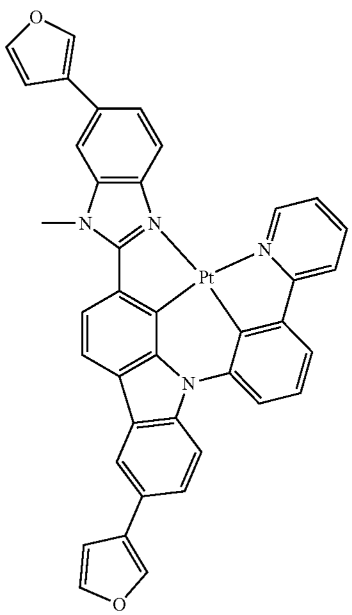
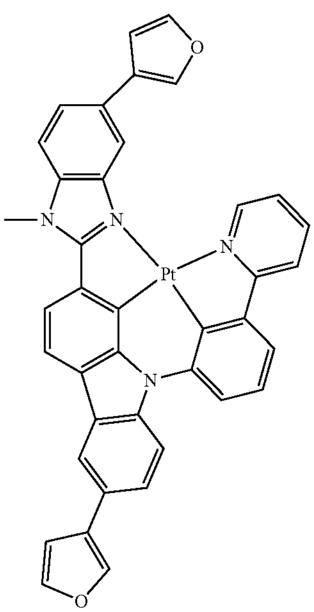
-continued
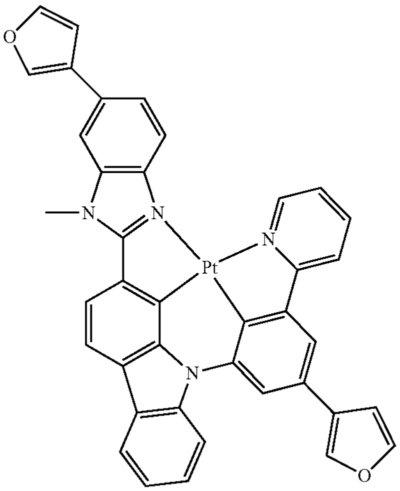
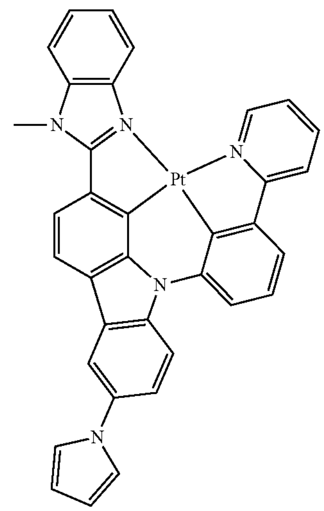
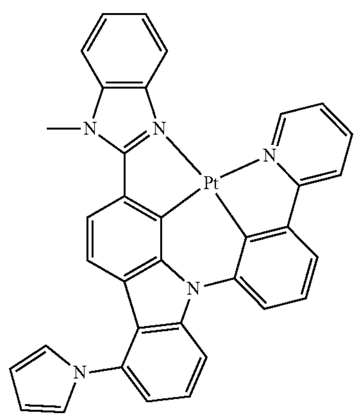

-continued
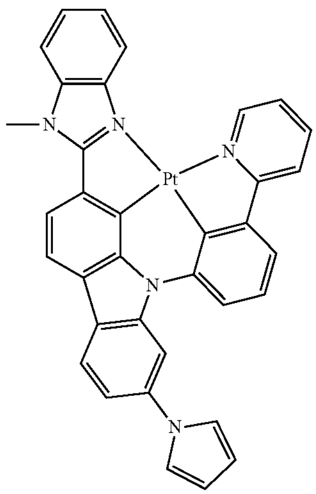
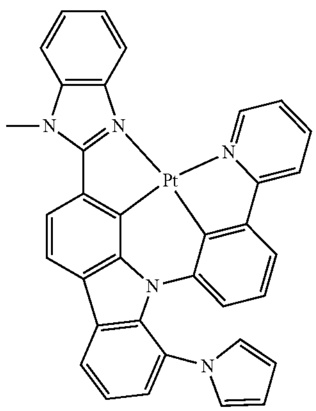
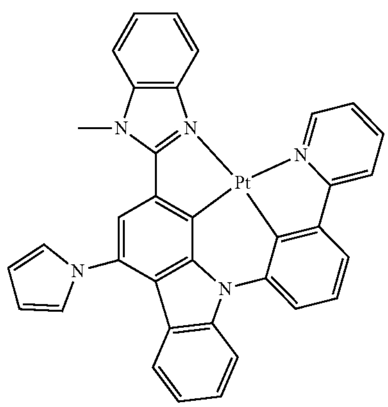
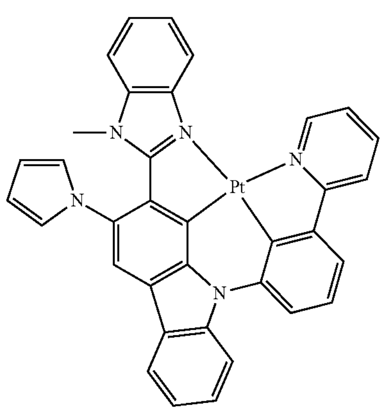
-continued
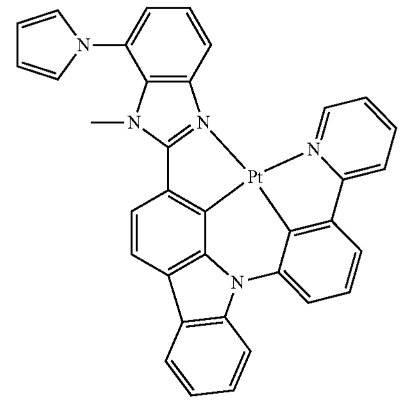
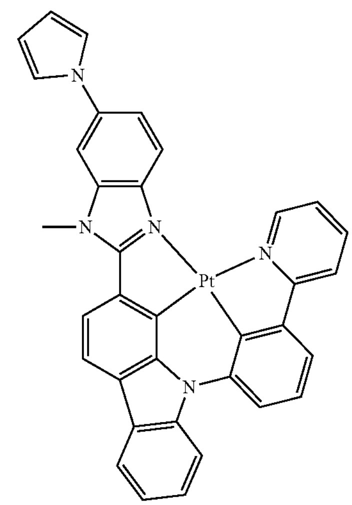
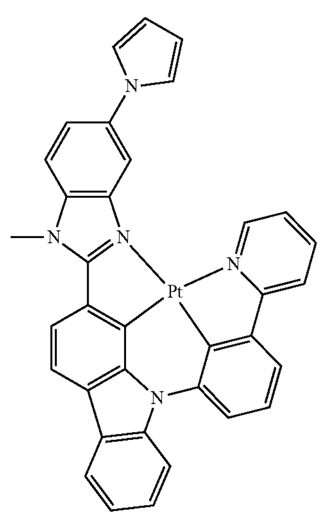

-continued
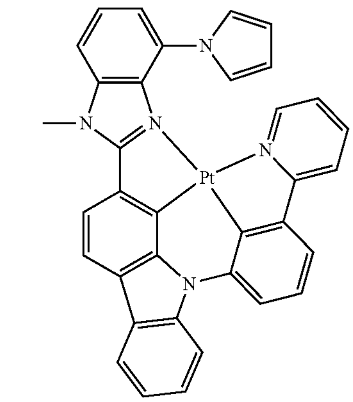
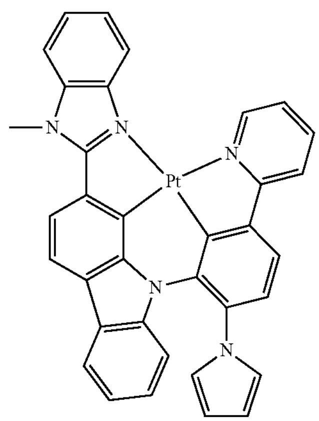
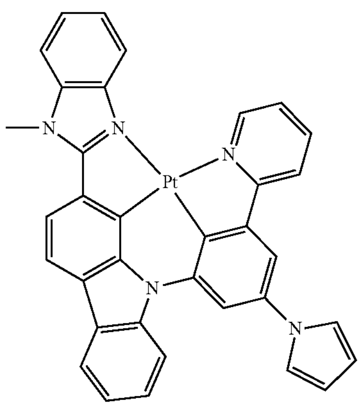
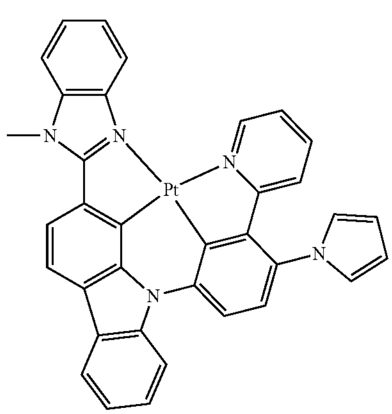
-continued
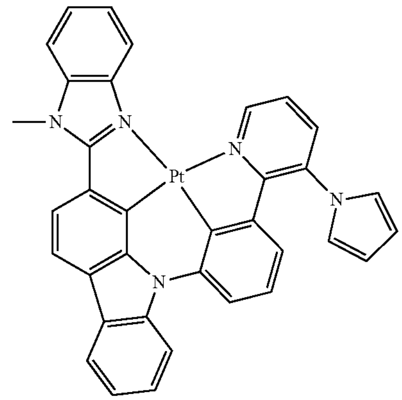
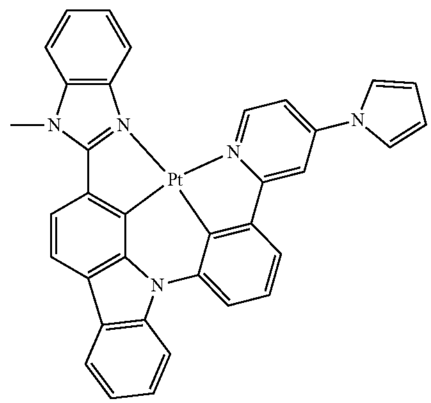
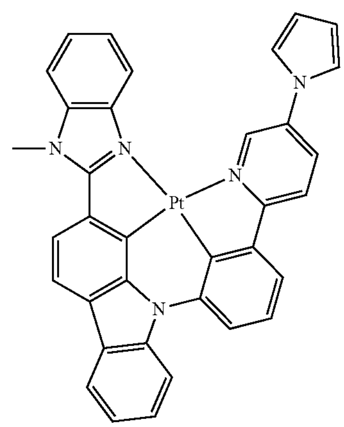
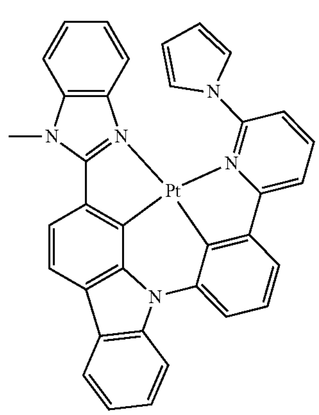

-continued
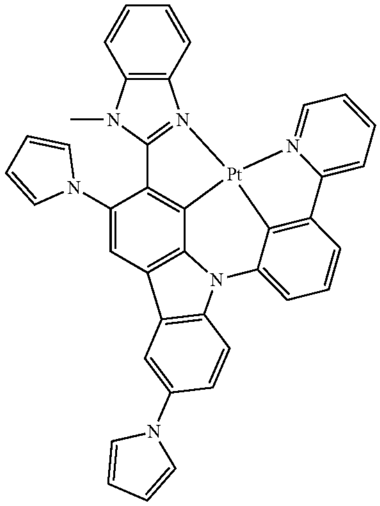
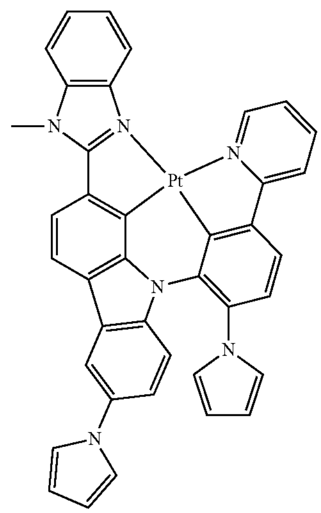
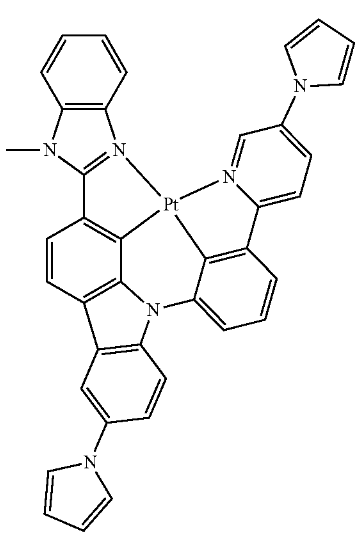
-continued
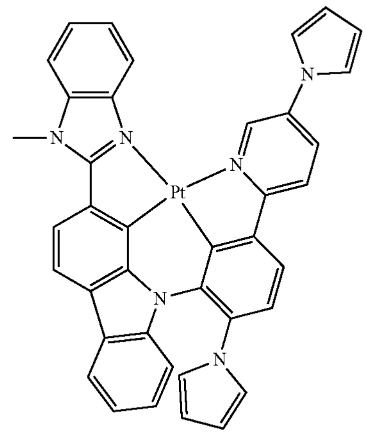
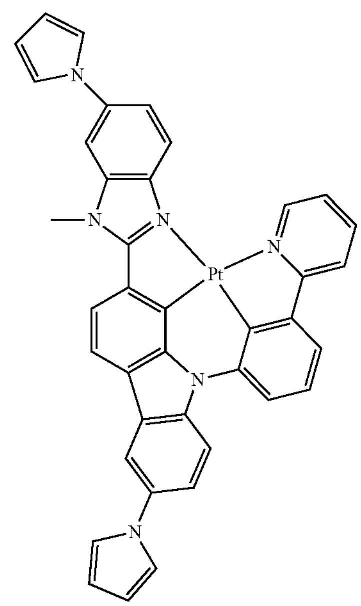
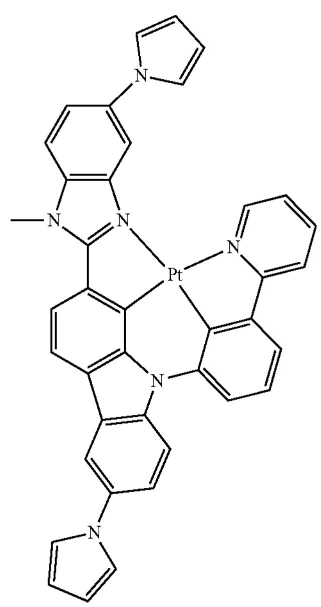

-continued
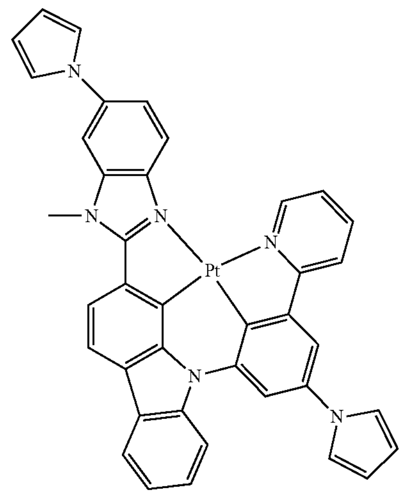
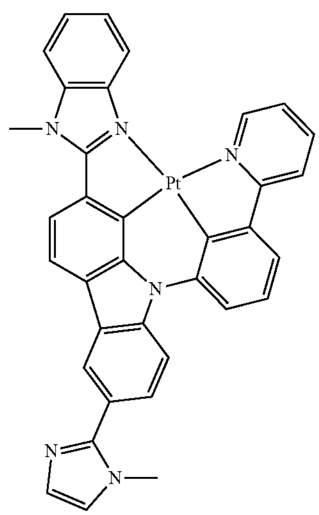
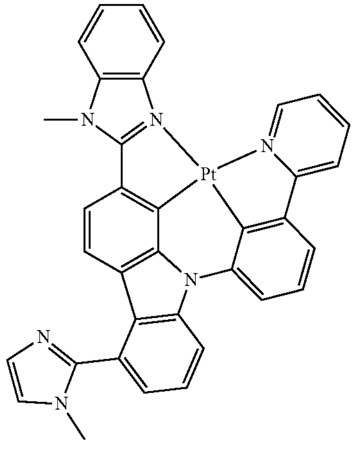
-continued
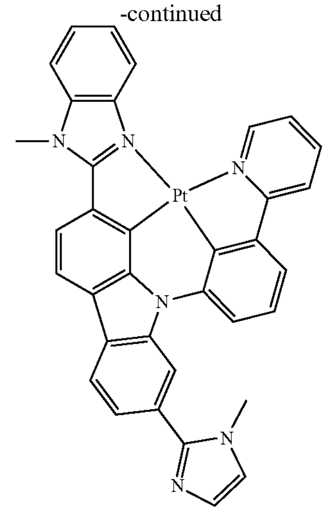
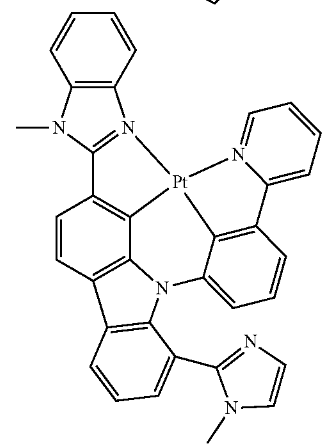
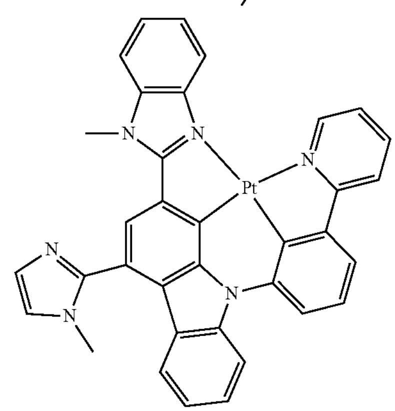
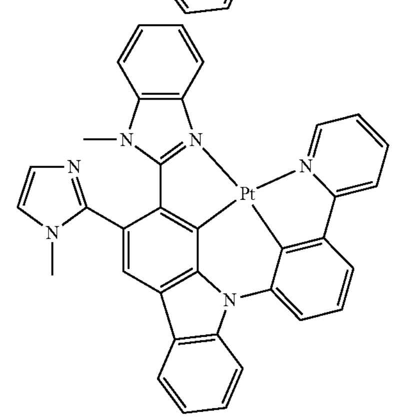

-continued
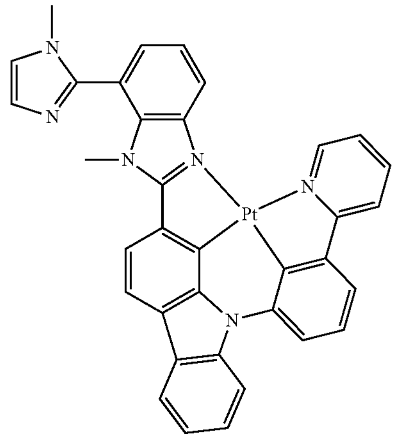
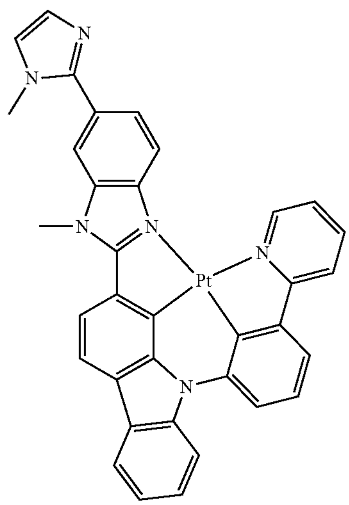
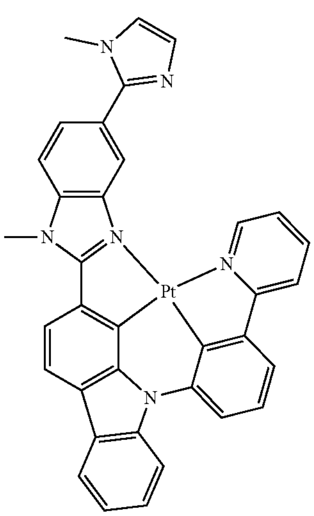
-continued
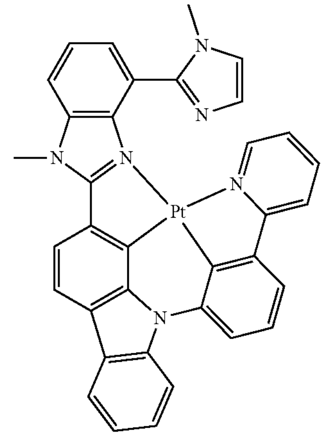
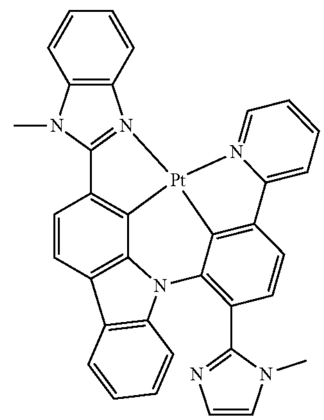
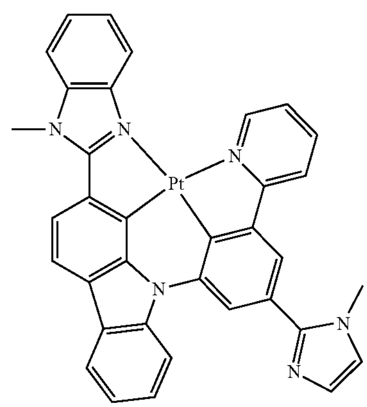
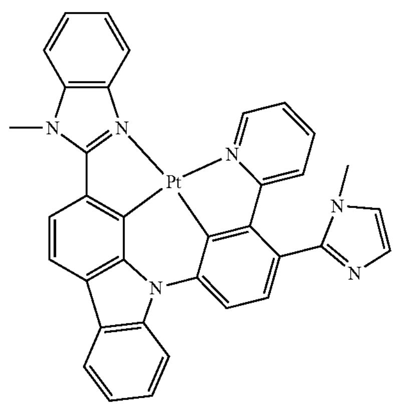

-continued
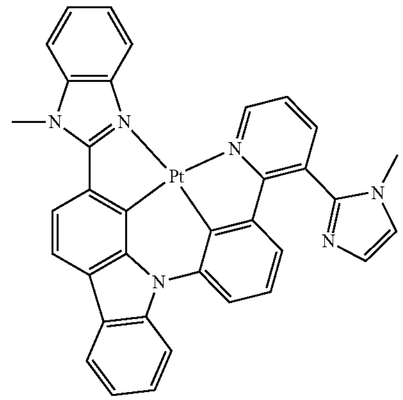
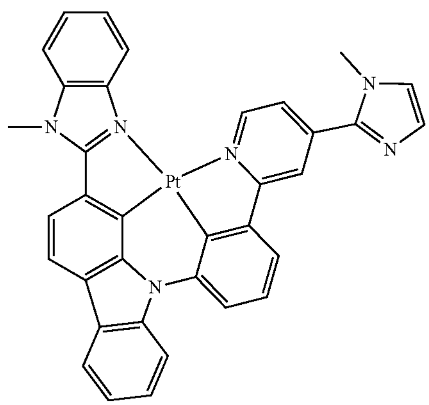
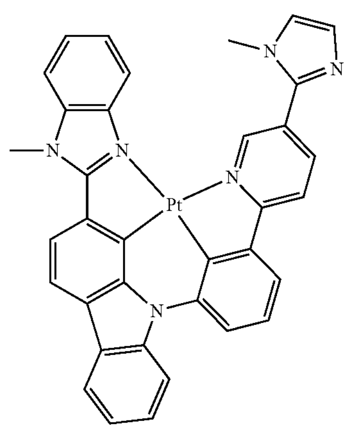
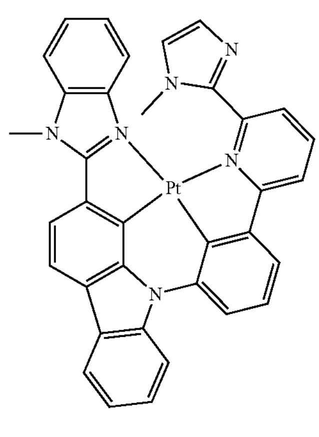
-continued
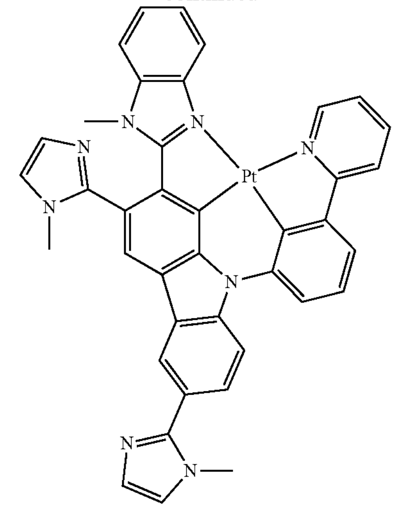
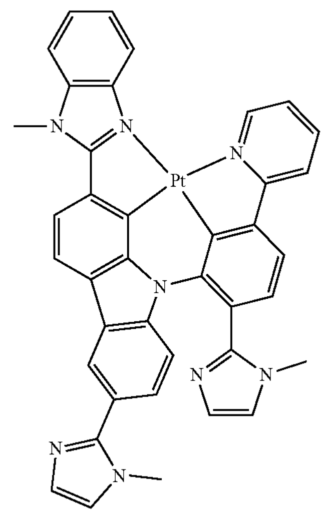
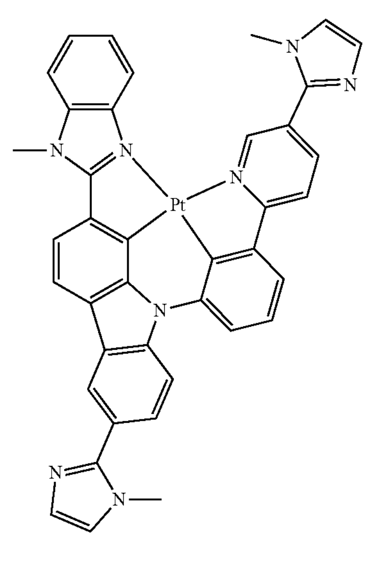

-continued
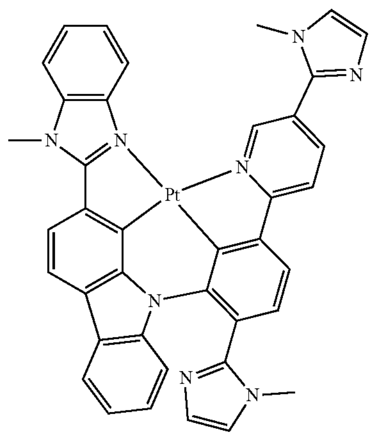
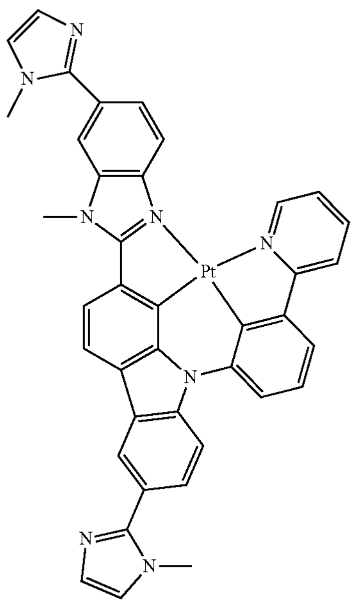
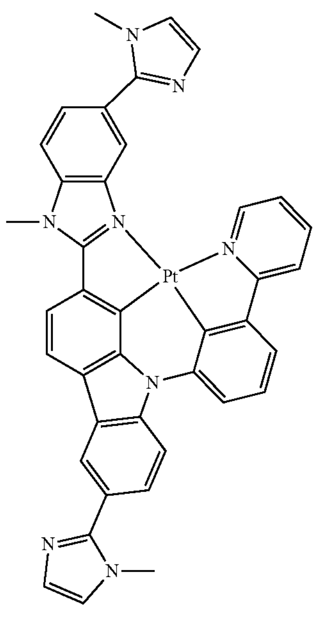
-continued
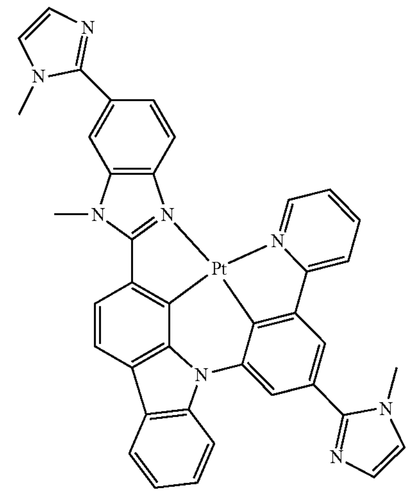
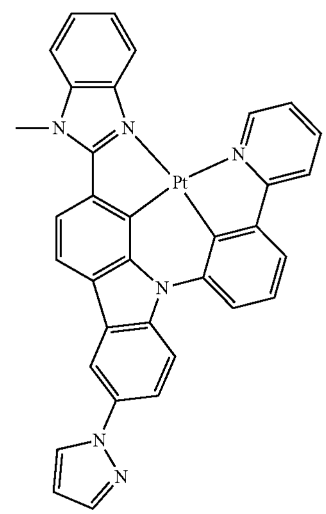
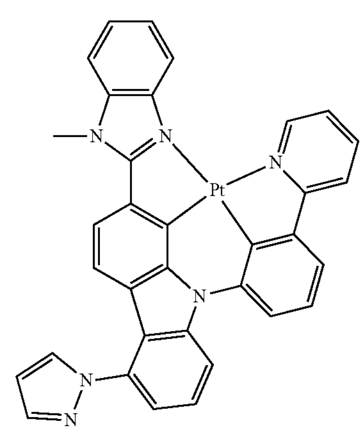

-continued
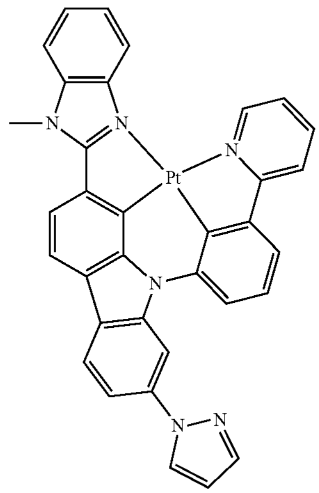
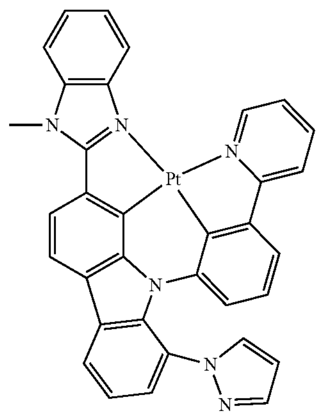
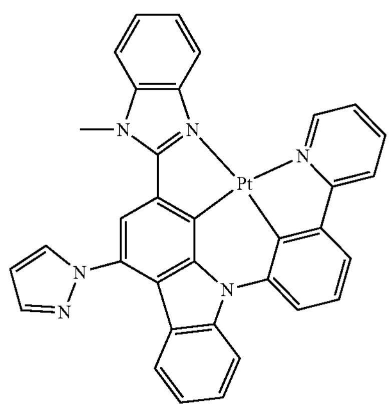
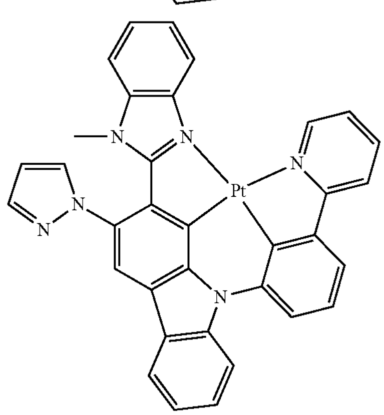
-continued
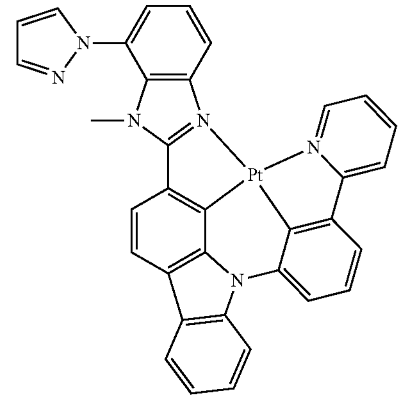
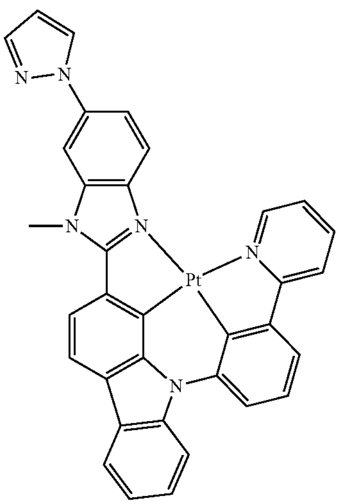
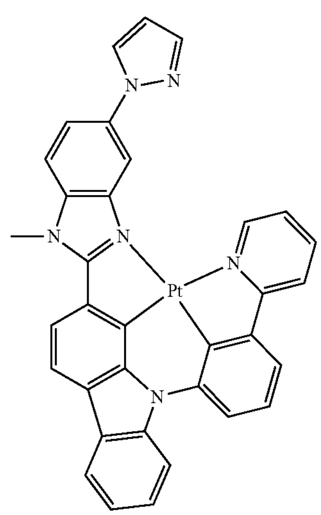

-continued
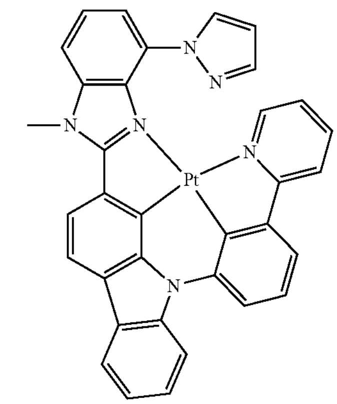
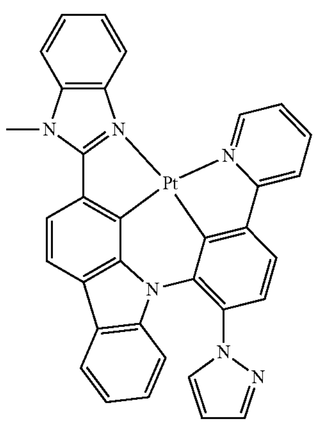
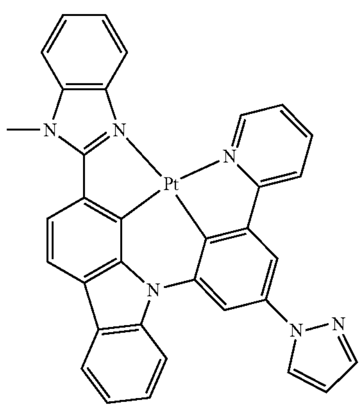
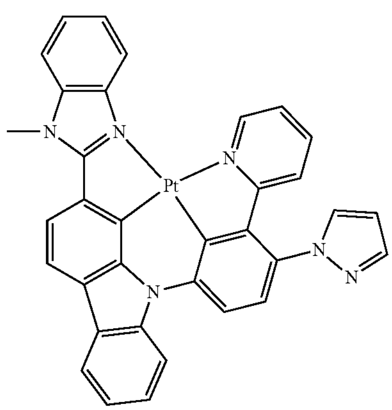
-continued
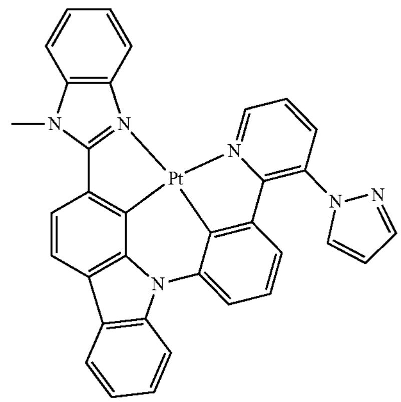
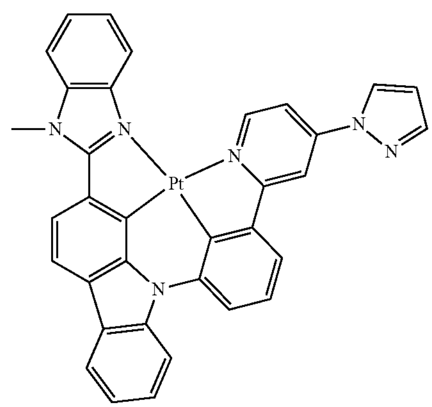
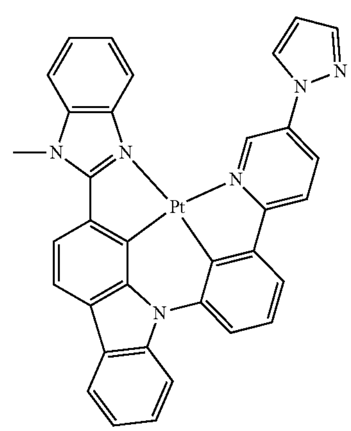
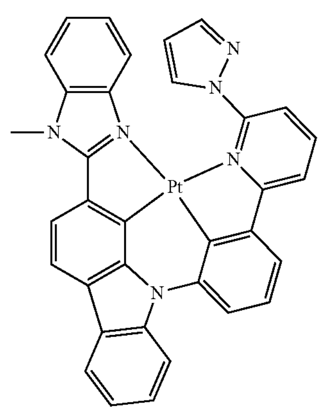

-continued
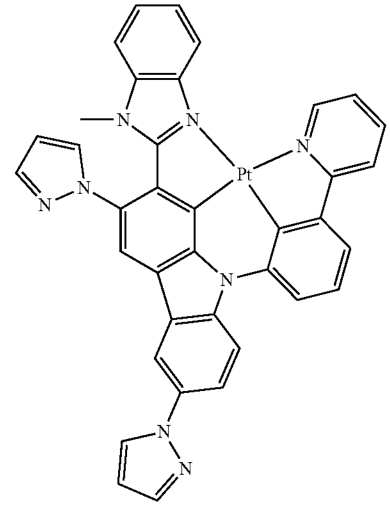
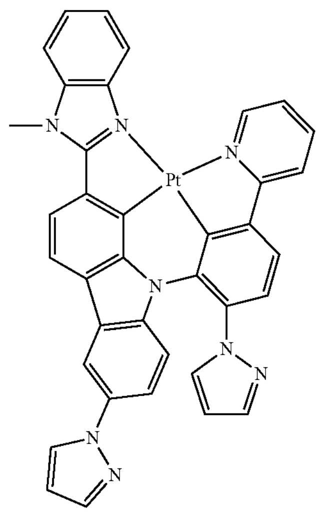
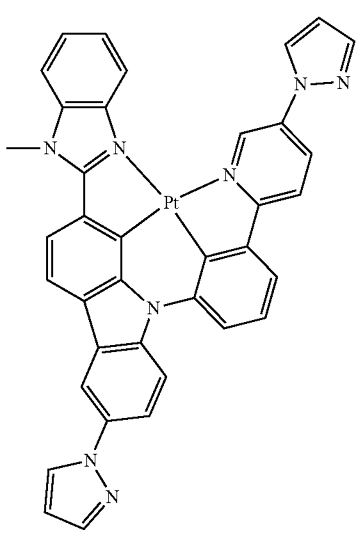
-continued
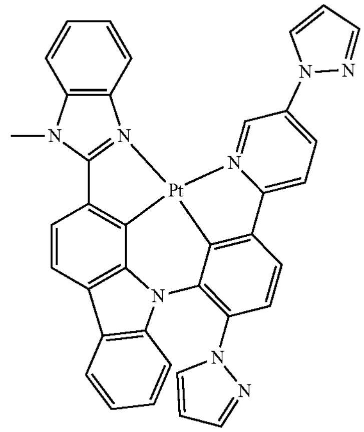
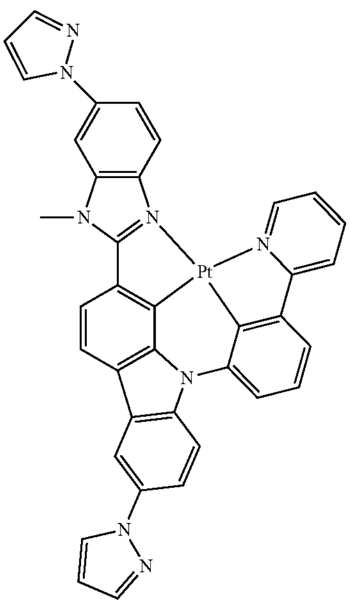
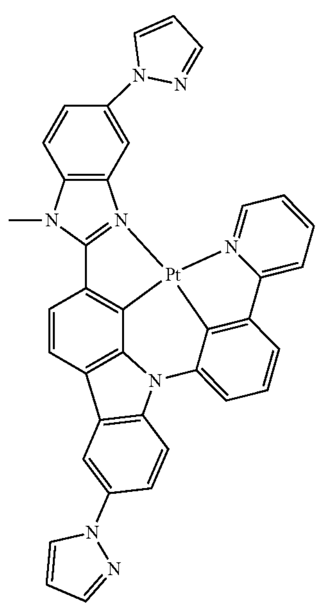

-continued
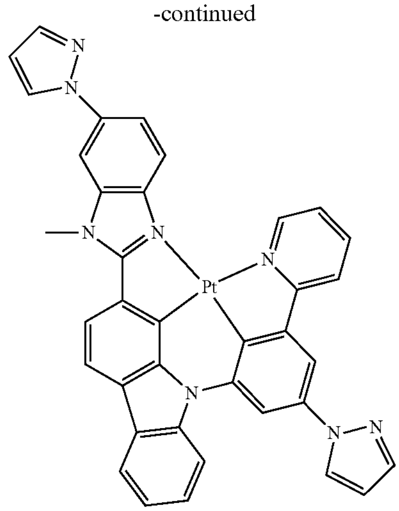
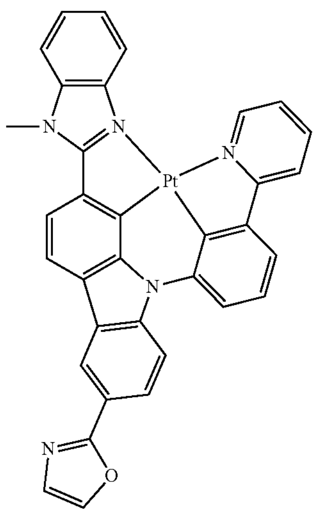
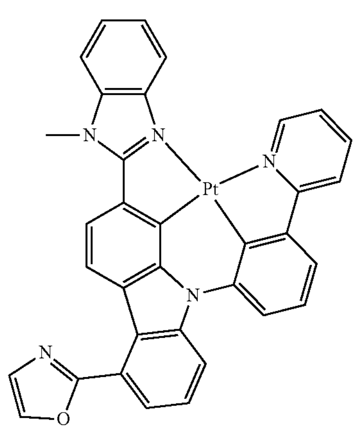
-continued
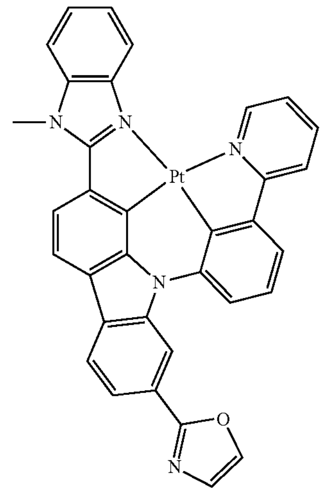
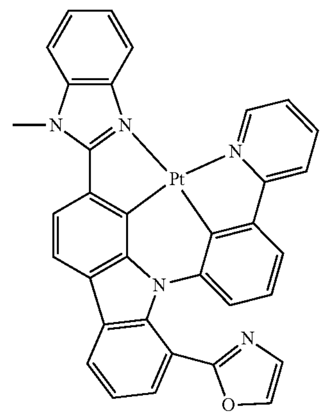
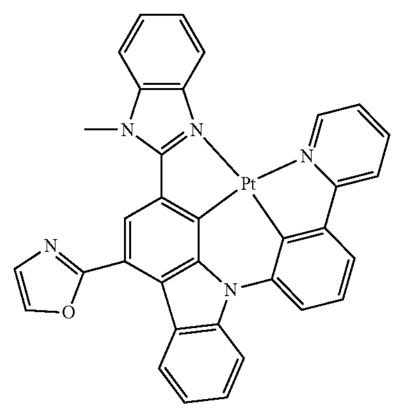
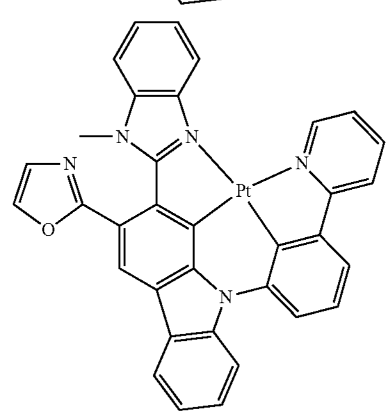

-continued
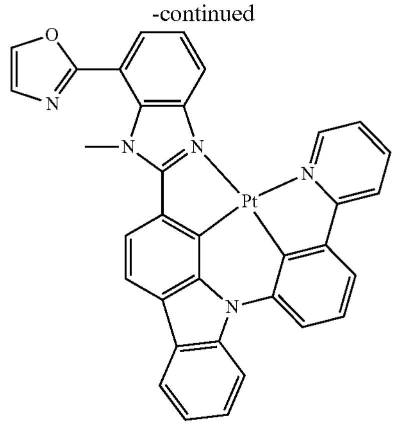
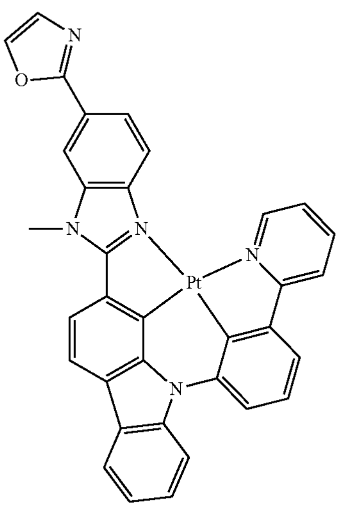
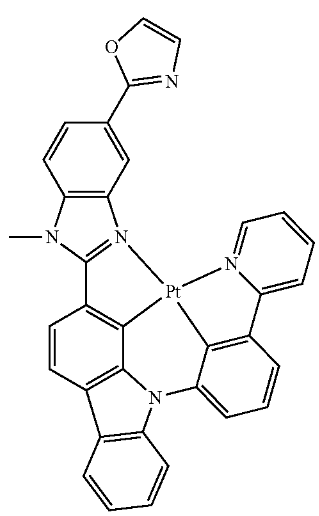
-continued
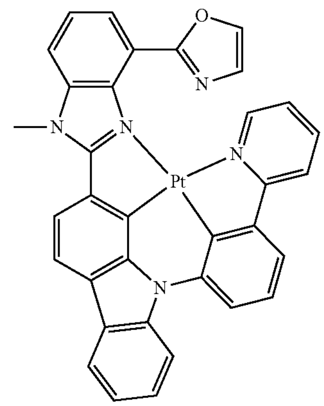
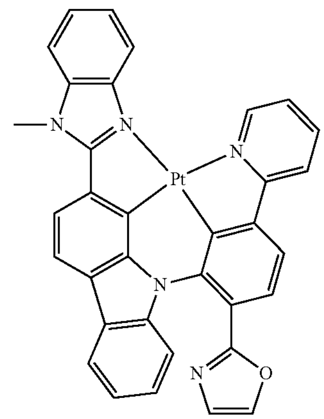
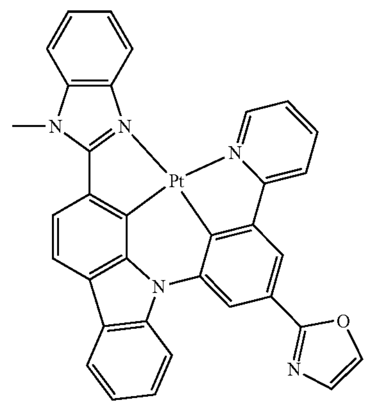
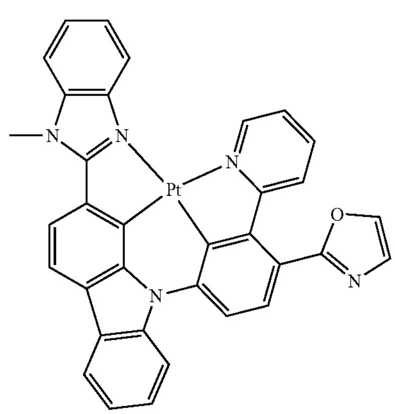

-continued
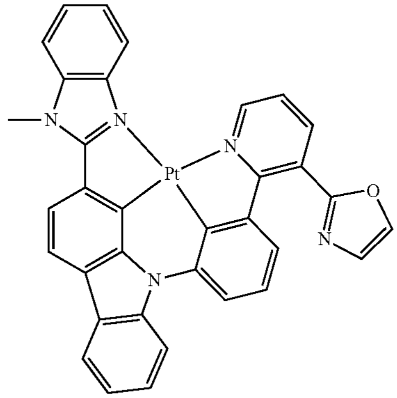
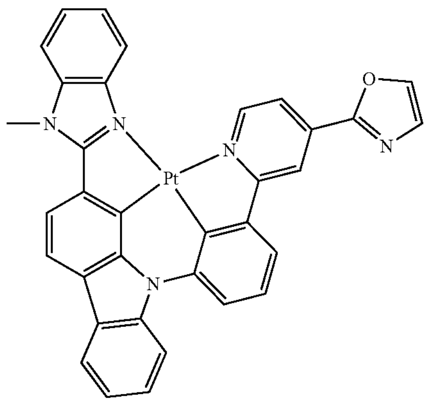
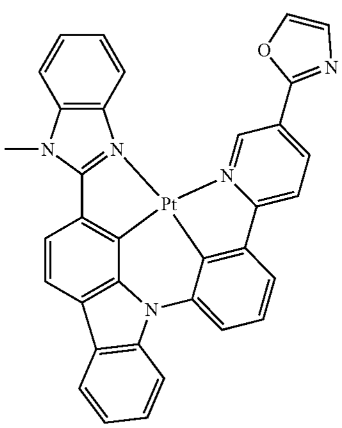
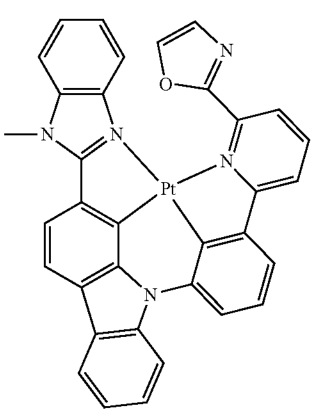
-continued
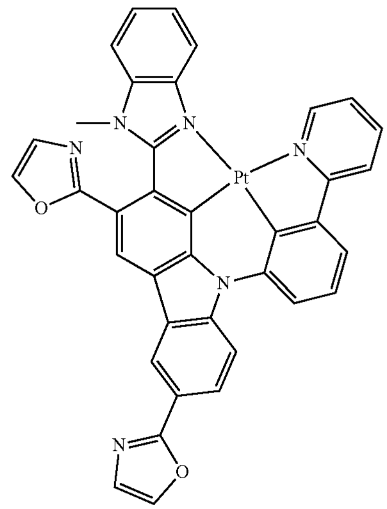
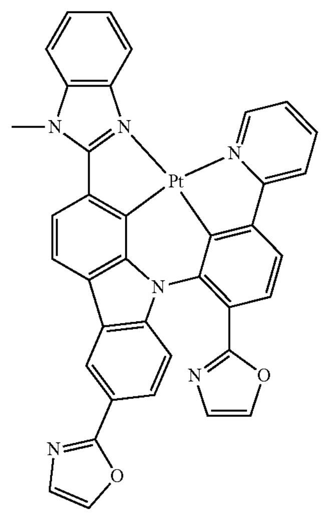
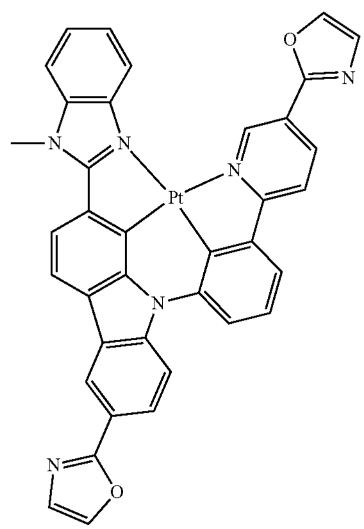

-continued
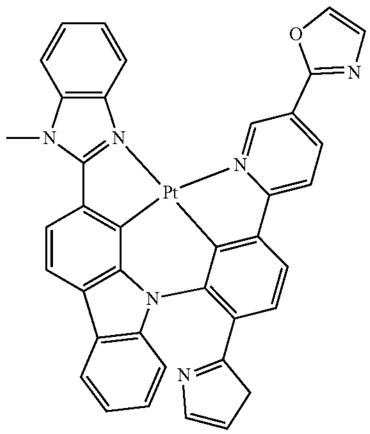
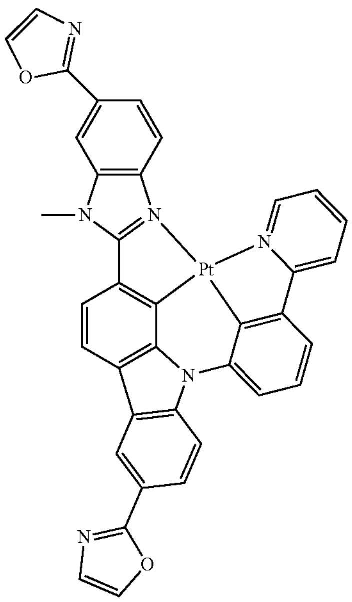
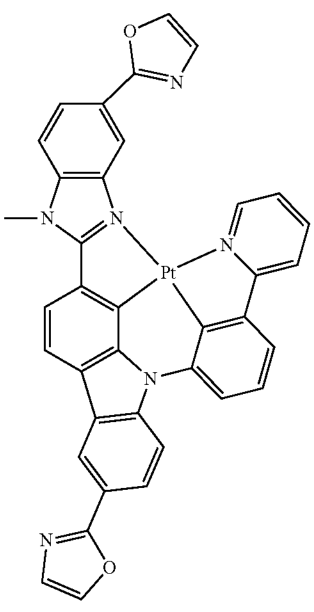
-continued
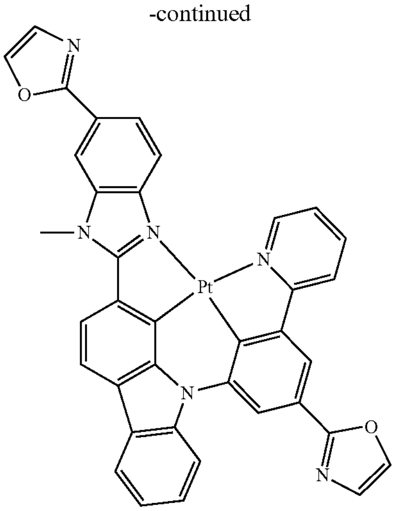
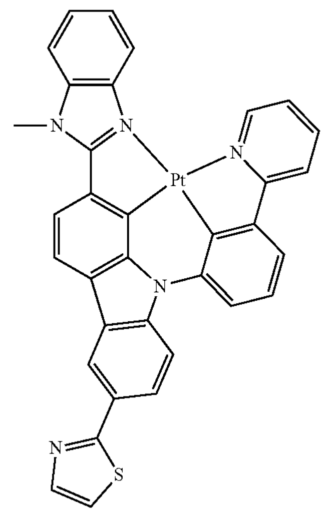
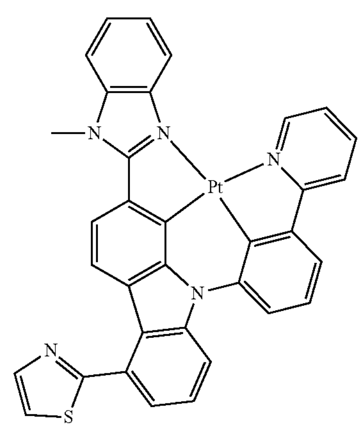

-continued
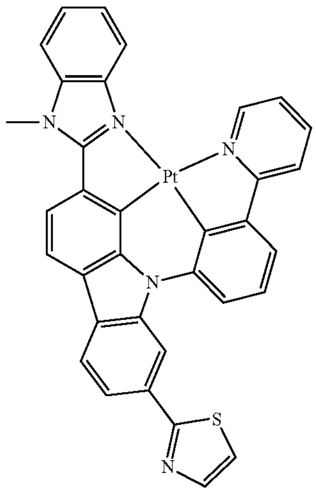
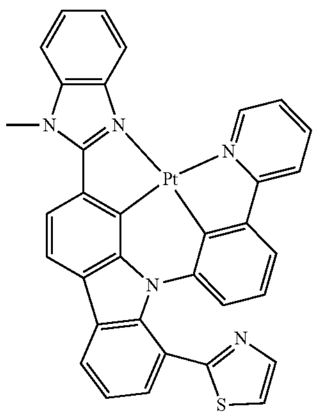
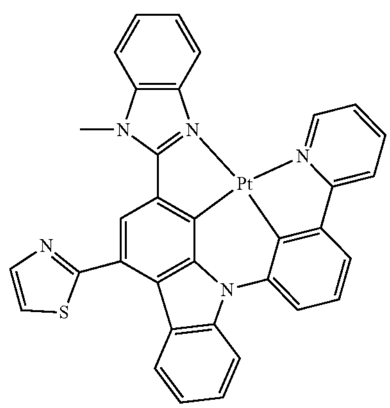
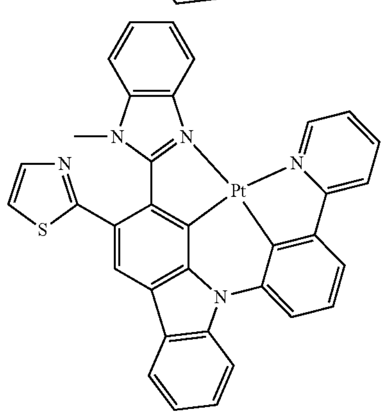
-continued
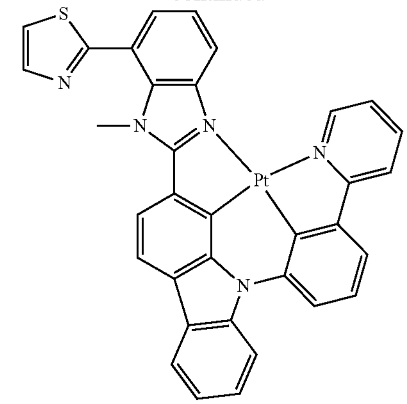
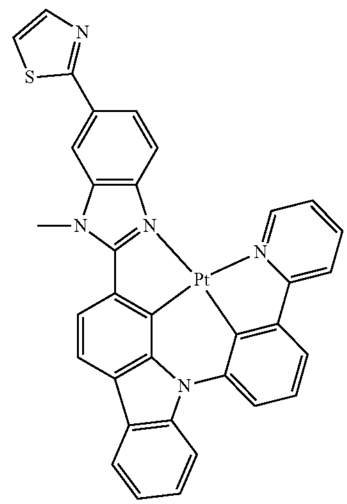
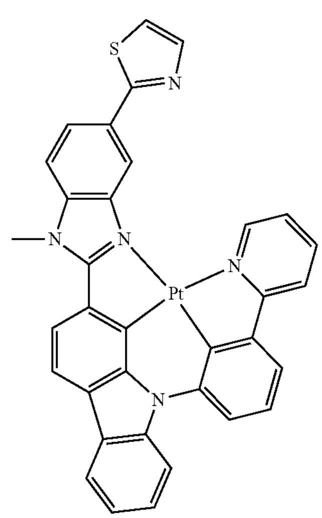

-continued
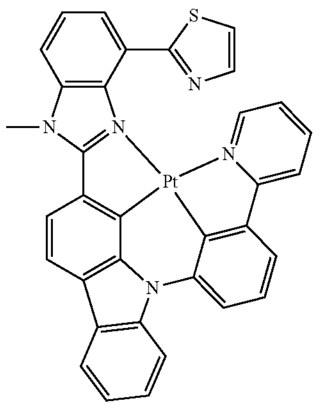
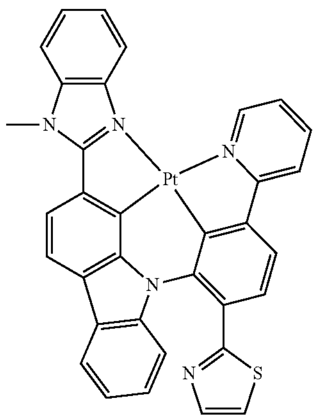
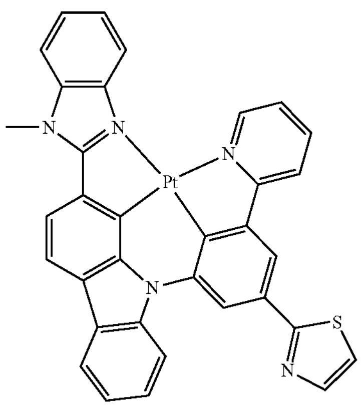
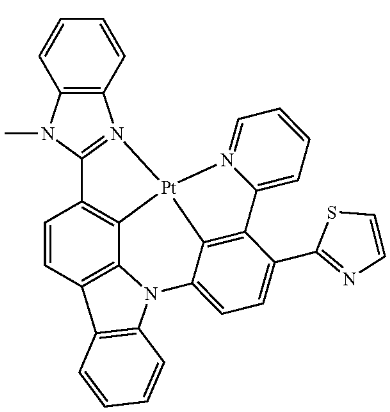
-continued
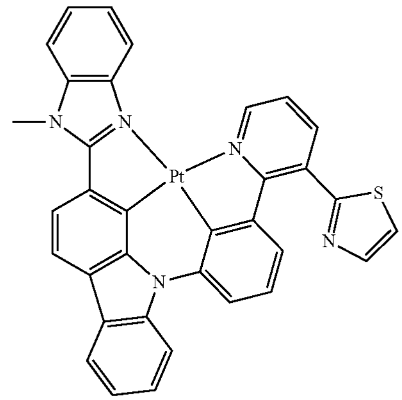
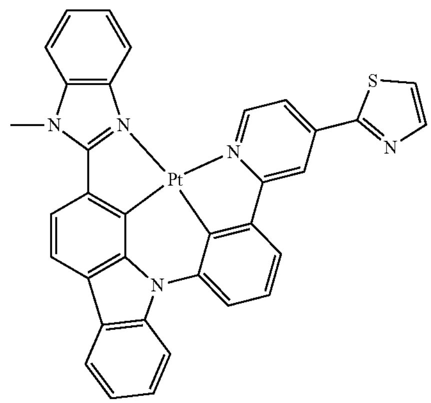
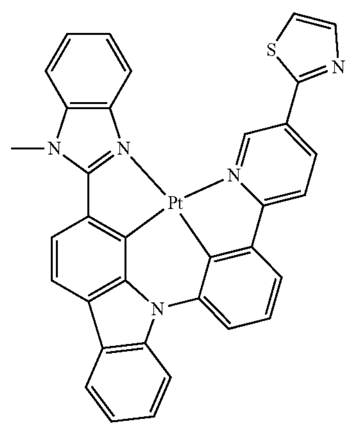
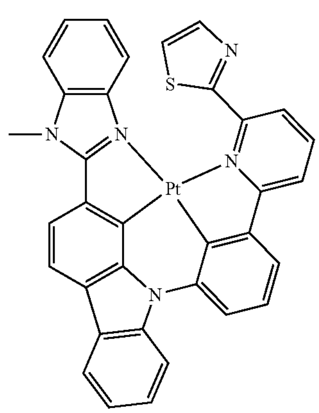

-continued
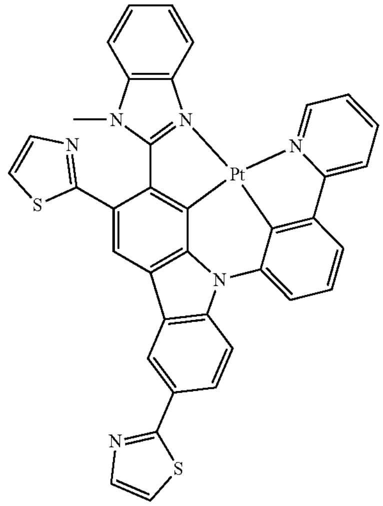
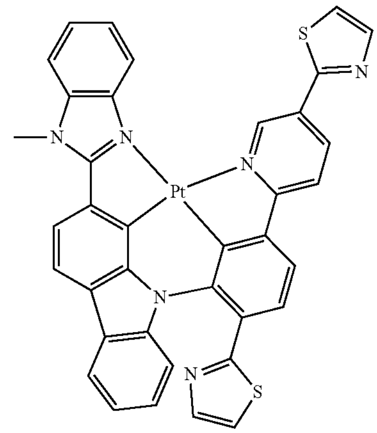
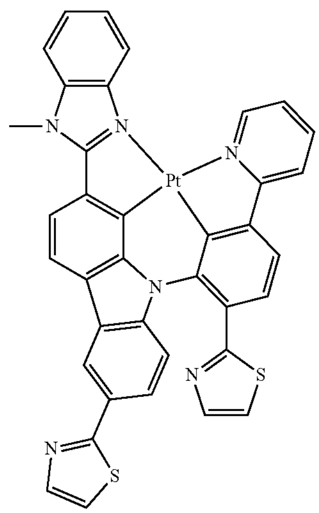
-continued
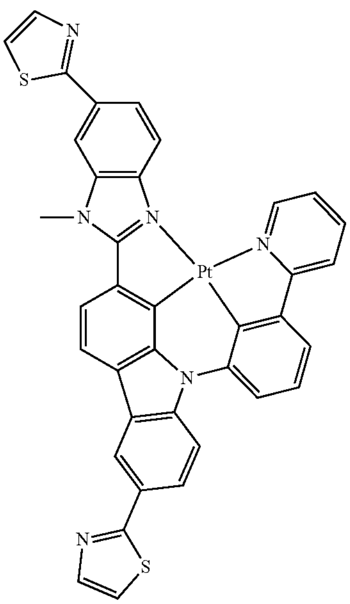
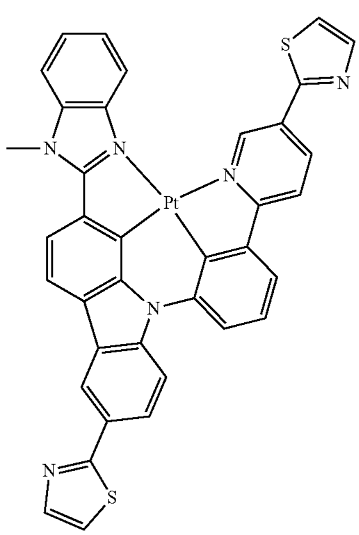
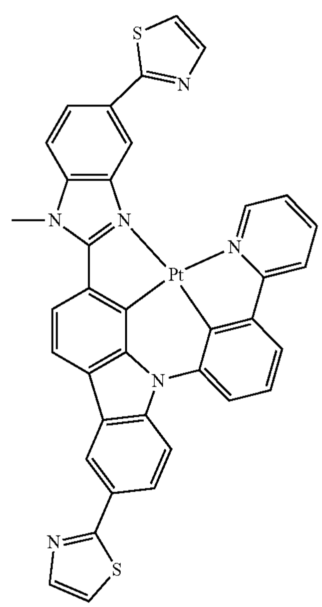

-continued
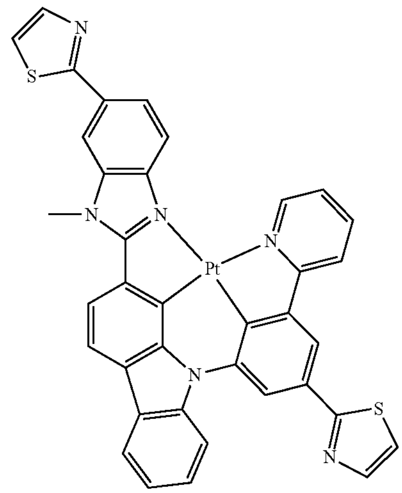
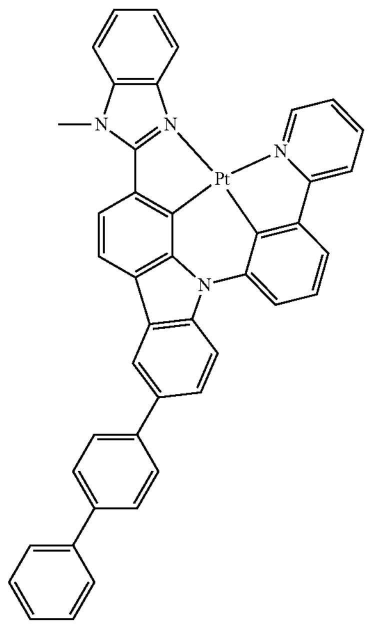
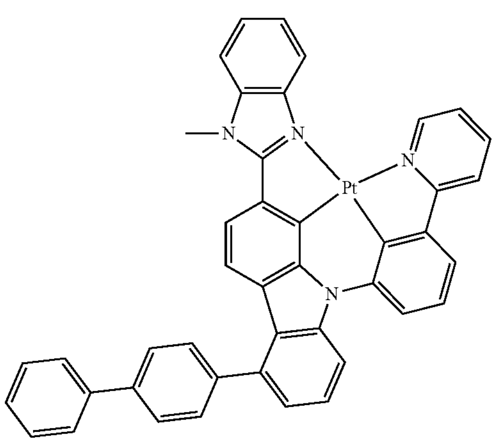
-continued
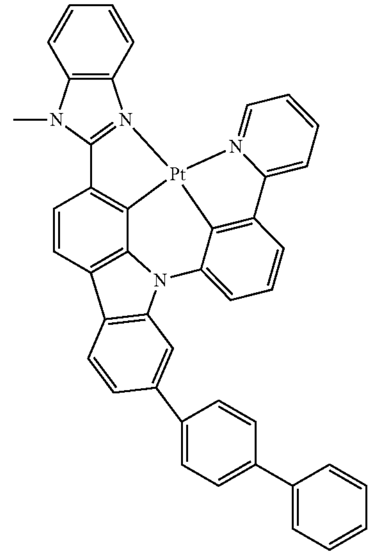
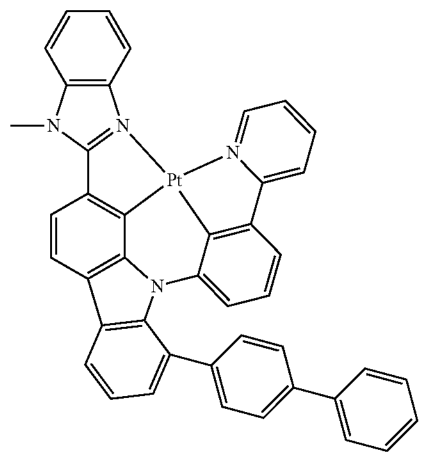
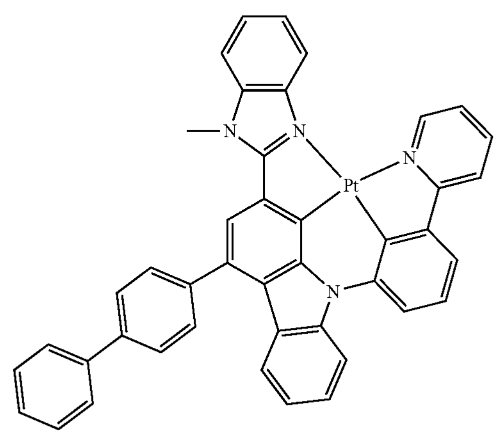

-continued
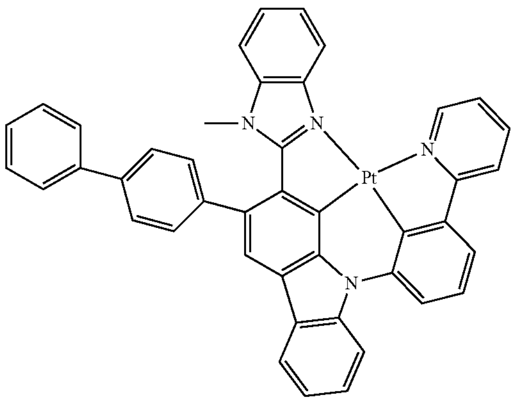
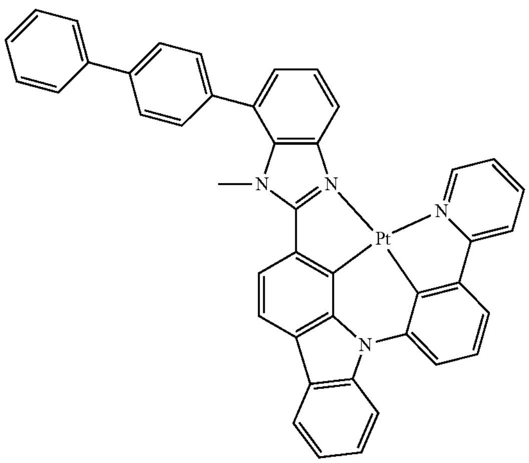
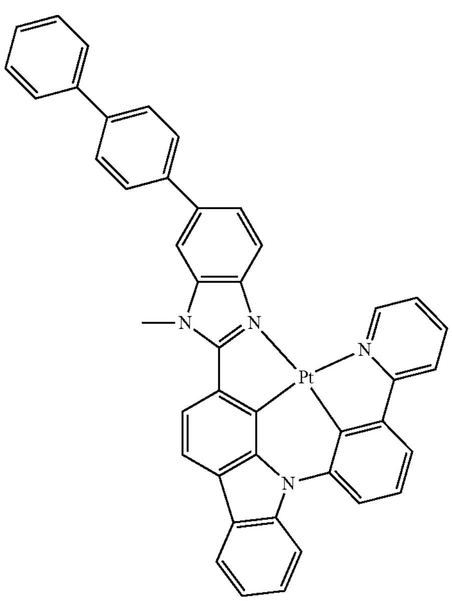
-continued
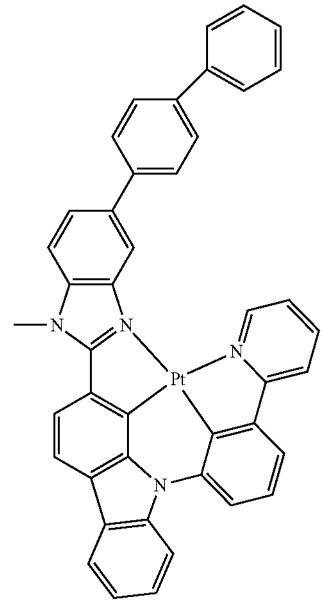
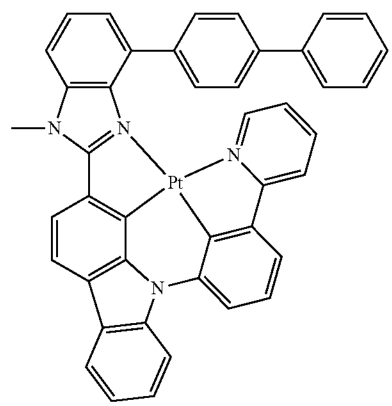
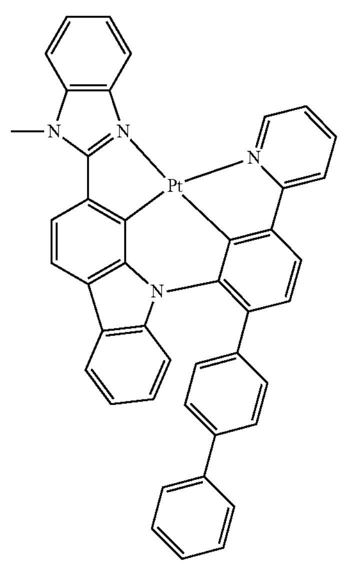

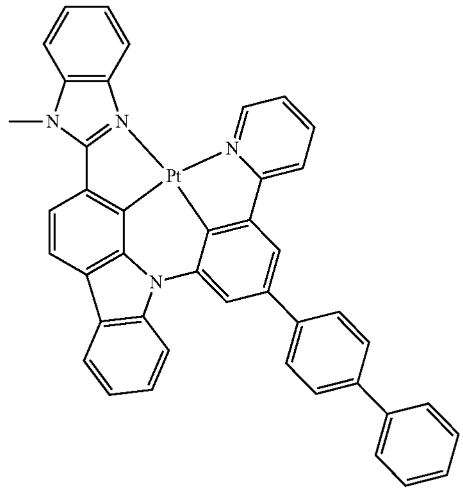
N
N
N
Pt
N
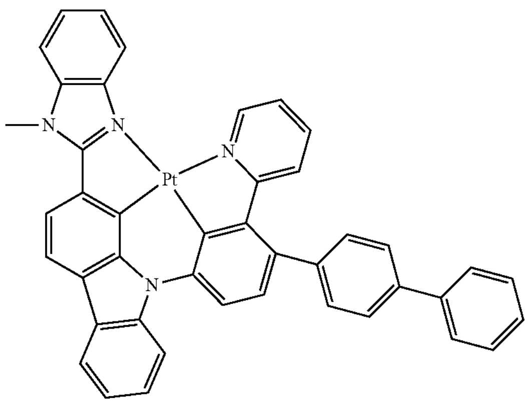
N
N
N
Pt
N
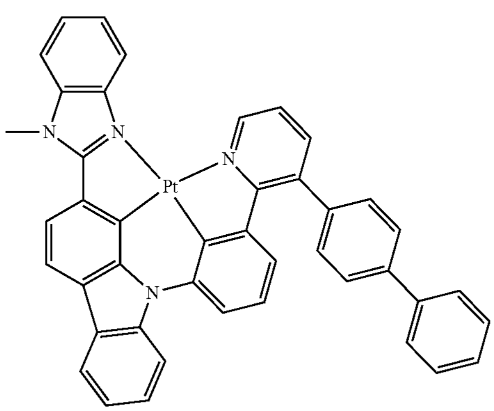
N
N
N
Pt
N
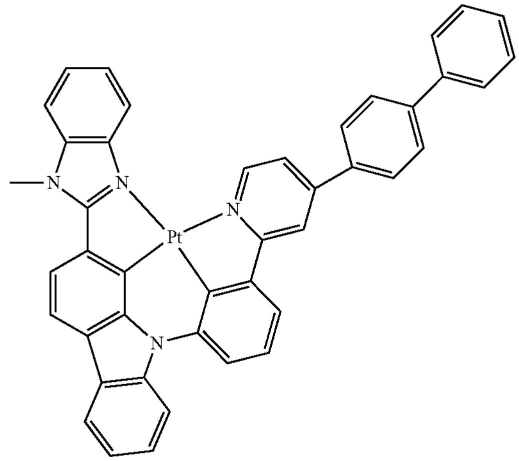
N
N
N
Pt
N
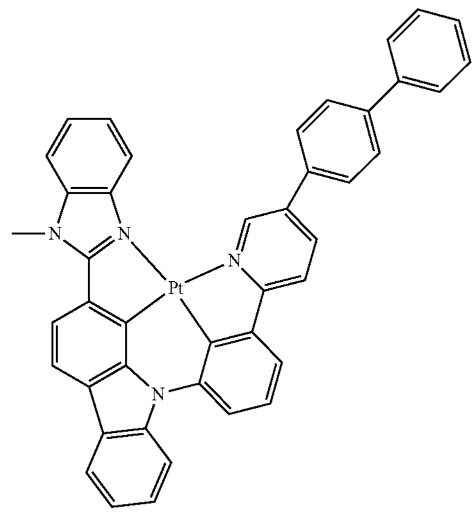
N
N
N
Pt
N
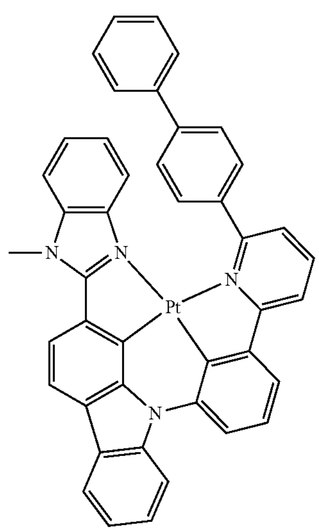
N
N
N
Pt
N -continued
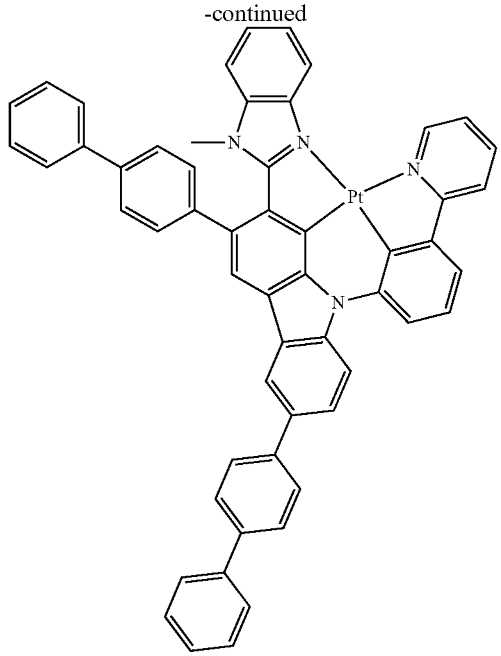
-continued
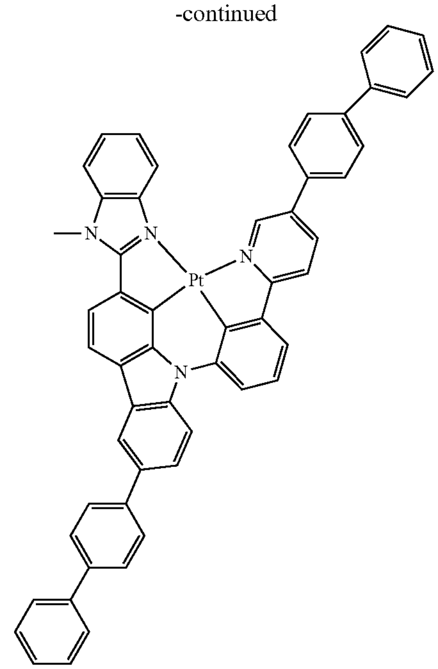
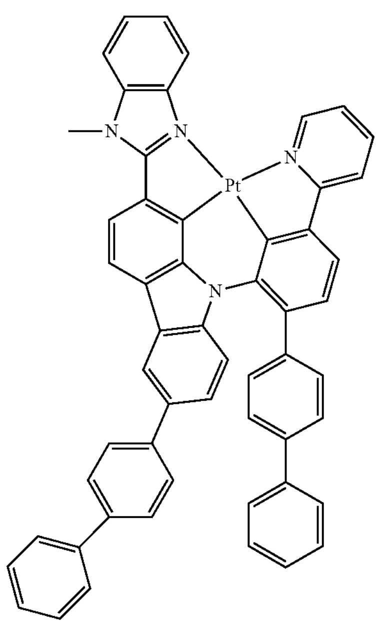
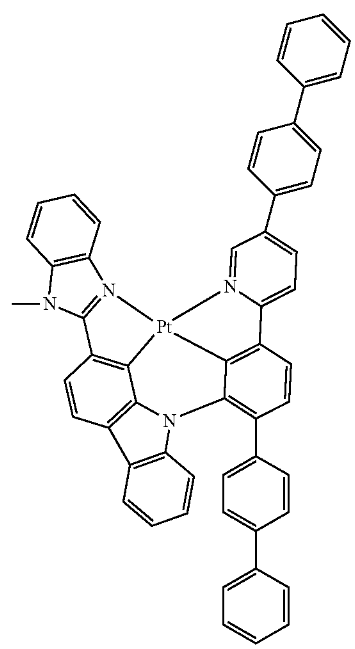

-continued
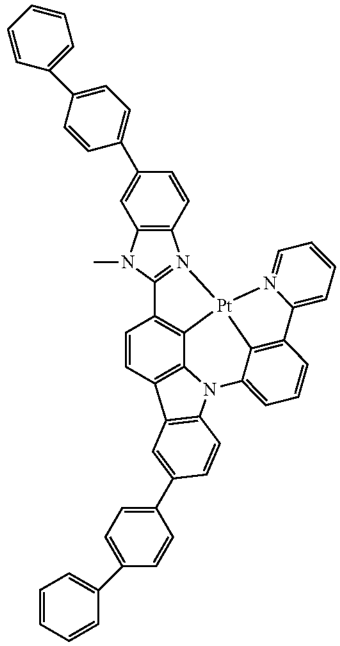
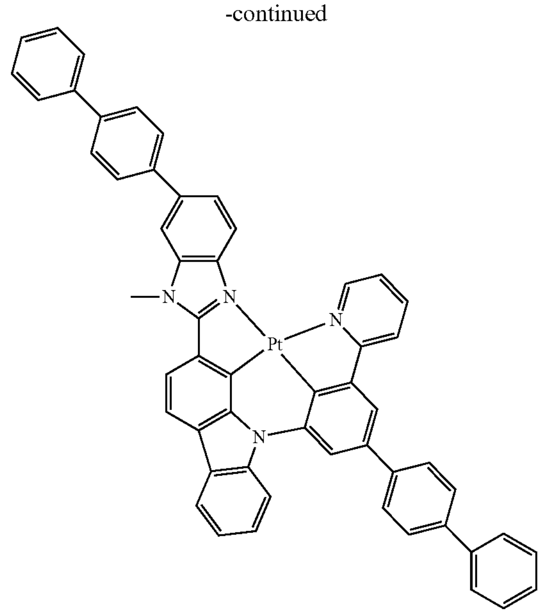
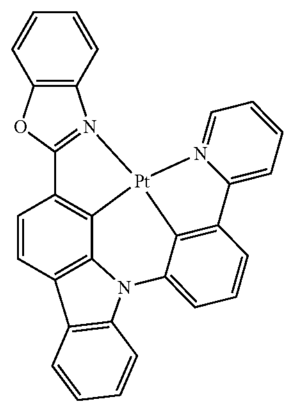
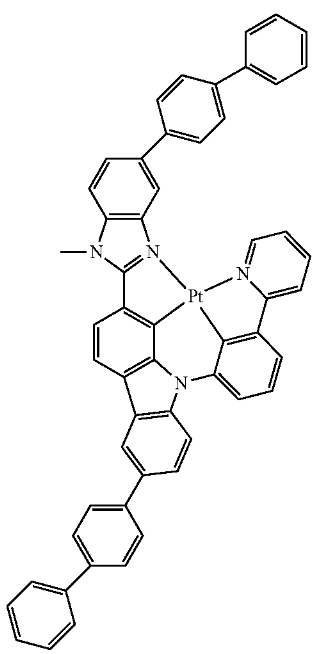
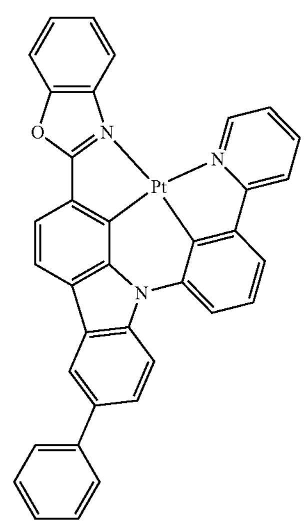

-continued
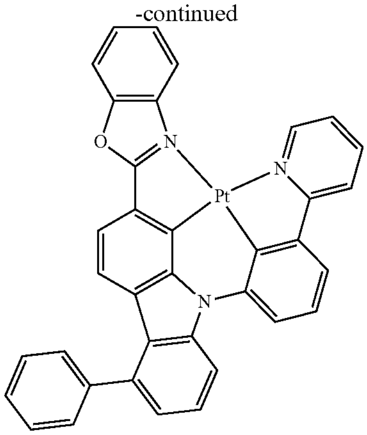
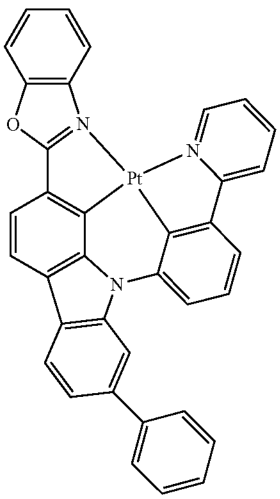
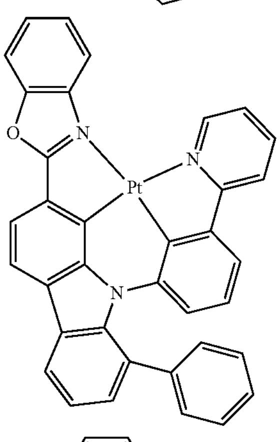
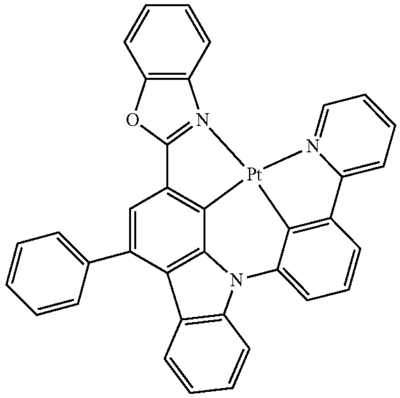
-continued
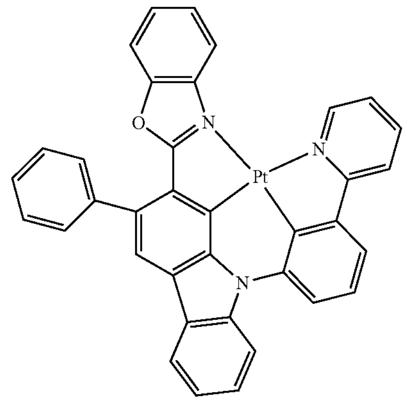
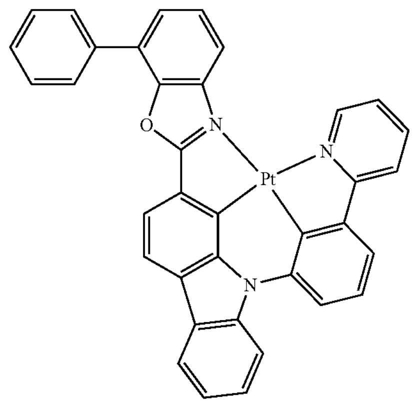
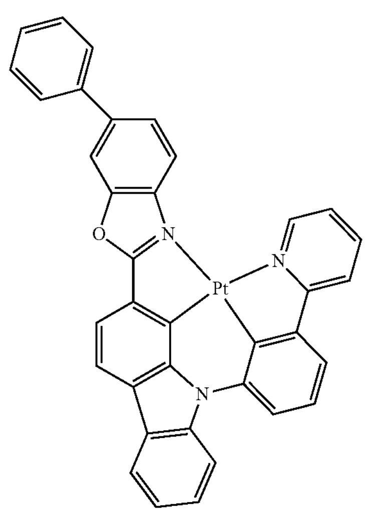

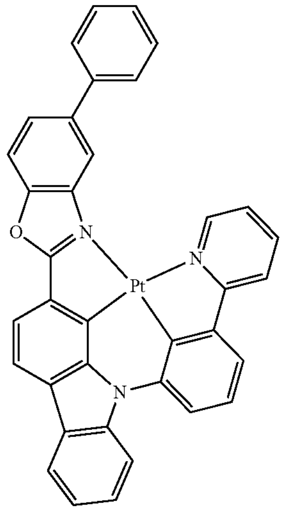
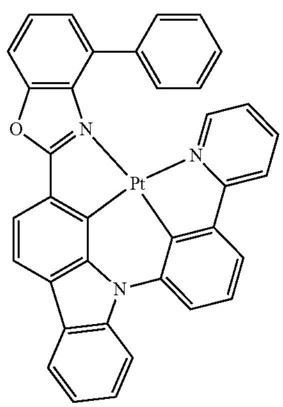
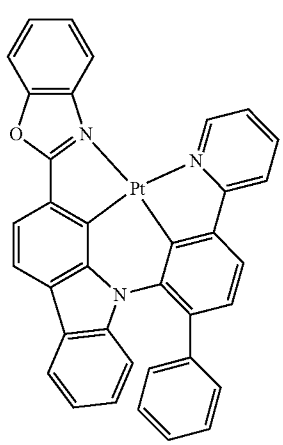
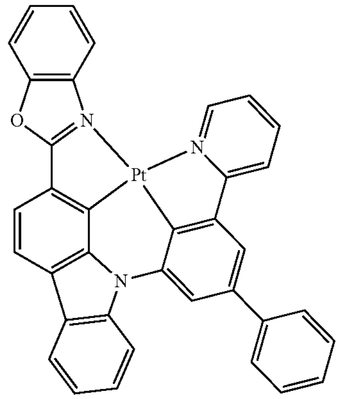
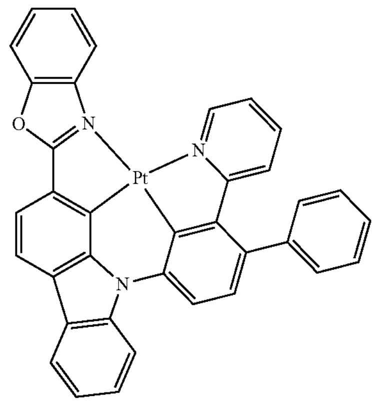
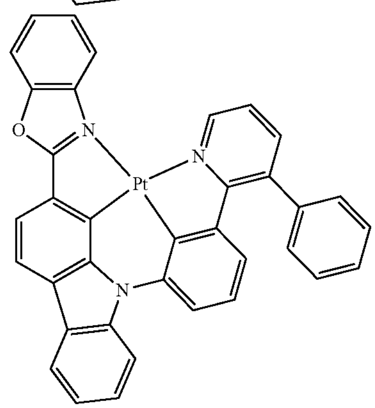
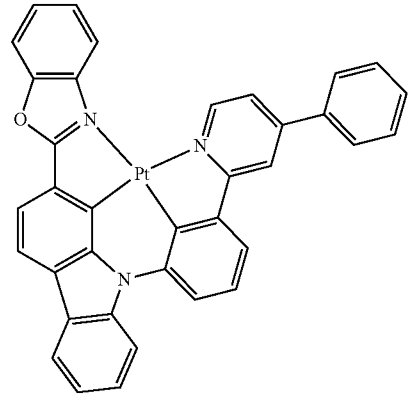

166
-continued
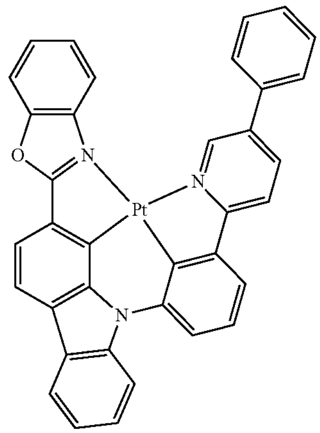
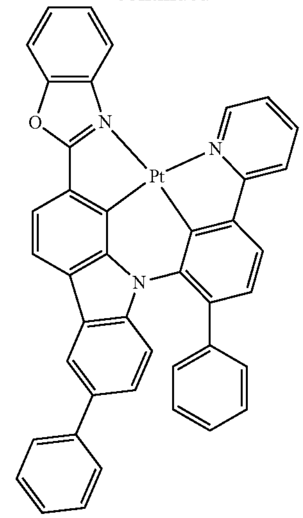
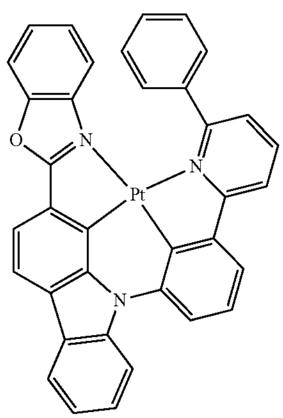
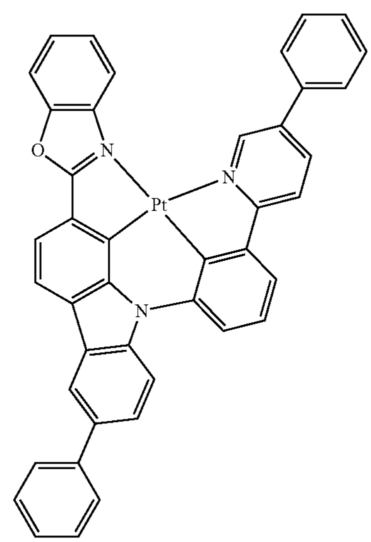
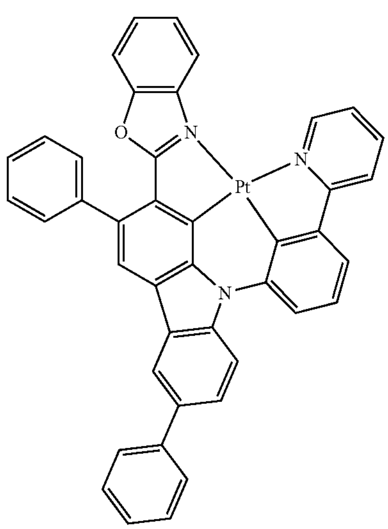
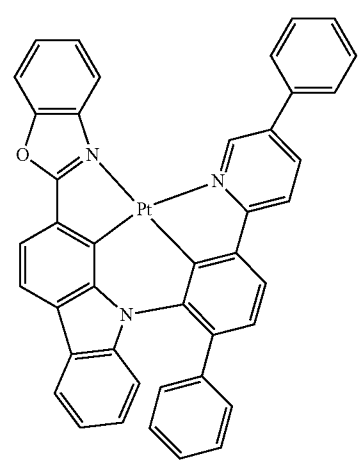

-continued
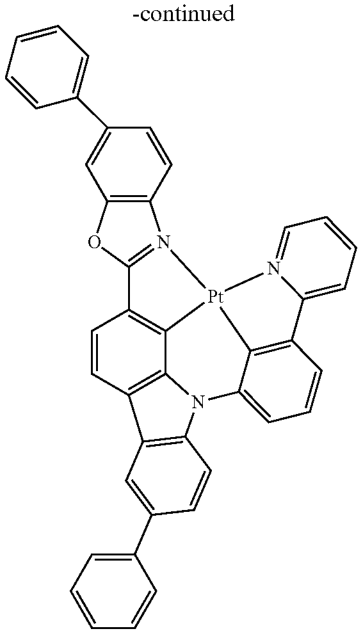
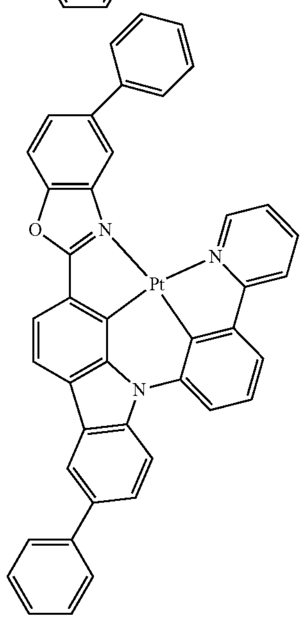
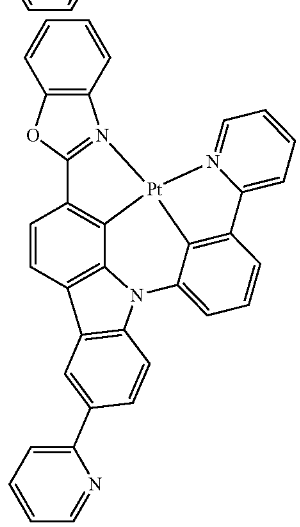
-continued
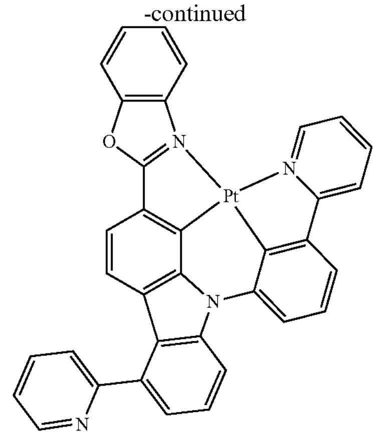
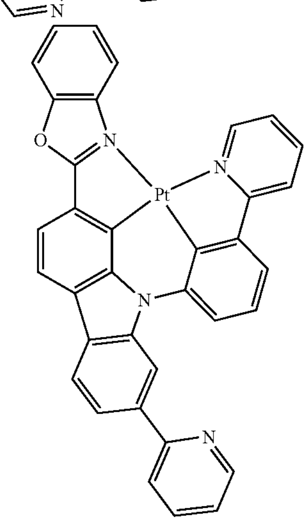
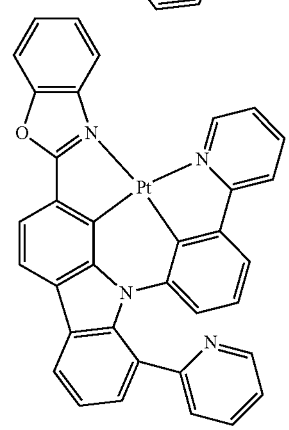
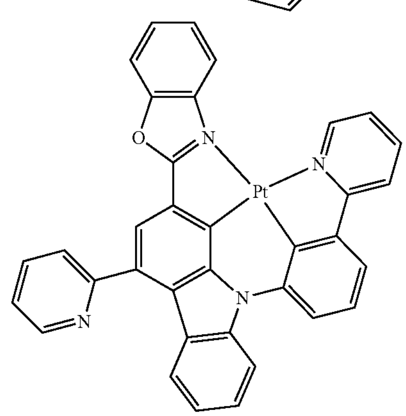

-continued
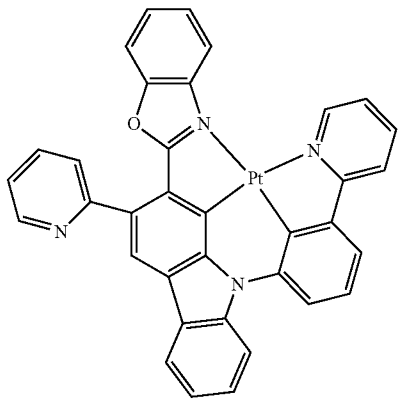
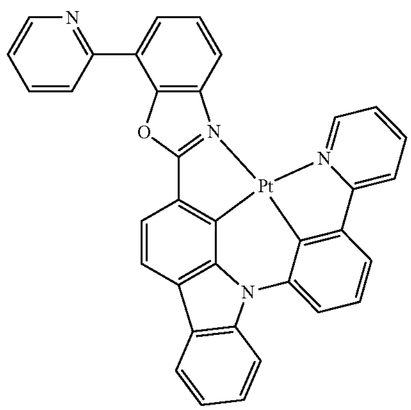
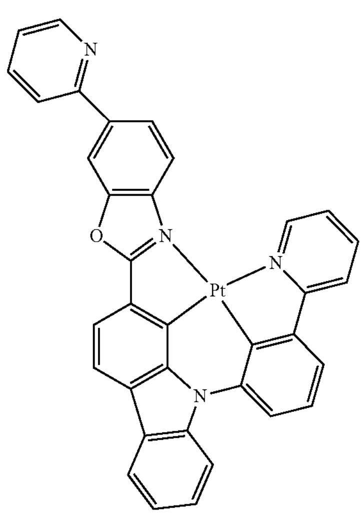
-continued
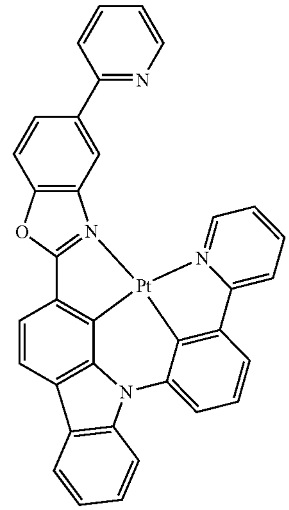
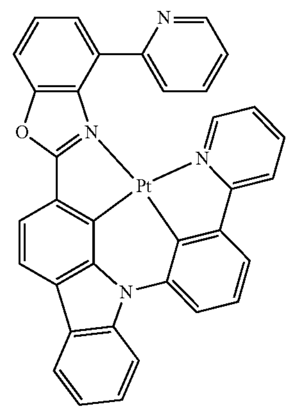
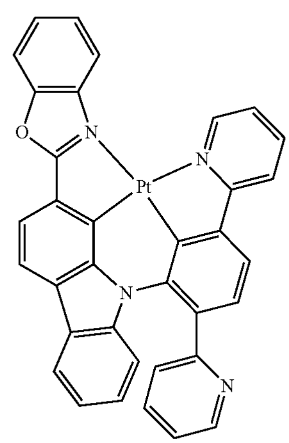

-continued
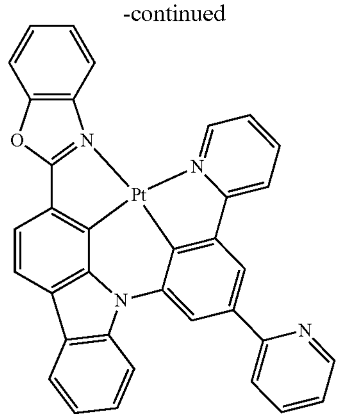
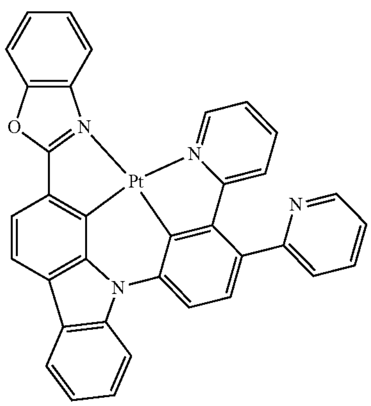
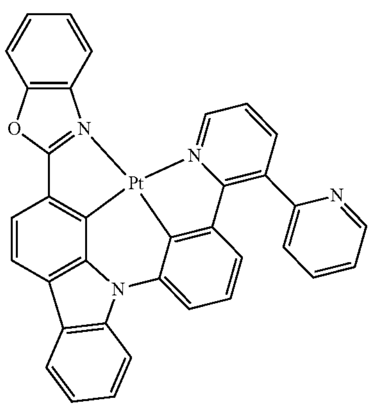
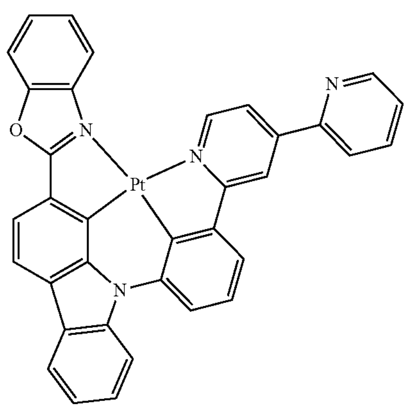
-continued
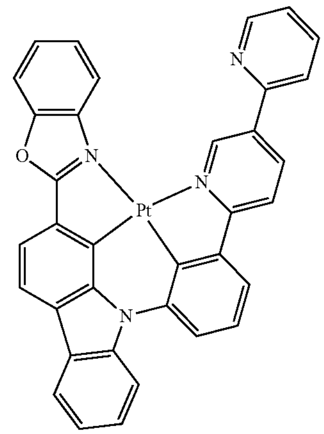
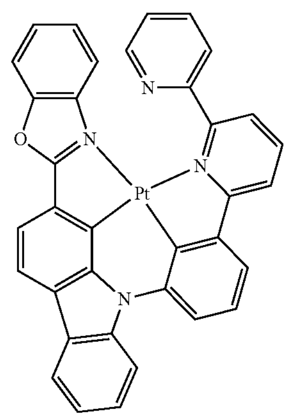
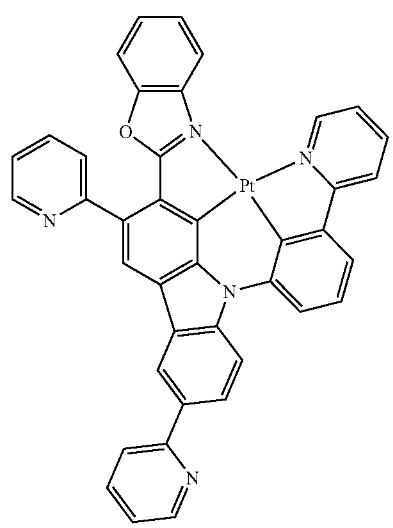

-continued
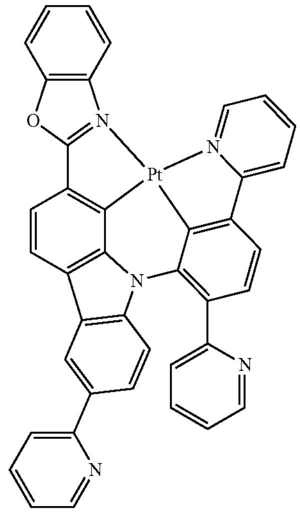
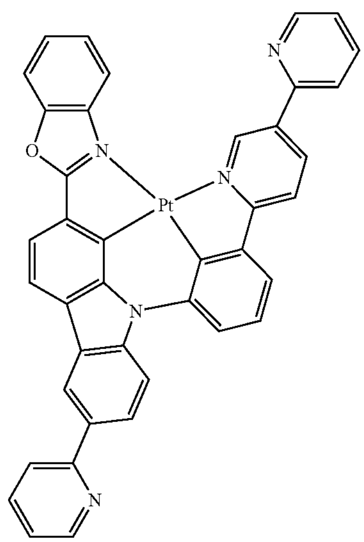
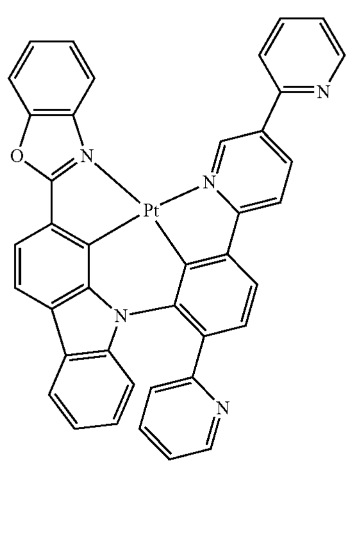
-continued
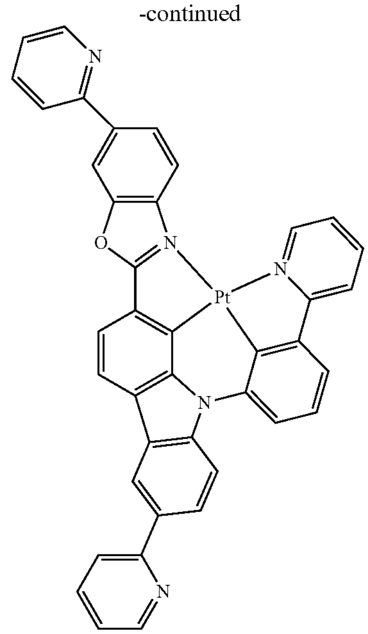
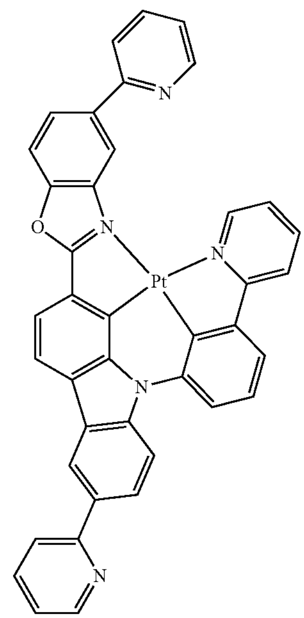
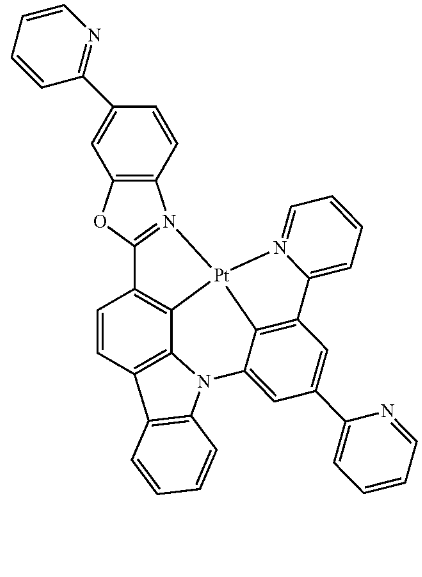

-continued
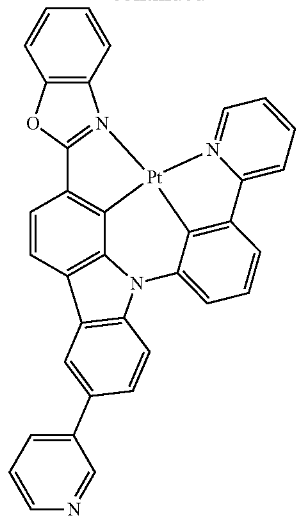
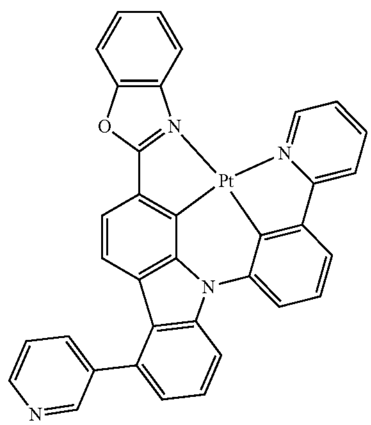
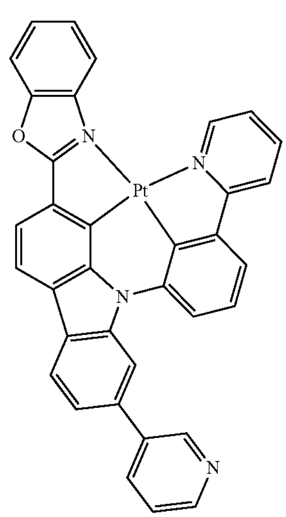
-continued
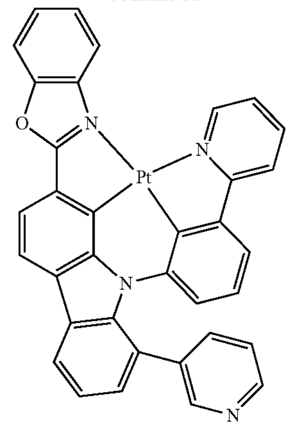
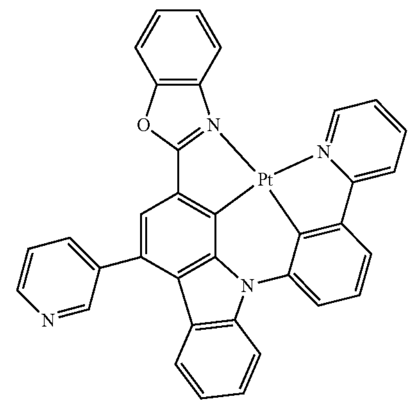
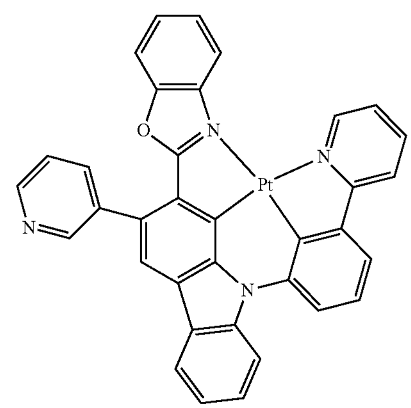
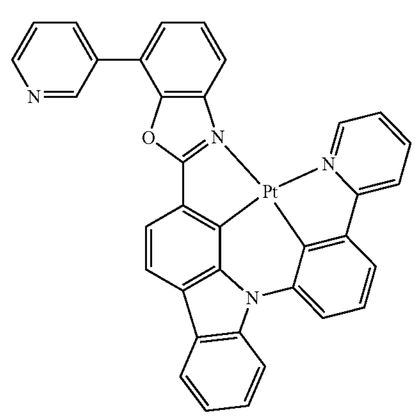

-continued
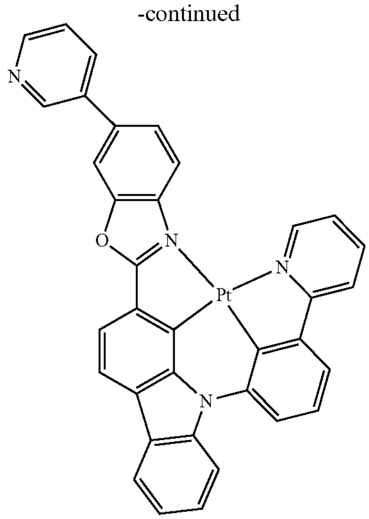
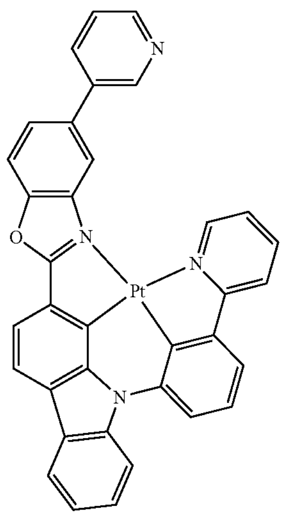
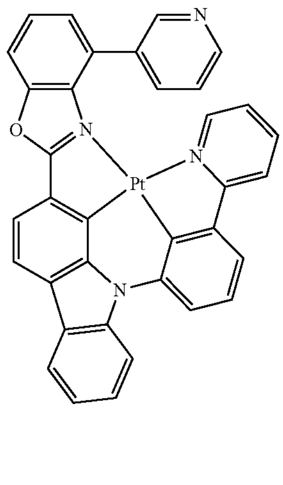
-continued
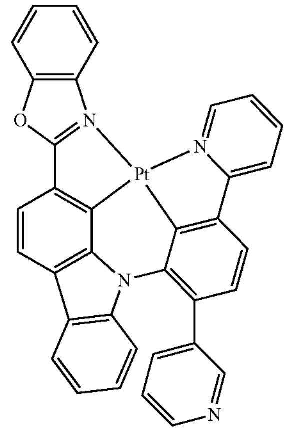
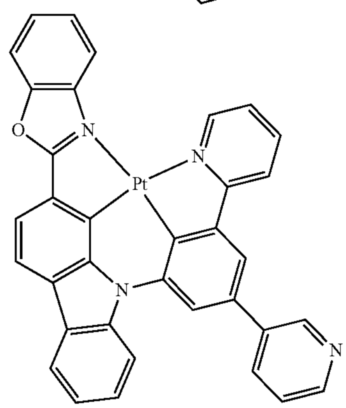
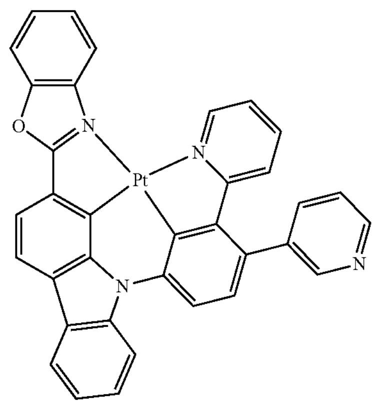
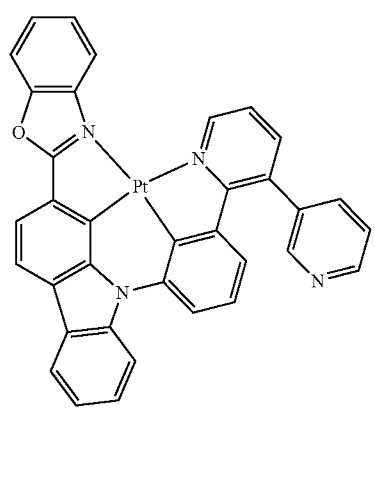

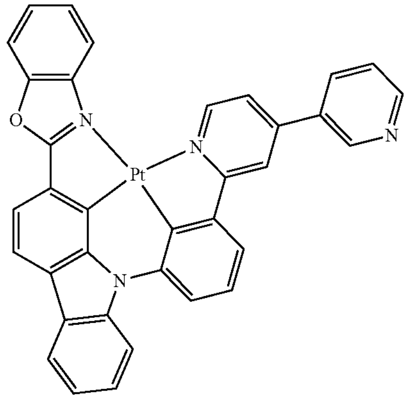
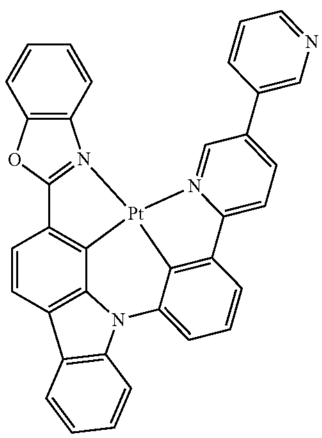
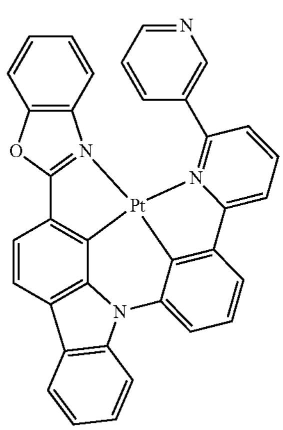
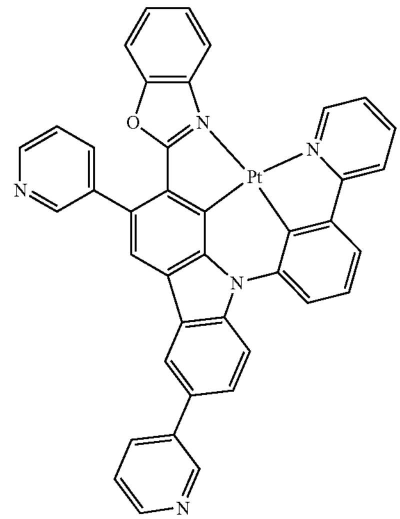
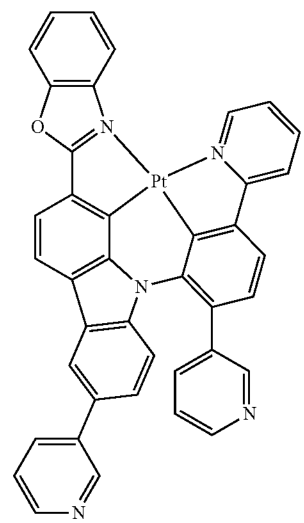
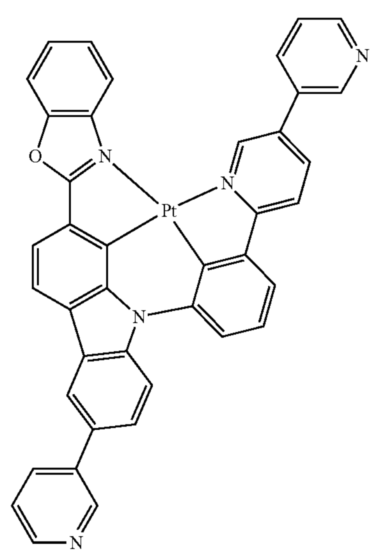

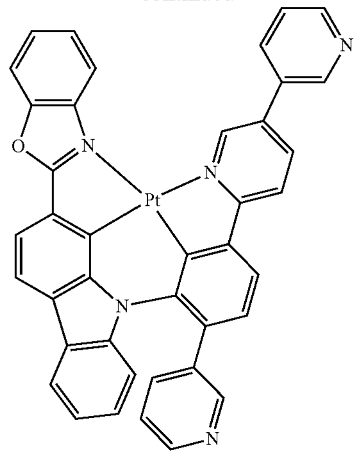
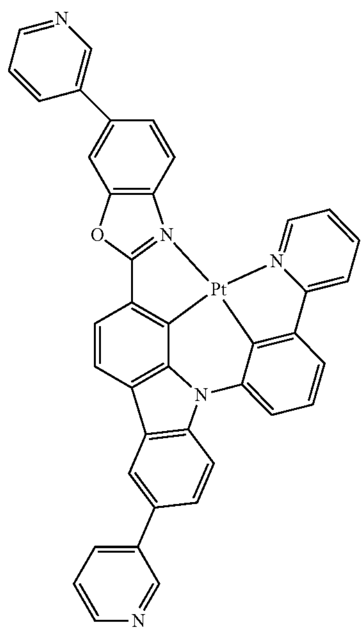
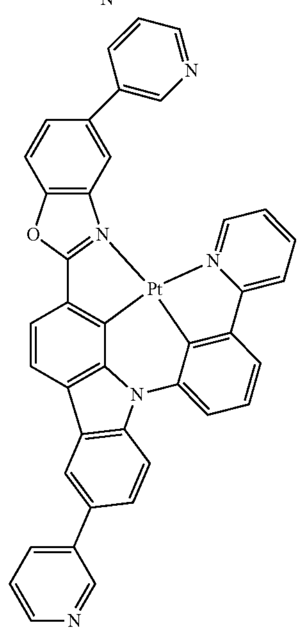
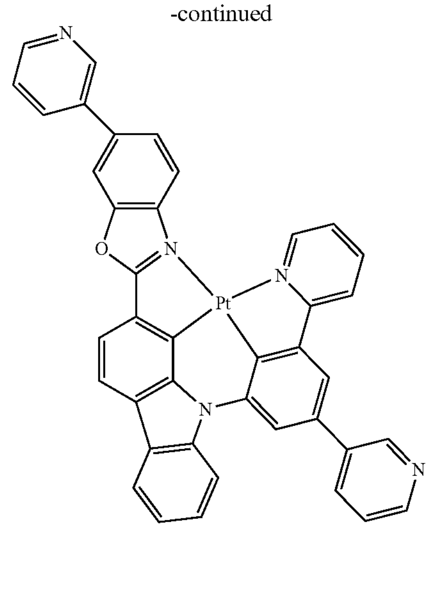
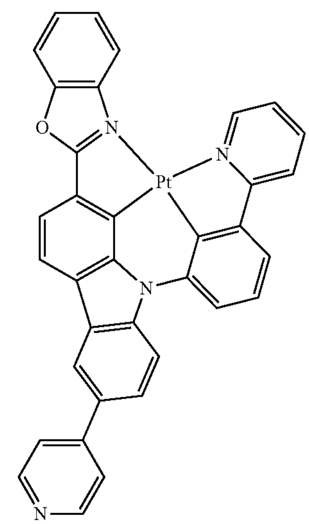
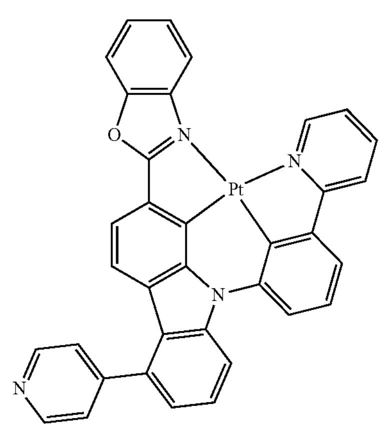

-continued
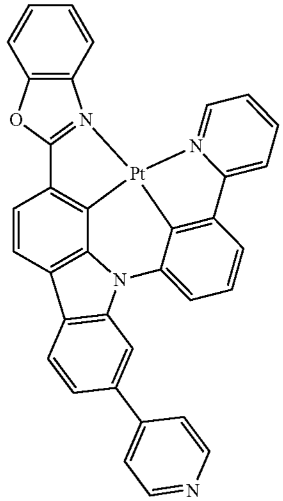
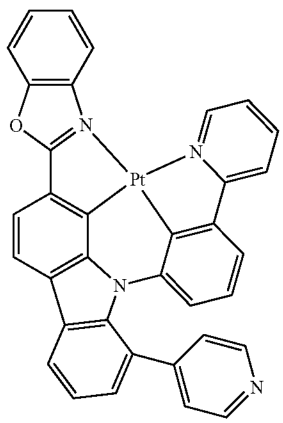
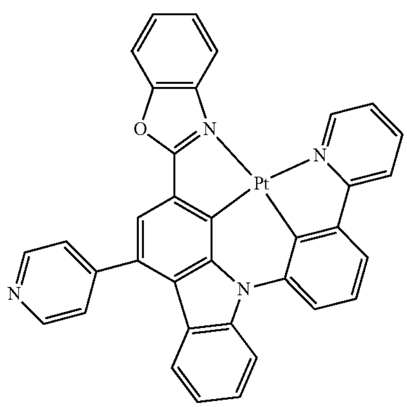
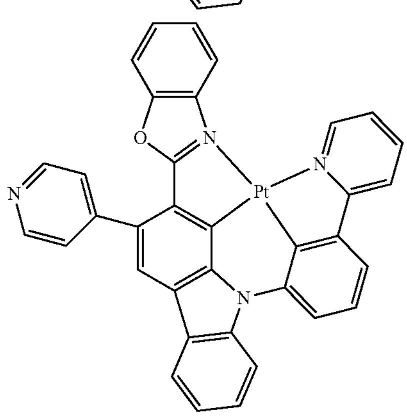
-continued
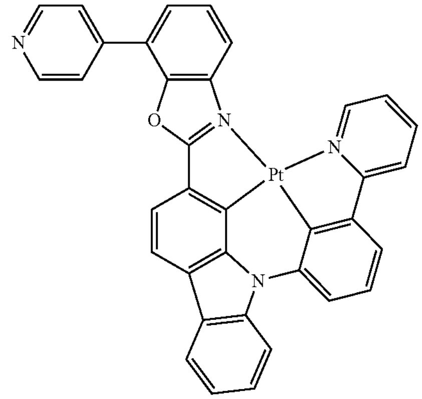
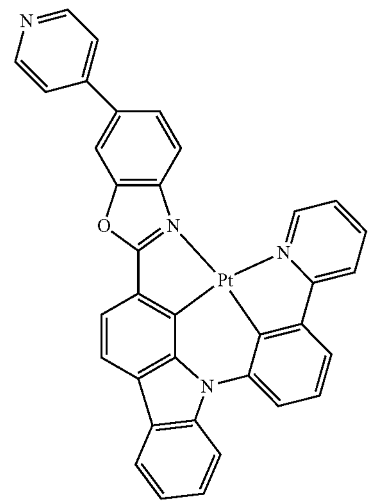
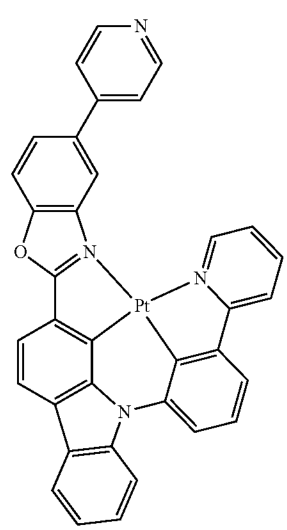

-continued
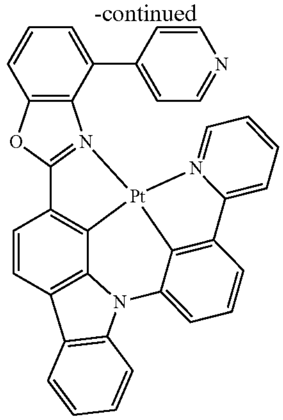
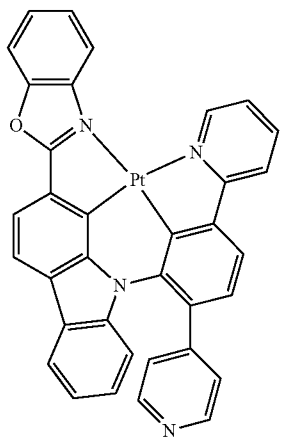
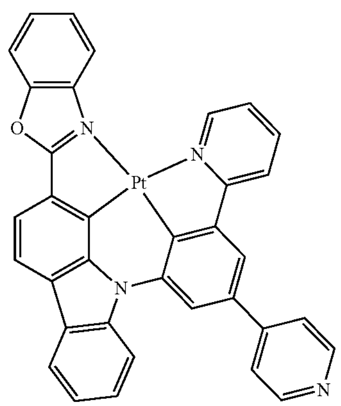
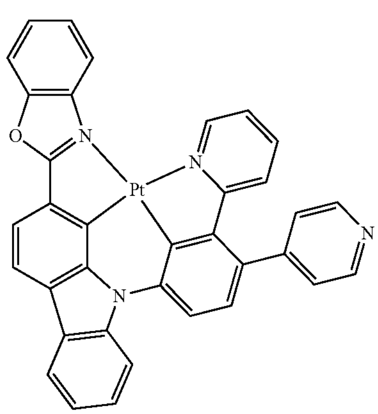
-continued
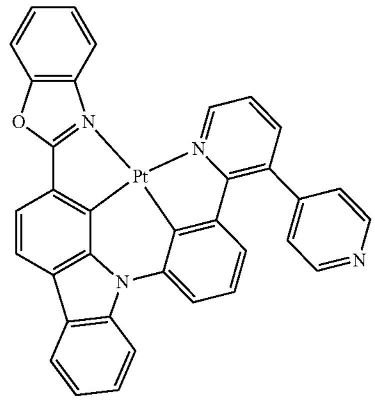
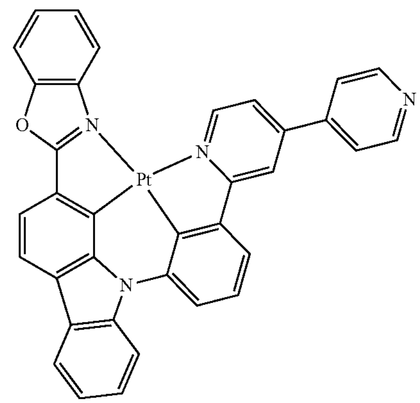
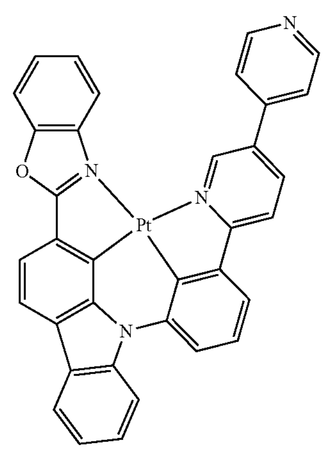
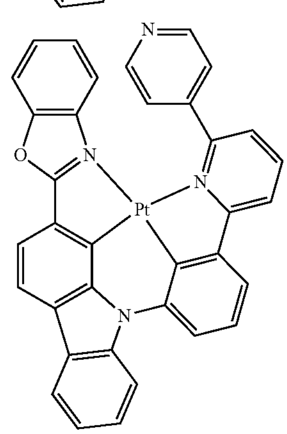

-continued
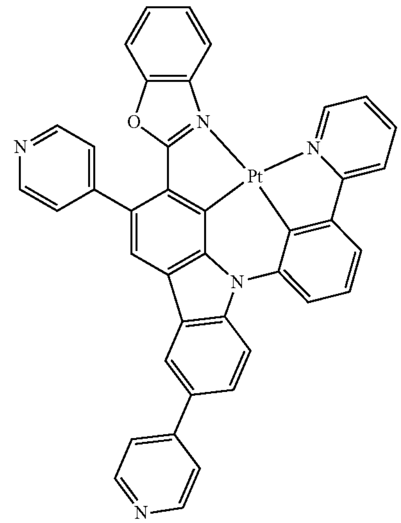
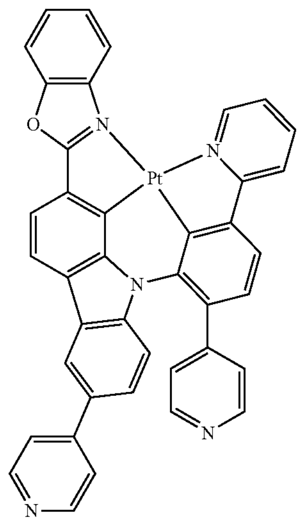
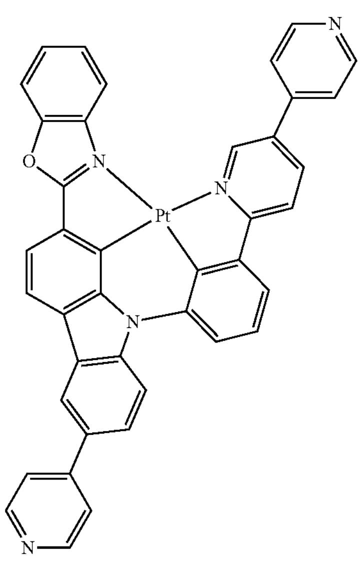
-continued
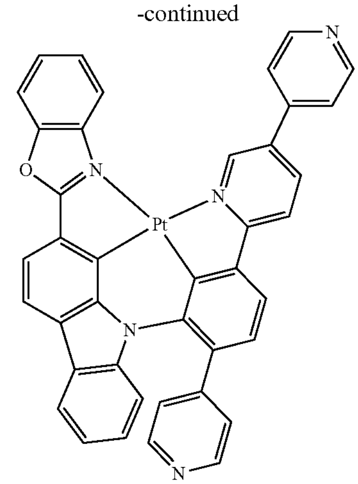
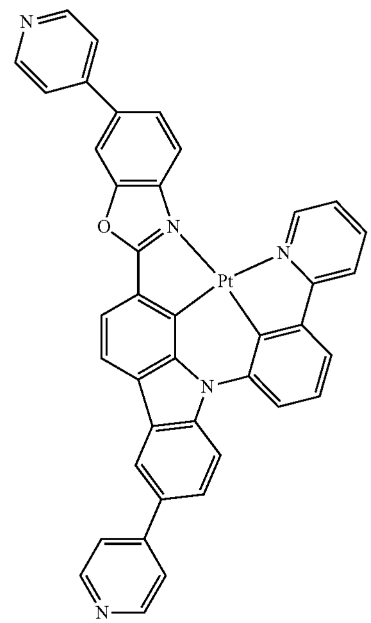
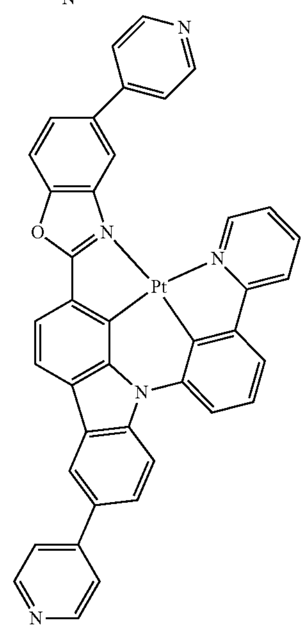

-continued
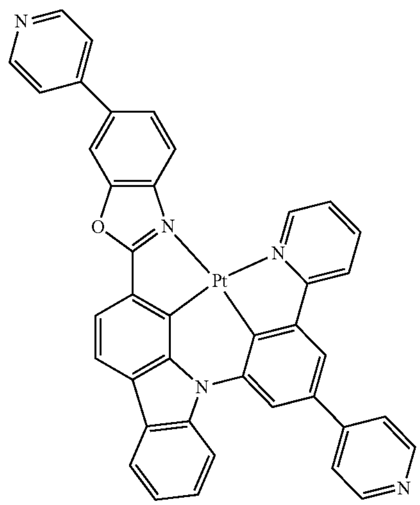
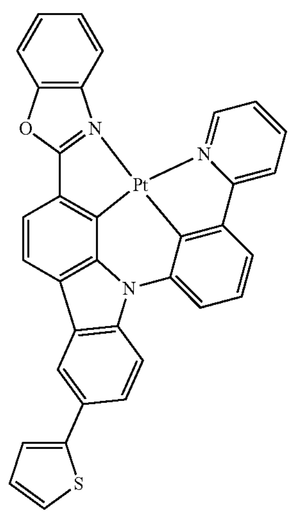
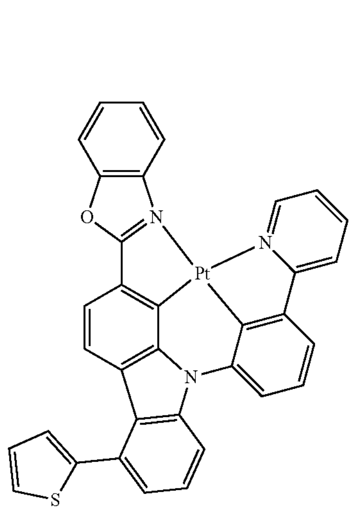
-continued
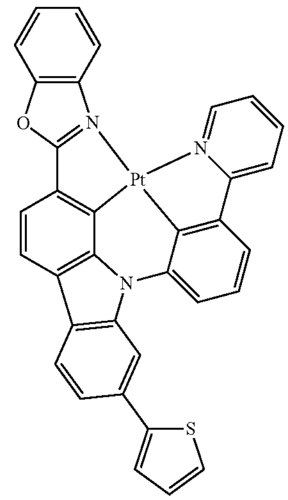
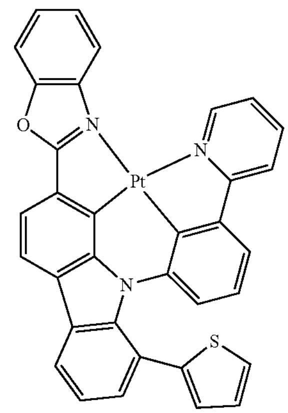
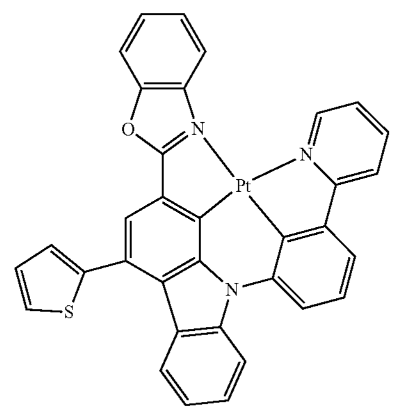
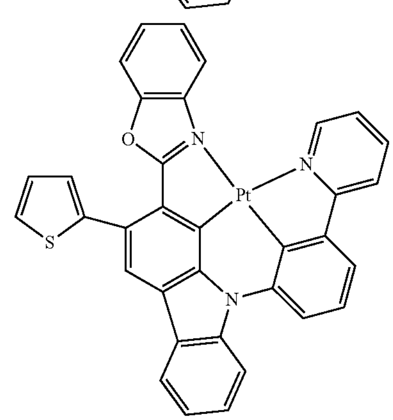

-continued
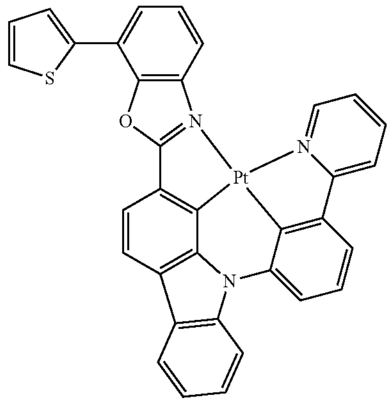
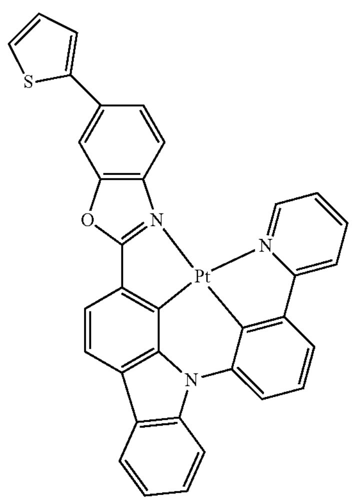
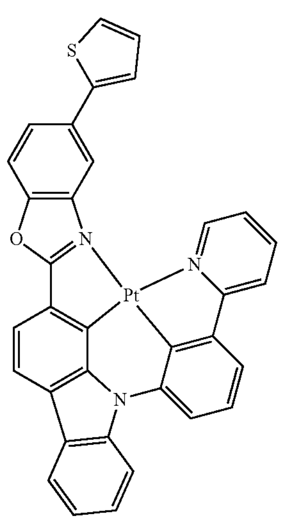
-continued
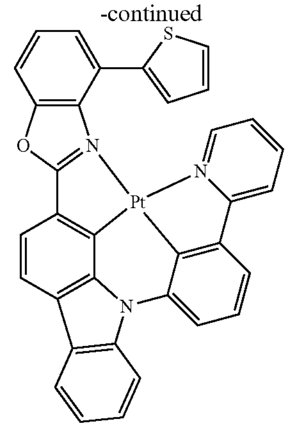
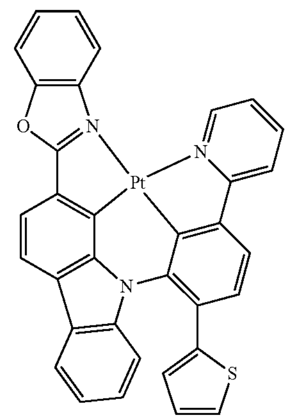
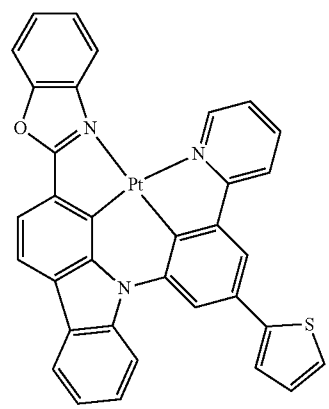
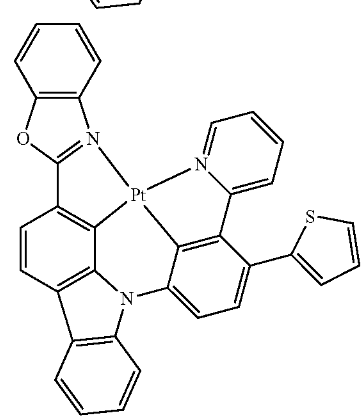

-continued
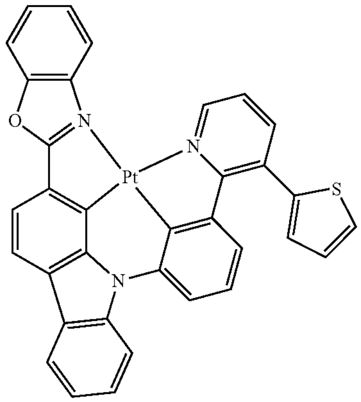
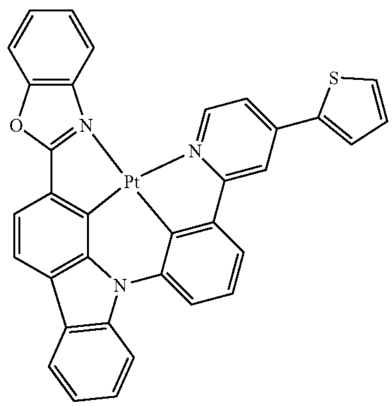
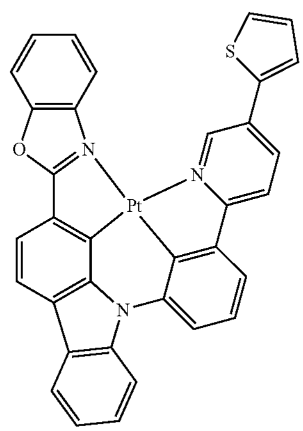
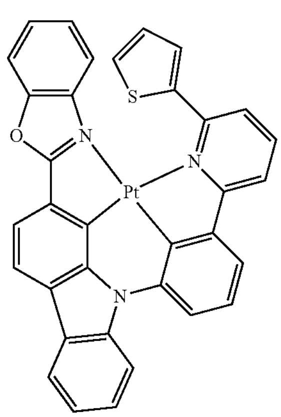
-continued
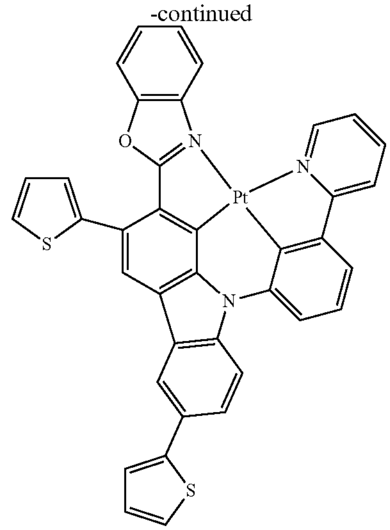
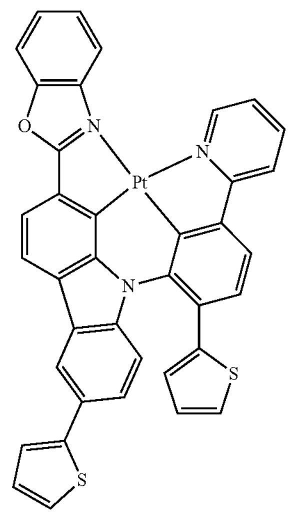
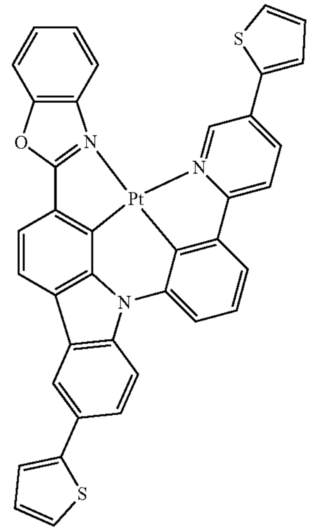

-continued
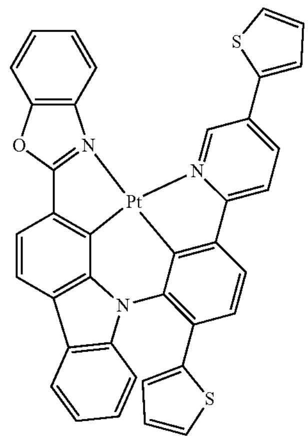
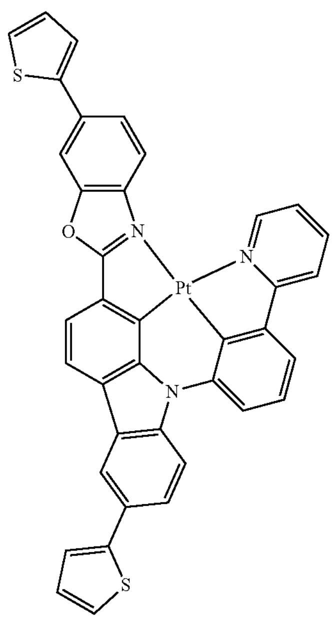
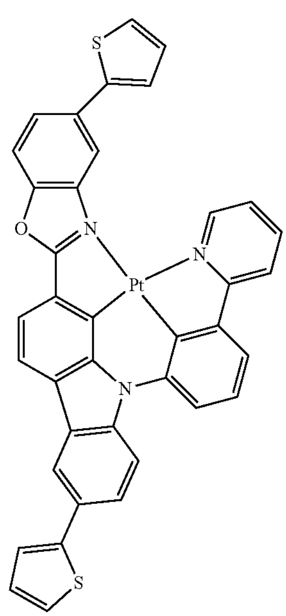
-continued
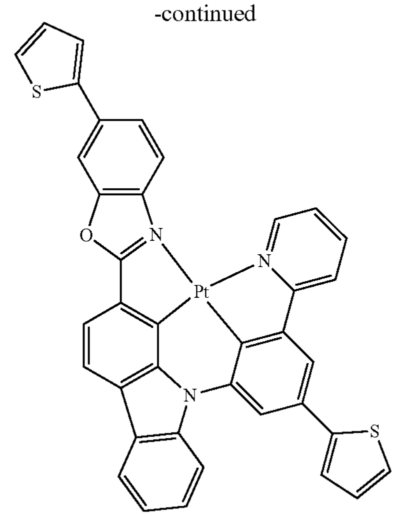
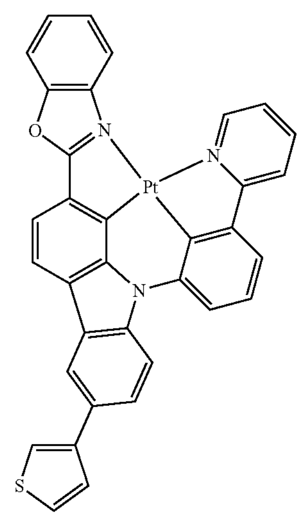
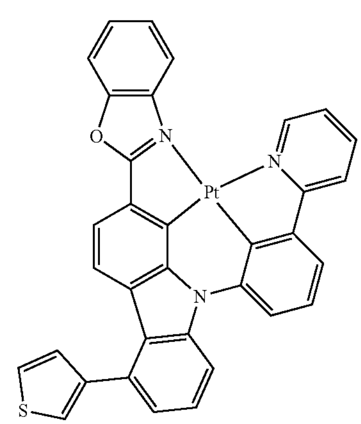

-continued
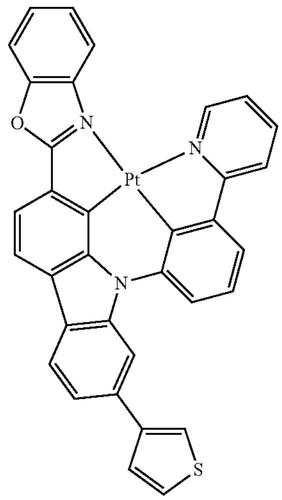
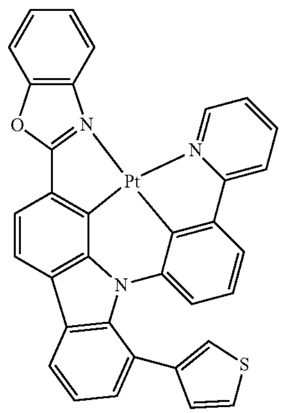
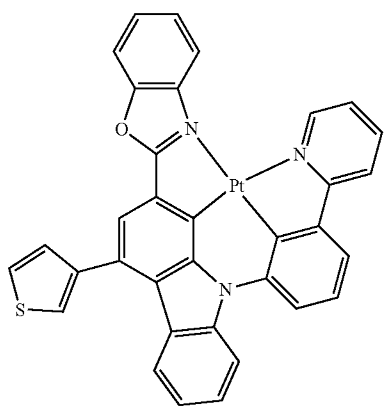
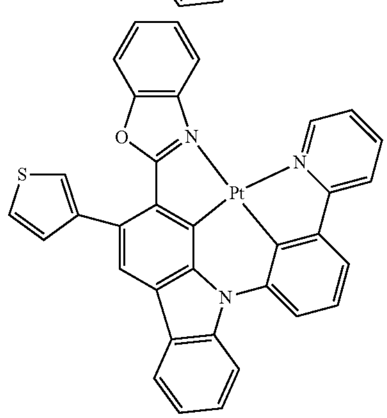
-continued
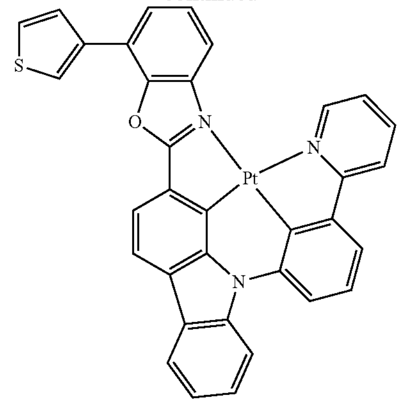
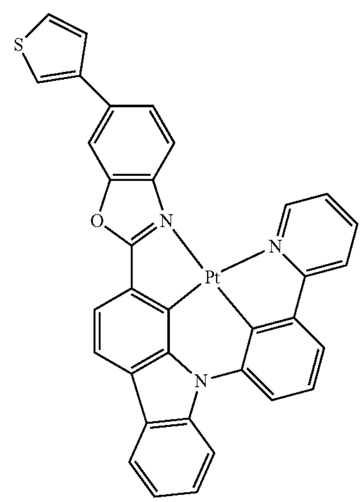
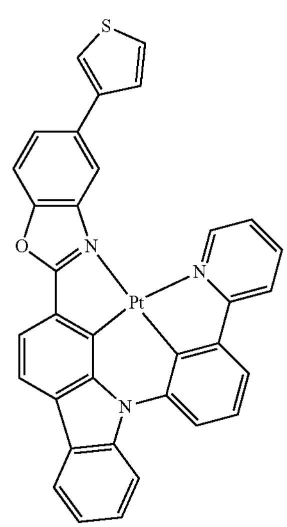

-continued
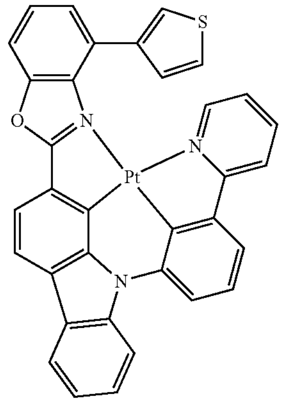
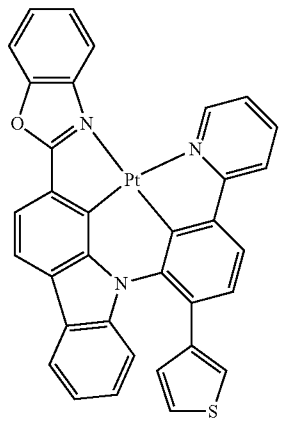
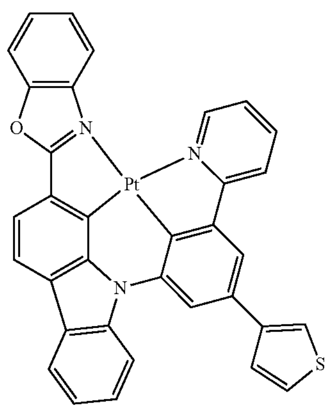
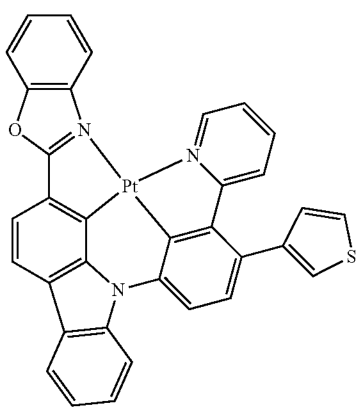
-continued
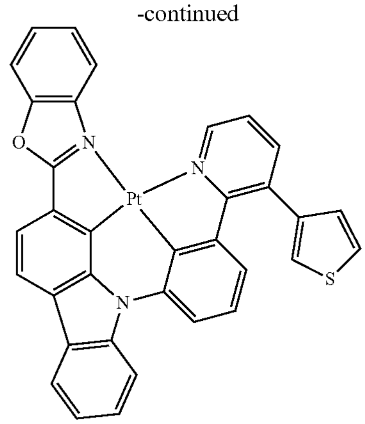
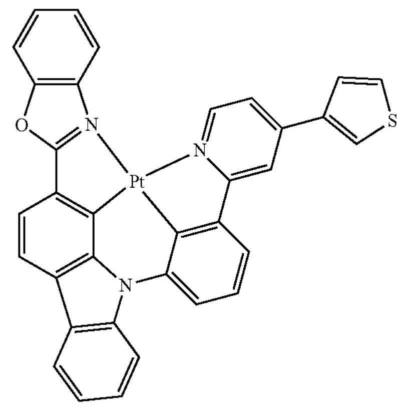
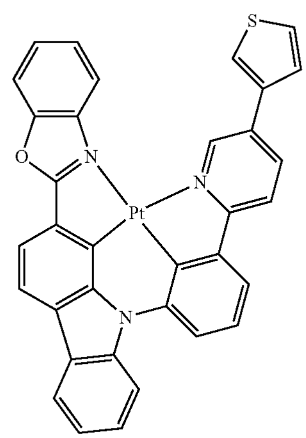
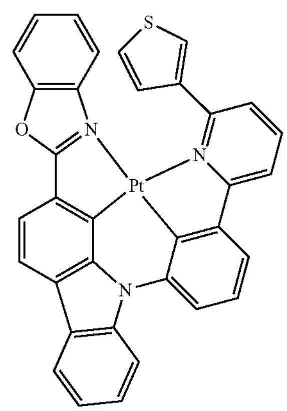

-continued
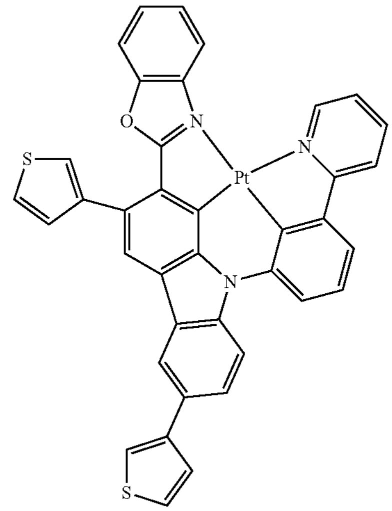
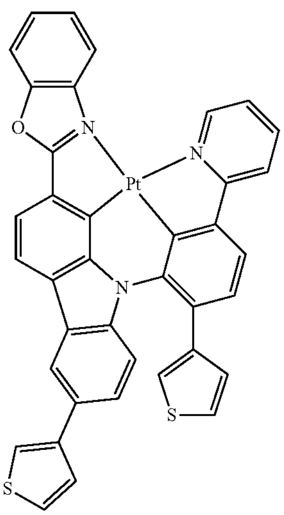
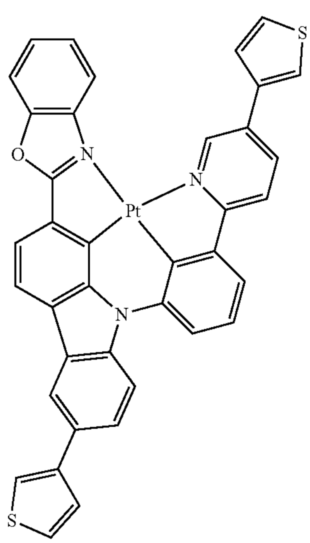
-continued
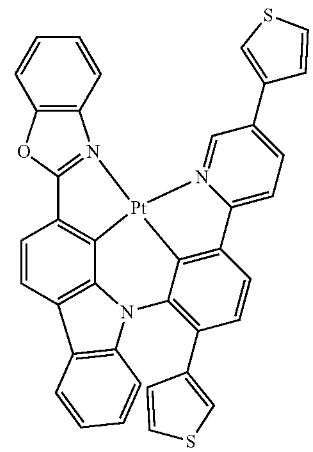
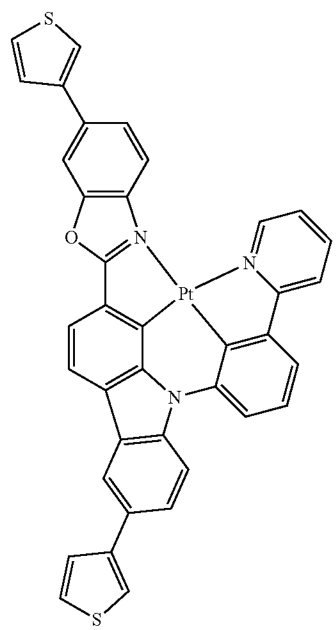
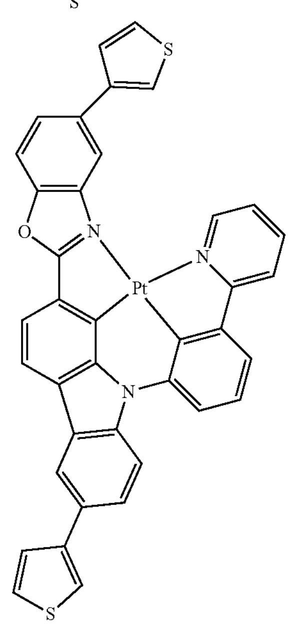

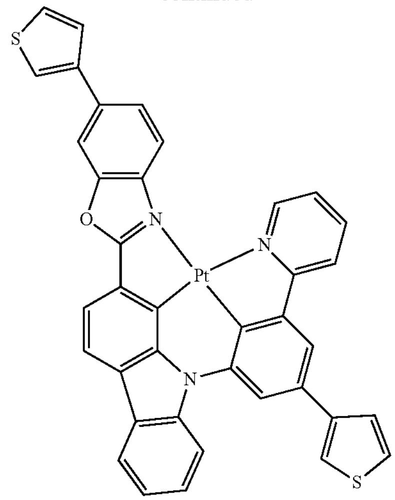
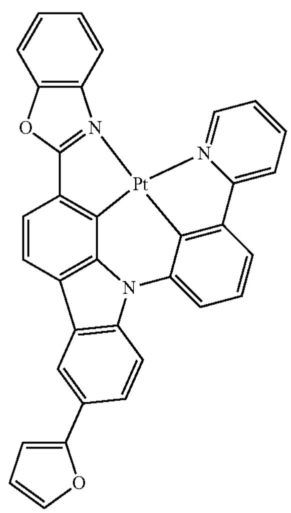
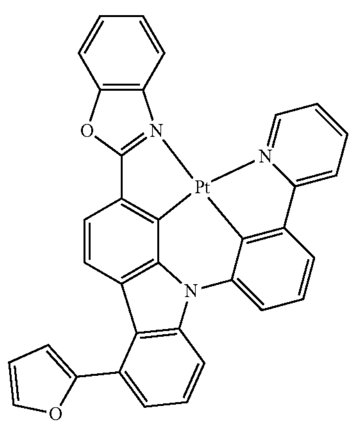
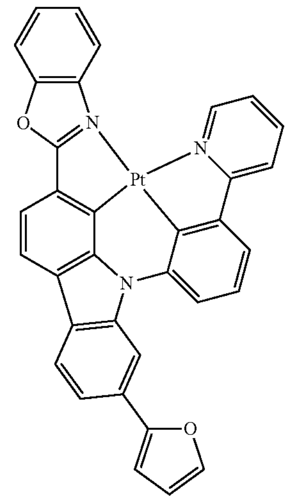
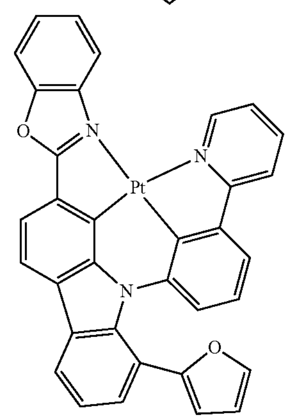
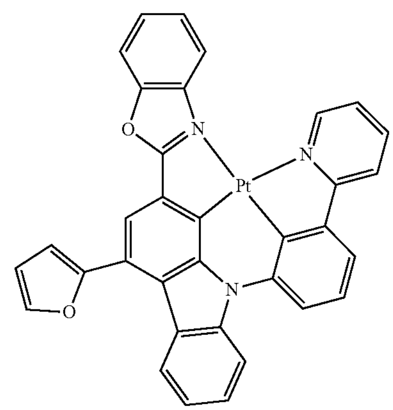
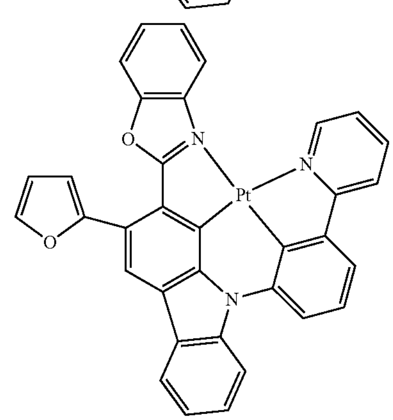

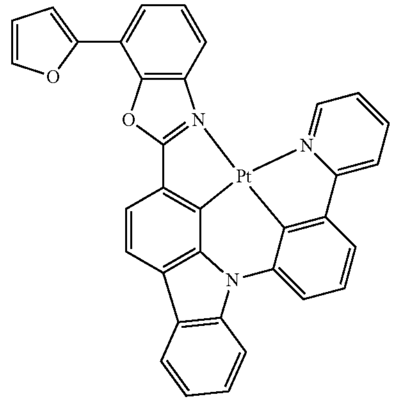
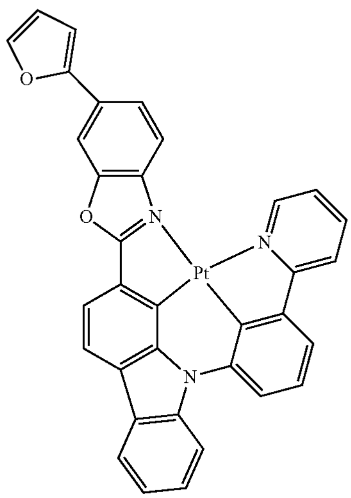
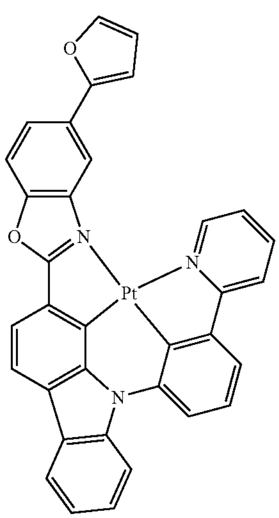
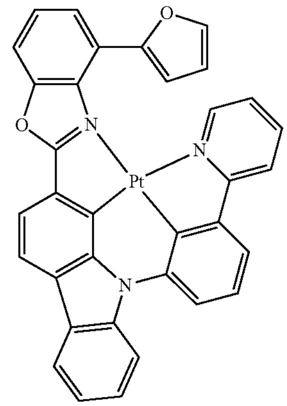
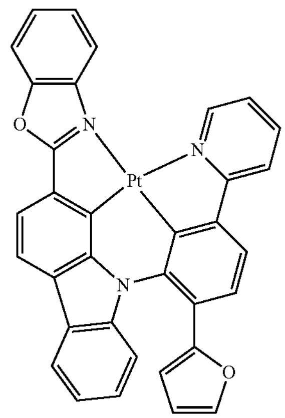
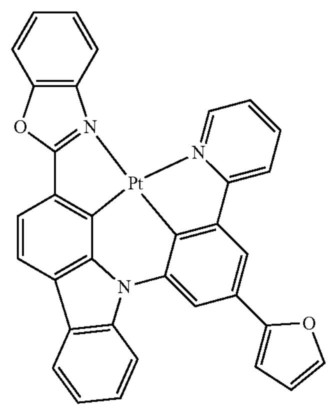
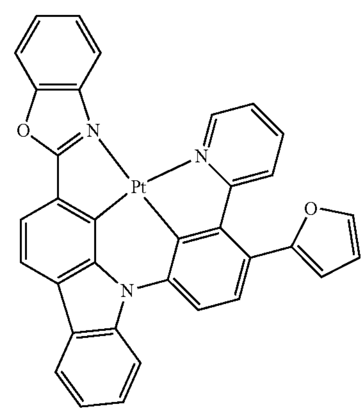

-continued
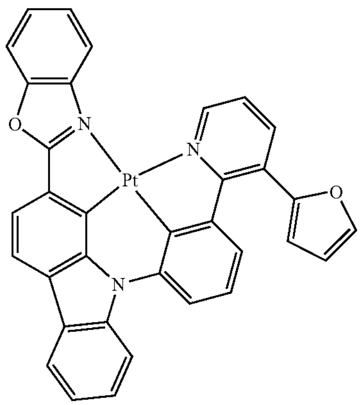
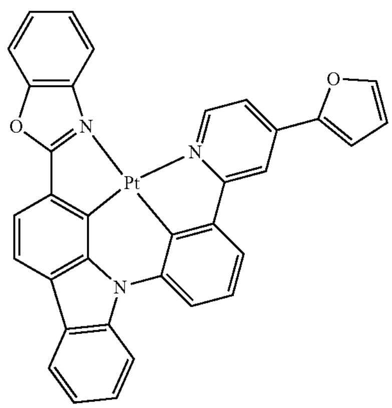
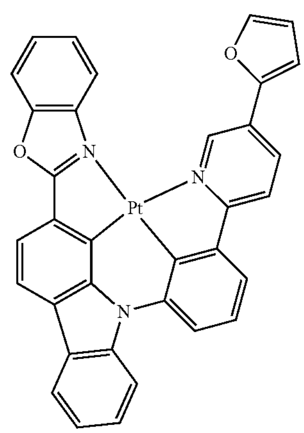
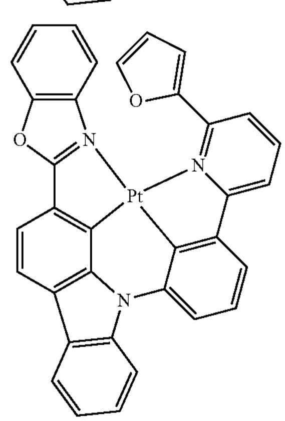
-continued
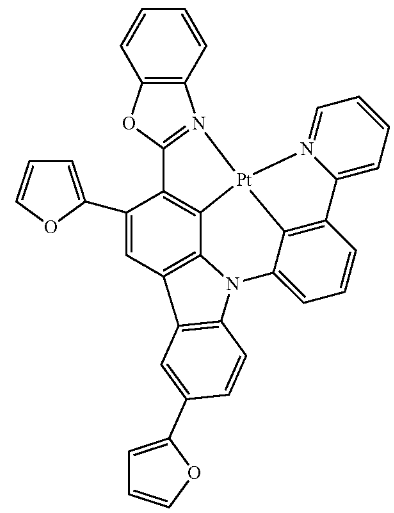
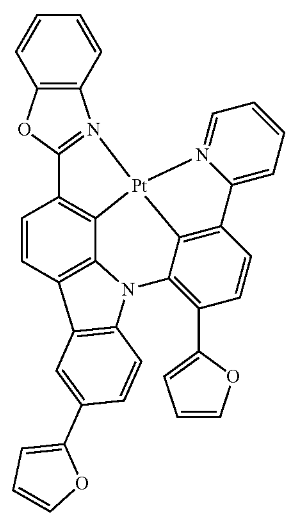
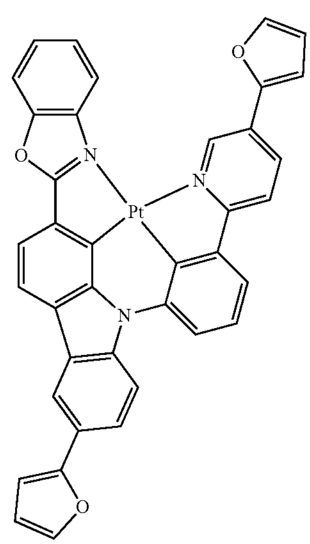

-continued
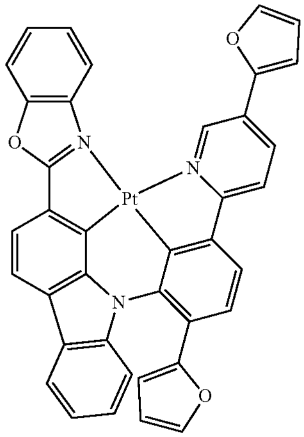
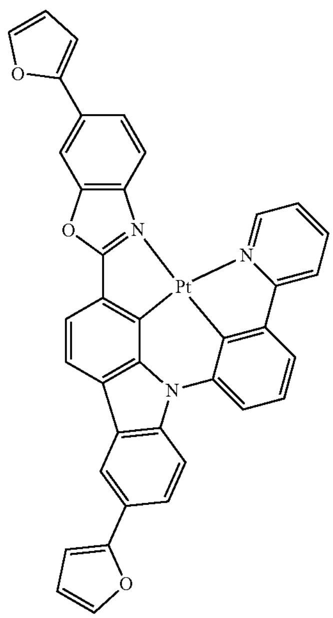
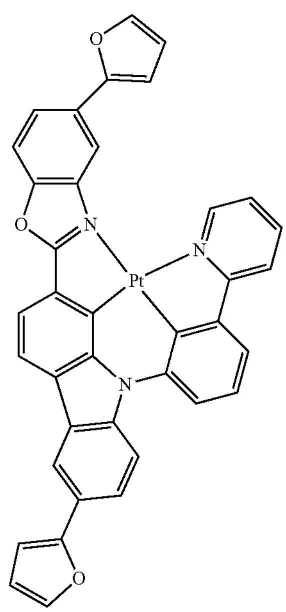
-continued
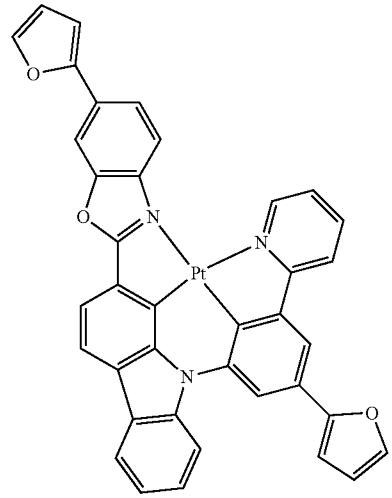
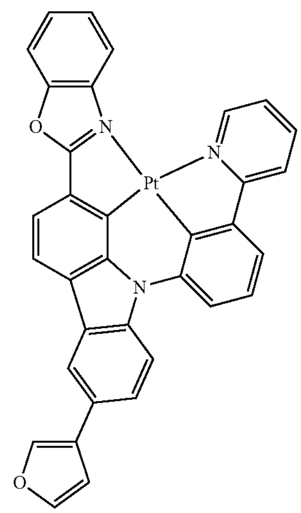
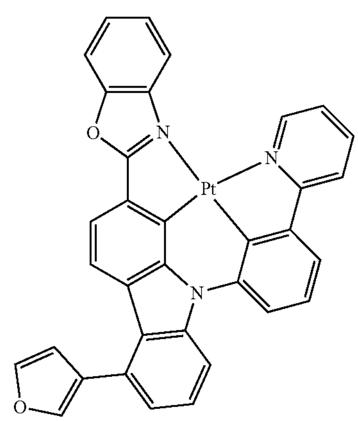

-continued
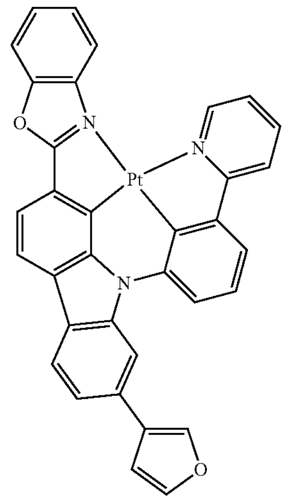
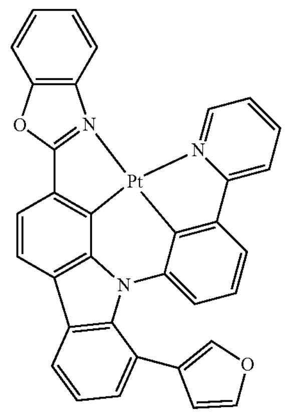
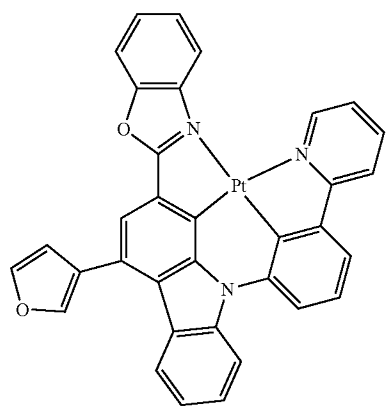
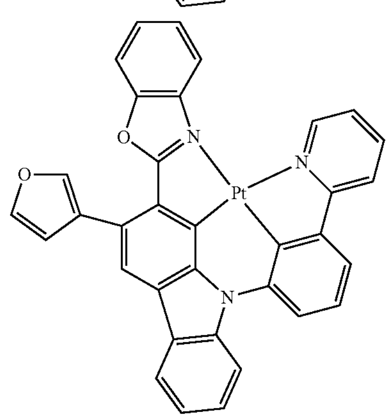
-continued
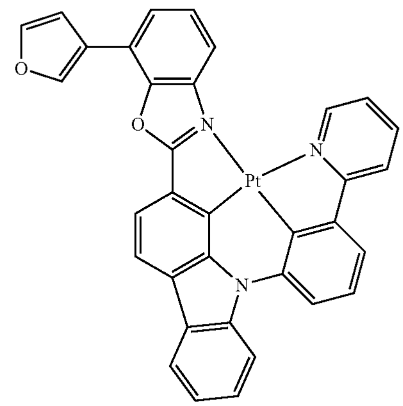
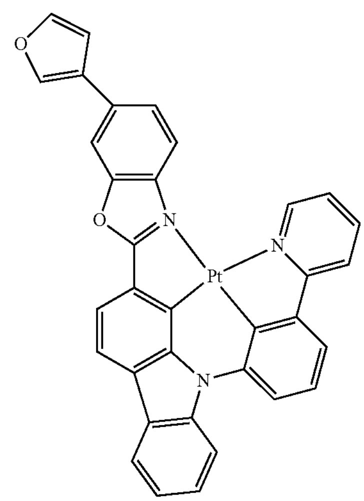
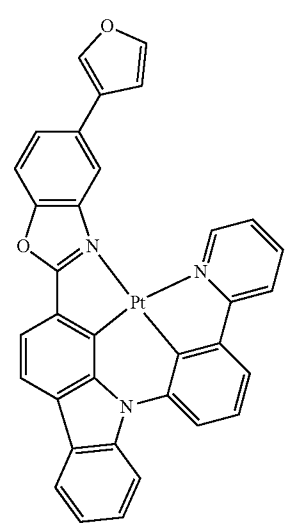

-continued
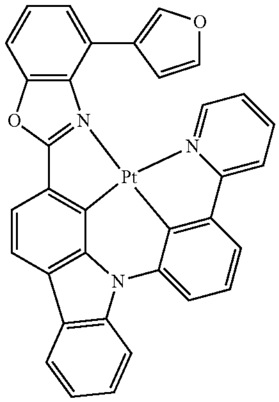
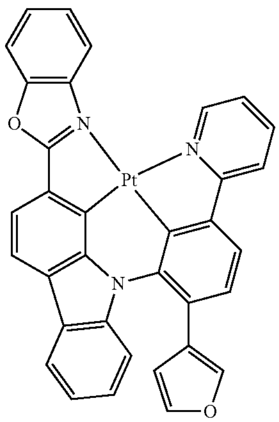
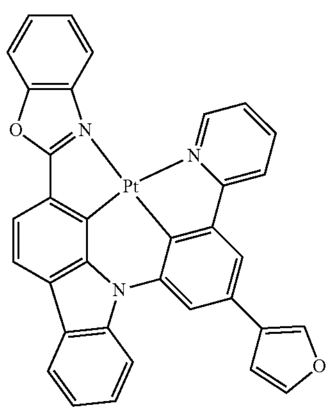
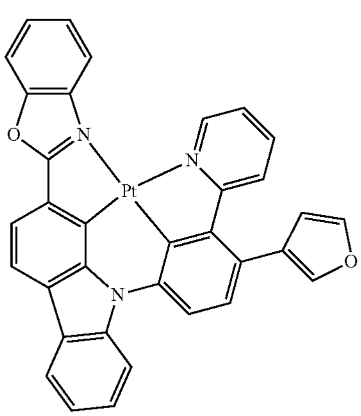
-continued
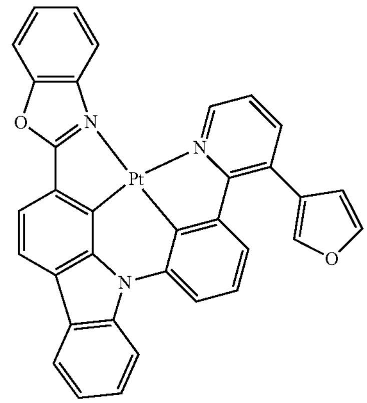
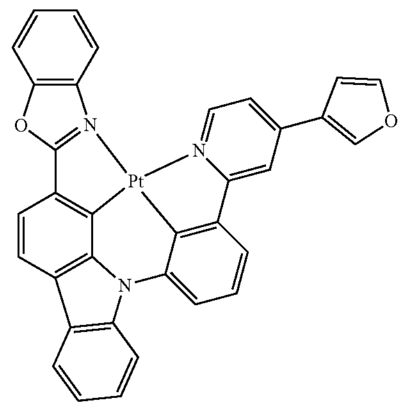
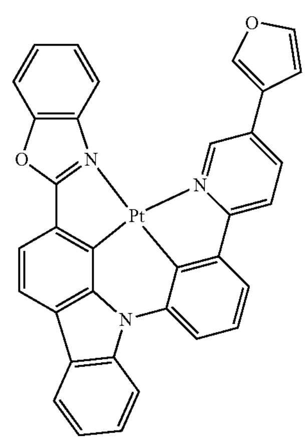
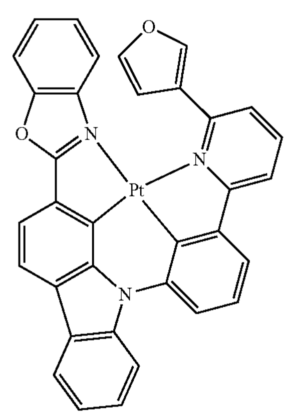

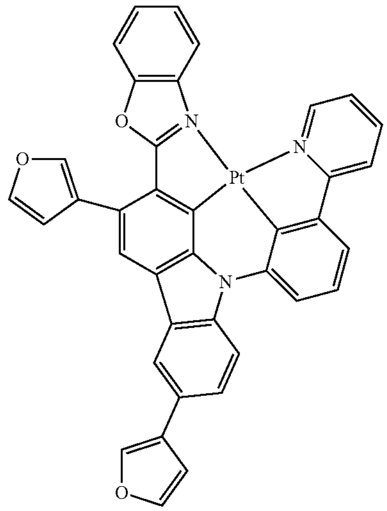
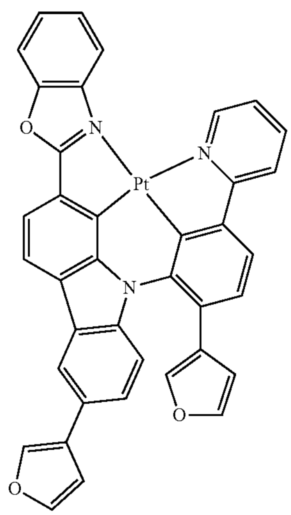
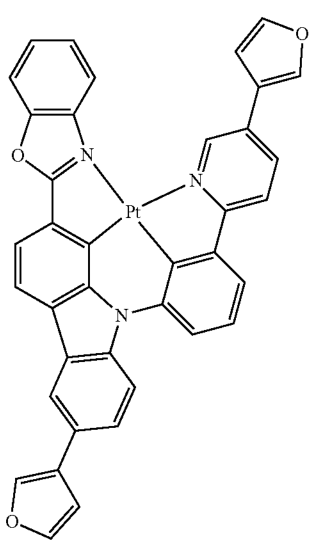
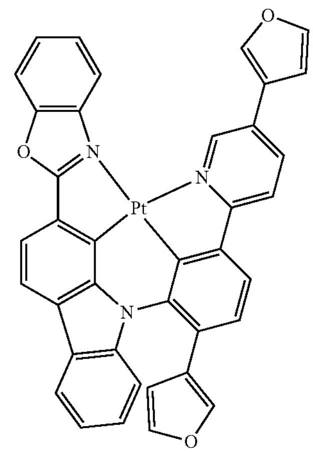
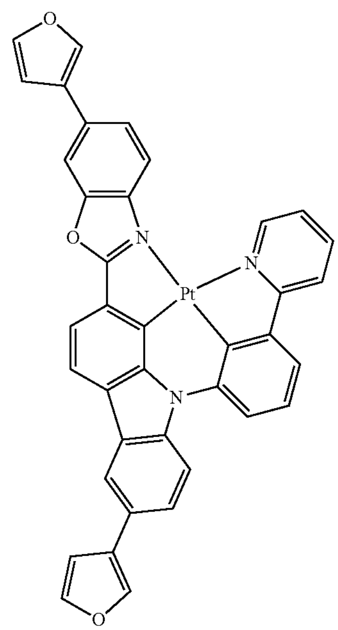
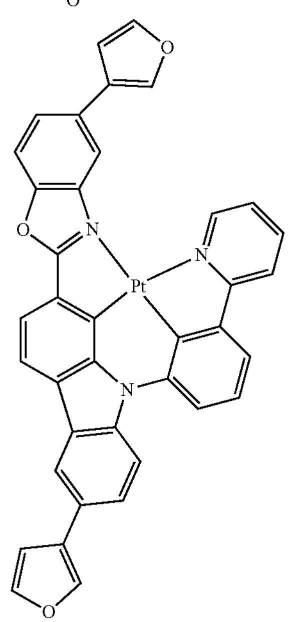

-continued
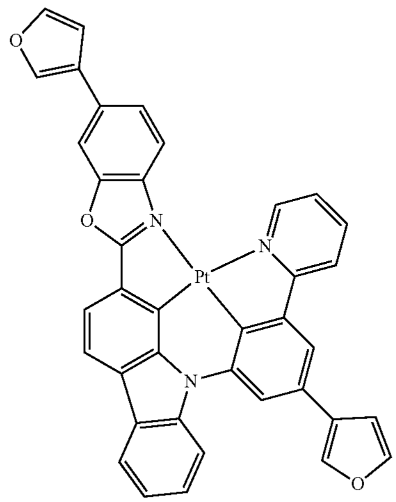
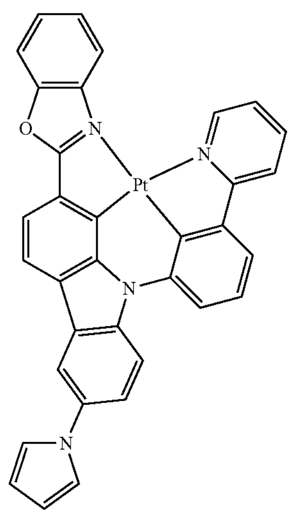
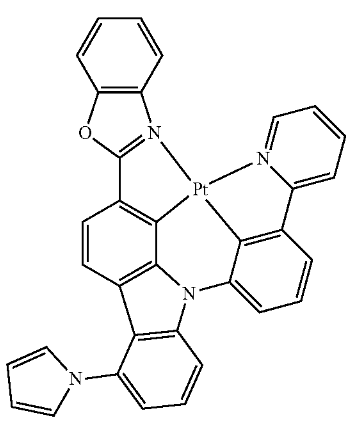
-continued
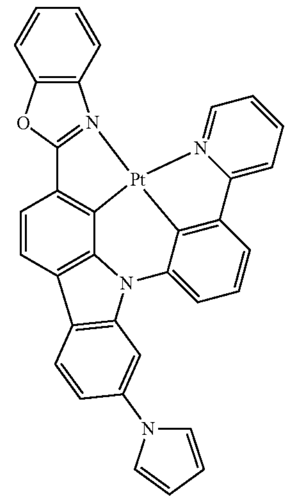
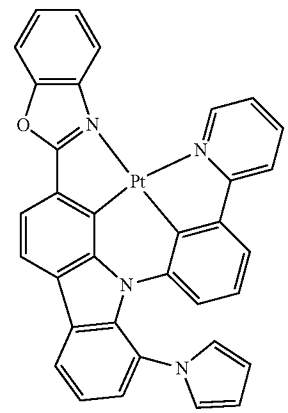
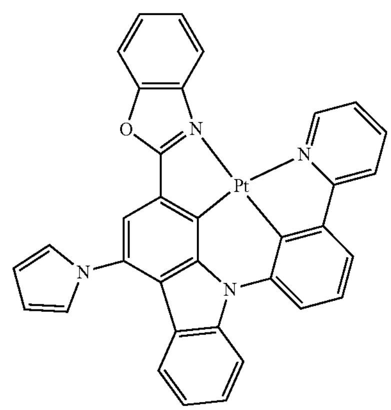
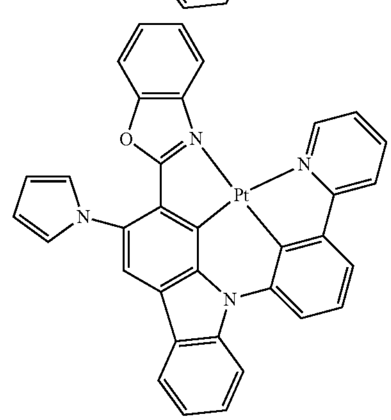

-continued
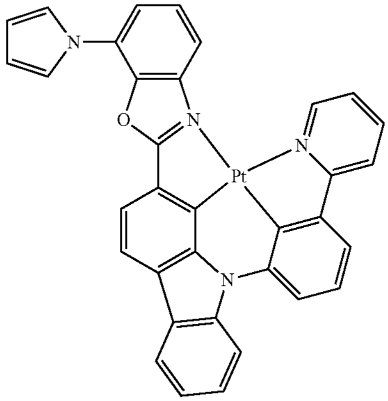
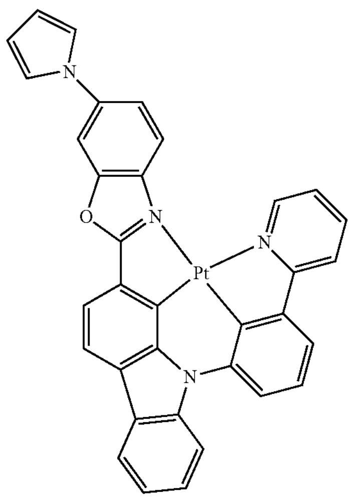
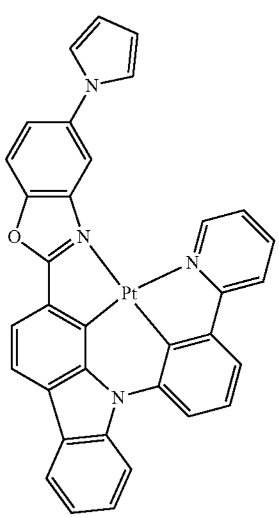
-continued
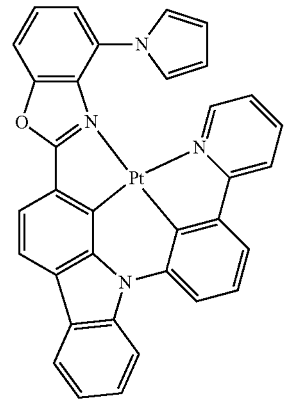
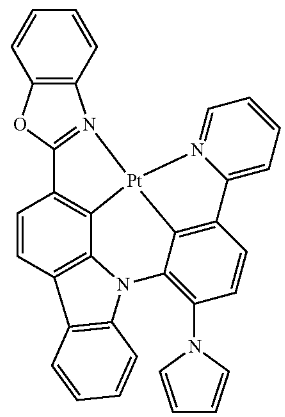
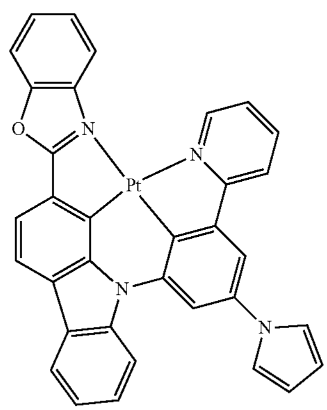
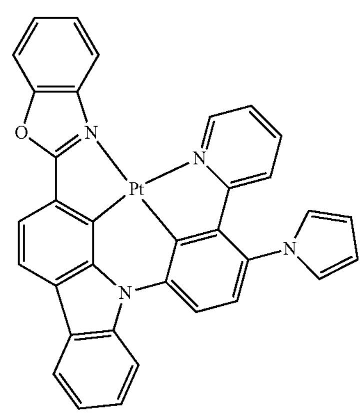

-continued
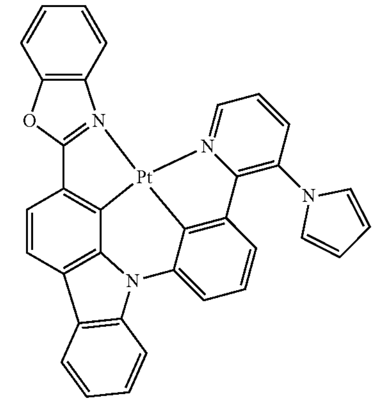
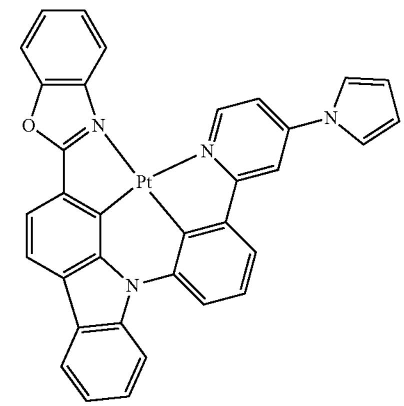
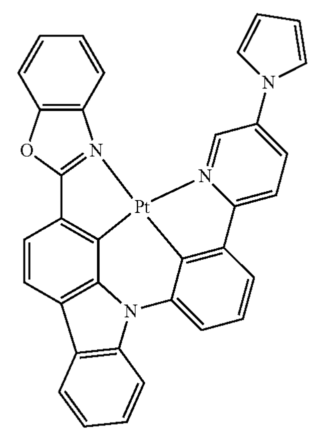
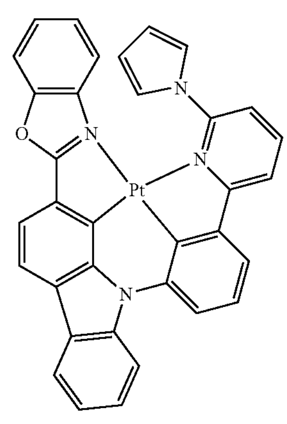
-continued
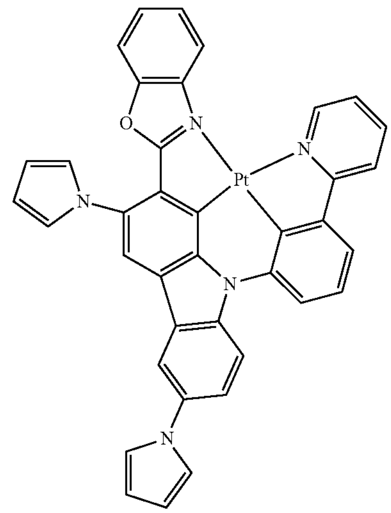
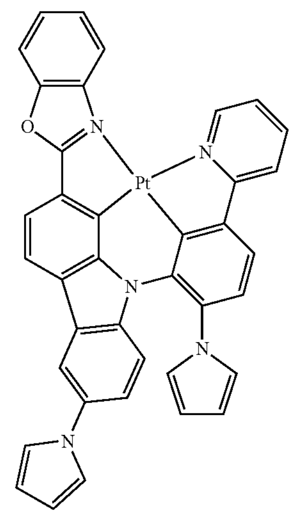
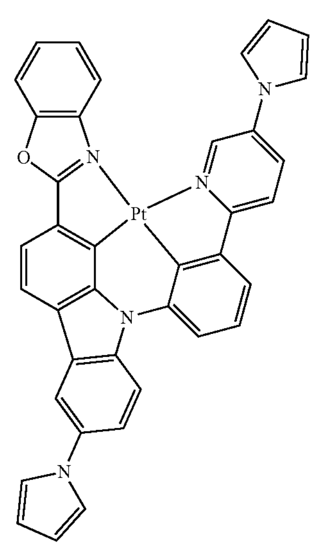

-continued
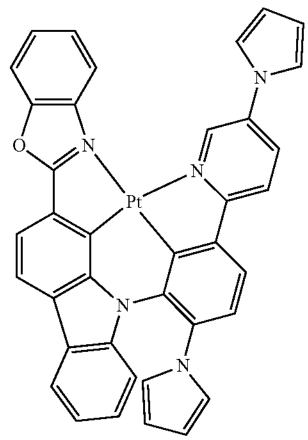
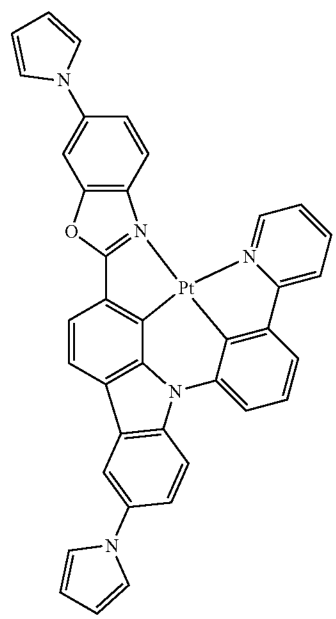
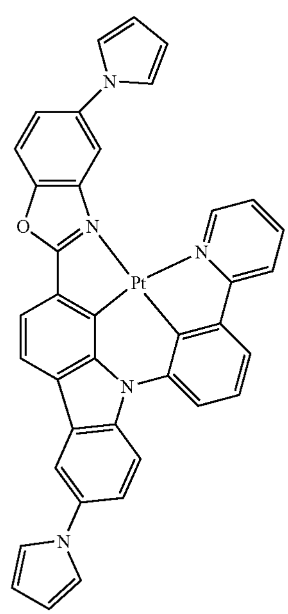
-continued
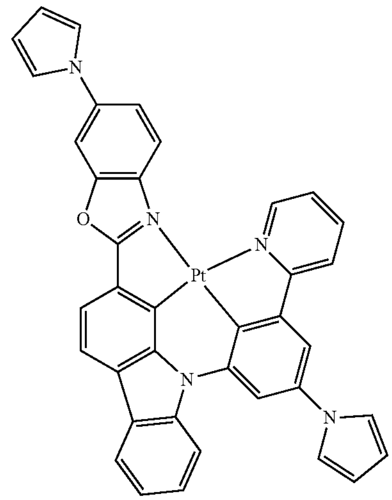
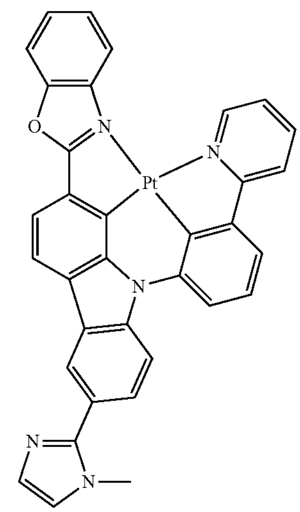
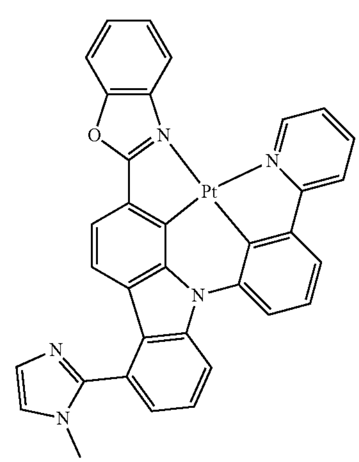

-continued
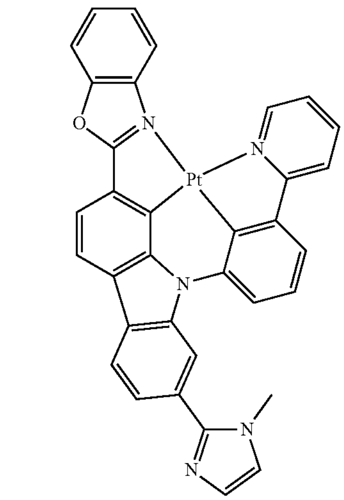
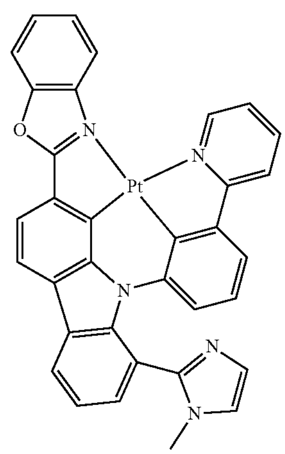
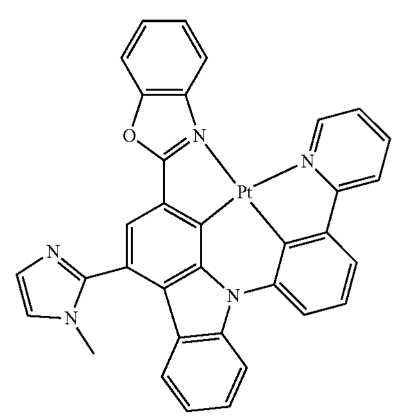
-continued
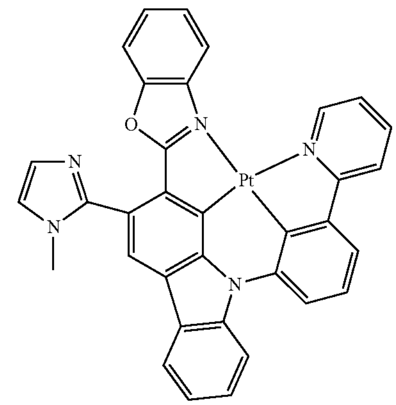
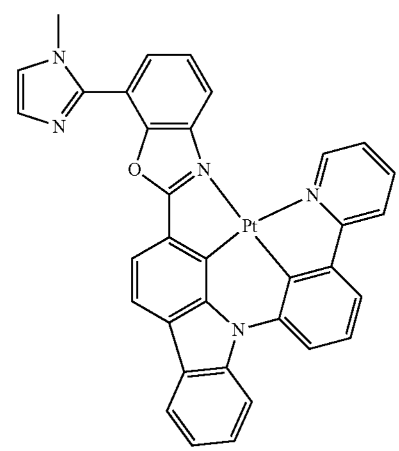
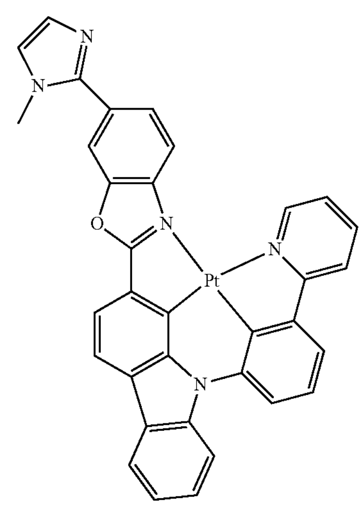

-continued
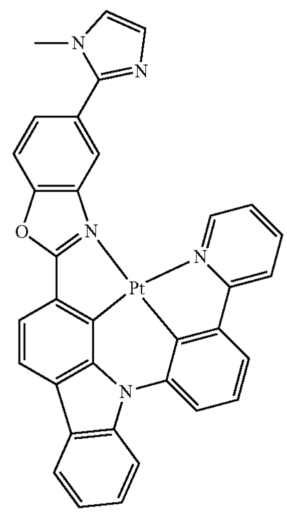
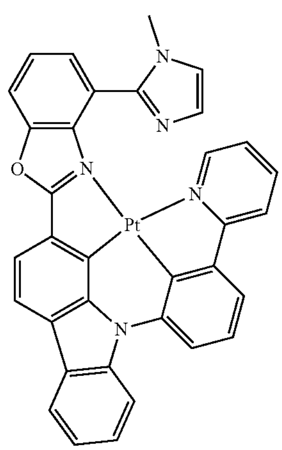
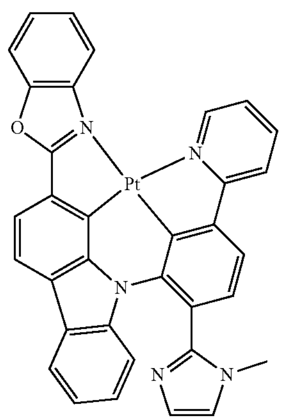
-continued
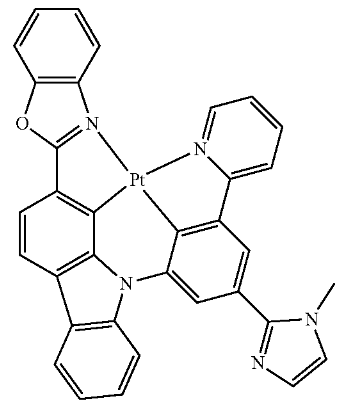
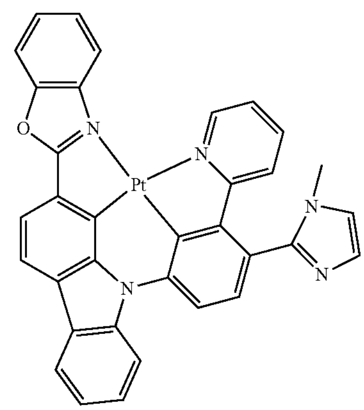
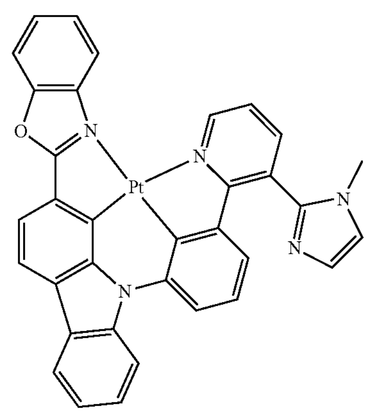
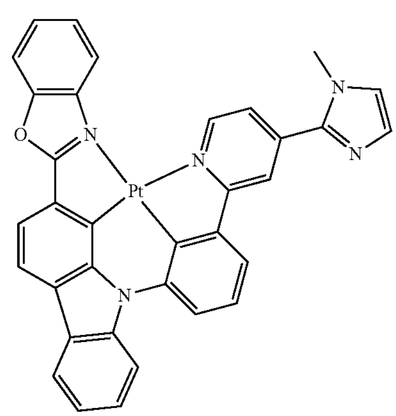

-continued
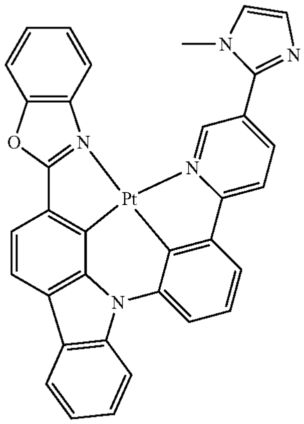
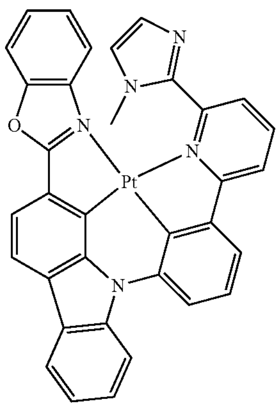
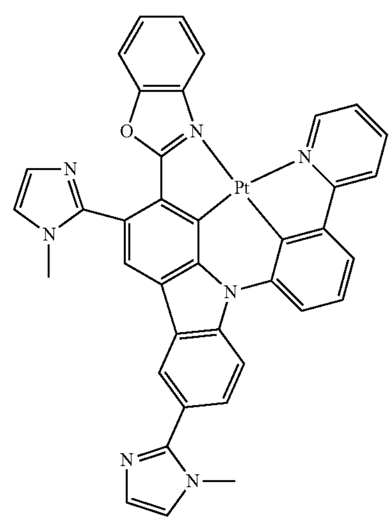
-continued
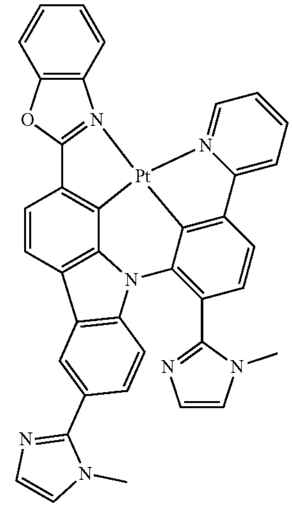
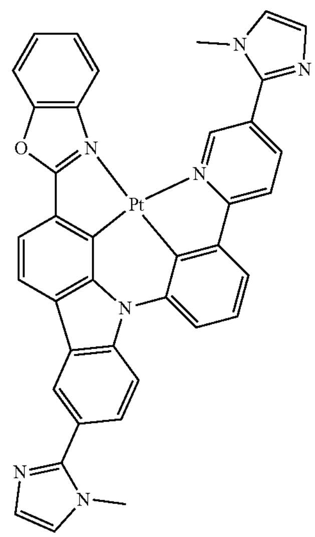
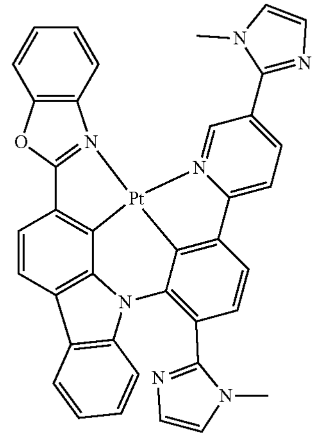

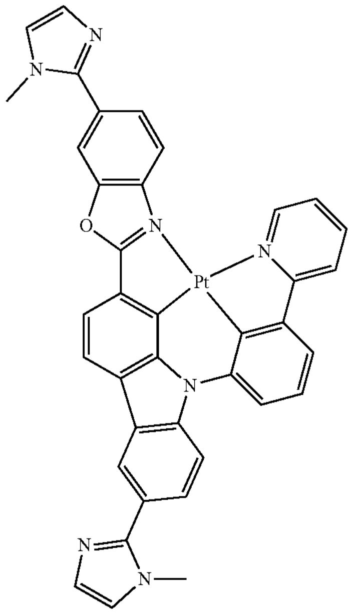
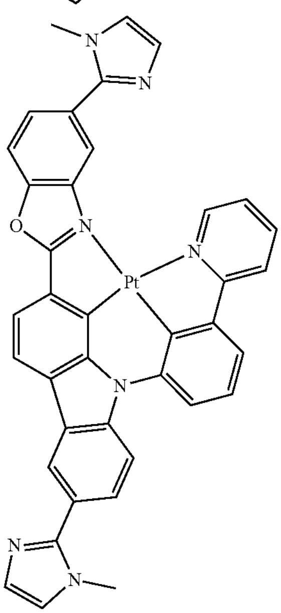
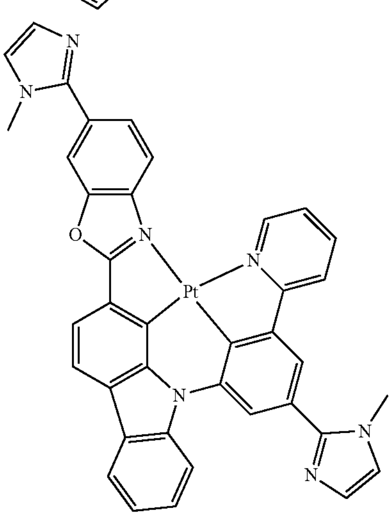
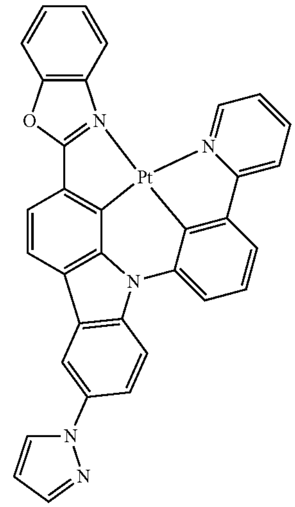
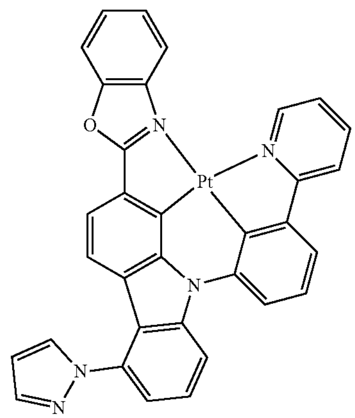
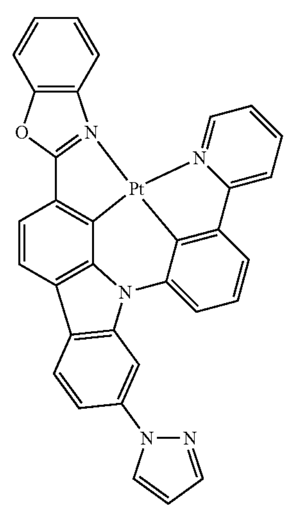

-continued
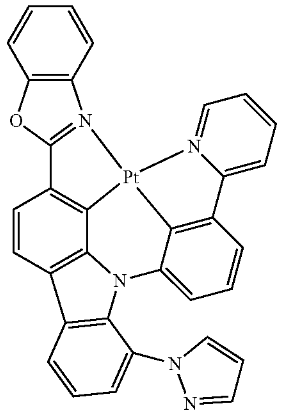
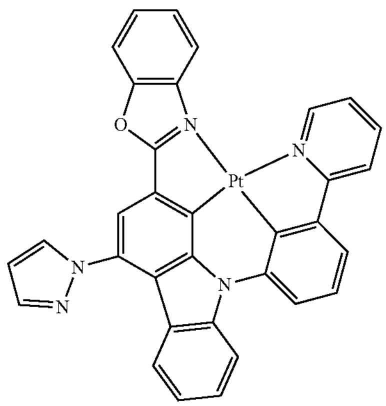
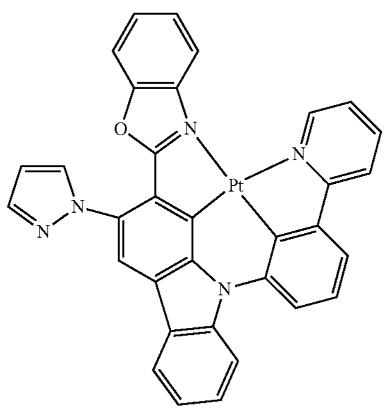
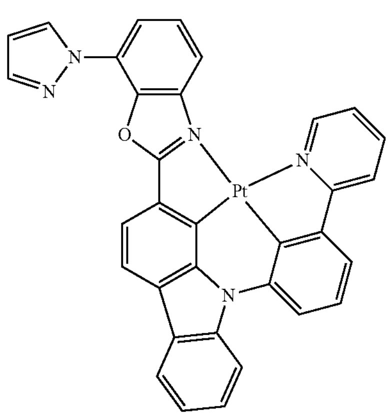
-continued
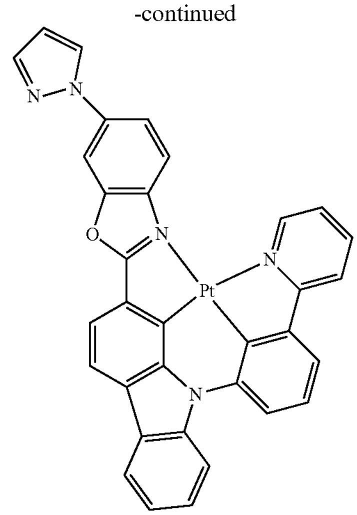
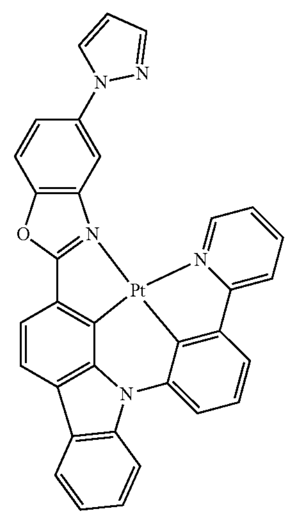
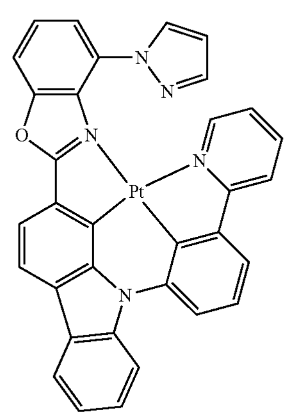

-continued
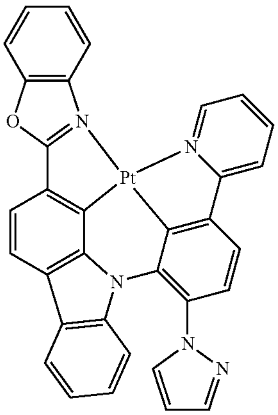
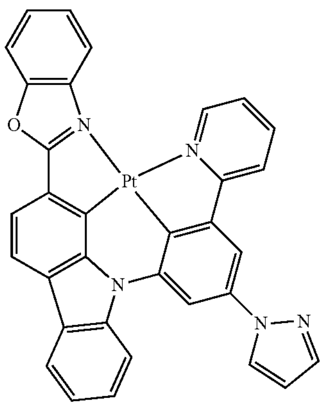
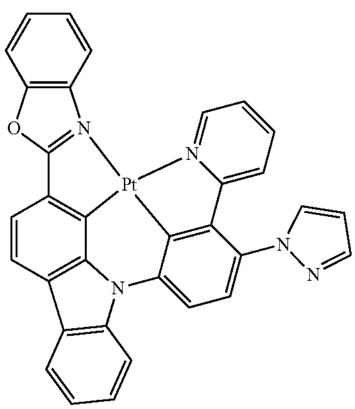
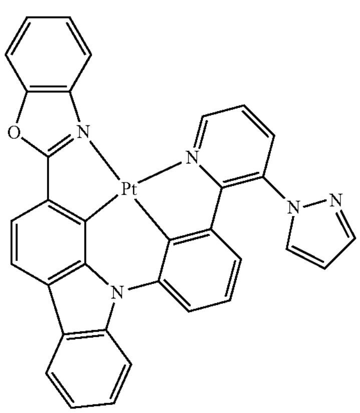
-continued
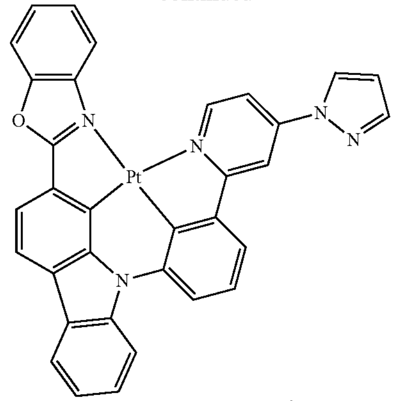
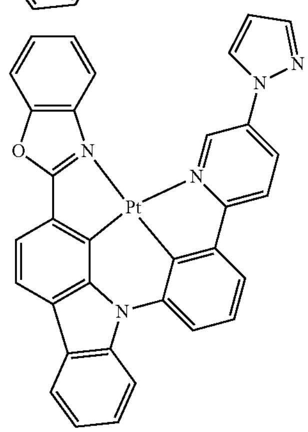
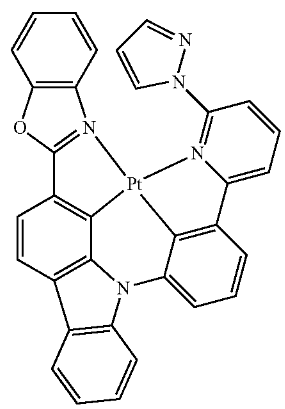
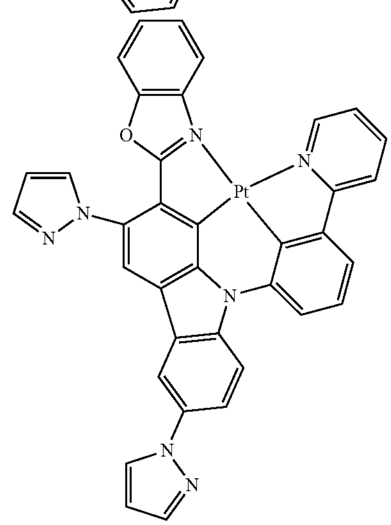

-continued
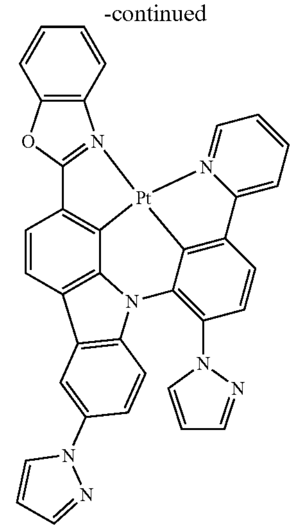
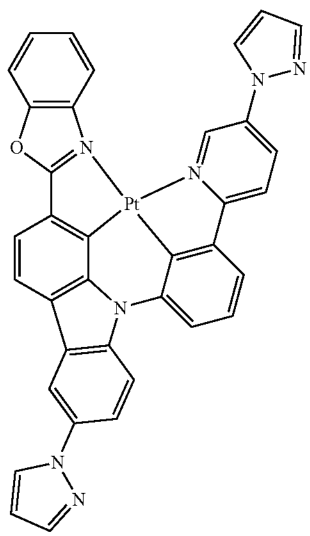
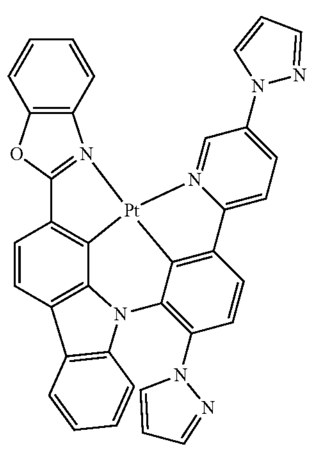
-continued
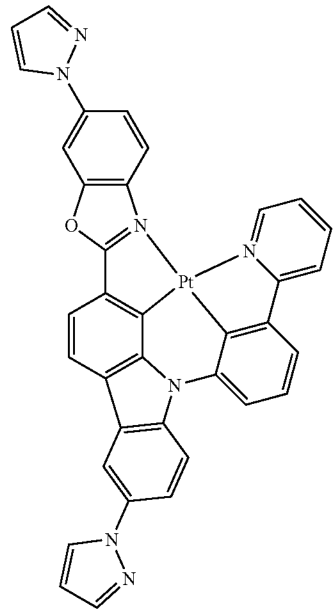
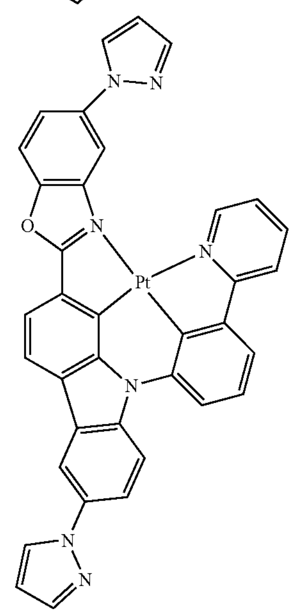
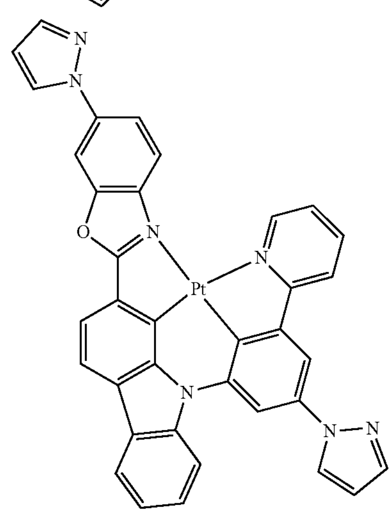

-continued
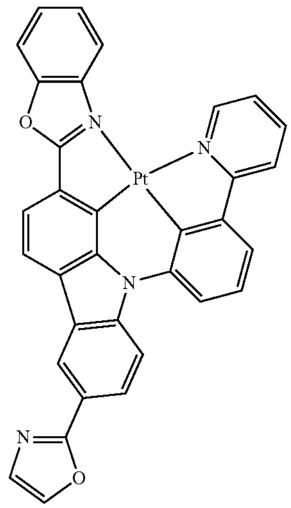
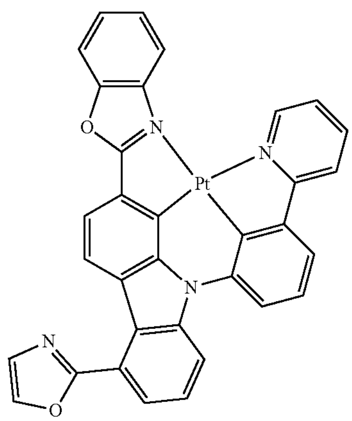
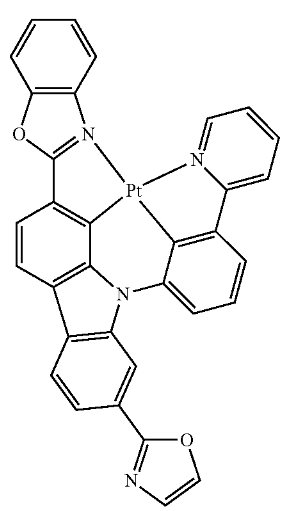
-continued
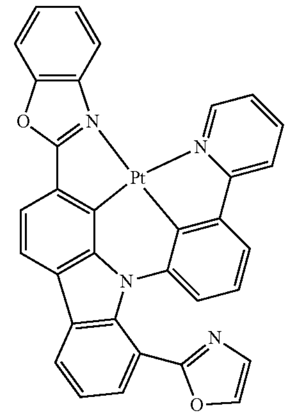
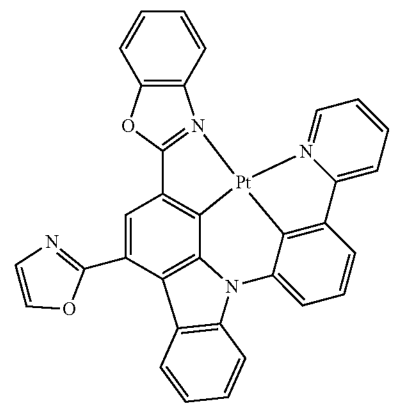
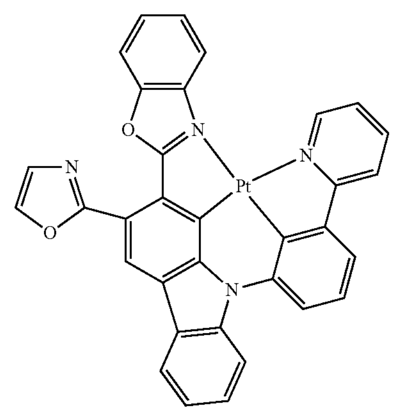
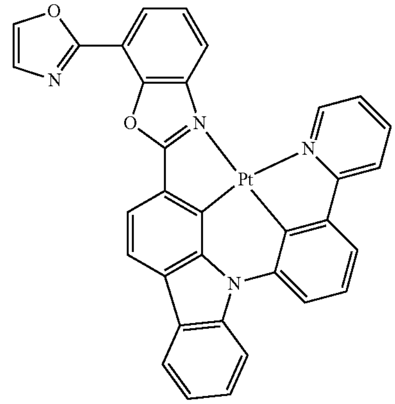

-continued
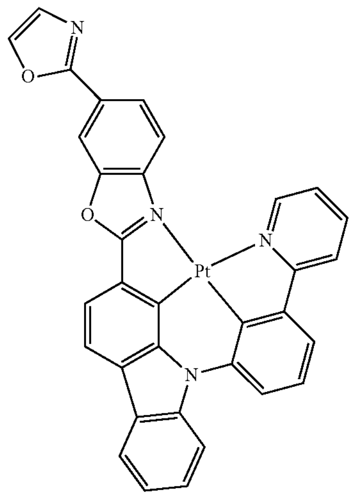
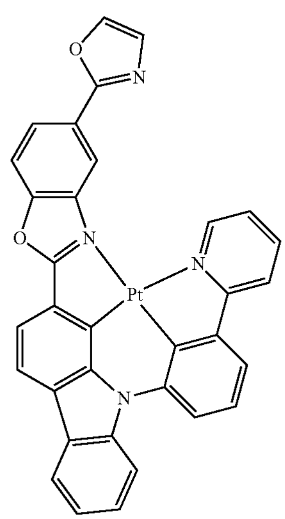
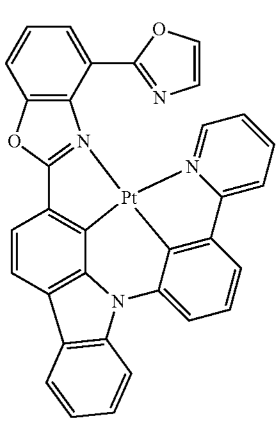
-continued
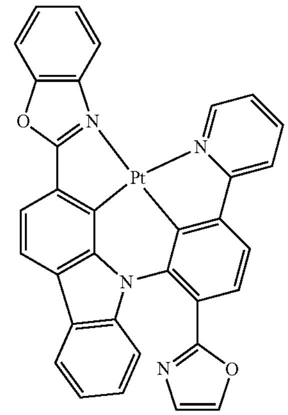
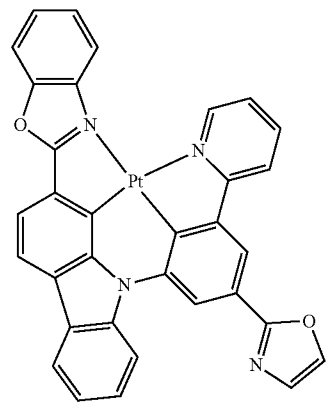
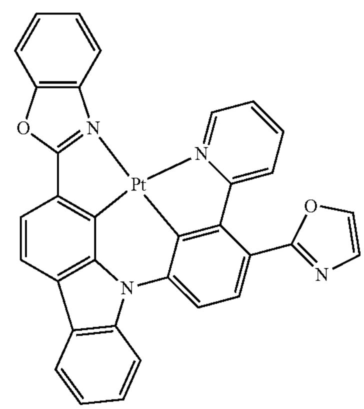
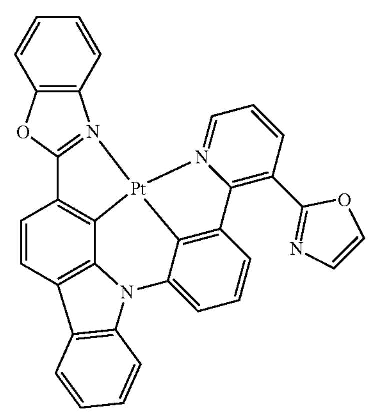

-continued
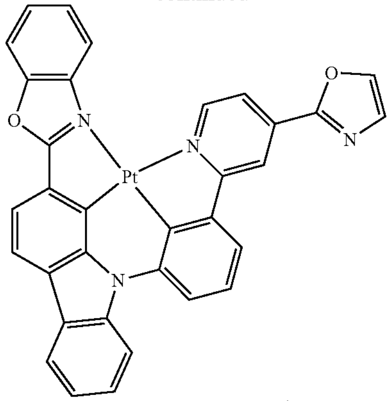
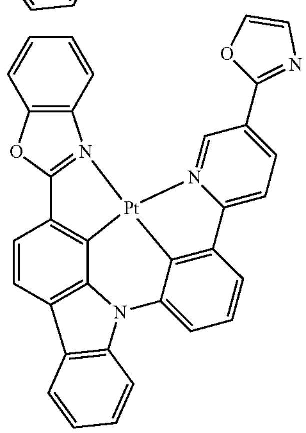
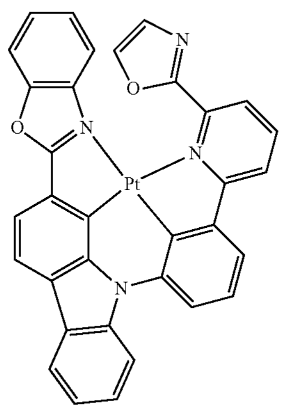
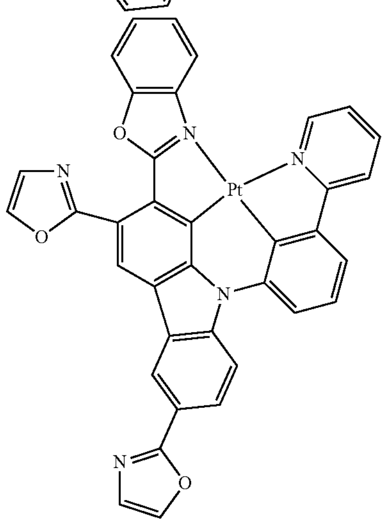
-continued
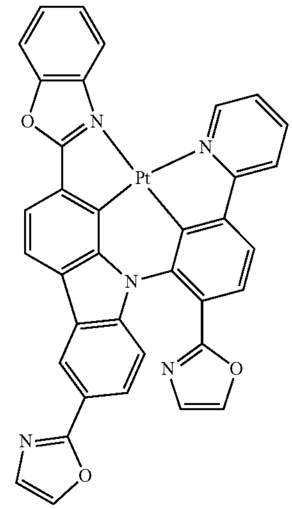
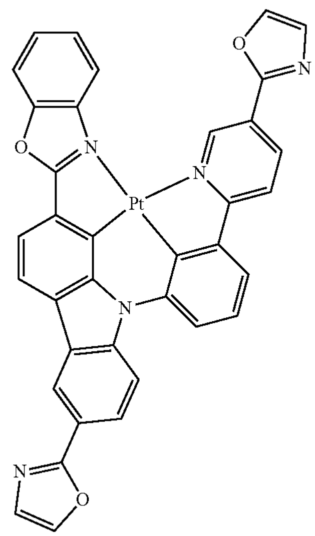
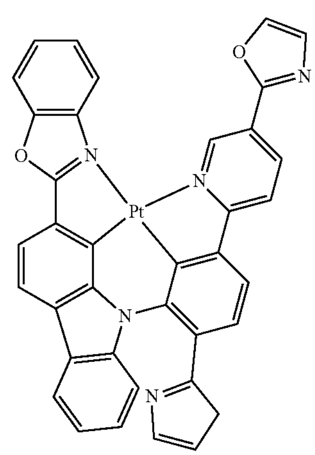

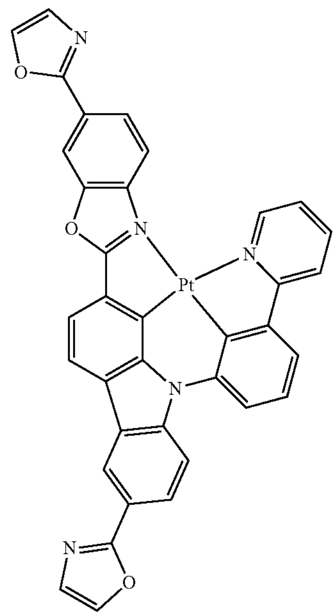
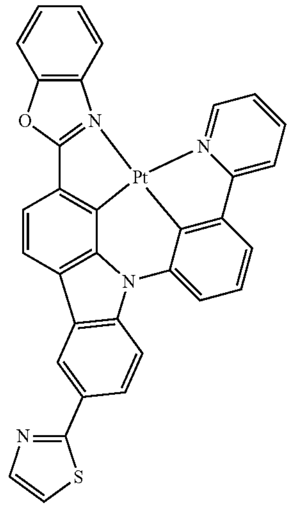
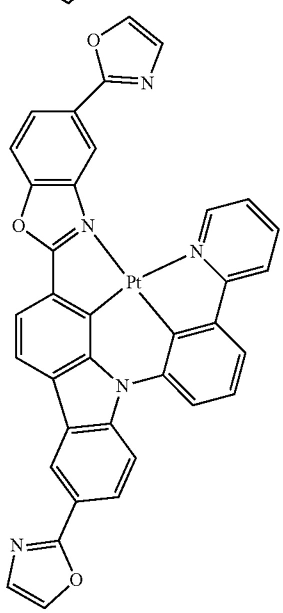
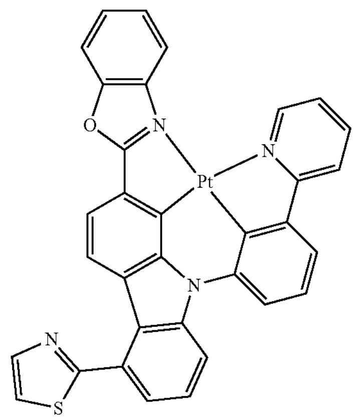
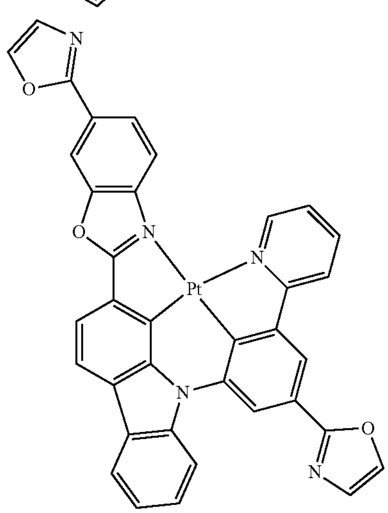
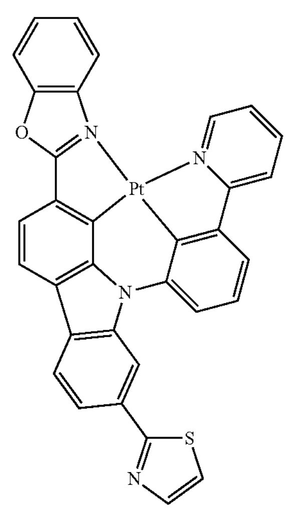

-continued
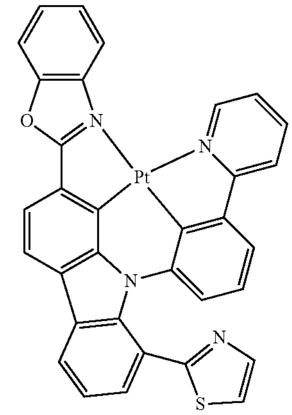
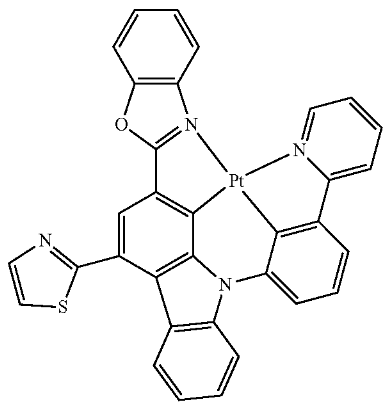
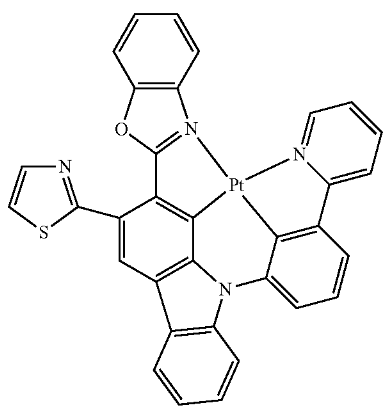
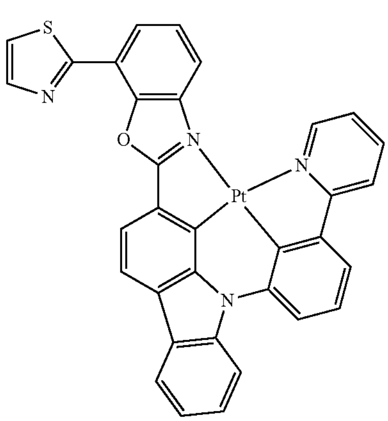
-continued
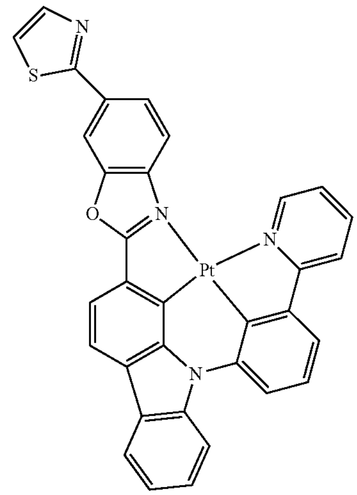
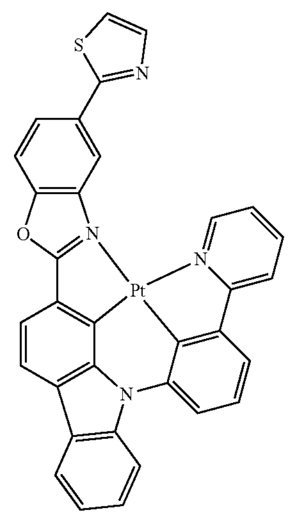
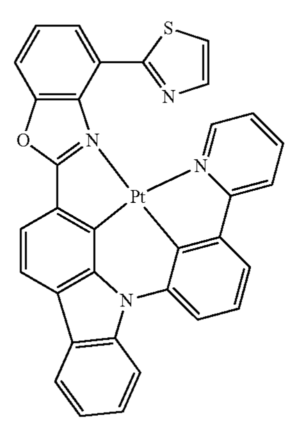

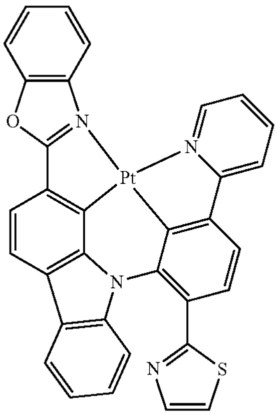
O
N
Pt
N
N
N
S
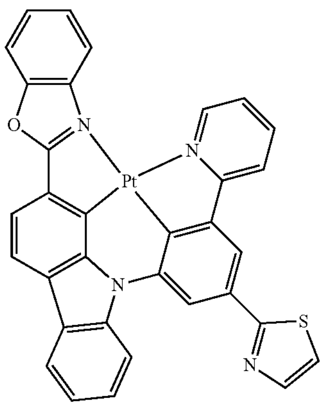
O
N
Pt
N
N
S
N
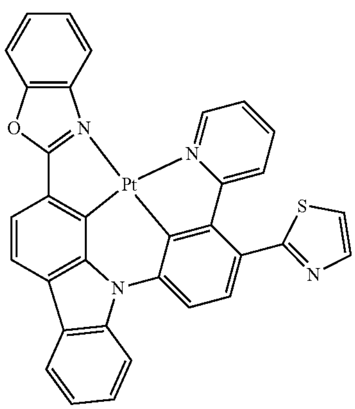
O
N
Pt
N
N
S
N
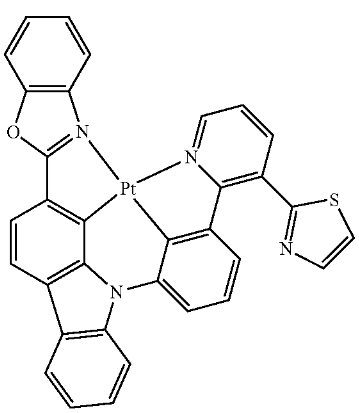
O
N
Pt
N
N
S
N
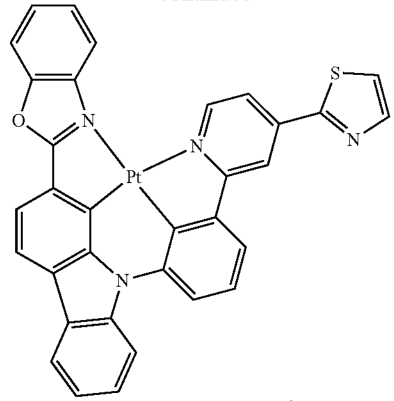
O
N
Pt
N
S
N
N
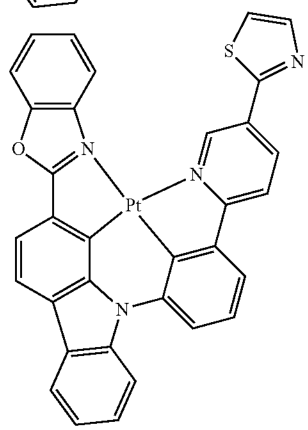
S
N
O
N
Pt
N
N
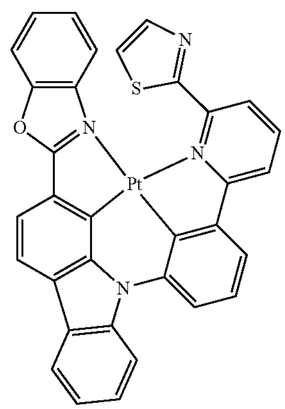
N
S
O
N
Pt
N
N
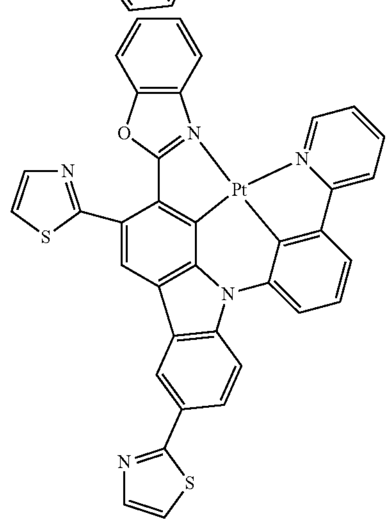
O
N
N
Pt
N
N
S
N
N
S -continued
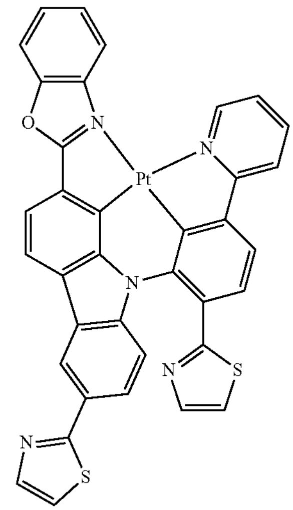
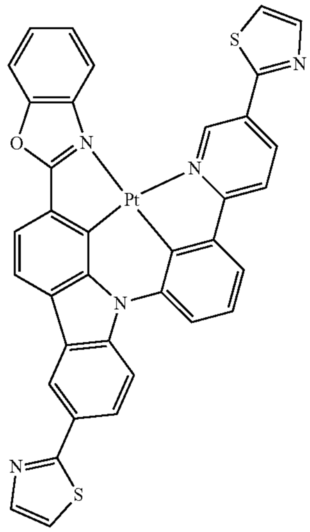
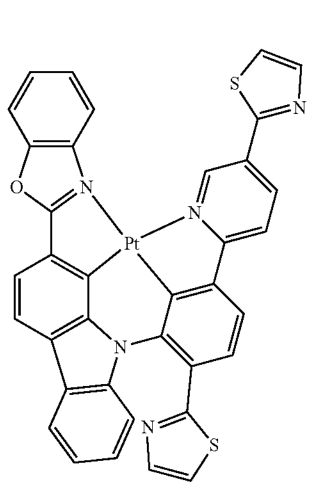
-continued
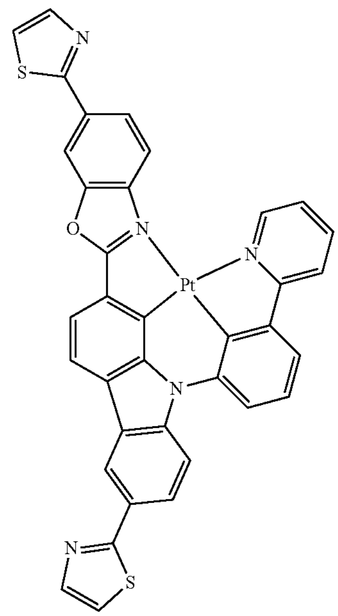
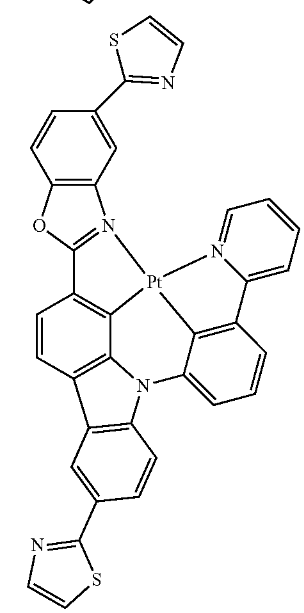
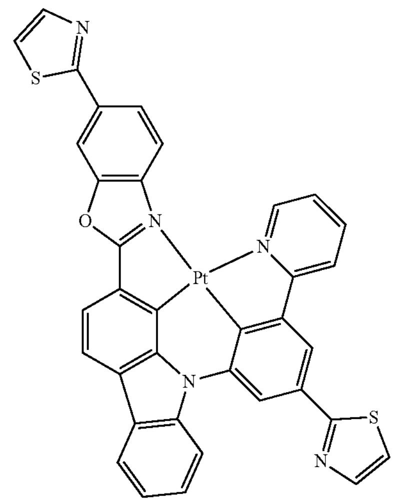

-continued
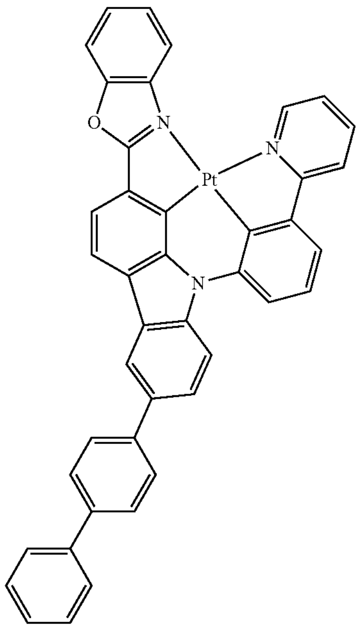
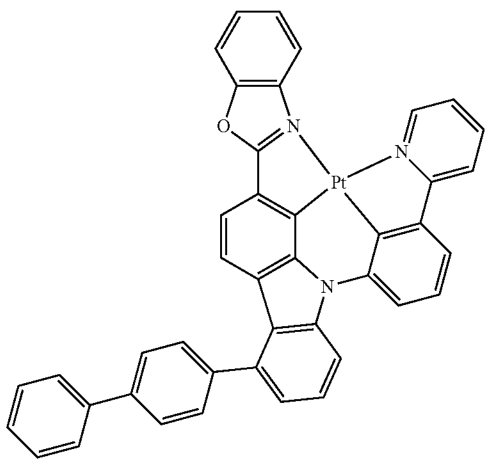
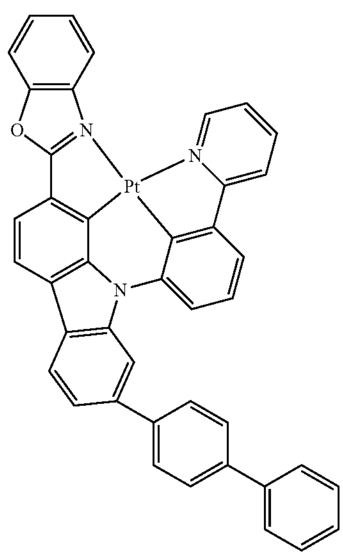
-continued
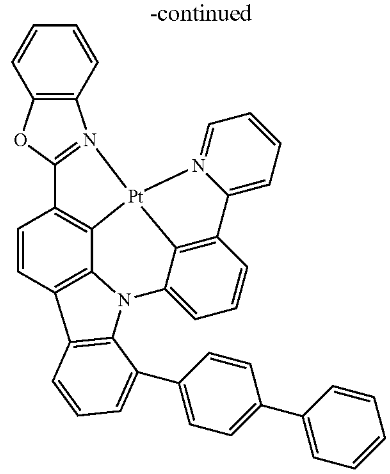
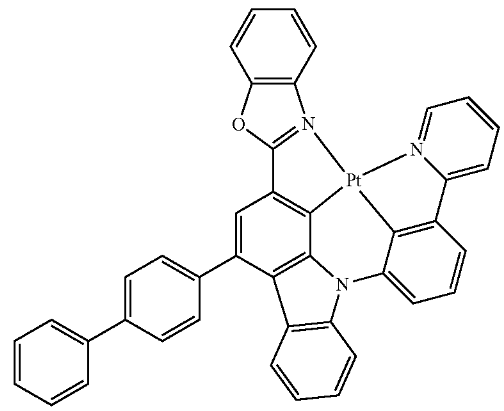
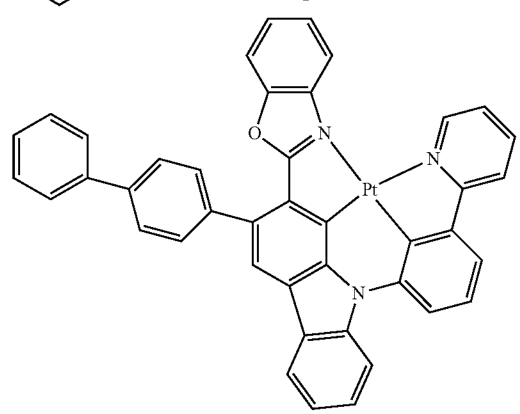
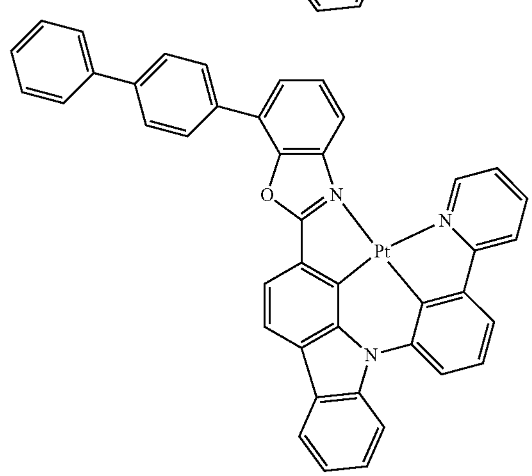

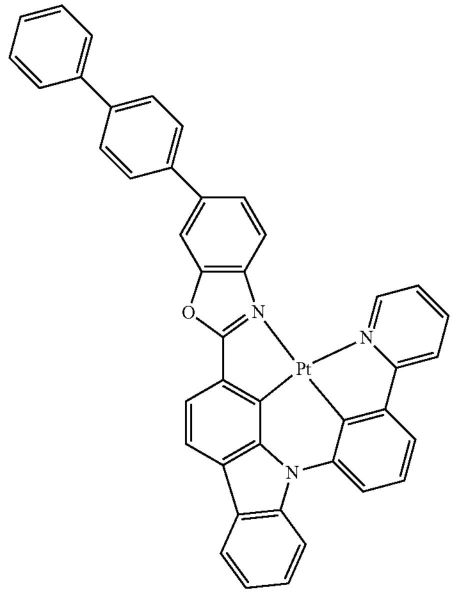
O
N
Pt
N
N
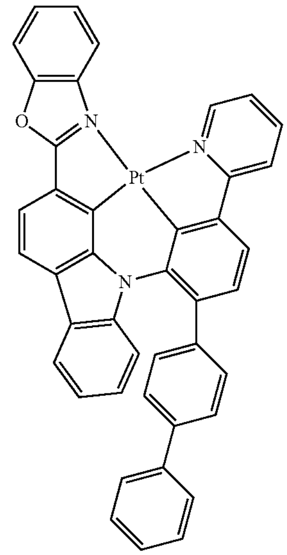
O
N
Pt
N
N
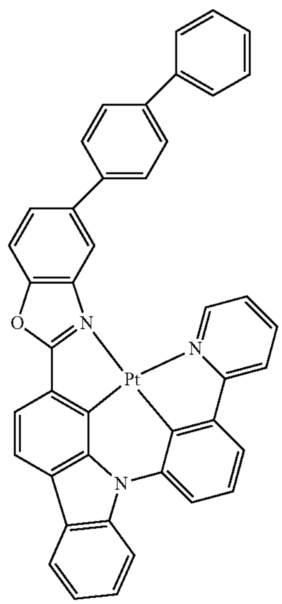
O
N
Pt
N
N
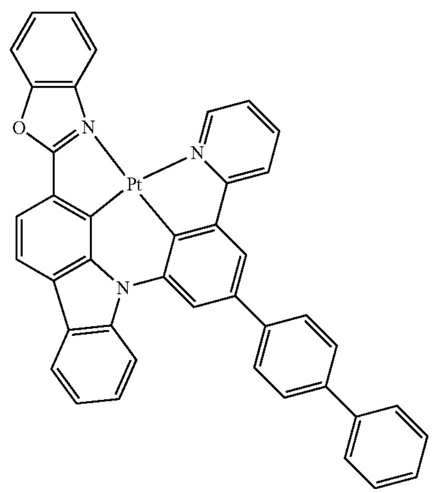
O
N
Pt
N
N
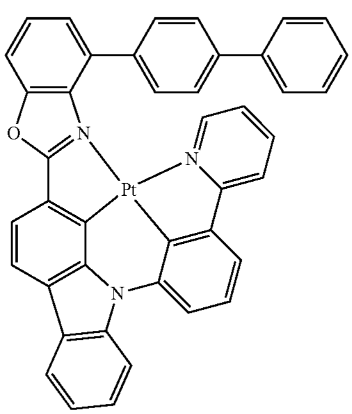
O
N
Pt
N
N
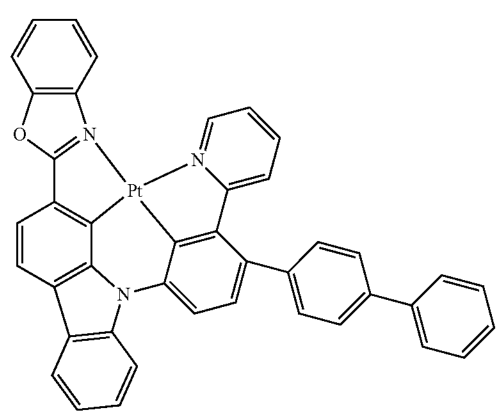
O
N
Pt
N
N -continued
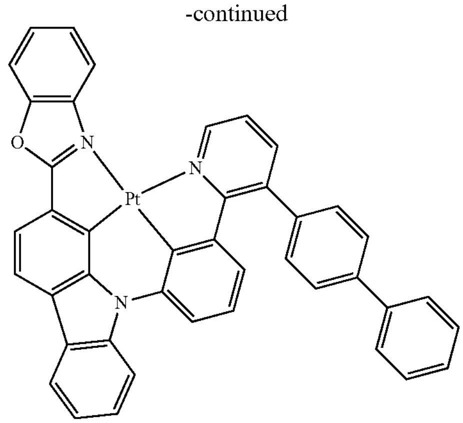
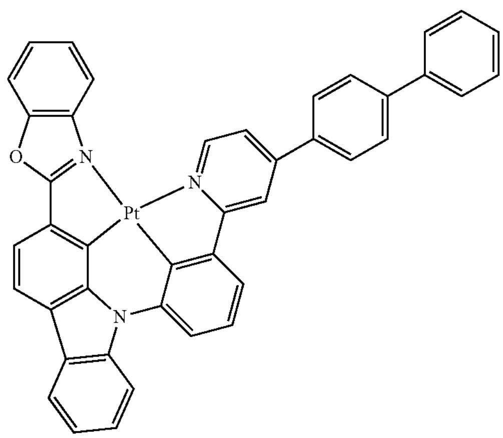
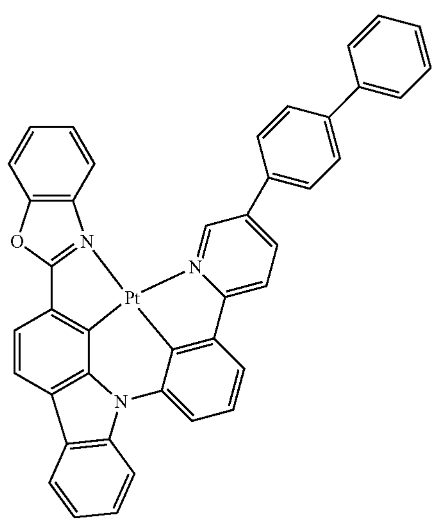
-continued
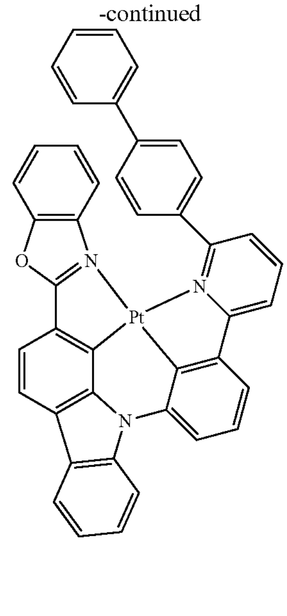
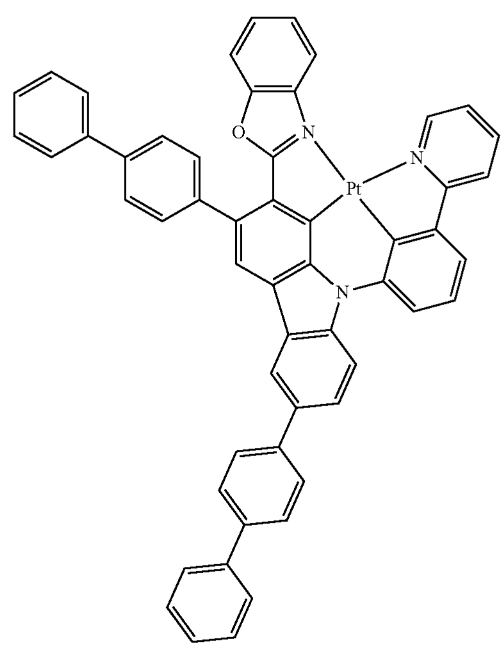

-continued
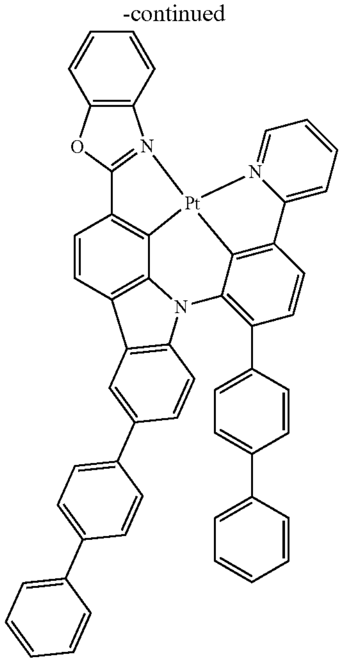
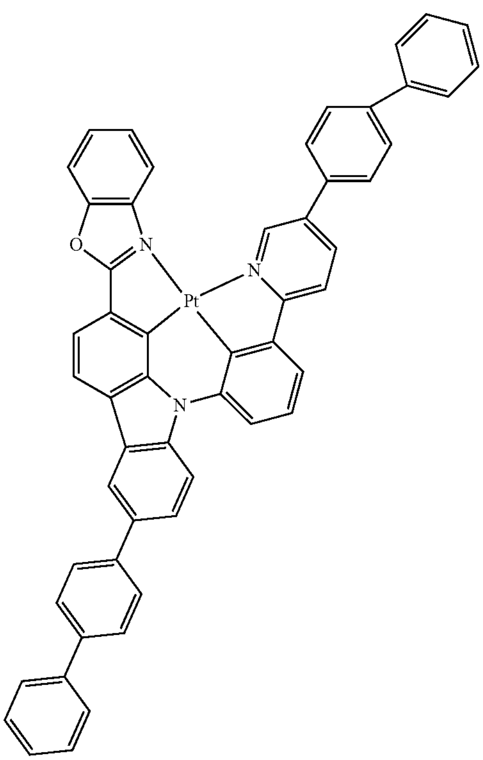
-continued
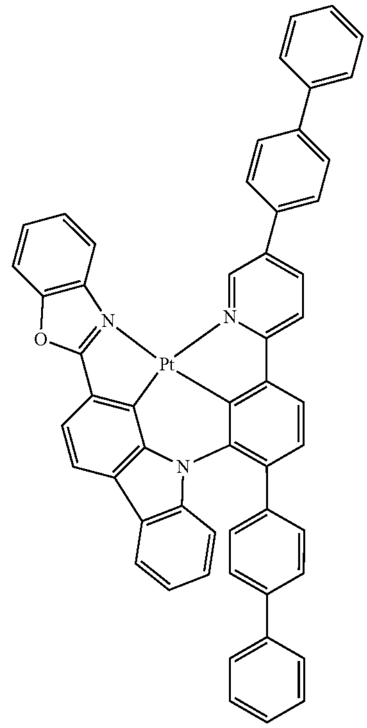
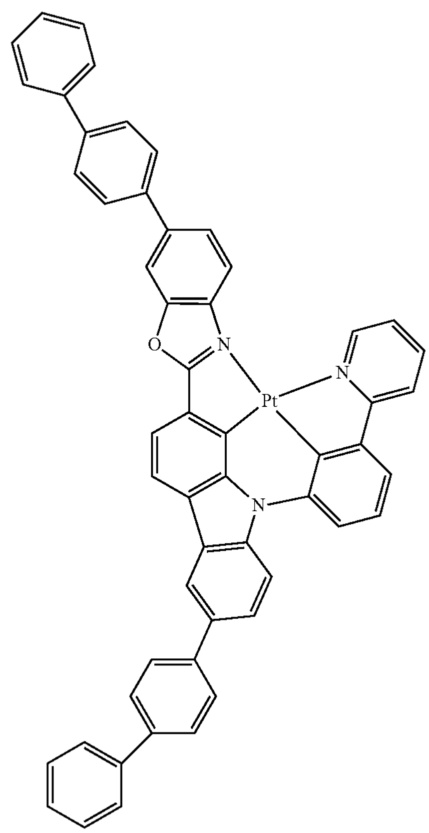

-continued
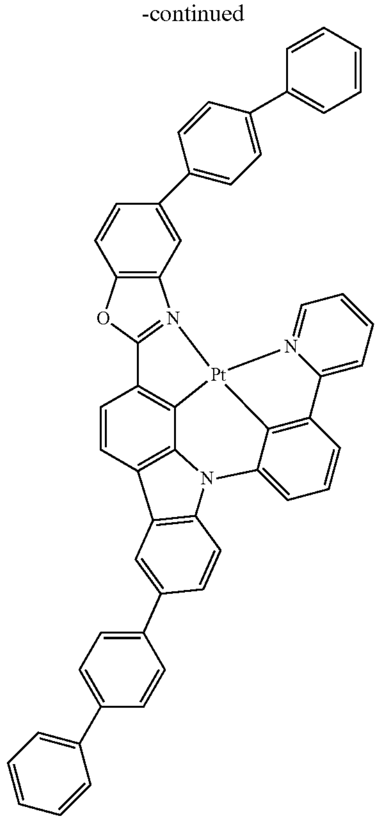
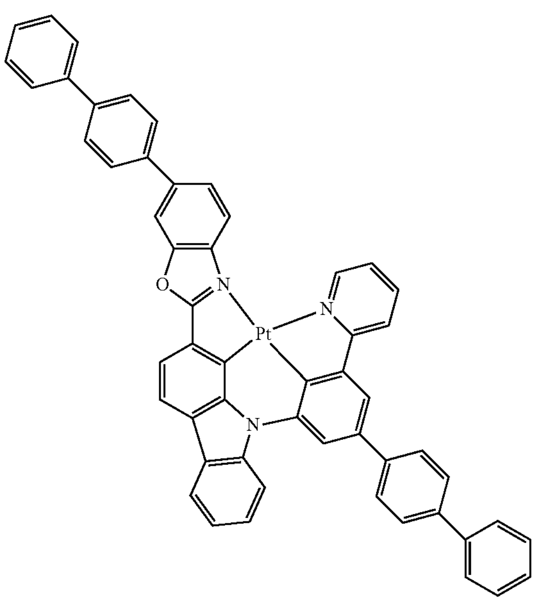
-continued
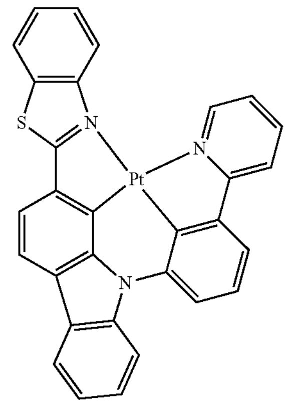
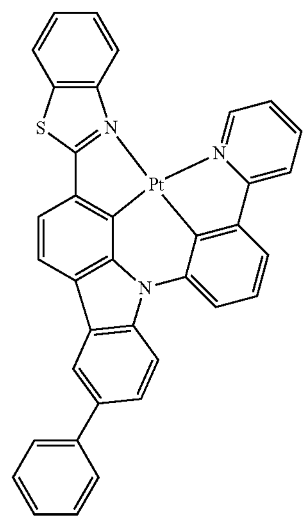
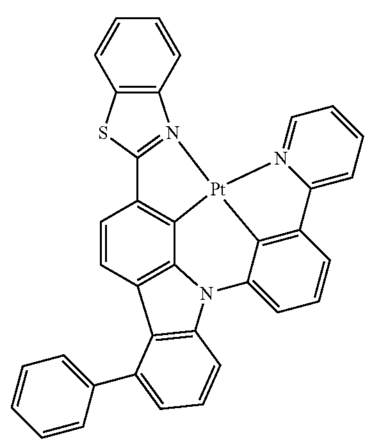

-continued
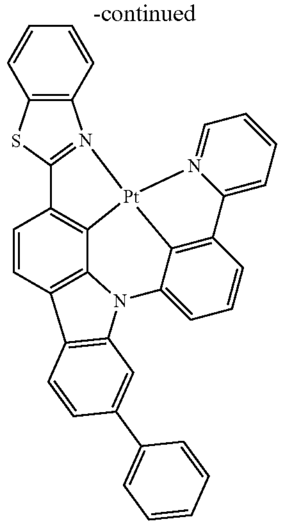
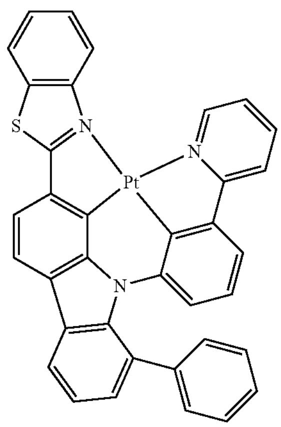
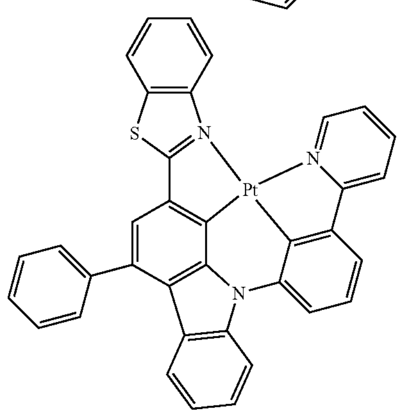
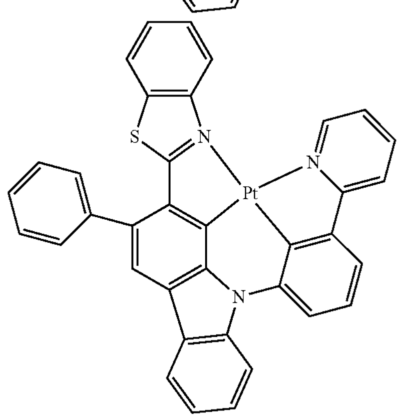
-continued
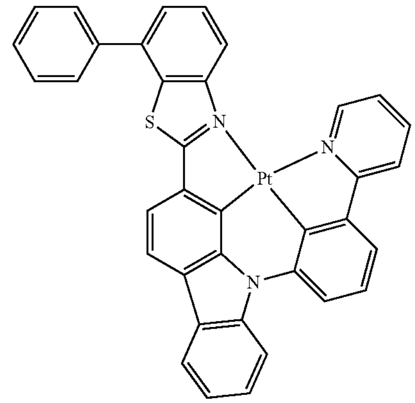
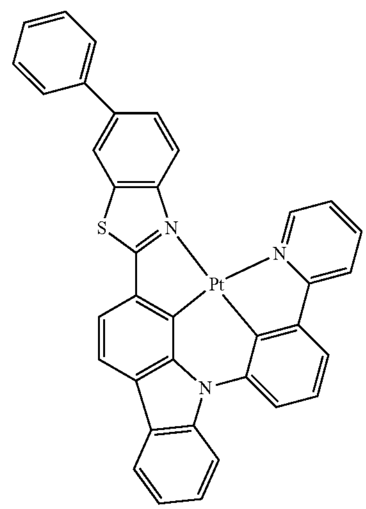
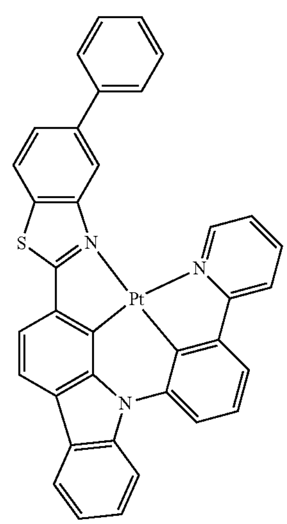

-continued
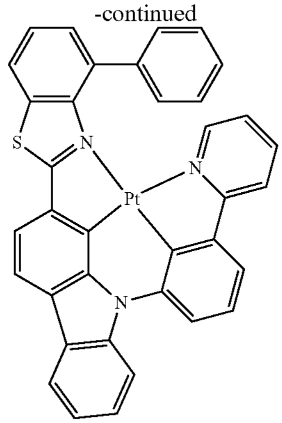
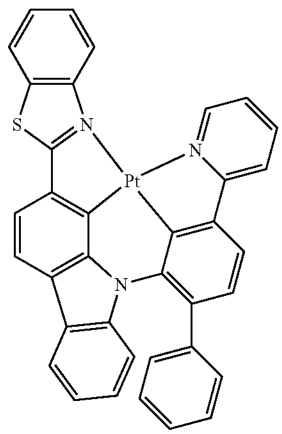
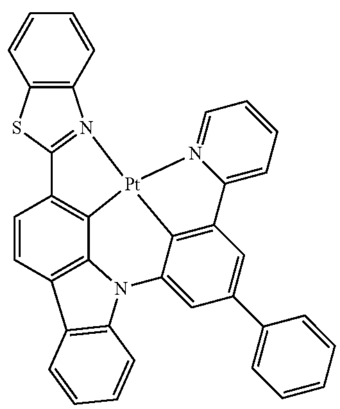
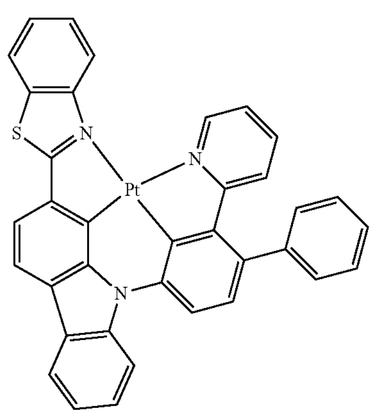
-continued
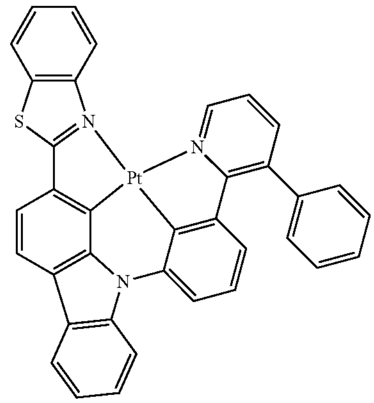
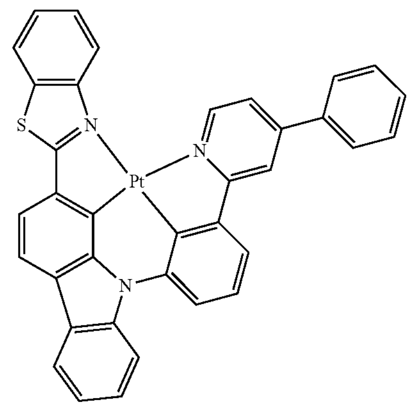
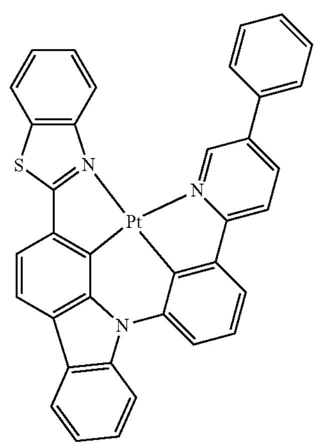
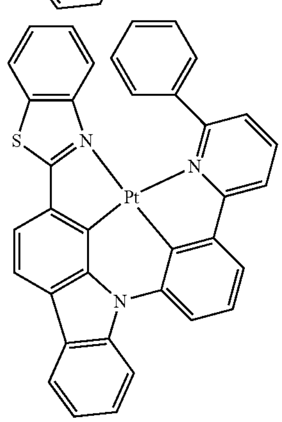

-continued
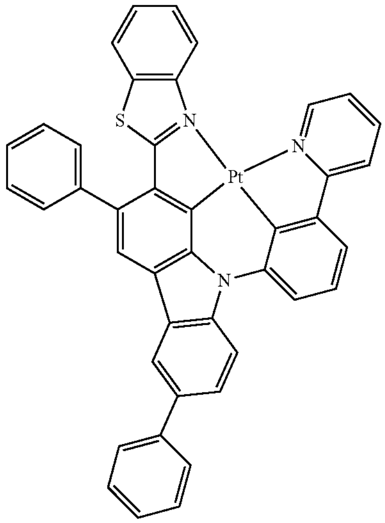
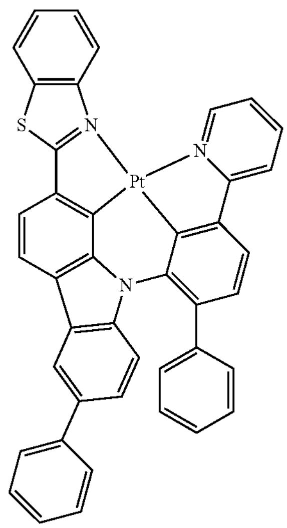
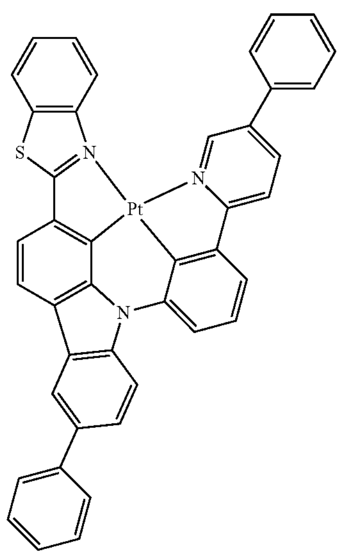
-continued
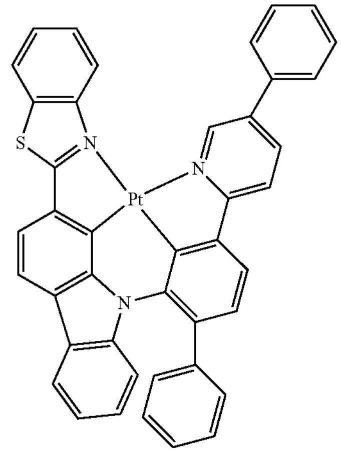
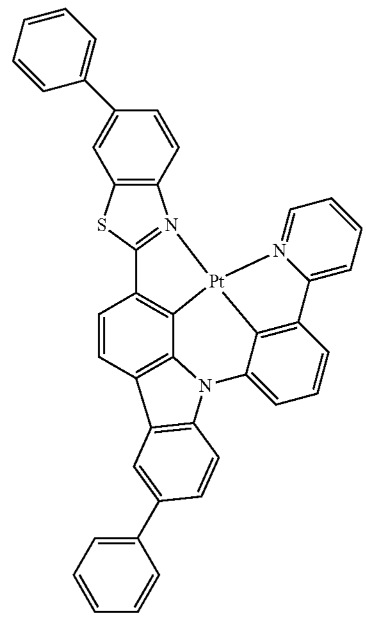
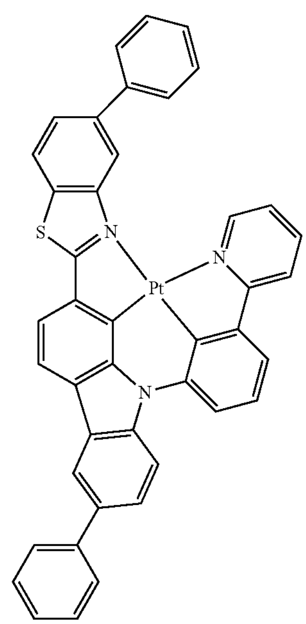

-continued
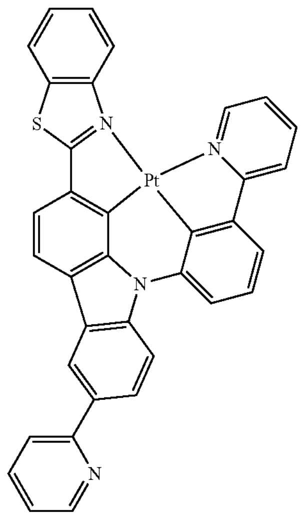
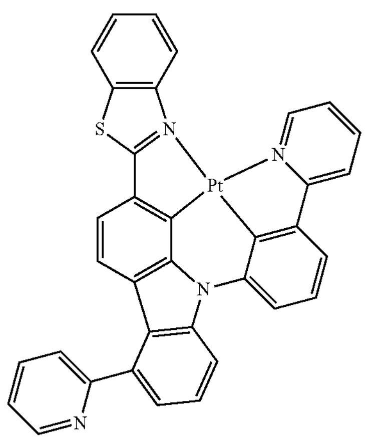
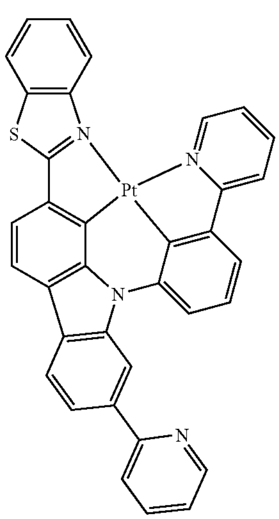
-continued
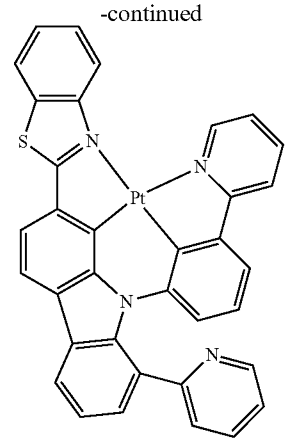
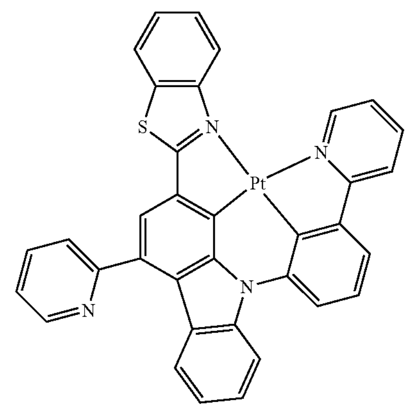
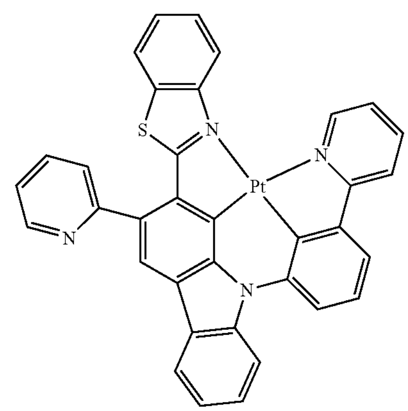
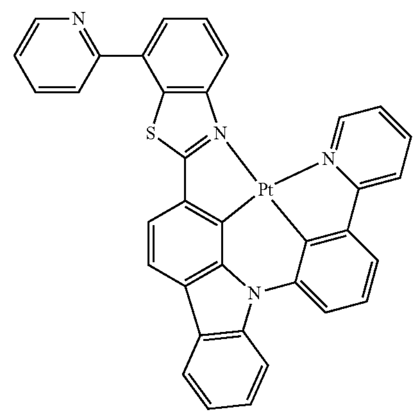

-continued
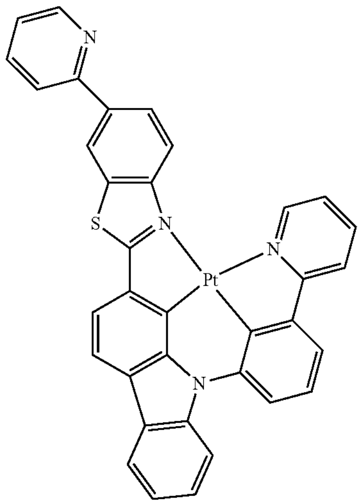
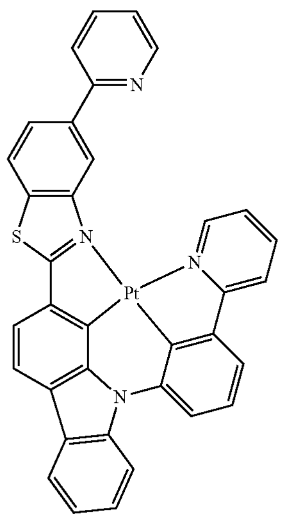
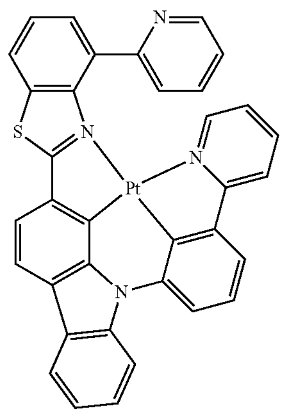
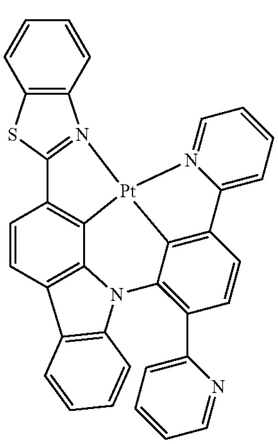
-continued
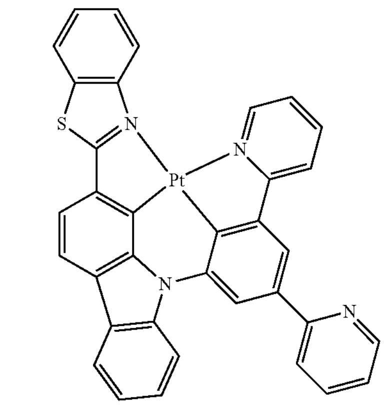
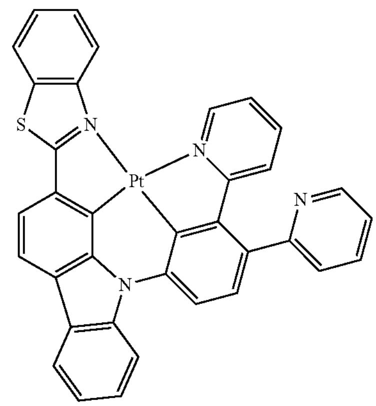
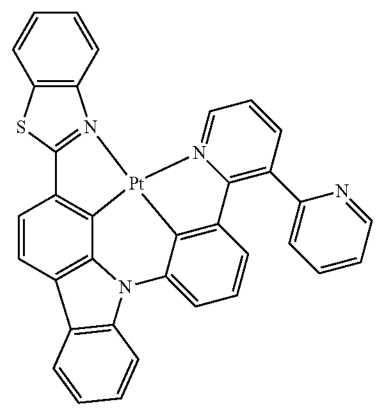
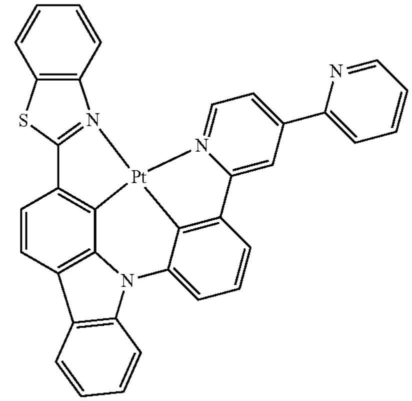

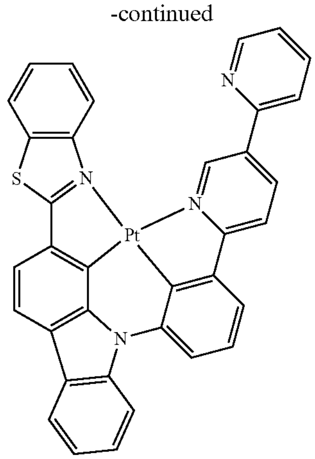
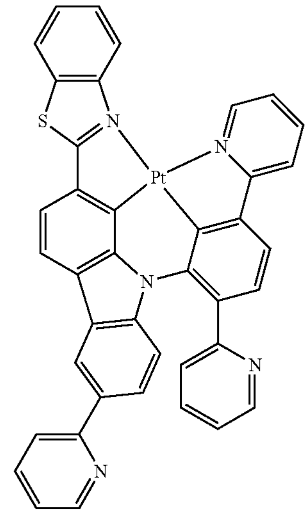
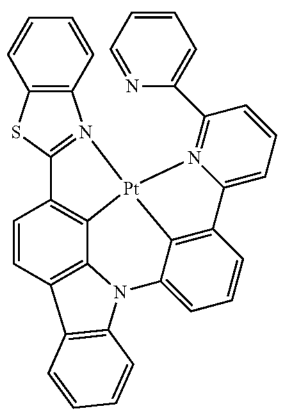
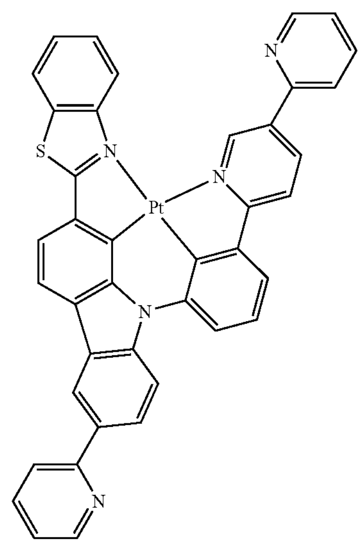
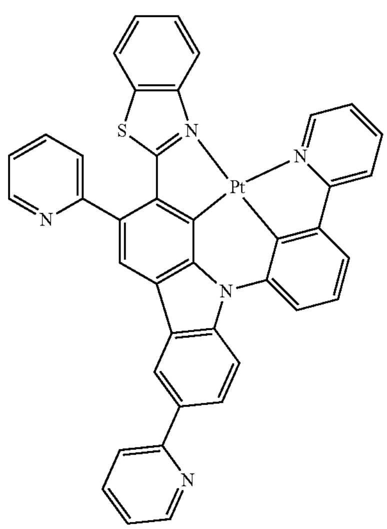
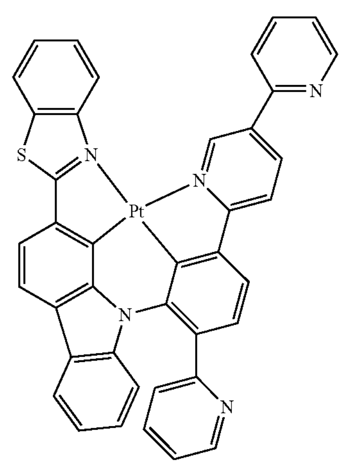

-continued
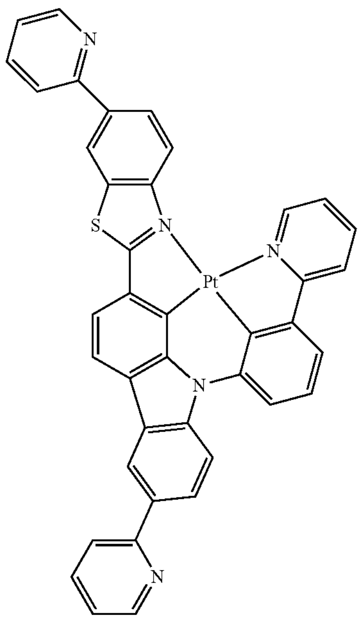
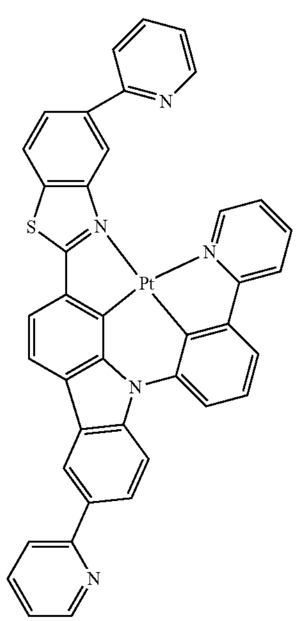
-continued
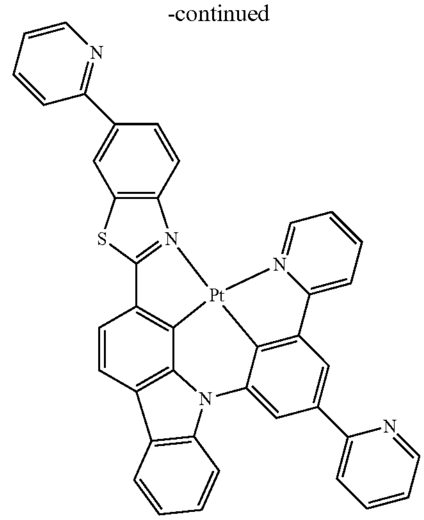
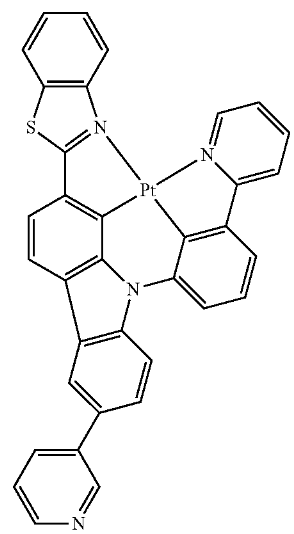
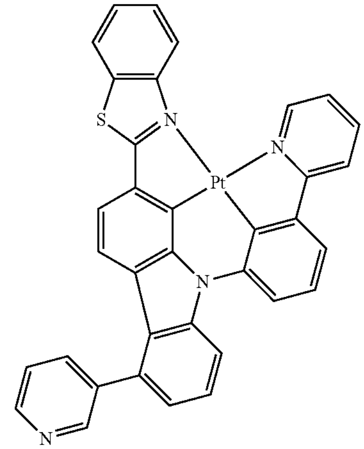

-continued
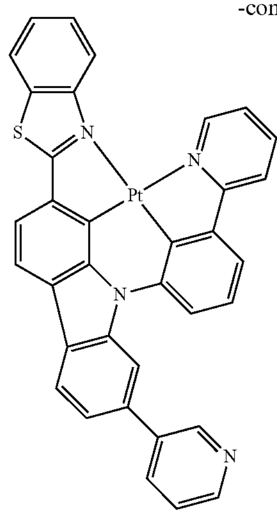
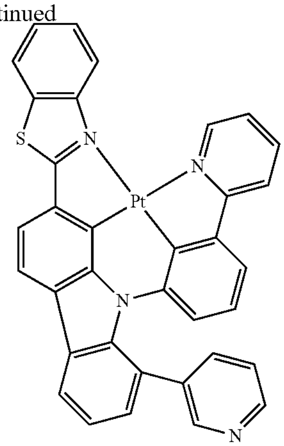
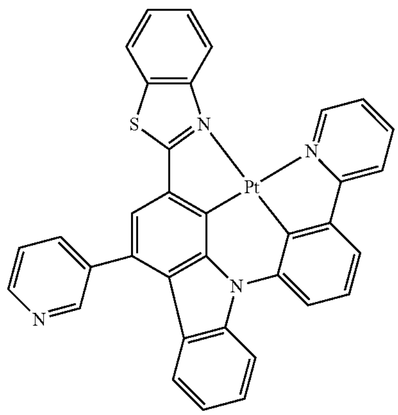
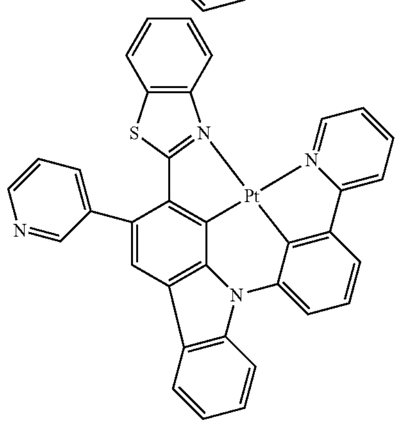
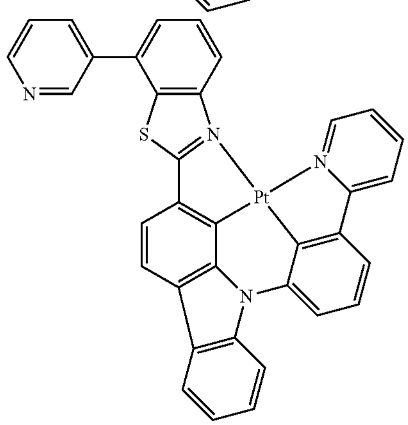
-continued
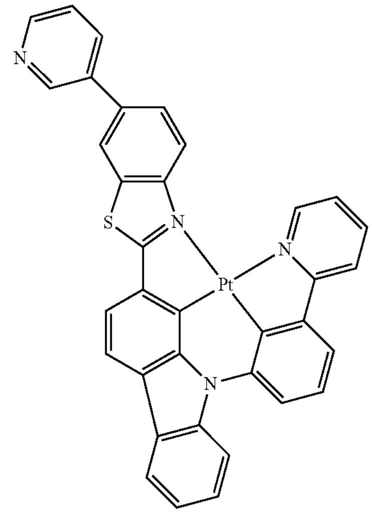
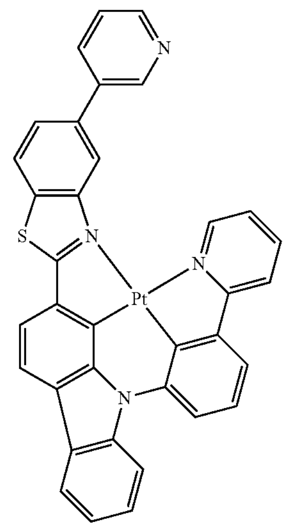
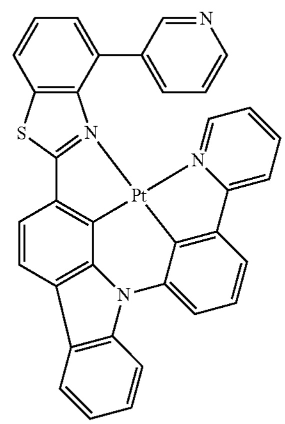
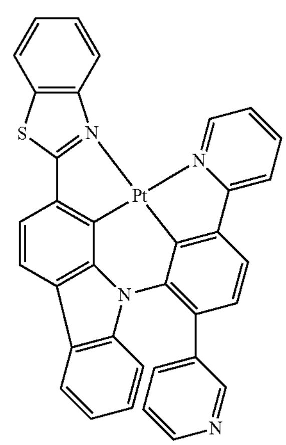

-continued
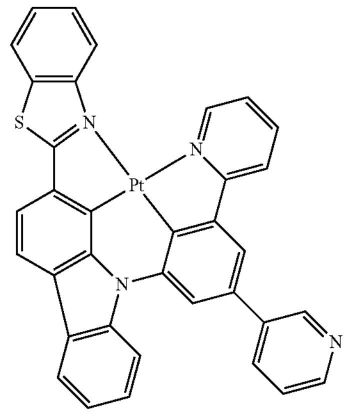
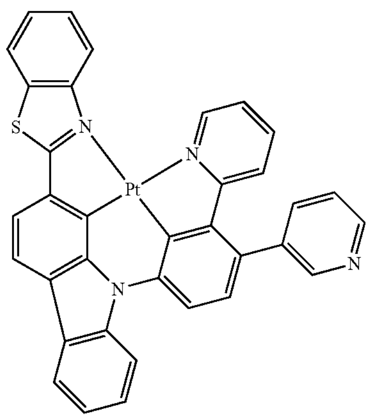
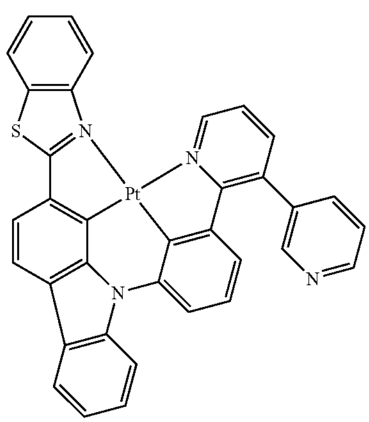
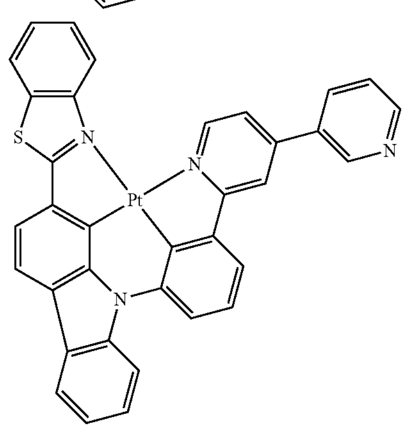
-continued
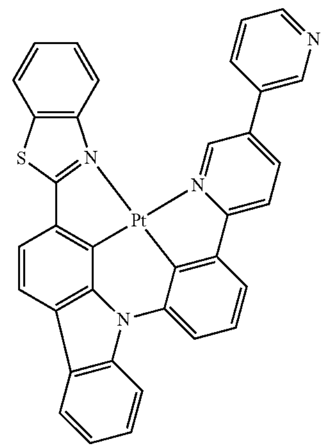
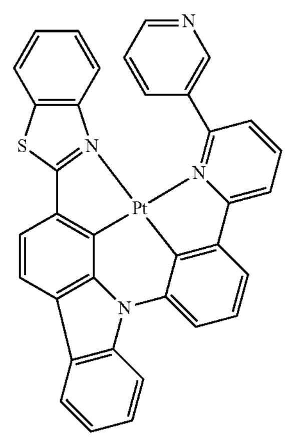
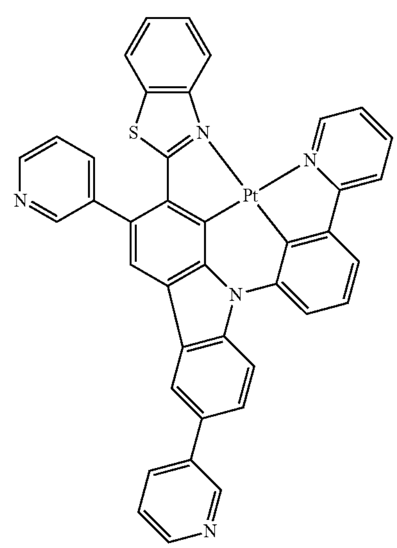

-continued
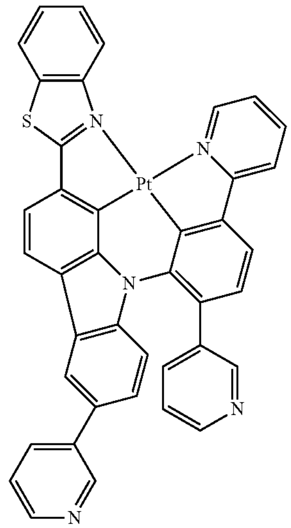
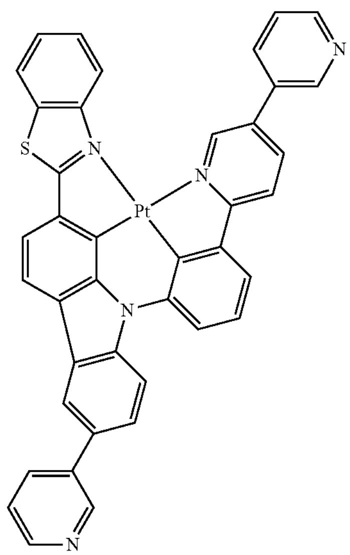
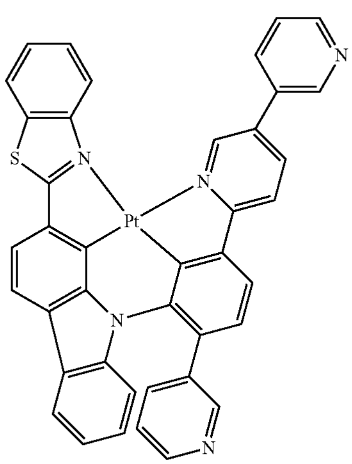
-continued
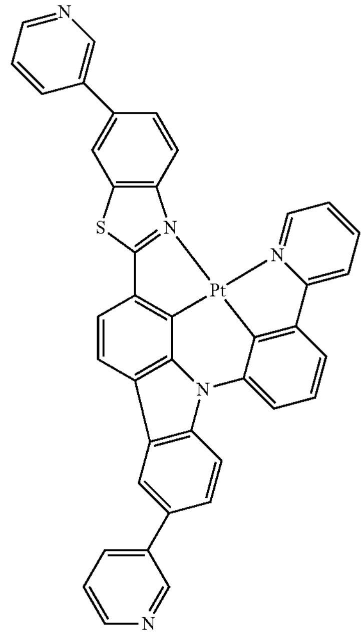
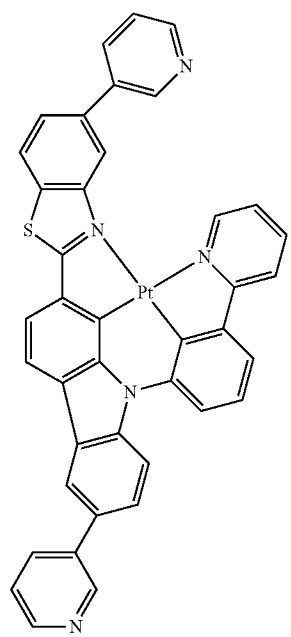

-continued
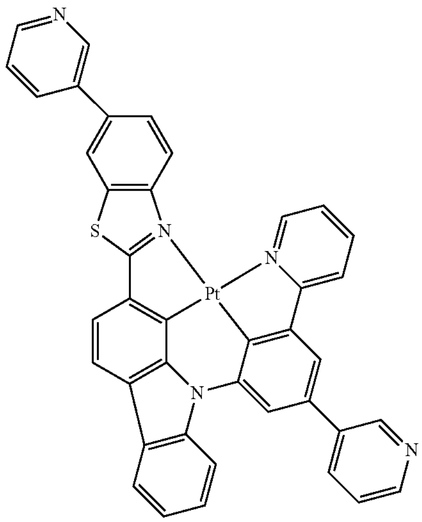
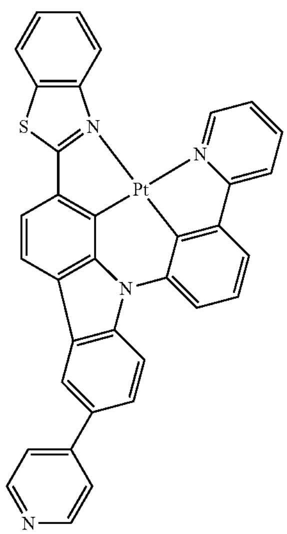
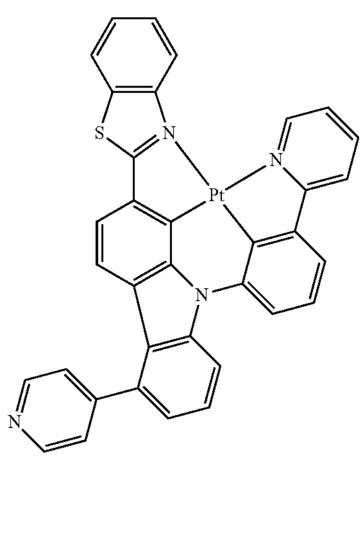
-continued
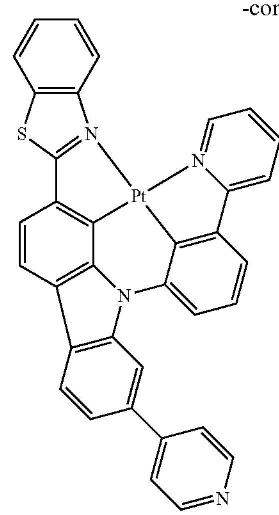
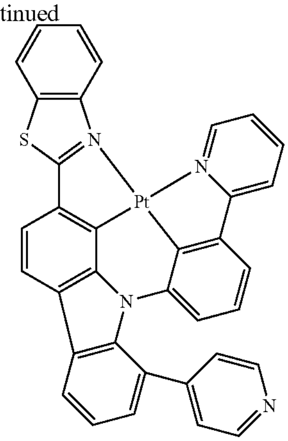
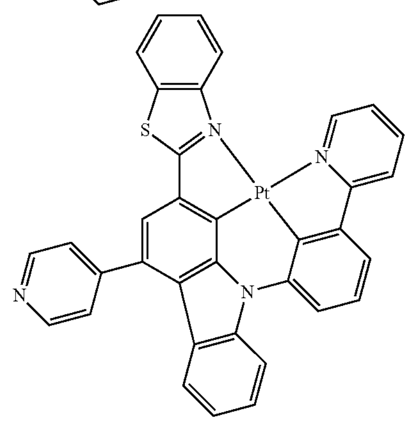
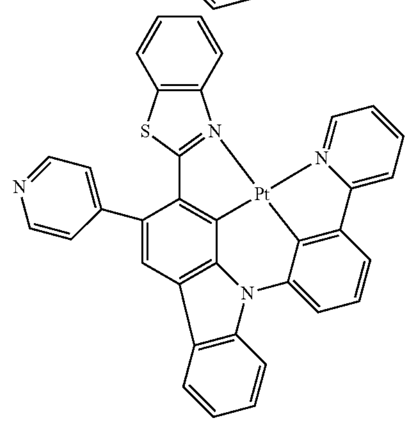
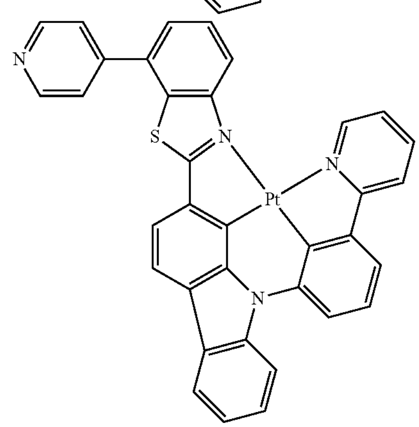

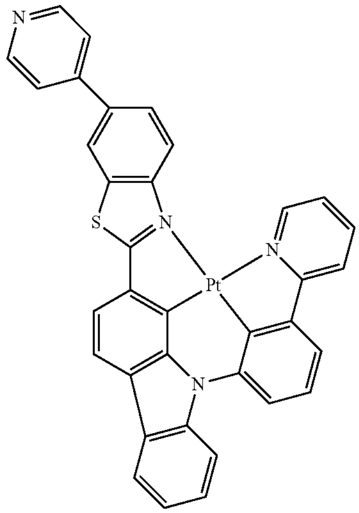
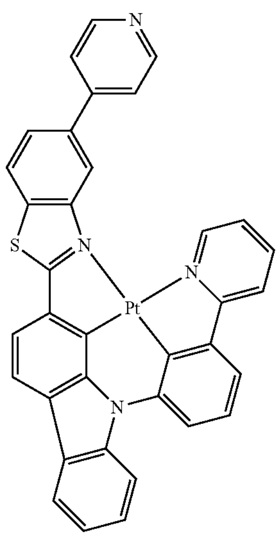
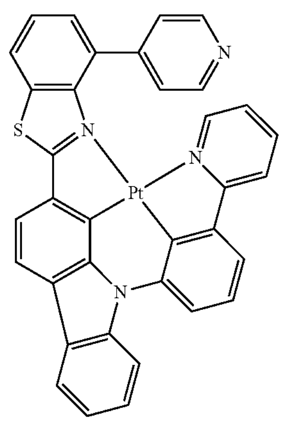
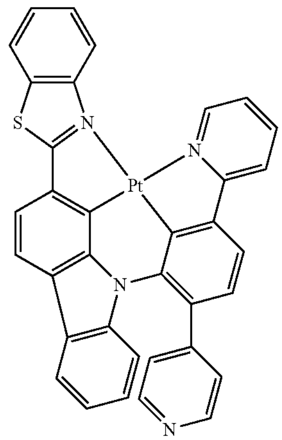
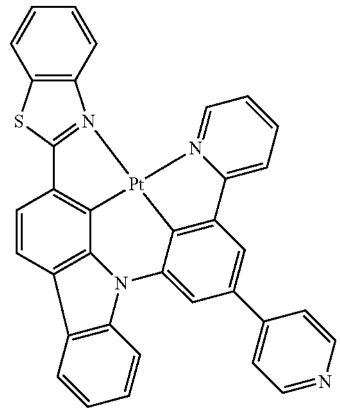
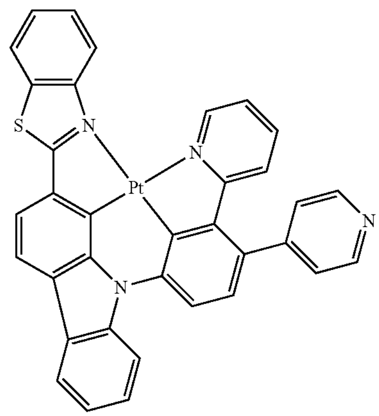
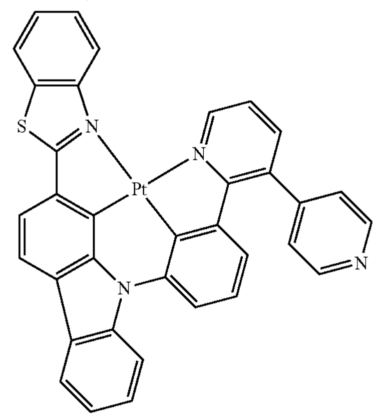
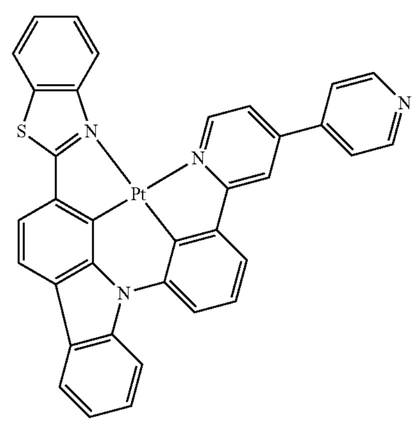

-continued
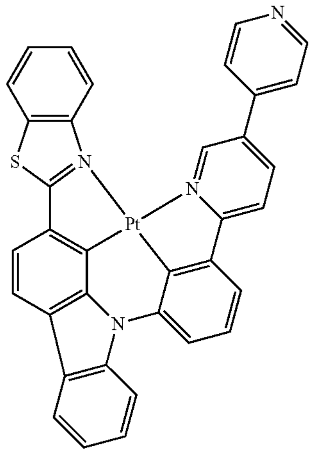
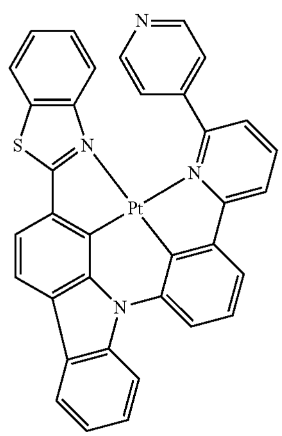
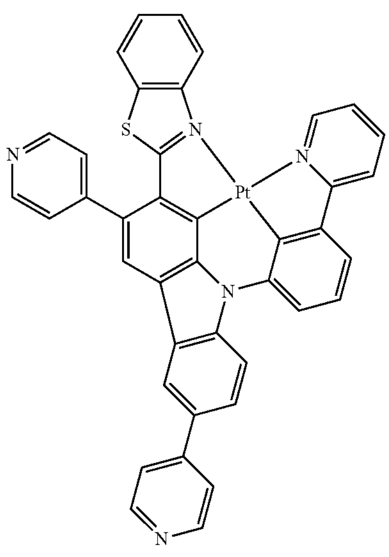
-continued
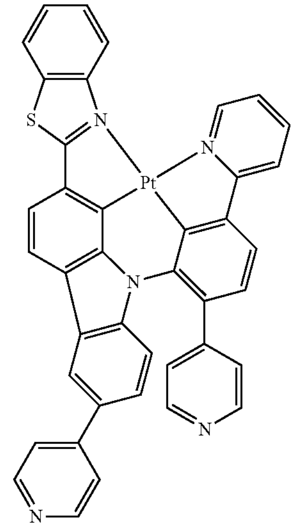
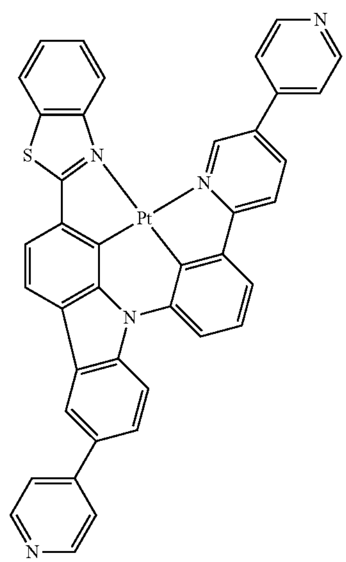
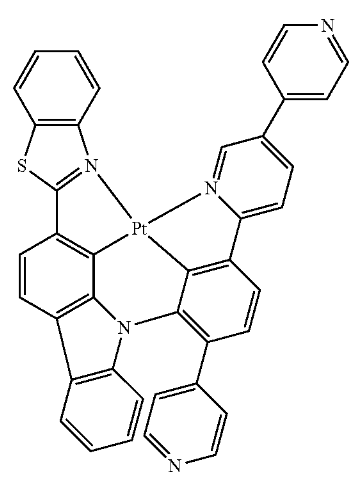

-continued
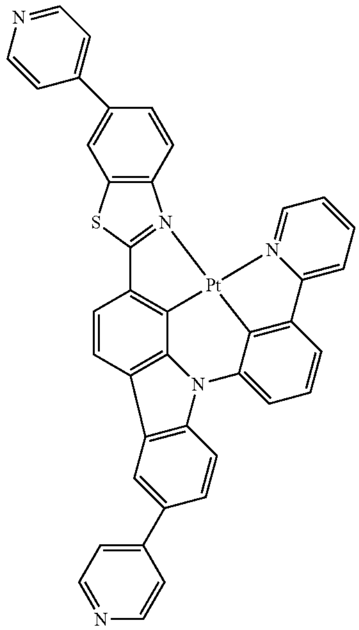
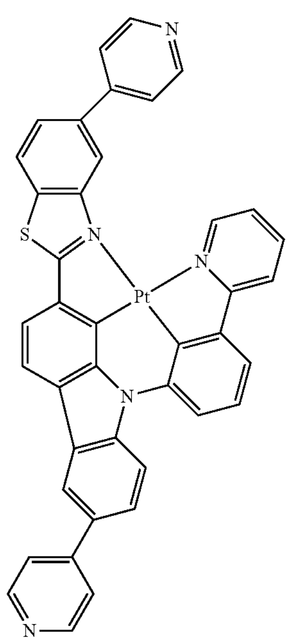
-continued
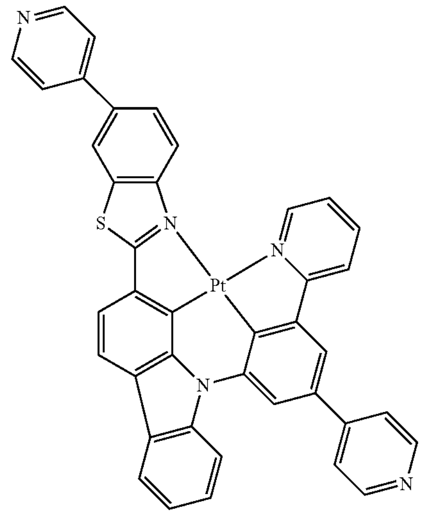
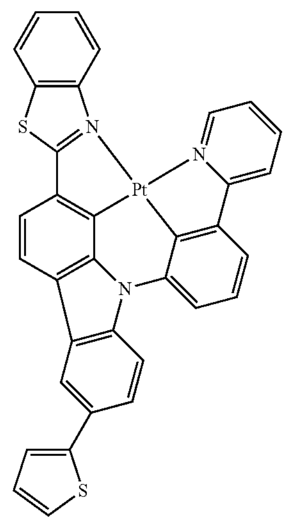
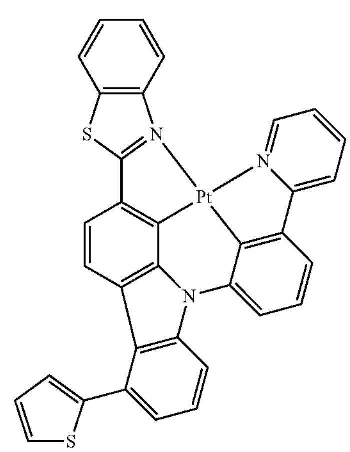

-continued
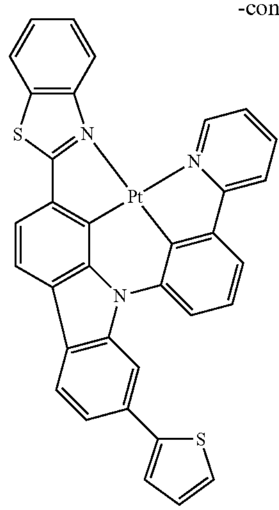
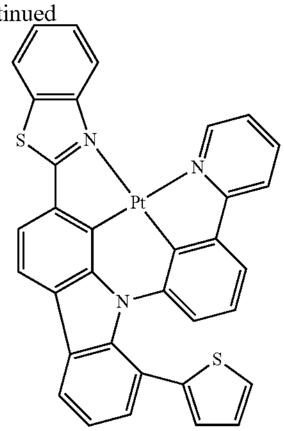
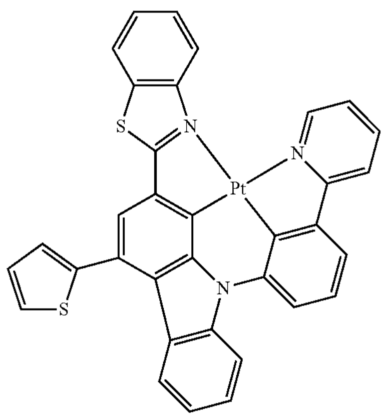
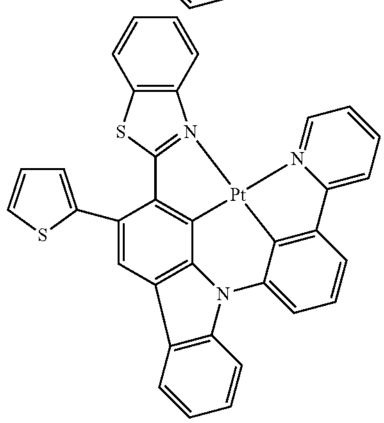
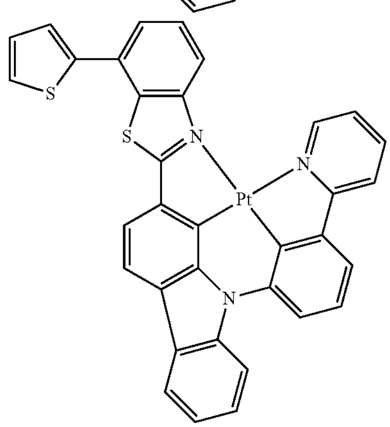
-continued
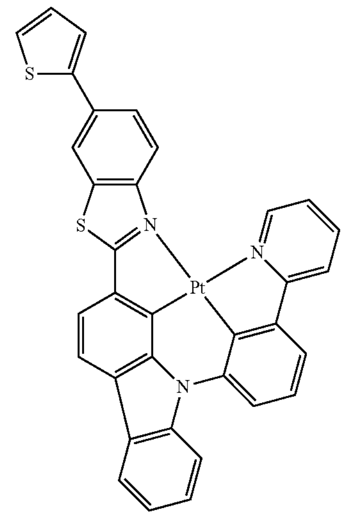
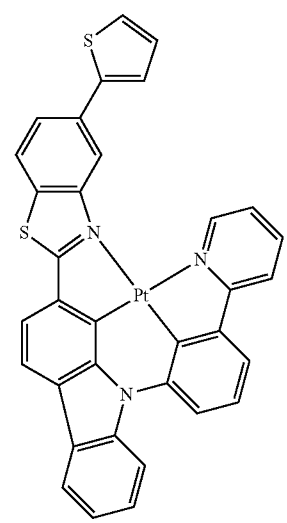
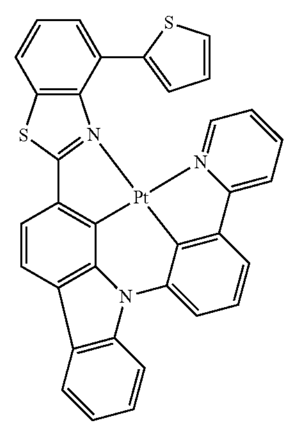
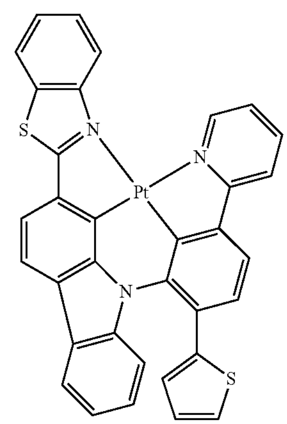

-continued
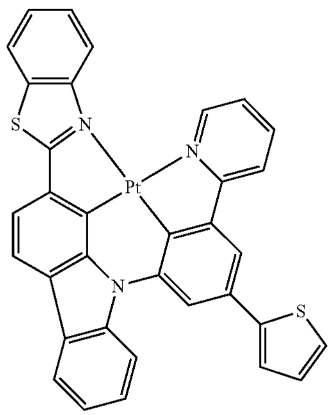
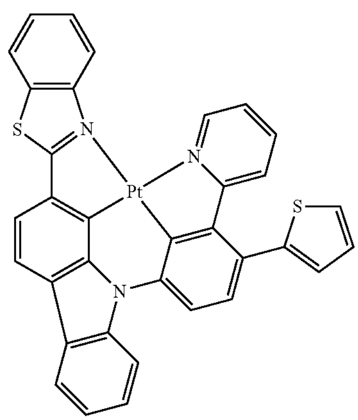
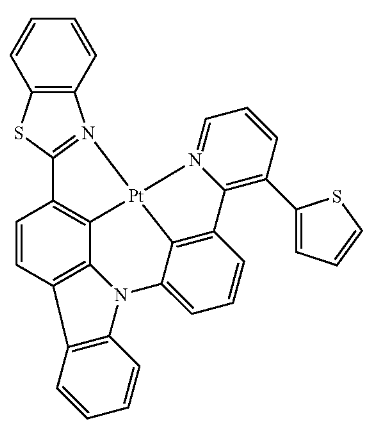
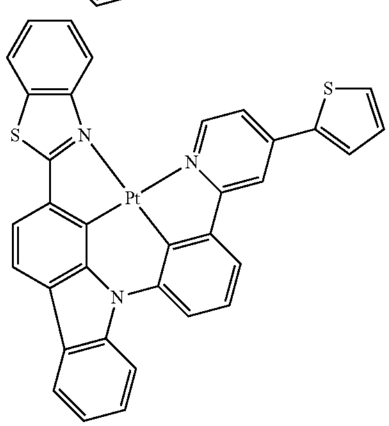
-continued
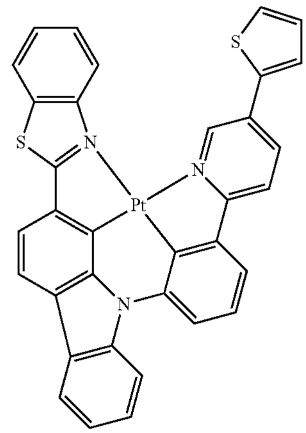
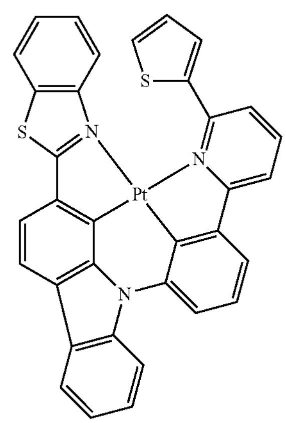
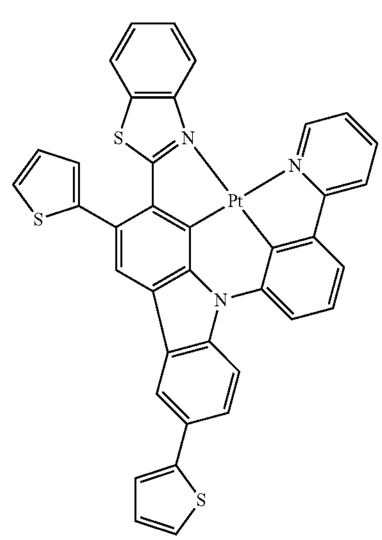

-continued
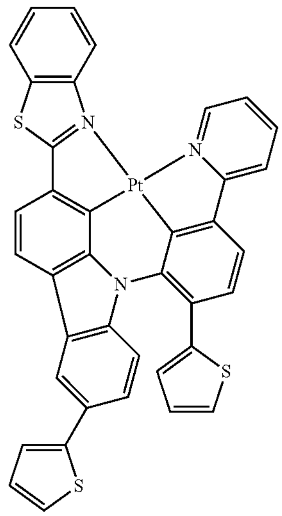
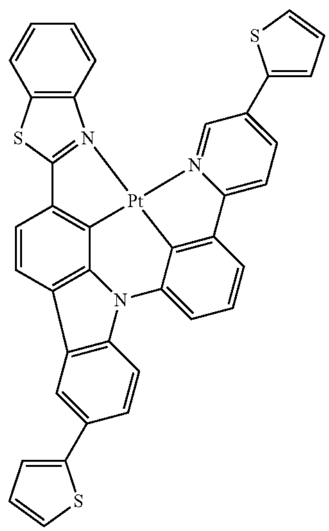
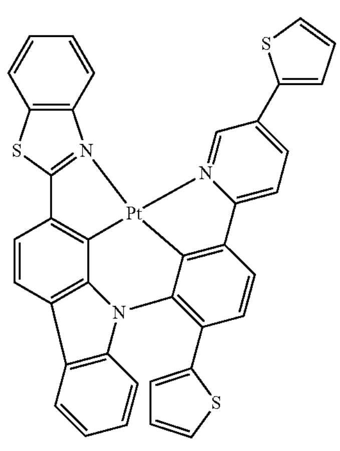
-continued
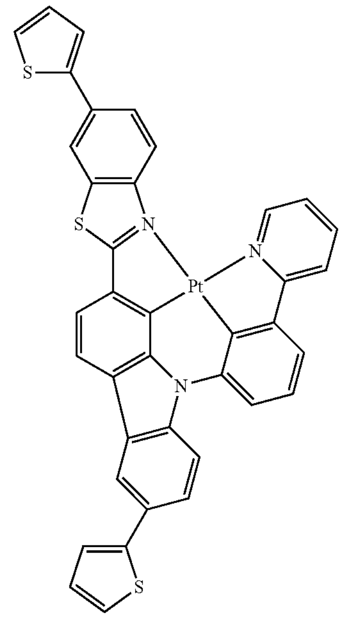
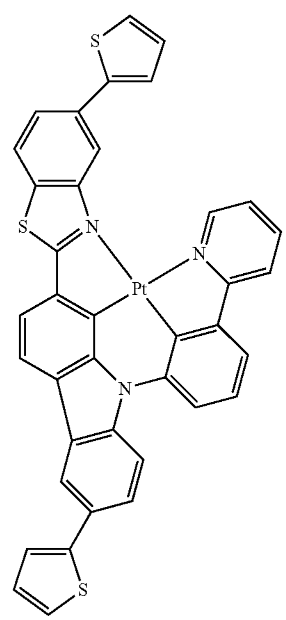

-continued
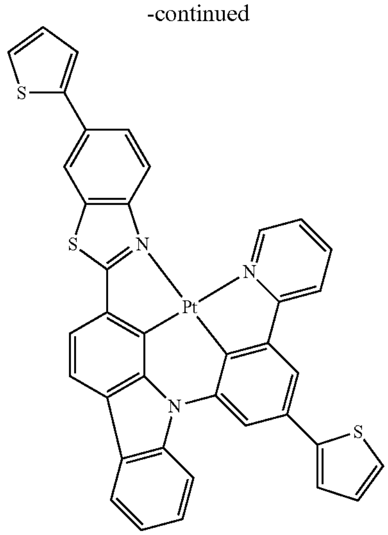
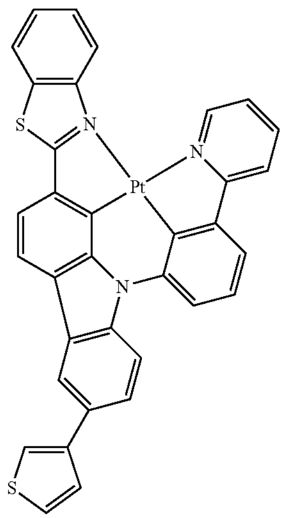
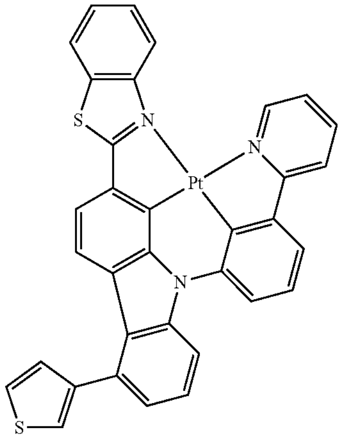
-continued
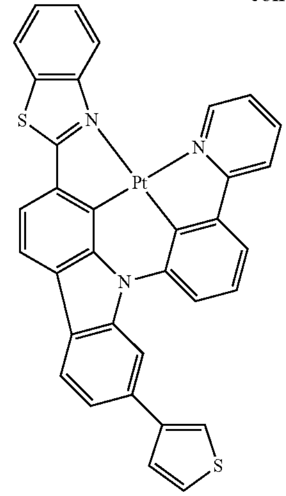
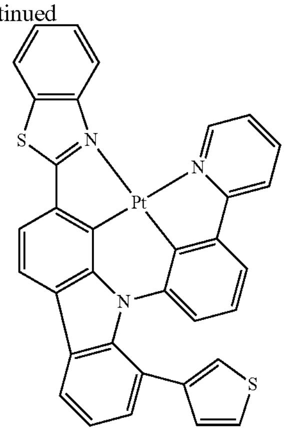
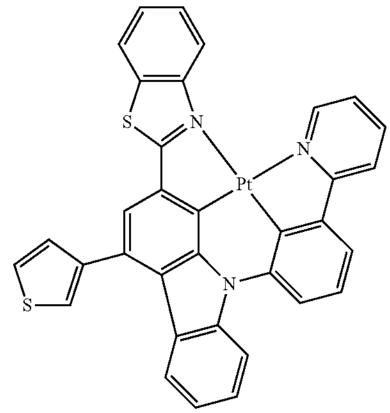
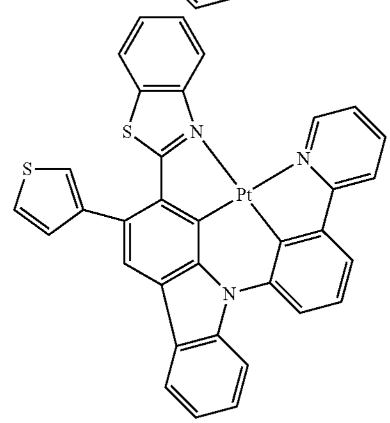
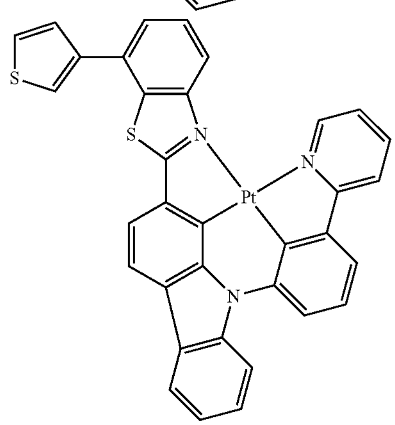

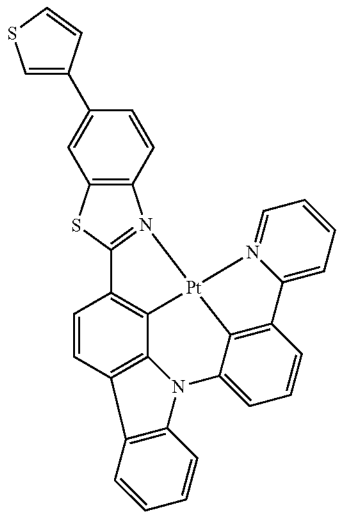
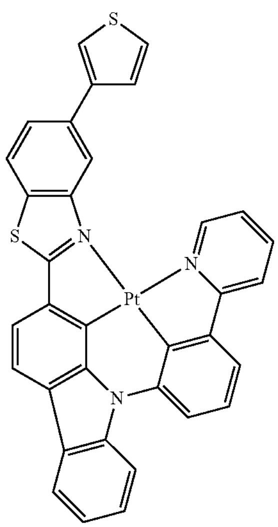
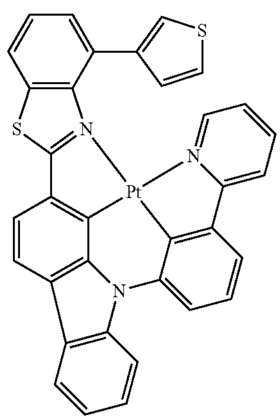
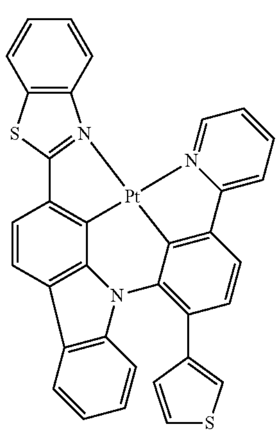
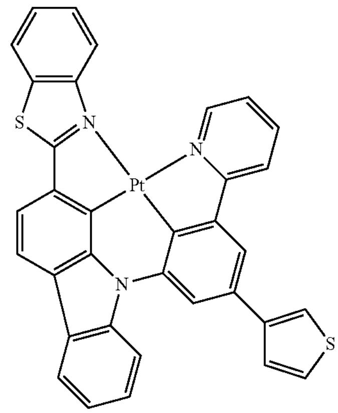
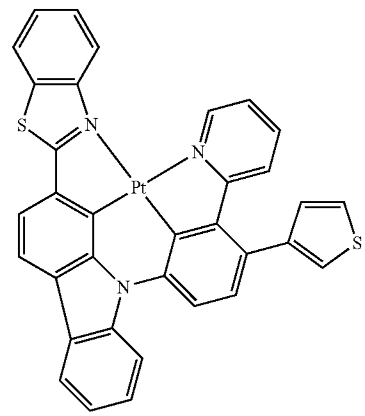
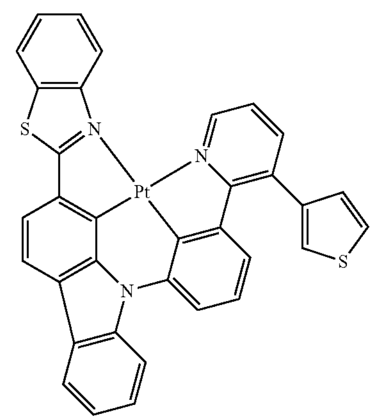
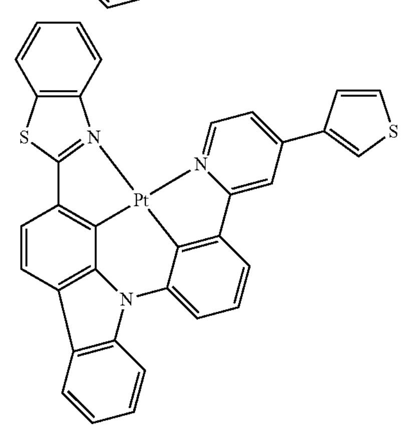

-continued
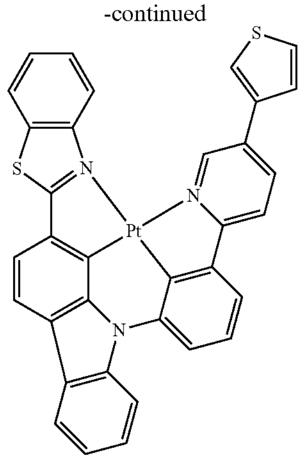
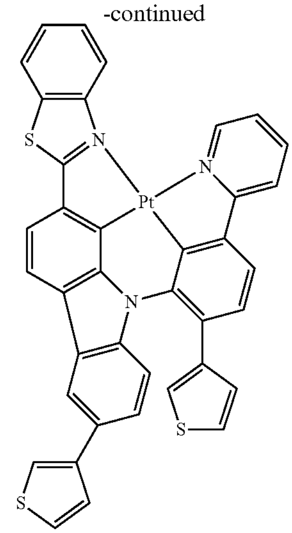
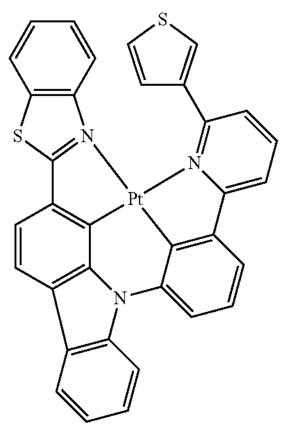
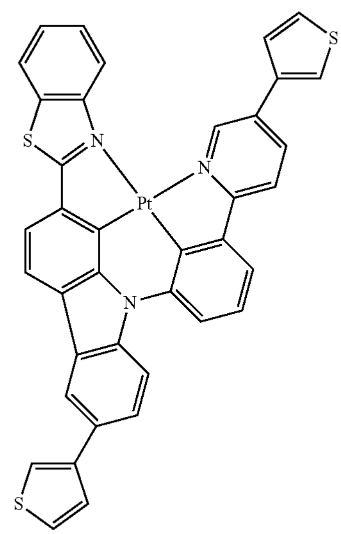
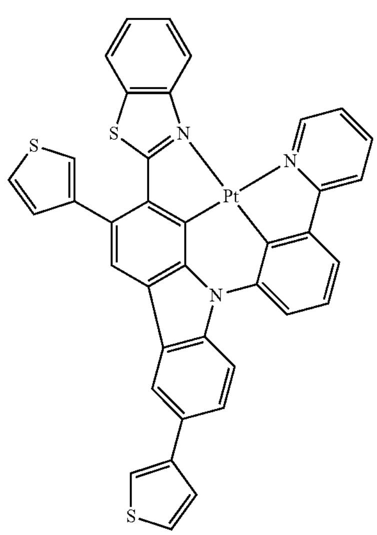
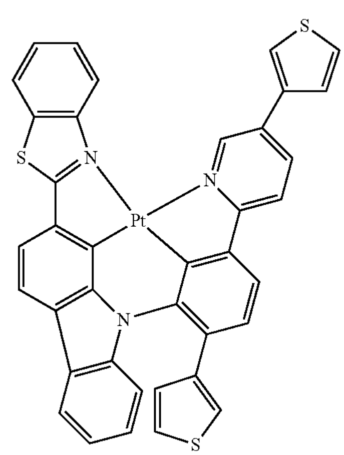

-continued
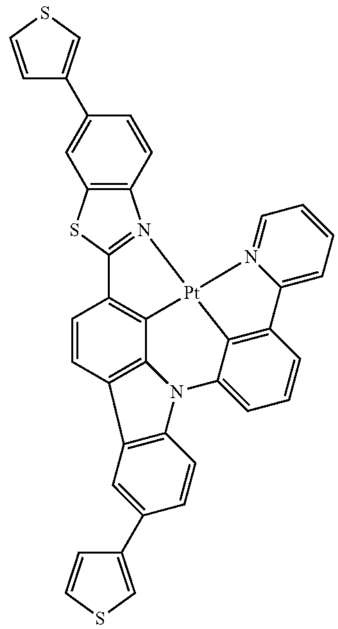
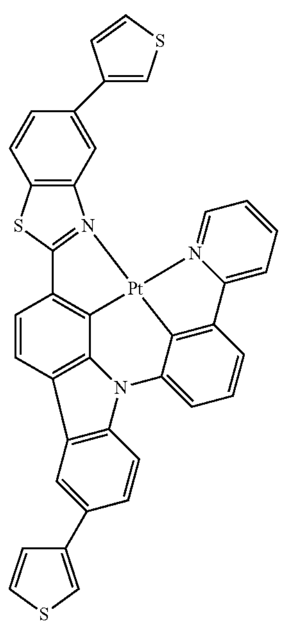
-continued
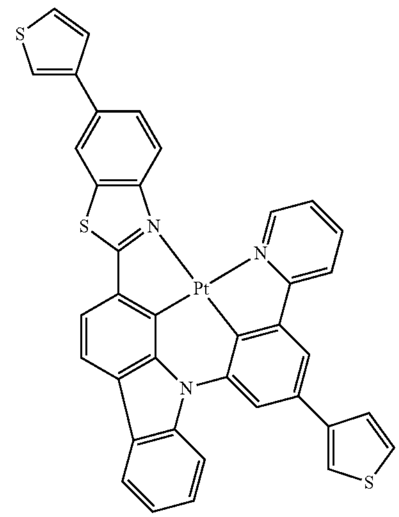
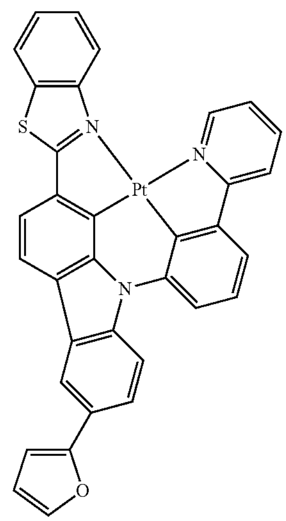
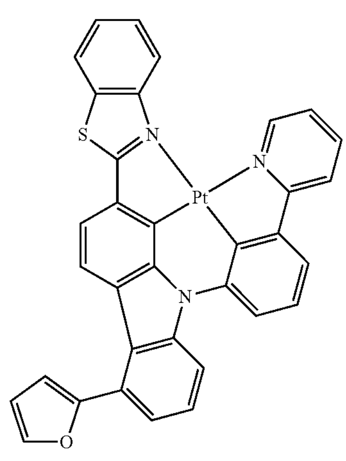

-continued
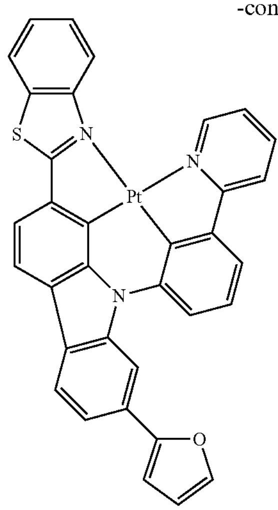
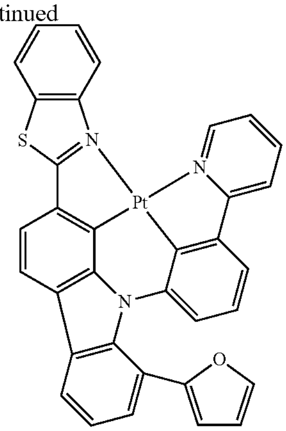
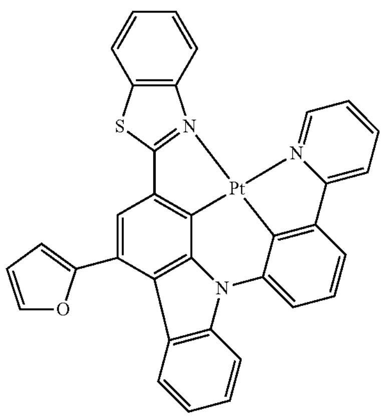
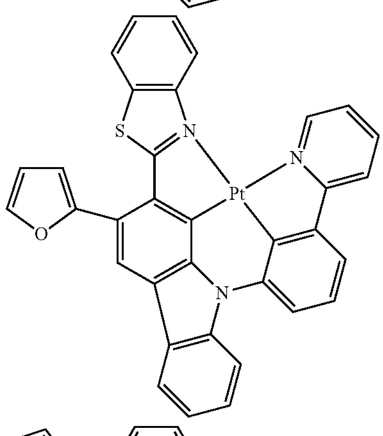
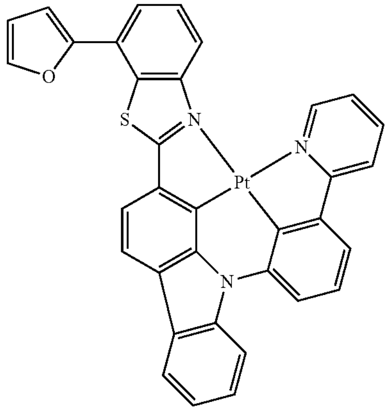
-continued
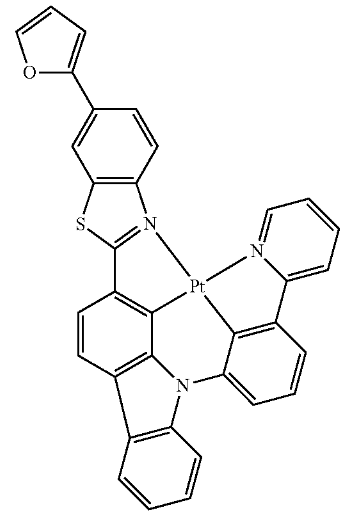
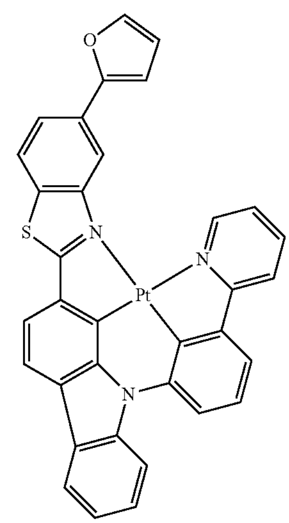
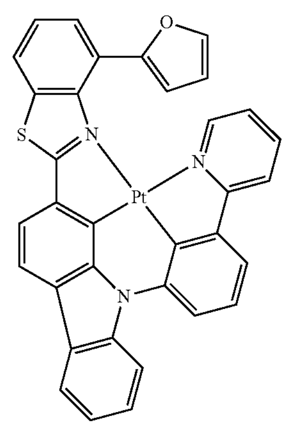
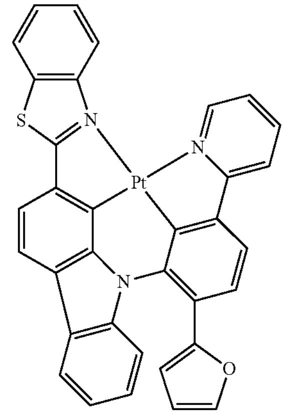

-continued
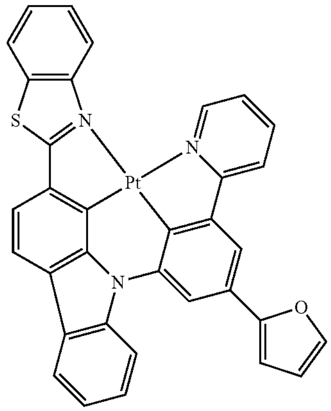
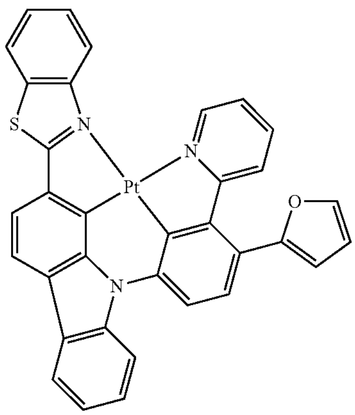
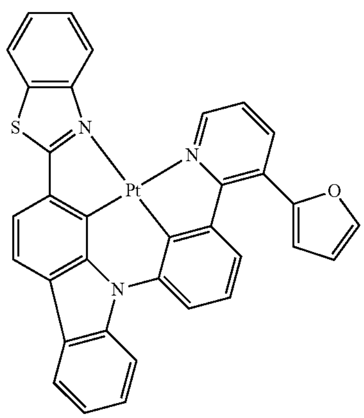
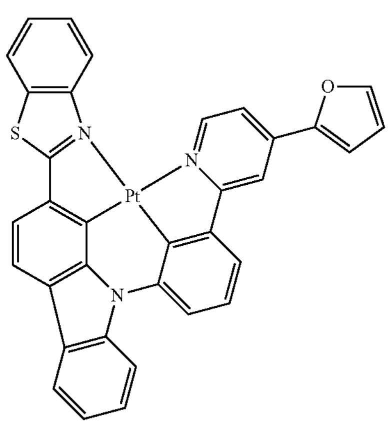
-continued
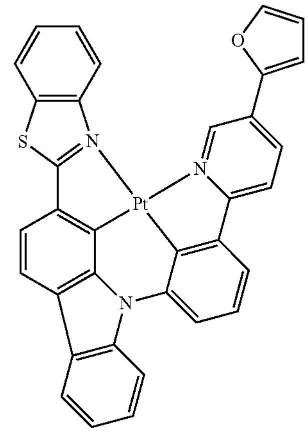
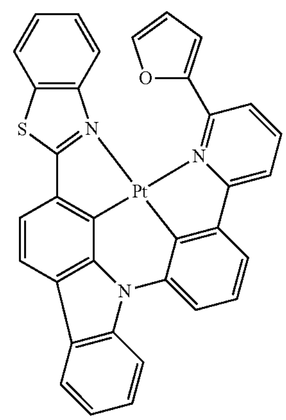
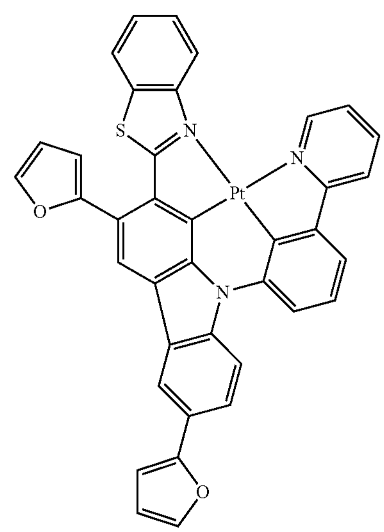

-continued
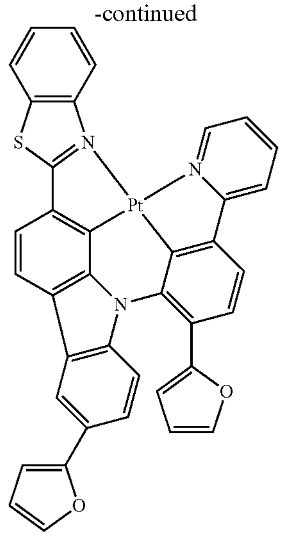
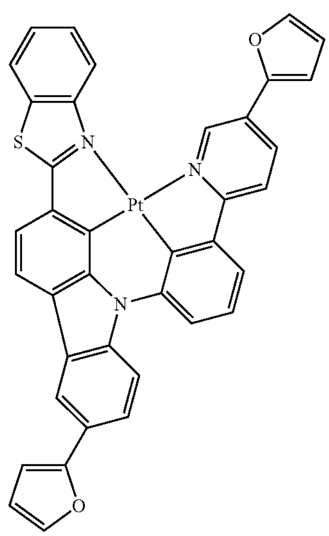
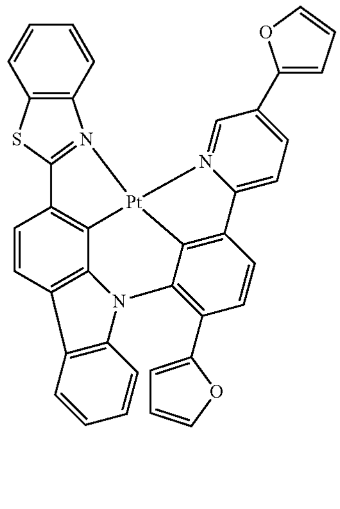
-continued
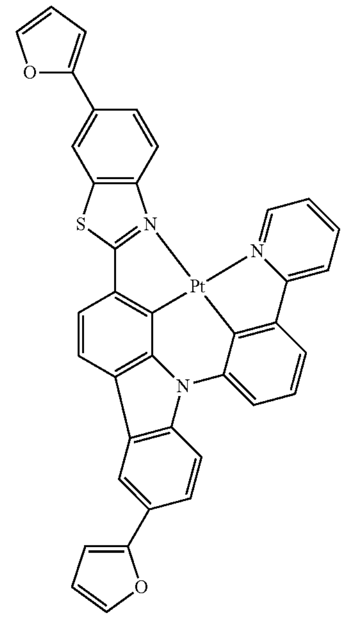
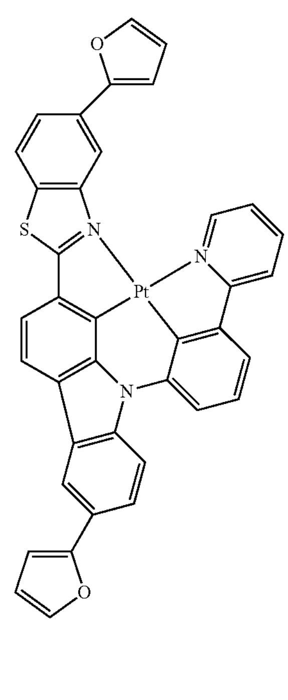

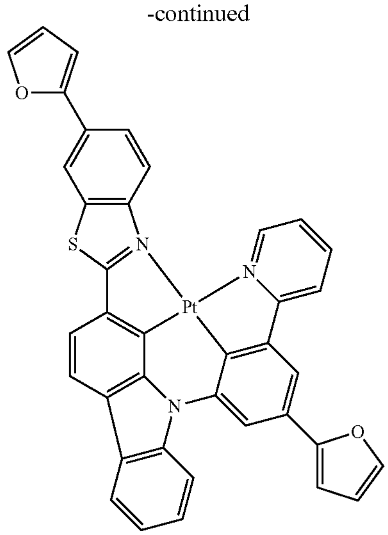
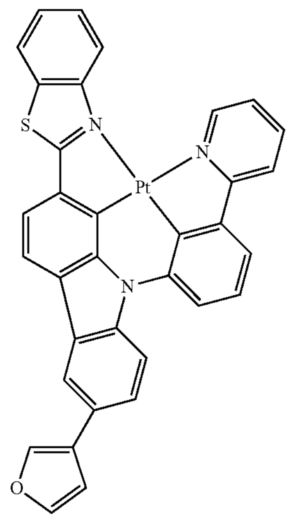
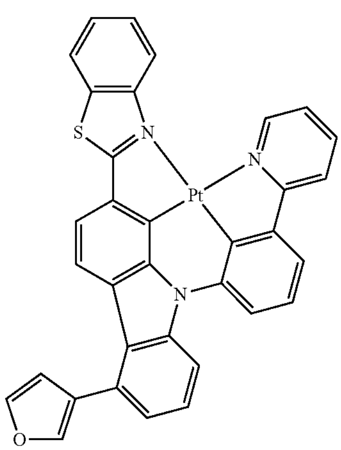
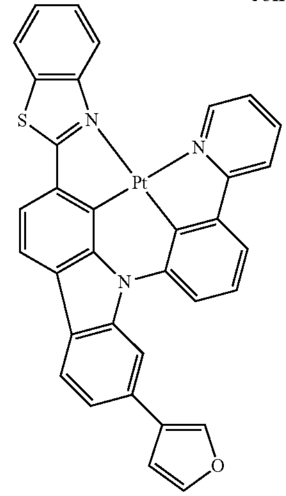
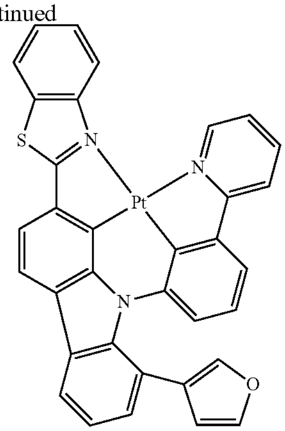
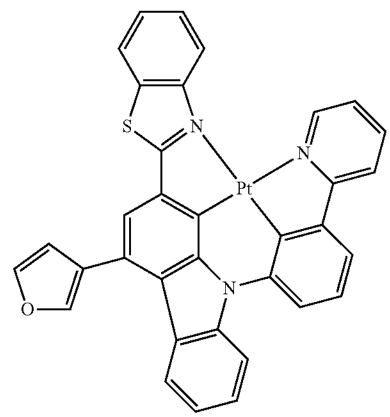
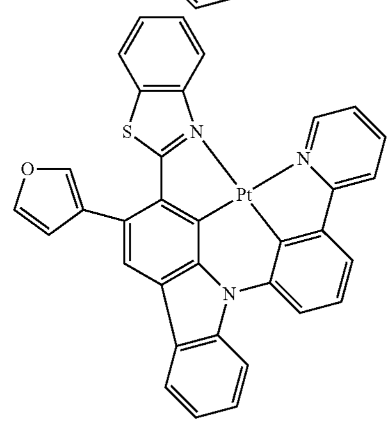
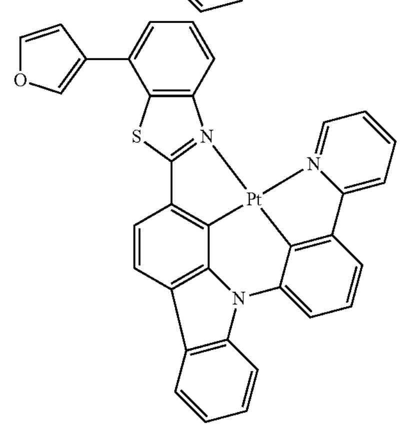

-continued
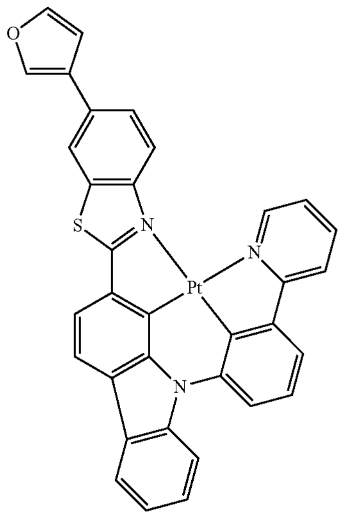
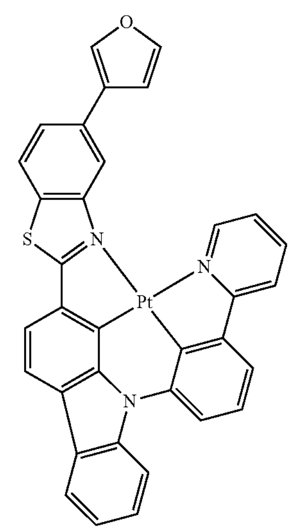
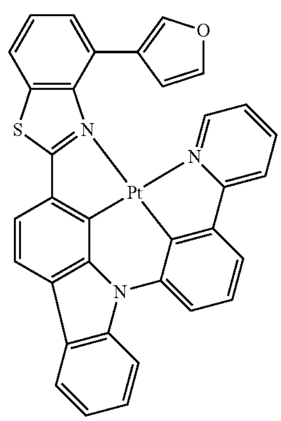
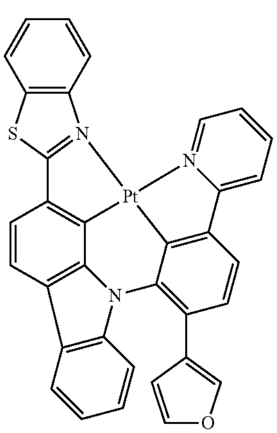
-continued
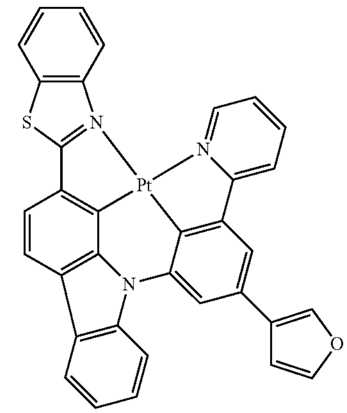
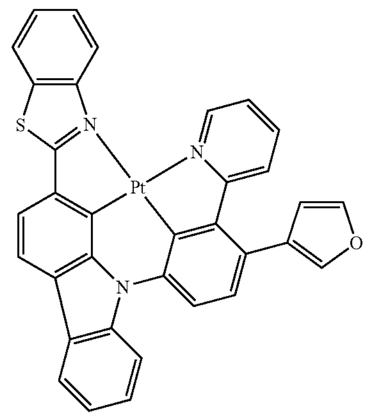
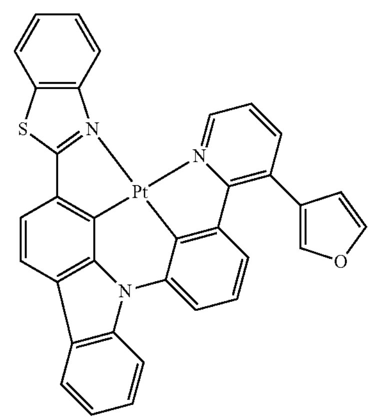
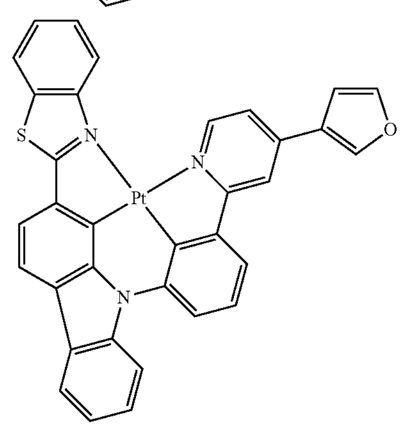

-continued
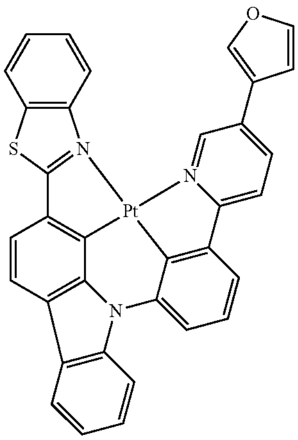
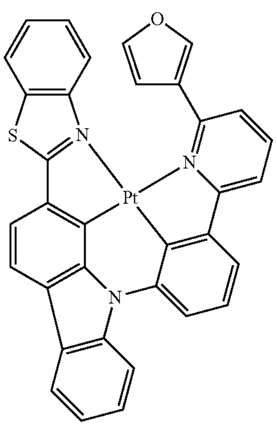
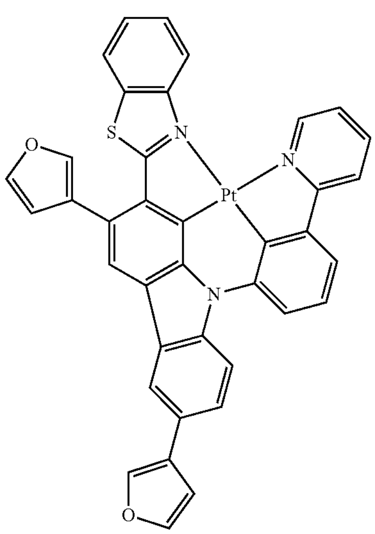
-continued
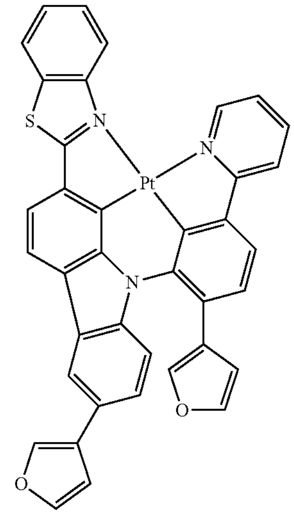
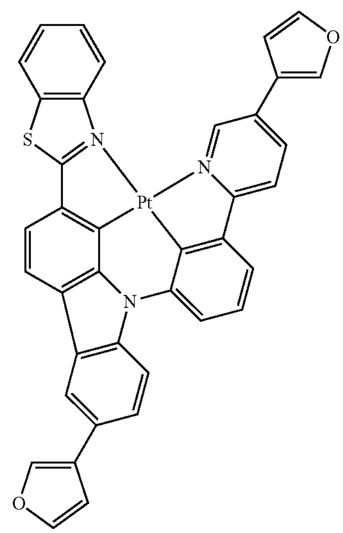
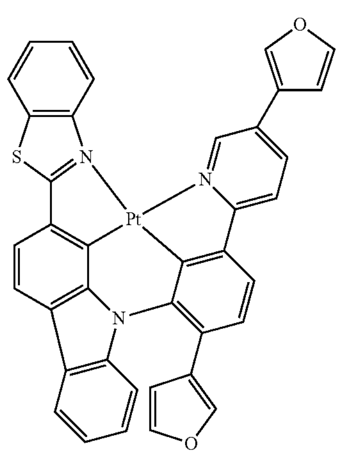

-continued
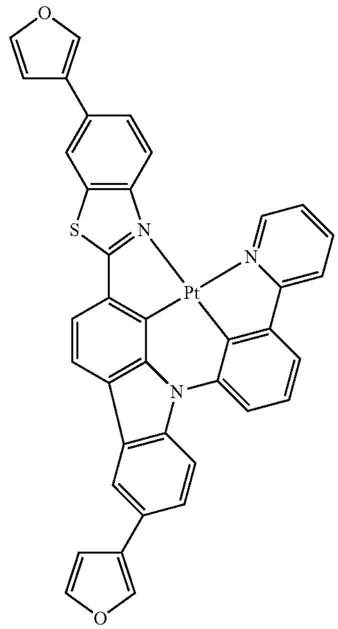
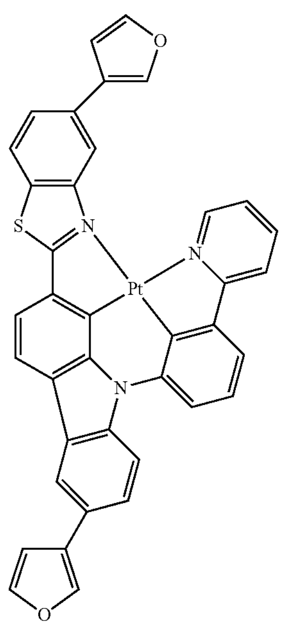
-continued
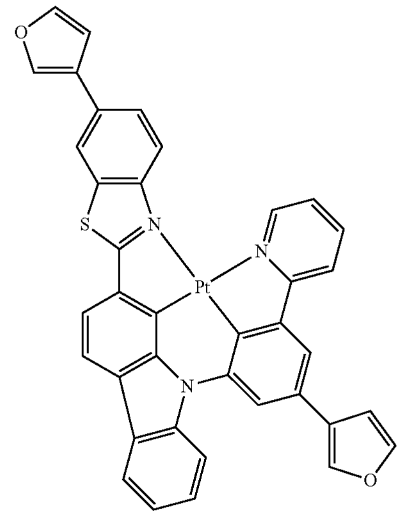
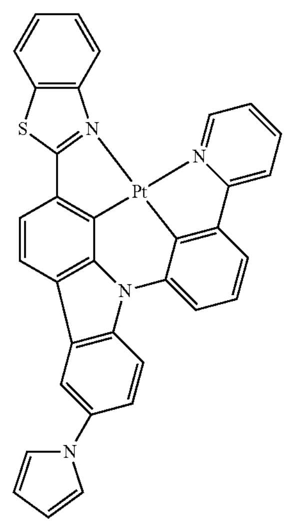
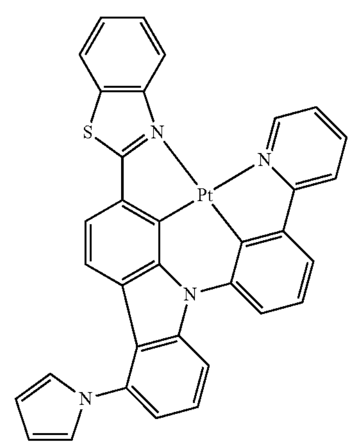

-continued
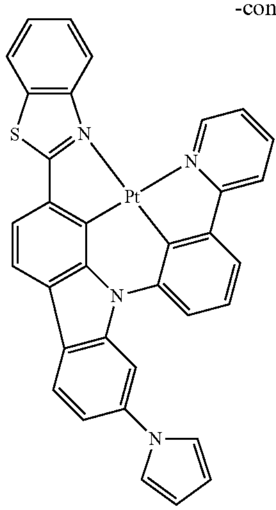
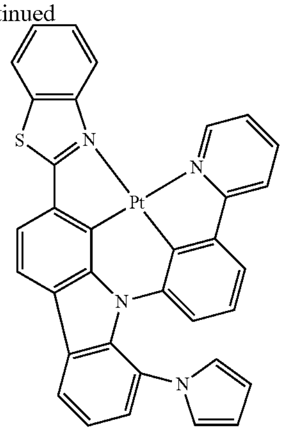
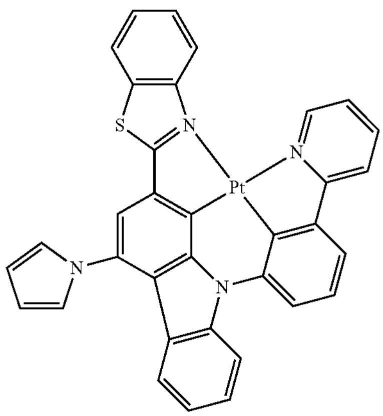
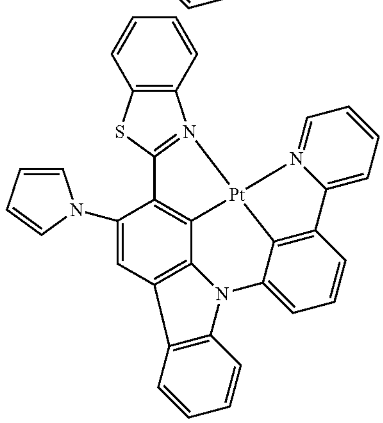
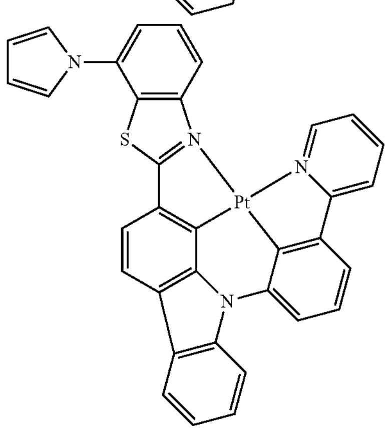
-continued
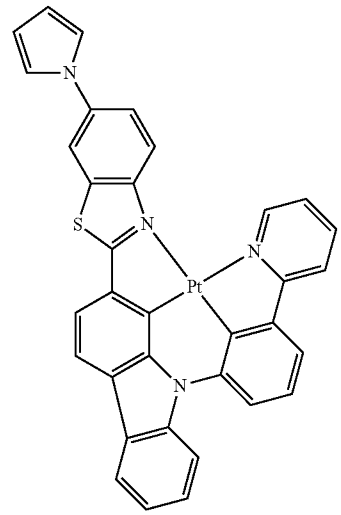
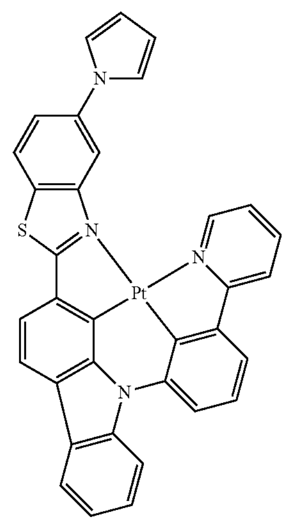
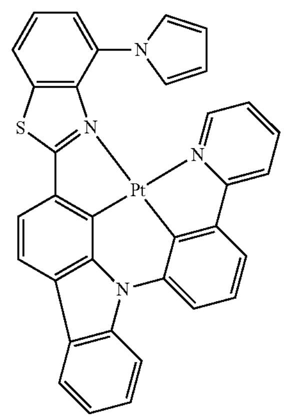
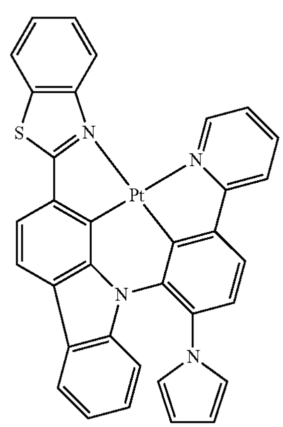

-continued
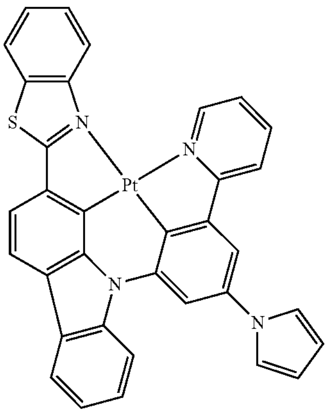
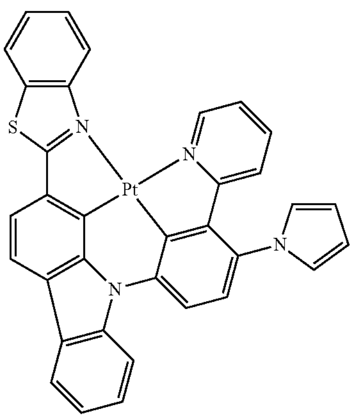
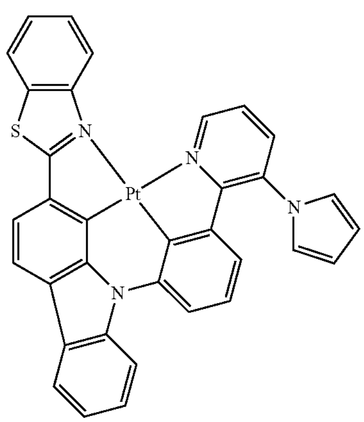
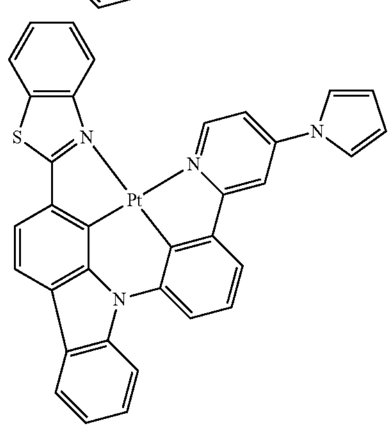
-continued
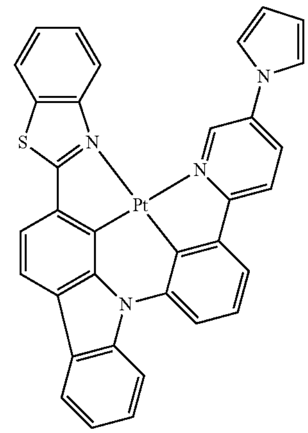
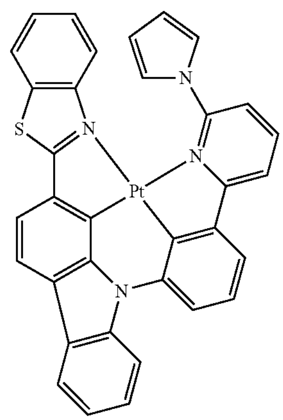
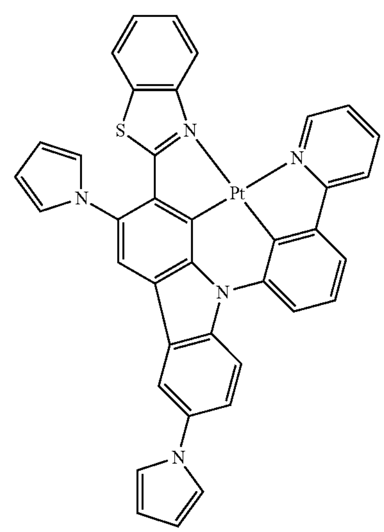

-continued
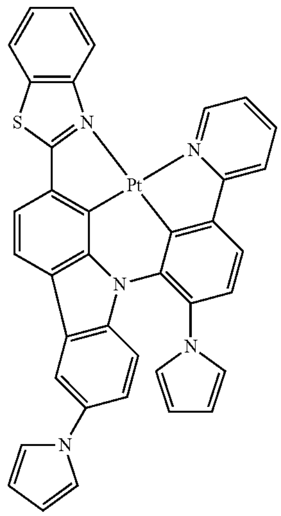
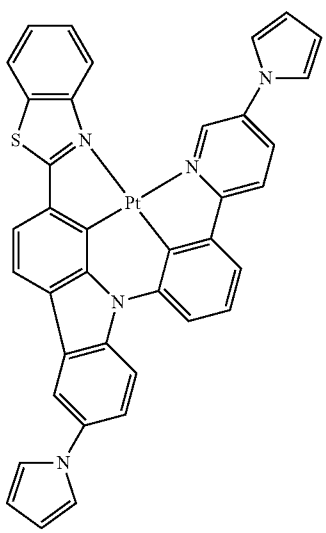
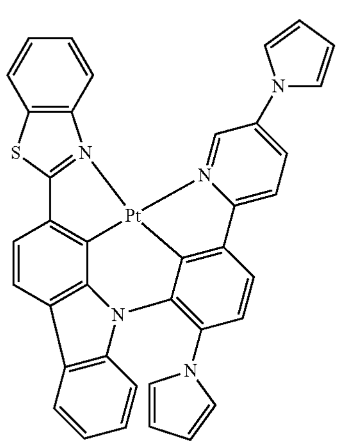
-continued
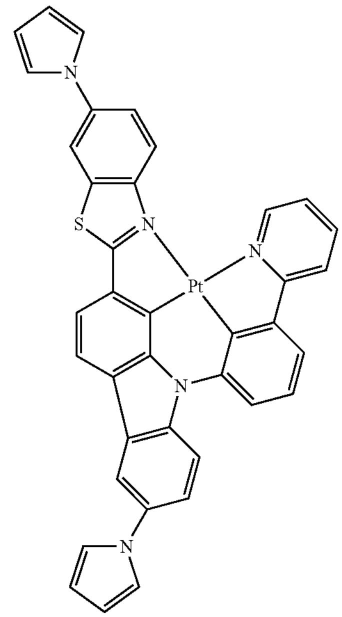
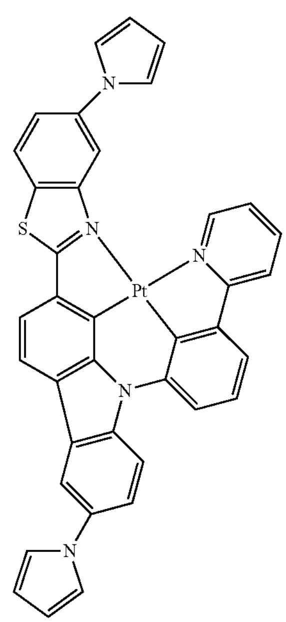

-continued
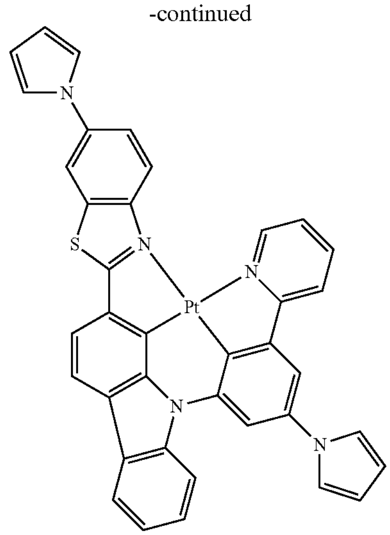
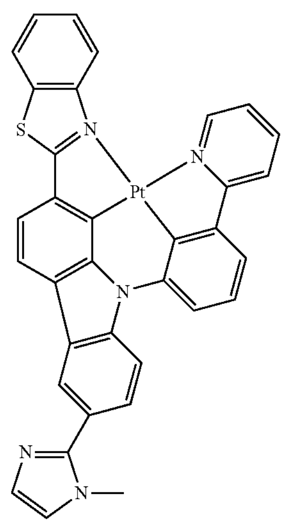
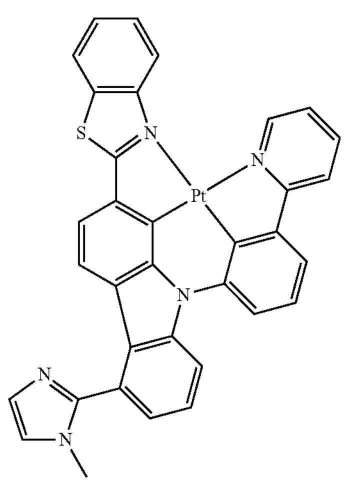
-continued
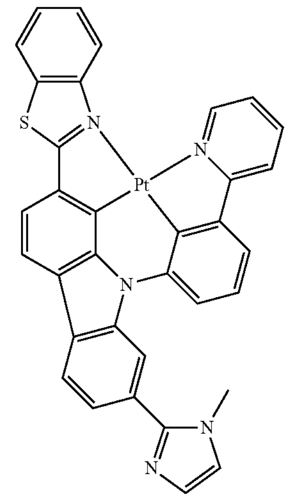
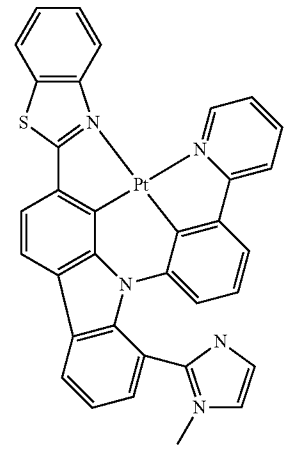
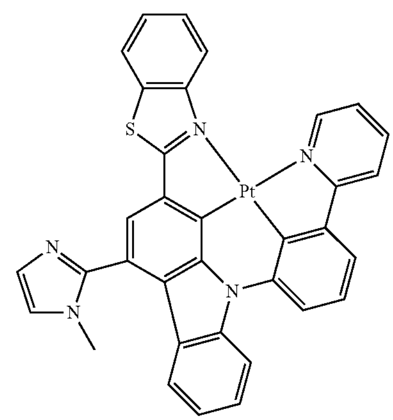
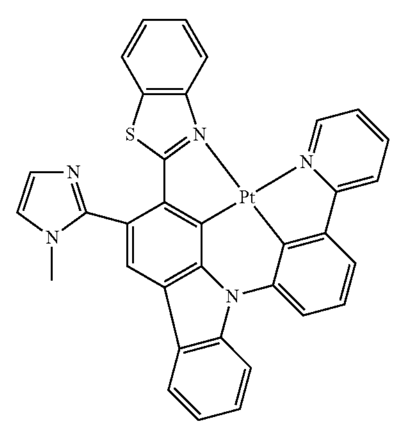

-continued
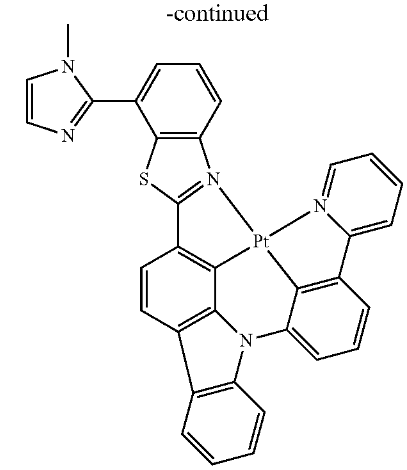
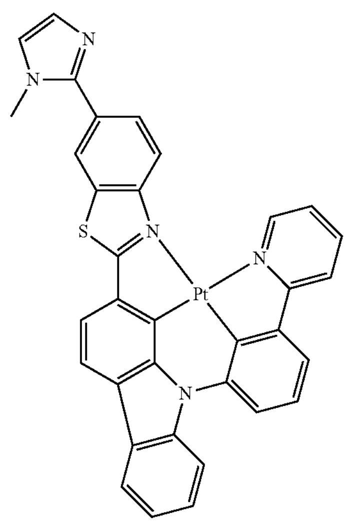
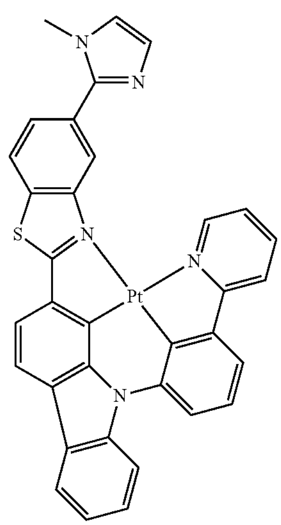
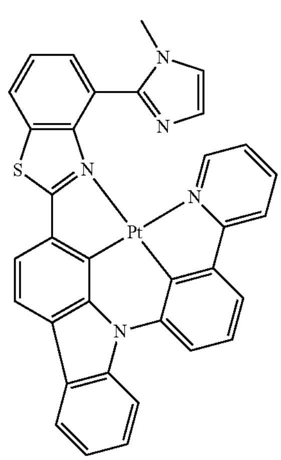
-continued
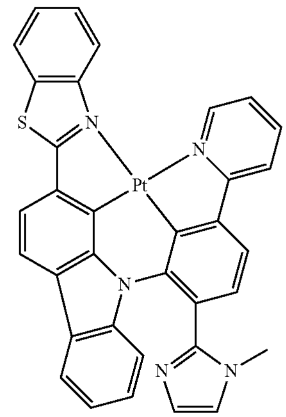
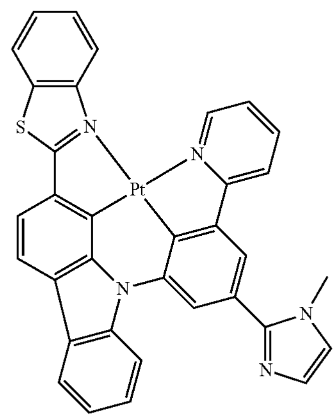
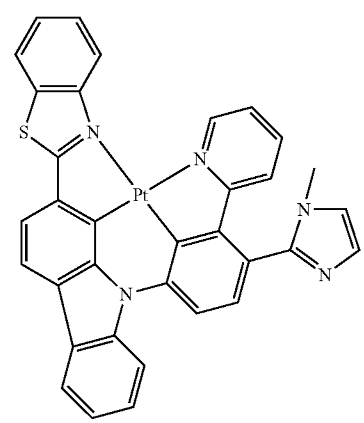
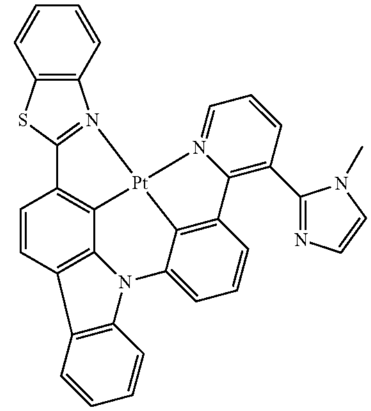

-continued
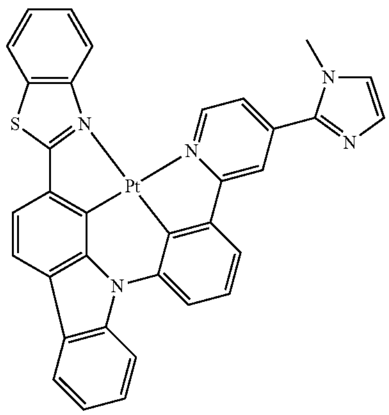
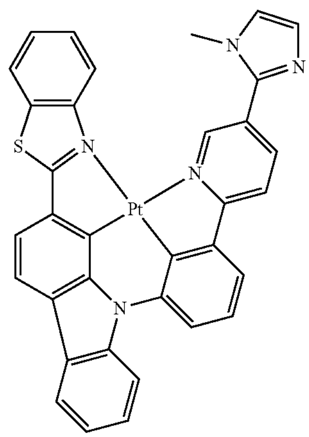
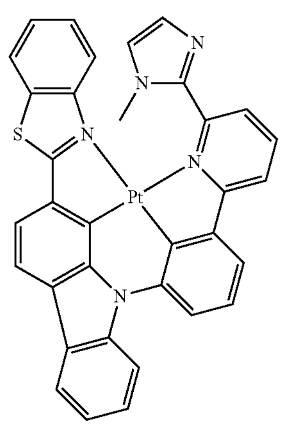
-continued
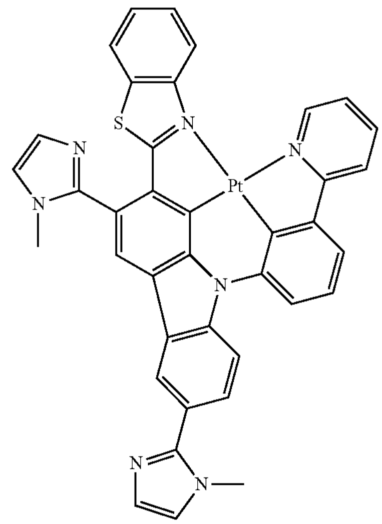
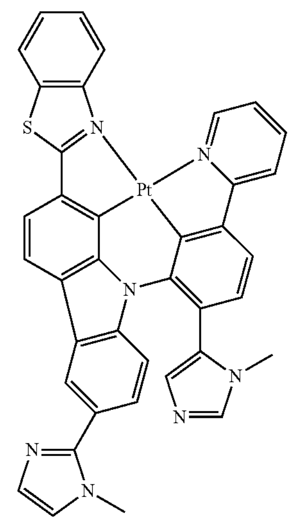
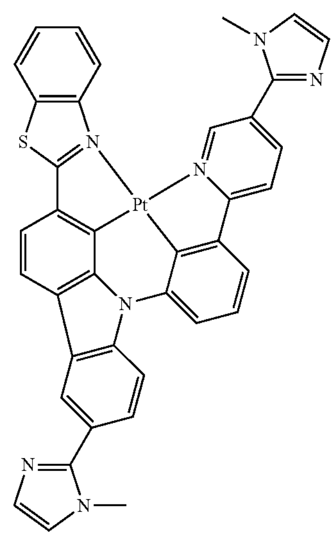

-continued
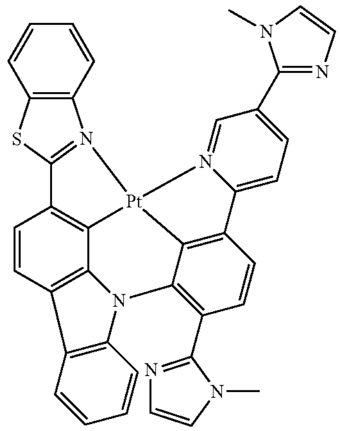
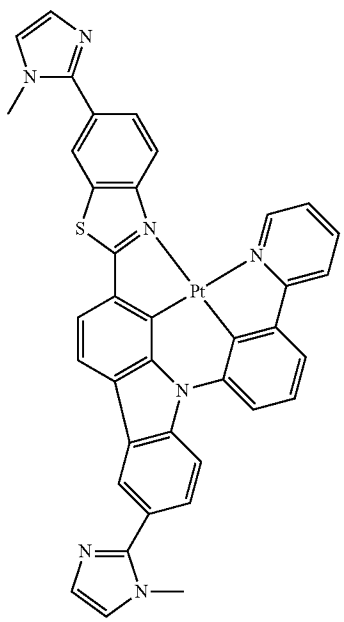
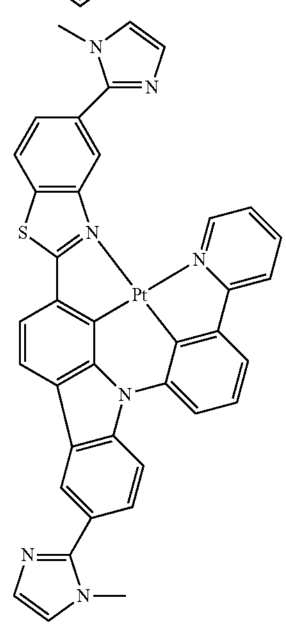
-continued
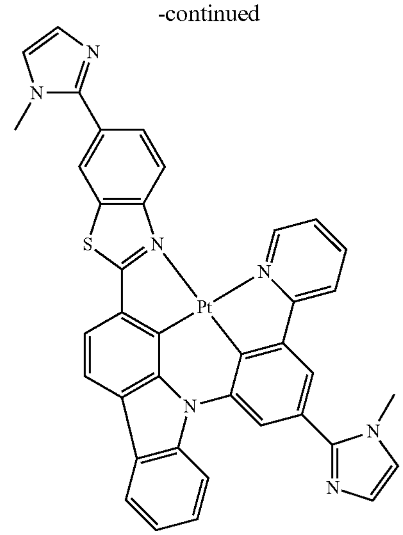
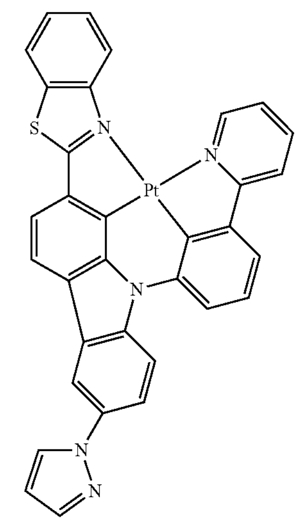
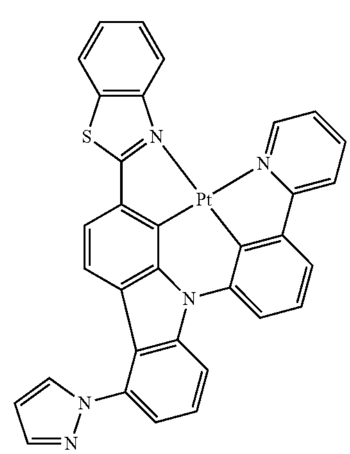

-continued
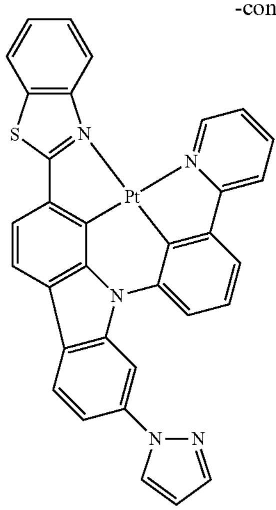
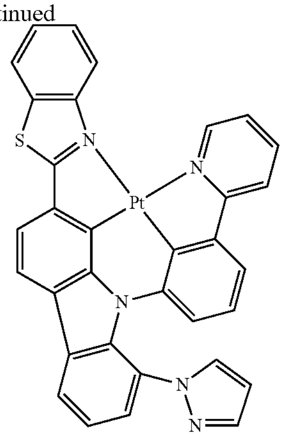
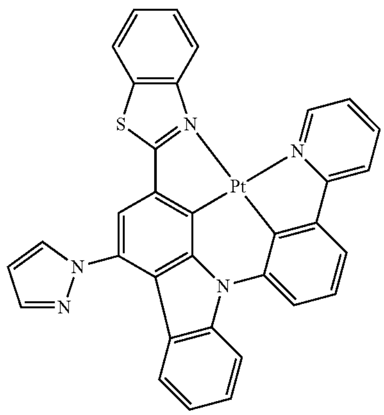
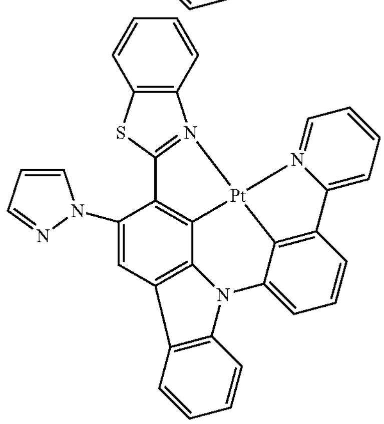
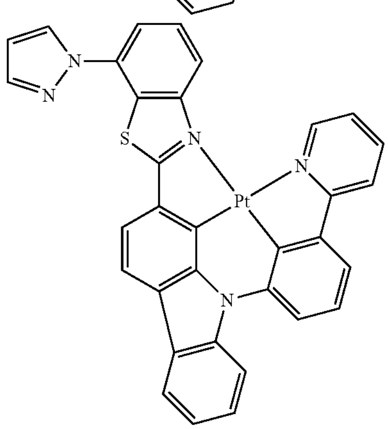
-continued
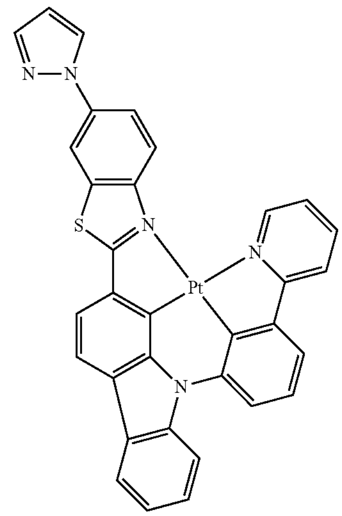
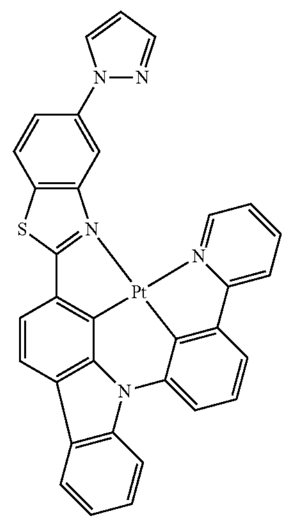
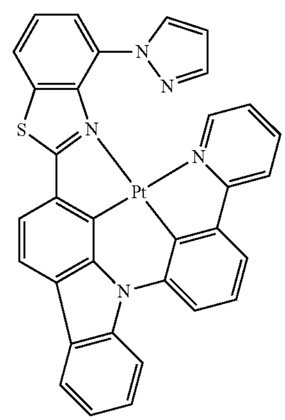
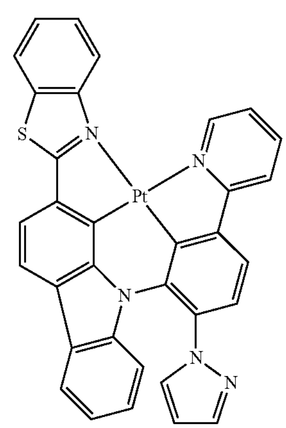

-continued
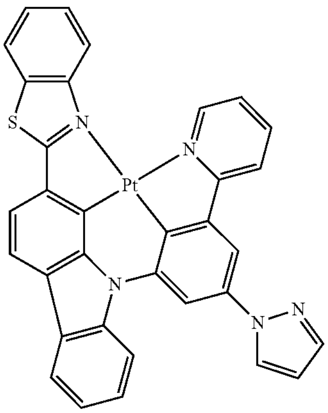
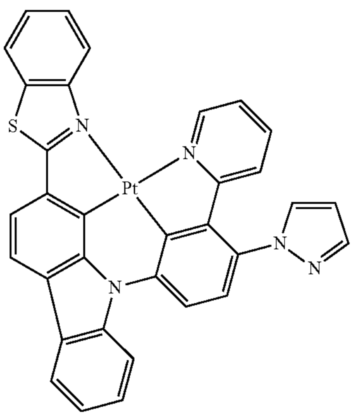
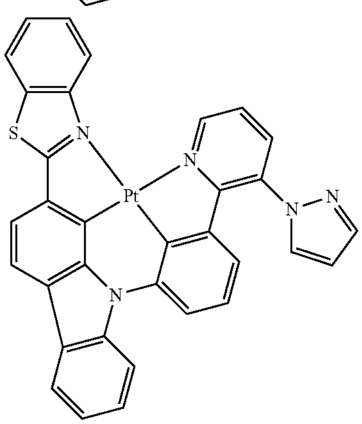
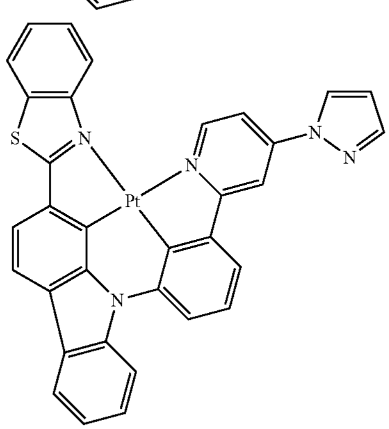
-continued
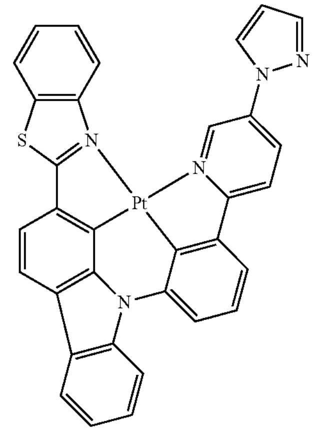
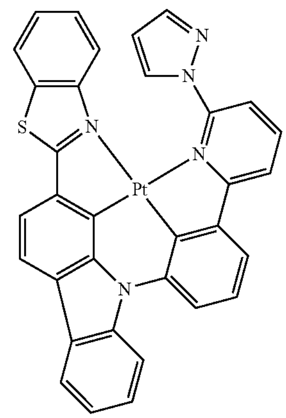
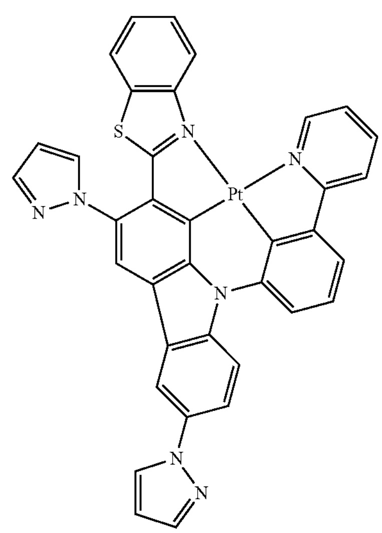

-continued
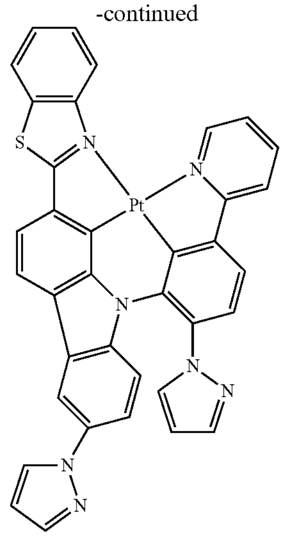
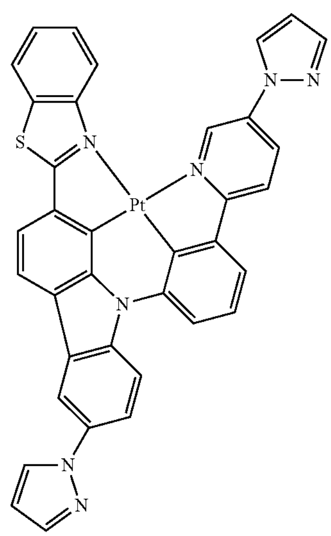
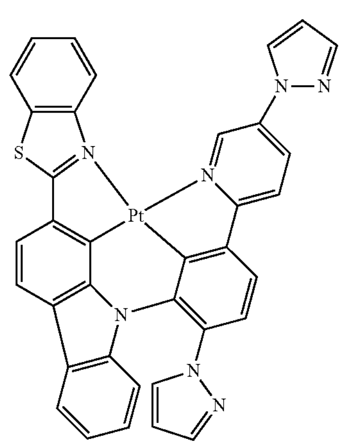
-continued
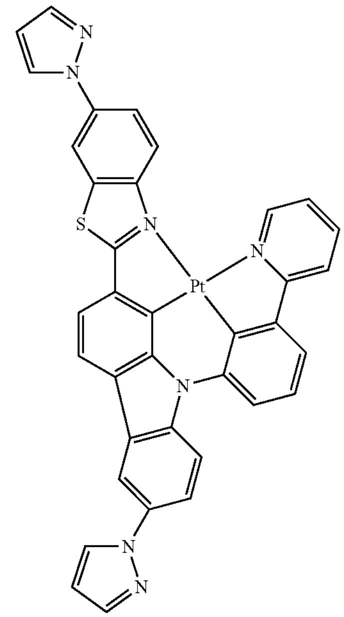
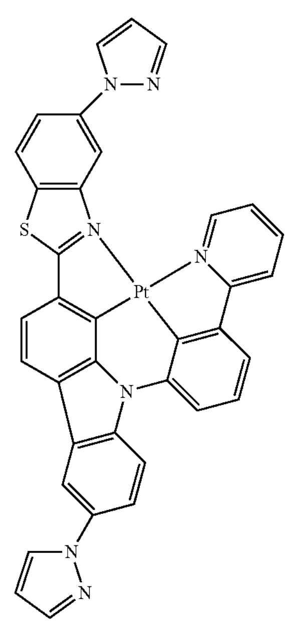

-continued
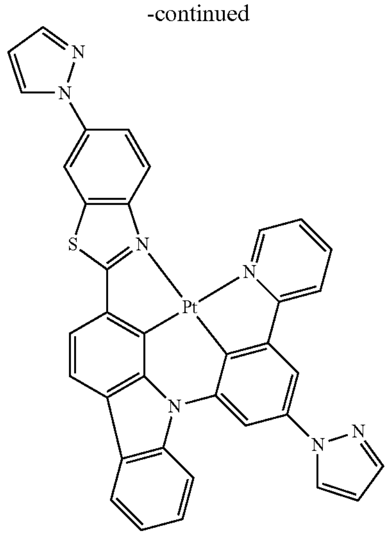
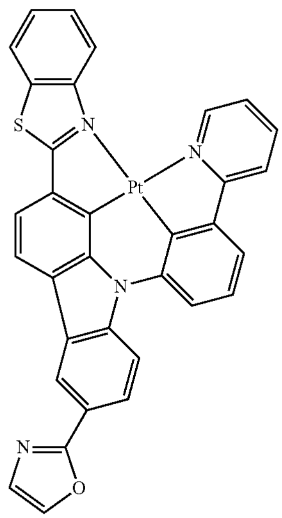
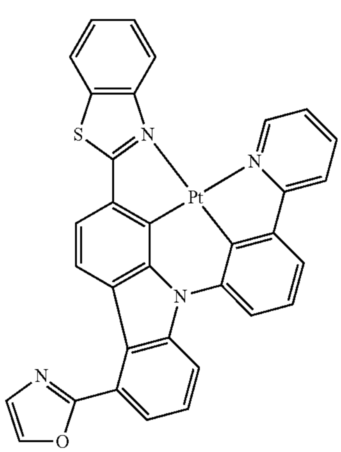
-continued
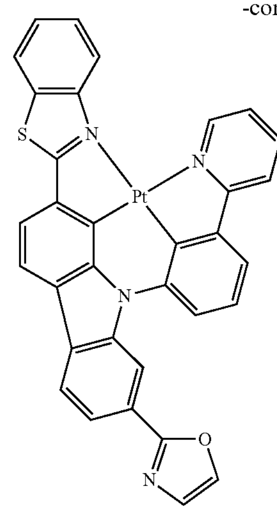
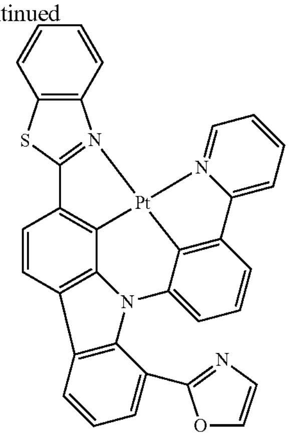
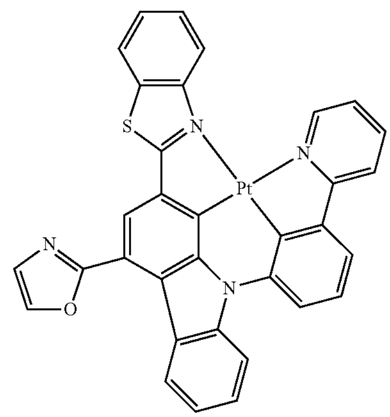
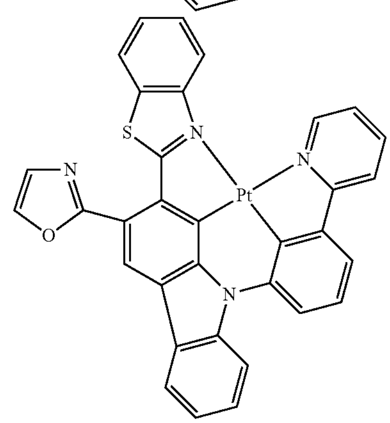
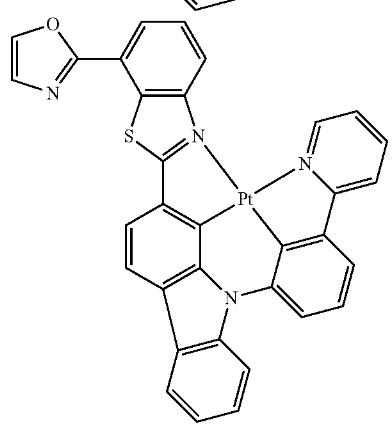

-continued
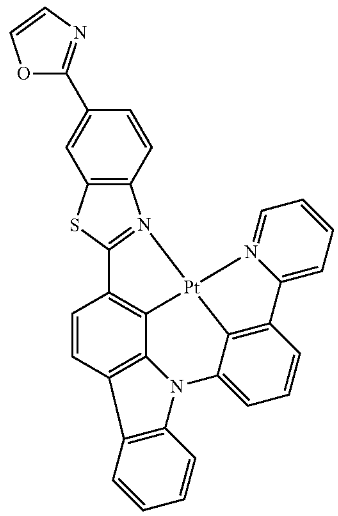
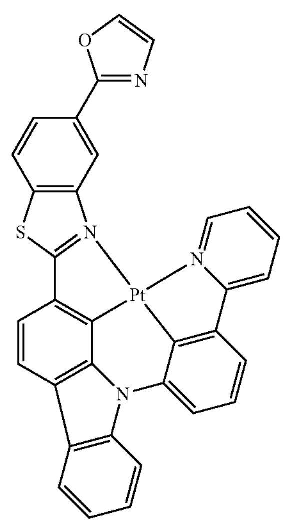
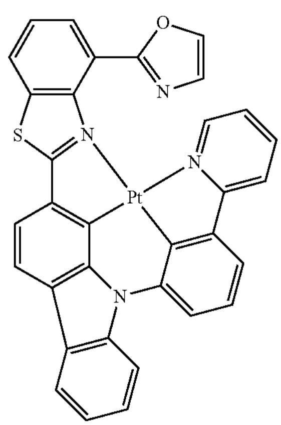
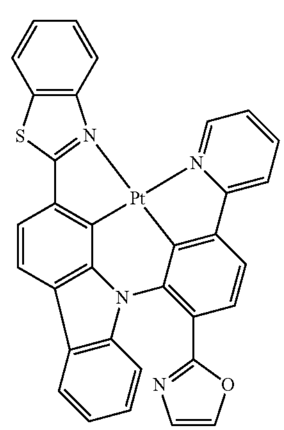
-continued
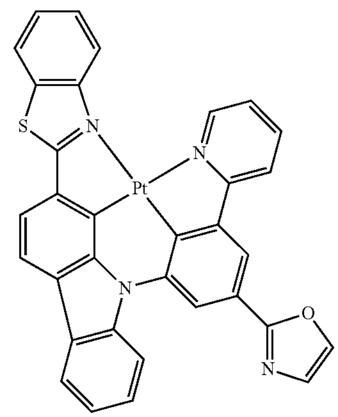
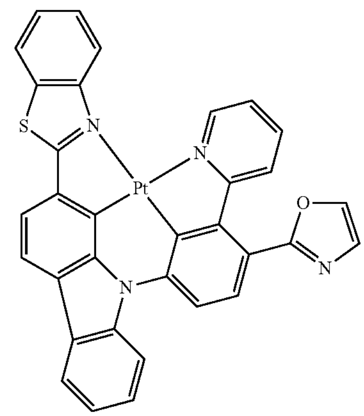
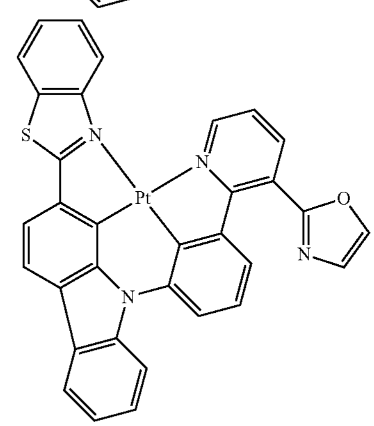
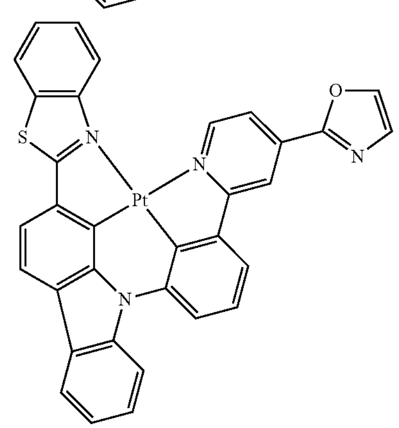

-continued
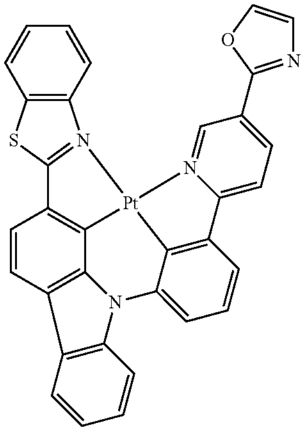
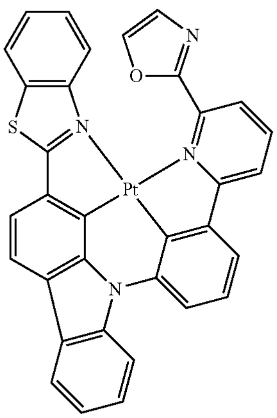
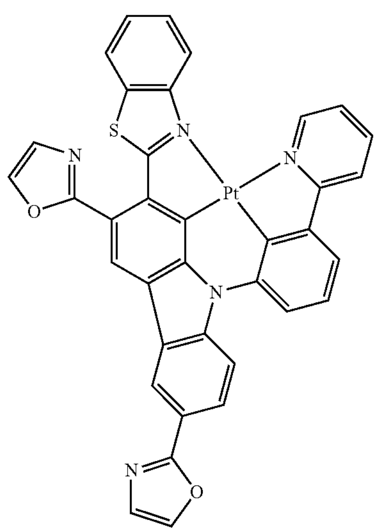
-continued
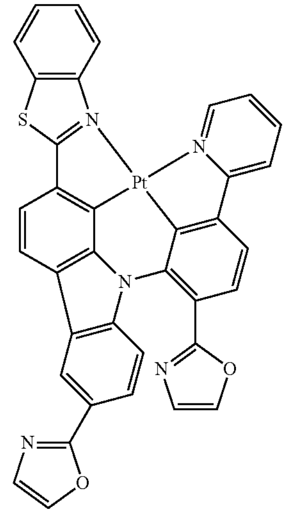
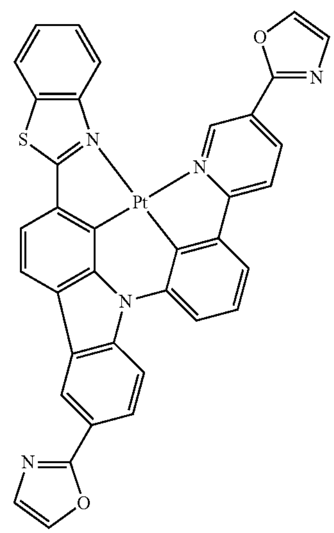
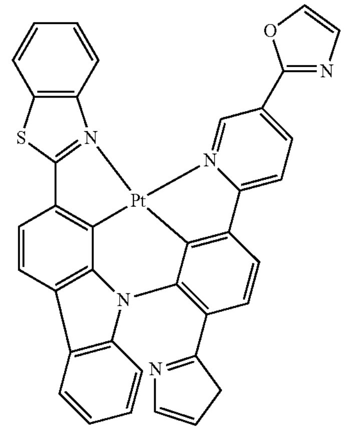

-continued
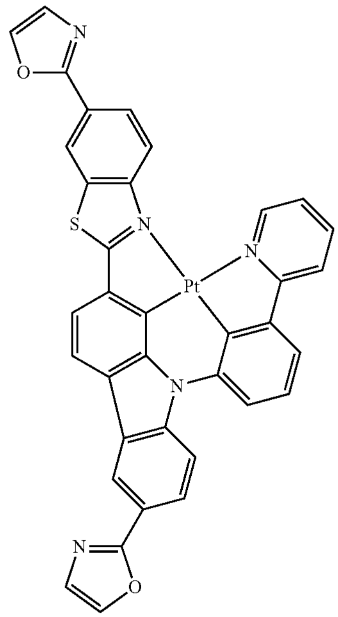
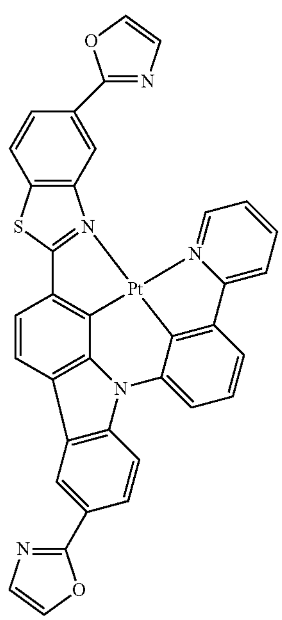
-continued
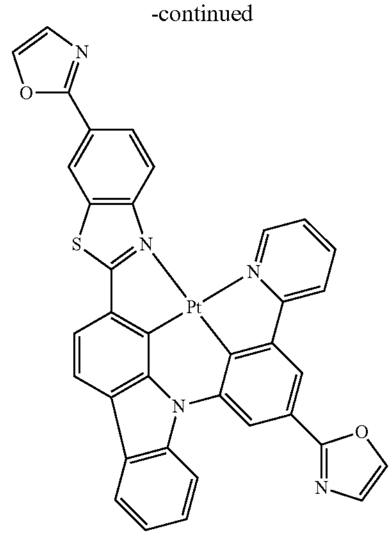
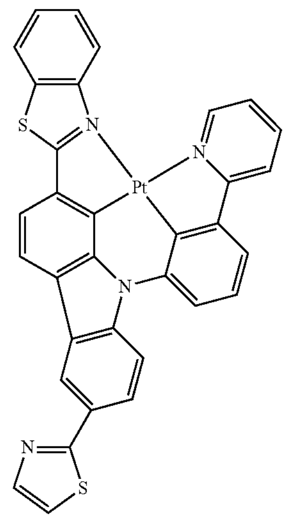
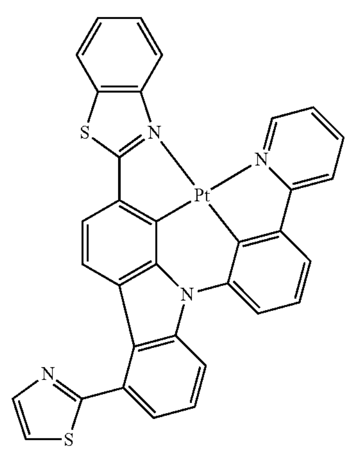

-continued
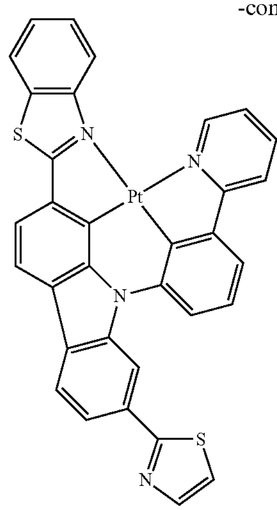
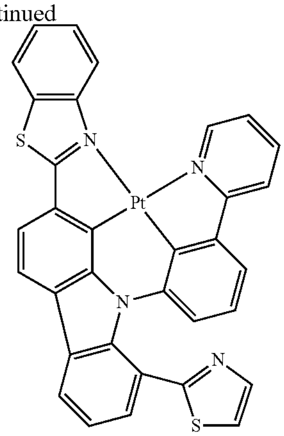
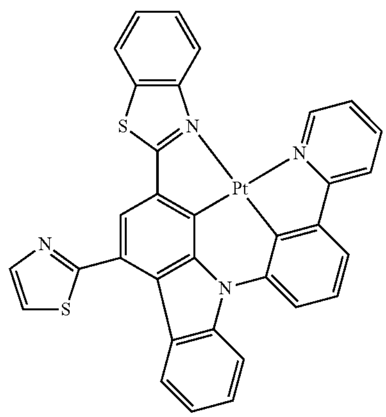
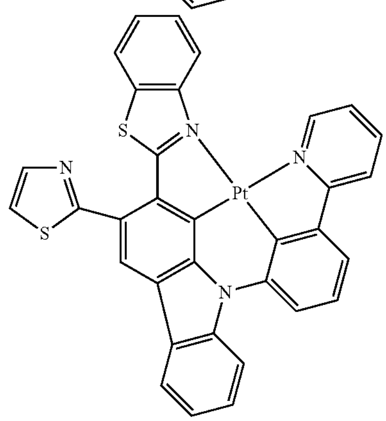
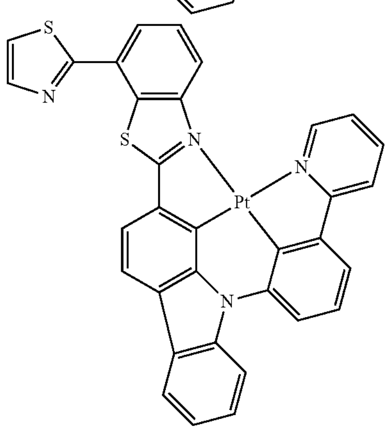
-continued
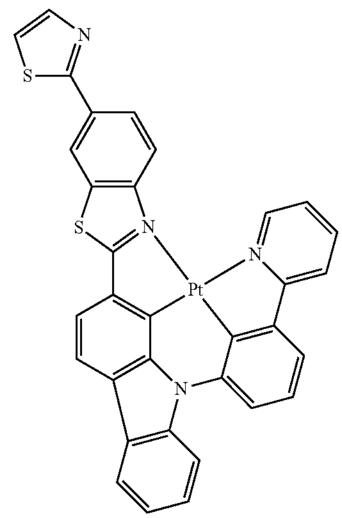
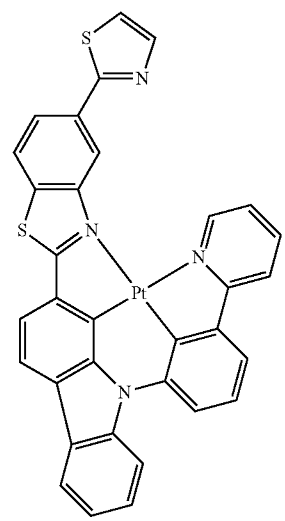
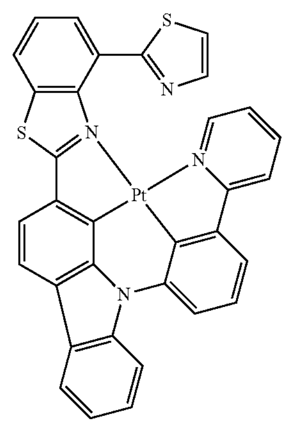
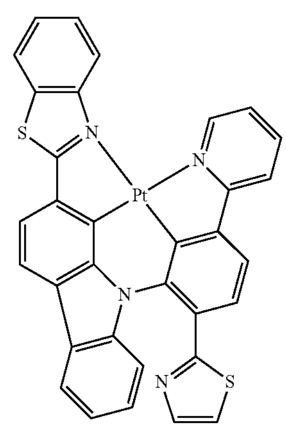

-continued
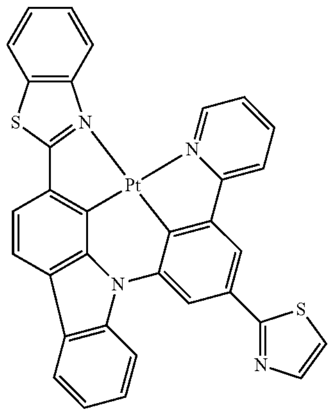
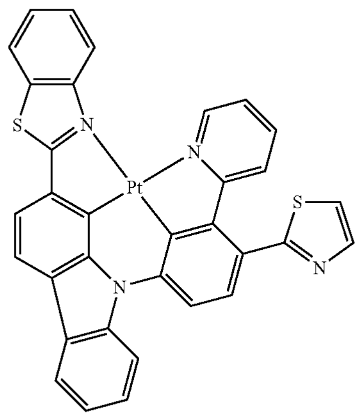
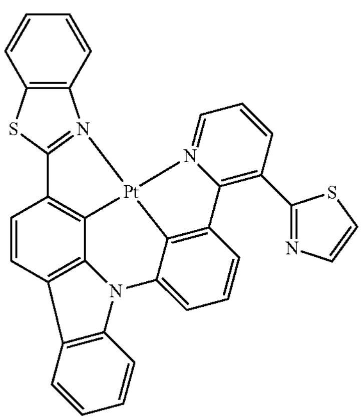
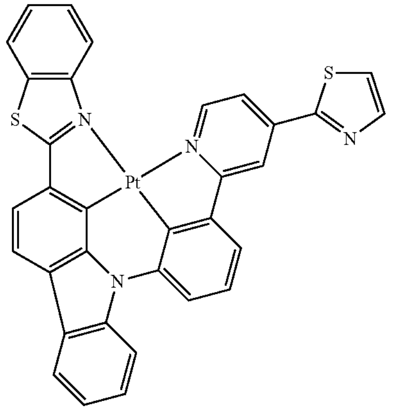
-continued
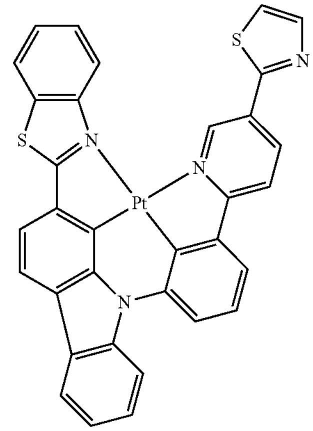
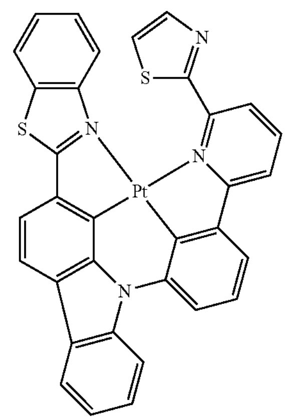
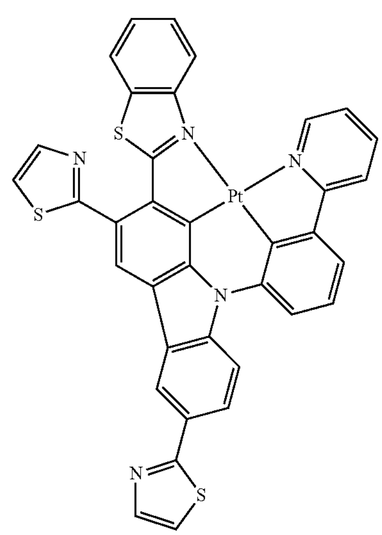

-continued
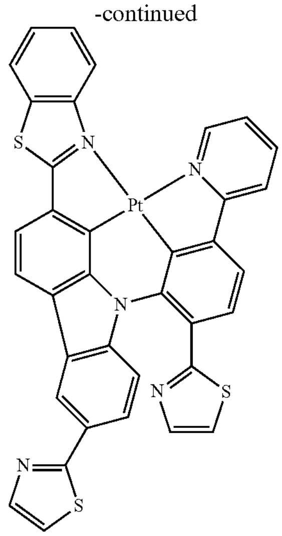
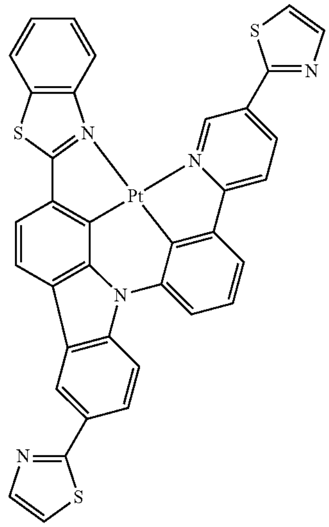
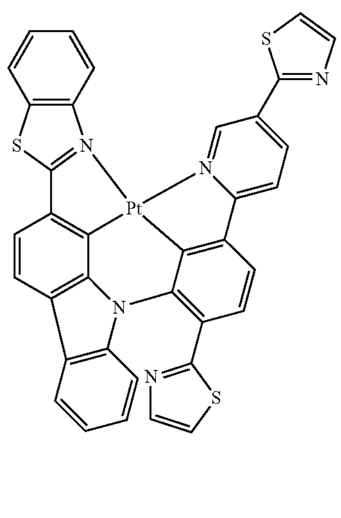
-continued
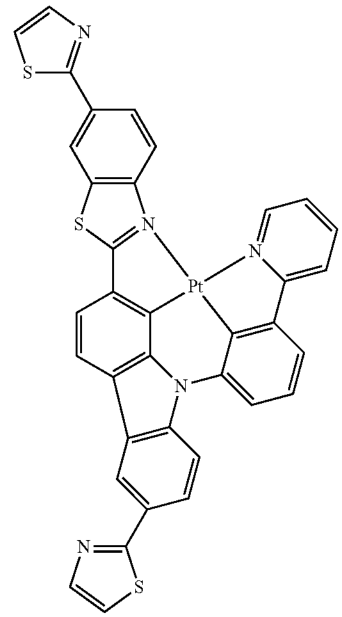
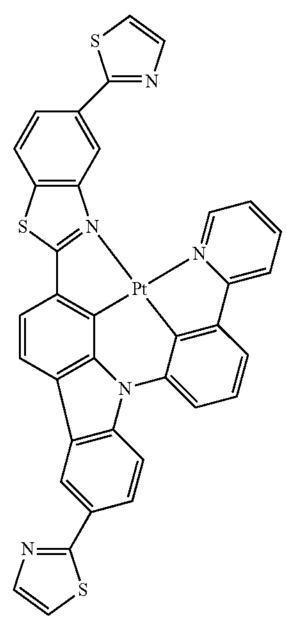

-continued
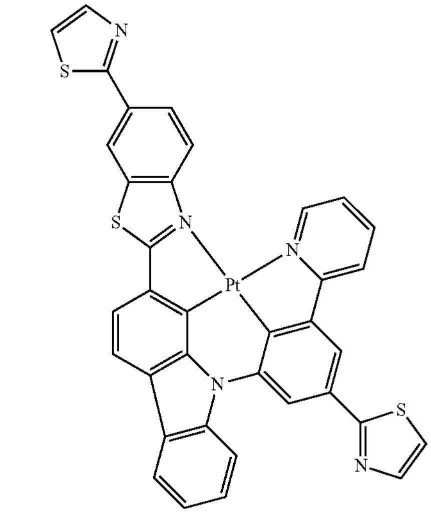
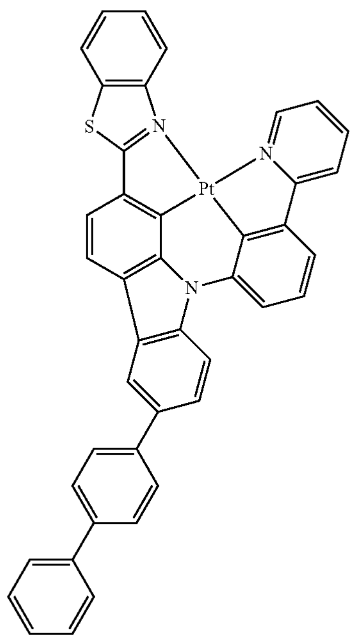
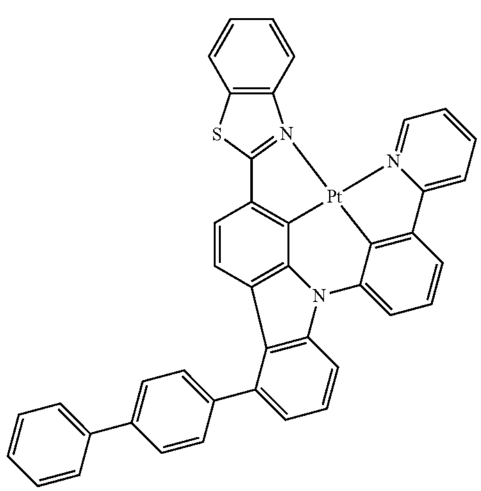
-continued
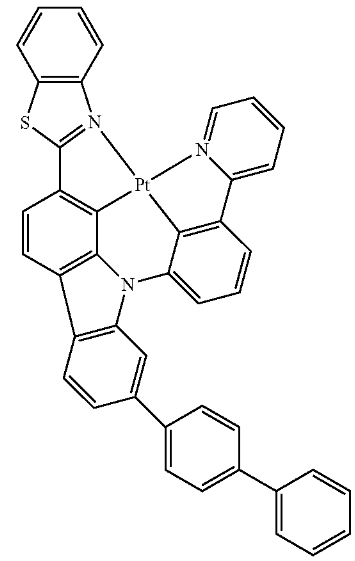
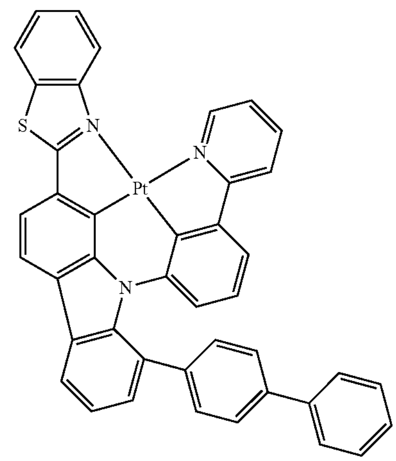
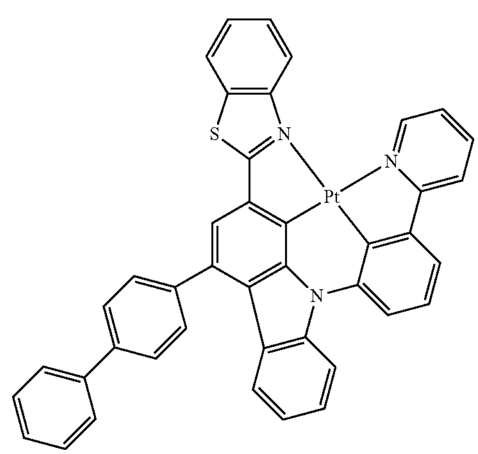

-continued
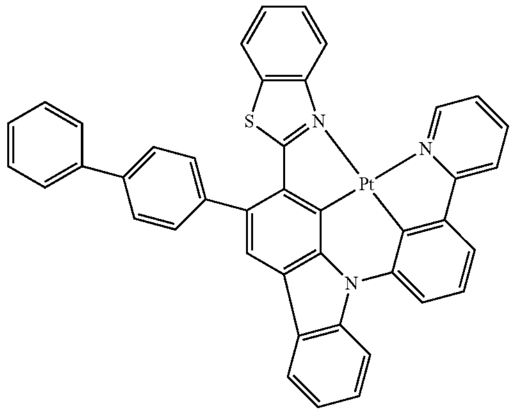
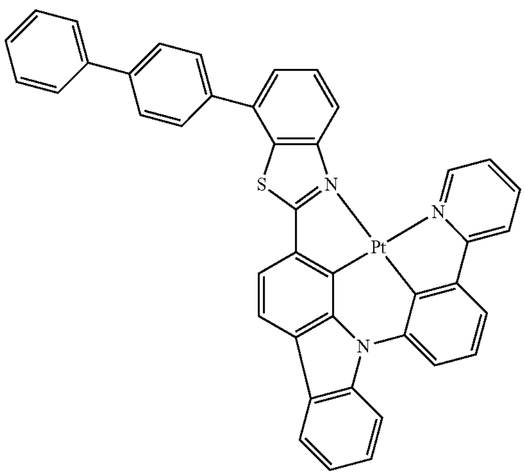
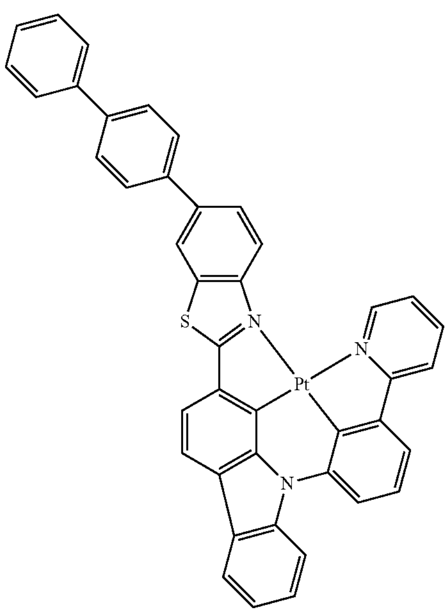
-continued
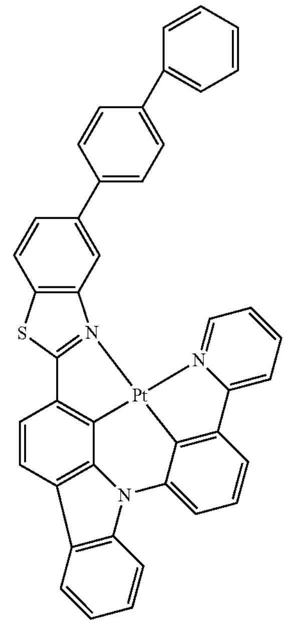
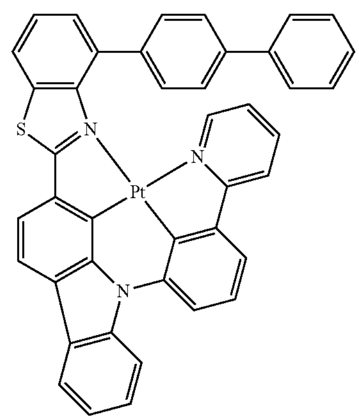
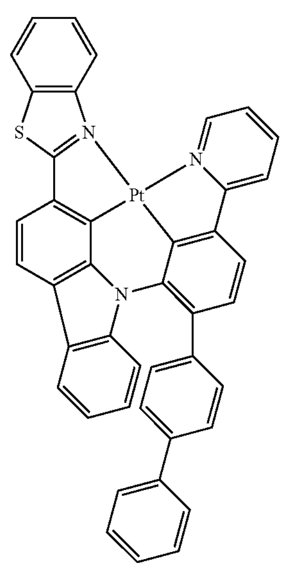

-continued
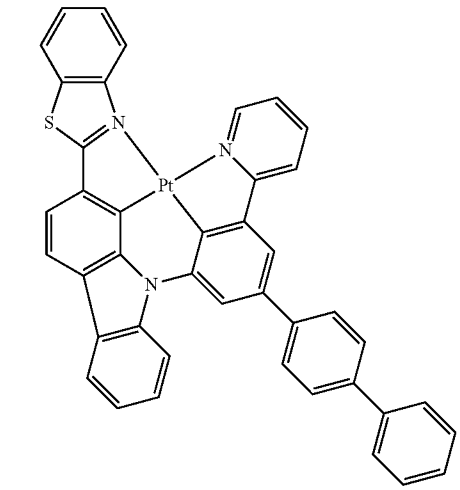
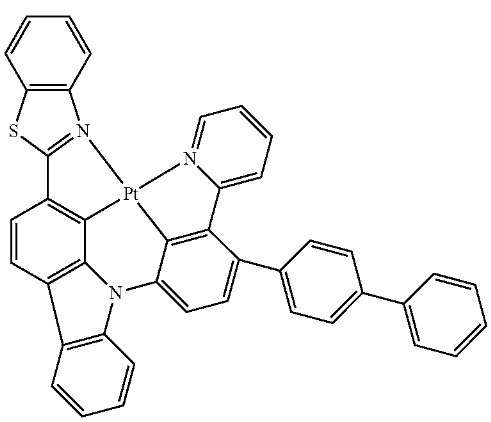
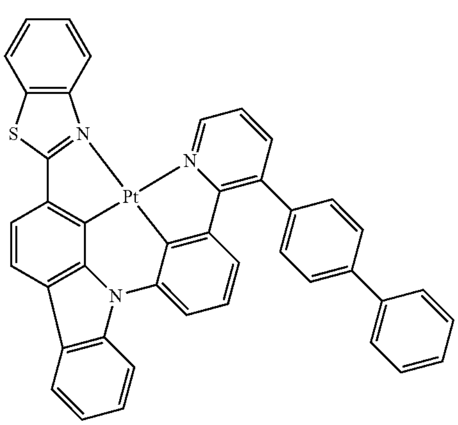
-continued
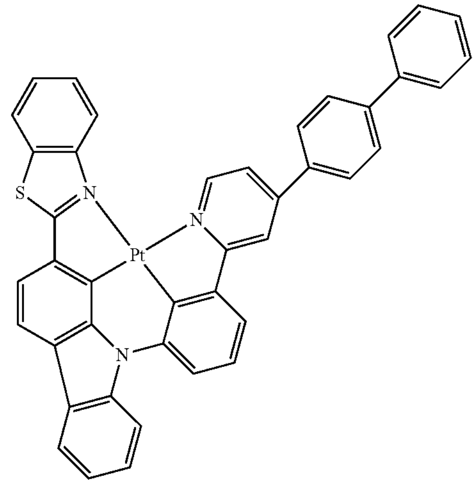
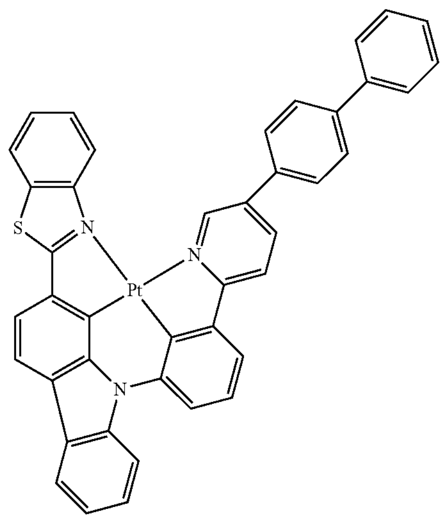
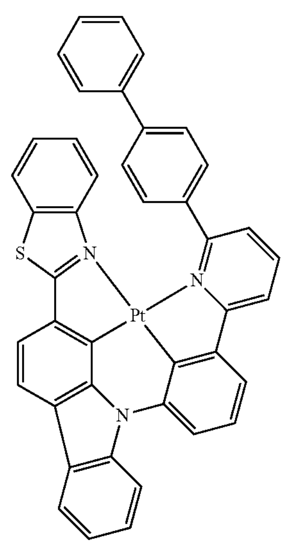

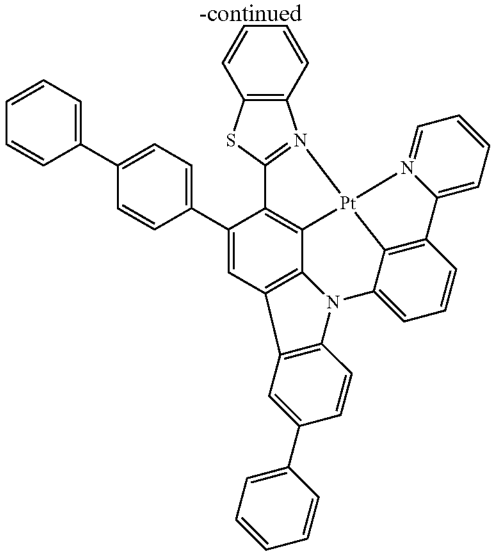
S
N
Pt
N
N
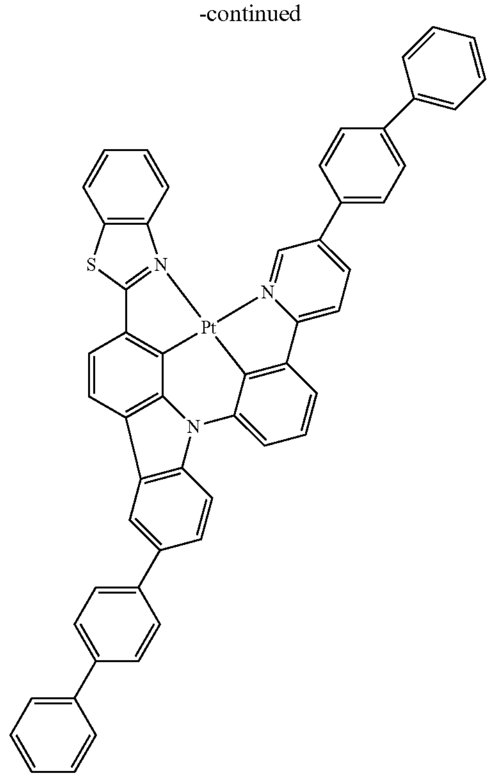
S
N
Pt
N
N
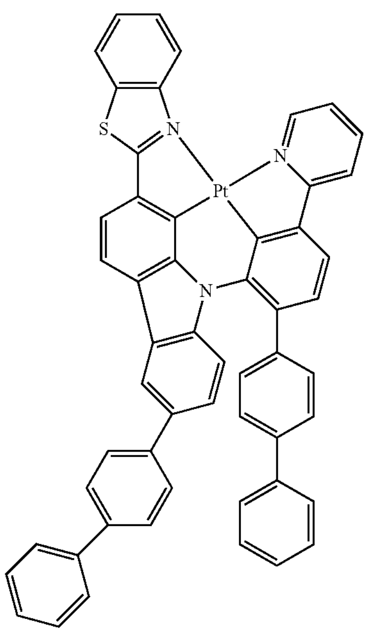
S
N
Pt
N
N
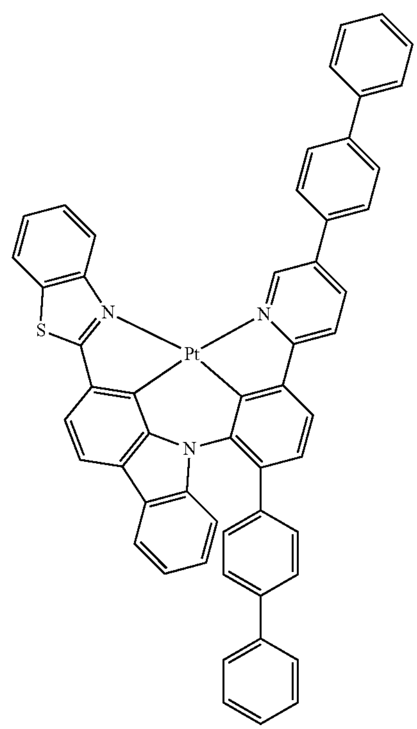
S
N
Pt
N
N -continued

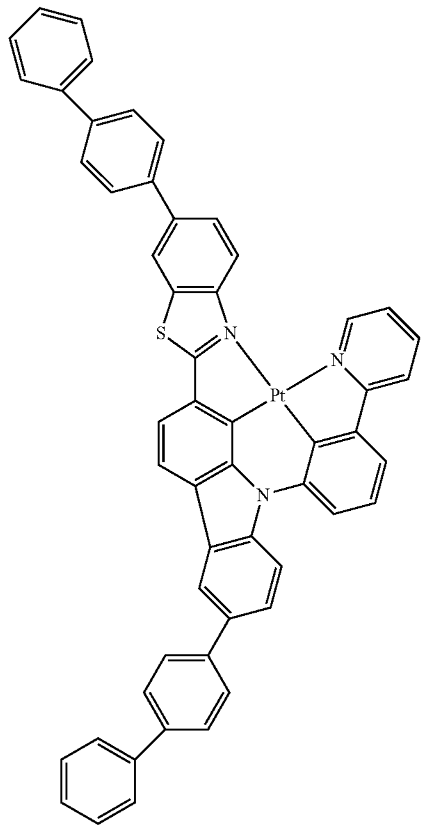

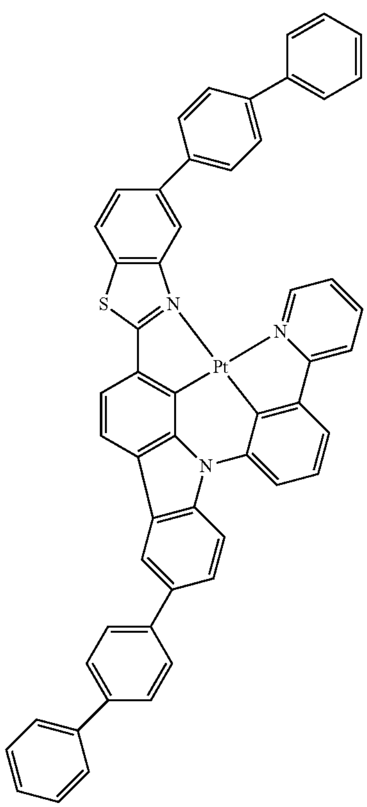

-continued

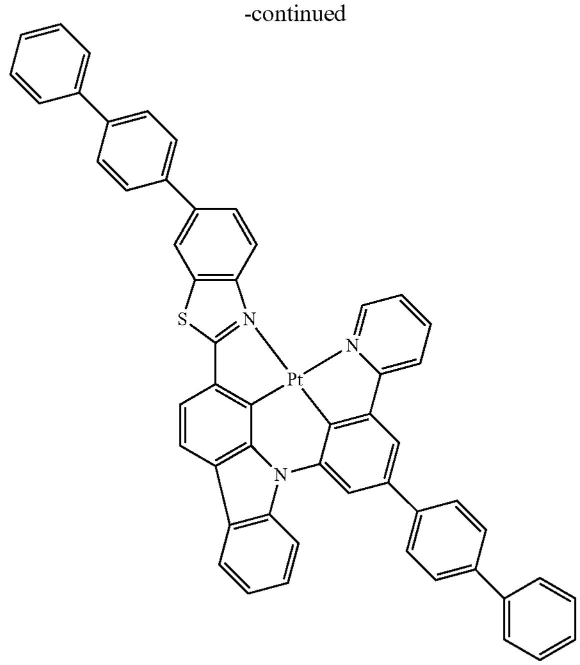

It is to be understood that present compounds/complexes, devices, and/or methods are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of compounds of the present disclosure, example methods and materials are now described.

Disclosed are the components to be used to prepare the compositions of this disclosure as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C is disclosed as well as a class of molecules D, E, and F and an example of a combination molecule, A-D is disclosed, then even if each is not individually recited each is individually and collectively contemplated meaning combinations A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed it is understood that each of these additional steps can be performed with any specific embodiment or combination of embodiments of the methods described herein.

As referred to herein, a linking atom or group connects two atoms such as, for example, an N atom and a C atom. A linking atom or group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dode cyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

"$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

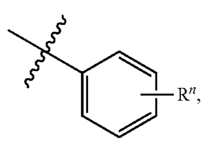

which is understood to be equivalent to a formula:

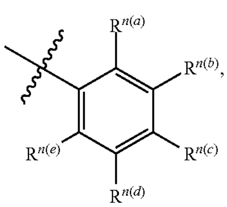

wherein n is typically an integer of 0 to 5. That is, $R^n$ is understood to be absent or to represent up to five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to $R^1$, $R^2$, $R^3$, $R^4$, $R^5$, $R^6$, etc. are made in chemical structures and moieties disclosed and described herein. Any description of $R^1$, $R^2$, $R^3$, $R^4$, $R^5$, $R^6$, etc. in the specification is applicable to any structure or moiety reciting $R^1$, $R^2$, $R^3$, $R^4$, $R^5$, $R^6$, etc. respectively.

The complexes disclosed herein are suited for use in a wide variety of devices, including, for example, optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Also disclosed herein are compositions including one or more complexes disclosed herein. The present disclosure provides light emitting device that include one or more complexes or compositions described herein. The light emitting device can be an OLED (e.g., a phosphorescent OLED device). The present disclosure also provides a photovoltaic device comprising one or more complexes or compositions described herein. Further, the present disclosure also provides a luminescent display device comprising one or more complexes or compositions described herein.

Compounds described herein can be used in a light emitting device such as an OLED. FIG. 1 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more complexes of the present disclosure optionally together with a host material. The host material can be any suitable host material known in the art. The emission color of an OLED is determined by the emission energy (optical energy gap) of the light processing material 108, which can be tuned by tuning the electronic structure of the emitting complexes, the host material, or both. Both the hole-transporting material in the HTL layer 106 and the electron-transporting material(s) in the ETL layer 110 may include any suitable hole-transporter known in the art.

Complexes described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

EXAMPLES

The following examples are put forth so as to provide those of ordinary skill in the art with a complete disclosure and description of how the complexes, compositions, articles, devices and/or methods claimed herein are made and evaluated, and are intended to be purely exemplary and are not intended to be limiting in scope. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation method of the complexes described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the complexes described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex.

$^{1}$H spectra were recorded at 400 MHz on Varian Liquid-State NMR instruments in $CDCl_3$ solutions and chemical shifts were referenced to residual protiated solvent. $^{1}$H NMR spectra were recorded with tetramethylsilane (δ=0.00 ppm) as internal reference. The following abbreviations (or combinations thereof) were used to explain $^{1}$H NMR multiplicities: s=singlet, d=doublet, t=triplet, q=quartet, p=quintet, m=multiplet, br=broad.

Example 1: Synthesis of PtN8ppy

Synthesis of 2-(1-methyl-1H-benzo[d]imidazol-2-yl)-9-(3-(pyridin-2-yl)phenyl)-9H-carbazole (N8ppy)

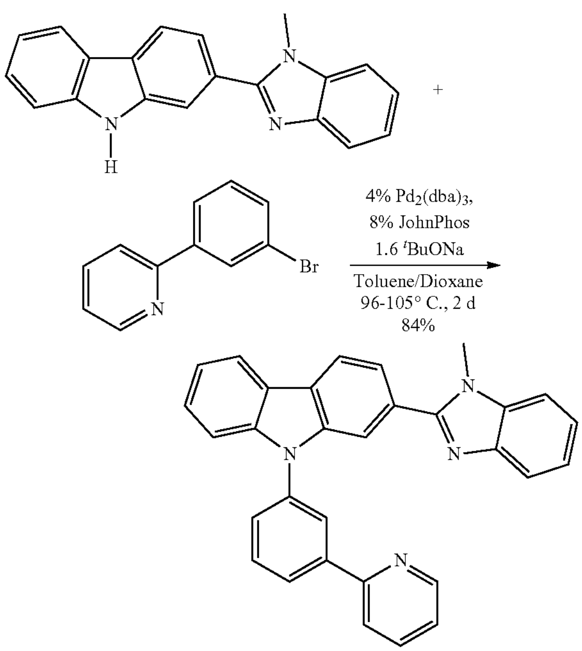

N8ppy Ligand 2-(1-methyl-1H-benzo[d]imidazol-2-yl)-9H-carbazole (200 mg, 0.67 mmol), 2-(3-bromophenyl)pyridine (173.2 mg, 0.74 mmol), $Pd_2(dba)_3$ (31 mg, 0.033 mmol), Johnphos (20.1 mg, 0.067 mmol), and Na(t-BuO) (100 mg, 1 mmol) were placed in a round-bottom three-neck flask under a nitrogen atmosphere, 10 mL of toluene and 10 mL dioxane was added, the mixture was stirred and refluxed for 2 days. After completion of the reaction, the resulting solution was washed with dichloromethane and water. The organic layer was collected, dried with $MgSO_4$, and separated by column, thus obtaining 2-(1-methyl-1H-benzo[d]imidazol-2-yl)-9-(3-(pyridin-2-yl) phenyl)-9H-carbazole (N8ppy) (230 mg, 76% yield). $^{1}$H NMR (DMSO-d6, 500 MHz): δ 8.68 (s, 1H), 8.46 (d, J=3.4 Hz, 1H), 8.41-8.35 (m, 2H), 8.28 (d, J=7.8 Hz, 1H), 8.10 (d, J=8.0 Hz, 1H), 7.90 (t, J=7.9 Hz, 2H), 7.85-7.73 (m, 3H), 7.65 (brs, 2H), 7.56-7.46 (m, 2H), 7.42-7.35 (m, 2H), 7.27 (t, J=7.5 Hz, 1H), 7.22 (brs, 1H), 3.93 (s, 3H).

Synthesis of PtN8ppy

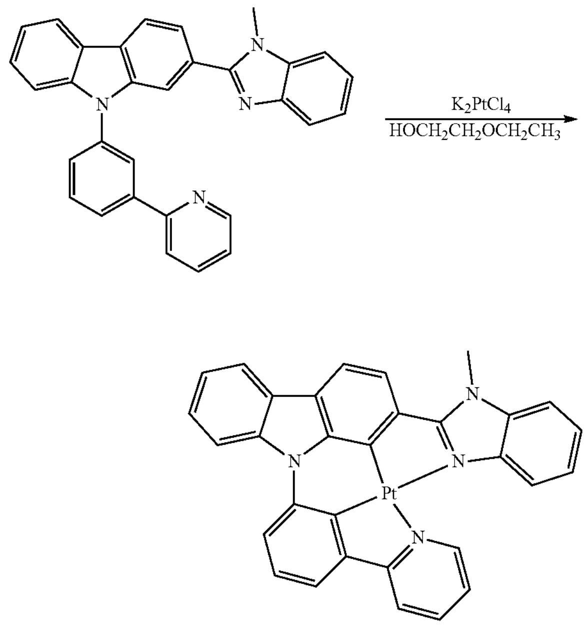

Figure 2:
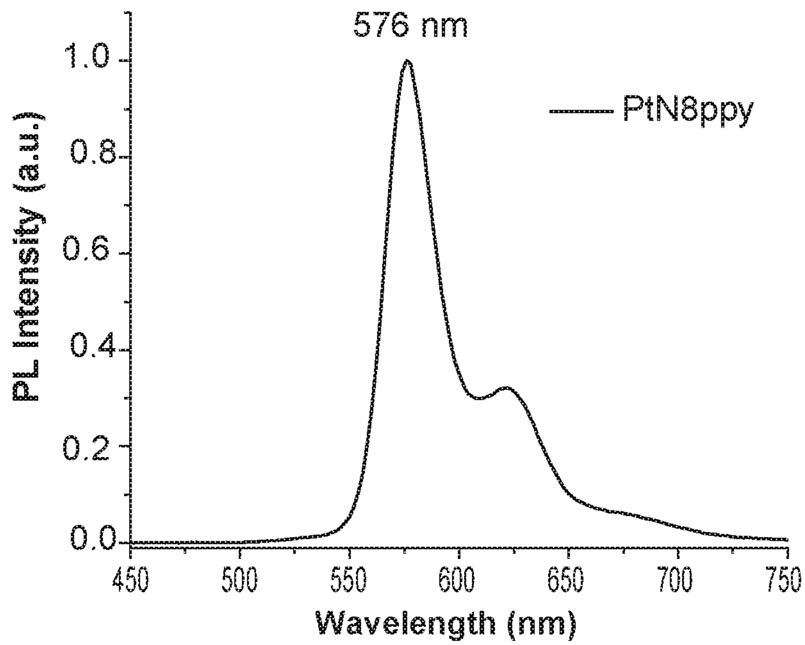
FIGS. 2 and 3 show photoluminescence spectra of exemplary complexes disclosed herein.

PtN8ppy 2-(1-methyl-1H-benzo[d]imidazol-2-yl)-9-(3-(pyridin-2-yl)phenyl)-9H-carbazole (100 mg, 0.22 mmol), potassium tetrachloroplatinate(II) $K_2PtCl_4$ (101.3 mg, 0.25 mmol), n-butylammonium bromide (32.2 mg, 0.1 mmol) and 2-ethoxyethan-1-ol (10 mL) were placed in a round-bottom flask under a nitrogen atmosphere. The mixture was stirred and refluxed for 2 days. After completion of the reaction, the resulting solution was washed with dichloromethane and water. The organic layer was collected, dried with $MgSO_4$, and purified by column chromatography (ethyl acetate: DCM=10:1 to 5:1) with $Al_2O_3$, thus obtaining PtN8ppy (90 mg, 63% yield) as a red solid. $^{1}$H NMR (DMSO-d6, 500 MHz): δ 9.44 (d, J=5.0 Hz, 1H), 8.33-8.24 (m, 3H), 8.19 (t, J=6.3 Hz, 1H), 8.12 (d, J=8.1 Hz, 1H), 8.01 (d, J=7.8 Hz, 1H), 7.96 (d, J=7.8 Hz, 1H), 7.91 (d, J=7.3 Hz, 1H), 7.87 (d, J=7.3 Hz, 1H), 7.78 (d, J=7.4 Hz, 1H), 7.68 (t, J=6.4 Hz, 1H), 7.53 (t, J=7.7 Hz, 1H), 7.48-7.37 (m, 3H), 7.31 (t, J=7.3 Hz, 1H), 4.37 (s, 3H). FIG. 2 shows photoluminescent intensity as a function of wavelength for PtN8ppy.

Example 2: Synthesis of PtN8ppy-P

Synthesis of 6-bromo-2-(1-methyl-1H-benzo[d]imidazol-2-yl)-9-(3-(pyridin-2-yl) phenyl)-9H-carbazole (BrN8ppy)

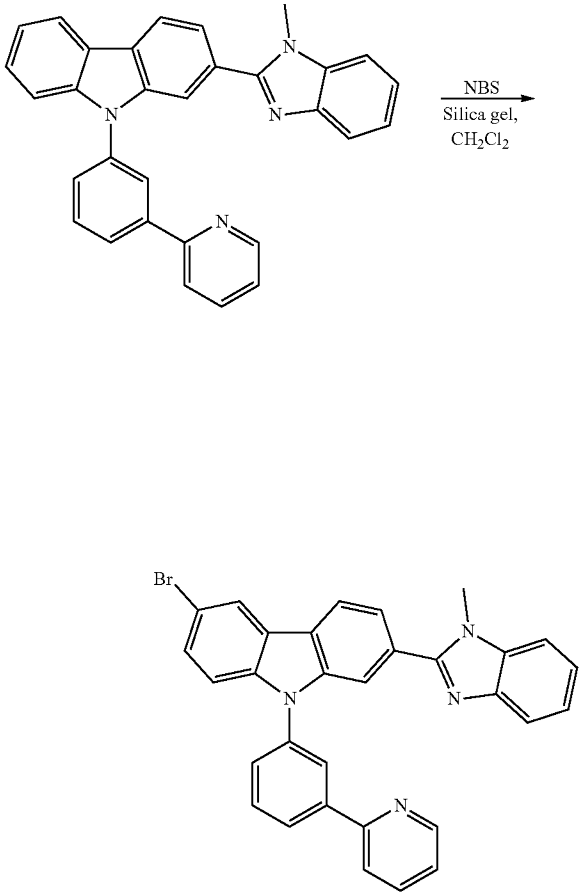

BrN8ppy

N-Bromosuccinimide (36 mg, 0.02 mol) was added to a solution of 2-(1-methyl-1H-benzo[d]imidazol-2-yl)-9-(3-(pyridin-2-yl)phenyl)-91H-carbazole (N8ppy) (90 mg, 0.2 mmol) and silica-gel (100 mg) in methylene chloride (5 mL). The reaction mixture was stirred at room temperature. Before extraction with water and Methylene chloride, the reaction mixture was filtered with Methylene chloride. The mixture of reaction was purified by column chromatography and recrystallization with ethanol (90 mg, 85% yield). $^1$H NMR (DMSO-d6, 500 MHz): δ 8.7-8.66 (m, 2H), 8.55 (d, J=8.3 Hz, 1H), 8.39 (s, 1H), 8.31 (d, J=7.8 Hz, 1H), 8.11 (d, J=8.3 Hz, 1H), 7.91 (t, J=7.9 Hz, 1H), 7.85-7.73 (m, 3H), 7.78 (d, J=7.9 Hz, 1H), 7.69-7.63 (m, 3H), 7.44 (t, J=8.8 Hz, 1H), 7.39 (t, J=5.9 Hz, 1H), 7.32 (t, J=7.5 Hz, 1H), 7.27 (t, J=7.5 Hz, 1H), 3.95 (s, 3H).

Synthesis of 2-(1-methyl-1H-benzo[d]imidazol-2-yl)-6-phenyl-9-(3-(pyridin-2-yl) phenyl)-9H-carbazole (N8ppy-P)

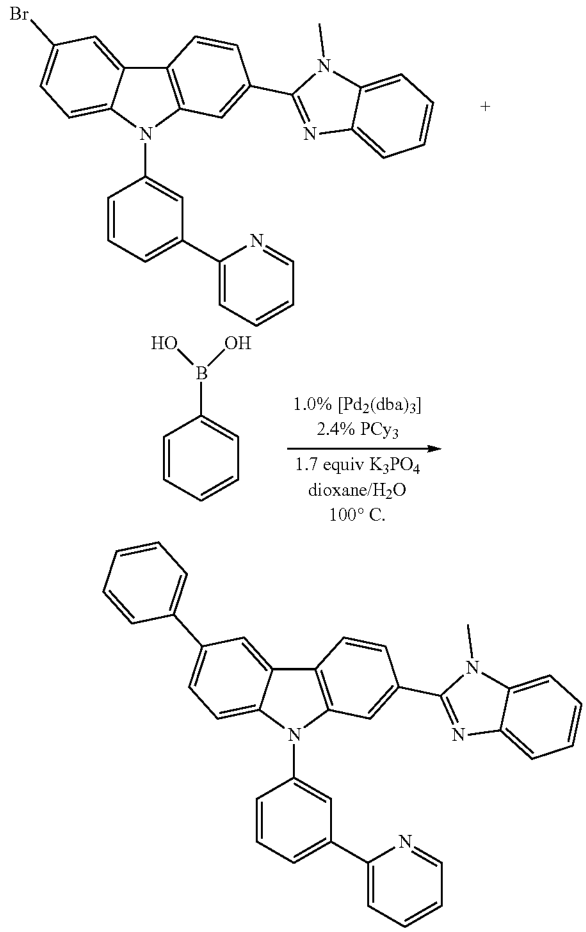

N8ppy-P Ligand

The benzoboric acid (117 mg, 1 mmol), $[Pd_2\text{-}(dba)_3]$(16 mg, 0.016 mmol), 6-bromo-2-(1-methyl-1H-benzo[d]imidazol-2-yl)-9-(3-(pyridin-2-yl)phenyl)-9H-carbazole (170 mg, 0.032 mmol) and $PCy_3HF_4$ (11.8 mg, 0.032 mmol) were added to a 25-mL Schlenk flask equipped with a stir bar in air. The flask was evacuated and refilled with argon five times. Dioxane (6 mL) and aqueous $K_3PO_4$ (136 mg, 2 mL, 0.64 mmol) were added by syringe. The Schlenk flask was sealed and heated in an oil bath at 100° C. for 18 h with vigorous stirring. The mixture was then filtered through a pad of silica gel (washing with EtOAc), the filtrate concentrated under reduced pressure, and the aqueous residue extracted three times with EtOAc. The combined extracts were dried over anhydrous $MgSO_4$, filtered, and concentrated. The residue was then purified by column chromatography on silica gel (140 mg, 83% yield).

Synthesis of PtN8ppy-P

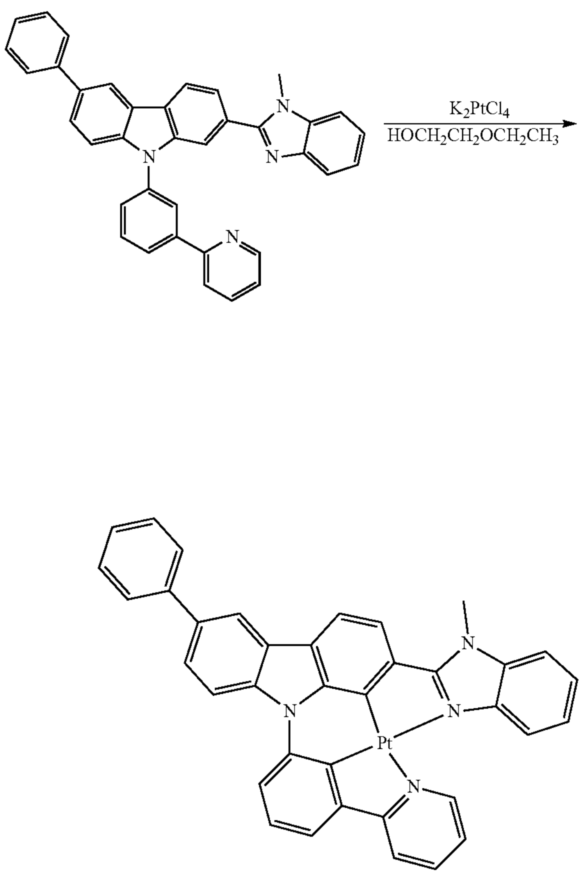

Figure 3:
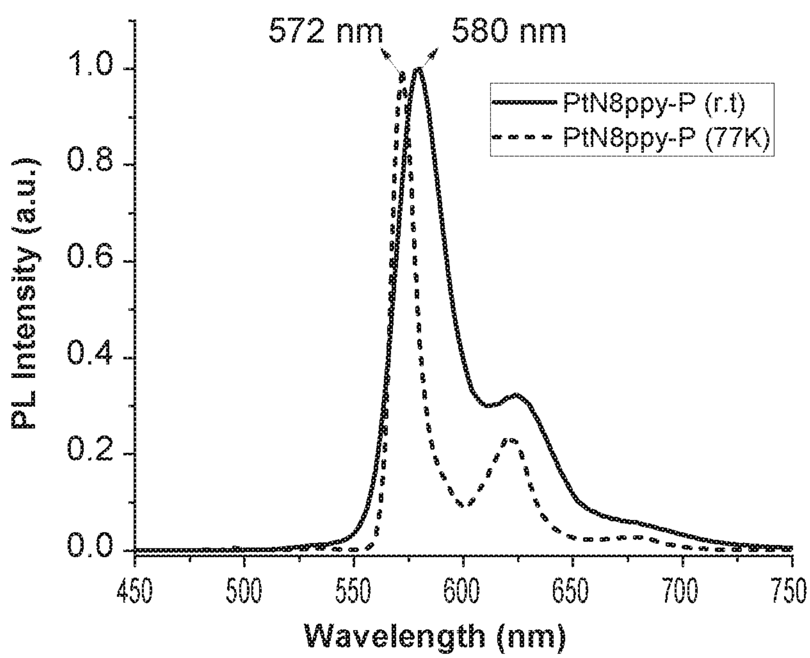

PtN8ppy-P 2-(1-methyl-1H-benzo[d]imidazol-2-yl)-6-phenyl-9-(3-(pyridin-2-yl)phenyl)-9H-carbazole (100 mg, 0.19 mmol), potassium tetrachloroplatinate(II) $K_2PtCl_4$ (86.7 mg, 0.21 mmol), n-butylammonium bromide (32.2 mg, 0.1 mmol) and 2-ethoxyethan-1-ol (10 mL) were placed in a round-bottom flask under a nitrogen atmosphere. The mixture was stirred and refluxed for 2 days. After completion of the reaction, the resulting solution was washed with dichloromethane and water. The organic layer was collected, dried with $MgSO_4$, and purified by column chromatography (ethyl acetate:DCM=10:1 to 5:1) with $Al_2O_3$, thus obtaining PtN8ppy-P (85 mg, 62% yield) as a red solid. $^1H$ NMR (DMSO-d6, 500 MHz): δ 9.43 (d, J=4.9 Hz, 1H), δ 8.6 (d, J=1.5 Hz, 1H), 8.36 (d, J=9.3 Hz, 1H), 8.30 (d, J=8.3 Hz, 1H), 8.21-8.1 (m, 3H), 7.98 (d, J=8.2 Hz, 1H), 7.91 (d, J=7.9 Hz, 1H), 7.89-7.82 (m, 4H), 7.78 (d, J=7.8 Hz, 1H), 7.68 (t, J=6.1 Hz, 1H), 7.53 (t, J=7.8 Hz, 2H), 7.48-7.37 (m, 4H), 4.37 (s, 3H). FIG. 3 shows photoluminescent intensity of PtN8ppy-P at room temperature and 77K.

Example 3: Synthesis of PtN8N-ben

Synthesis of 5-(1-methyl-1H-benzo[d]imidazol-2-yl)-7-(9-(pyridin-2-yl)-9H-carbazol-2-yl)-7H-benzo[c]carbazole (N8N-ben)

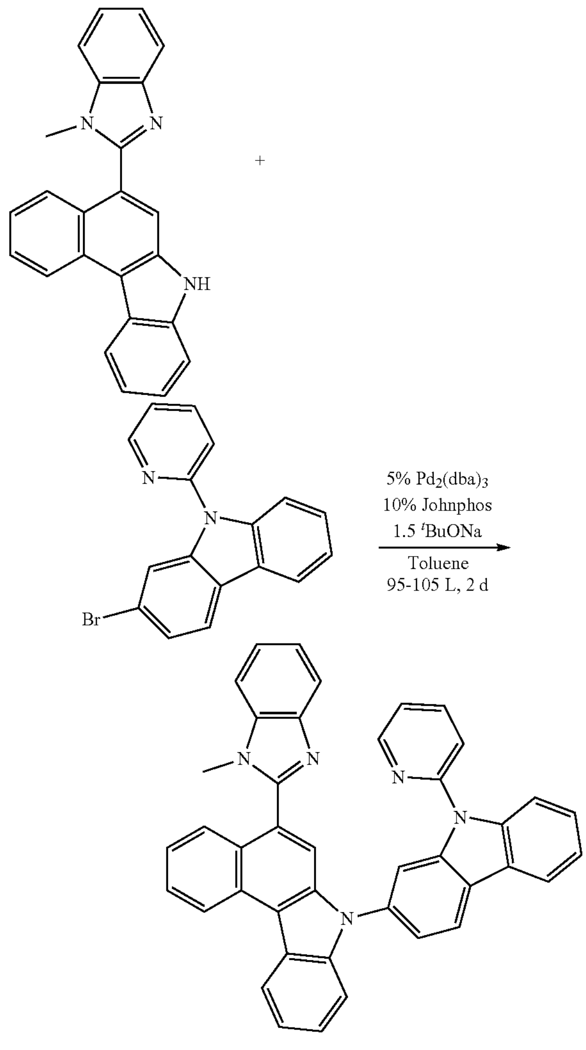

5-(1-methyl-1H-benzo[d]imidazol-2-yl)-7H-benzo[c]carbazole (300 mg, 0.86 mmol), 2-bromo-9-(pyridin-2-yl)-9H-carbazole (418 mg, 1.30 mmol), $Pd_2(dba)_3$ (39 mg, 0.043 mmol), Johnphos (26 mg, 0.086 mmol), and Na(t-BuO) (124 mg, 1.29 mmol) were placed in a round-bottom three-neck flask under a nitrogen atmosphere, 10 mL of toluene was added, the mixture was stirred and refluxed for 2 days. After completion of the reaction, the resulting solution was washed with dichloromethane and water. The organic layer was collected, dried with $MgSO_4$, and separated by column, thus obtaining 5-(1-methyl-1H-benzo[d]imidazol-2-yl)-7-(9-(pyridin-2-yl)-9H-carbazol-2-yl)-7H-benzo[c]carbazole (N8N-ben) (355 mg, 70% yield). 1H NMR (DMSO-d6, 500 Hz) δ 9.06 (d, J=8.3 Hz, 1H), 8.85 (d, J=7.9 Hz, 1H), 8.65 (d, J=3.7 Hz, 1H), 8.56 (d, J=8.2 Hz, 1H), 8.37 (d, J=7.8 Hz, 1H), 8.10 (s, 1H), 8.07 (t, J=7.9 Hz, 1H), 7.90-7.81 (m, 5H), 7.71 (d, J=7.8 Hz, 1H), 7.65 (dd, J=8.1, 1.7 Hz, 1H), 7.62-7.57 (m, 2H), 7.57-7.47 (m, 4H), 7.46-7.38 (m, 2H), 7.29 (dt, J=24.2, 7.6 Hz, 2H), 3.57 (s, 3H).

Synthesis of PtN8N-ben

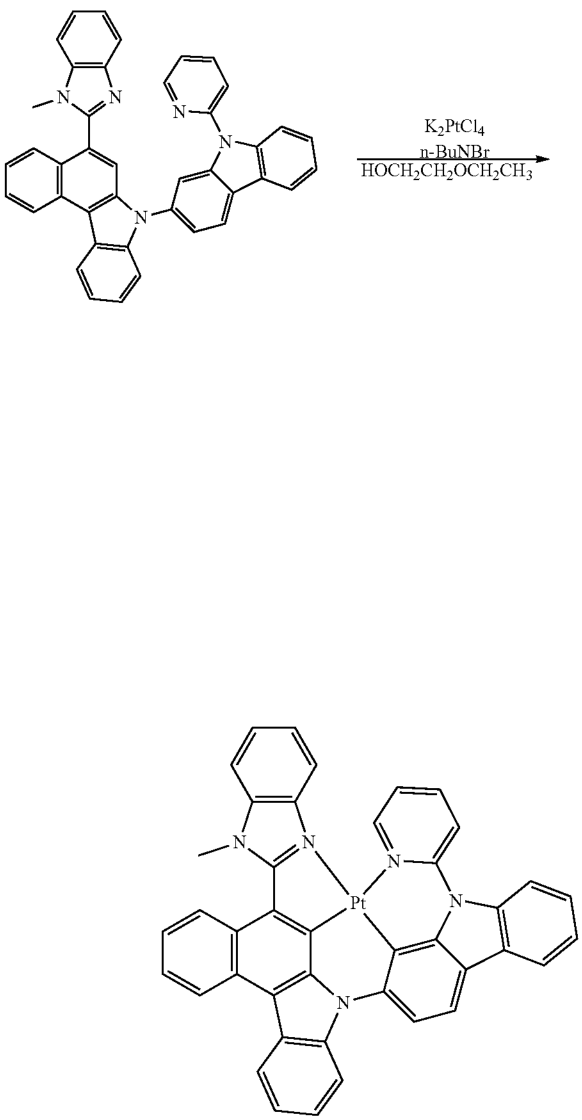

5-(1-methyl-1H-benzo[d]imidazol-2-yl)-7-(9-(pyridin-2-yl)-9H-carbazol-2-yl)-7H-benzo[c]carbazole (100 mg, 0.17 mmol), potassium tetrachloroplatinate(II) $K_2PtCl_4$ (84 mg, 0.20 mmol), n-butylammonium bromide (5 mg, 0.017 mmol) and 2-ethoxyethanol (10 mL) were placed in a round-bottom flask under a nitrogen atmosphere. The mixture was stirred and refluxed for 3 days. After completion of the reaction, the resulting solution was washed with dichloromethane and water. The organic layer was collected, dried with $MgSO_4$, and purified by column with $Al_2O_3$, thus obtaining PtN8N-ben as a red solid.

Example 4: Synthesis of PtN8N'

Synthesis of 9,10-dihydro-9,9-dimethyl-3-(2-(1-methyl-1H-benzo[d]imidazol-2-yl)-9H-carbazol-9-yl)-10-(pyridin-2-yl)acridine (N8N')

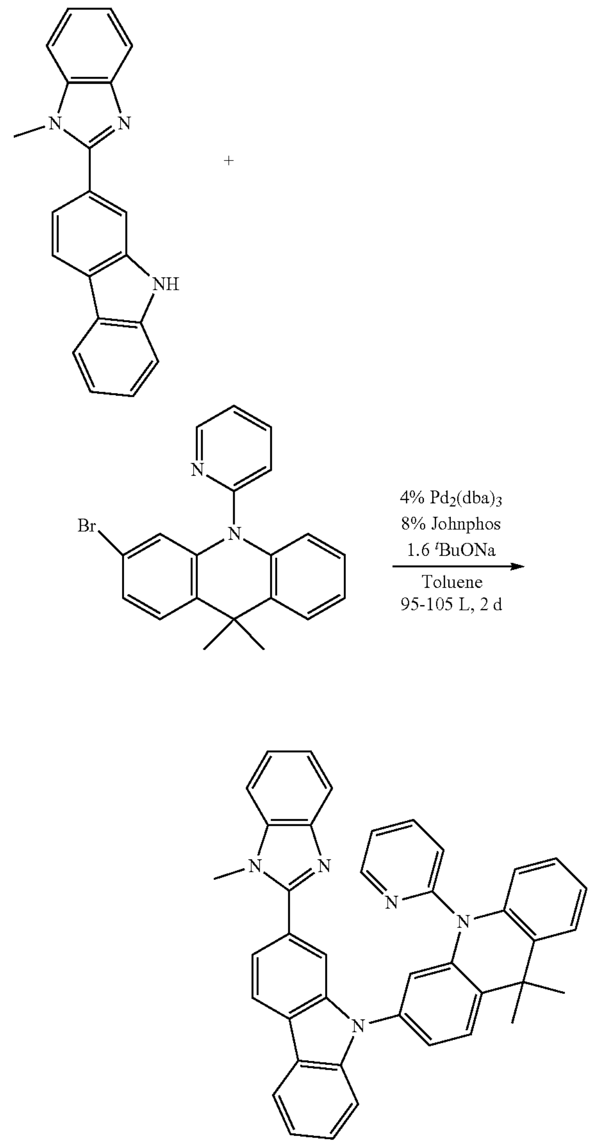

2-(1-methyl-1H-benzo[d]imidazol-2-yl)-9H-carbazole (200 mg, 0.67 mmol), 3-bromo-9,10-dihydro-9,9-dimethyl-10-(pyridin-2-yl)acridine (269.5 mg, 0.74 mmol), $Pd_2(dba)_3$ (31 mg, 0.033 mmol), Johnphos (20 mg, 0.067 mmol), and Na(t-BuO) (100 mg, 1 mmol) were placed in a round-bottom three-neck flask under a nitrogen atmosphere, 20 mL of toluene was added, the mixture was stirred and refluxed for 2 days. After completion of the reaction, the resulting solution was washed with dichloromethane and water. The organic layer was collected, dried with $MgSO_4$, and separated by column, thus obtaining 9,10-dihydro-9,9-dimethyl-3-(2-(1-methyl-1H-benzo[d]imidazol-2-yl)-9H-carbazol-9-yl)-10-(pyridin-2-yl)acridine (N8N') (280 mg, 72% yield).

Synthesis of PtN8N'

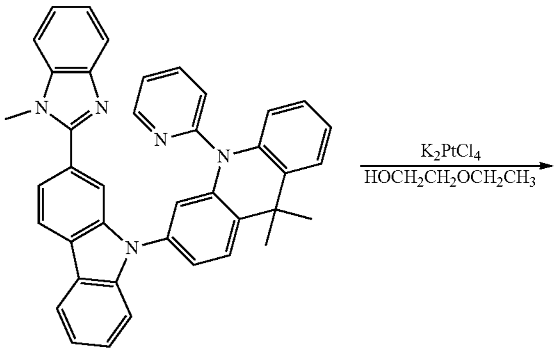

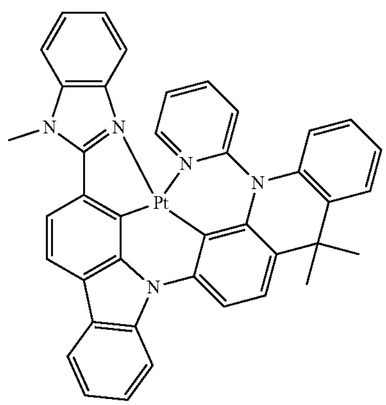

9,10-dihydro-9,9-dimethyl-3-(2-(1-methyl-1H-benzo[d]imidazol-2-yl)-9H-carbazol-9-yl)-10-(pyridin-2-yl)acridine (200 mg, 0.34 mmol), potassium tetrachloroplatinate(II) $K_2PtCl_4$ (157 mg, 0.38 mmol), water (3 mL) and 2-ethoxyethanol (12 mL) were placed in a round-bottom flask under a nitrogen atmosphere. The mixture was stirred and refluxed for 3 days. After completion of the reaction, the resulting solution was washed with dichloromethane and water. The organic layer was collected, dried with $MgSO_4$, and purified by column with $Al_2O_3$, thus obtaining PtN8N'. 1H NMR (DMSO-d6, 500 Hz) δ 8.99 (d, J=4.2 Hz, 1H), 8.22 (d, J=7.6 Hz, 1H), 8.15 (d, J=8.5 Hz, 1H), 8.05 (t, J=7.8, 1H), 7.91 (dd, J=32.9, 8.1 Hz, 2H), 7.83 (t, J=7.9 Hz, 2H), 7.58 (d, J=6.9 Hz, 1H), 7.49 (t, J=8.0 Hz, 1H), 7.39 (d, J=8.7 Hz, 1H), 7.36 (t, J=8.0 Hz, 1H), 7.32-7.14 (m, 8H), 4.34 (s, 3H), 1.34 (s, 3H).

A number of embodiments have been described. Nevertheless, it will be understood that various modifications may be made without departing from the spirit and scope of the disclosure. Accordingly, other embodiments are within the scope of the following claims.

What is claimed is:

1. A complex represented by Formula I:

Formula I

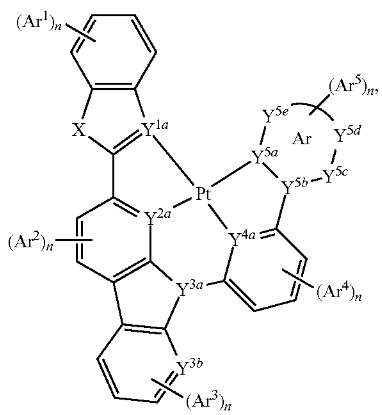

wherein:

each $Ar^1$, $Ar^2$, $Ar^3$, $Ar^4$, and $Ar^5$ present independently represents a substituted or unsubstituted aryl or heterocyclic aryl;

each n is independently an integer of 0 to 4, as limited by valence;

X represents O, S, $NR^{1a}$, $SiR^{1b}R^{1c}$, or $CR^{1d}R^{1e}$, where each of $R^{1a}$, $R^{1b}$, $R^{1c}$, $R^{1d}$, and $R^{1e}$ independently represents substituted or unsubstituted $C_1$-$C_4$ alkyl;

$Y^{1a}$, $Y^{2a}$, $Y^{3b}$, and $Y^{4a}$ each independently represents N or C;

$Y^{3a}$ represents N, $CR^{2a}$, or $SiR^{2b}$, where $R^{2a}$ and $R^{2b}$ represent hydrogen or substituted or unsubstituted $C_1$-$C_4$ alkyl, aryl, or heterocyclic aryl;

$Y^{5a}$ and $Y^{5b}$ each independently represents C or N; and $Y^{5c}$, $Y^{5d}$, and $Y^{5e}$ each independently represents C, N, O, or S;

provided that when the ring comprising $Y^{5a}$ through $Y^{5e}$ represents pyridine, then at least one of $Ar^1$, $Ar^2$, $Ar^3$, $Ar^4$, and $Ar^5$ is present.

2. The complex of claim 1, wherein at least one of $Ar^1$, $Ar^2$, $Ar^3$, $Ar^4$, and $Ar^5$ is present.

3. The complex of claim 2, wherein one of $Ar^1$, $Ar^2$, $Ar^3$, $Ar^4$, and $Ar^5$ is present.

4. The complex of claim 2, wherein two of $Ar^1$, $Ar^2$, $Ar^3$, $Ar^4$, and $Ar^5$ are present.

5. The complex of claim 4, wherein $Ar^1$ and $Ar^2$; $Ar^1$ and $Ar^3$; $Ar^1$ and $Ar^4$; $Ar^1$ and $Ar^5$; $Ar^2$ and $Ar^3$; $Ar^2$ and $Ar^4$; $Ar^2$ and $Ar^5$; $Ar^3$ and $Ar^4$; $Ar^3$ and $Ar^5$; or $Ar^4$ and $Ar^5$ are present.

6. The complex of claim 2, wherein three of $Ar^1$, $Ar^2$, $Ar^3$, $Ar^4$, and $Ar^5$ are present.

7. The complex of claim 6, wherein $Ar^1$, $Ar^2$, and $Ar^3$; $Ar^1$, $Ar^2$, and $Ar^4$; $Ar^1$, $Ar^2$, and $Ar^5$; $Ar^3$, and $Ar^4$; $Ar^3$, and $Ar^5$; $Ar^4$, and $Ar^5$; $Ar^2$, $Ar^3$, and $Ar^4$; $Ar^2$, $Ar^3$, and $Ar^5$; $Ar^2$, $Ar^4$, and $Ar^5$; or $Ar^3$, $Ar^4$, and $Ar^5$ are present.

8. The complex of claim 2, wherein four of $Ar^1$, $Ar^2$, $Ar^3$, $Ar^4$, and $Ar^5$ are present.

9. The complex of claim 8, wherein $Ar^1$, $Ar^2$, $Ar^3$, and $Ar^4$; $Ar^1$, $Ar^2$, $Ar^3$, and $Ar^5$; $Ar^1$, $Ar^2$, $Ar^4$, and $Ar^5$; $Ar^3$, $Ar^4$, and $Ar^5$; or $Ar^2$, $Ar^3$, $Ar^4$, and $Ar^5$ are present.

10. The complex of claim 1, wherein each $Ar^1$, $Ar^2$, $Ar^3$, $Ar^4$, and $Ar^5$ present independently represents pyrrolyl, furanyl, thiophenyl, imidazolyl, pyrazolyl, oxazolyl, isooxazolyl, thiazolyl, isothiazolyl, trazolyl, furazanyl, oxadiazolyl, thidiazolyl, dithiazolyl, tetrazolyl, phenyl, pyridinyl, pyranyl, thiopyranyl, diazinyls, oxazinyls, thiazinyls, dioxinyls, dithiinyls, triazinyls, tetrazinyls, pentazinyls, pyrimidyl, pyridazinyl, pyrazinyl, biphenyl, naphthyl, fluorenyl, carbazolyl, phenothiazinyl, acridinyl, and dihydroacridinyl.

11. The complex of claim 1, wherein the complex is selected from one of the following structures, where Z represents O, S, NR, PR, CRR', or Si RR', where R and R' each independently represents substituted or unsubstituted $C_1$-$C_4$ alkyl, aryl, or heterocyclic aryl:

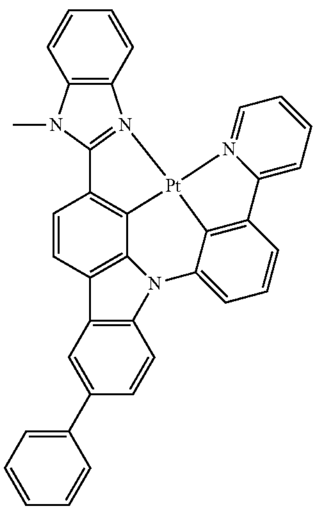

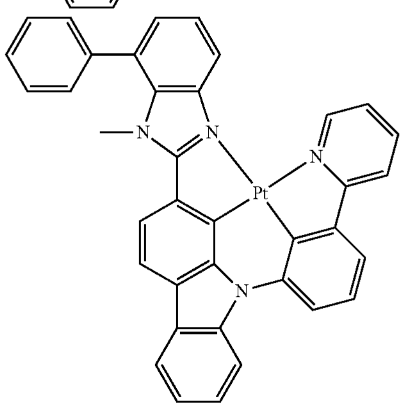

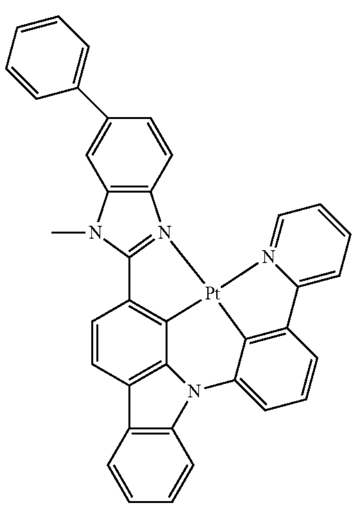

-continued

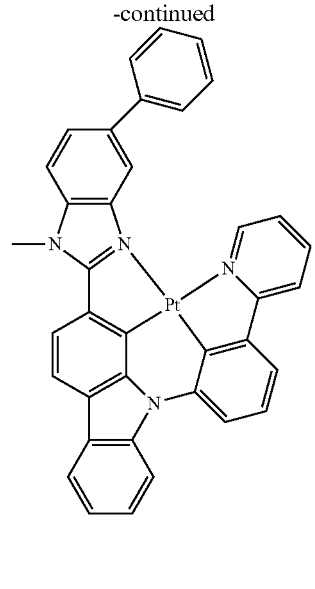

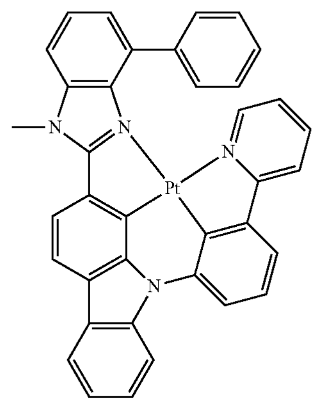

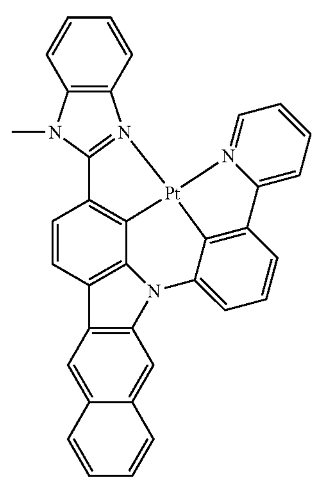

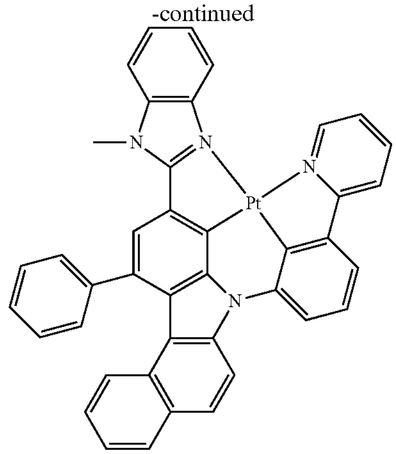
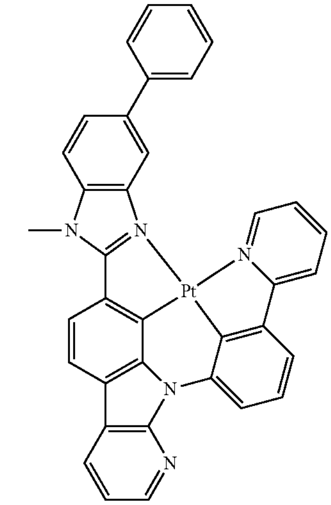
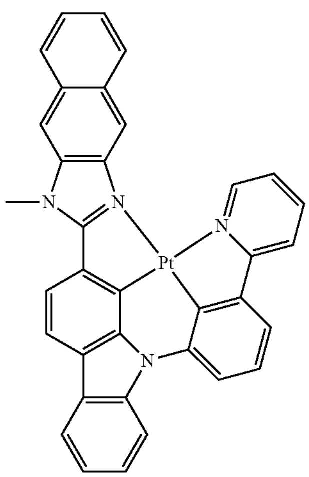
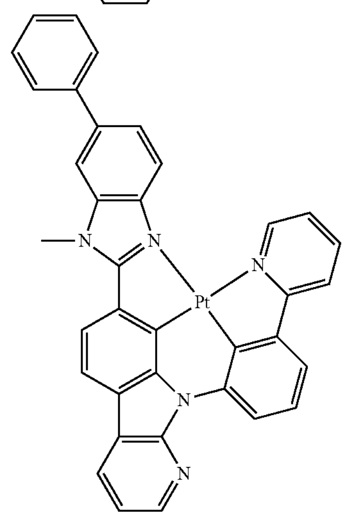
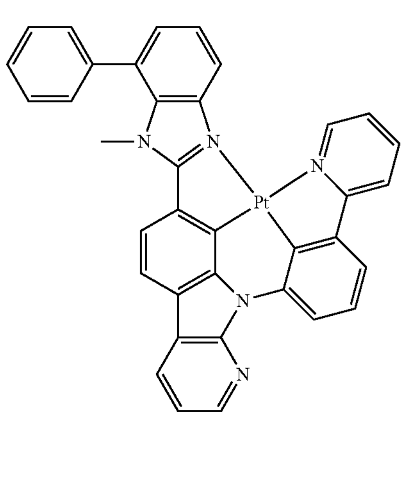
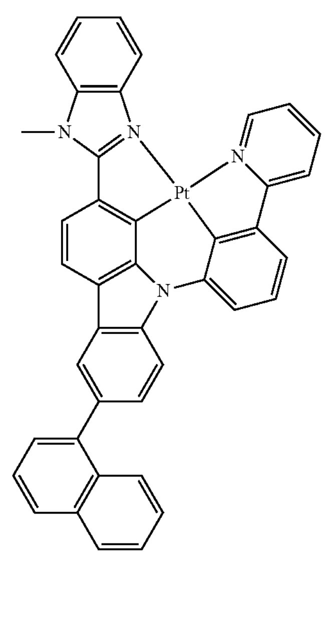
N
N
Pt
N
N -continued
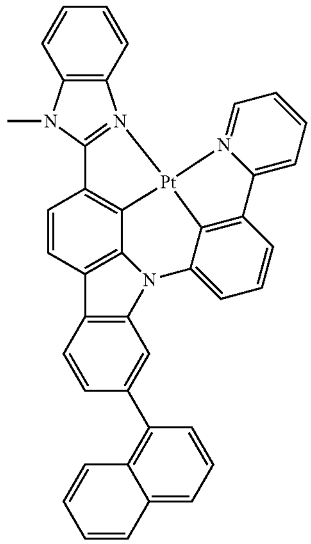
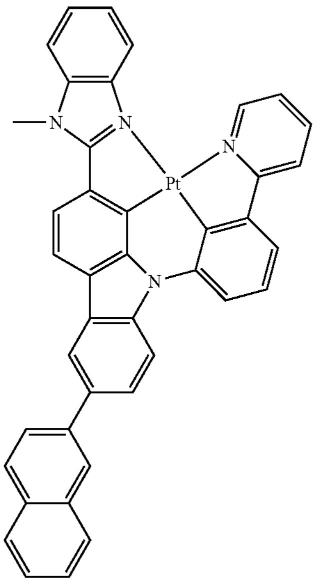
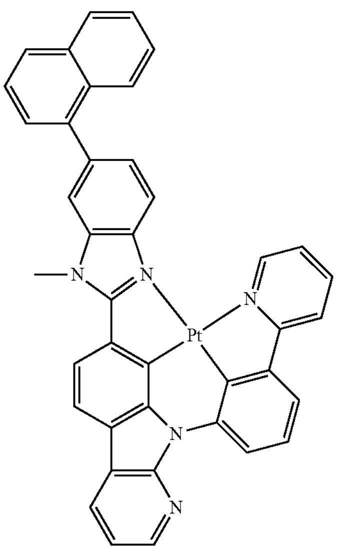
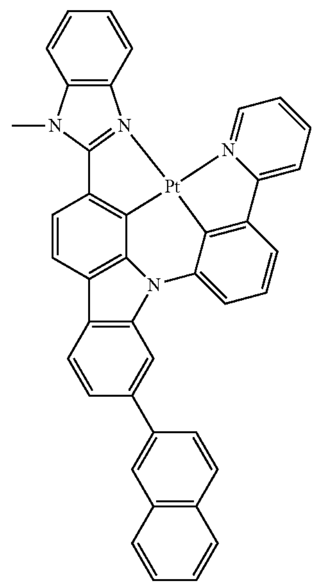
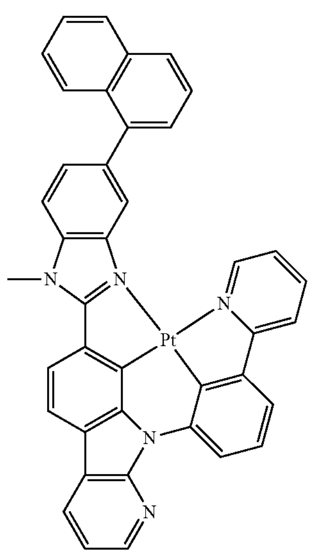
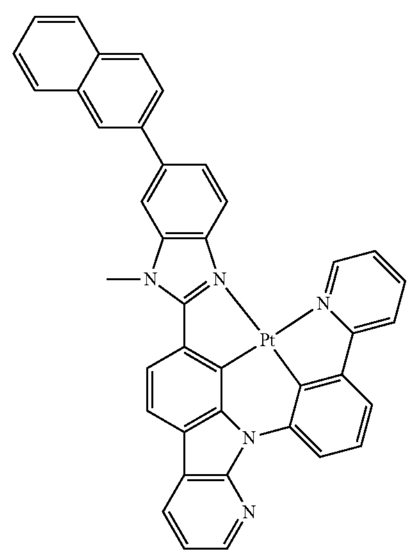
-continued -continued
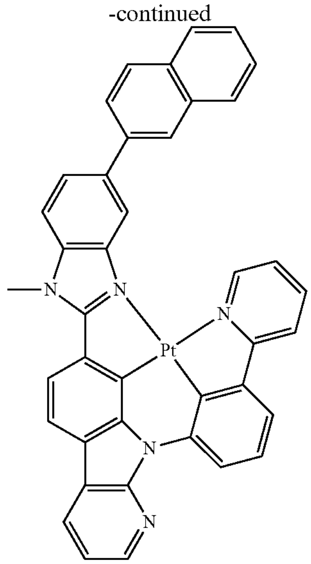
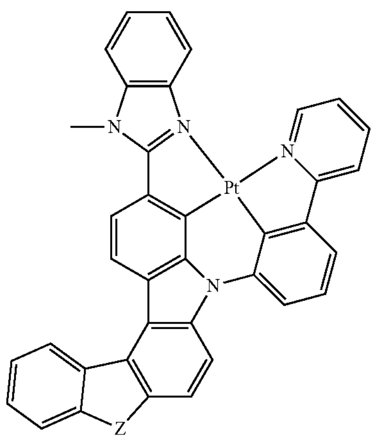
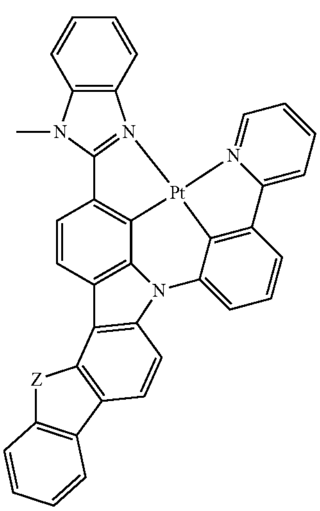
-continued
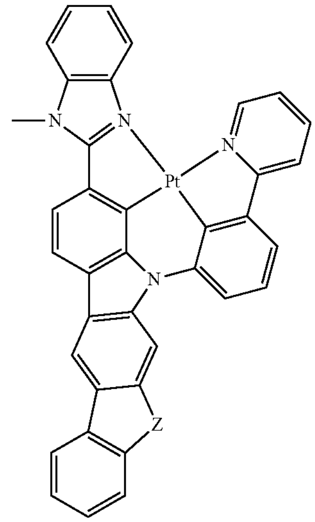
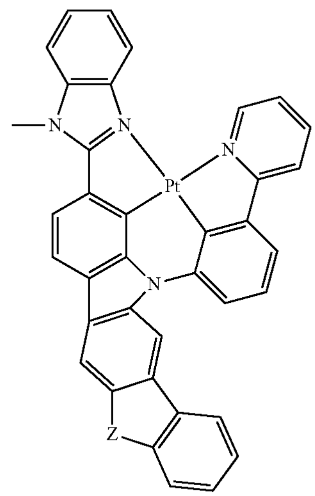
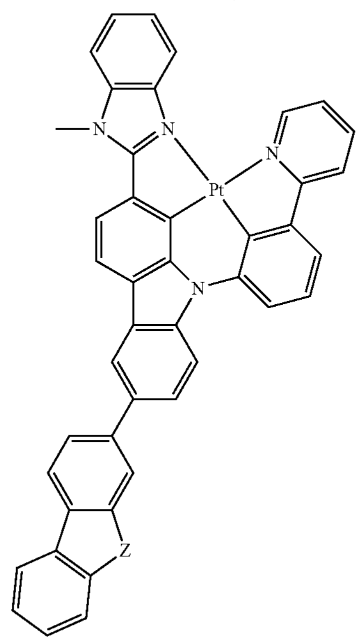

-continued
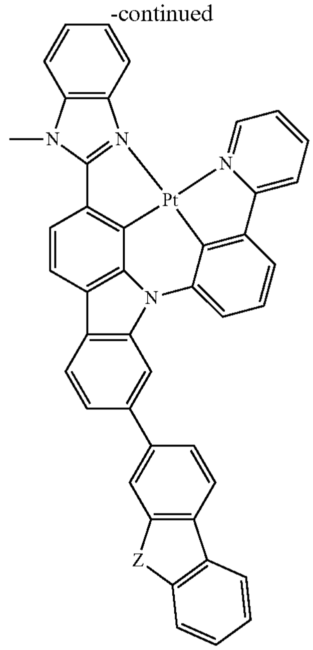
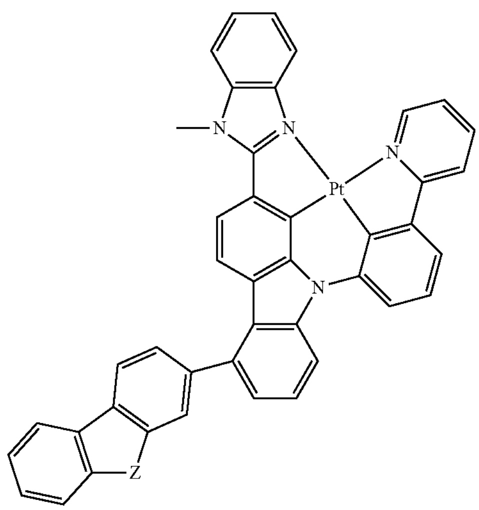
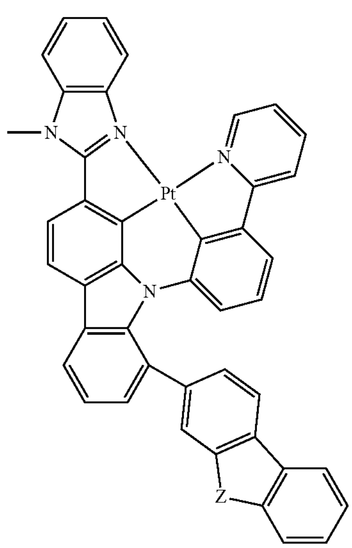
-continued
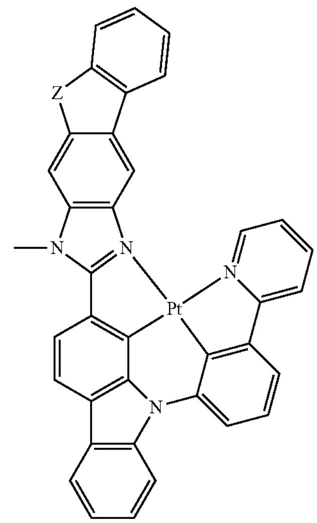
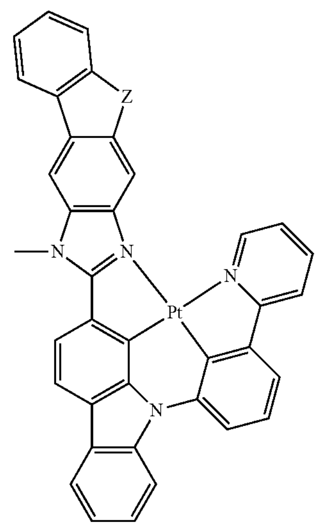
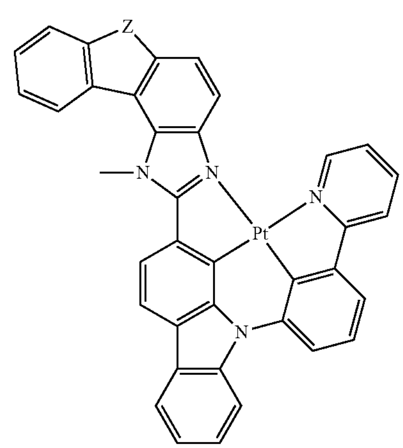

-continued
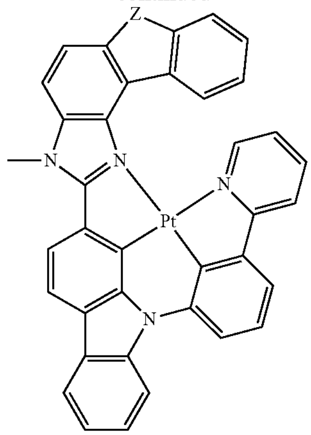
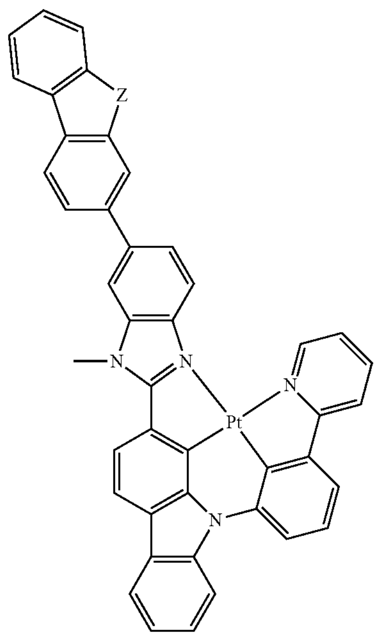
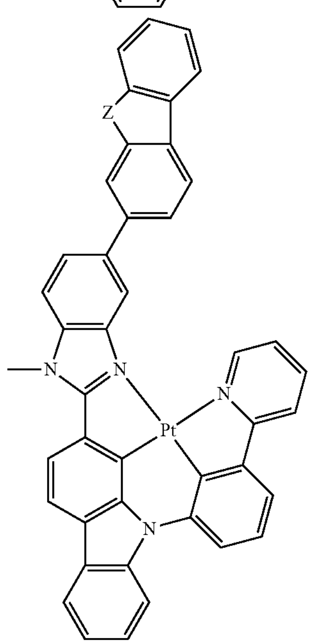
-continued
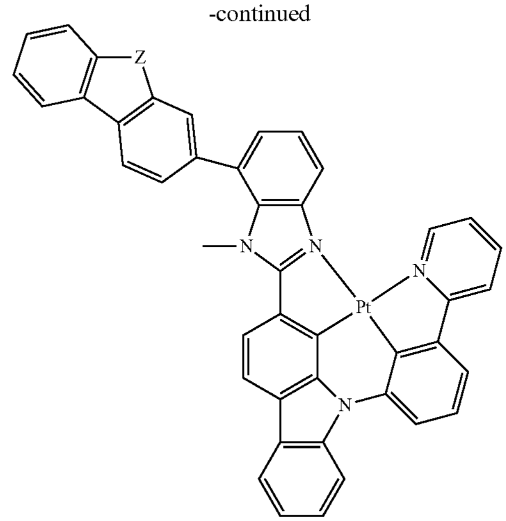
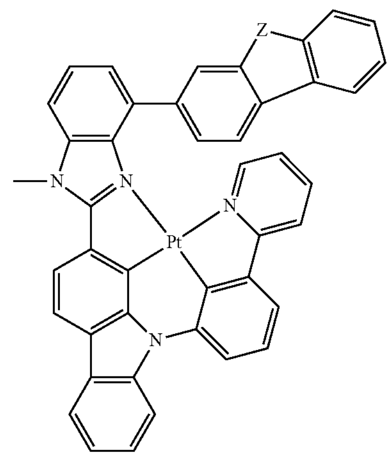
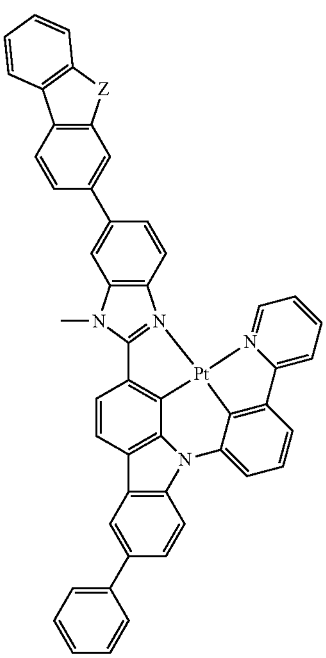

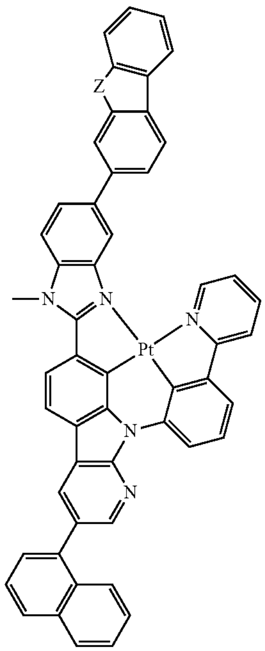
Z
N
N
Pt
N
N
N
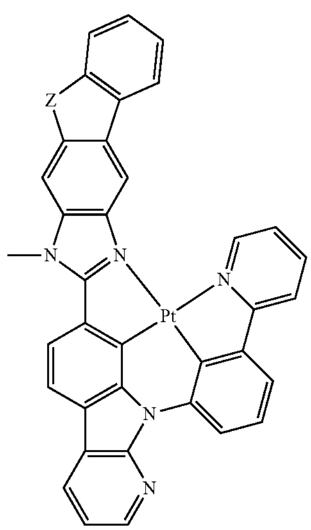
Z
N
N
Pt
N
N
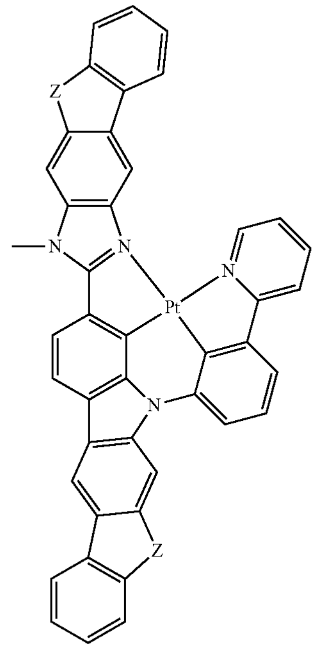
Z
N
N
Pt
N
N
Z
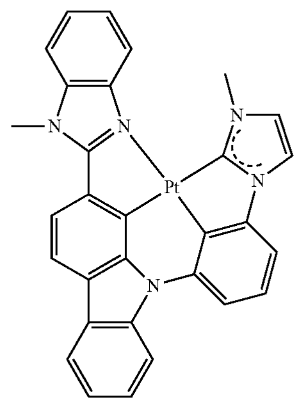
N
N
N
Pt
N
N
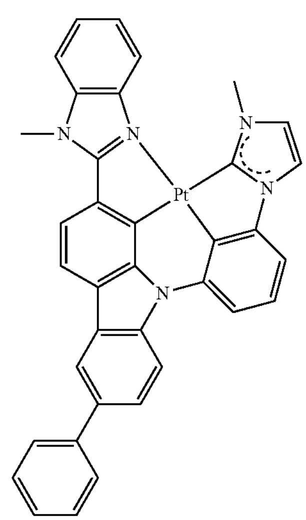
N
N
N
Pt
N
N -continued
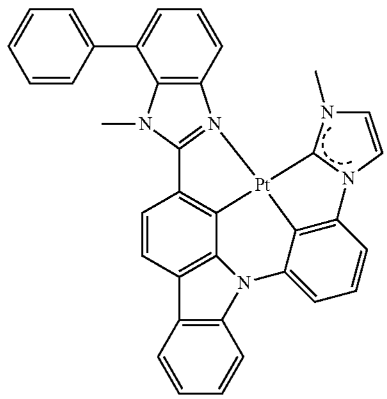
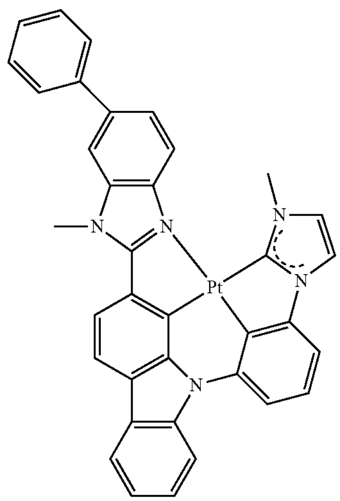
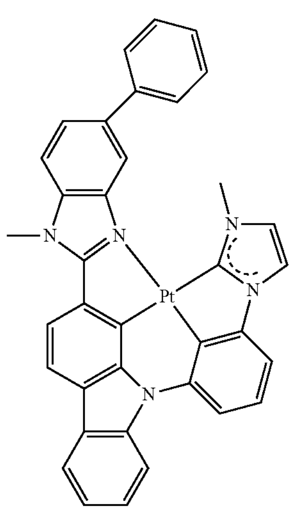
-continued
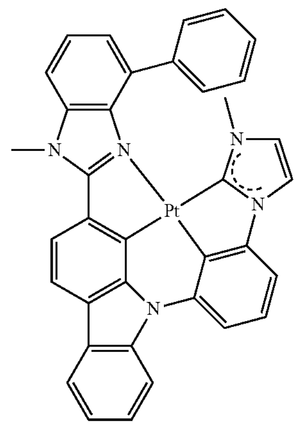
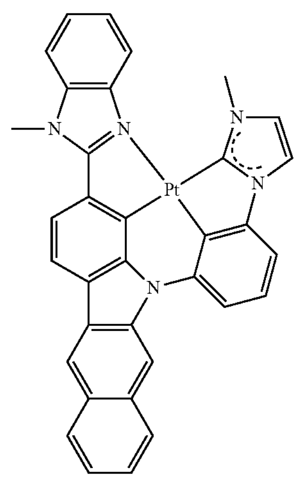
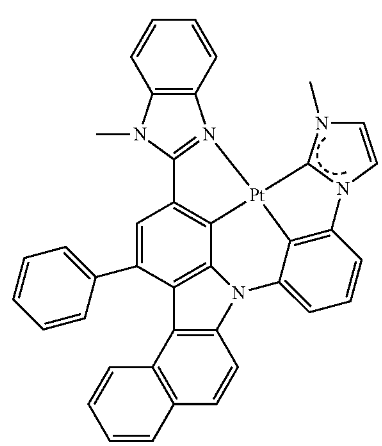

-continued
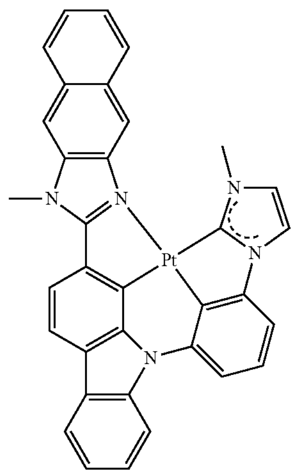
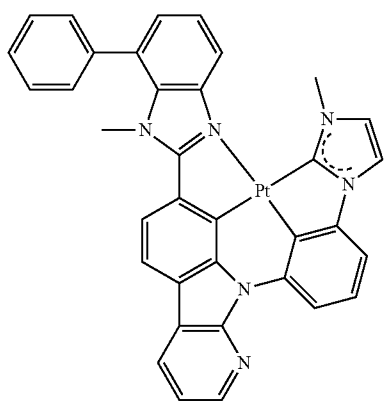
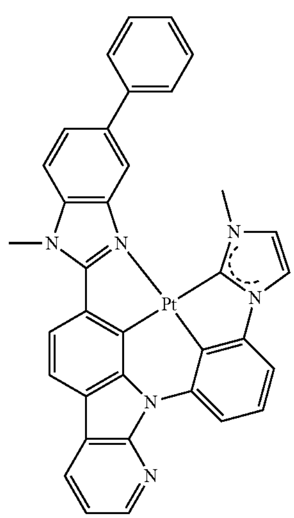
-continued
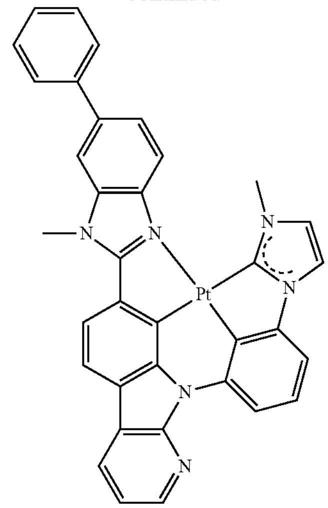
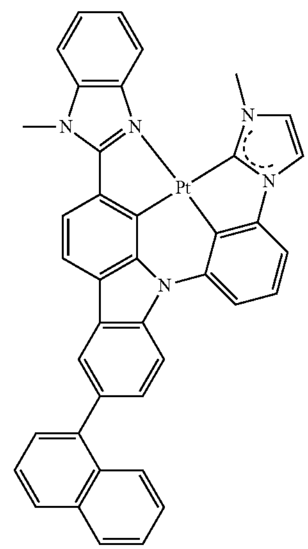
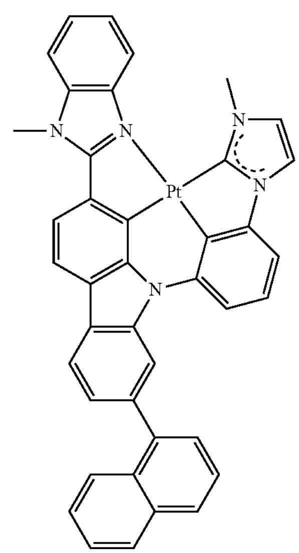

-continued
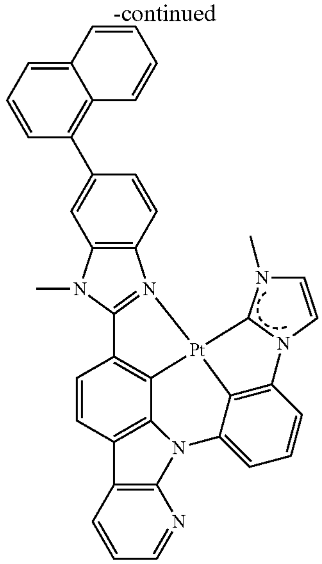
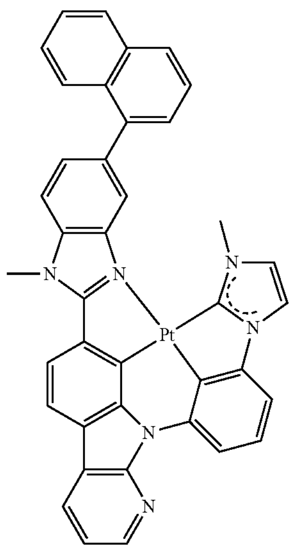
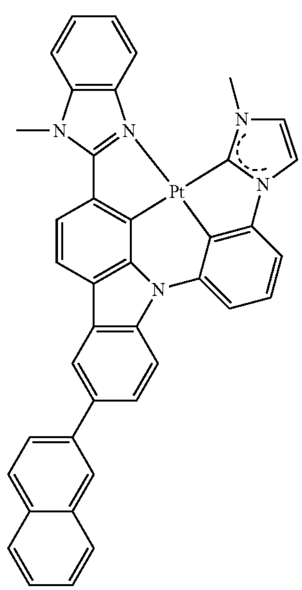
-continued
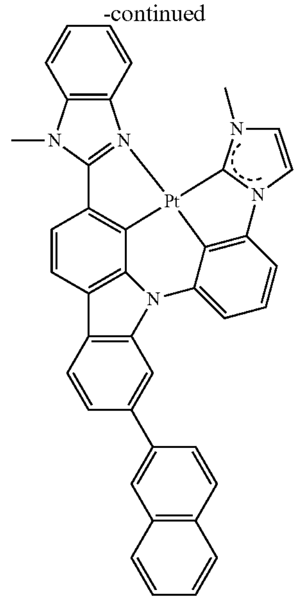
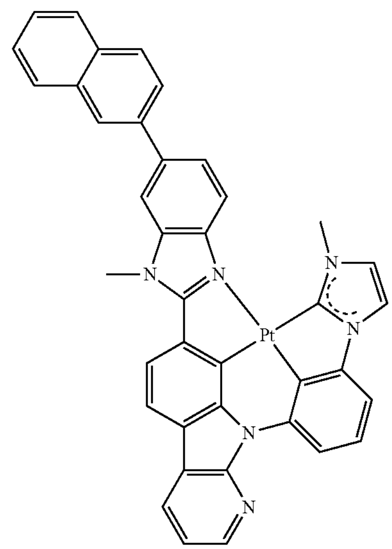
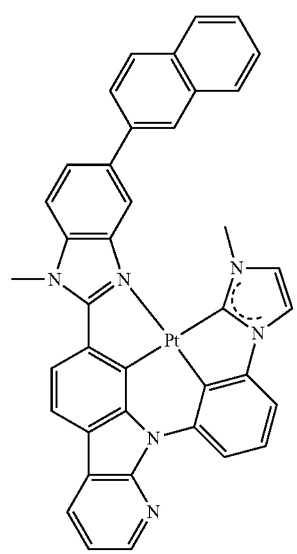

-continued
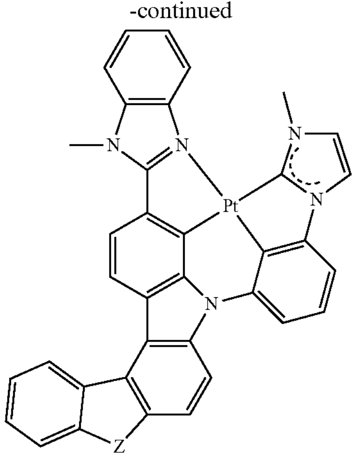
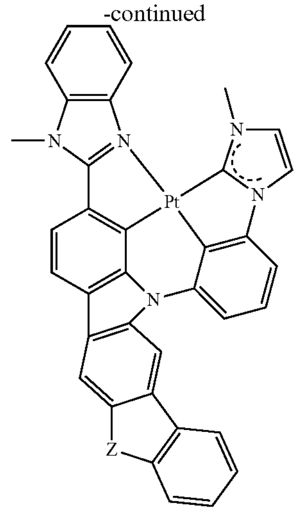
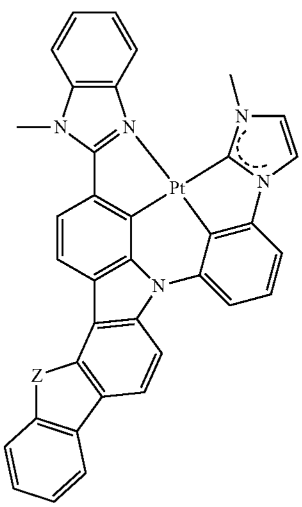
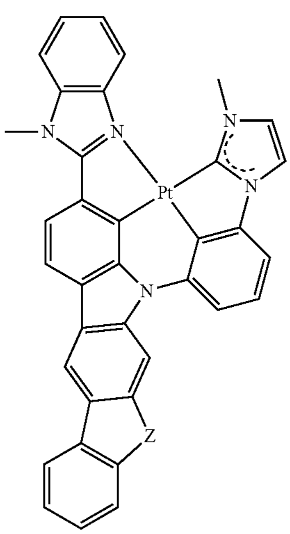
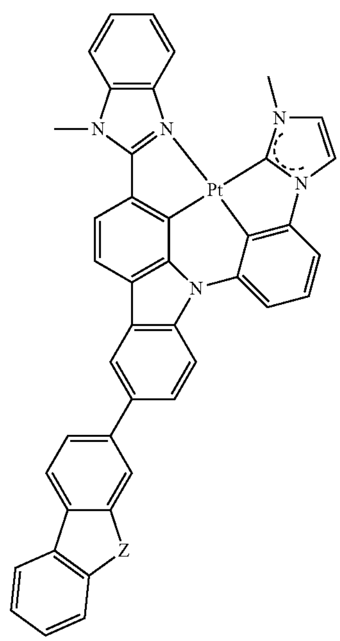

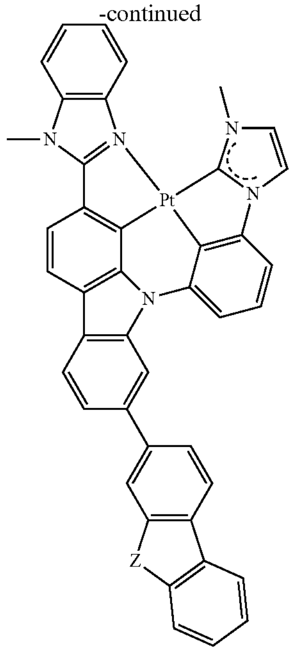
N
N
Pt
N
N
N
Z
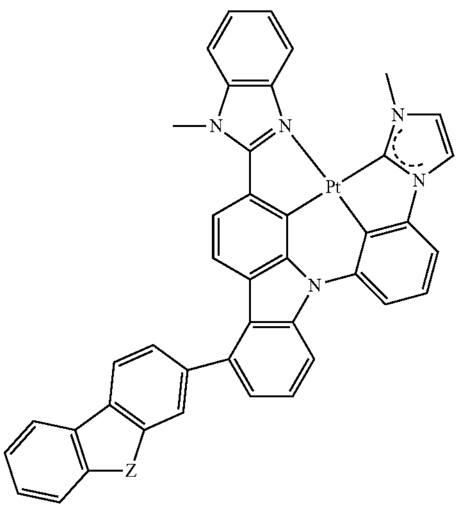
N
N
Pt
N
N
N
Z
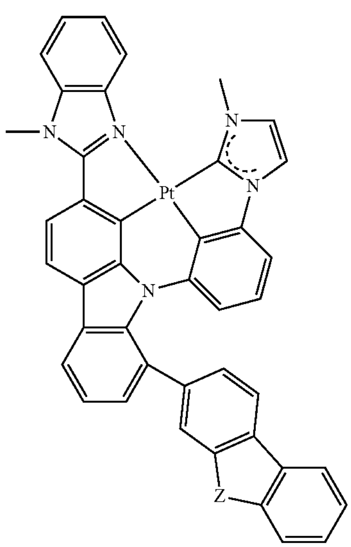
N
N
Pt
N
N
N
Z
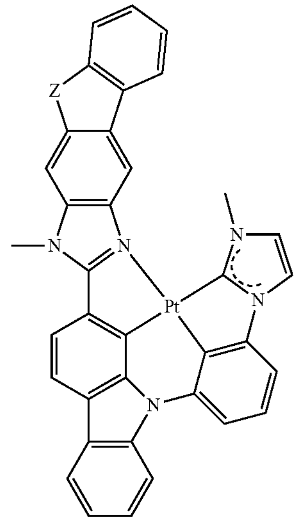
Z
N
N
N
Pt
N
N
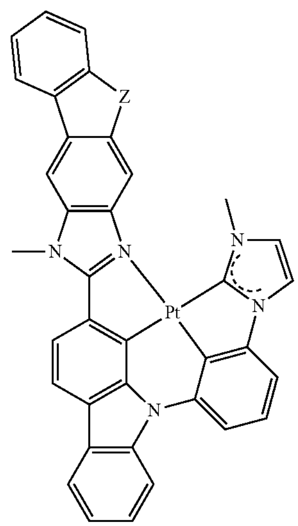
Z
N
N
N
Pt
N
N
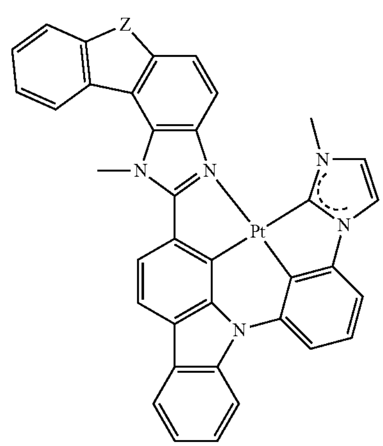
Z
N
N
N
Pt
N
N -continued
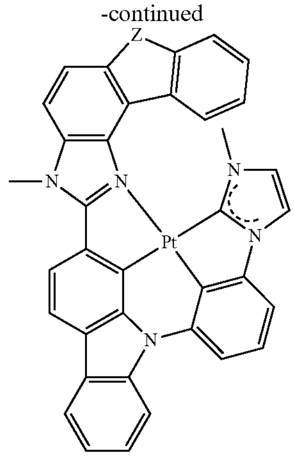
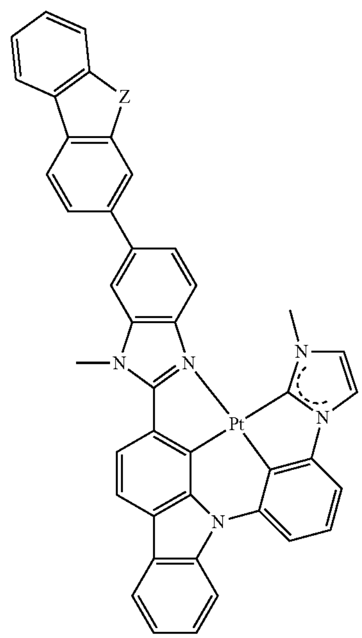
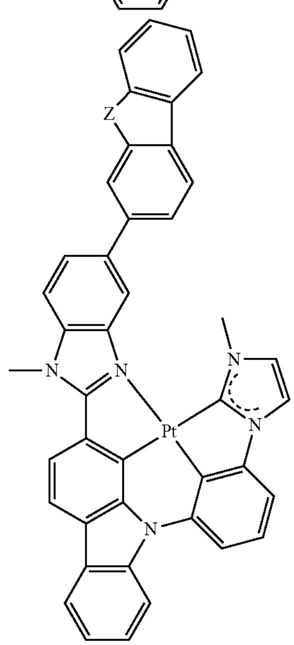
-continued
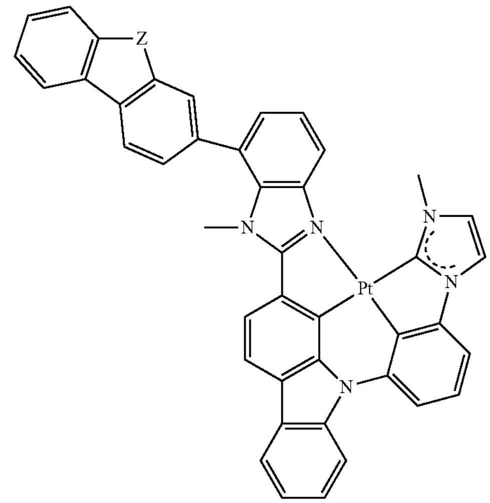
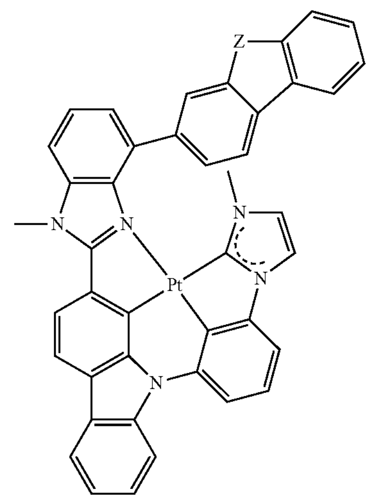
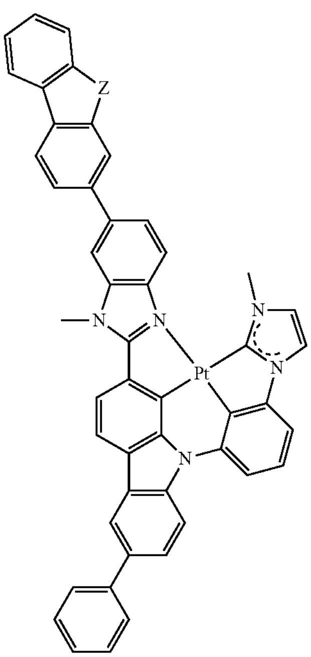

-continued
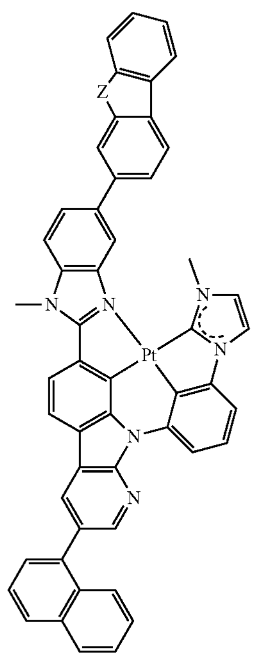
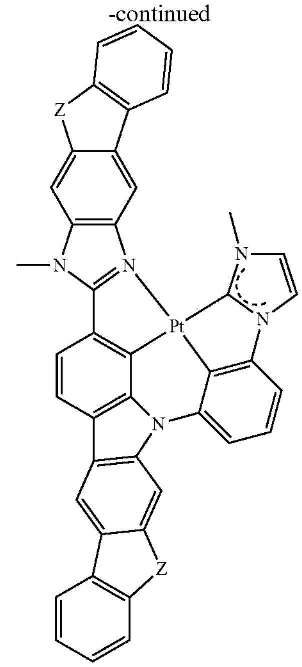
-continued
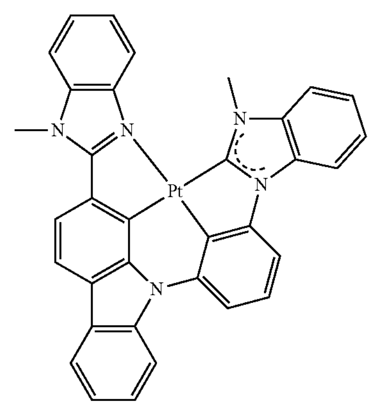
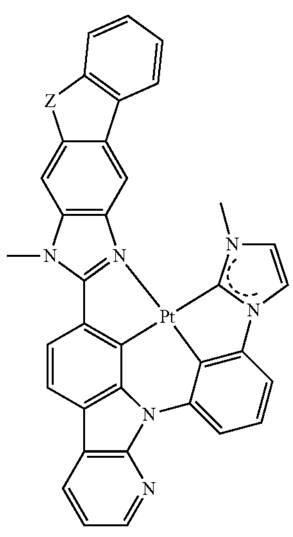
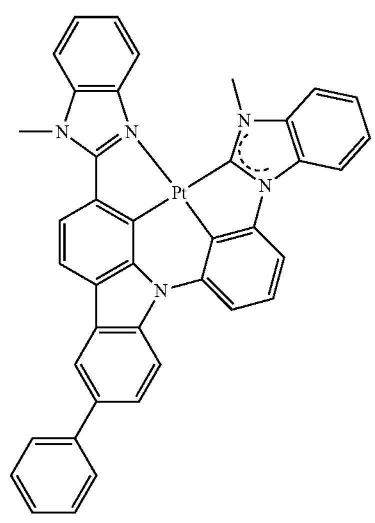

-continued
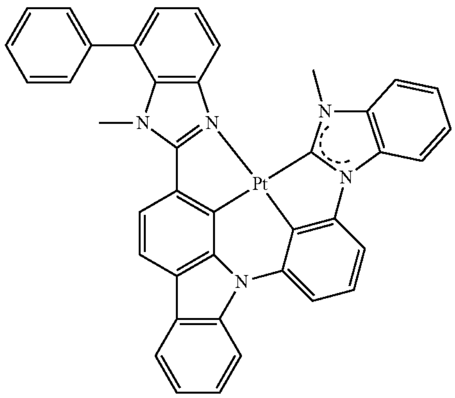
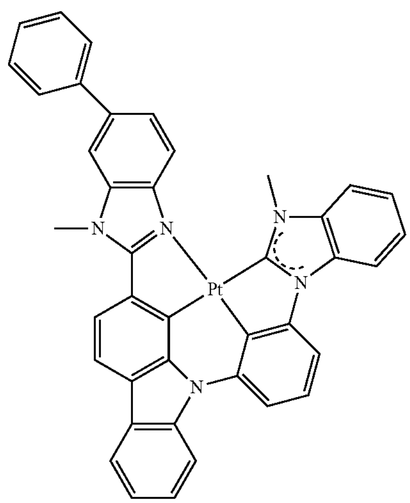
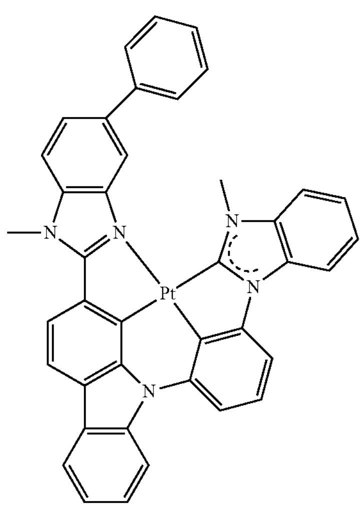
-continued
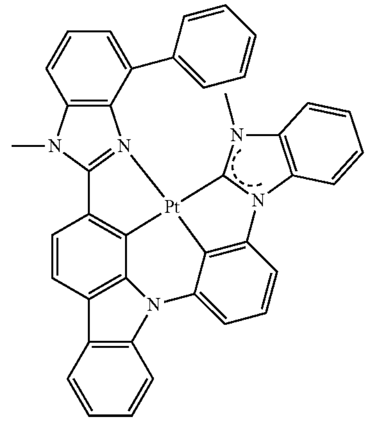
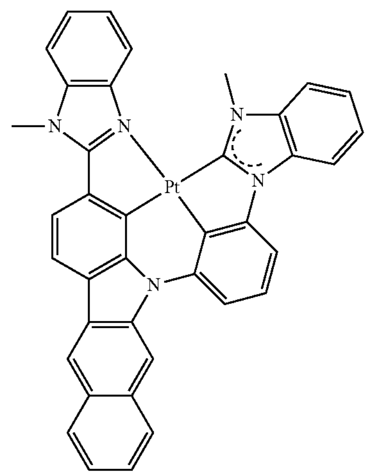
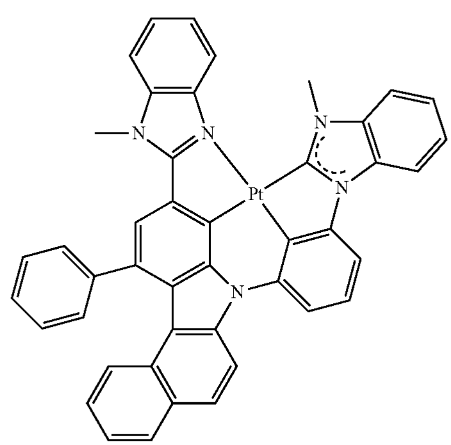

-continued
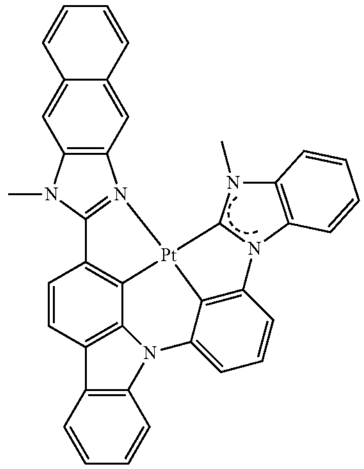
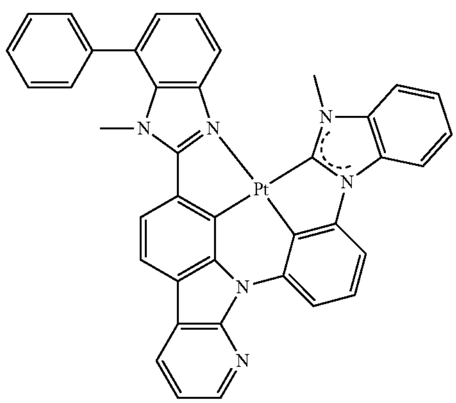
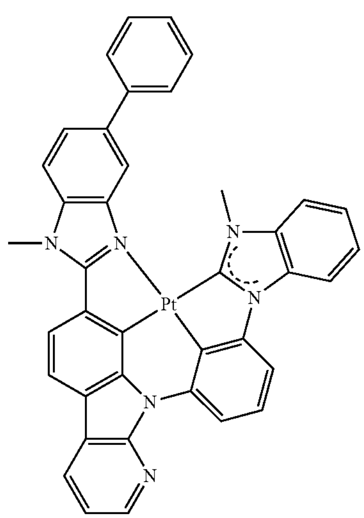
-continued
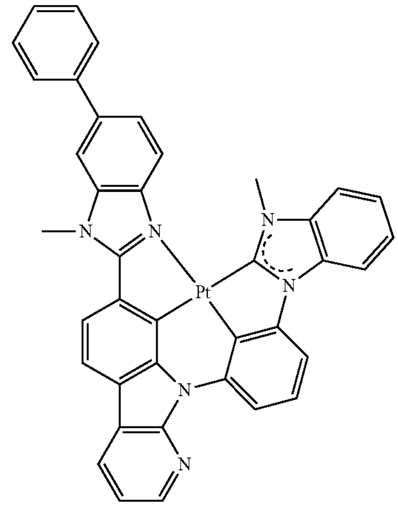
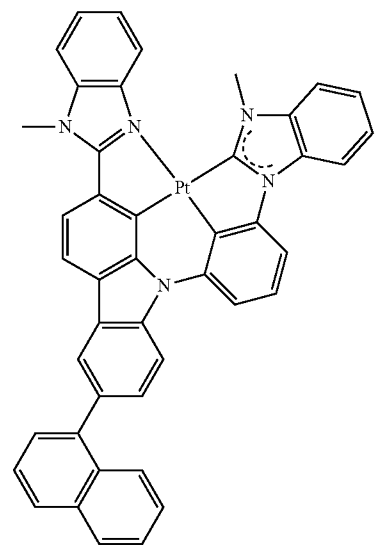
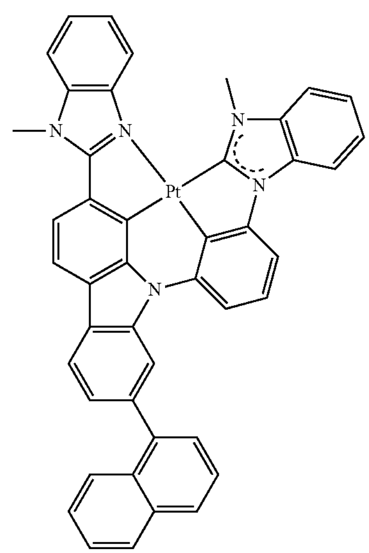

-continued
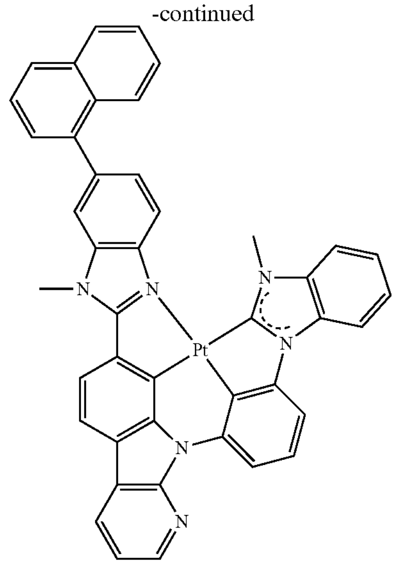
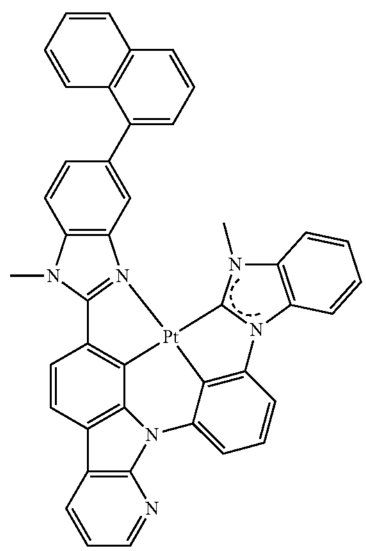
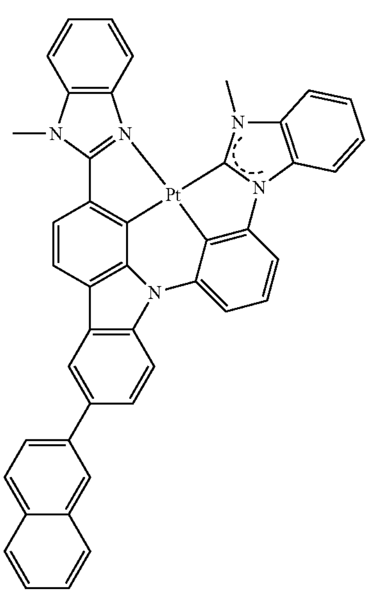
-continued
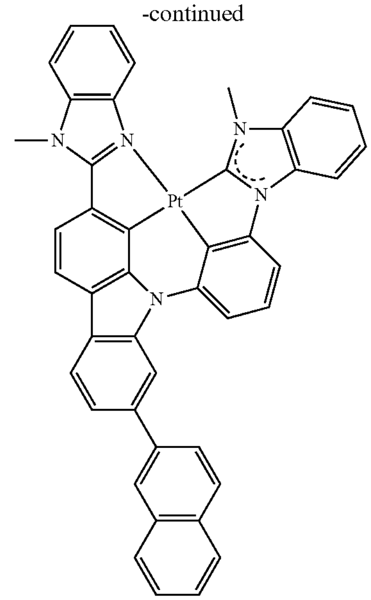
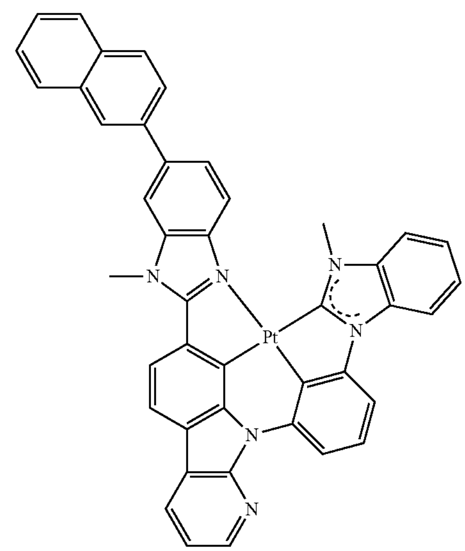
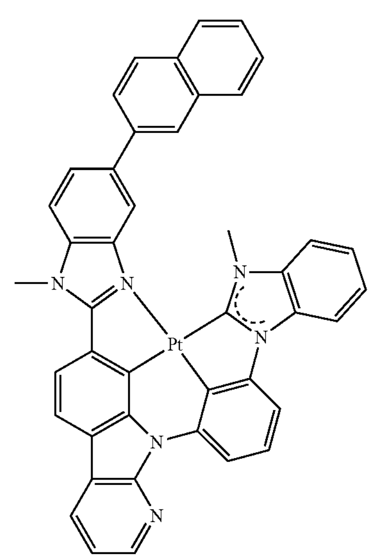

-continued
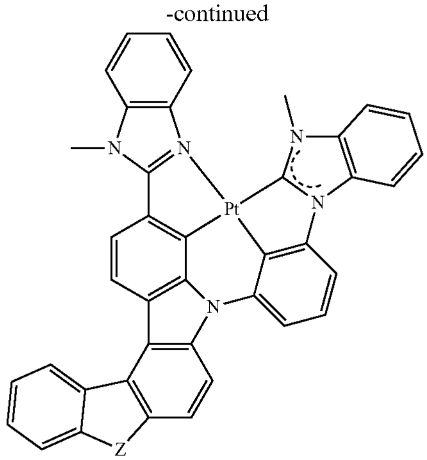
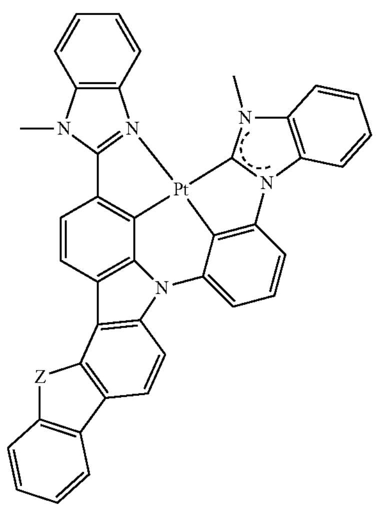
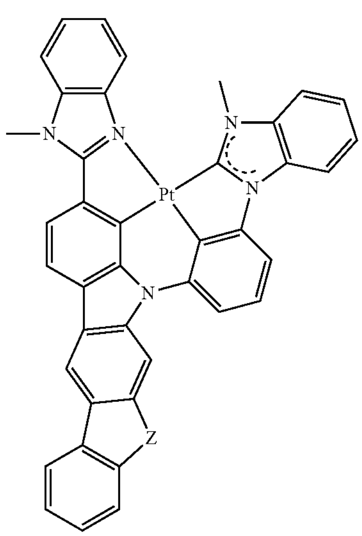
-continued
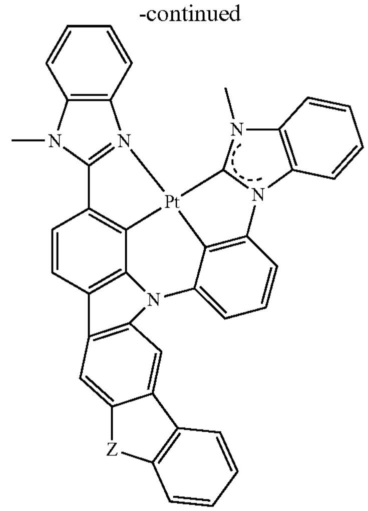
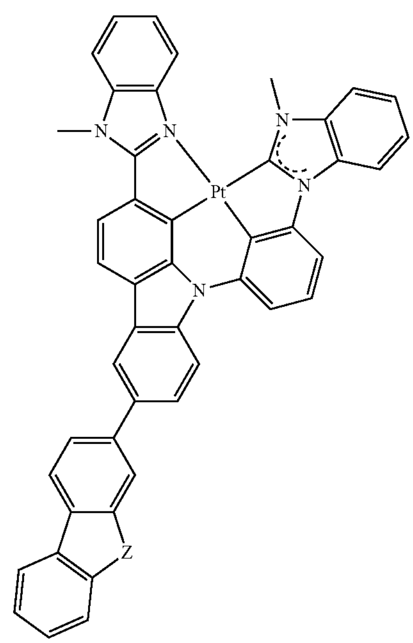

-continued
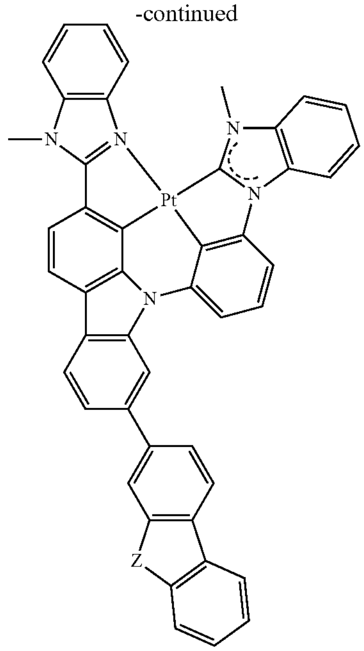
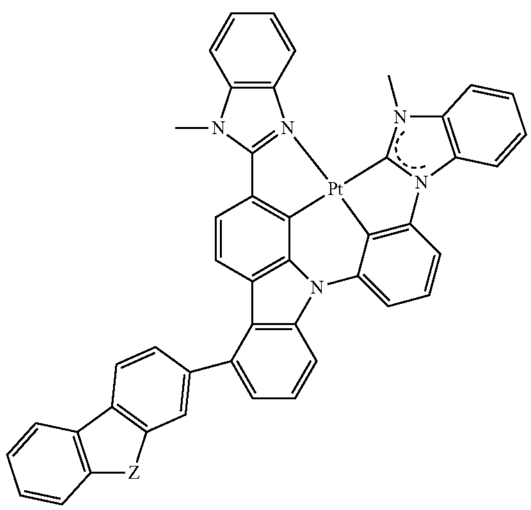
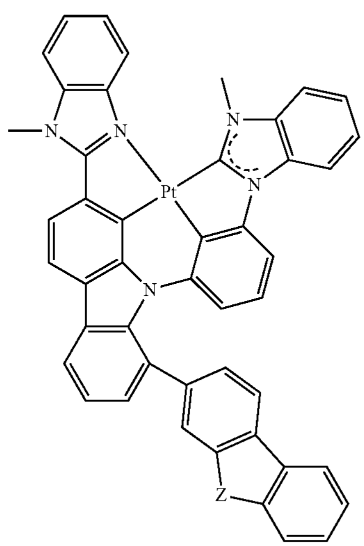
-continued
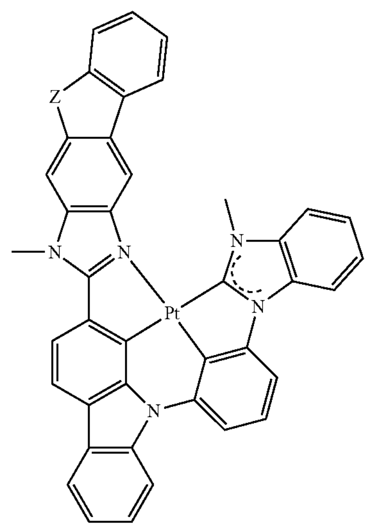
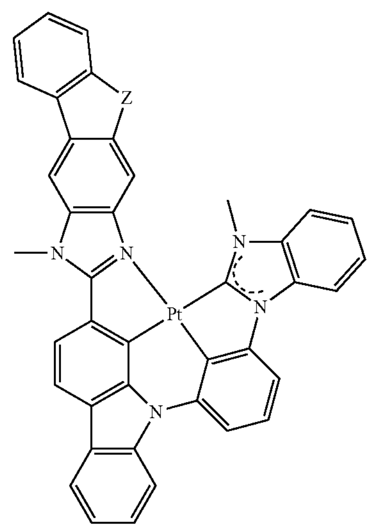
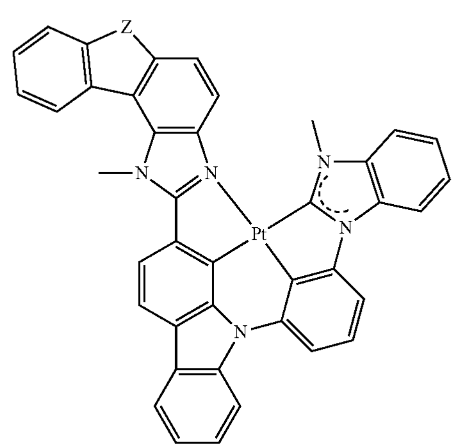

-continued
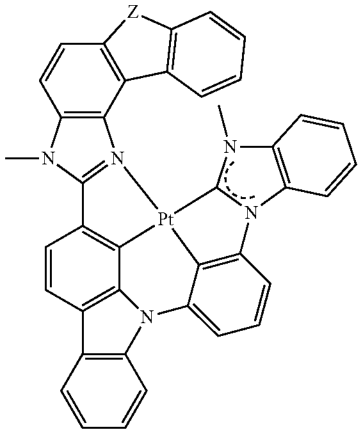
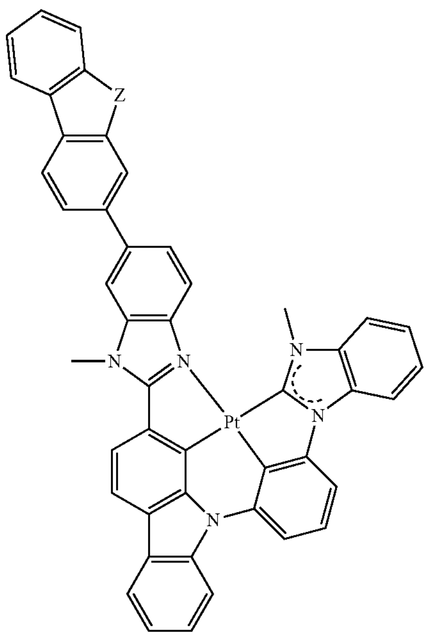
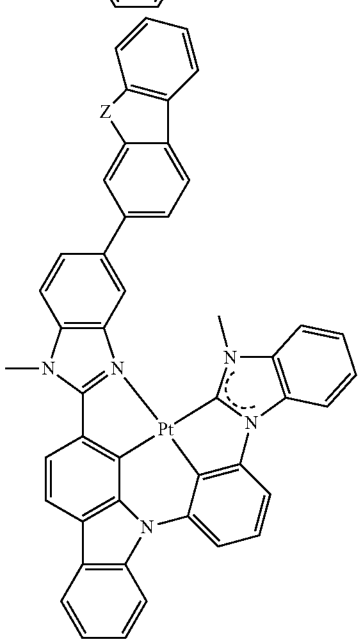
-continued
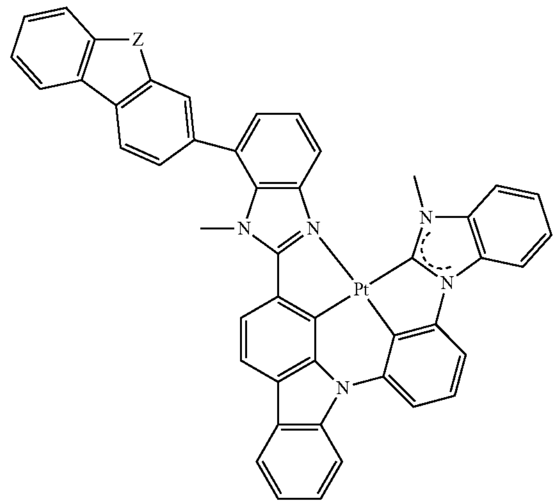
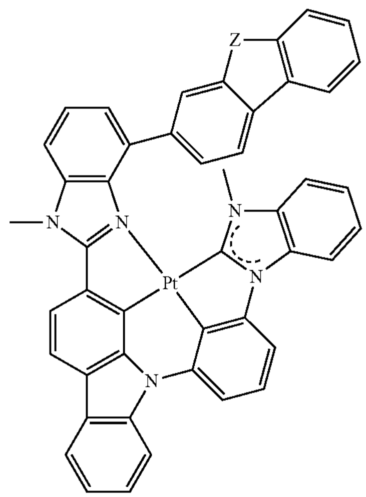
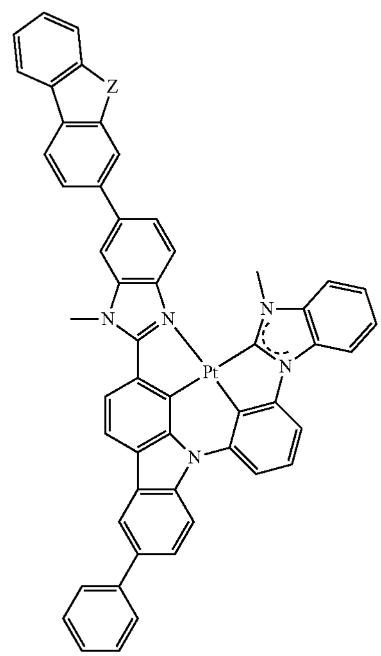

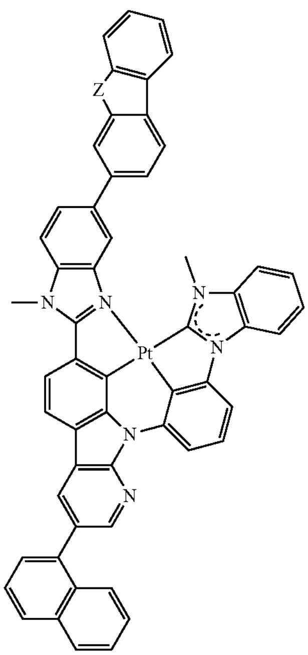
Z
N
N
Pt
N
N
N
N
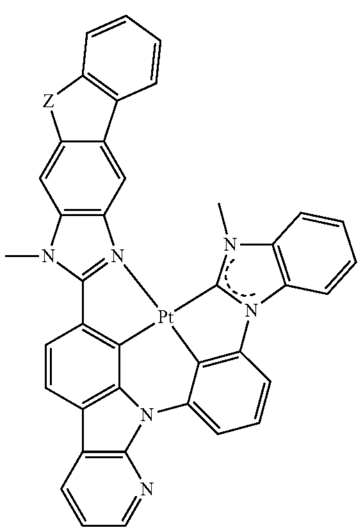
Z
N
N
Pt
N
N
N
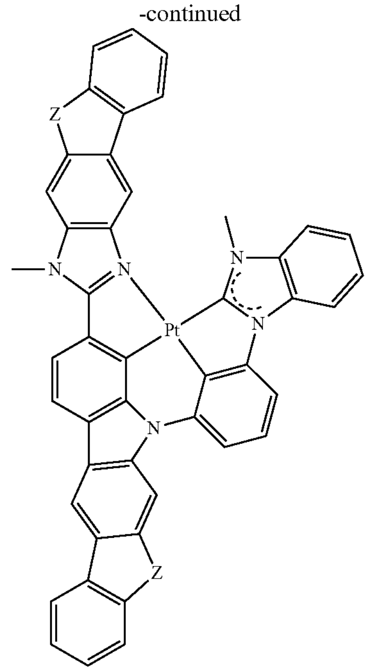
Z
N
N
Pt
N
N
N
Z
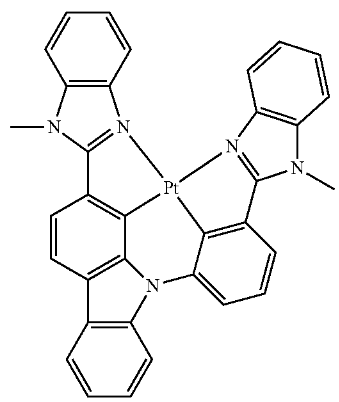
N
N
Pt
N
N
N
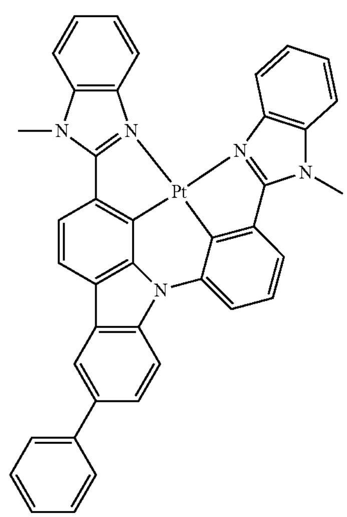
N
N
Pt
N
N
N -continued
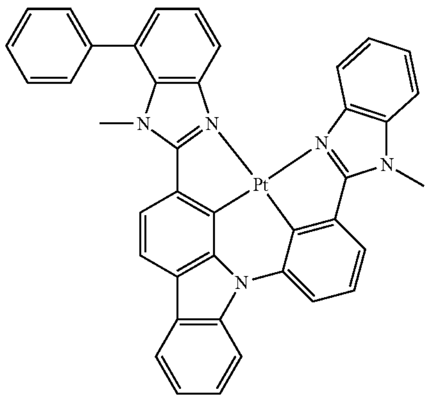
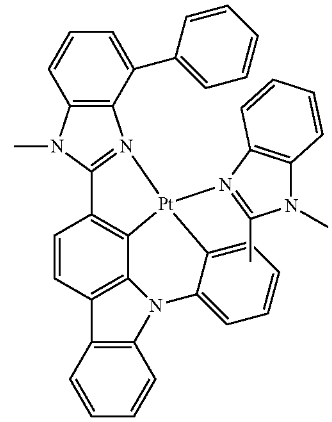
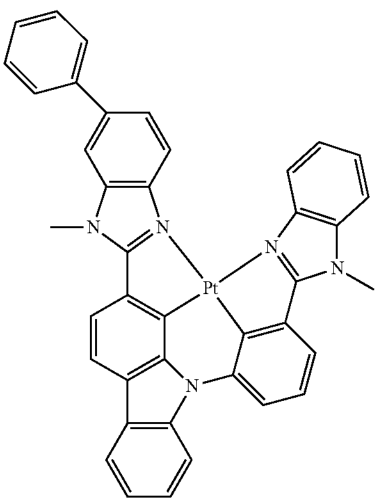
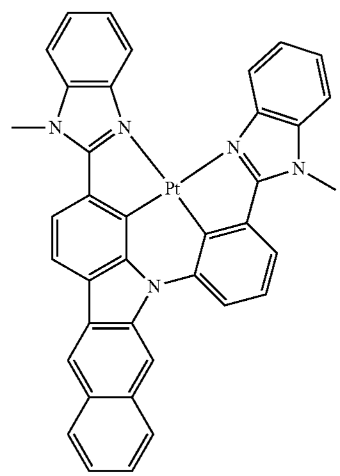
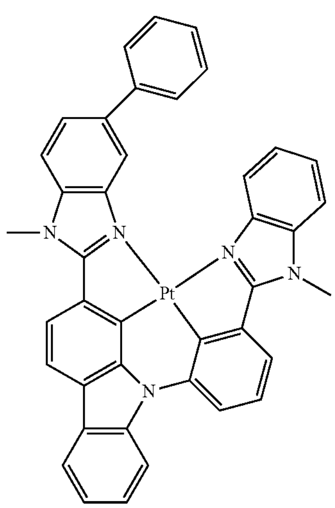
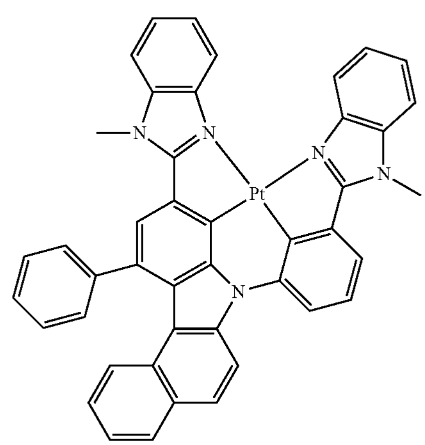
-continued

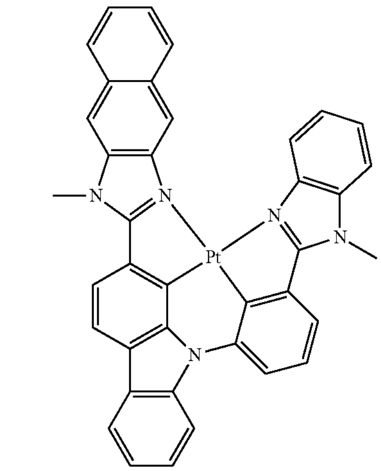
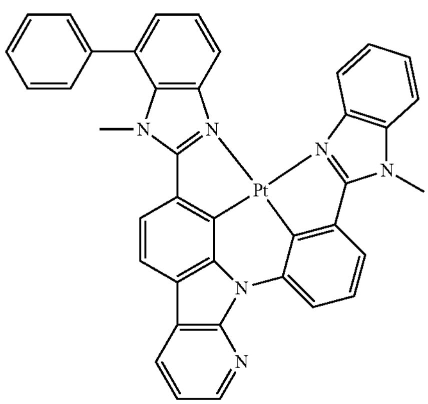
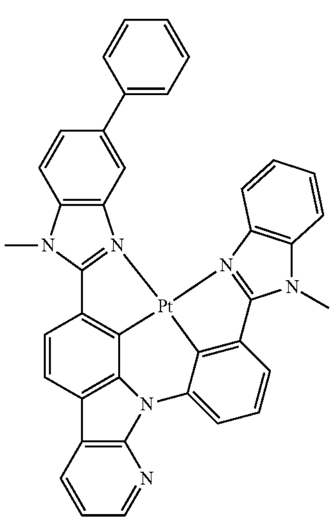
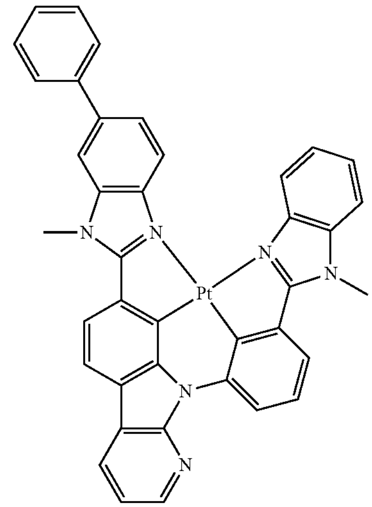
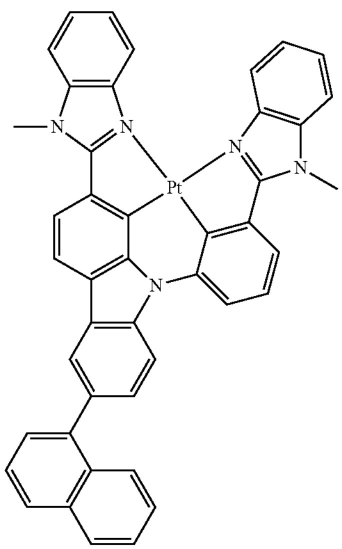
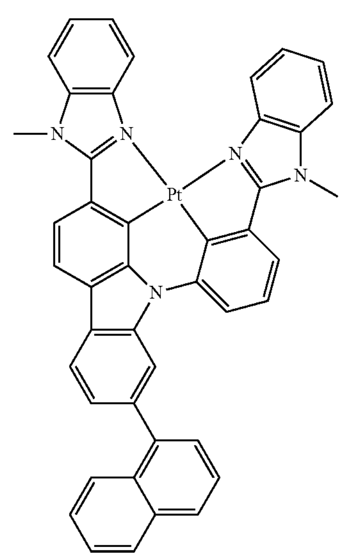

-continued
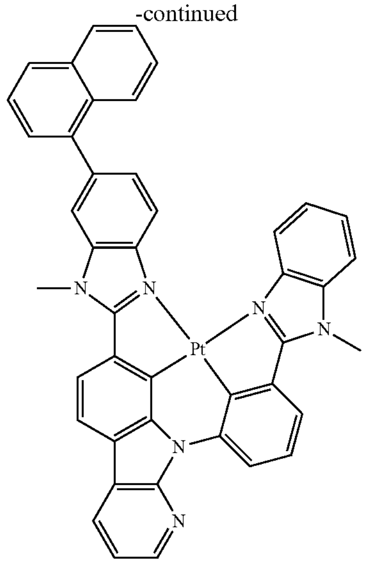
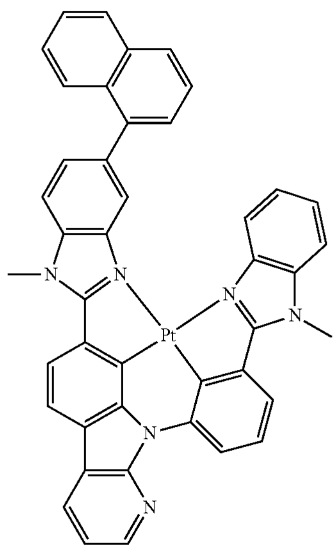
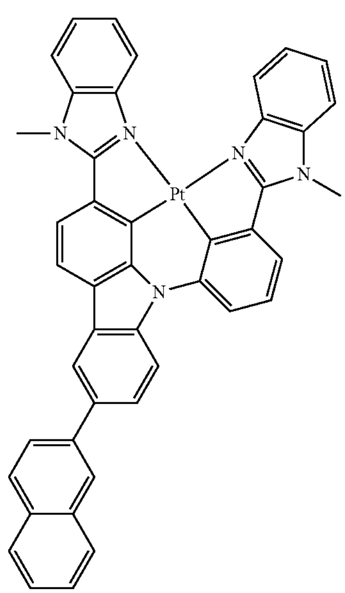
-continued
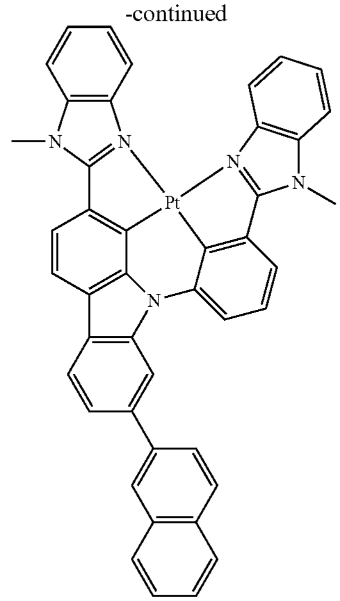
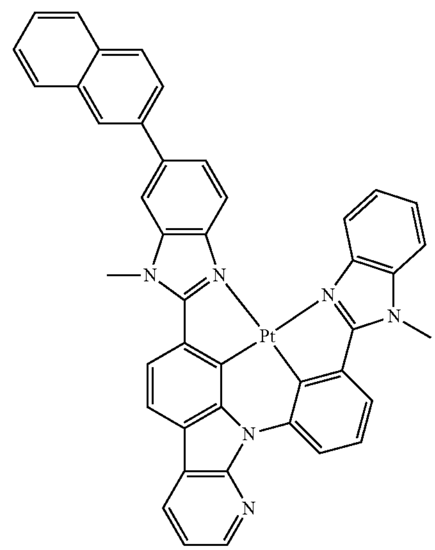
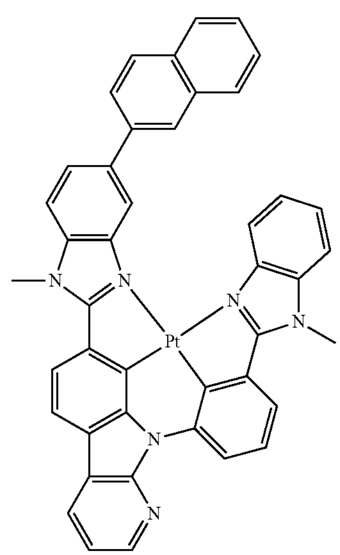

-continued
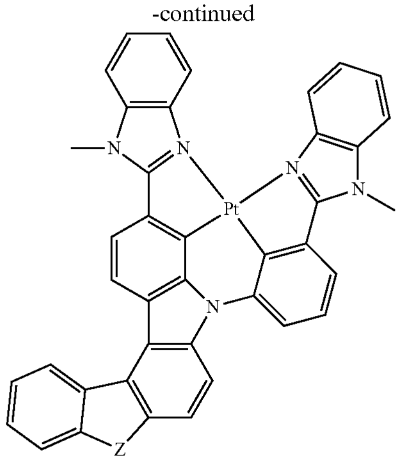
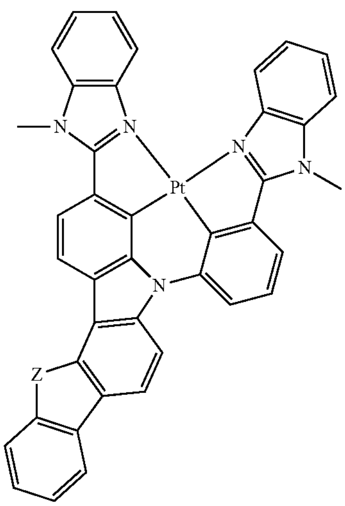
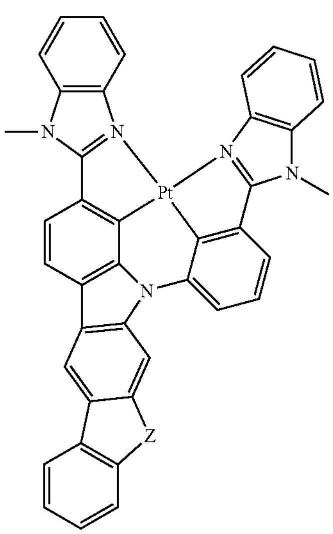
-continued
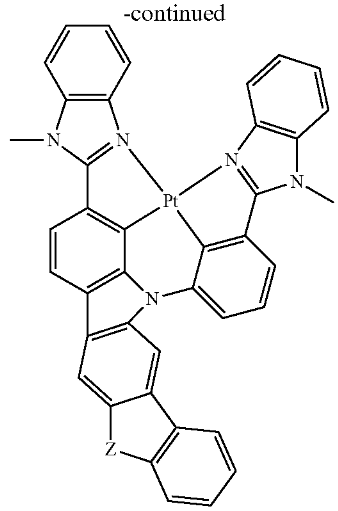
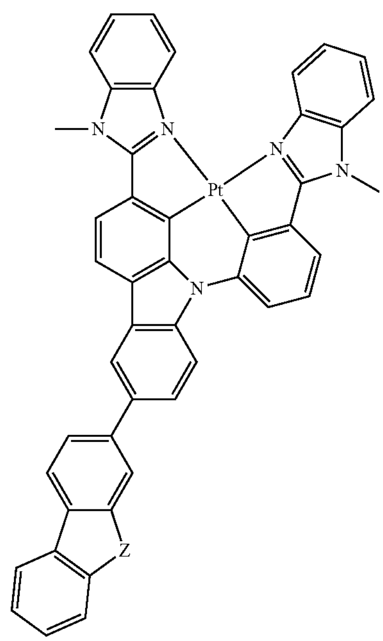

-continued
-continued
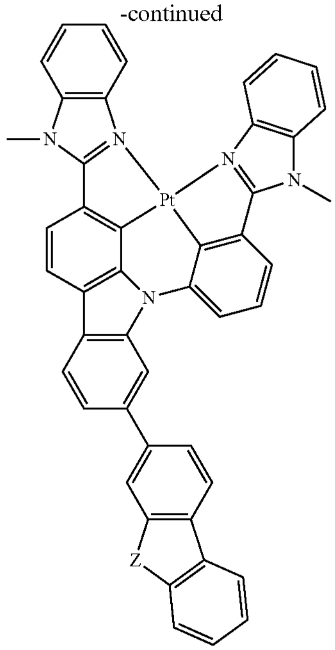
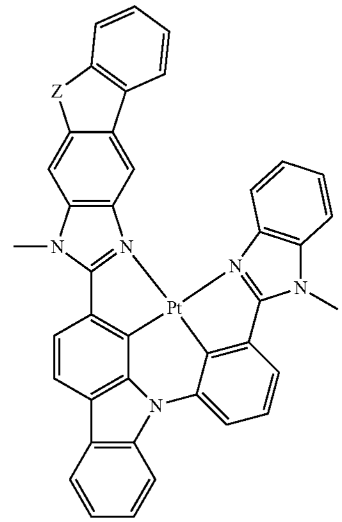
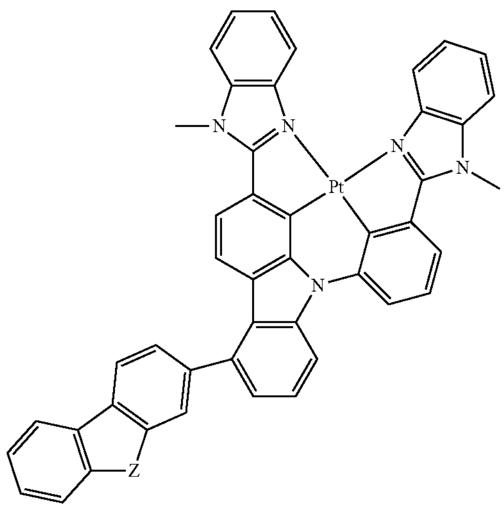
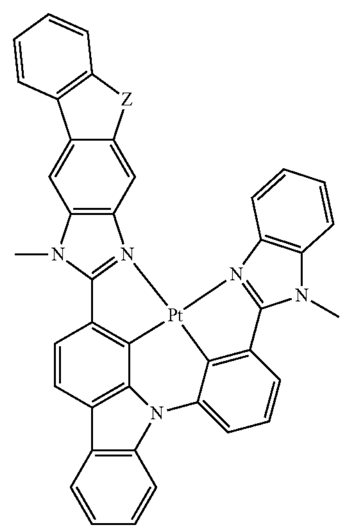
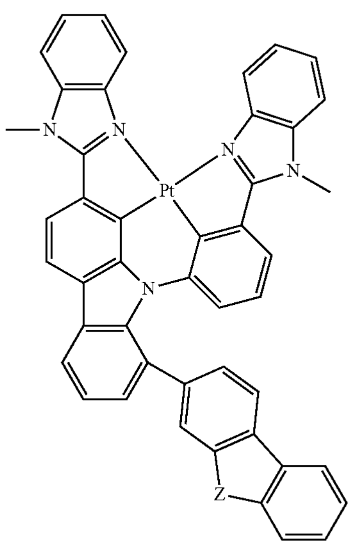
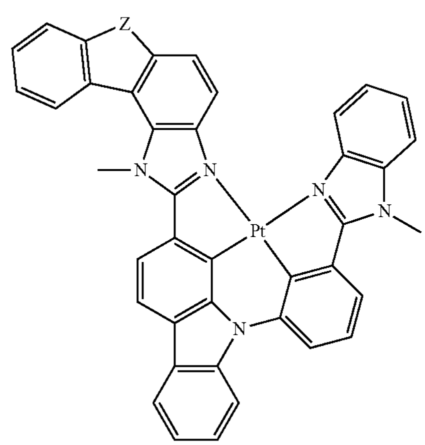

-continued
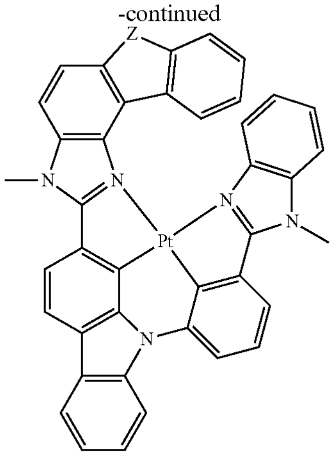
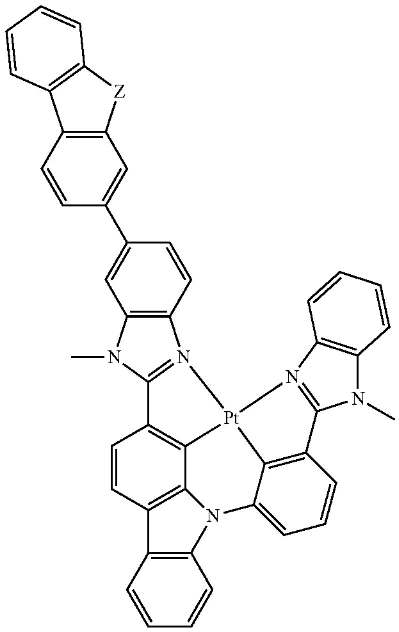
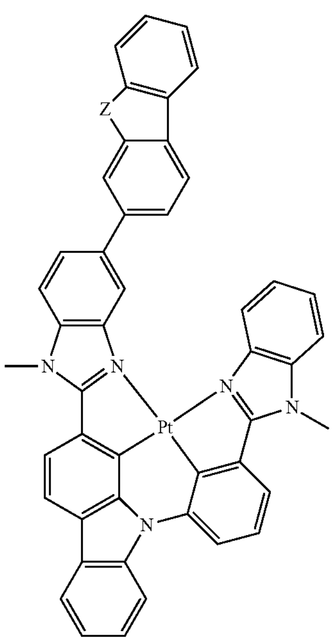
-continued
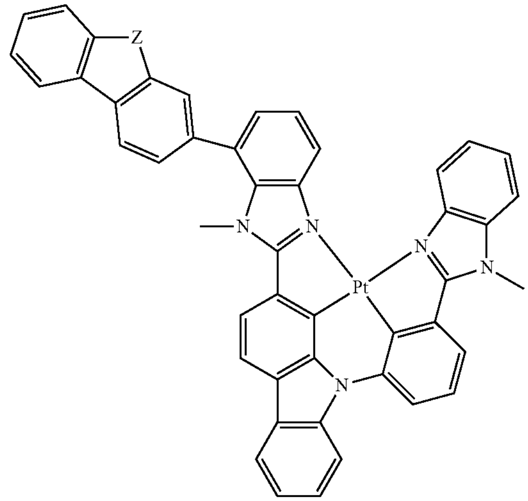
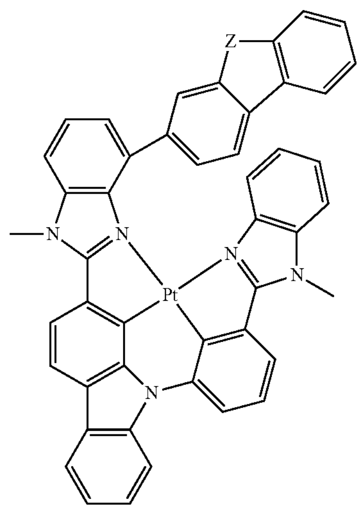
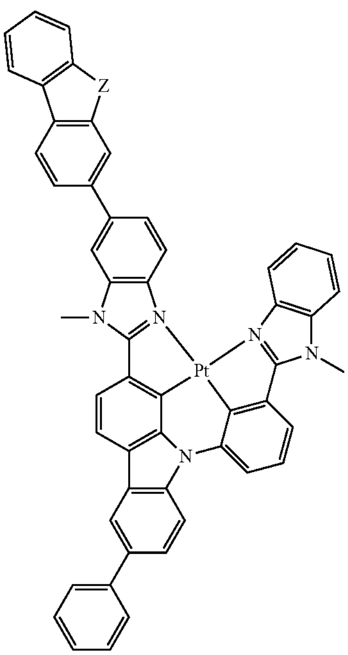

-continued
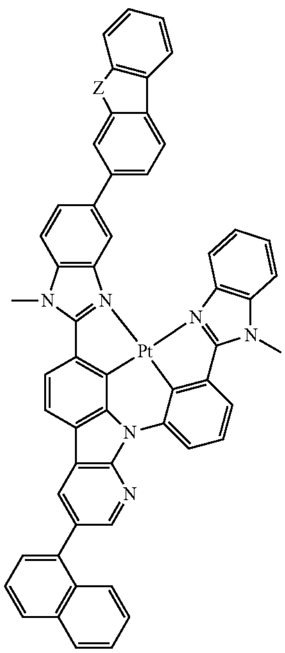
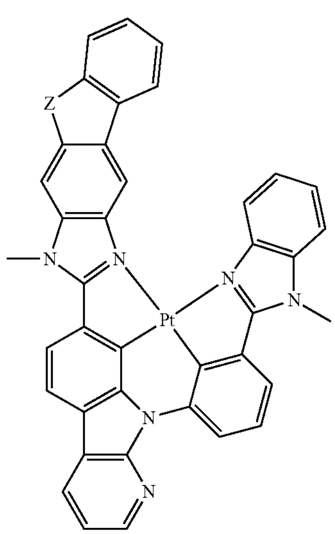
-continued
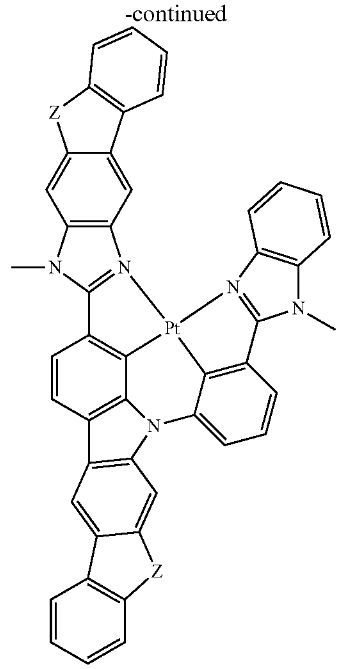
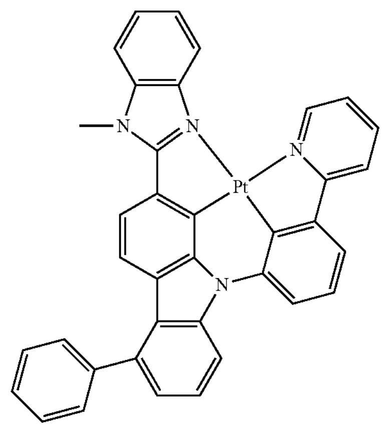
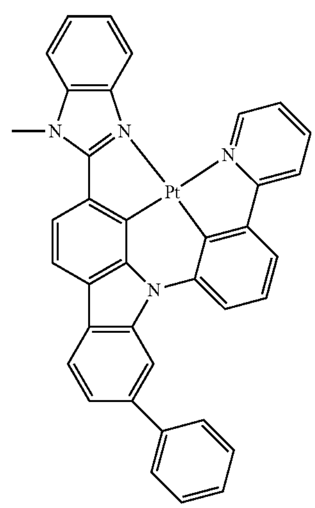

-continued
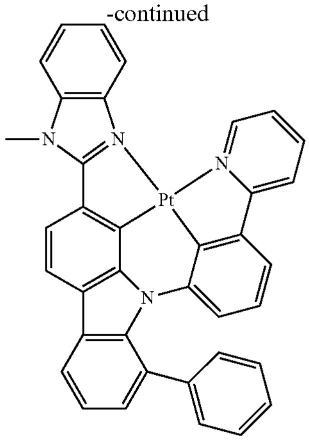
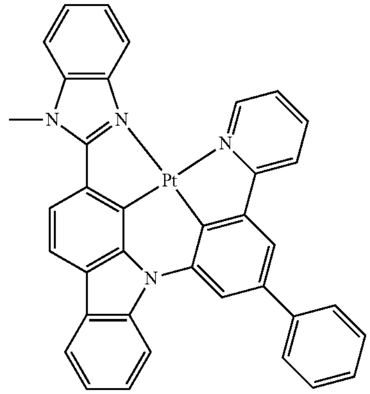
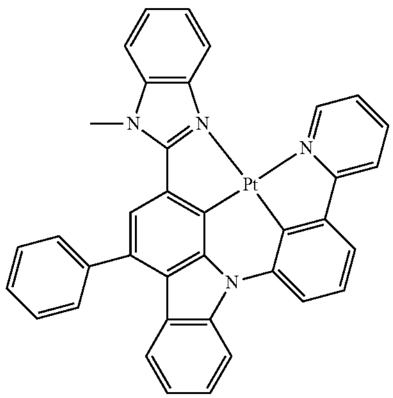
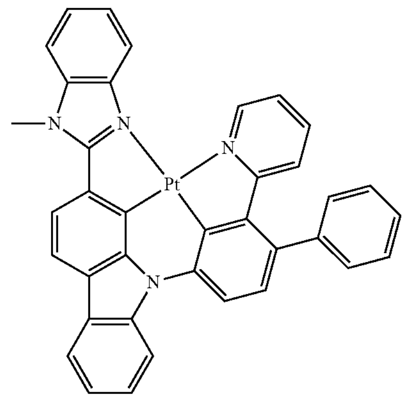
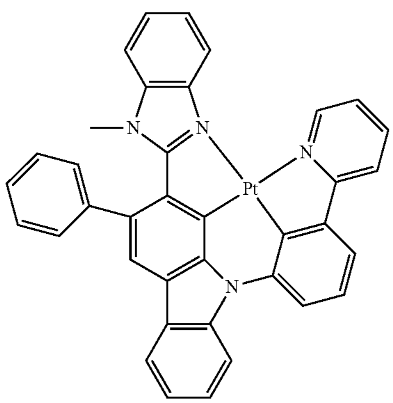
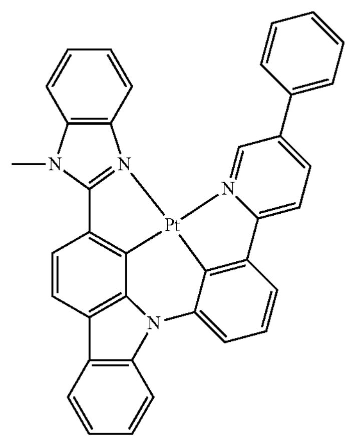
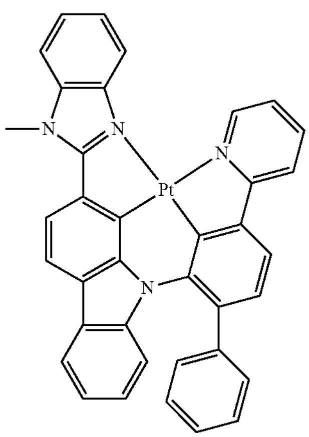
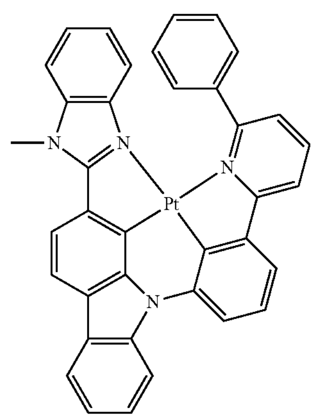

-continued
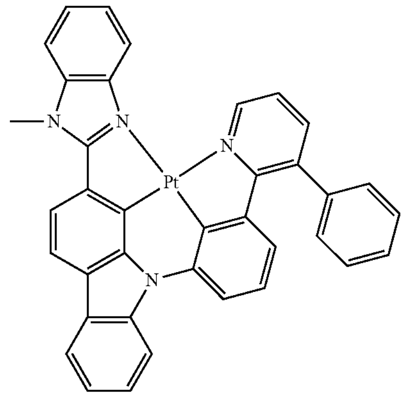
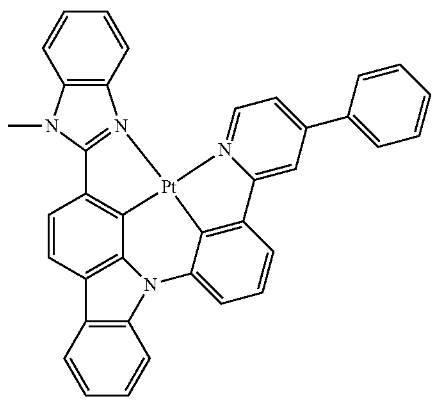
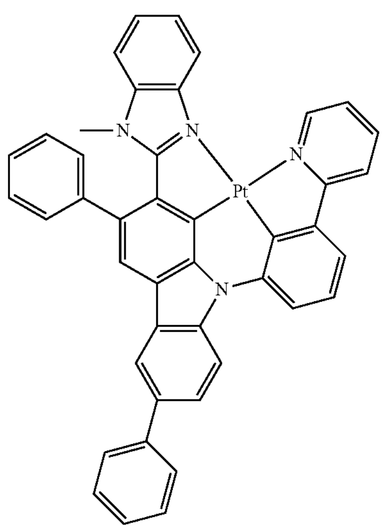
-continued
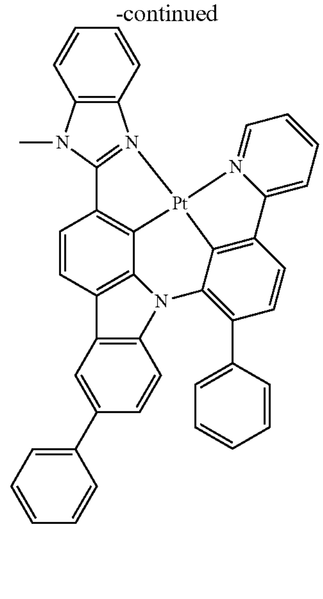
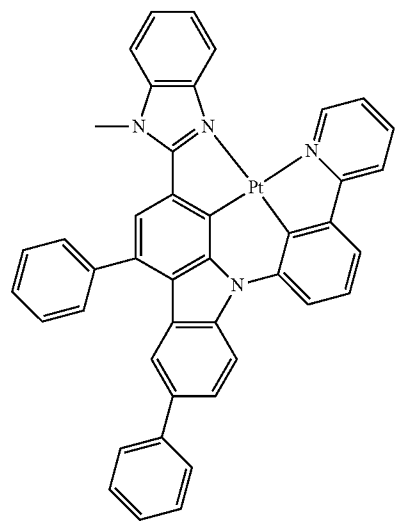
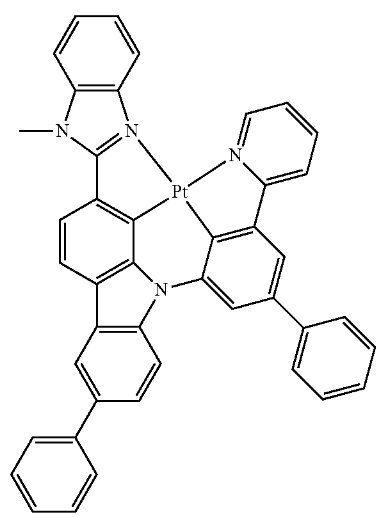

-continued
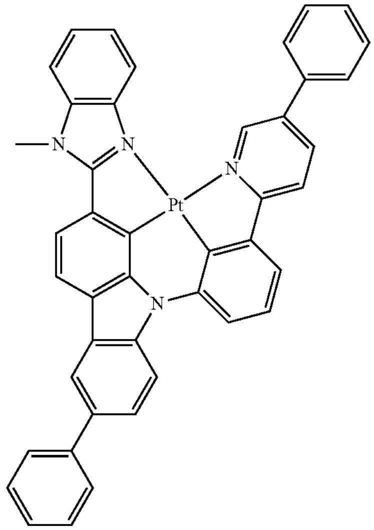
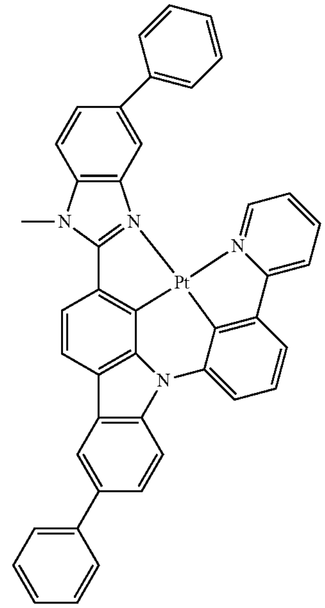
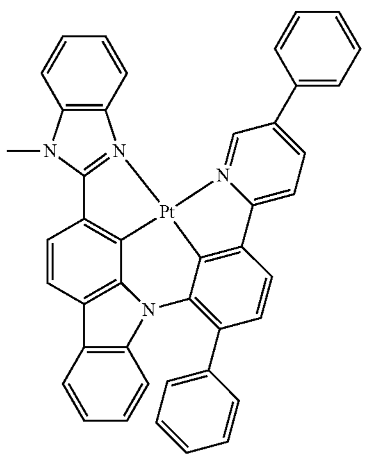
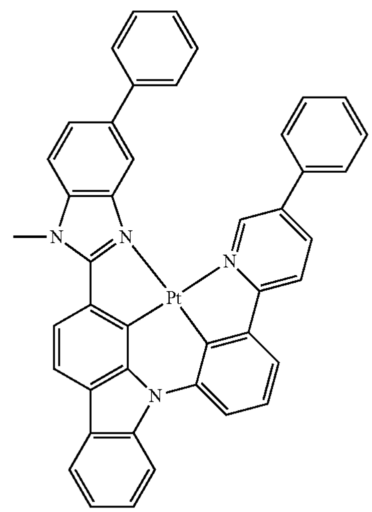
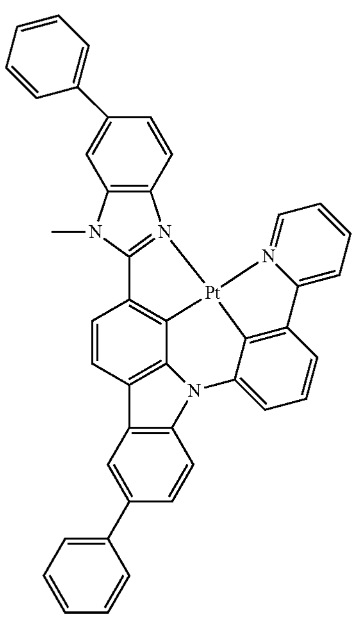
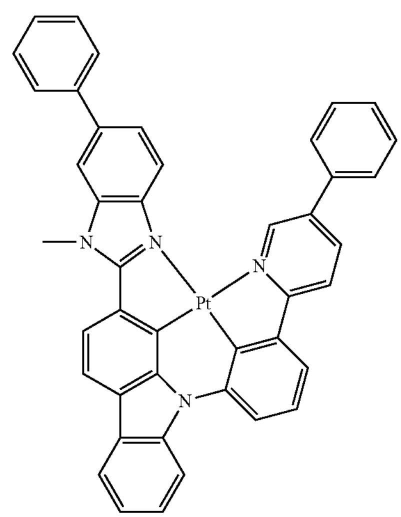

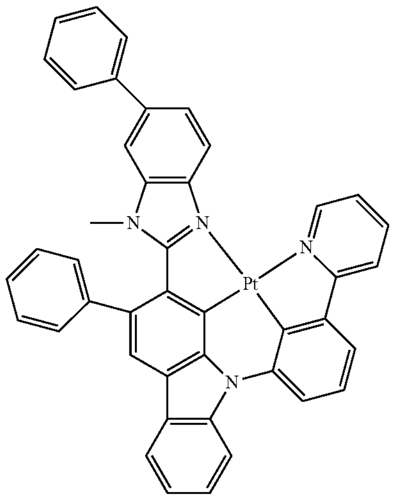
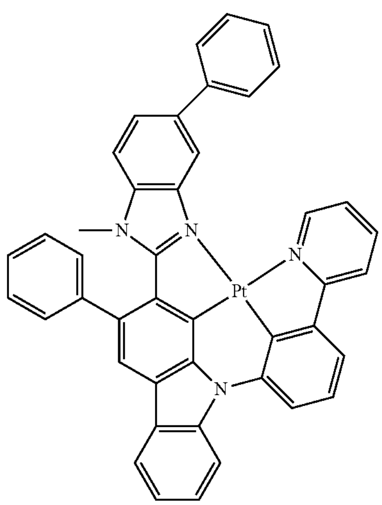
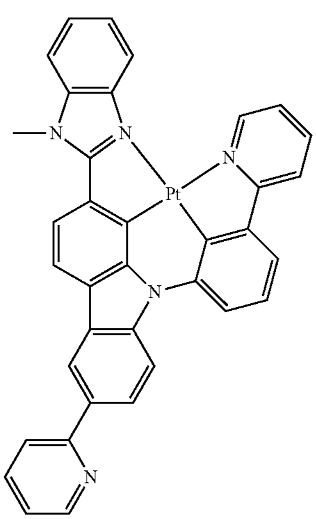
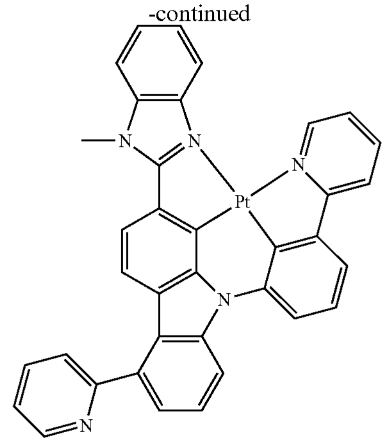
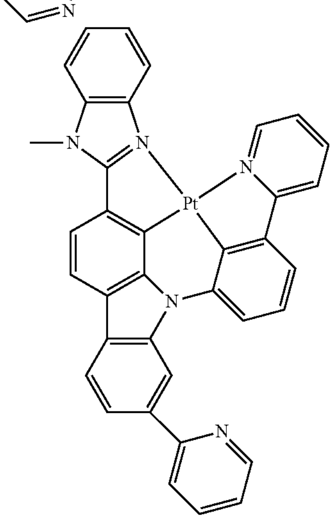
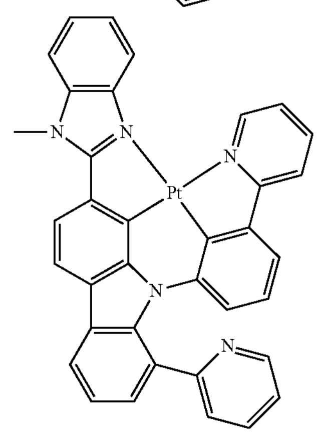
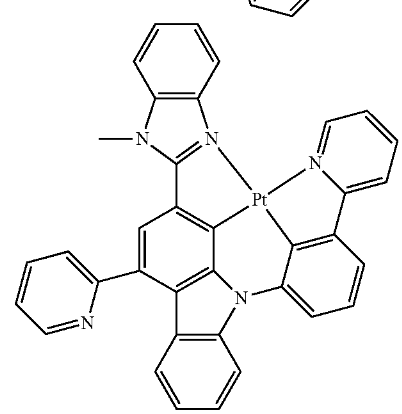

-continued
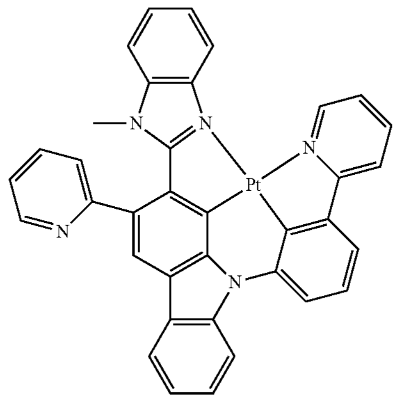
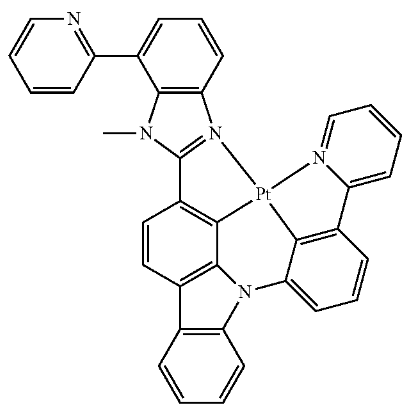
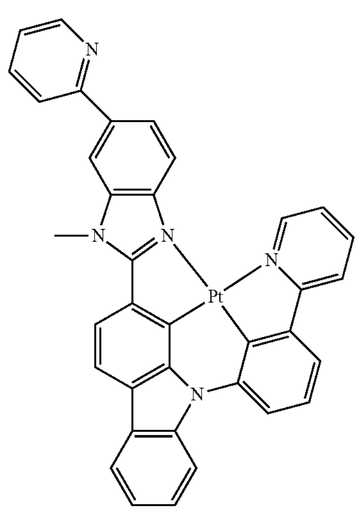
-continued
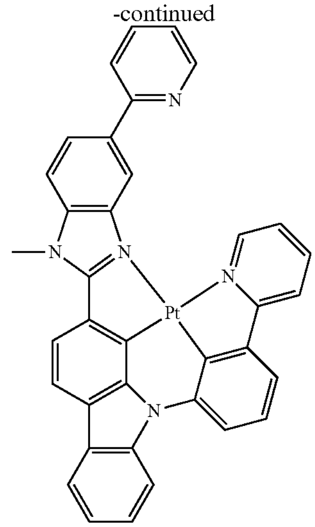
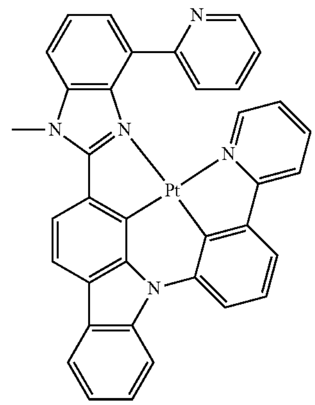
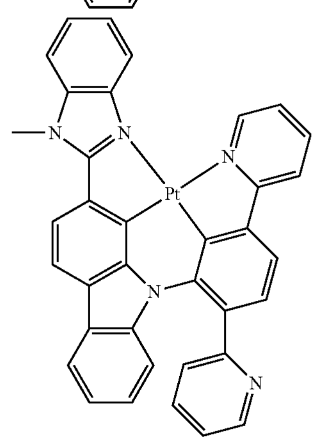
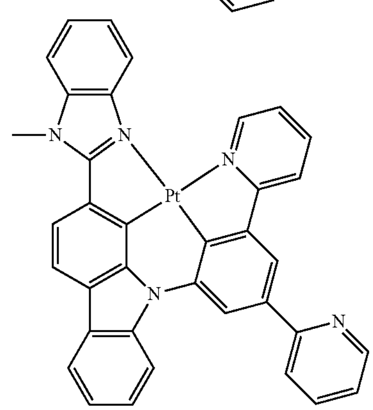

-continued
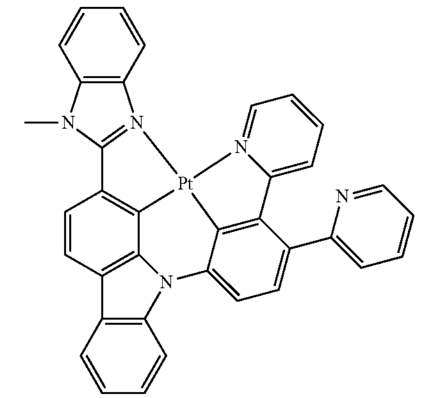
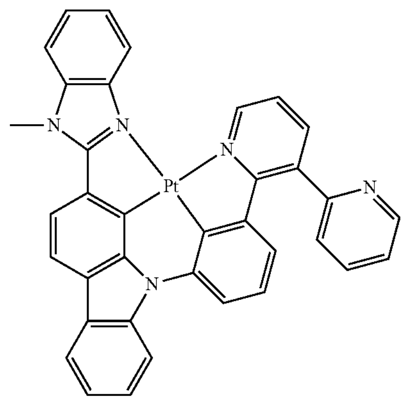
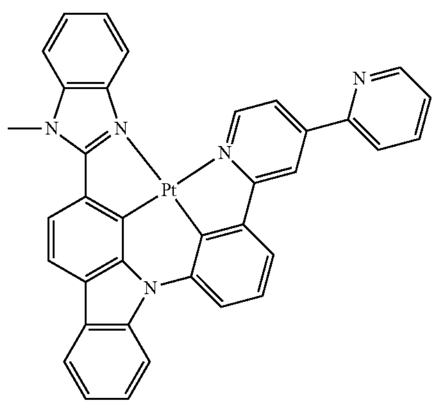
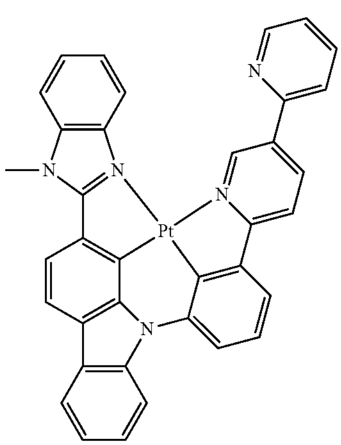
-continued
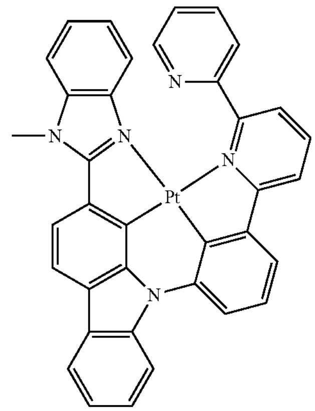
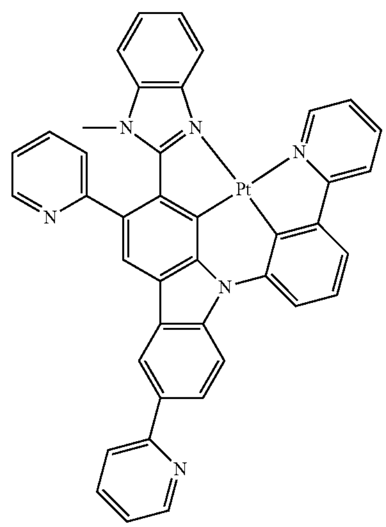
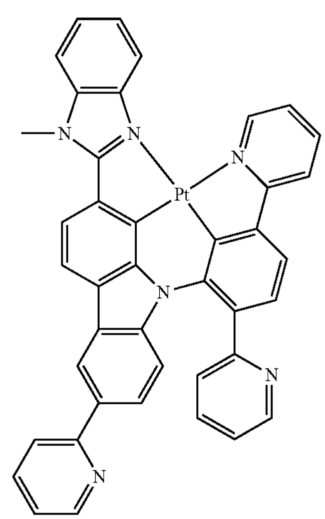

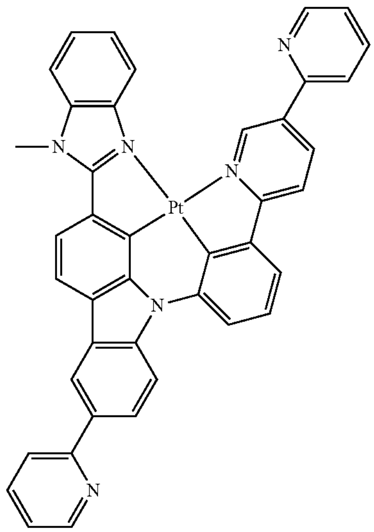
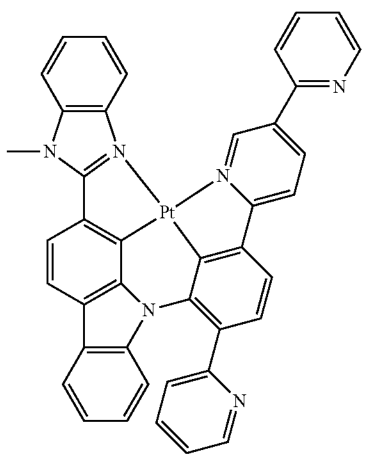
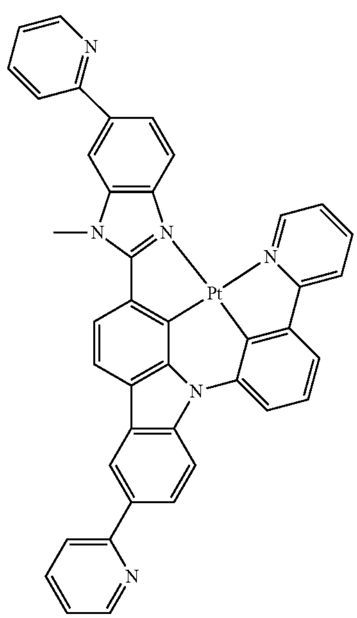
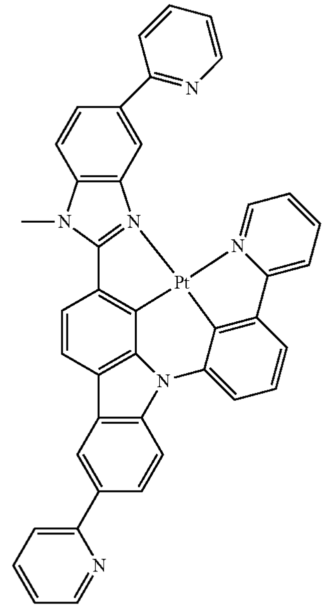
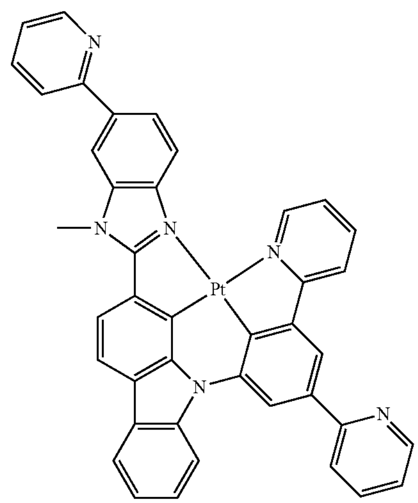
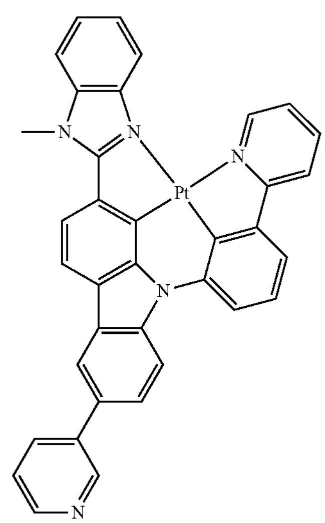

-continued
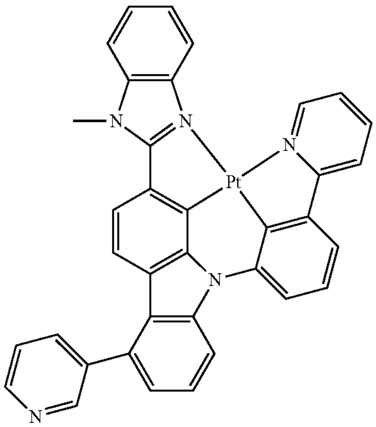
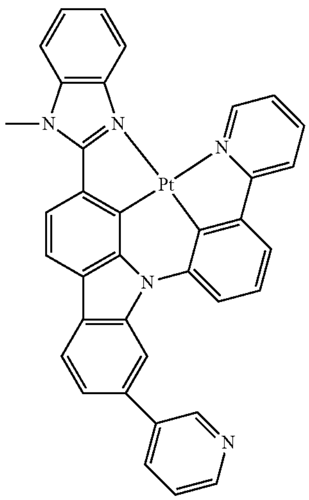
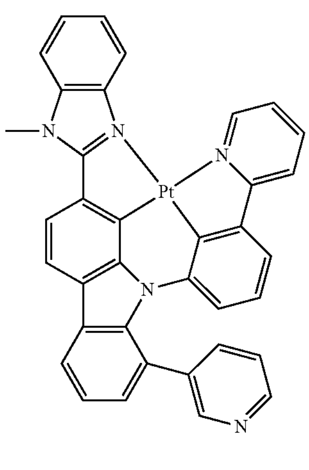
-continued
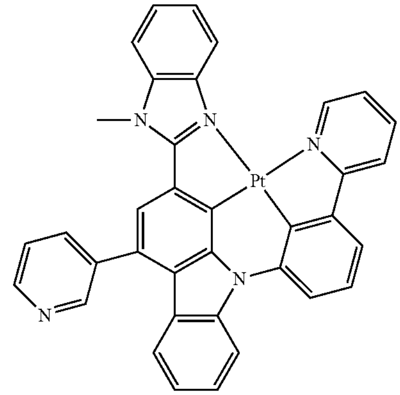
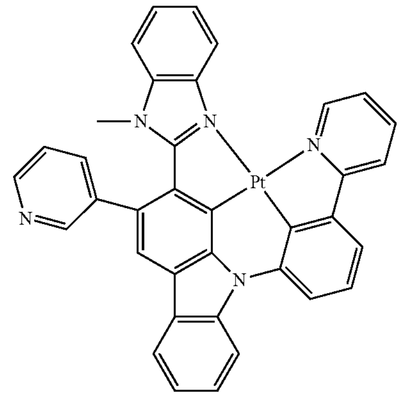
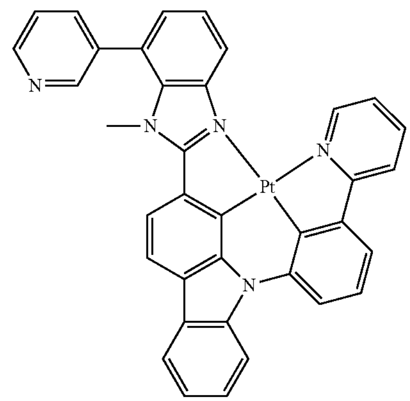
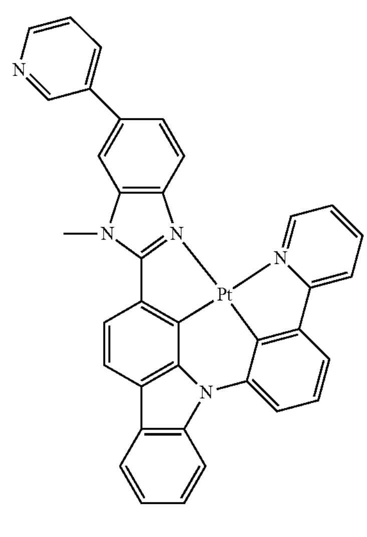

-continued
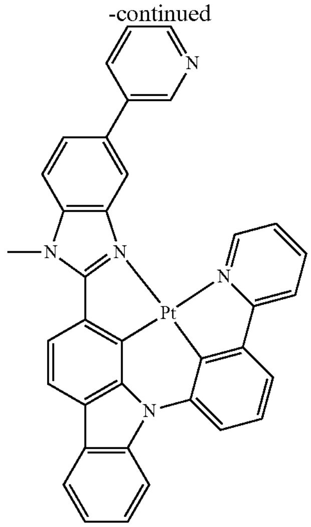
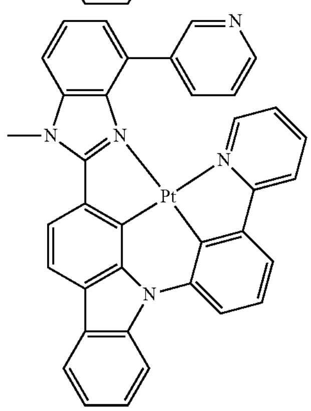
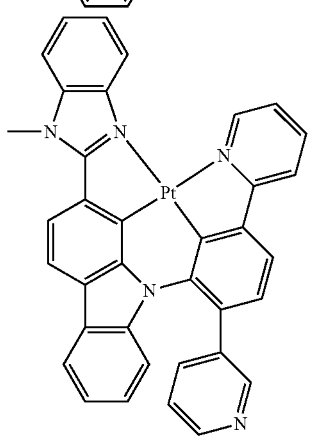
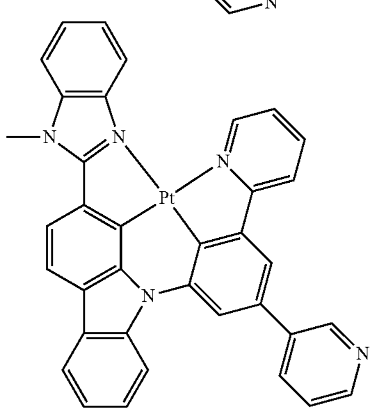
-continued
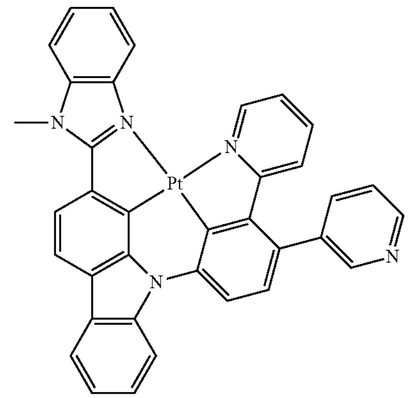
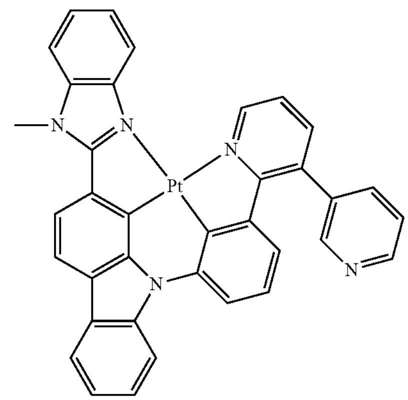
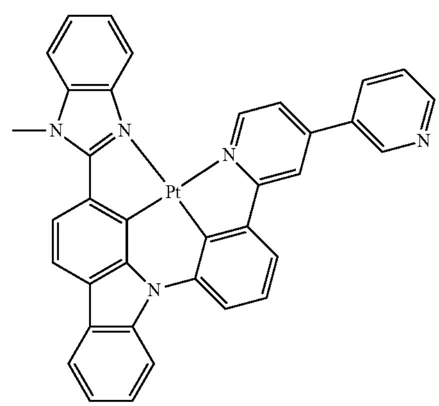
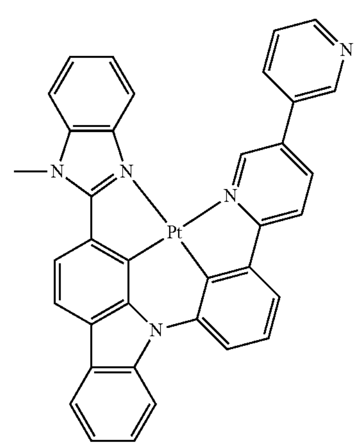

-continued
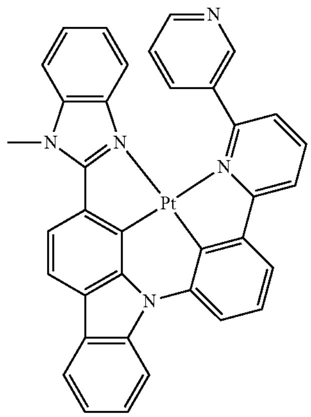
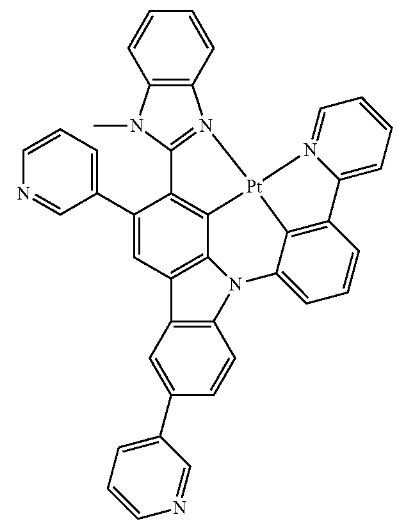
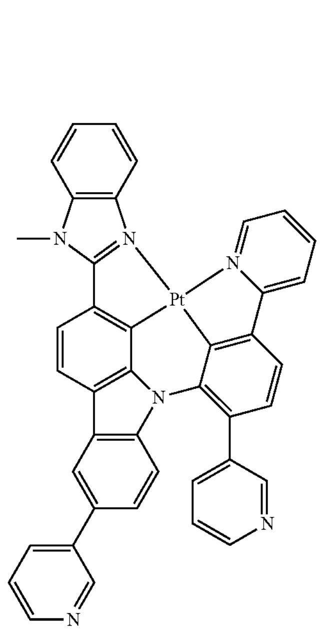
-continued
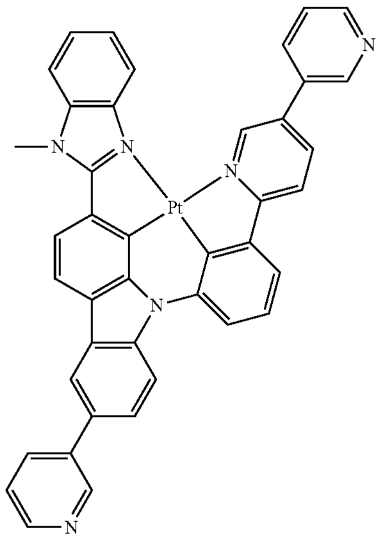
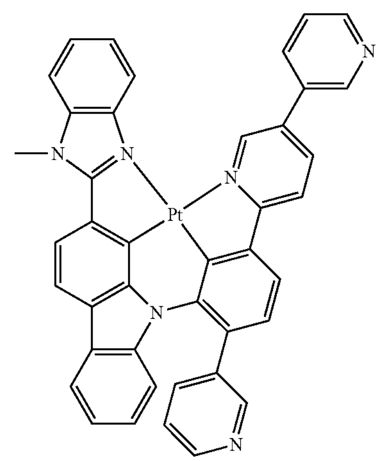
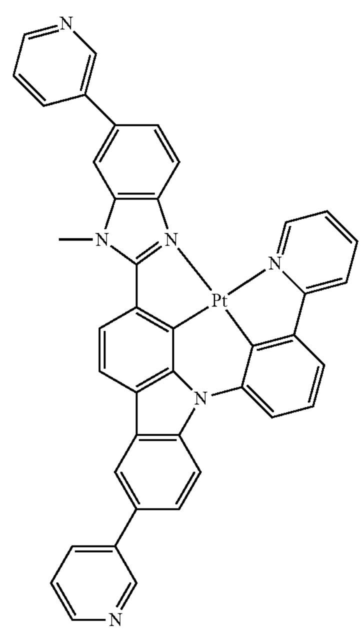

-continued
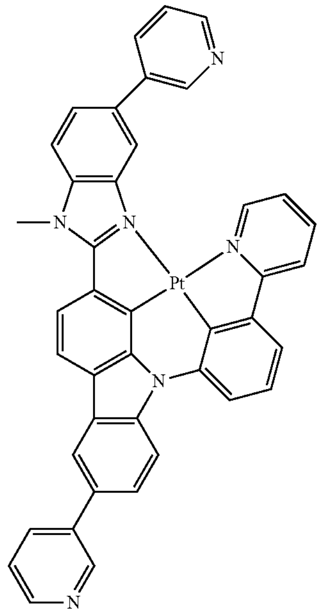
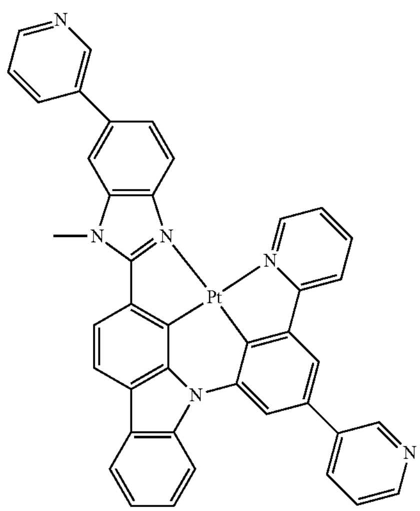
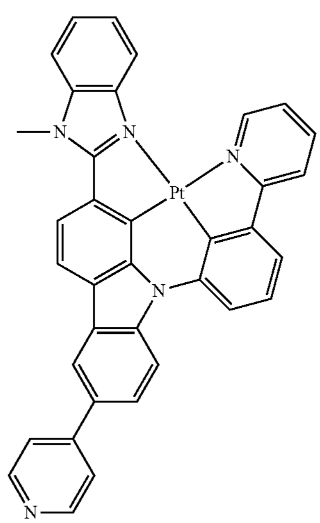
-continued
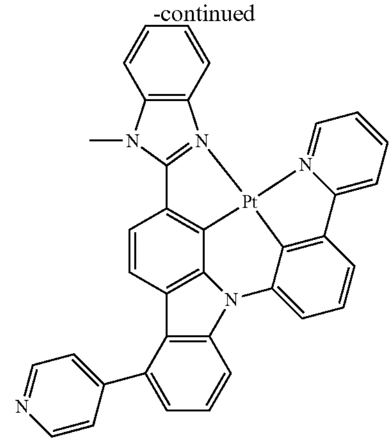
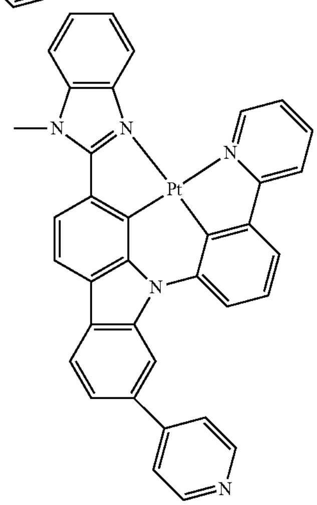
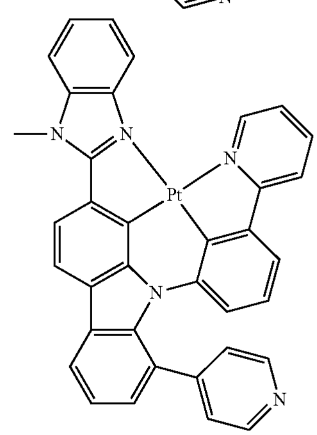
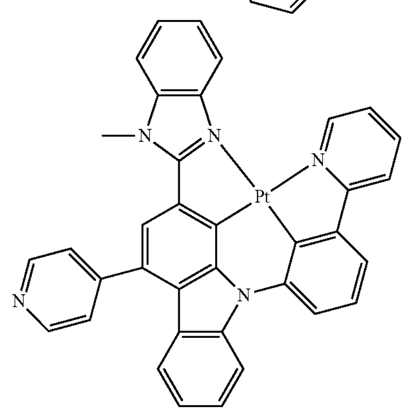

-continued
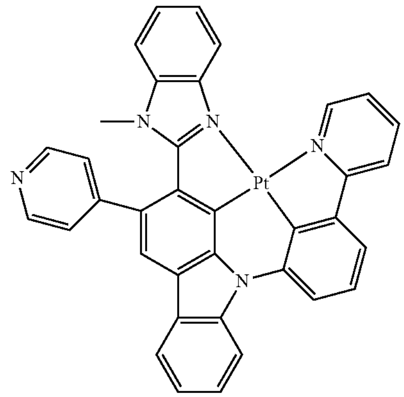
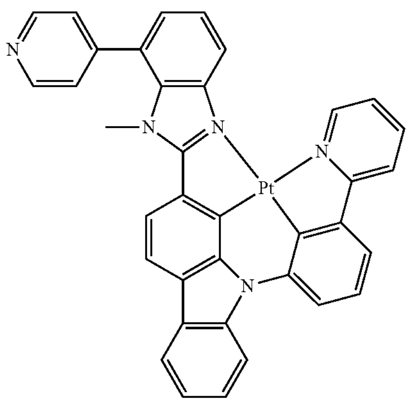
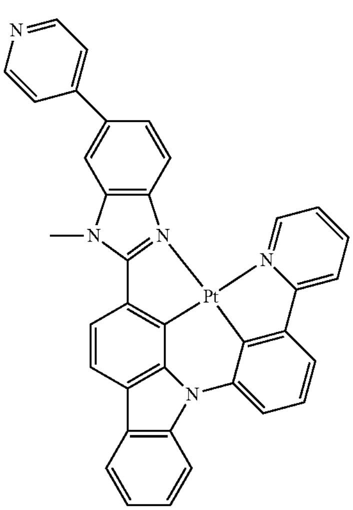
-continued
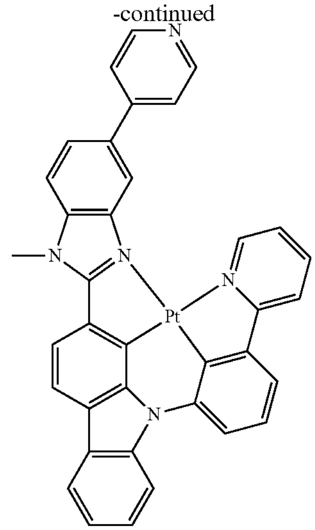
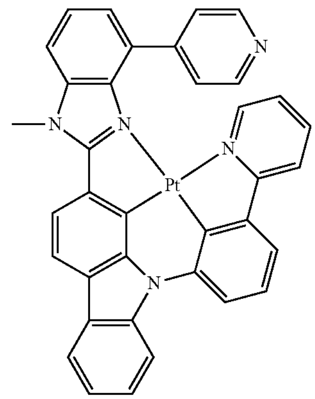
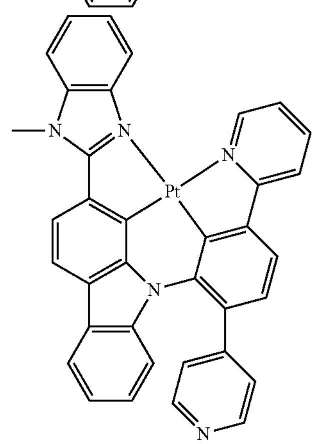
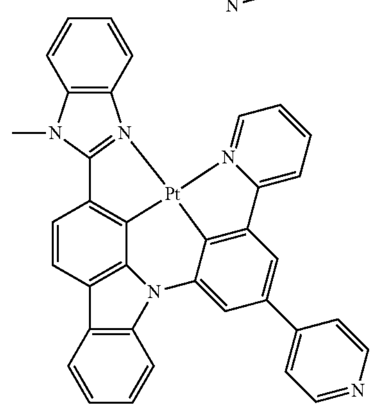

-continued
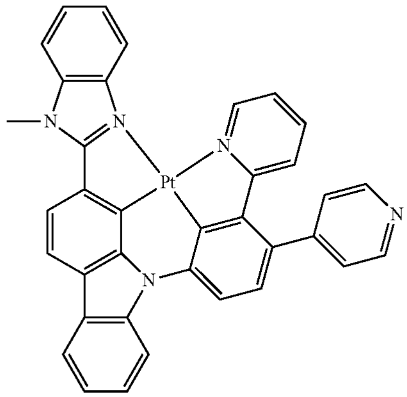
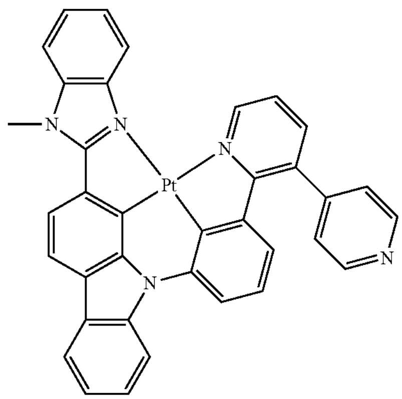
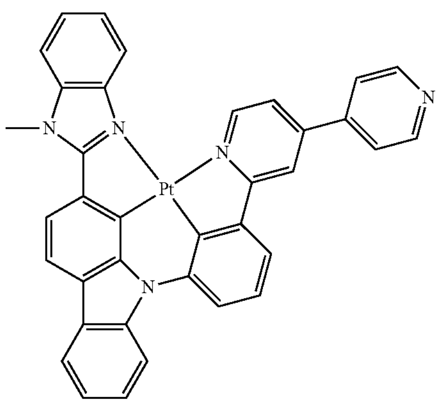
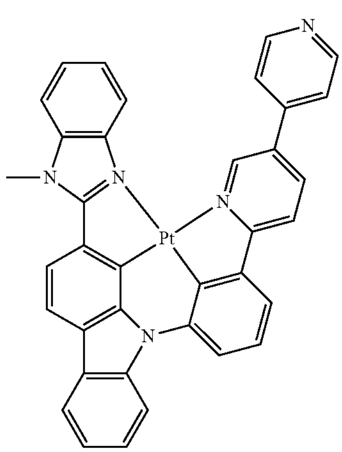
-continued
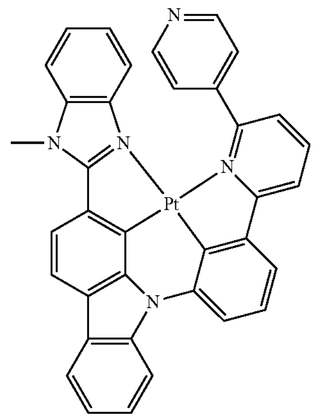
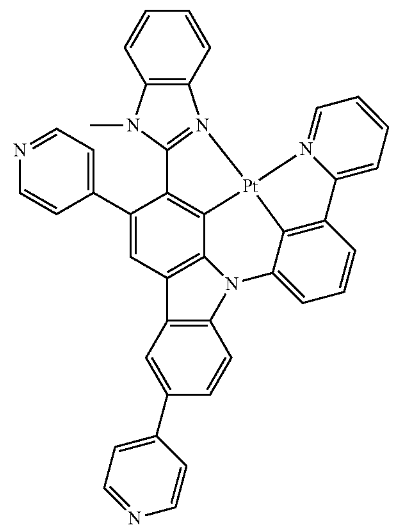
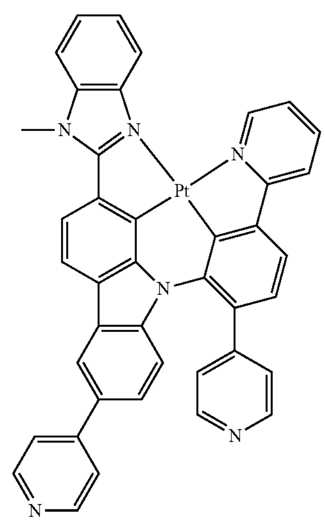

-continued
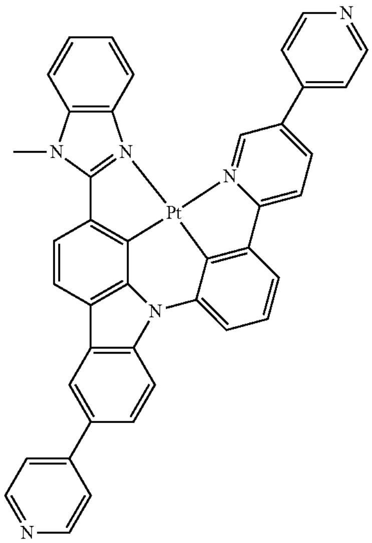
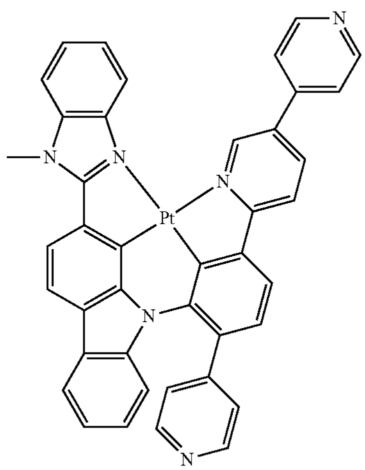
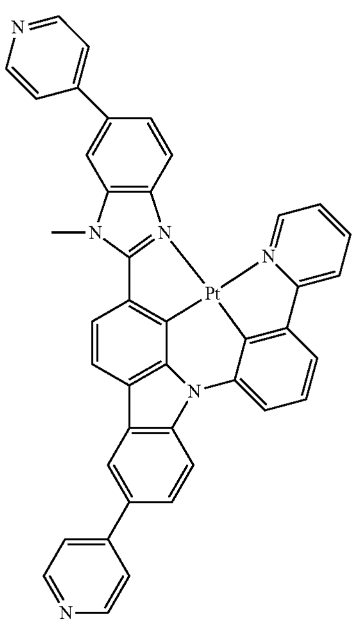
-continued
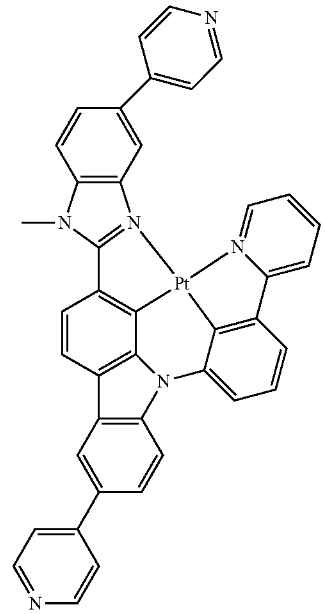
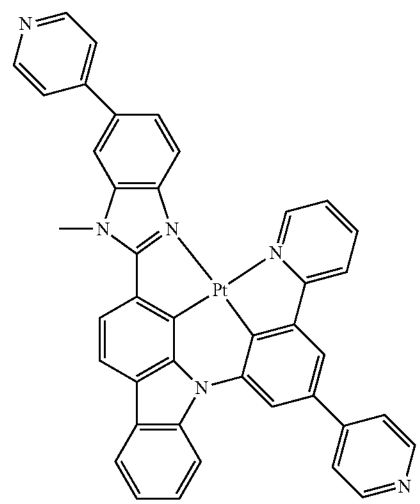
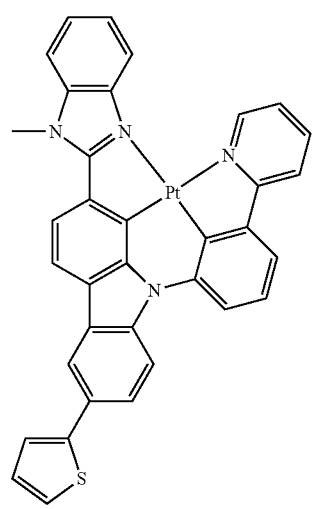

-continued
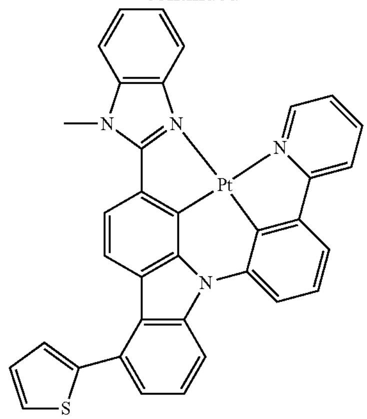
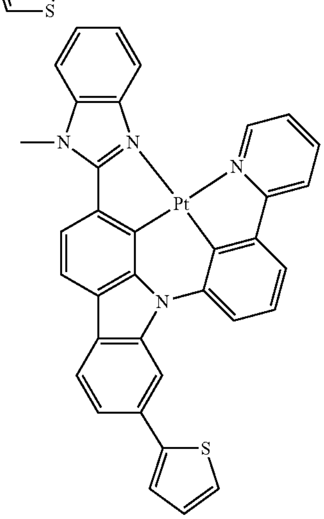
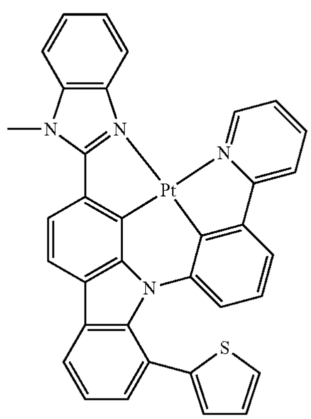
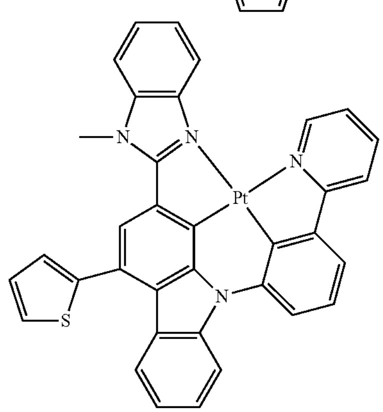
-continued
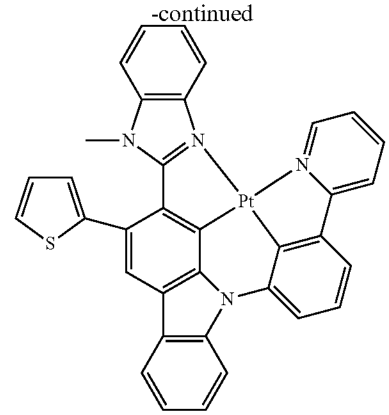
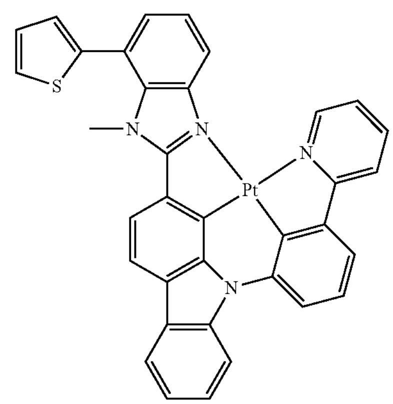
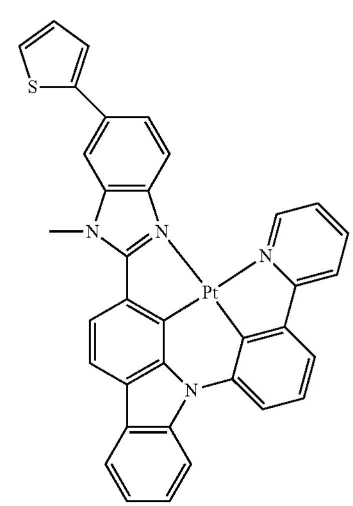

-continued
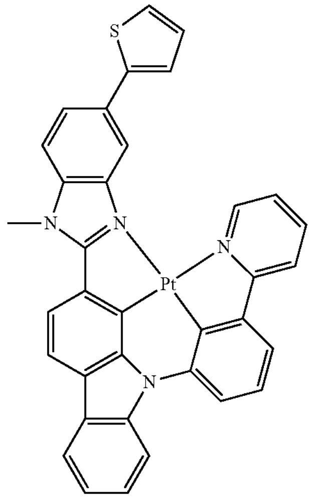
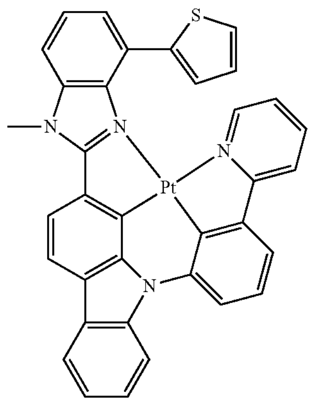
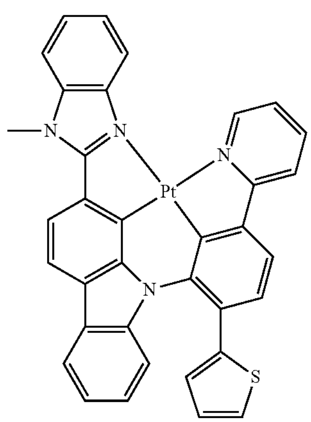
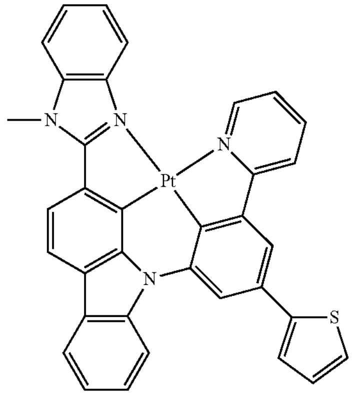
-continued
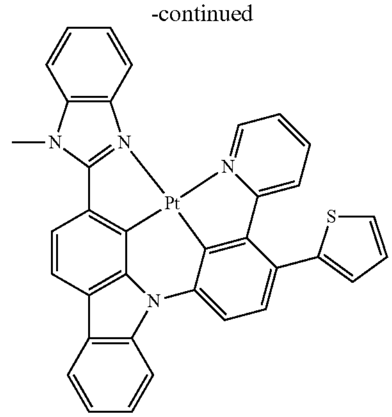
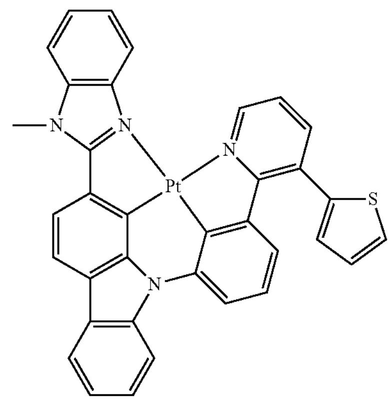
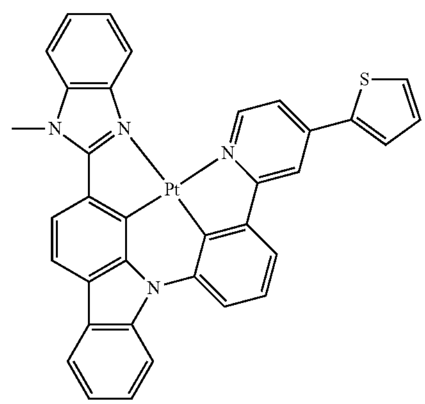
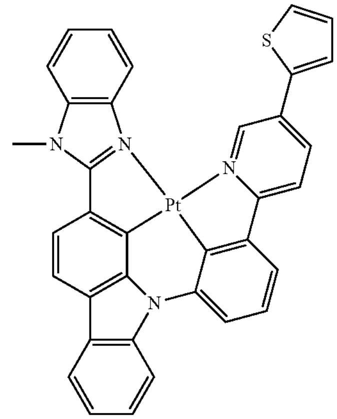

-continued
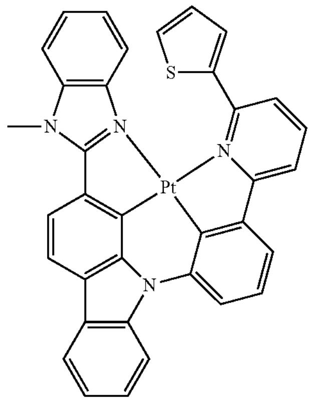
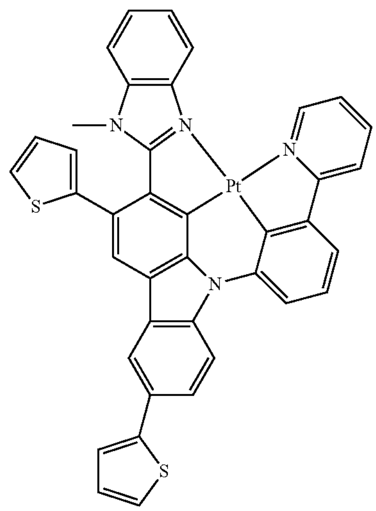
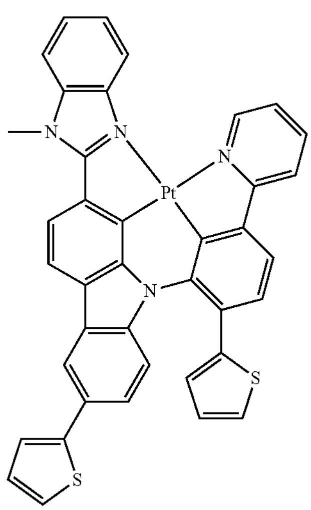
-continued
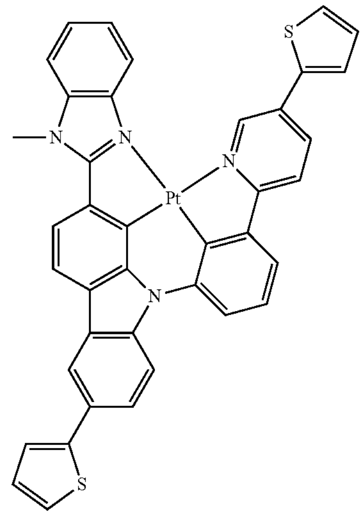
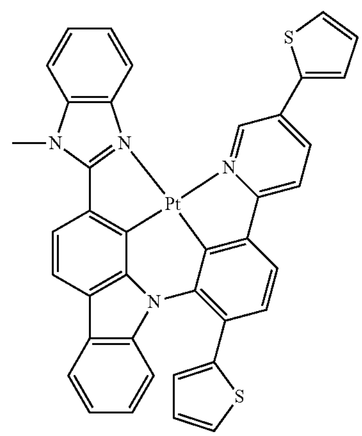
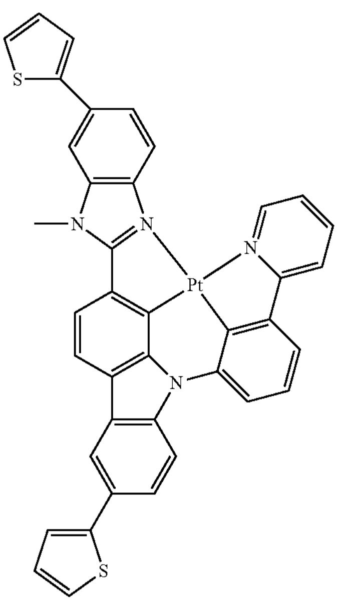

-continued
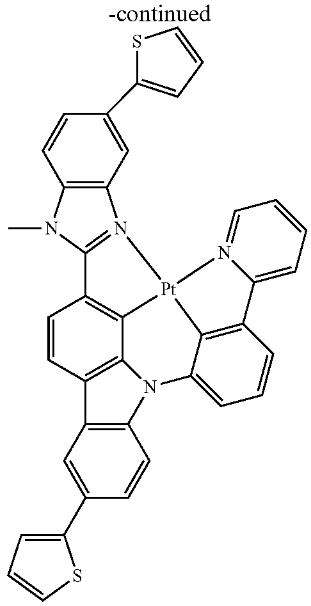
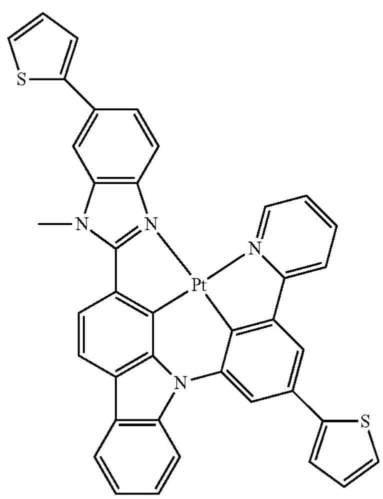
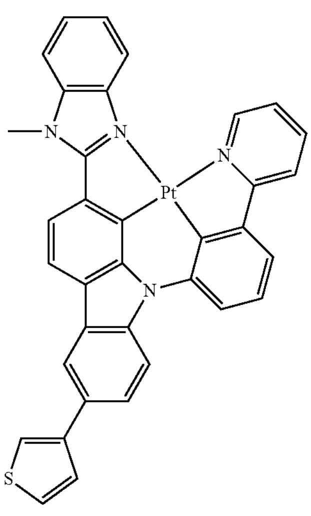
-continued
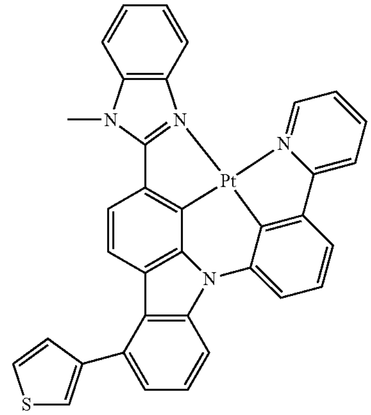
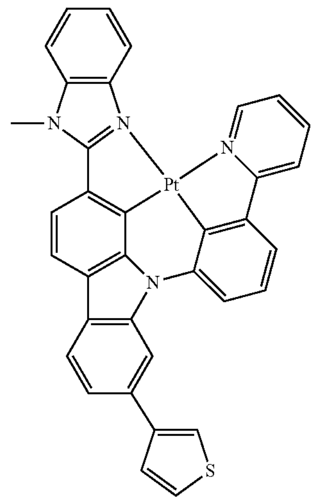
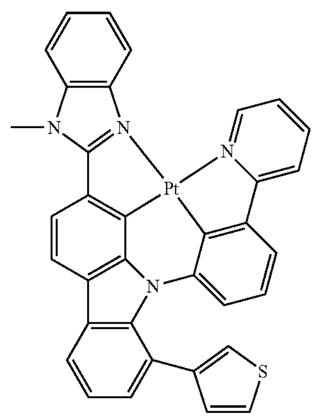
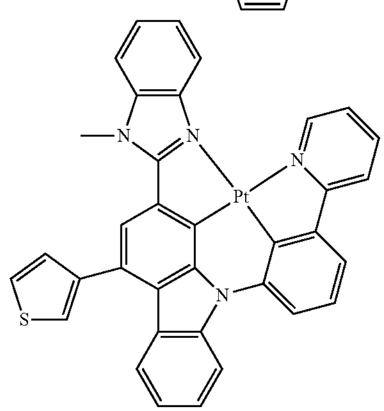

-continued
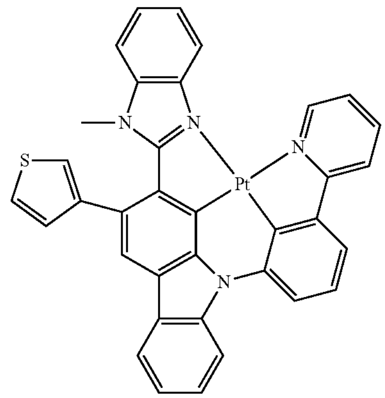
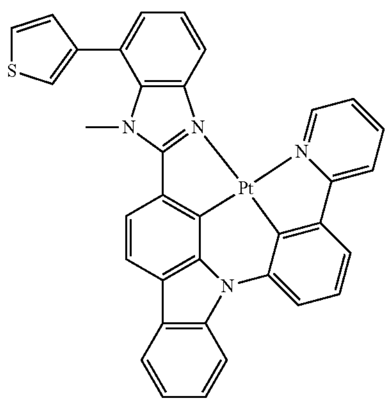
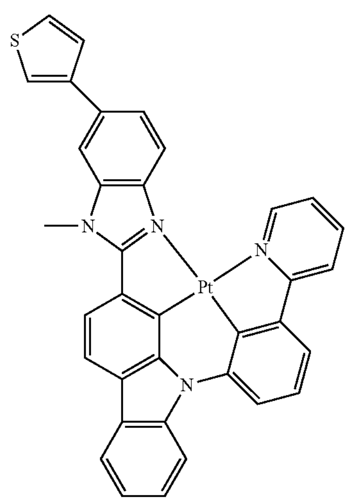
-continued
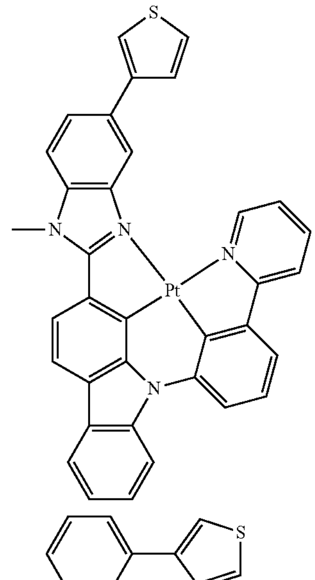
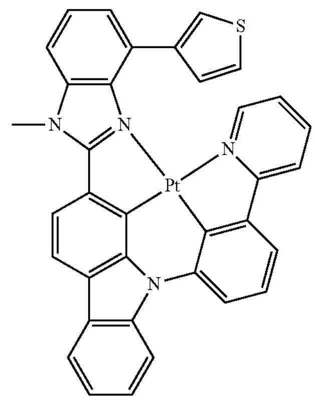
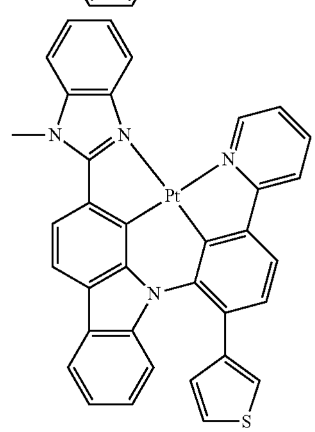
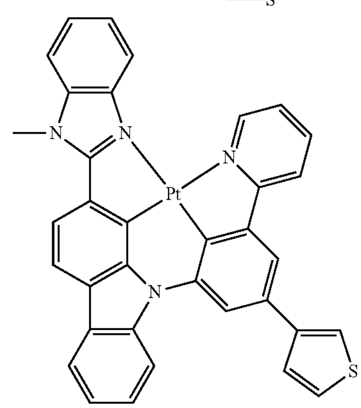

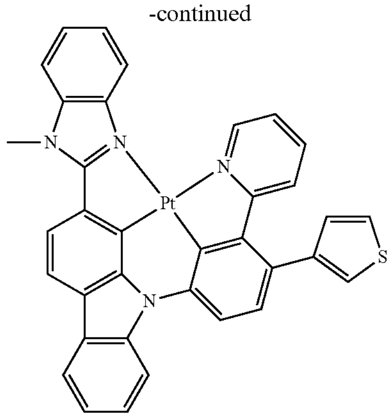
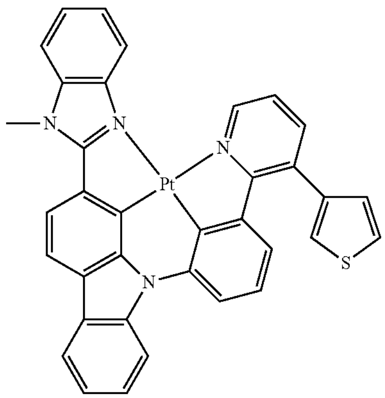
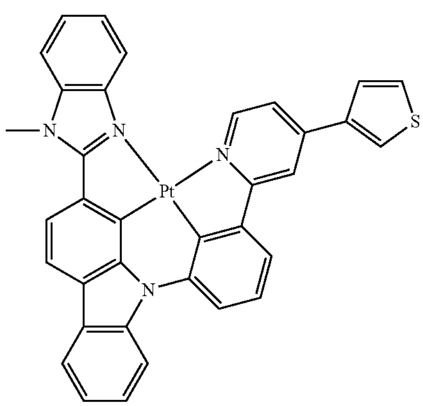
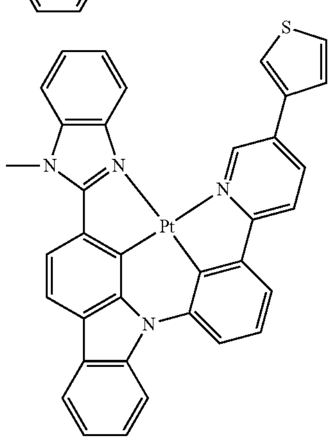
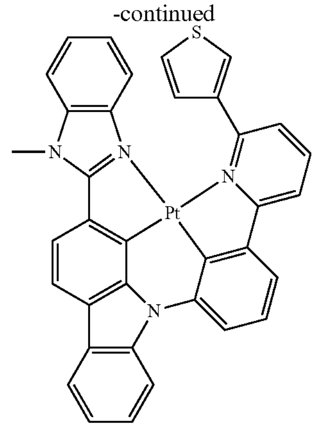
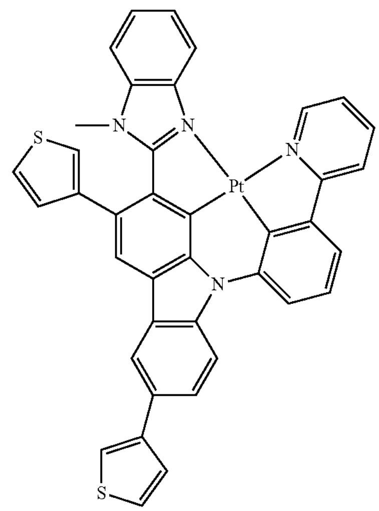
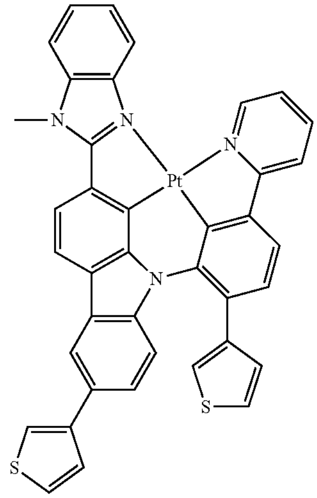

-continued
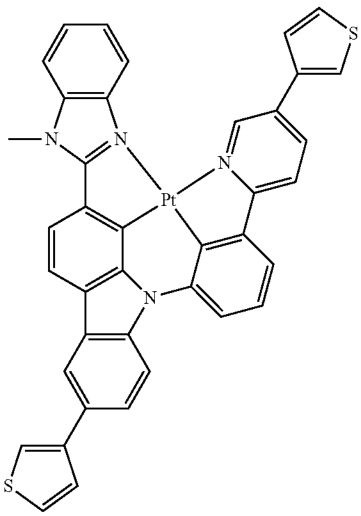
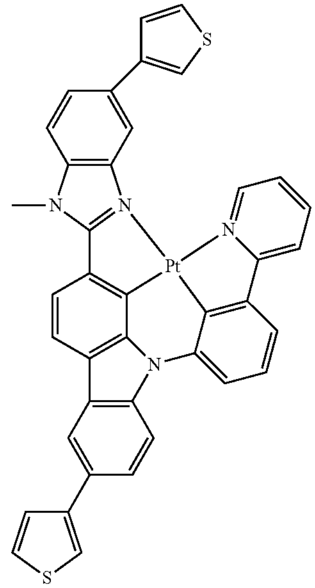
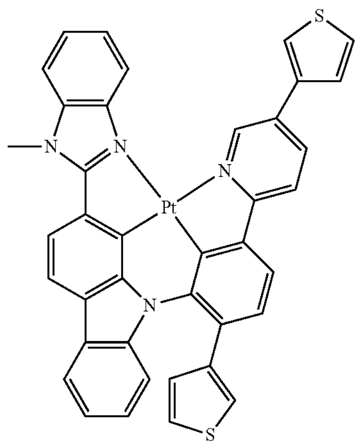
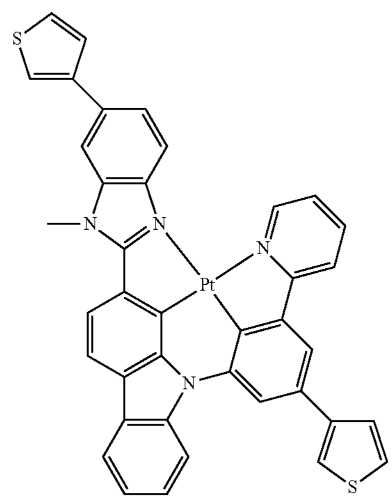
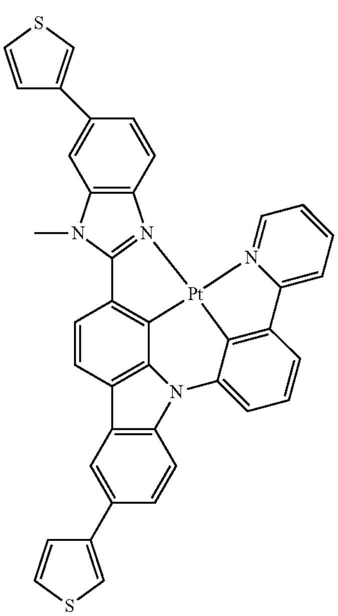
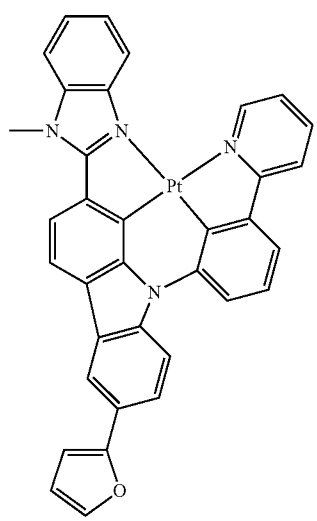

-continued
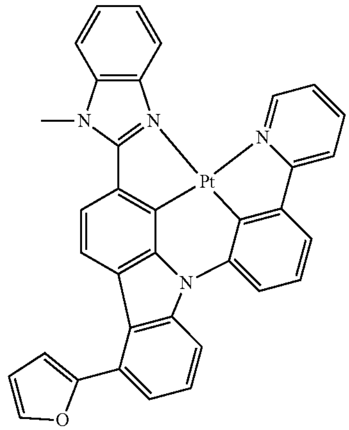
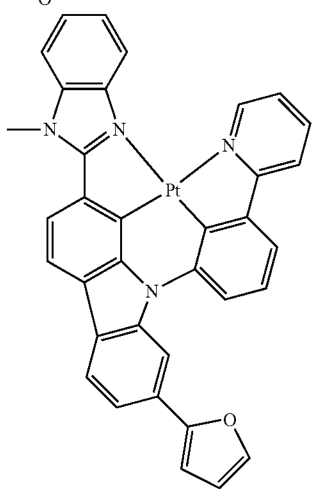
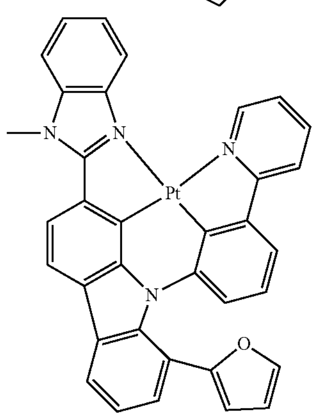
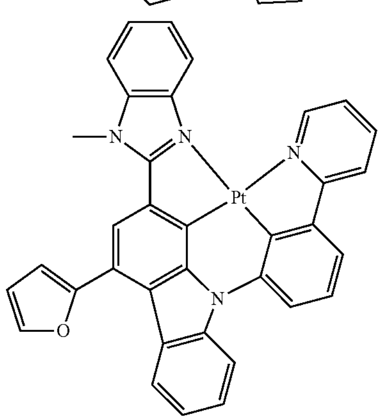
-continued
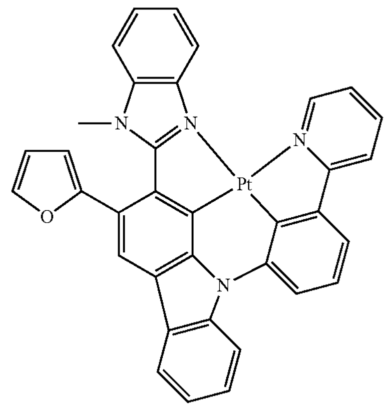
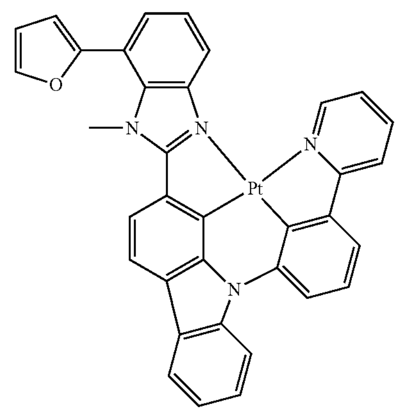
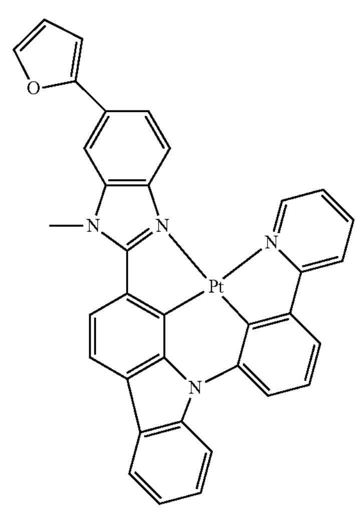

-continued
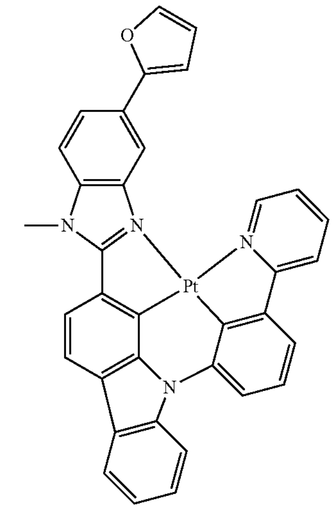
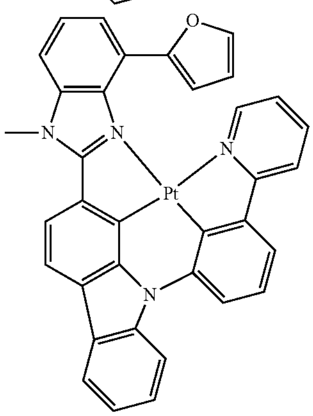
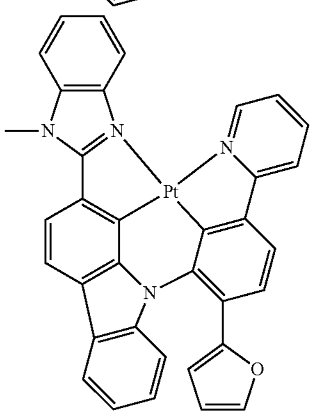
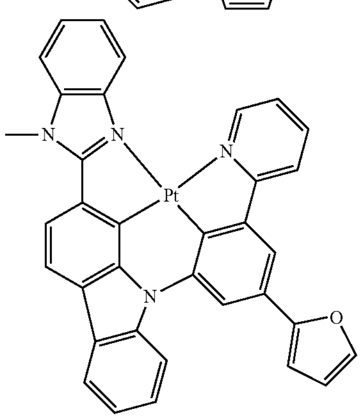
-continued
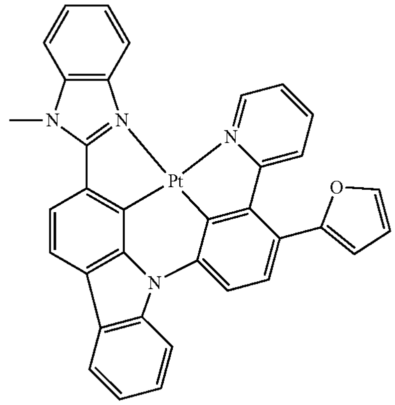
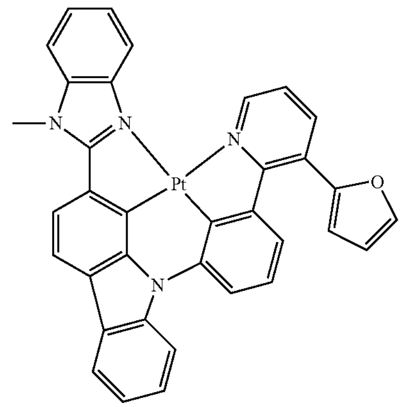
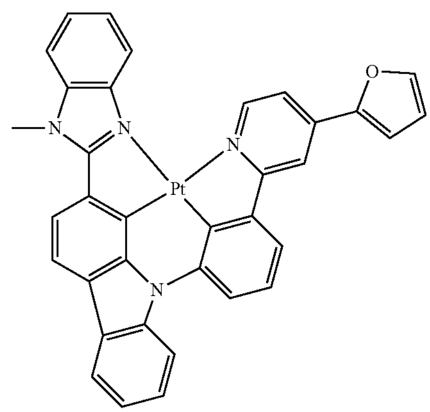
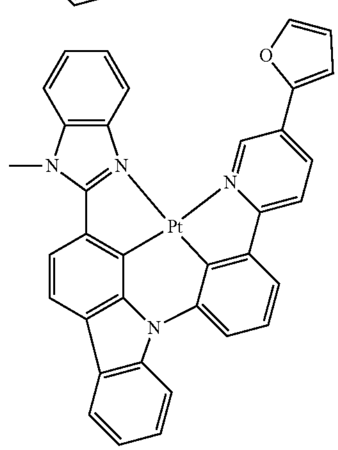

-continued
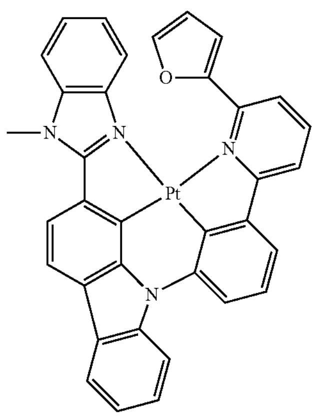
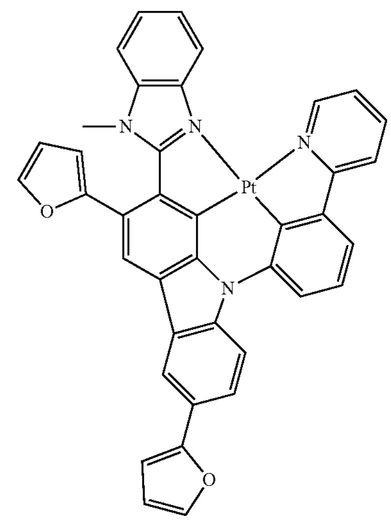
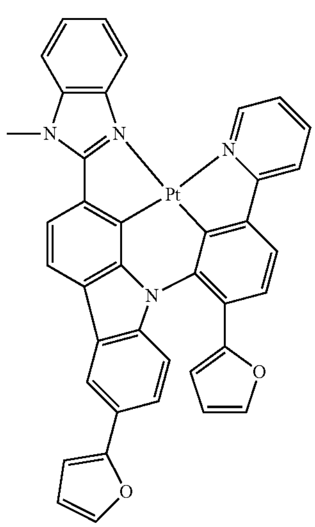
-continued
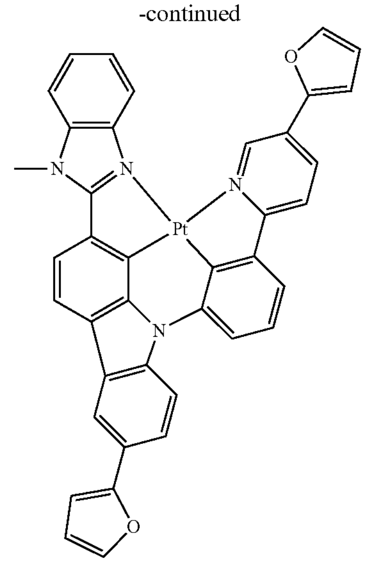
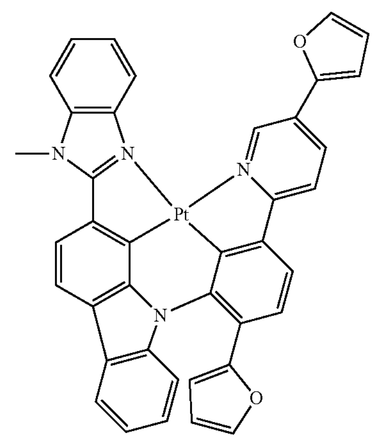
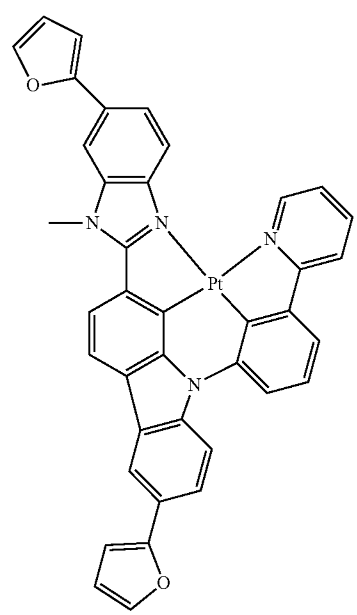

-continued
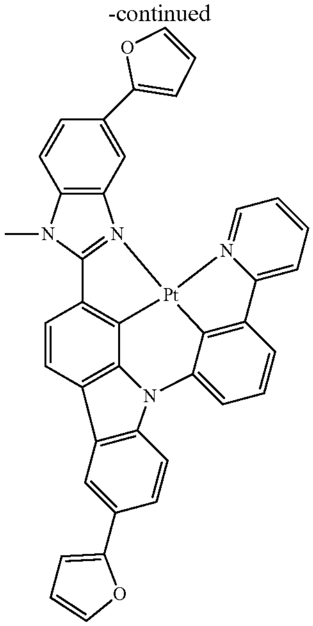
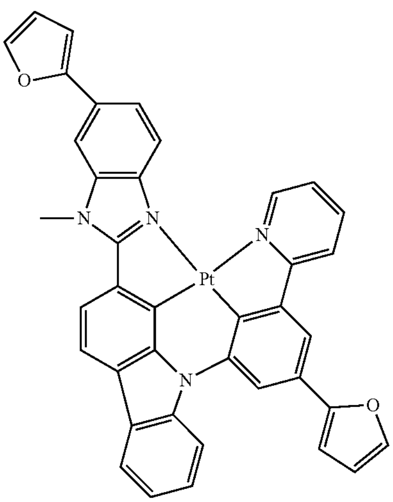
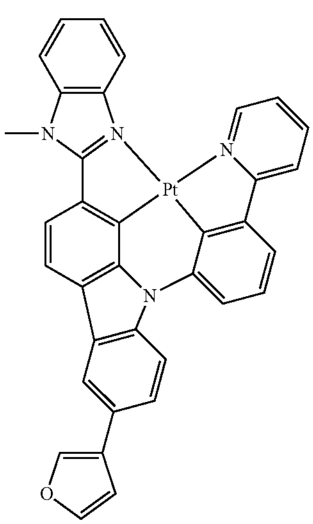
-continued
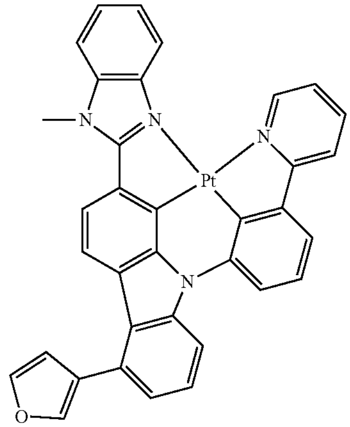
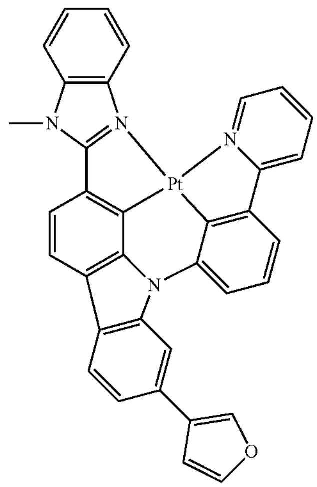
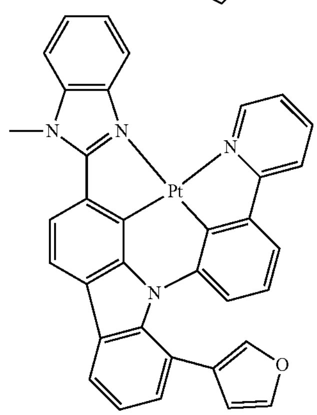
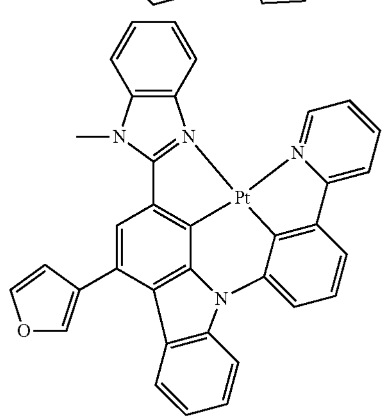

-continued
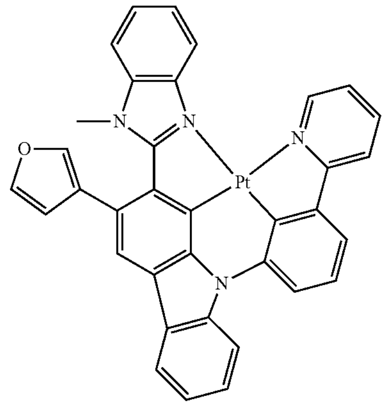
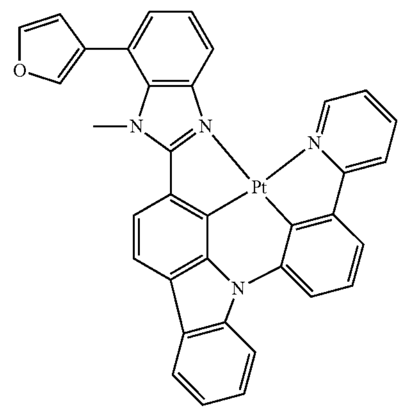
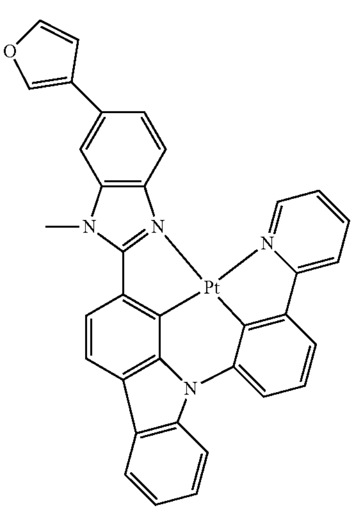
-continued
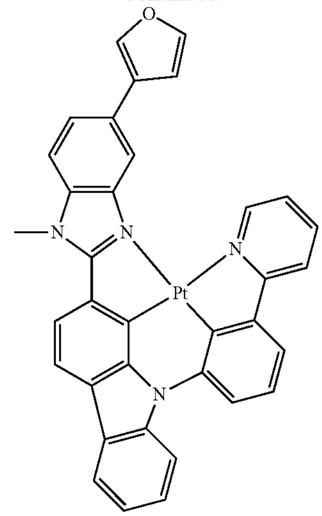
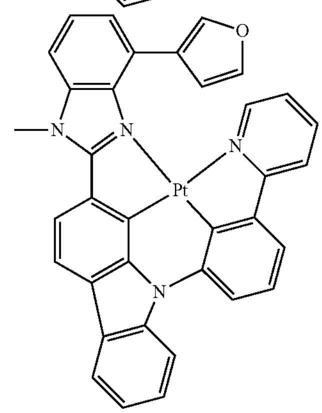
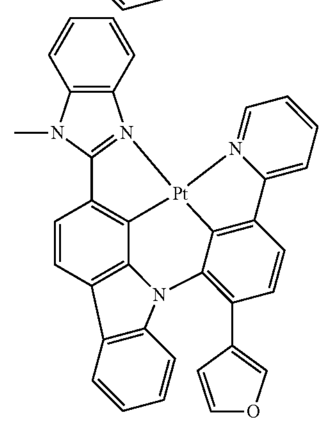
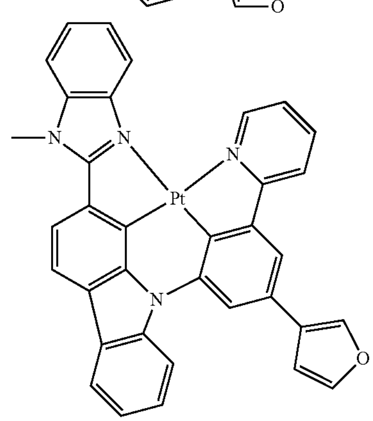

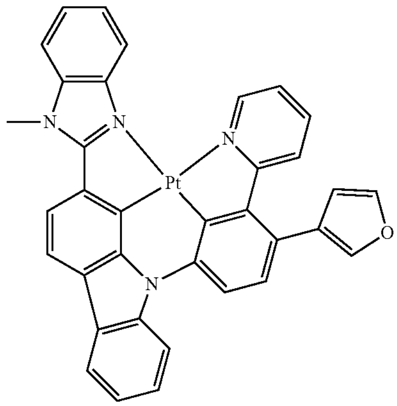
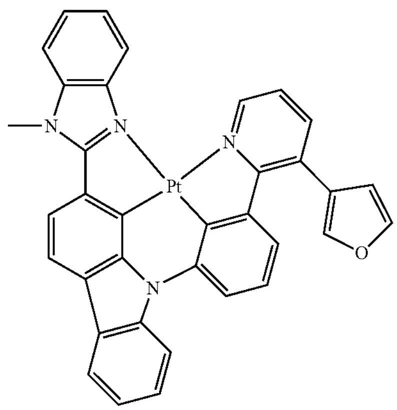
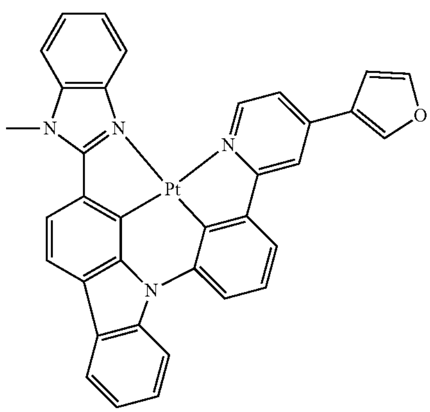
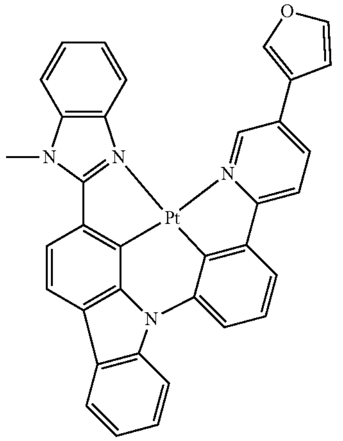
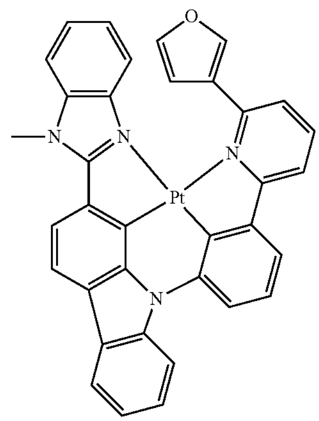
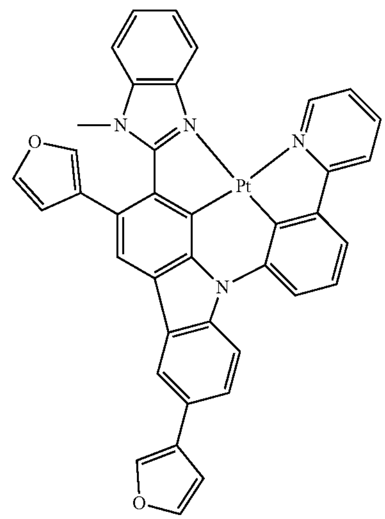
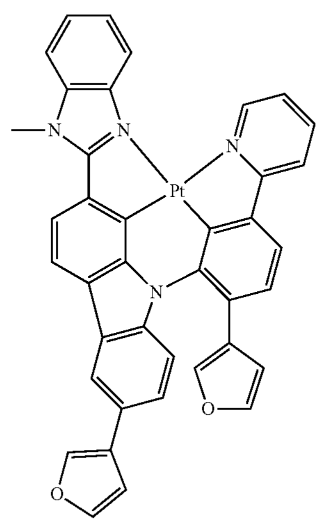

488
-continued
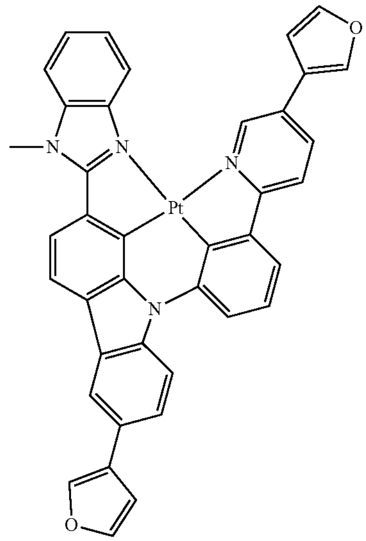
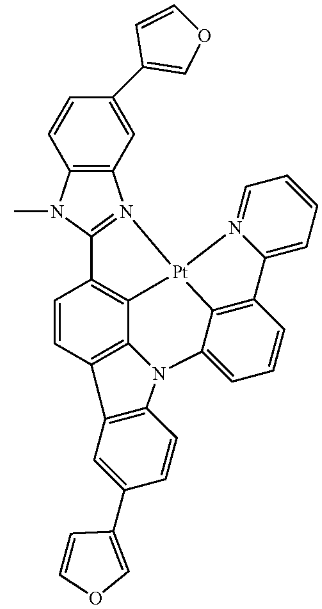
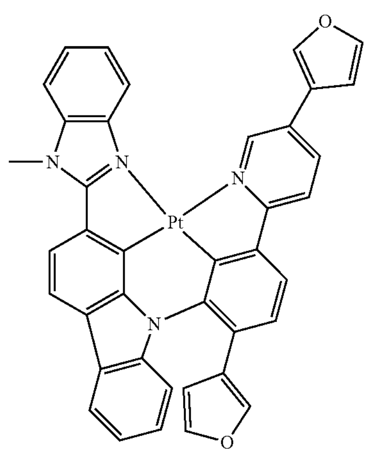
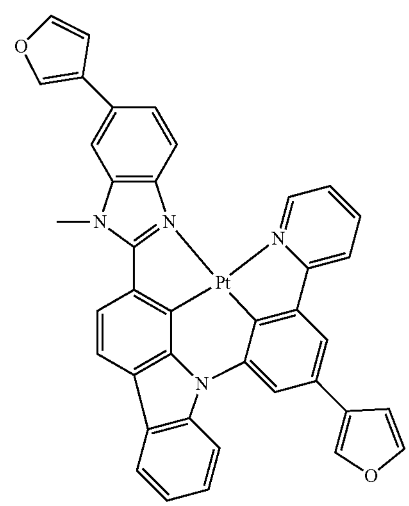
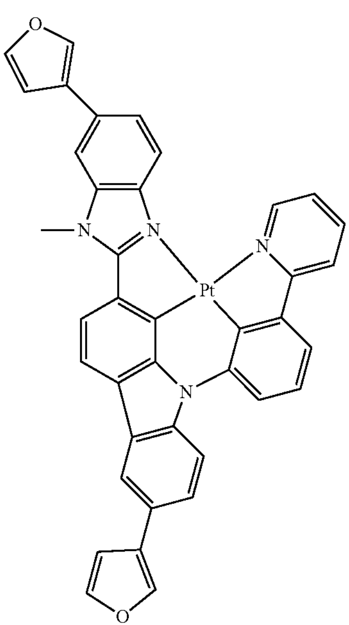
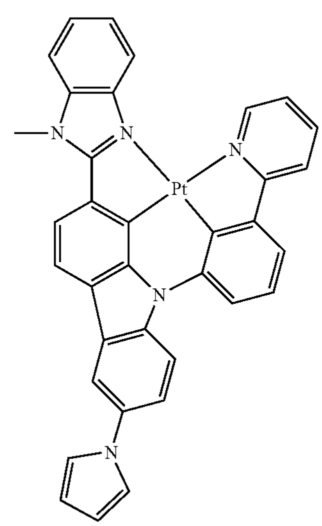

-continued
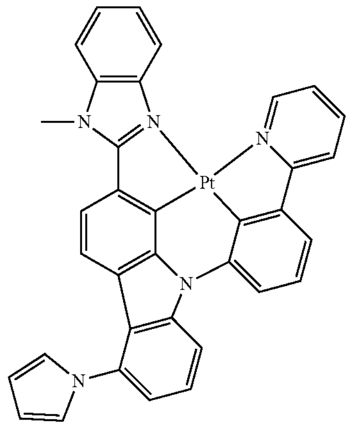
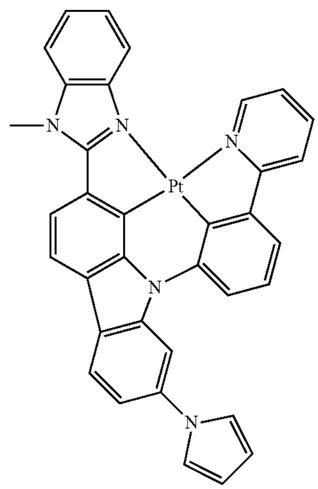
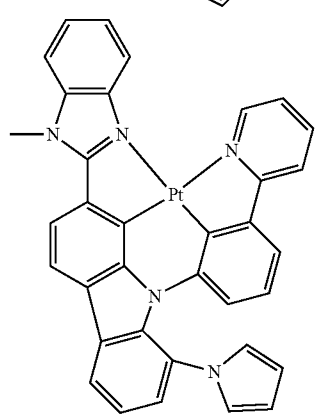
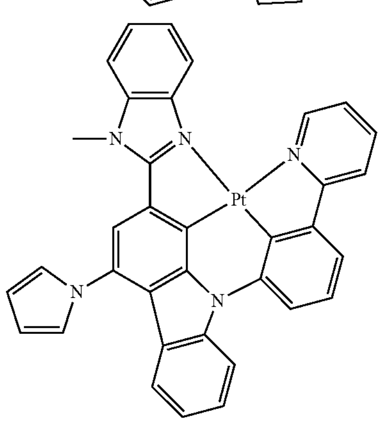
-continued
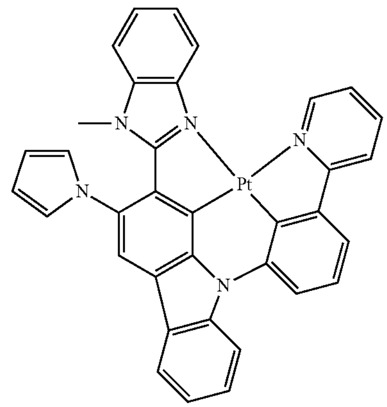
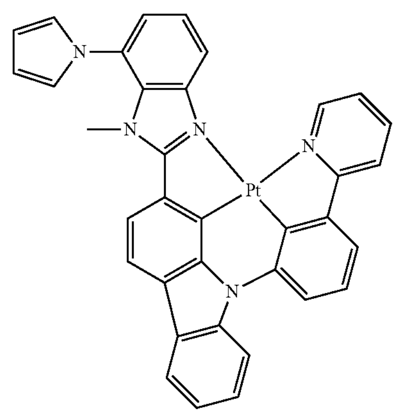
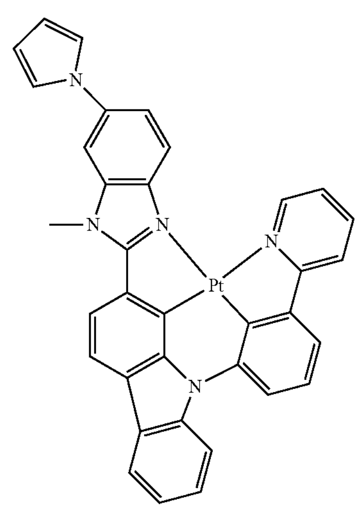

-continued
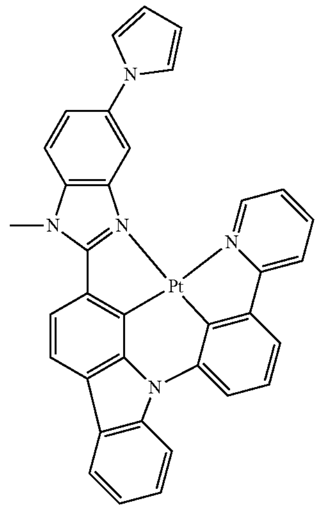
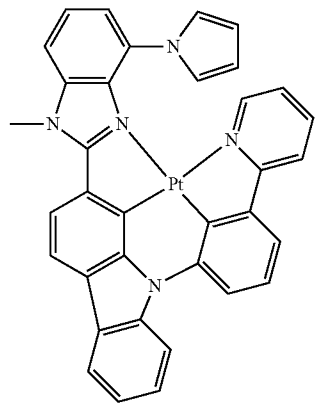
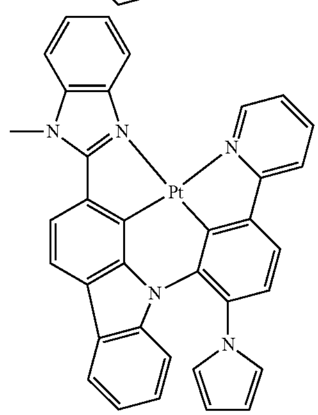
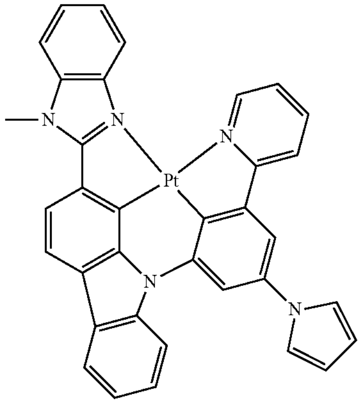
-continued
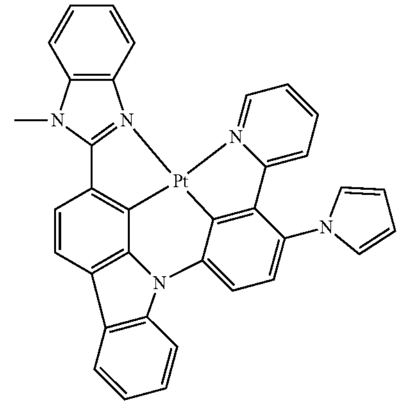
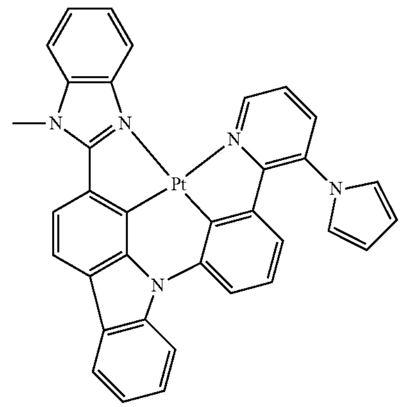
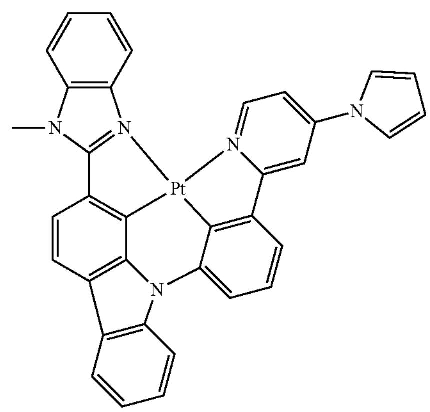
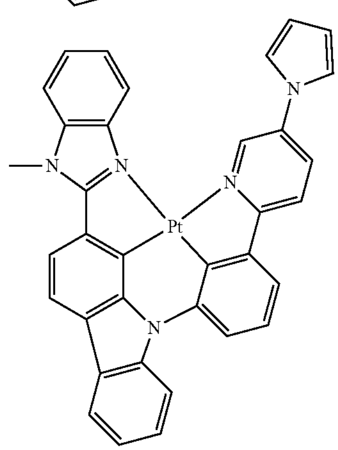

-continued
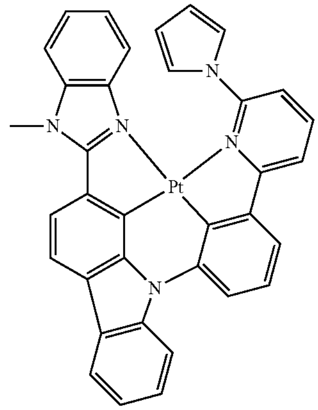
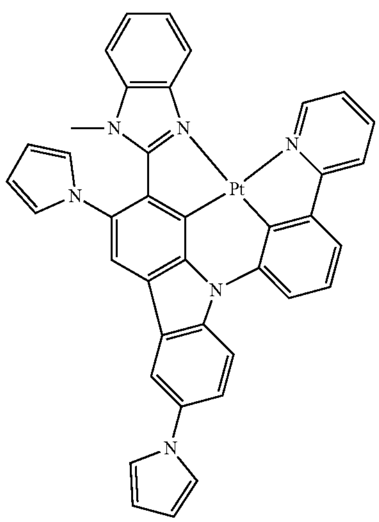
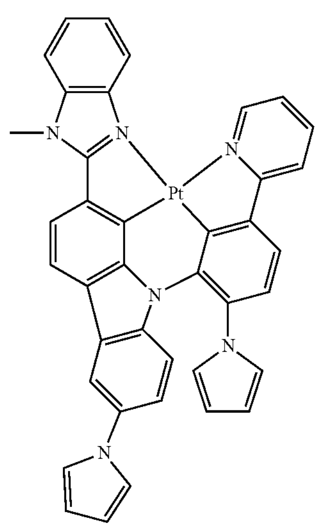
-continued
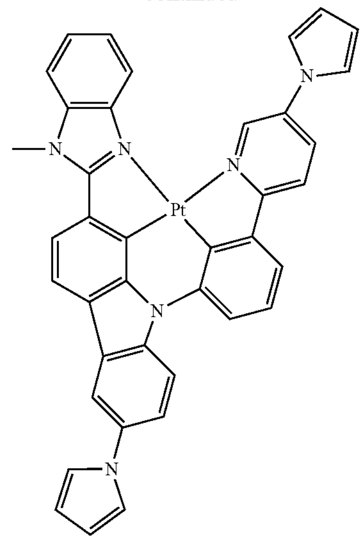
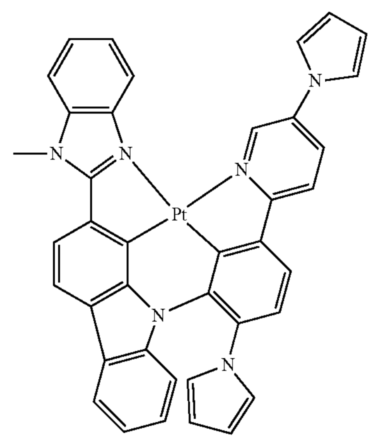
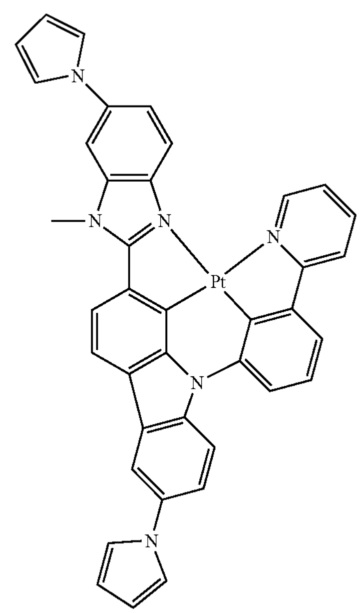

-continued
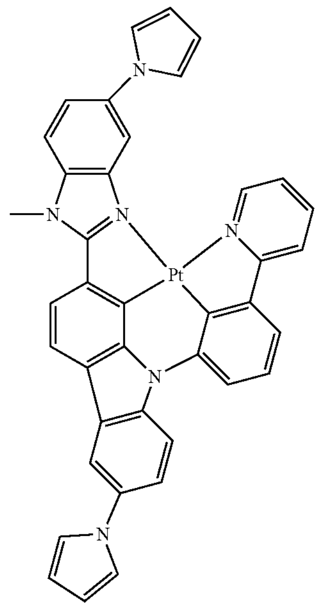
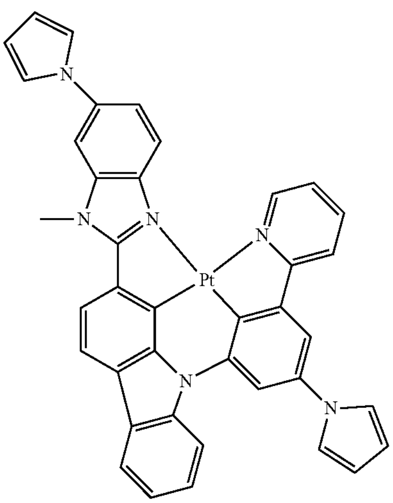
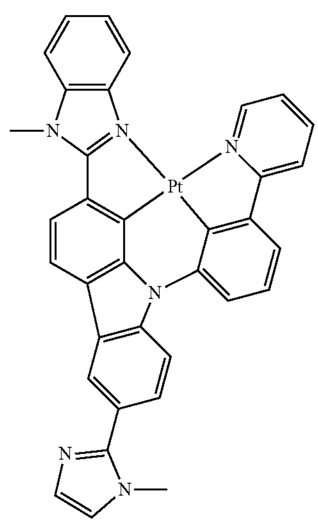
-continued
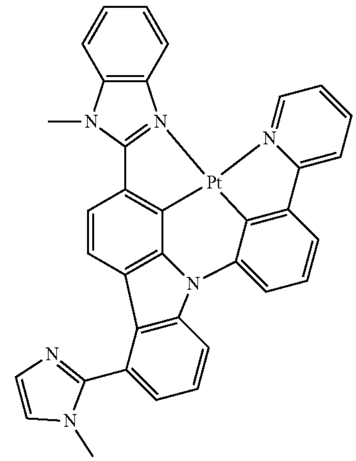
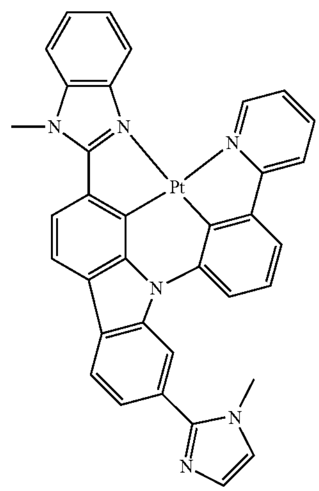
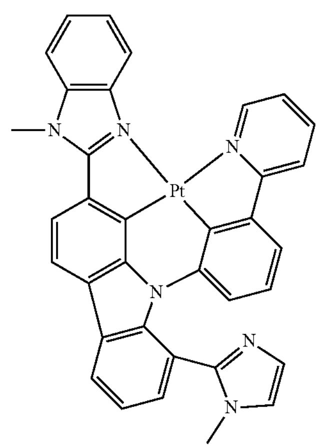

-continued
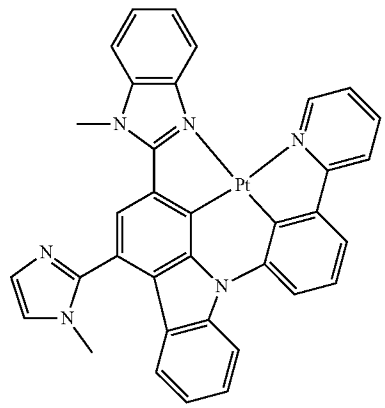
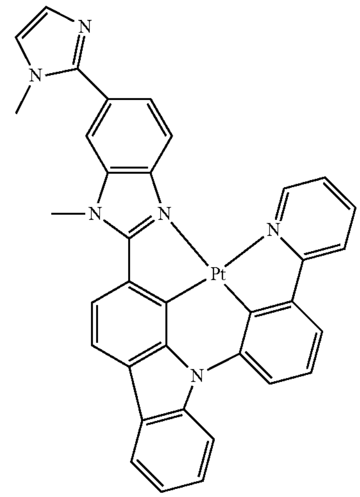
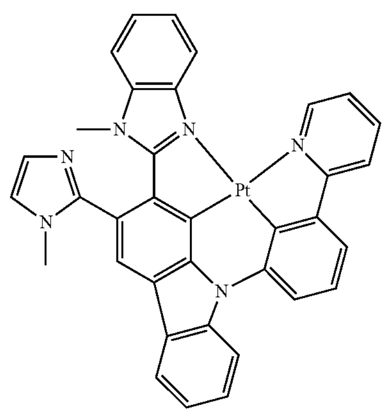
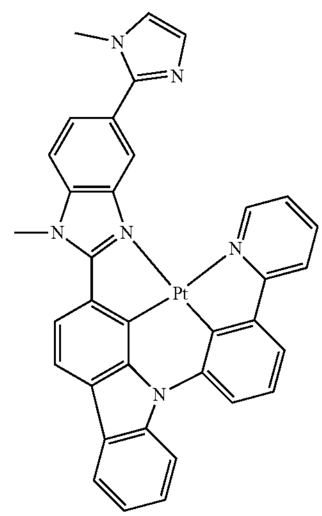
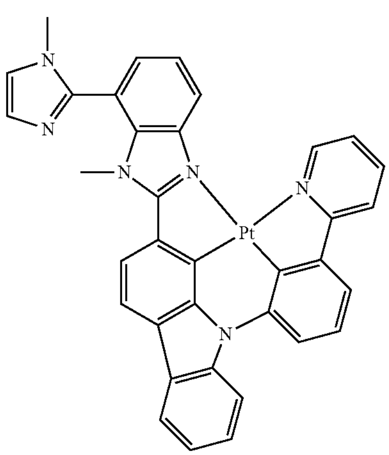
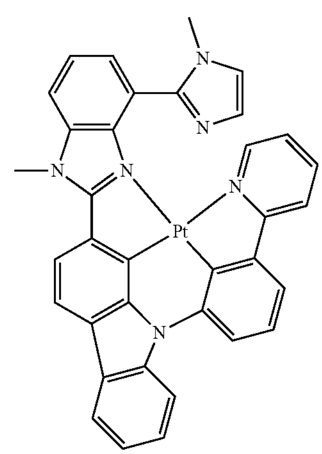

-continued
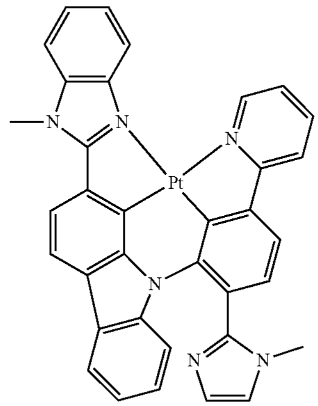
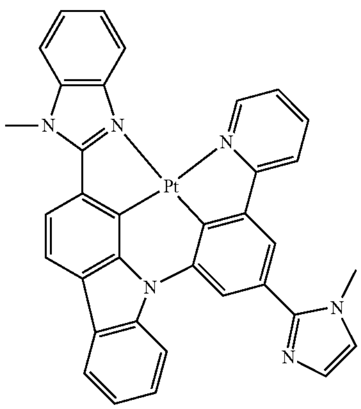
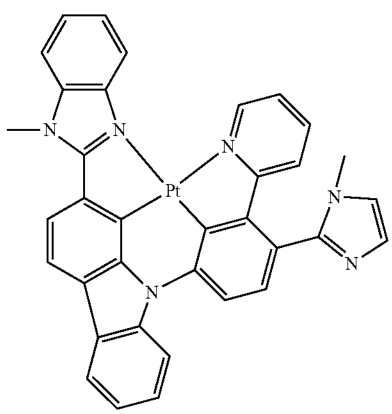
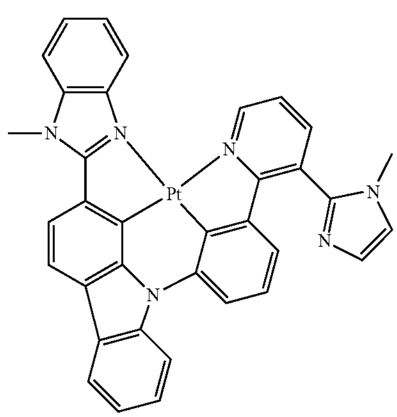
-continued
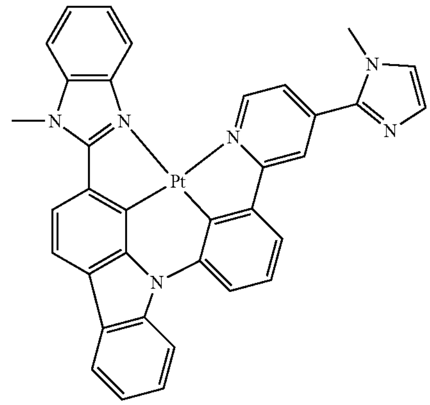
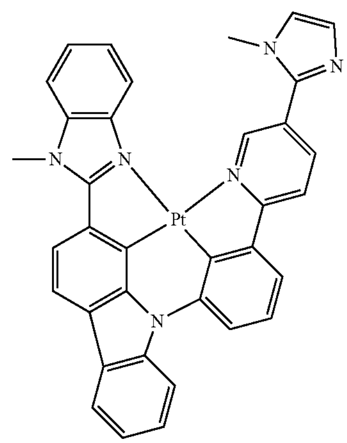
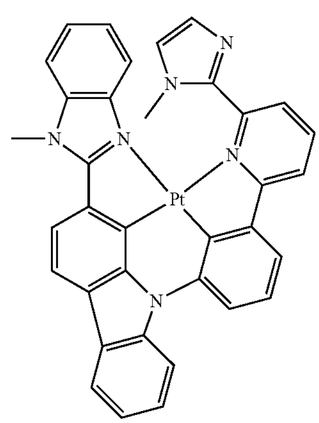

-continued
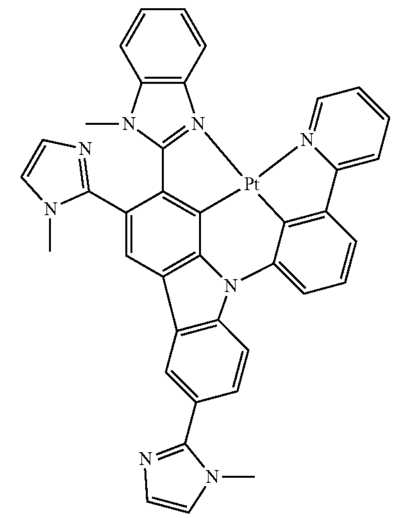
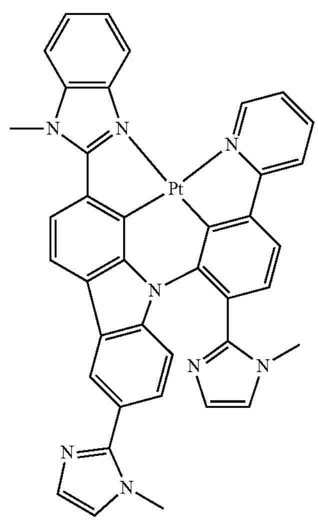
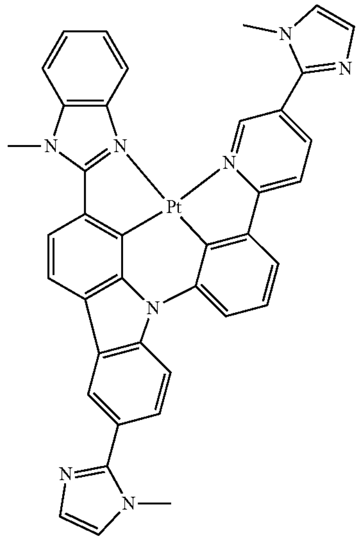
-continued
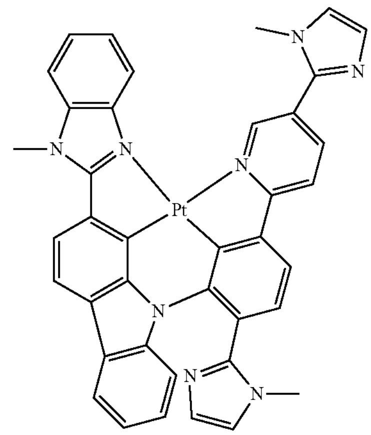
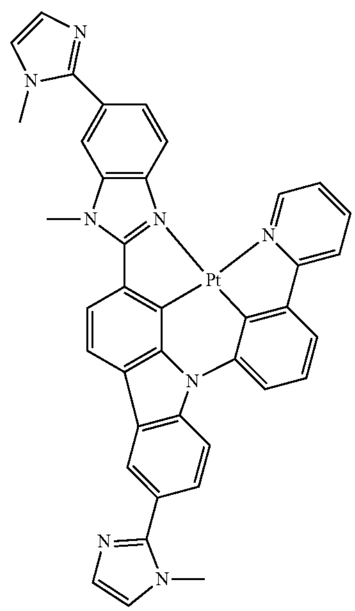
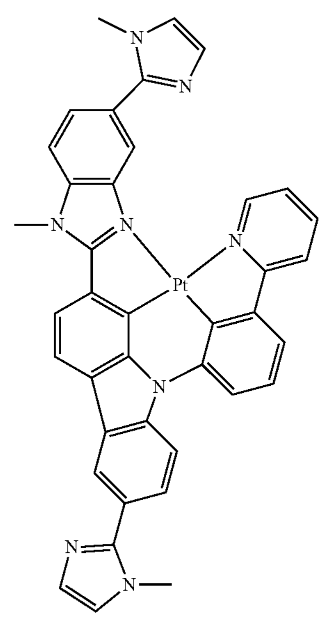

-continued
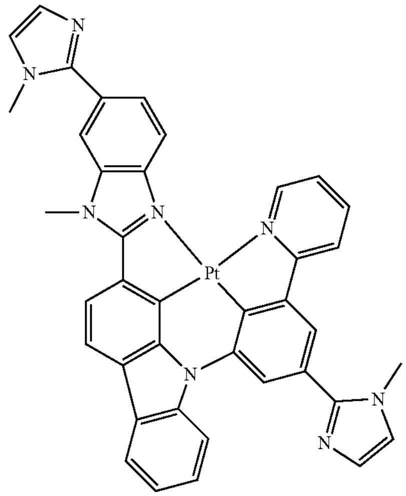
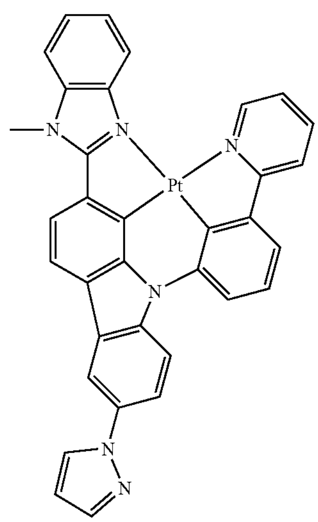
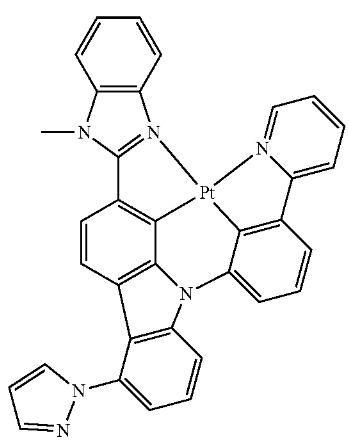
-continued
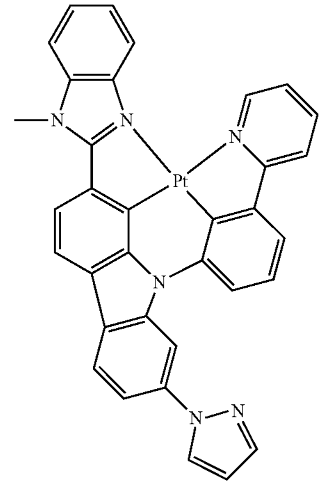
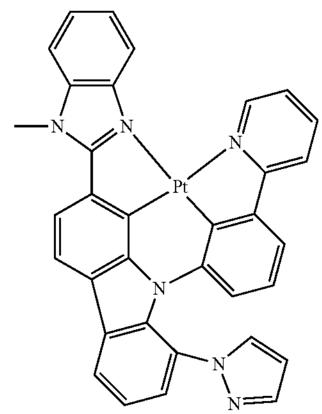
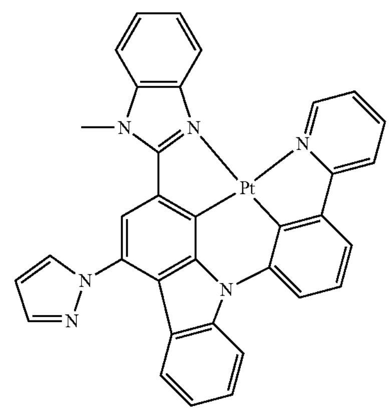
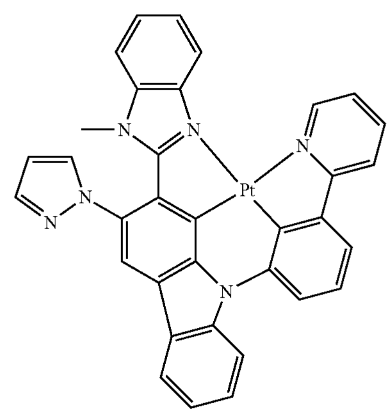

-continued
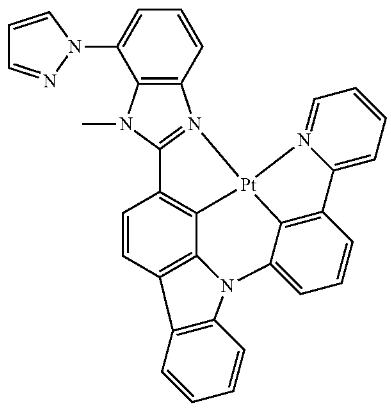
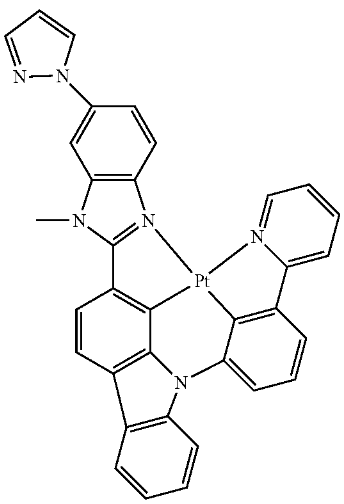
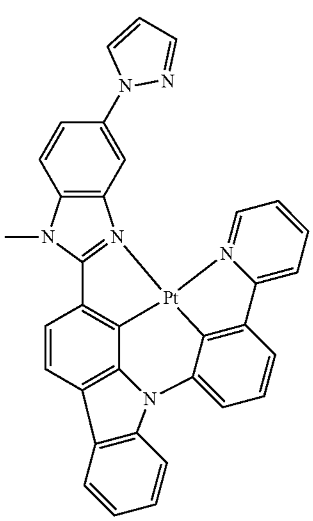
-continued
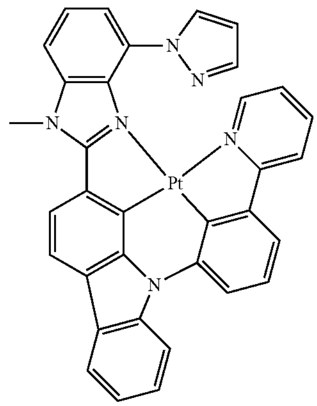
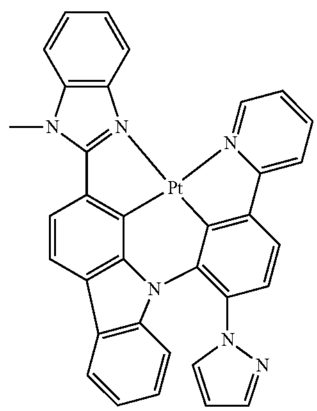
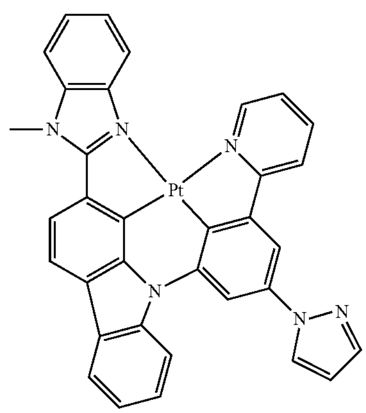
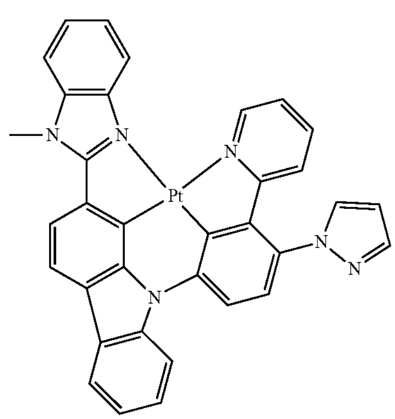

-continued
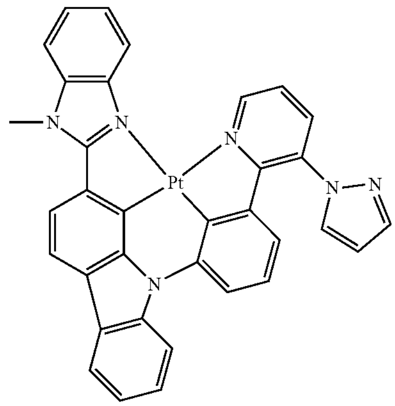
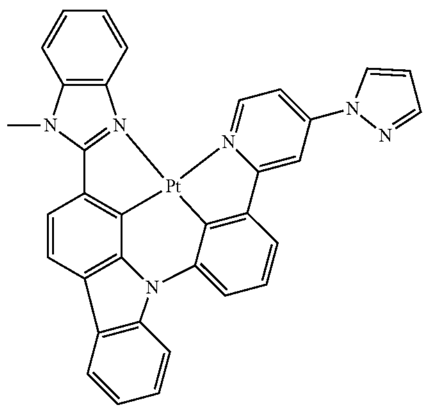
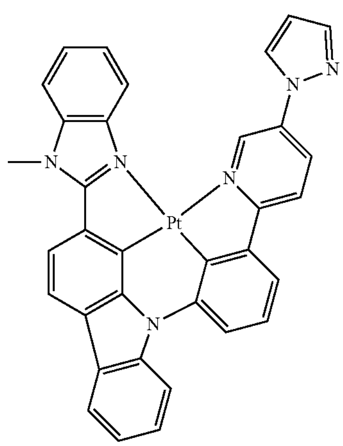
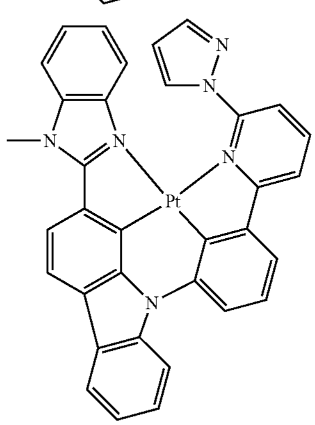
-continued
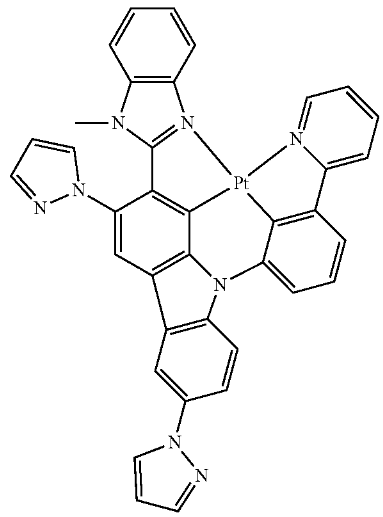
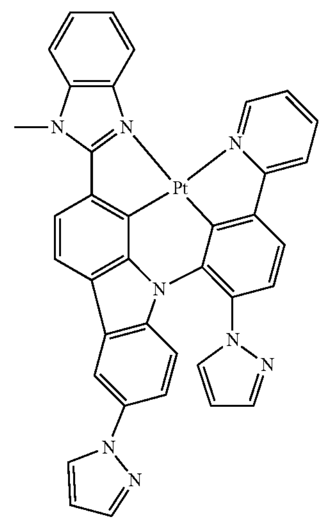
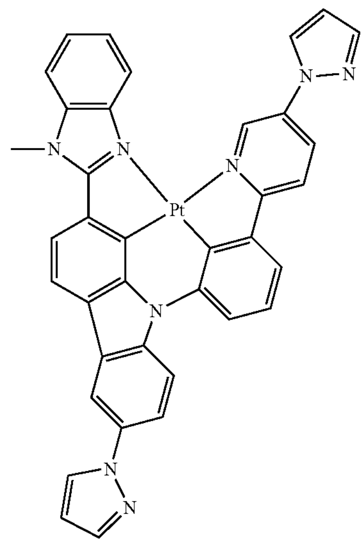

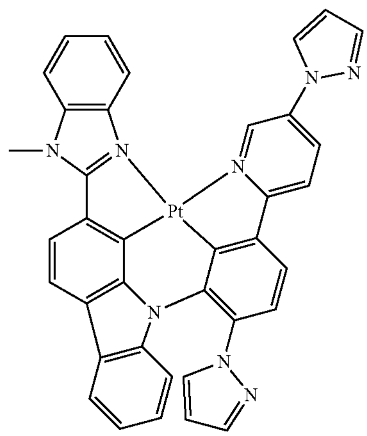
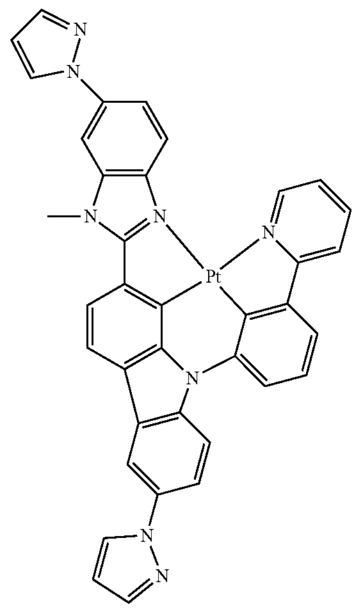
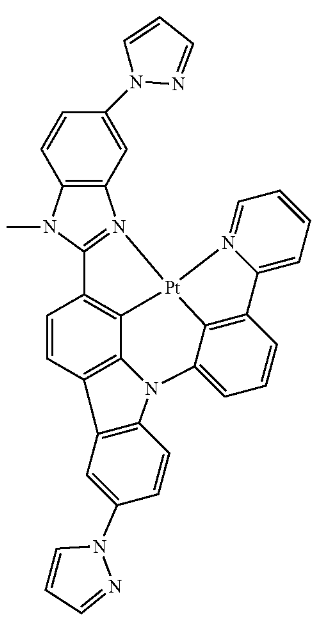
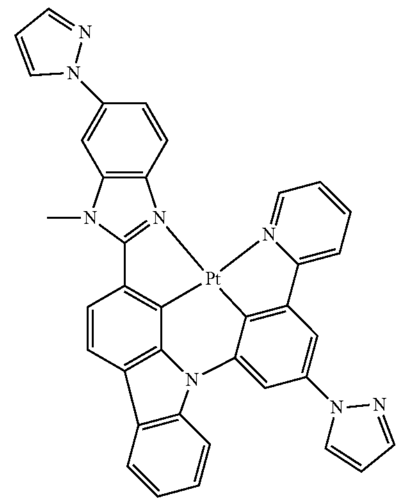
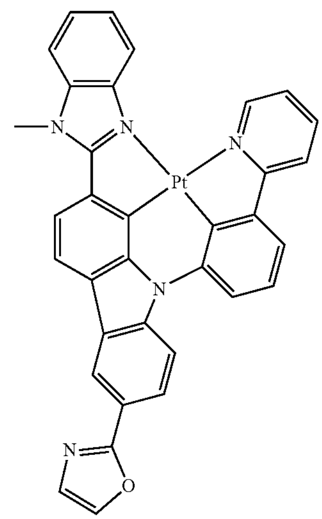
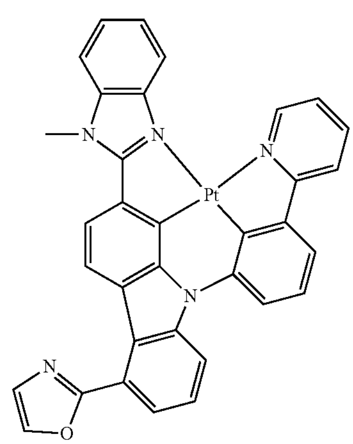

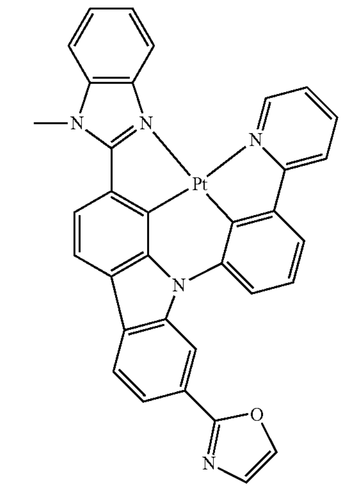
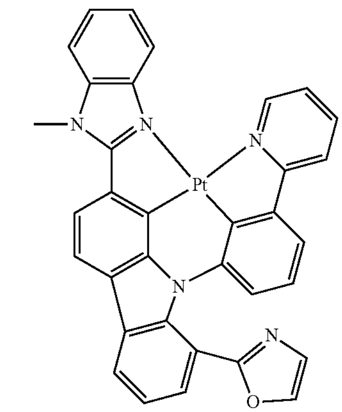
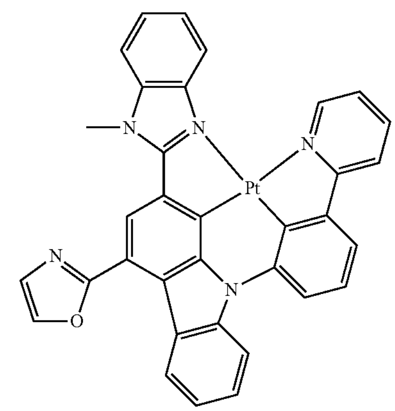
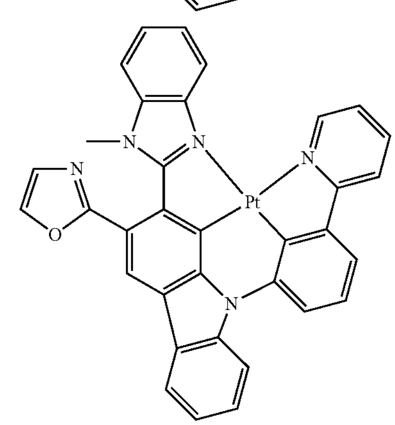
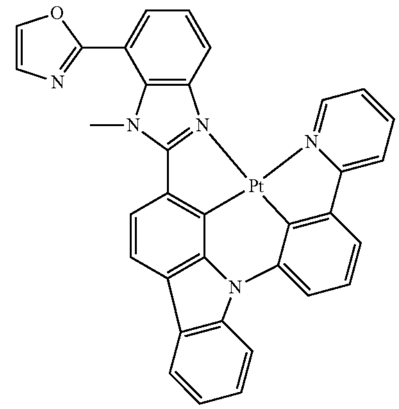
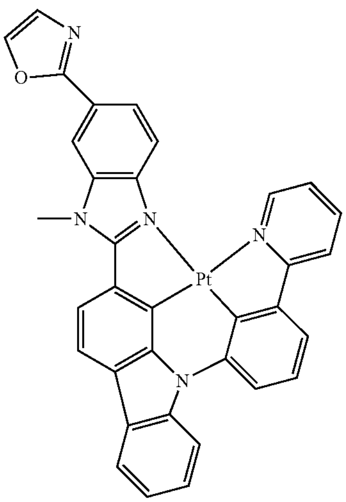
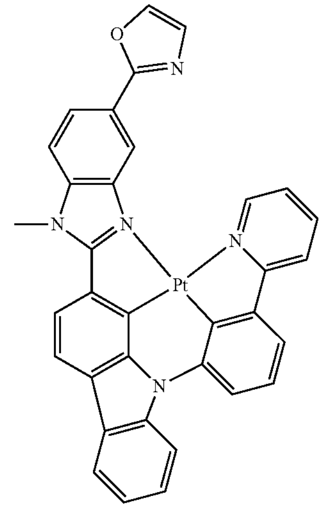

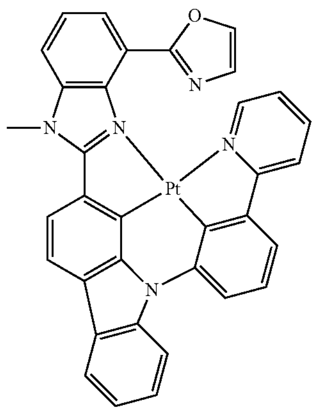
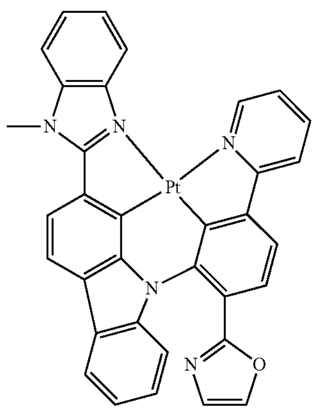
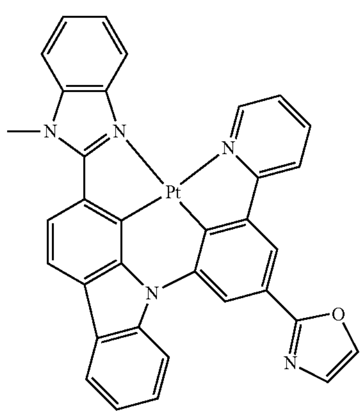
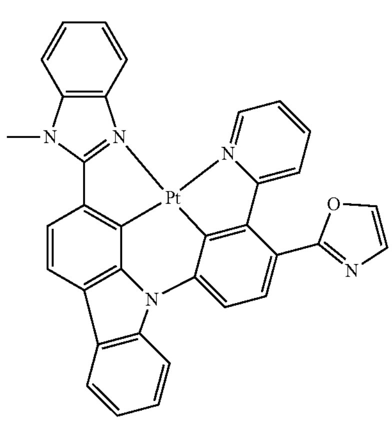
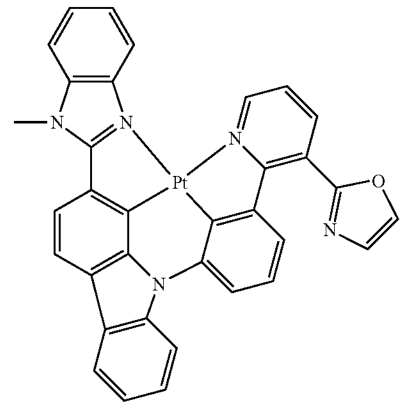
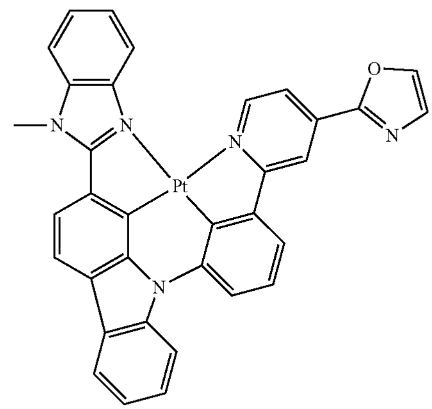
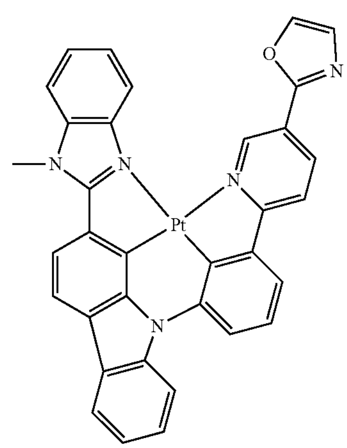
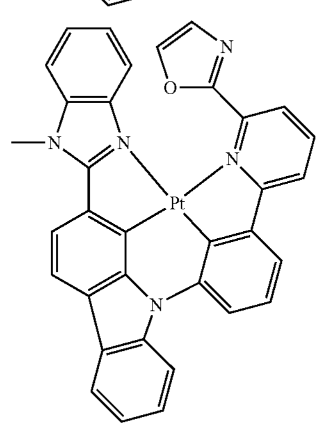

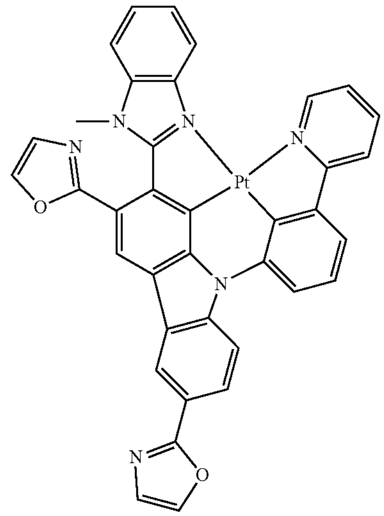
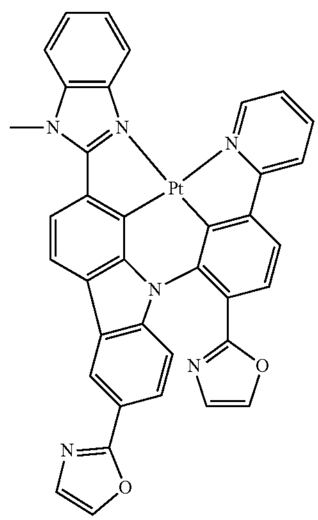
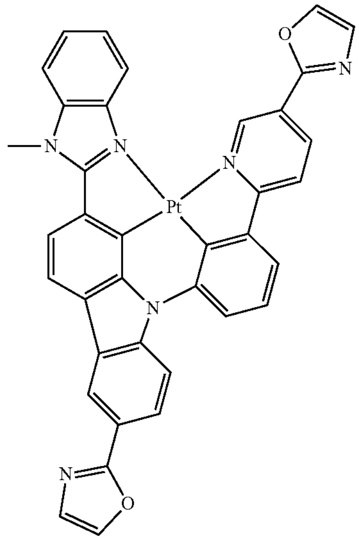
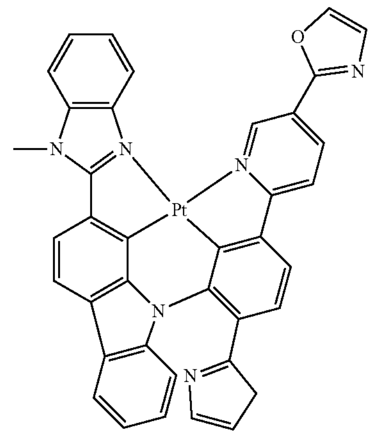
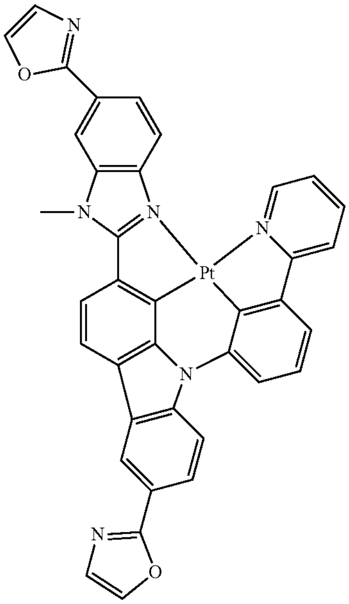
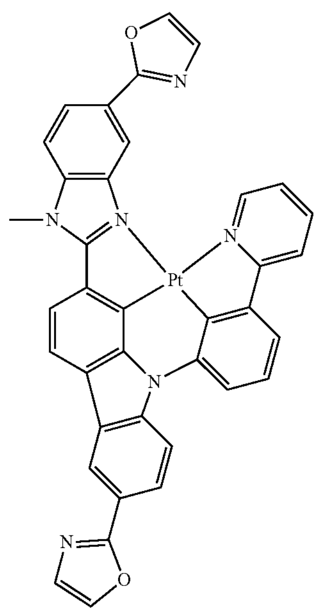

-continued
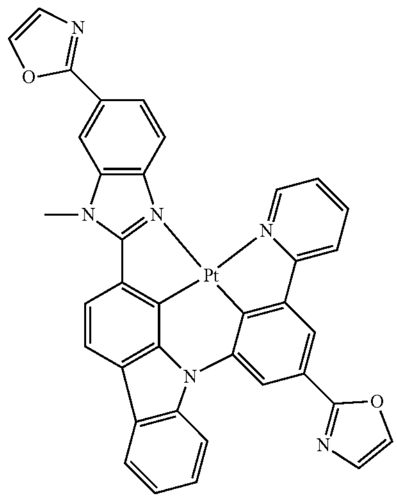
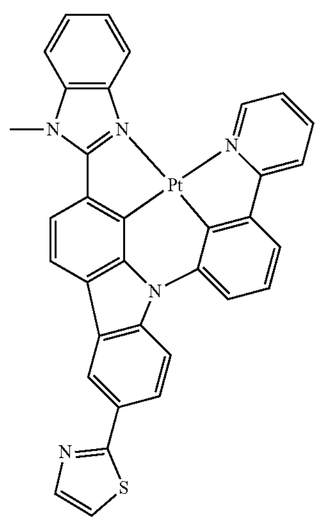
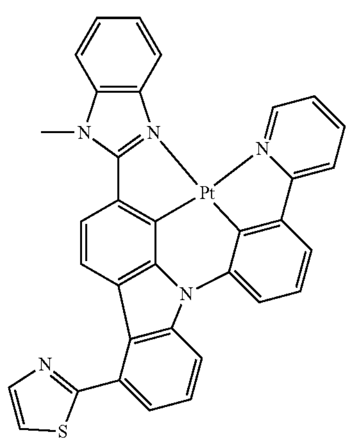
-continued
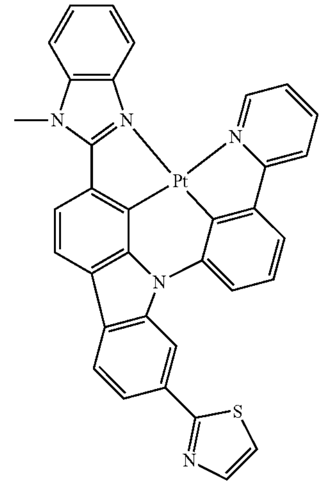
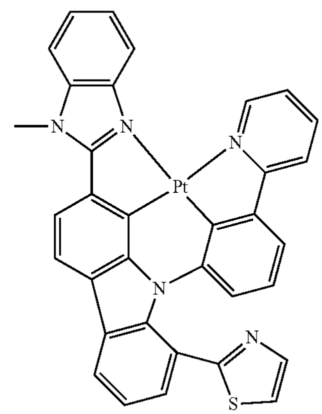
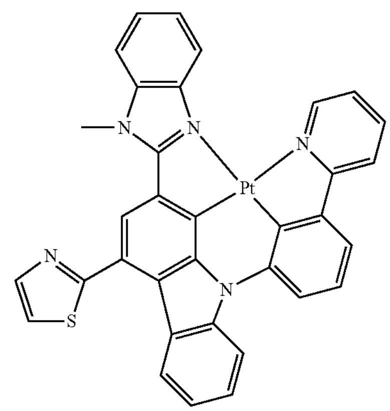
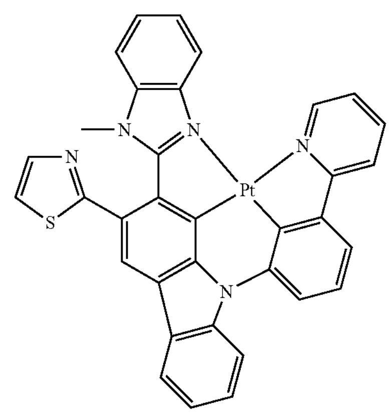

-continued
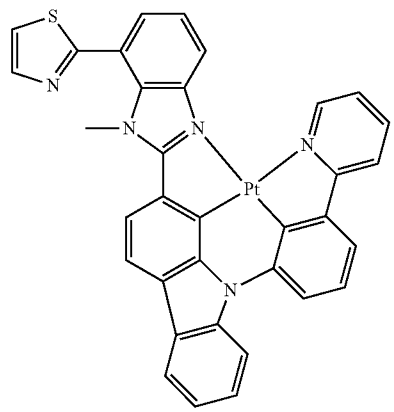
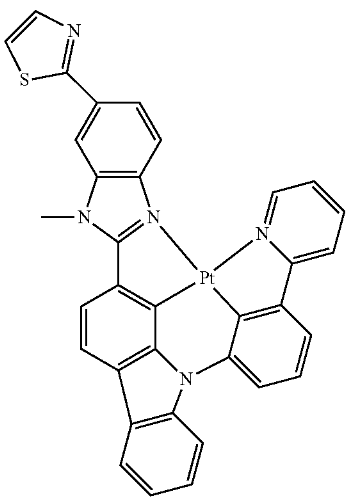
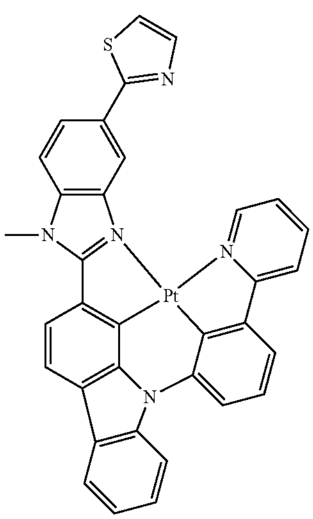
-continued
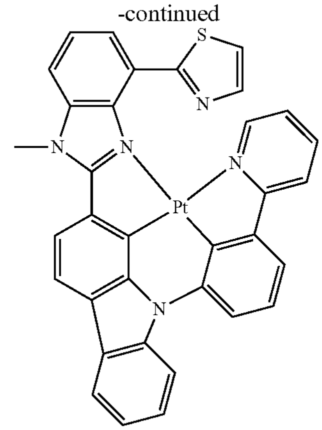
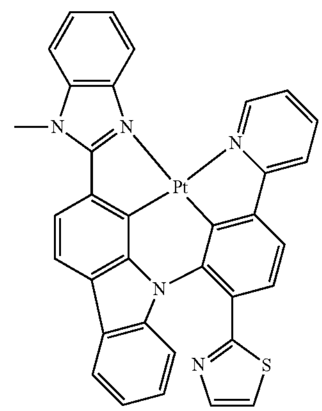
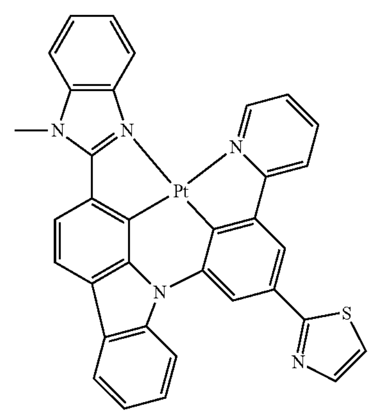
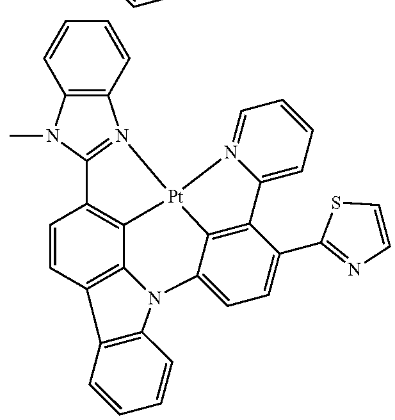

-continued
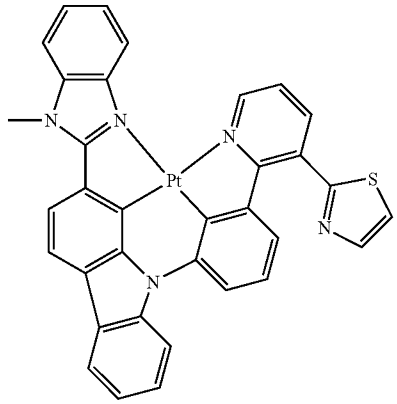
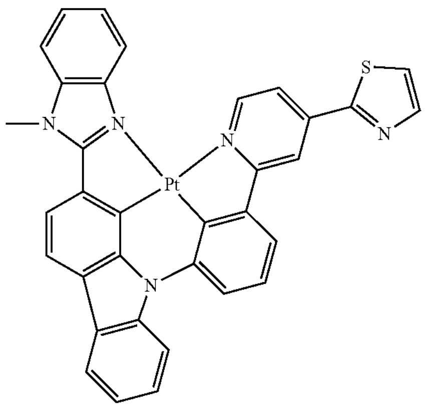
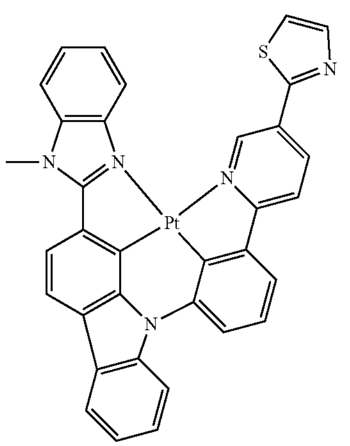
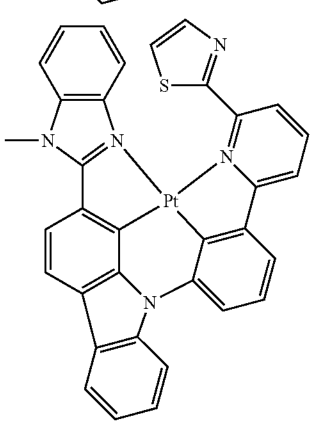
-continued
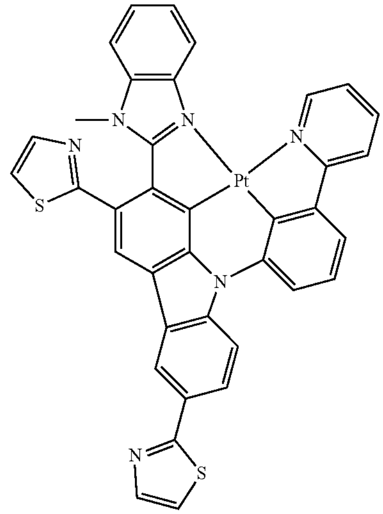
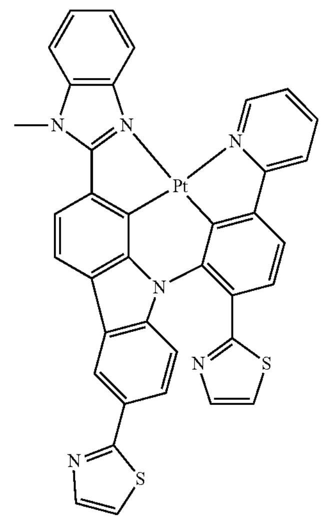
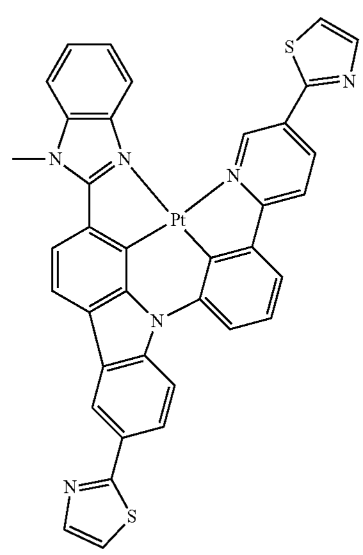

-continued
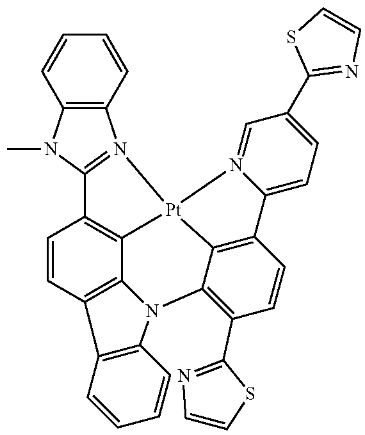
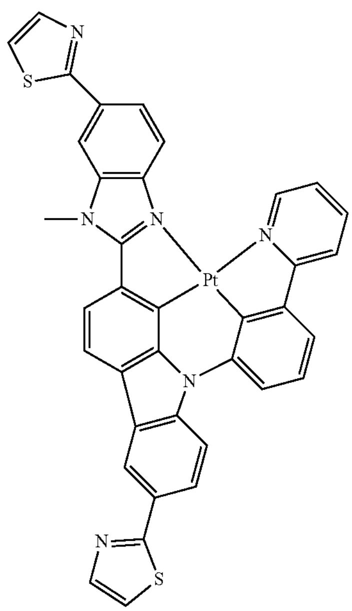
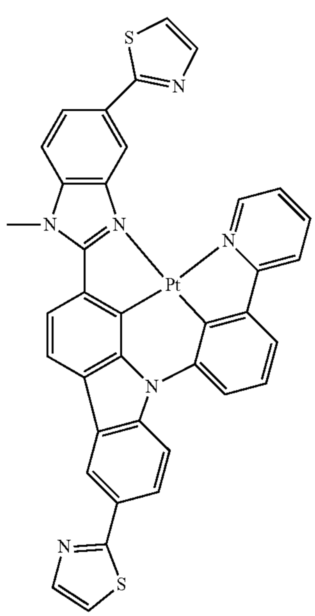
-continued
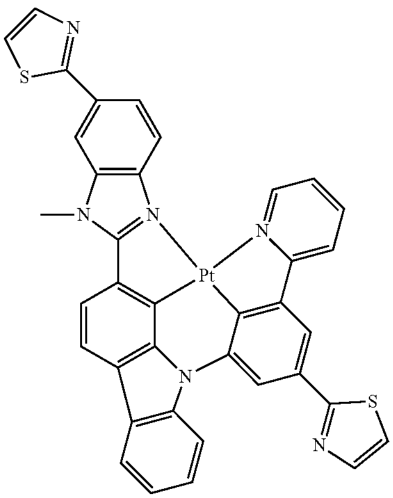
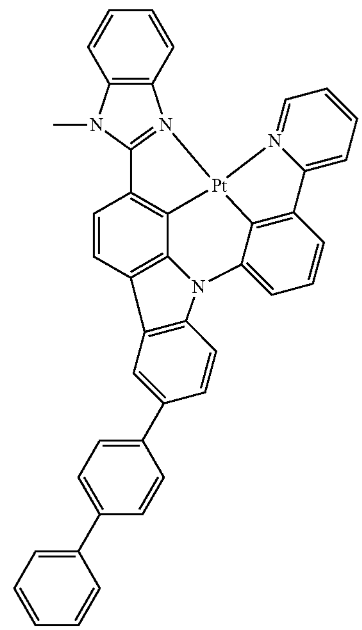
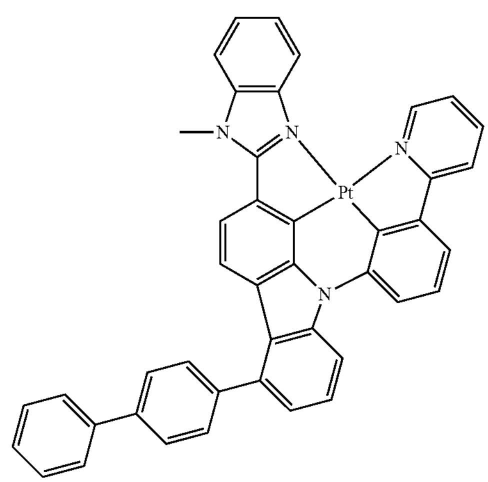

-continued
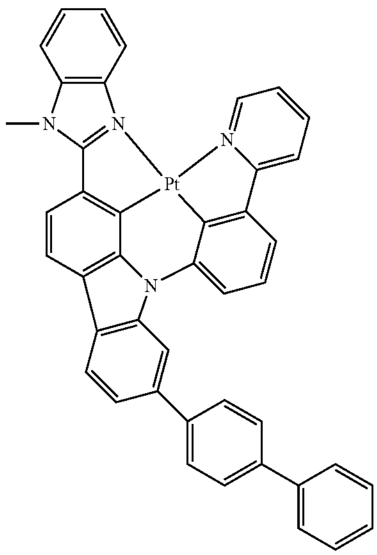
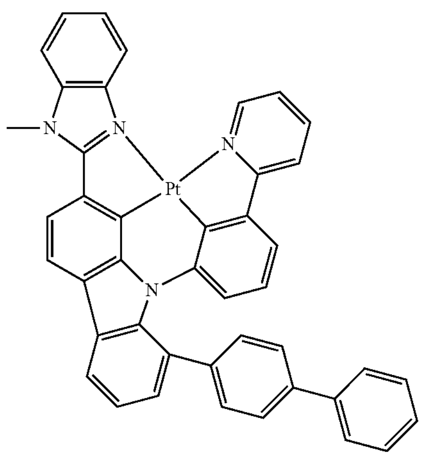
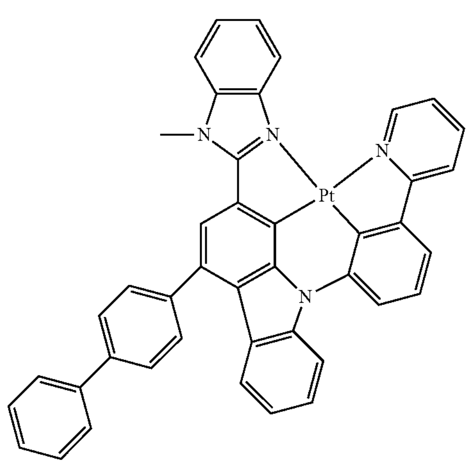
-continued
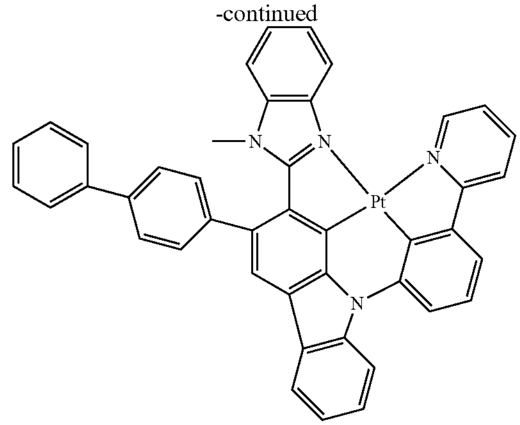
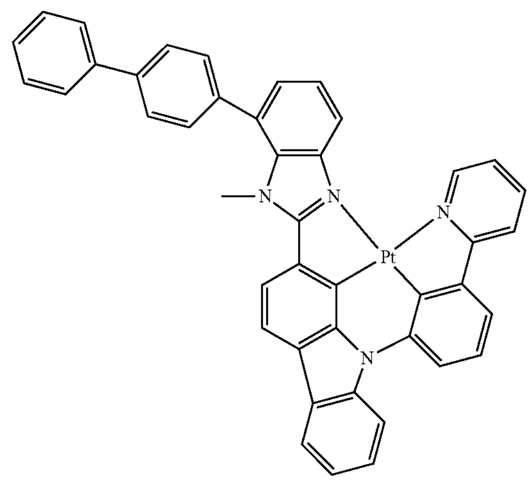
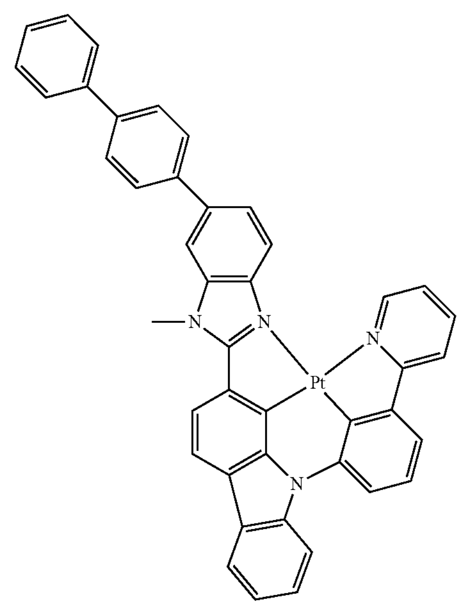

-continued
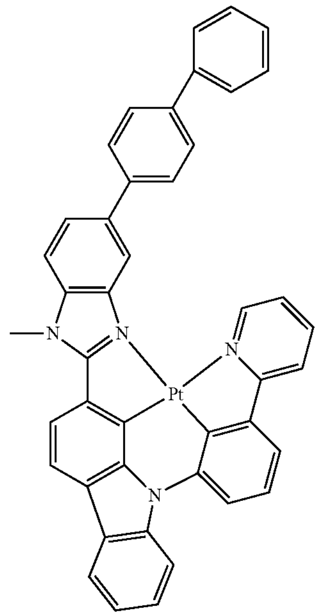
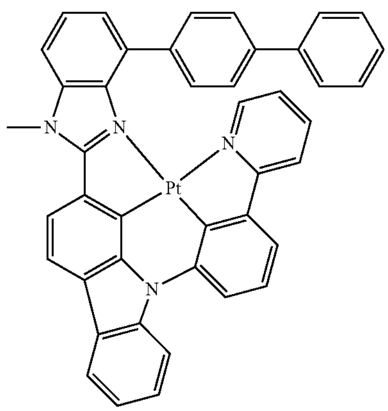
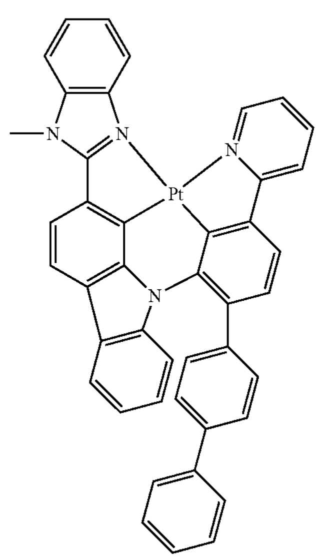
-continued
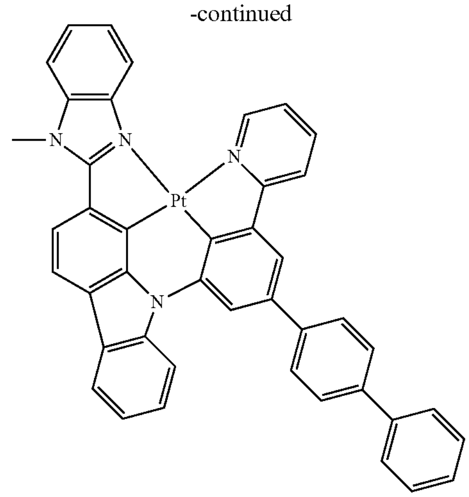
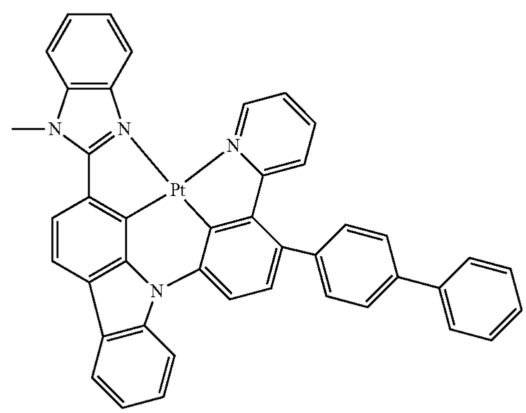
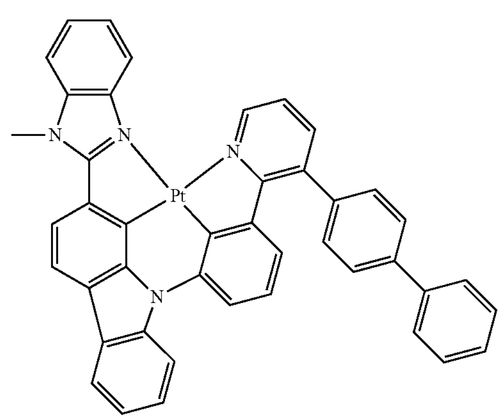

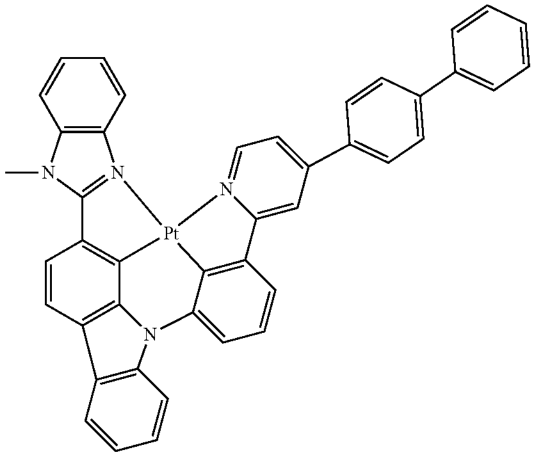
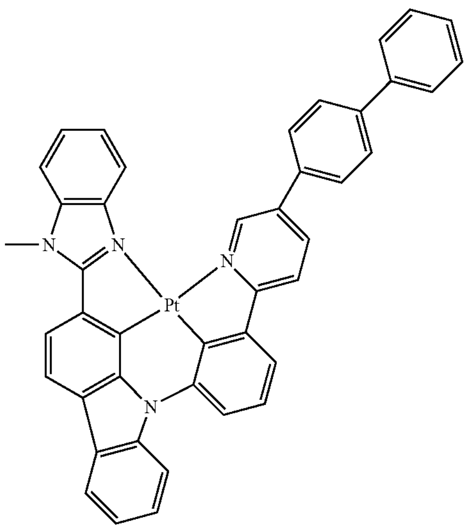
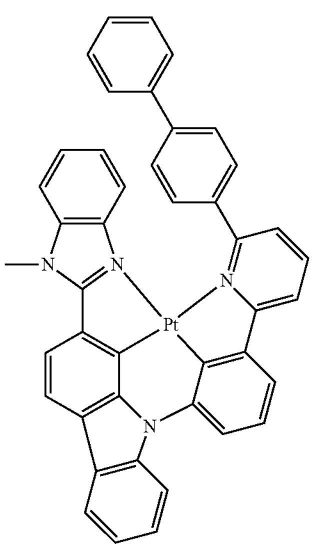
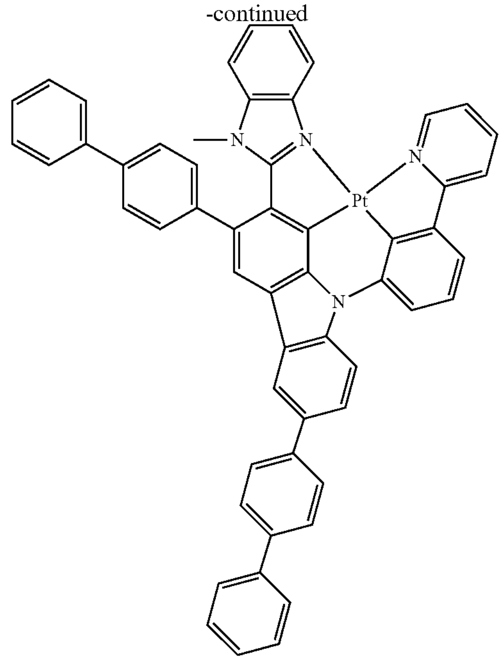
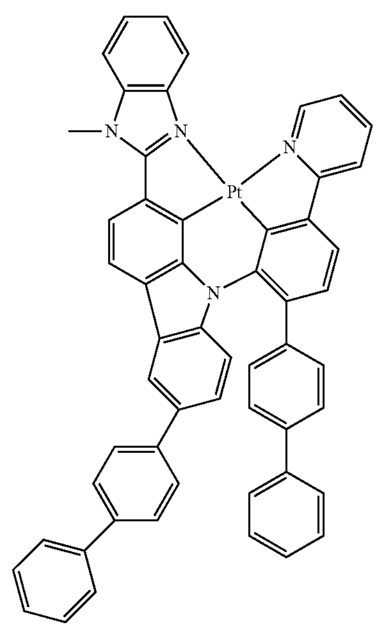

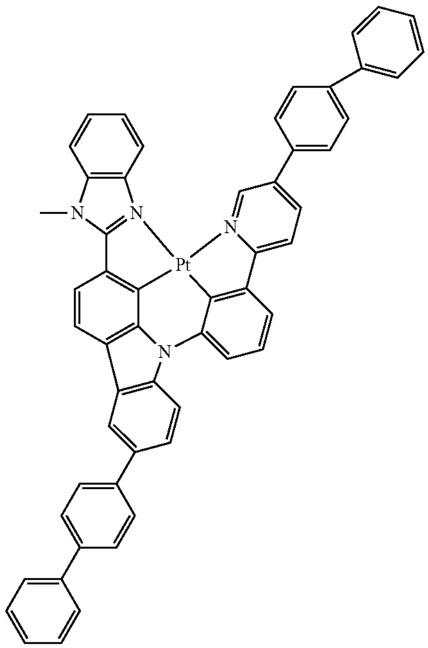
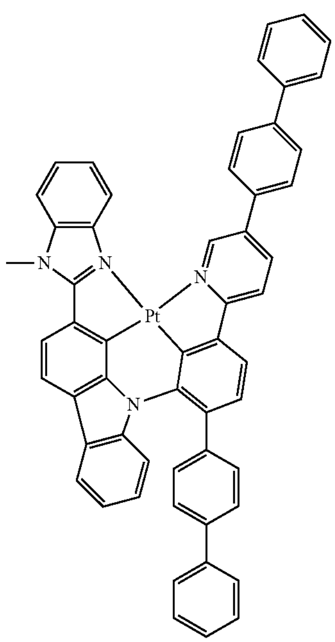
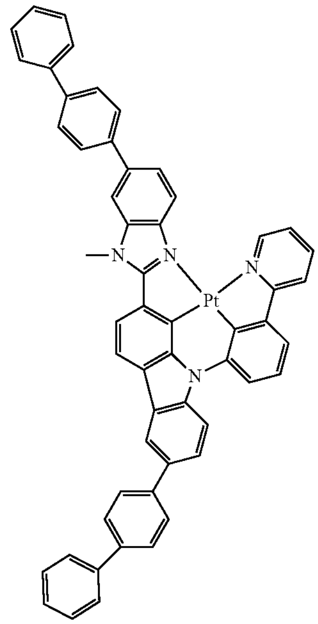
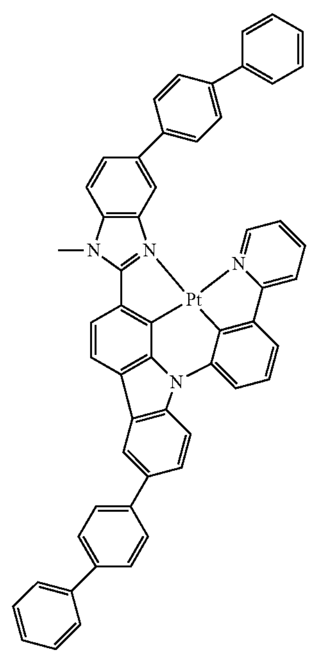

-continued
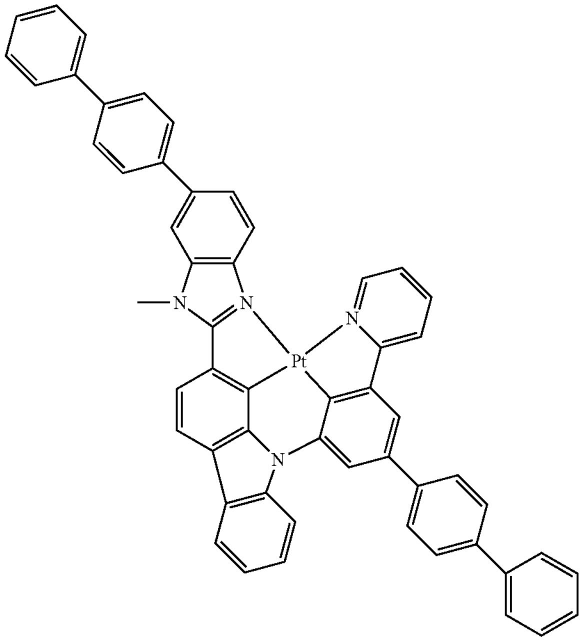
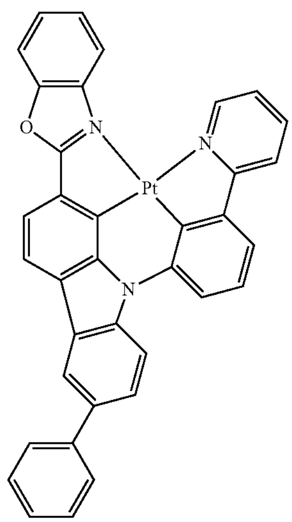
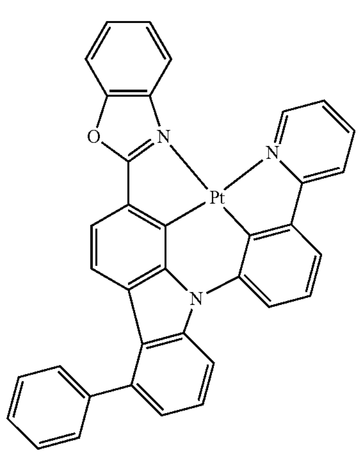
-continued
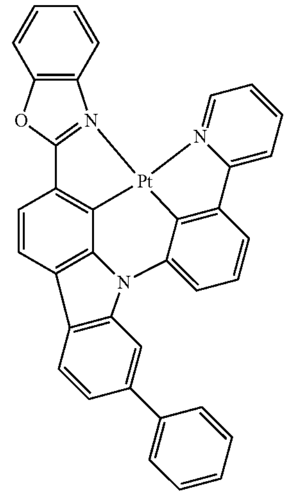
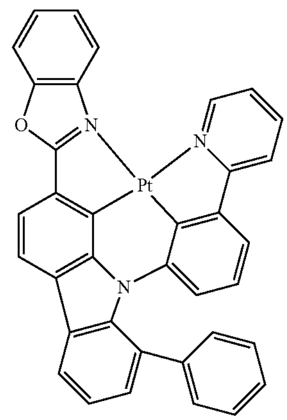
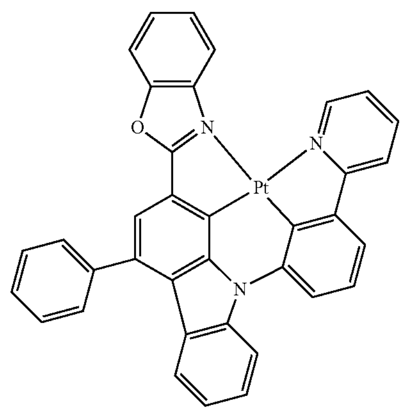
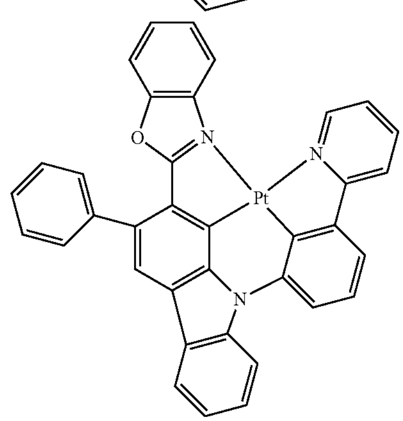

-continued
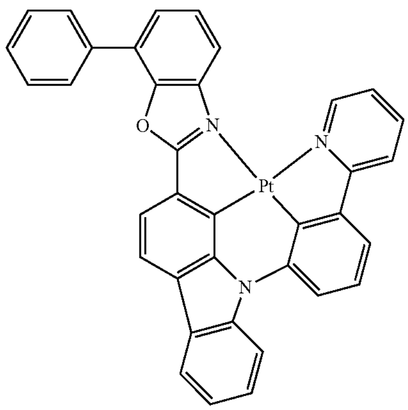
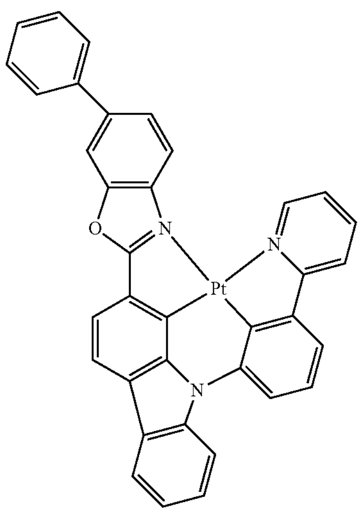
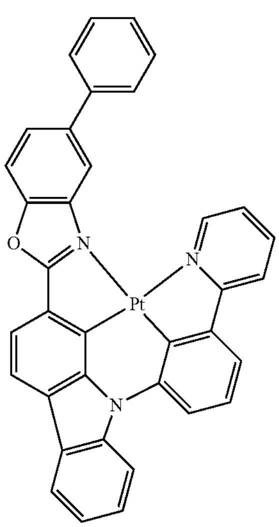
-continued
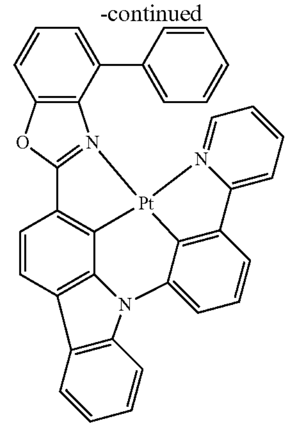
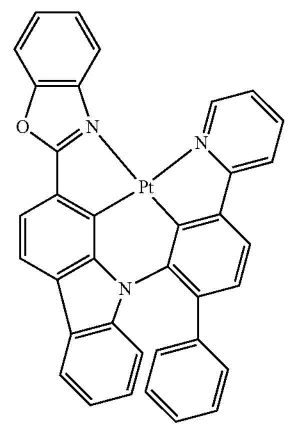
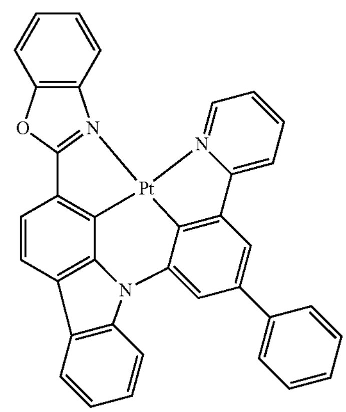
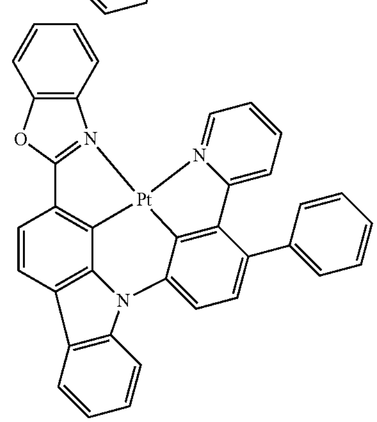

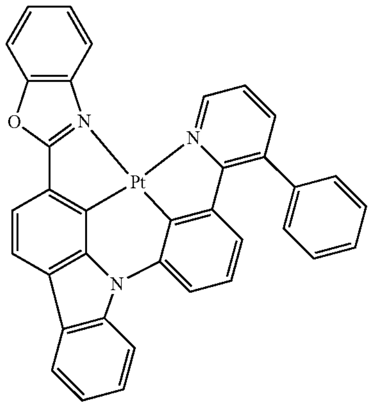
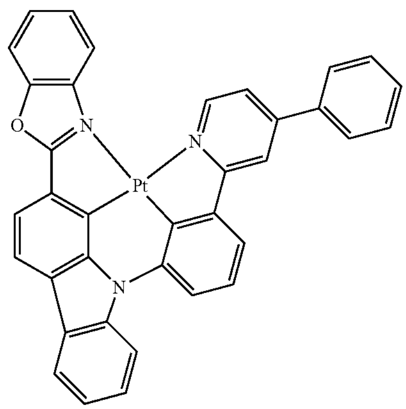
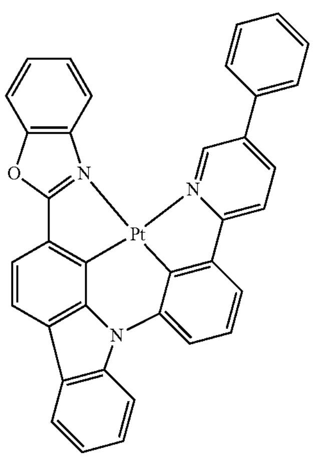
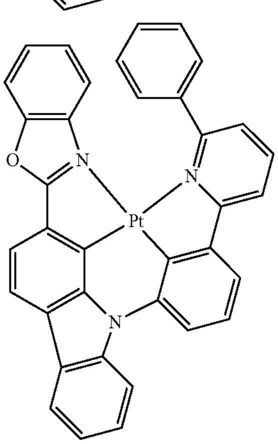
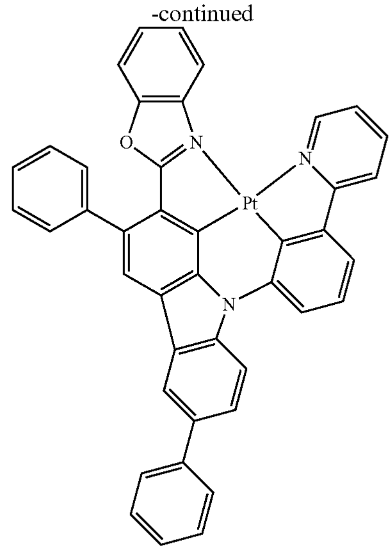
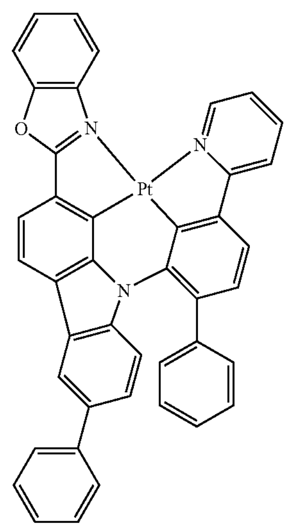
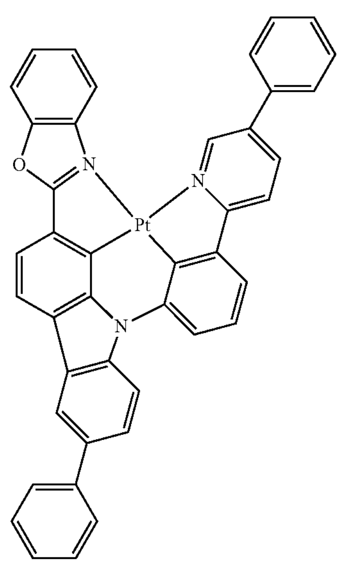

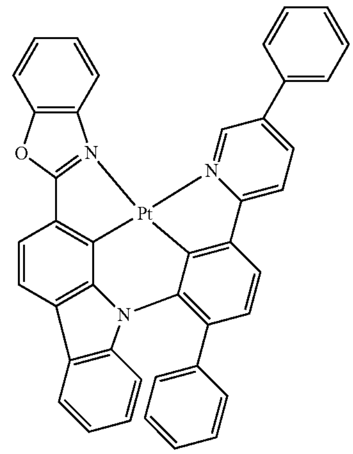
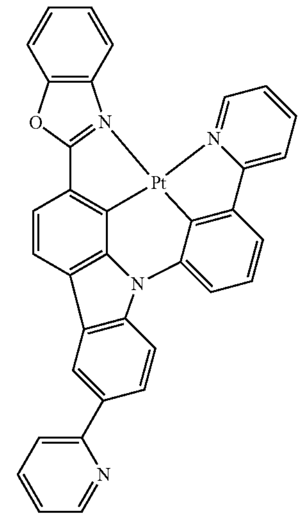
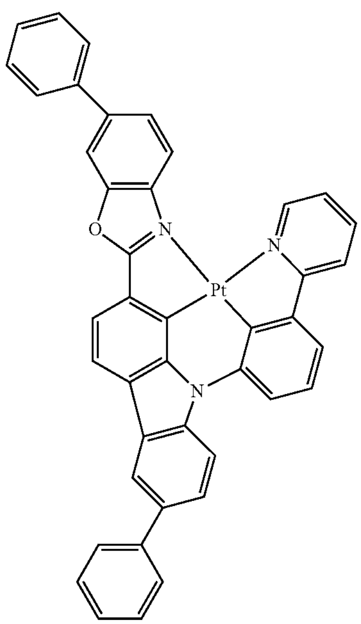
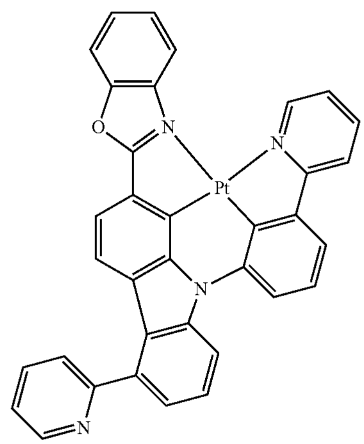
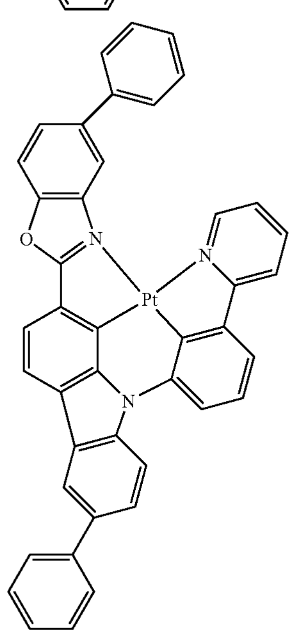
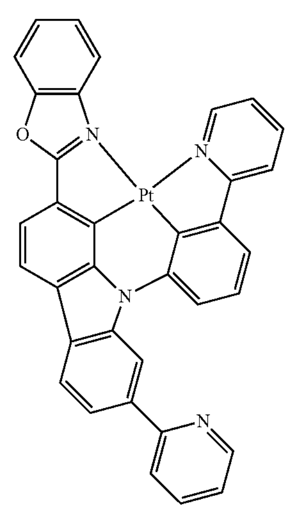
N
O
Pt

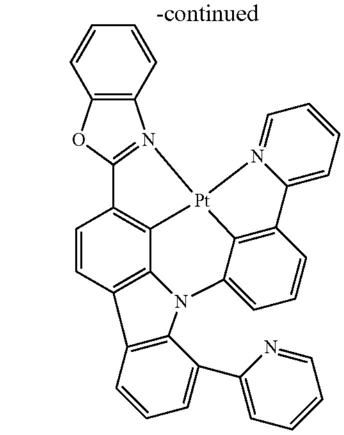
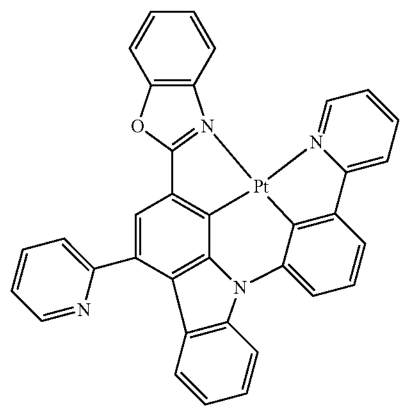
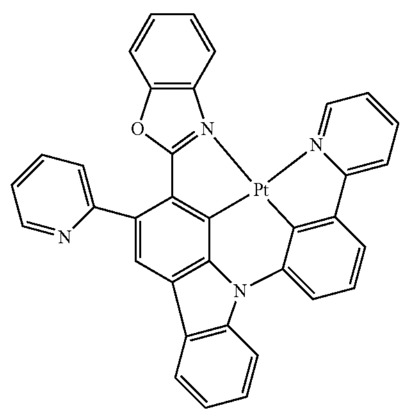
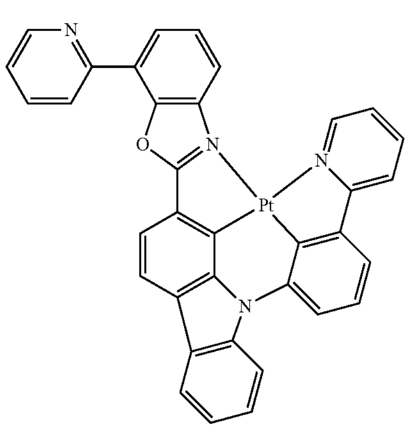
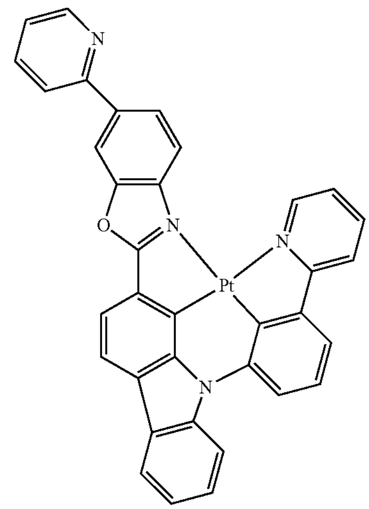
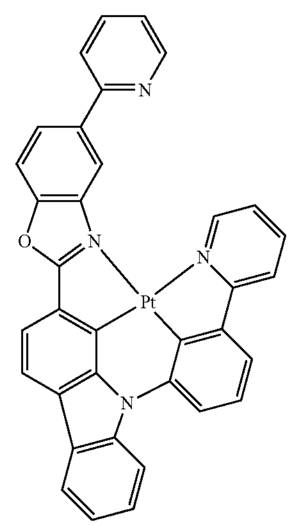
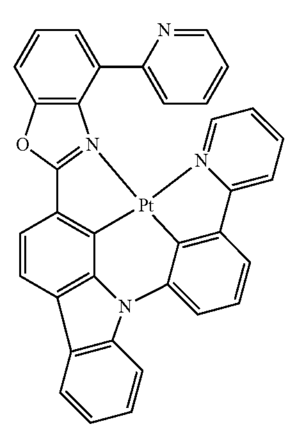

-continued
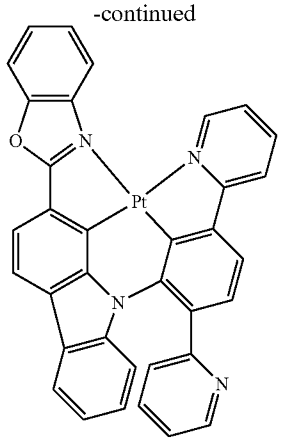
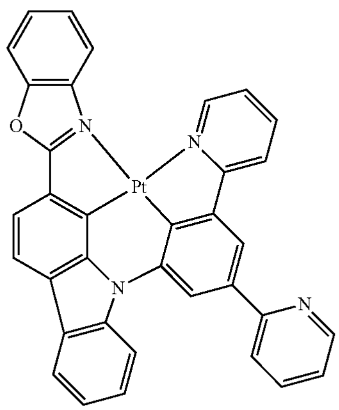
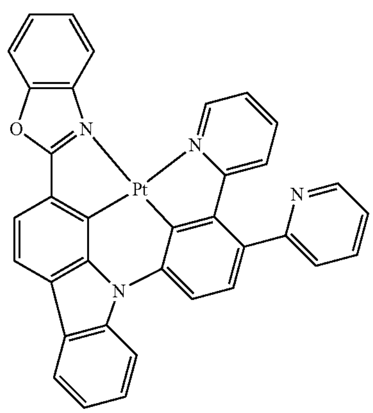
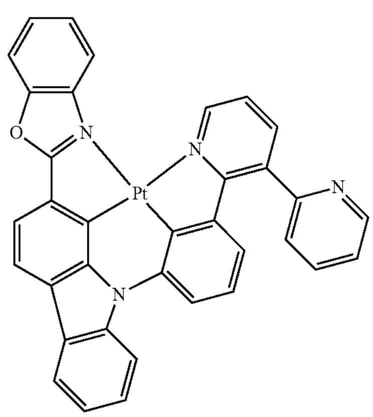
-continued
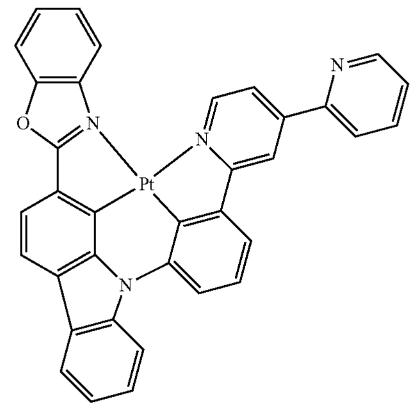
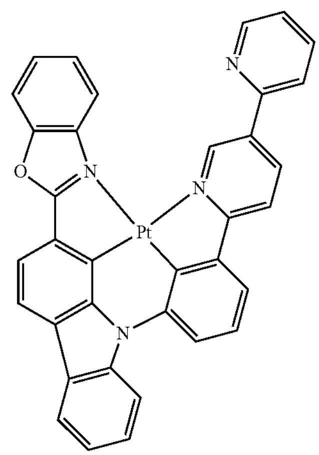
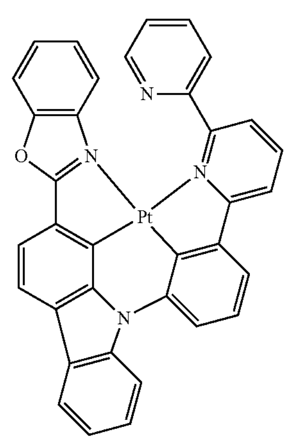

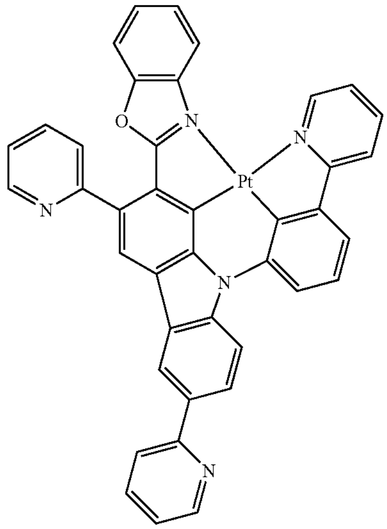
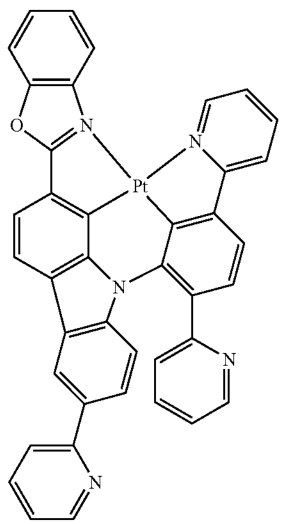
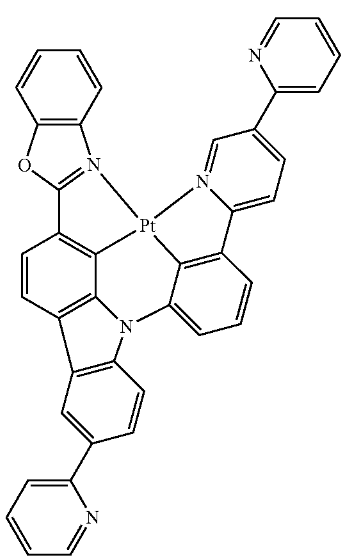
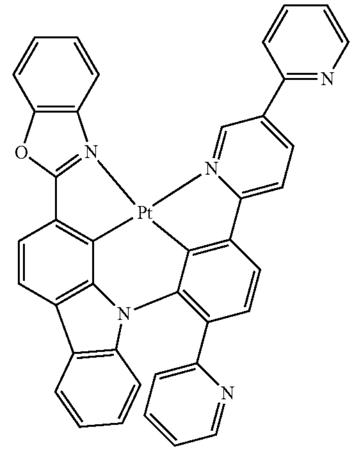
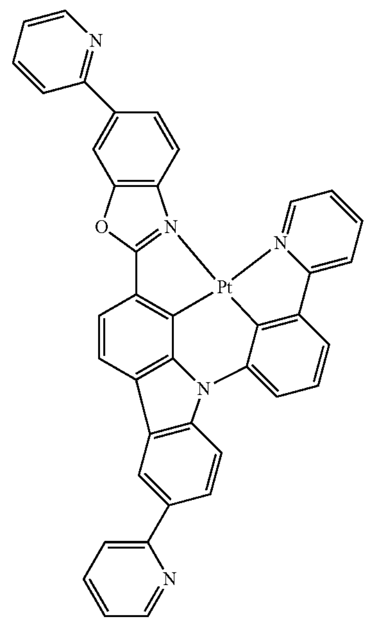
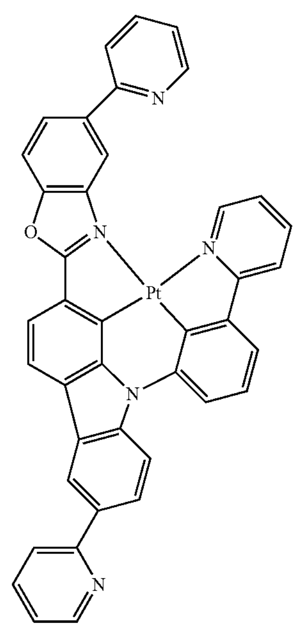

-continued
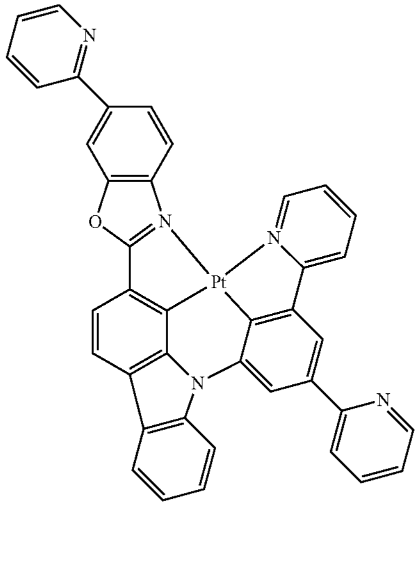
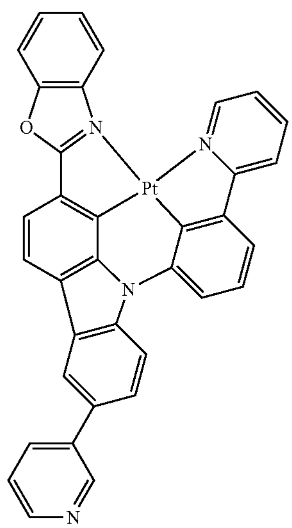
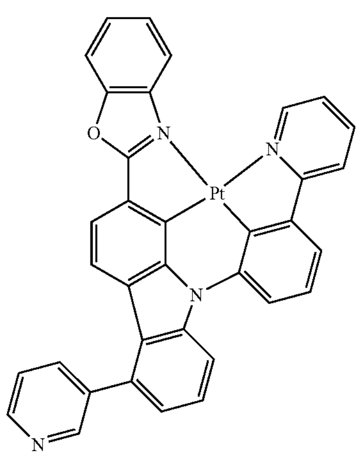
-continued
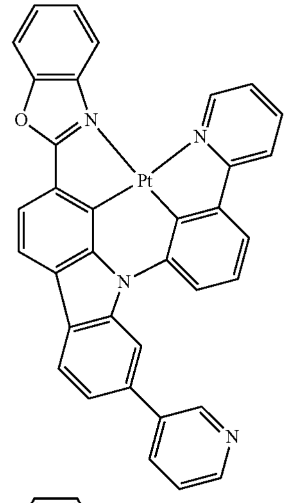
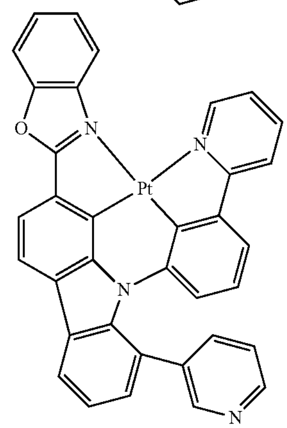
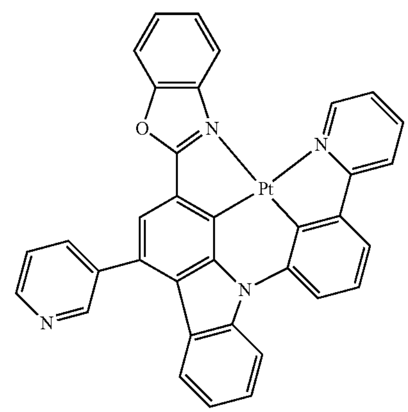
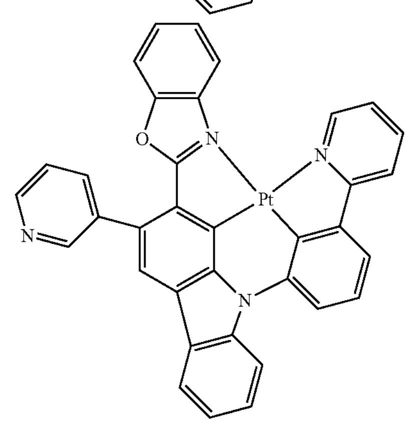

-continued
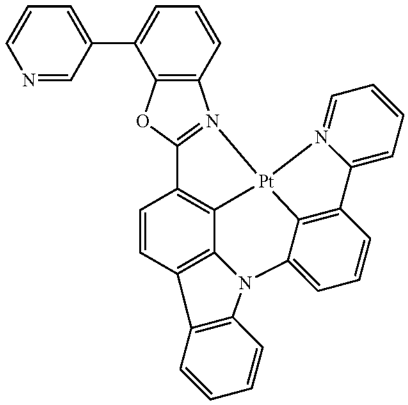
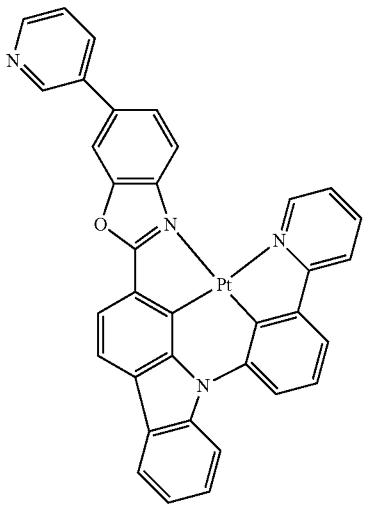
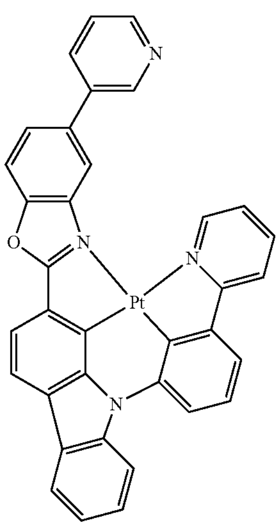
-continued
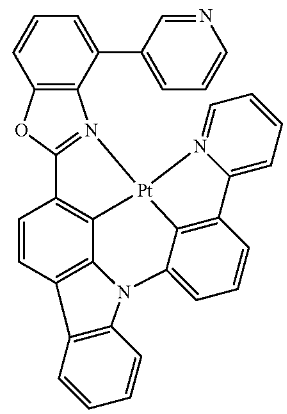
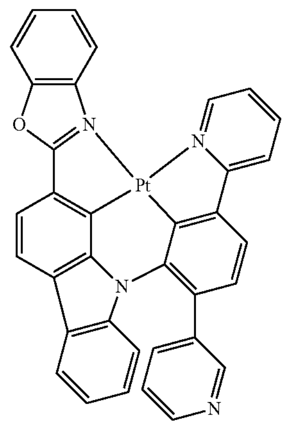
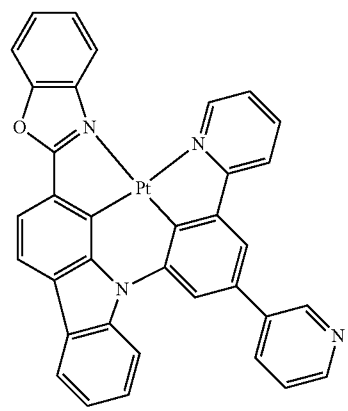
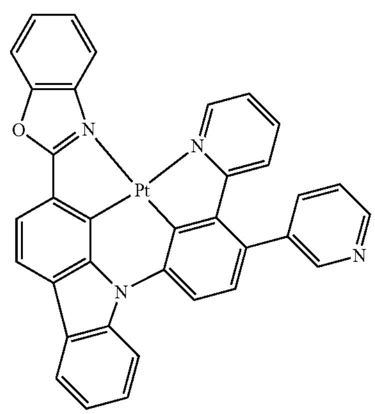

-continued
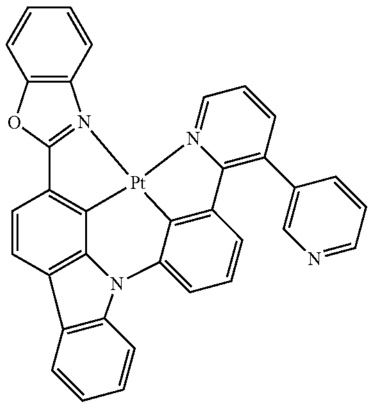
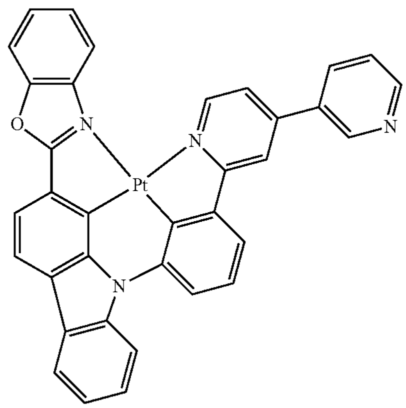
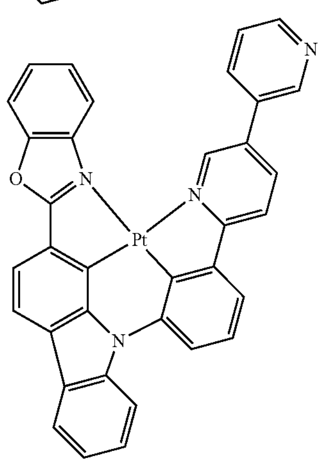
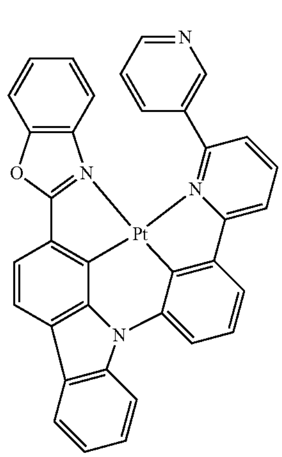
-continued
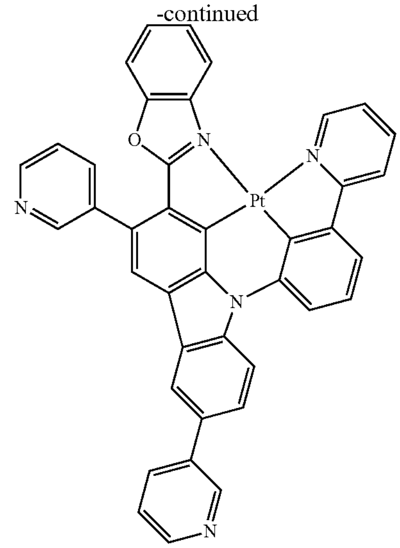
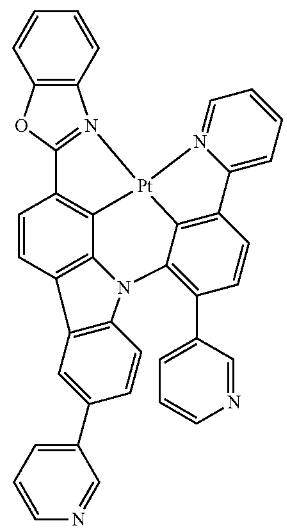
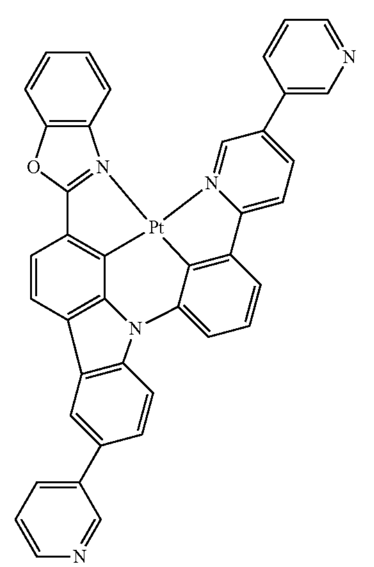

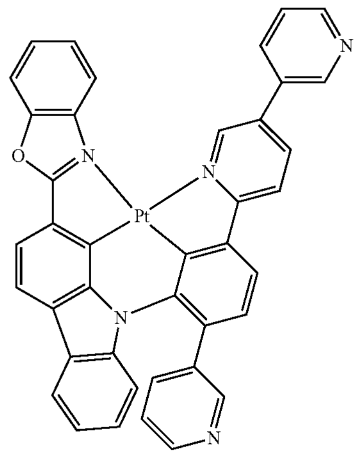
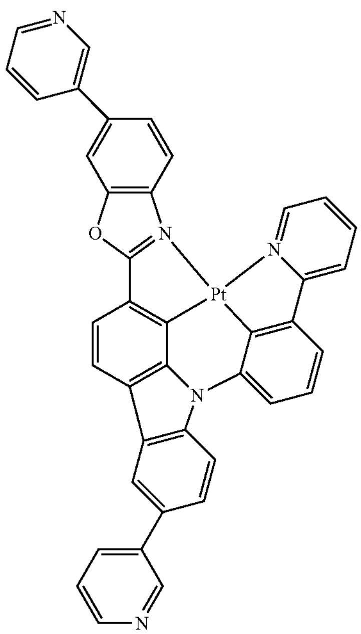
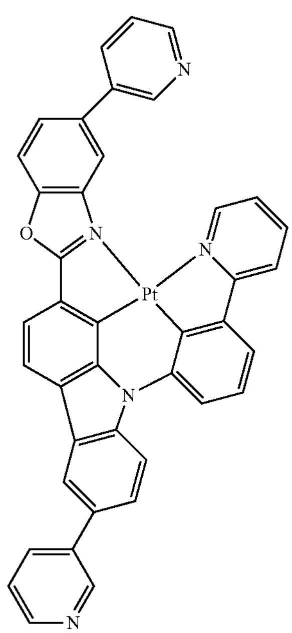
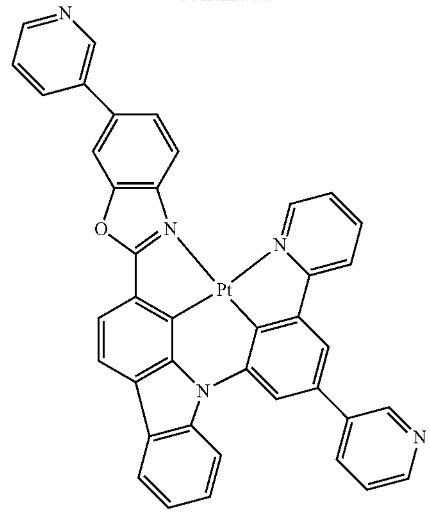
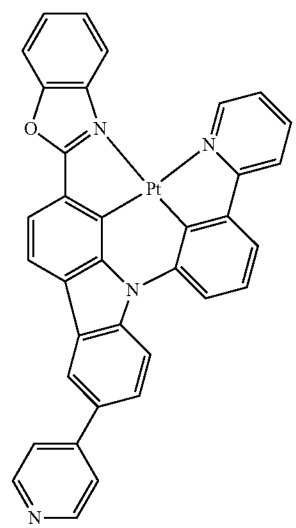
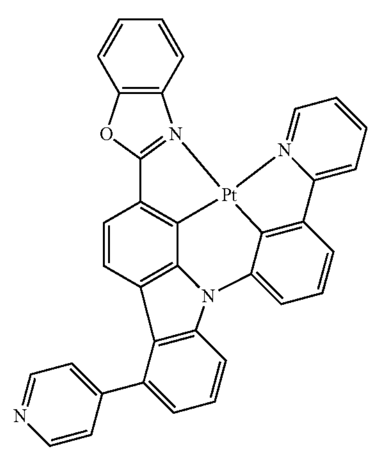

-continued
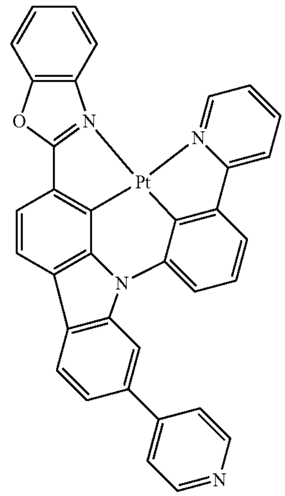
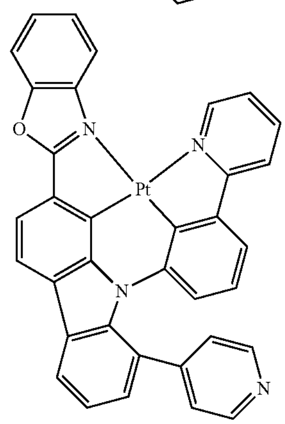
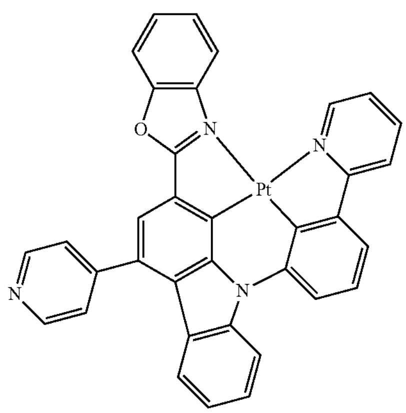
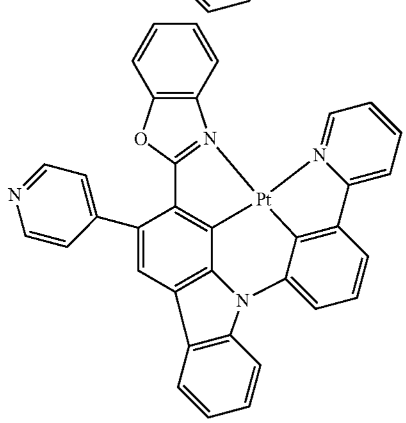
-continued
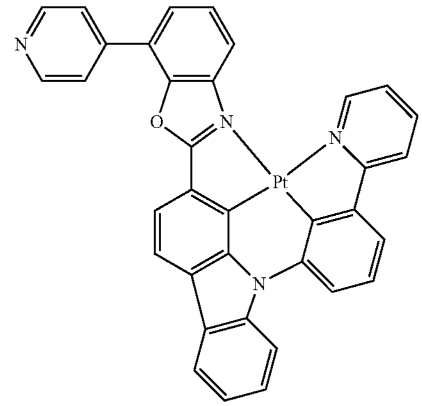
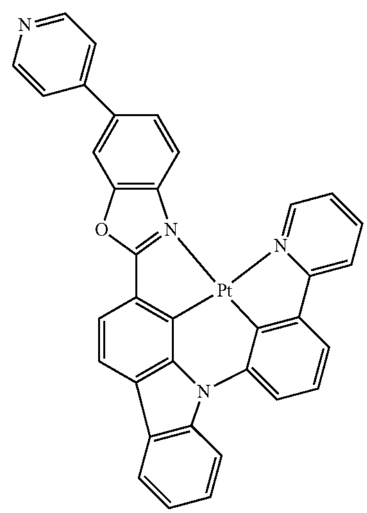
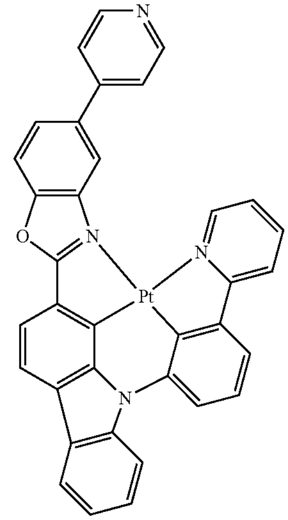

-continued
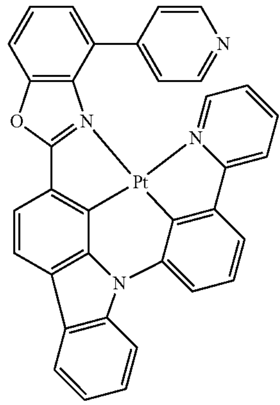
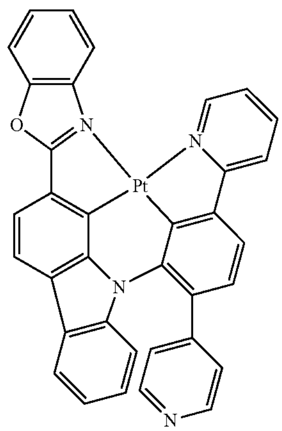
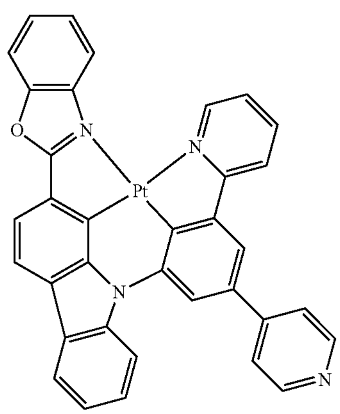
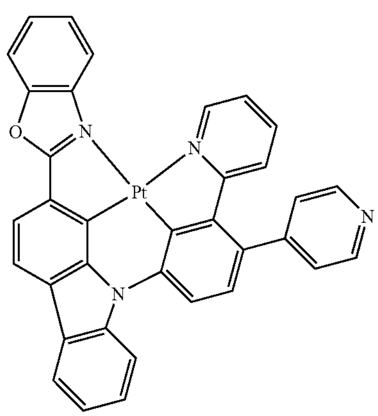
-continued
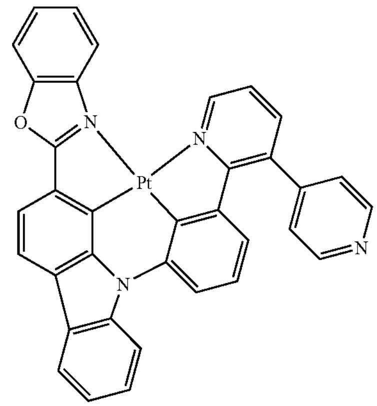
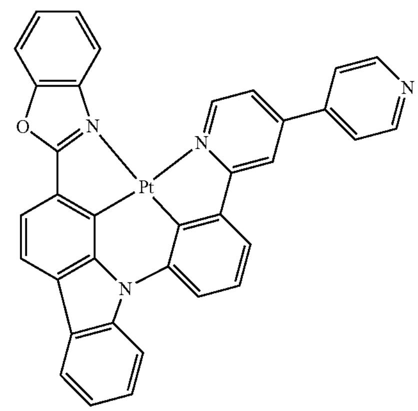
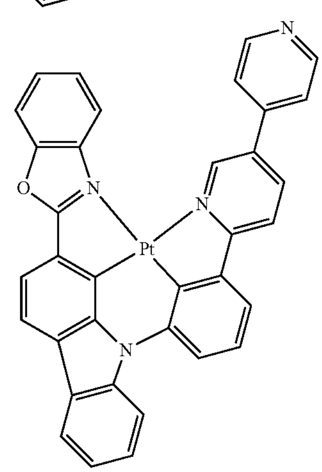
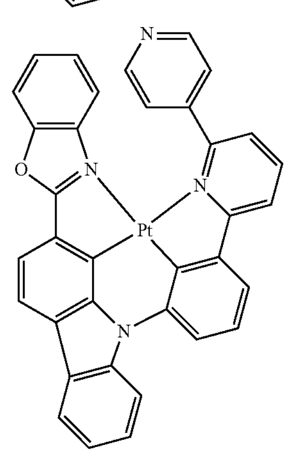

-continued
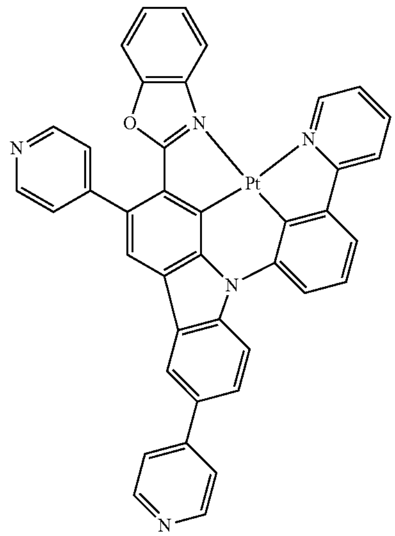
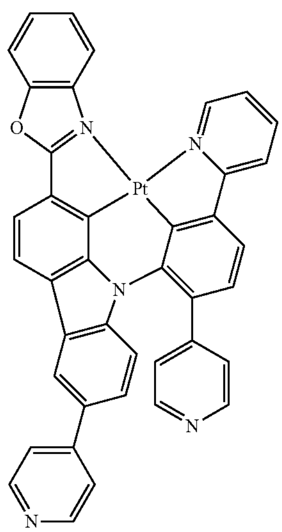
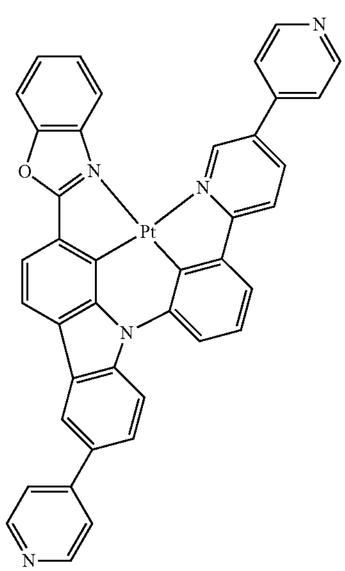
-continued
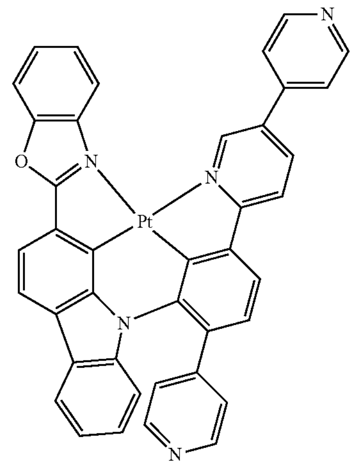
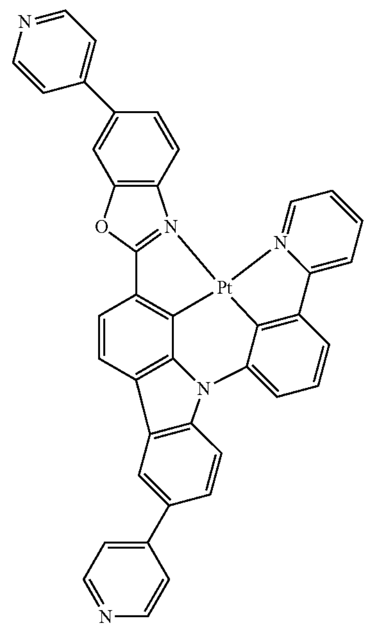
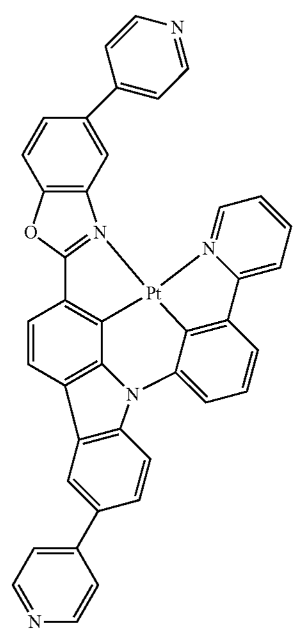

-continued
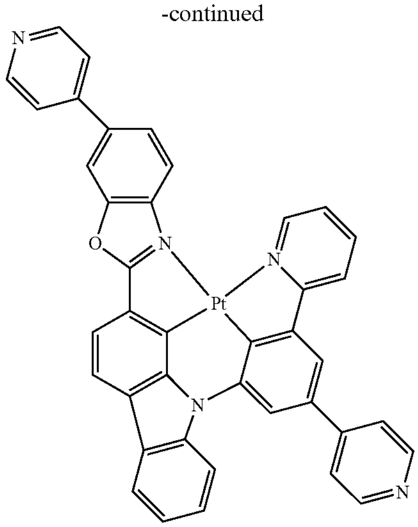
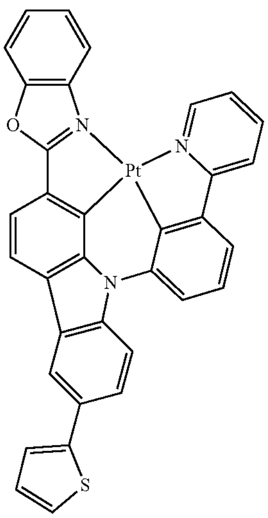
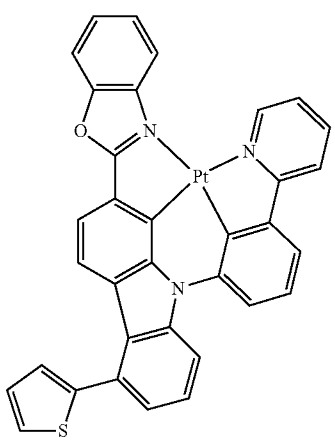
-continued
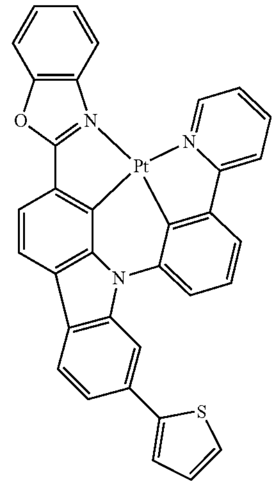
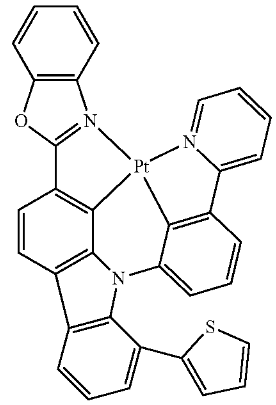
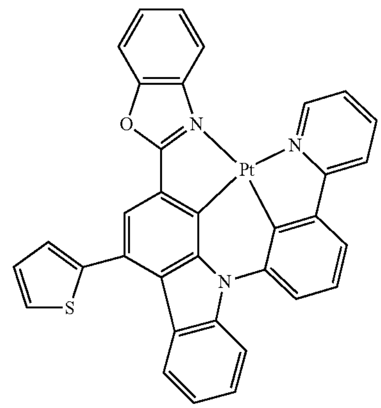
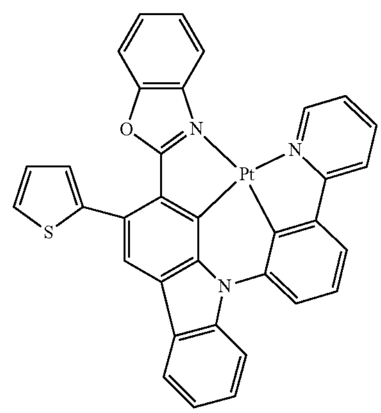
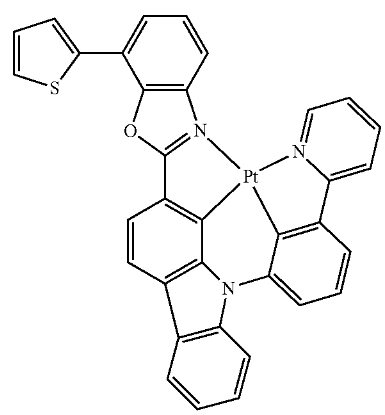

-continued
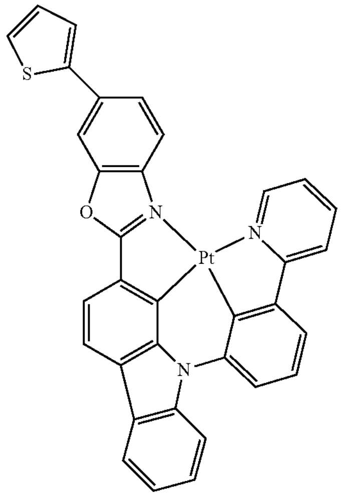
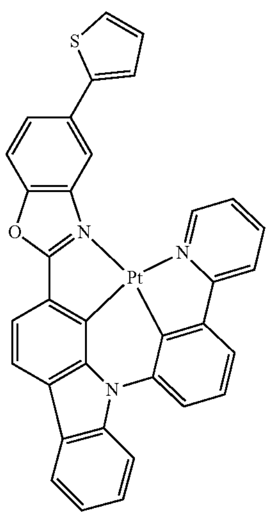
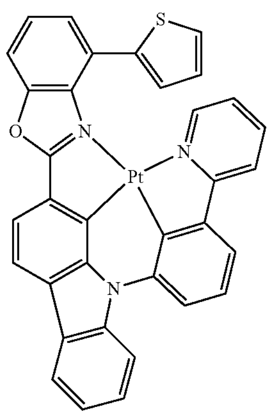
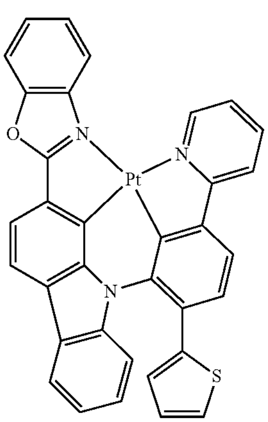
-continued
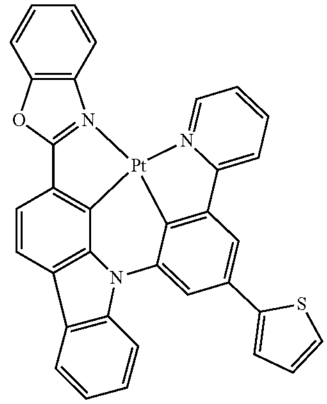
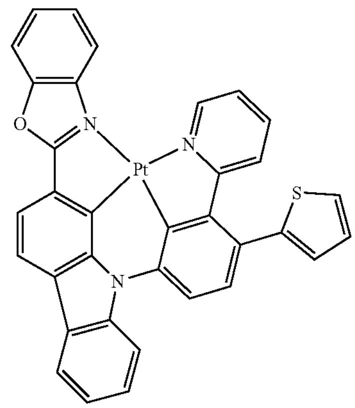
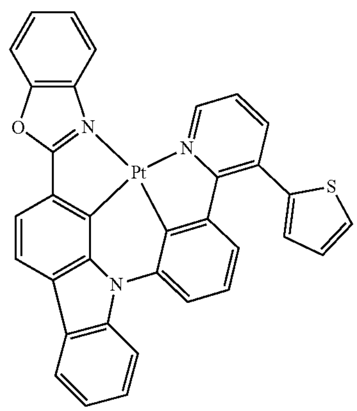
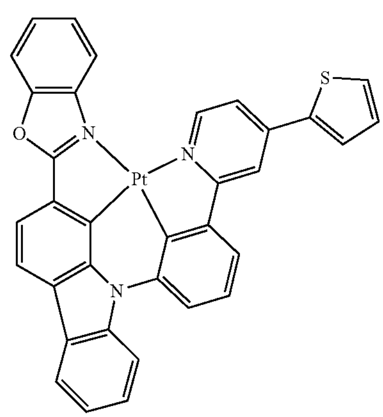

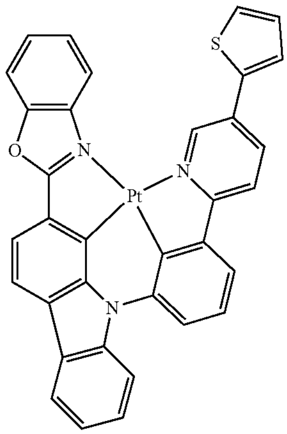
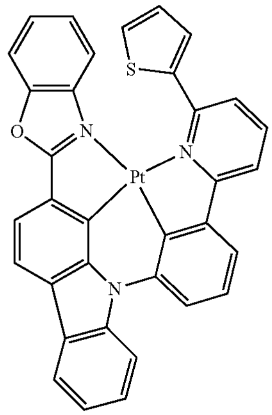
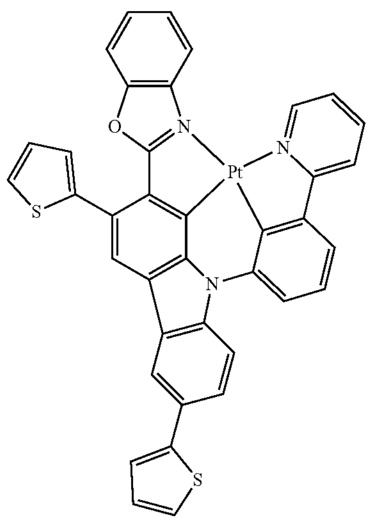
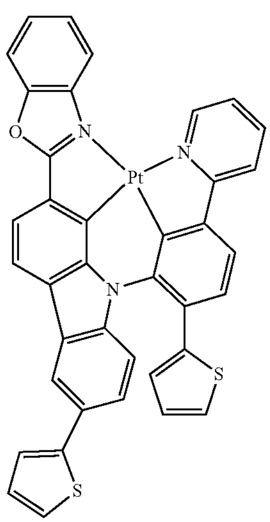
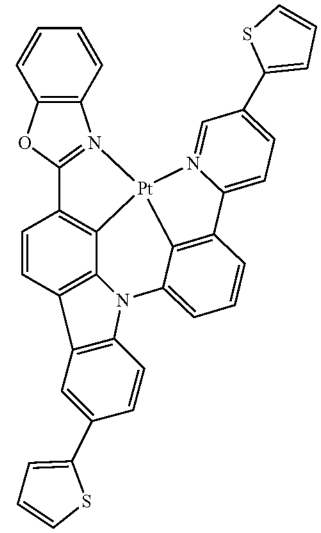
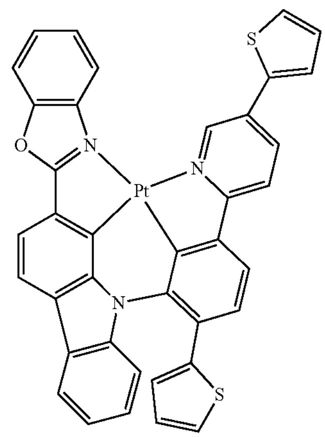
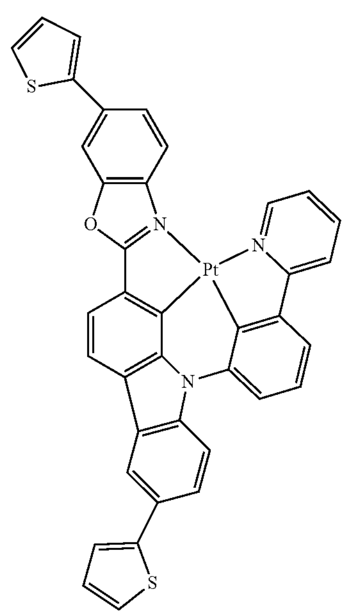

-continued
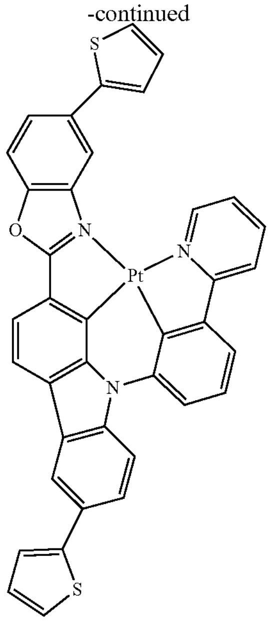
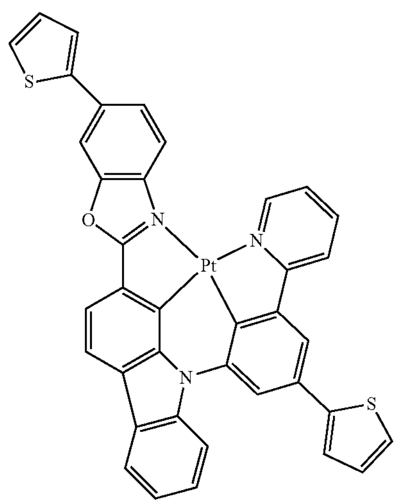
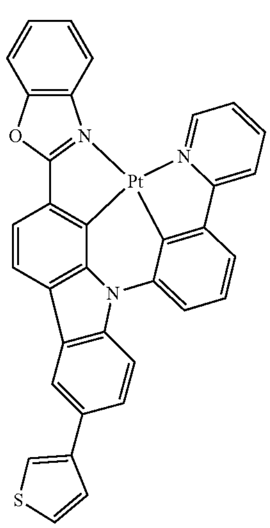
-continued
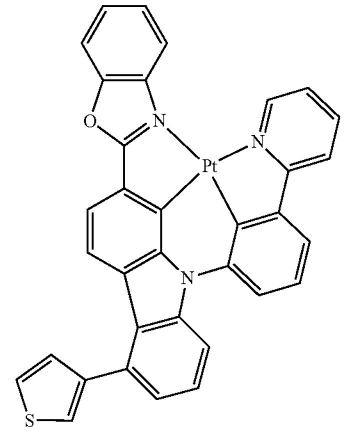
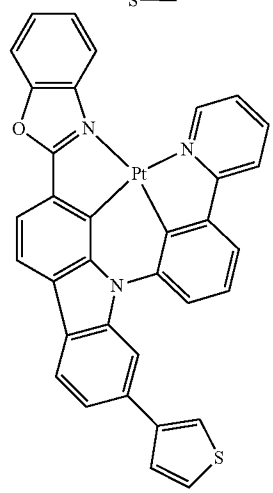
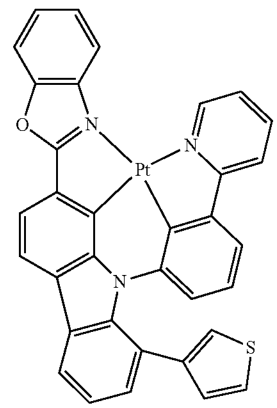
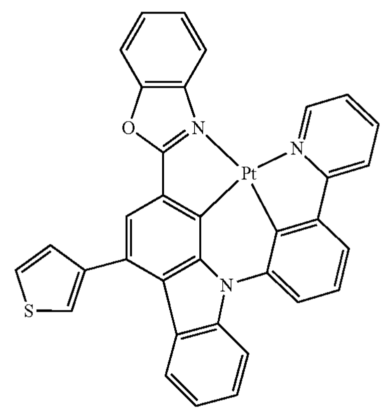
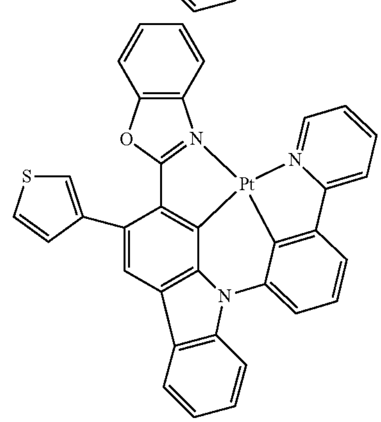

-continued
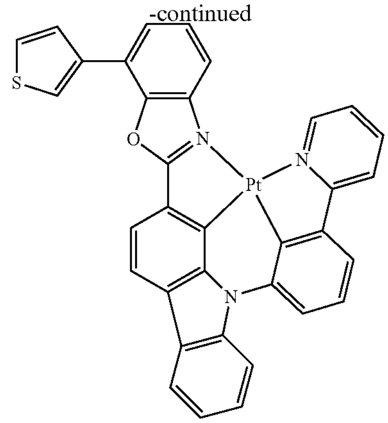
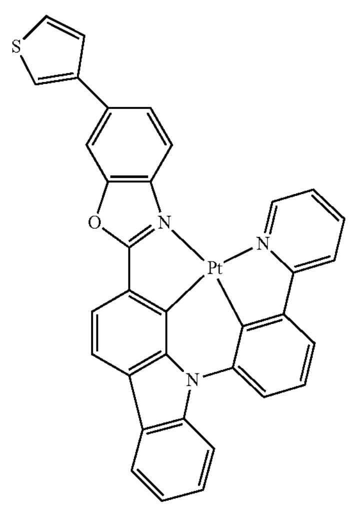
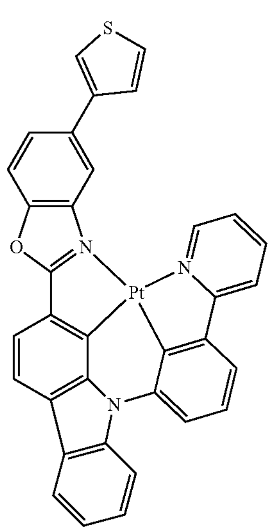
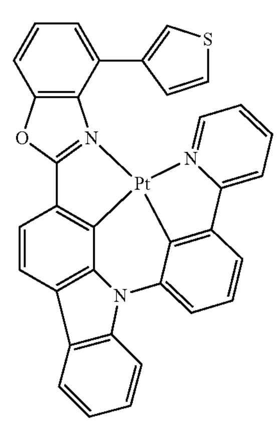
-continued
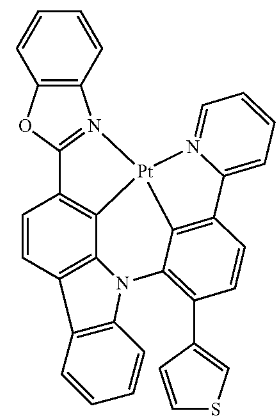
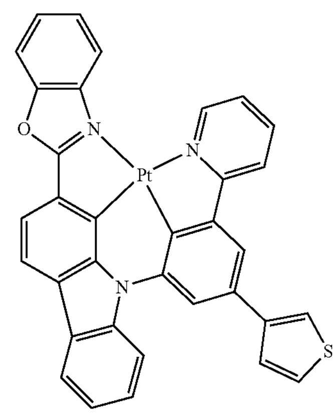
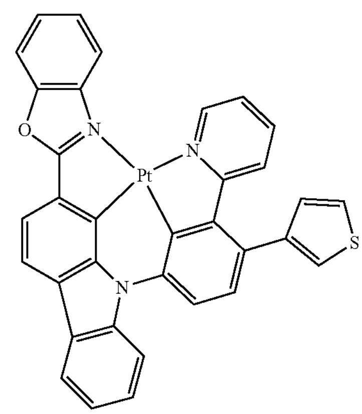
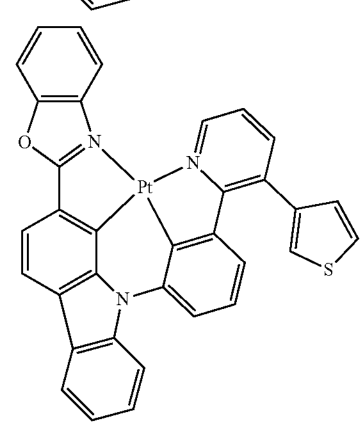

-continued
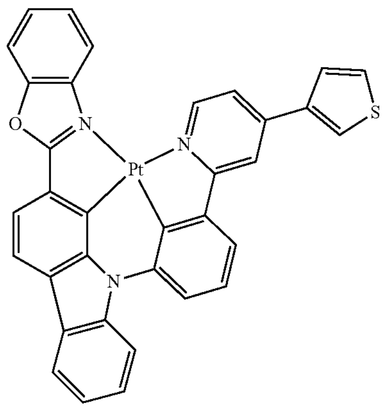
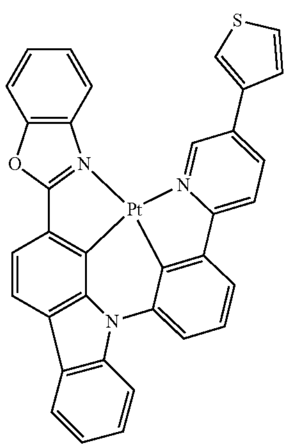
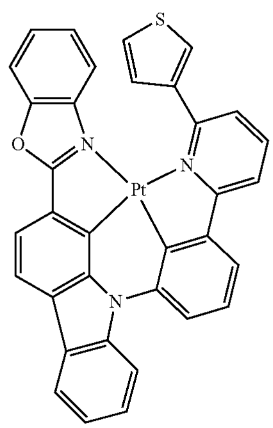
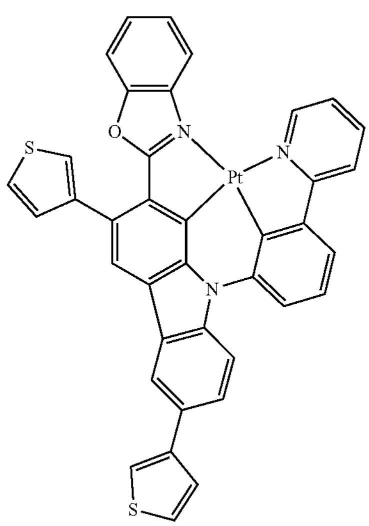
-continued
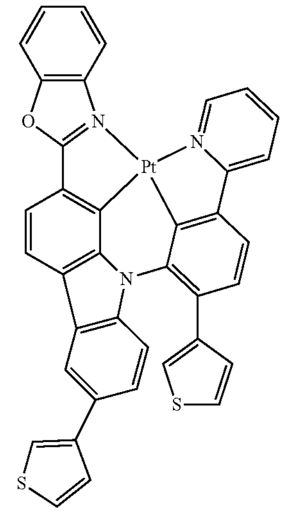
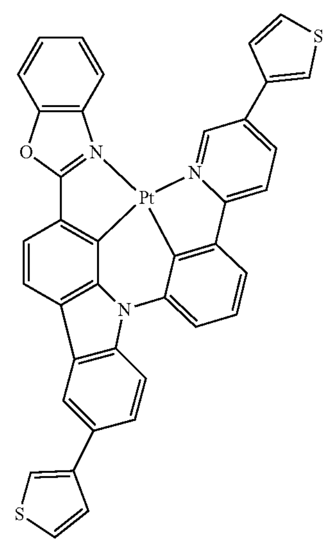
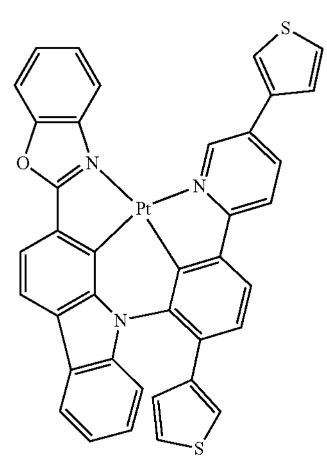

-continued
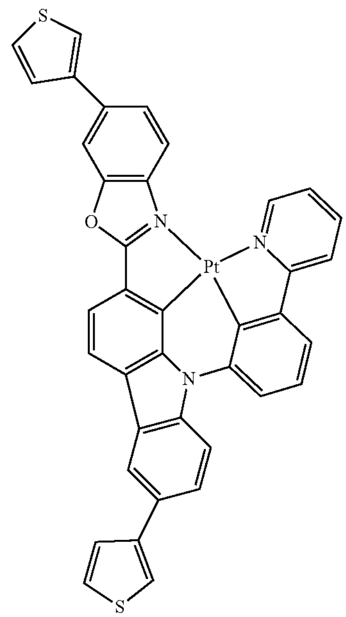
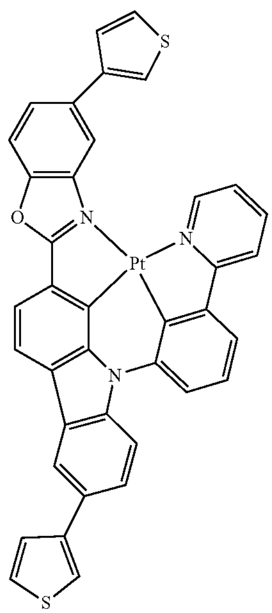
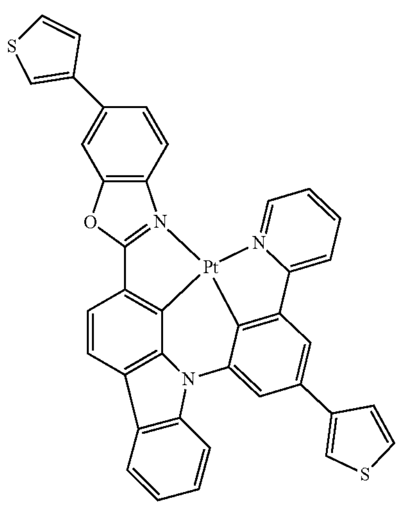
-continued
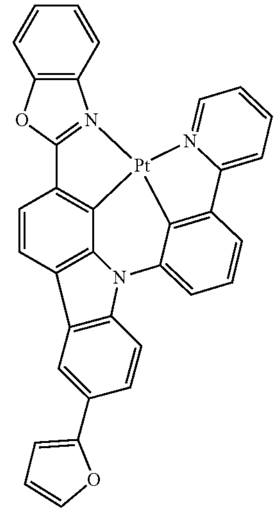
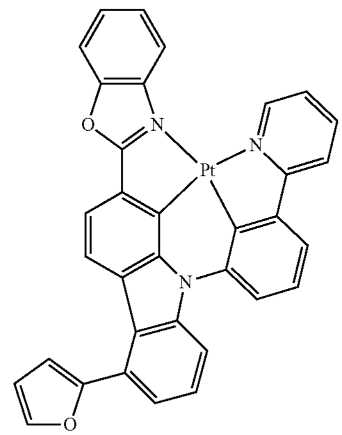
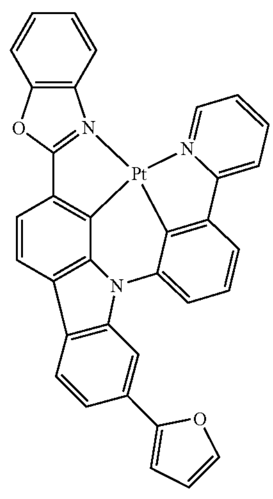
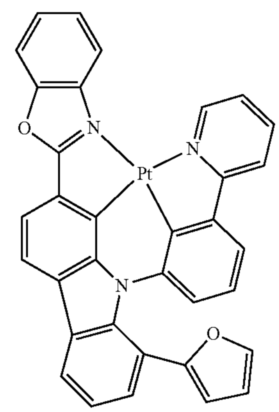

-continued
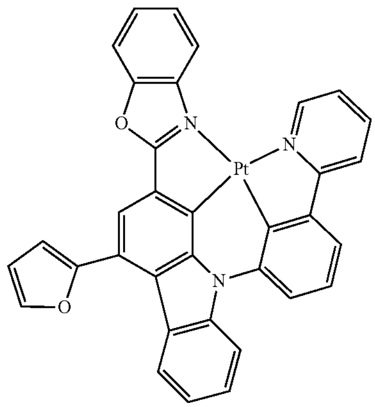
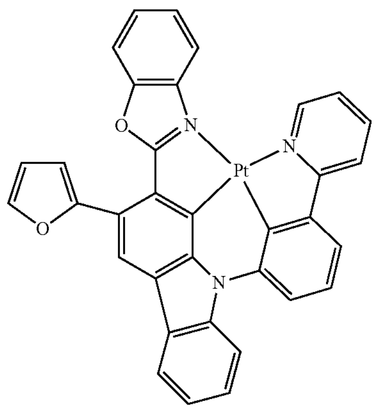
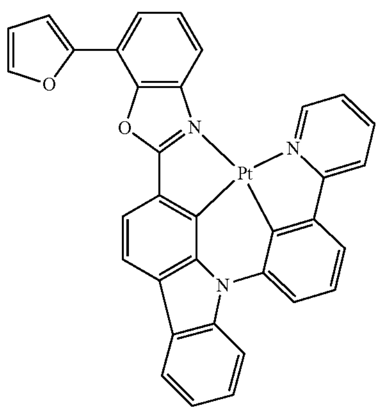
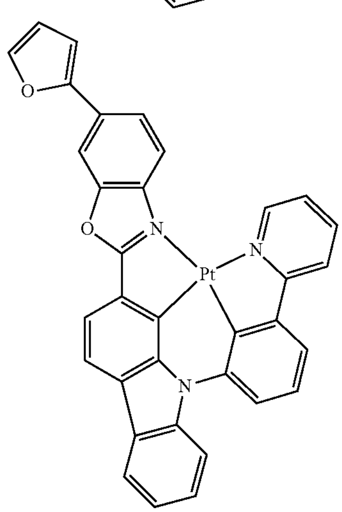
-continued
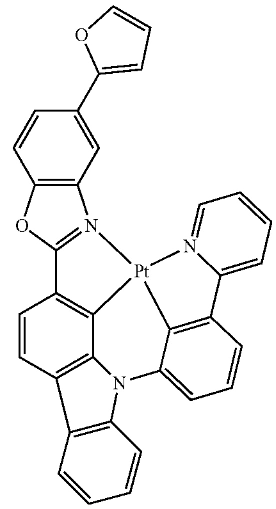
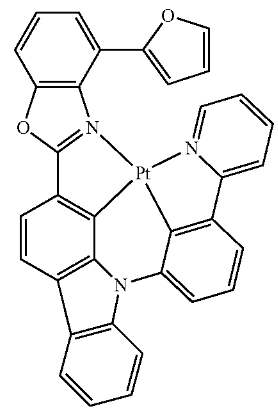
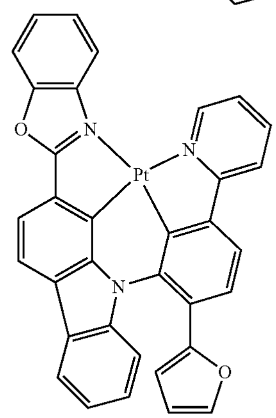
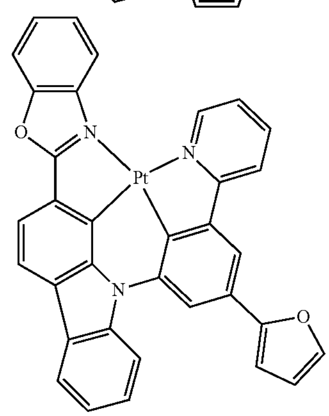
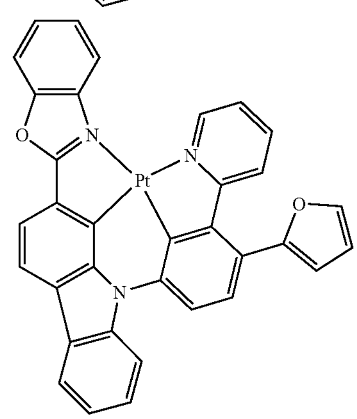

-continued
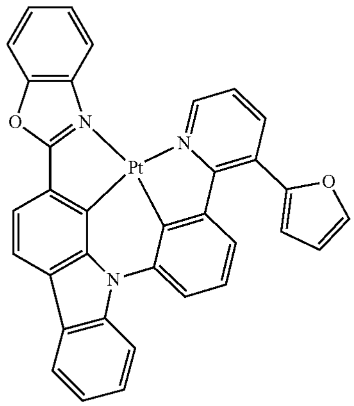
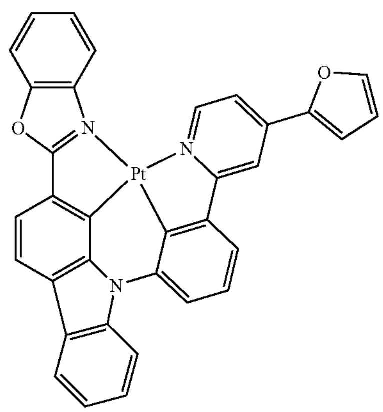
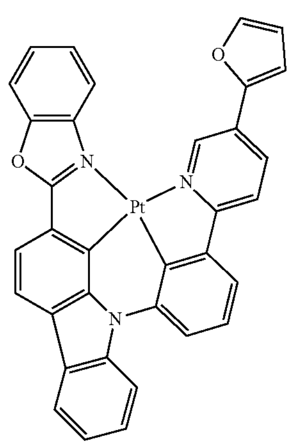
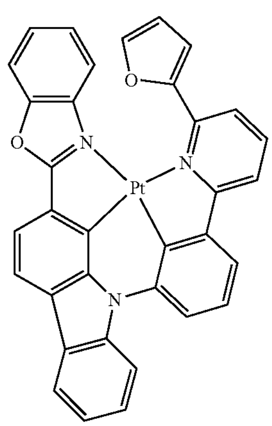
-continued
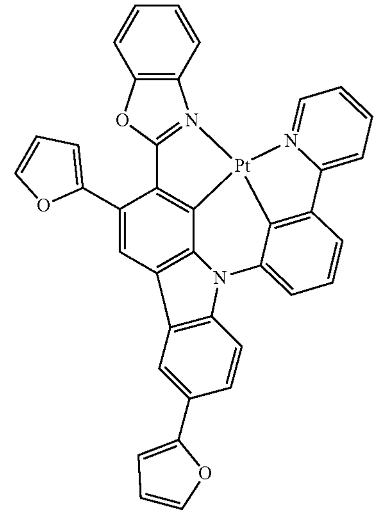
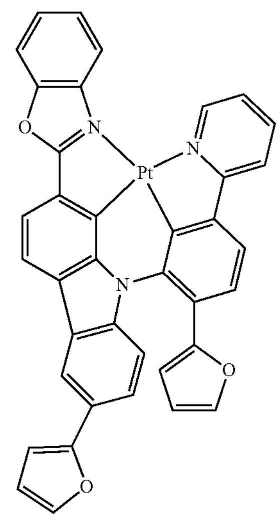
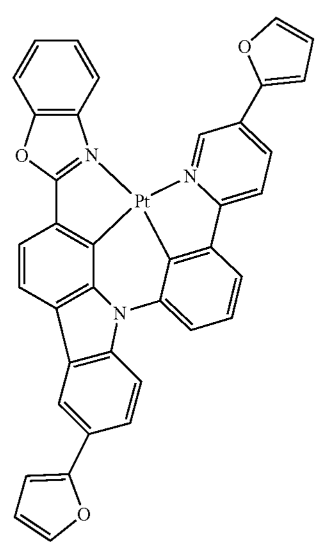

-continued
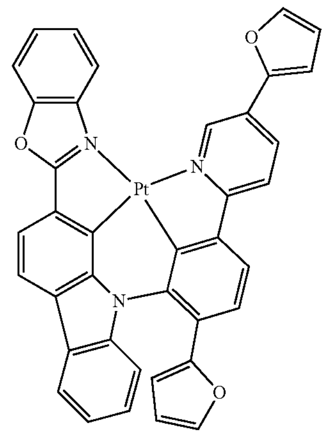
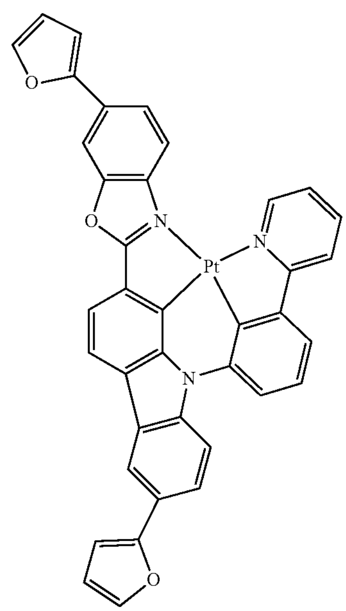
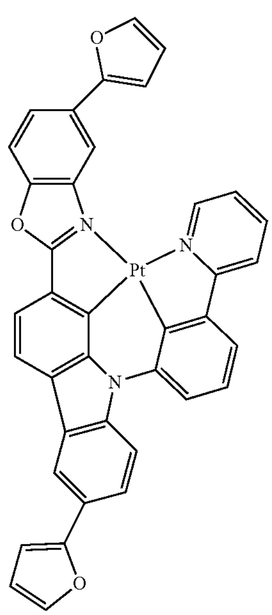
-continued
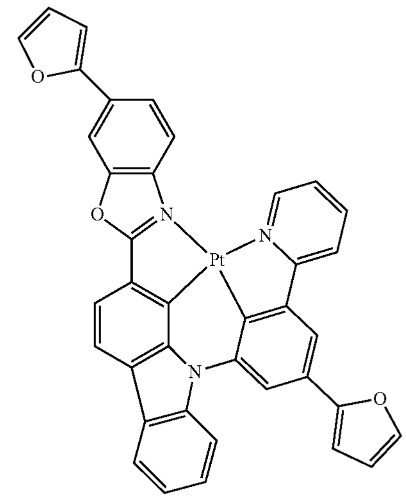
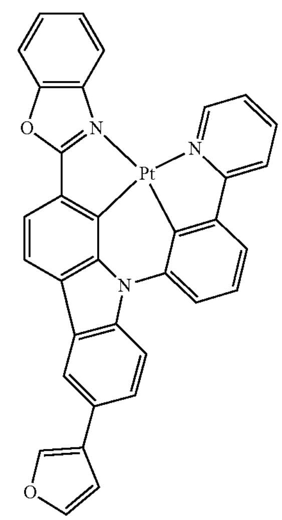
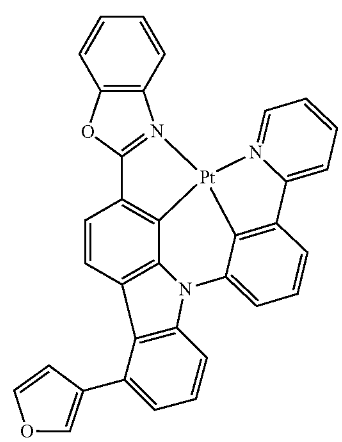

-continued
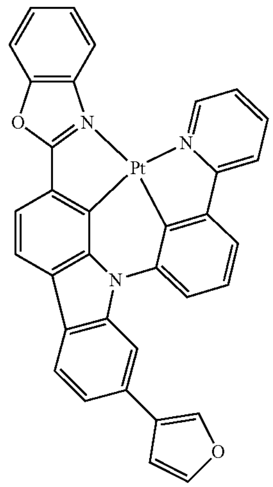
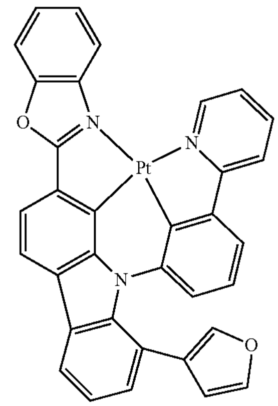
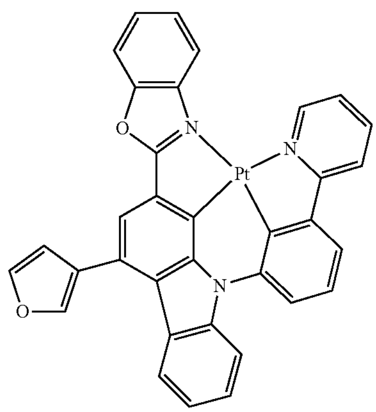
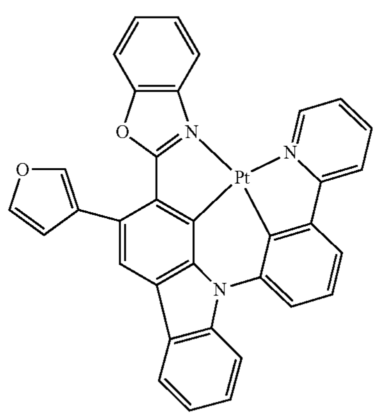
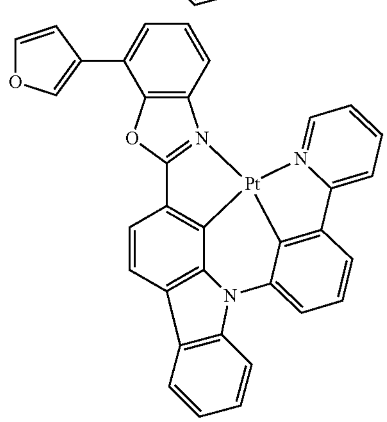
-continued
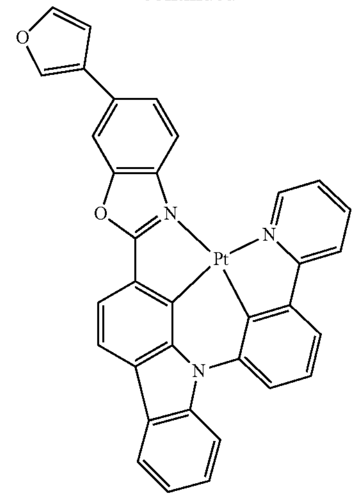
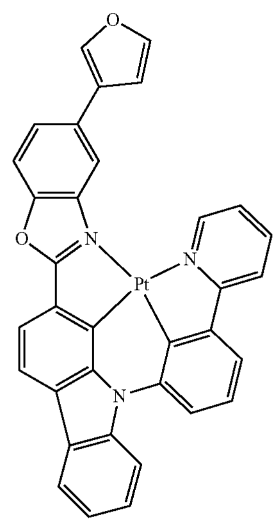
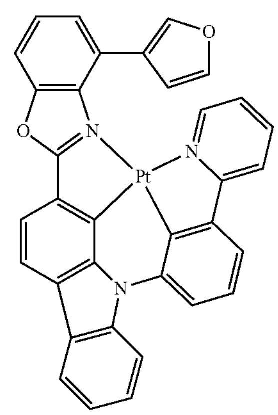
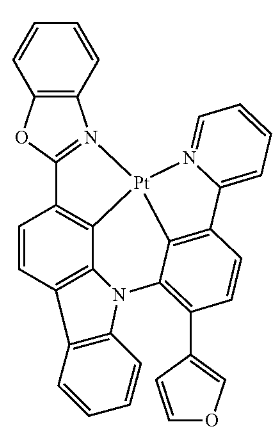

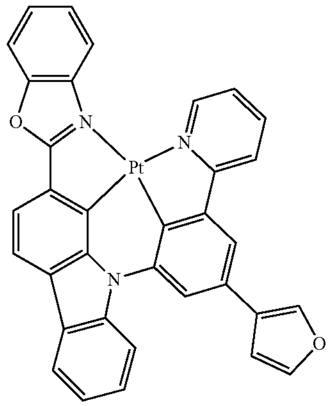
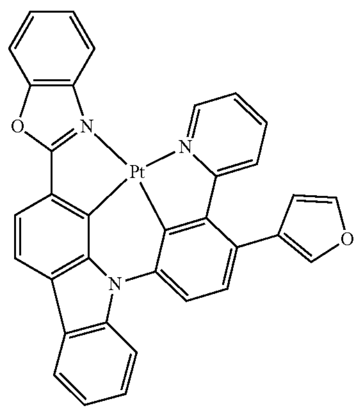
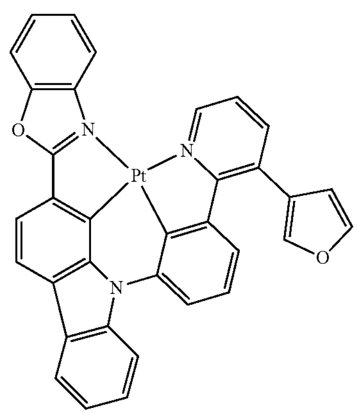
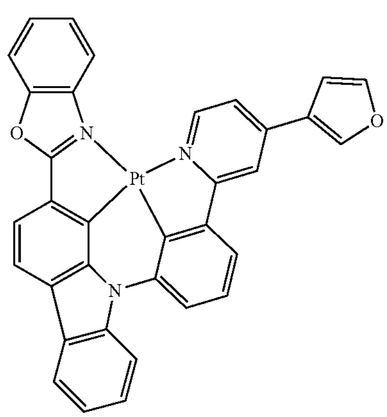
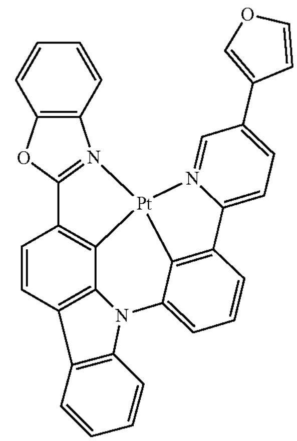
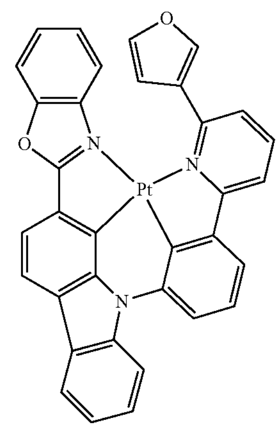
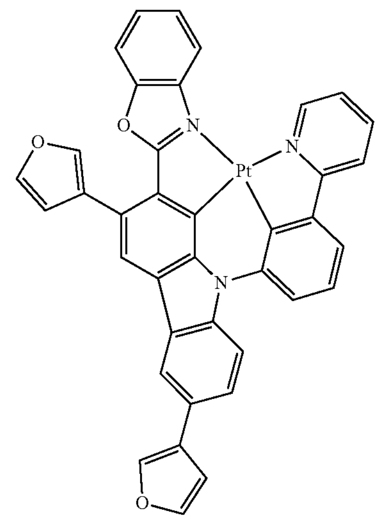
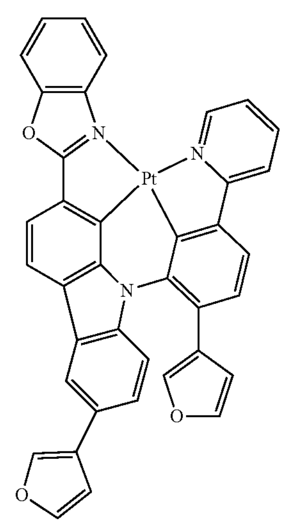

-continued
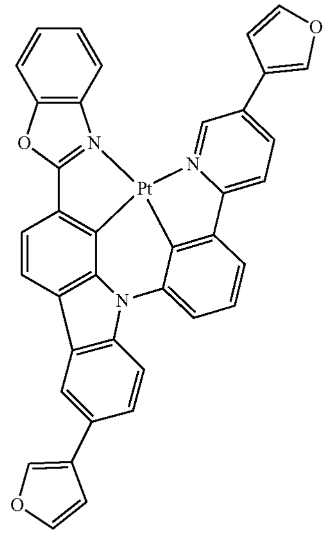
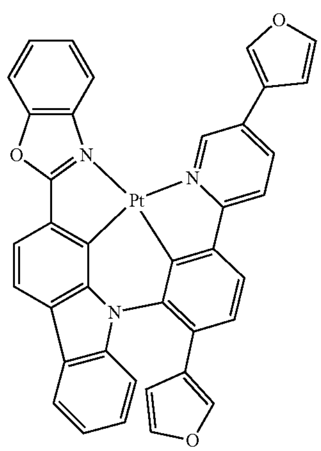
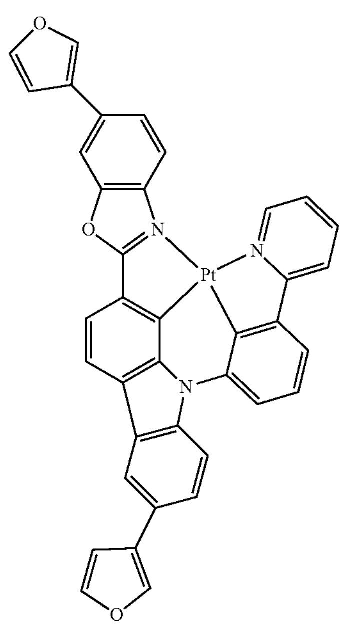
-continued
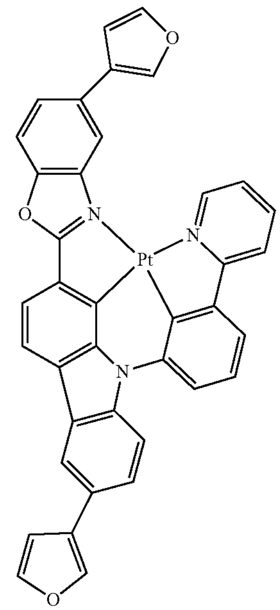
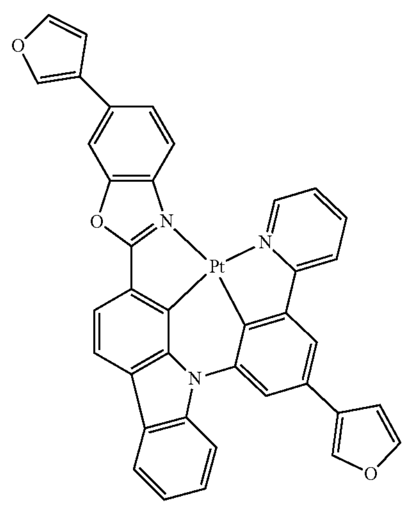
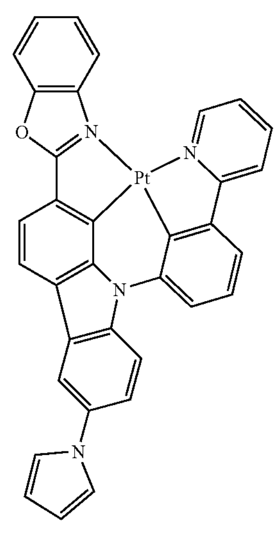

-continued
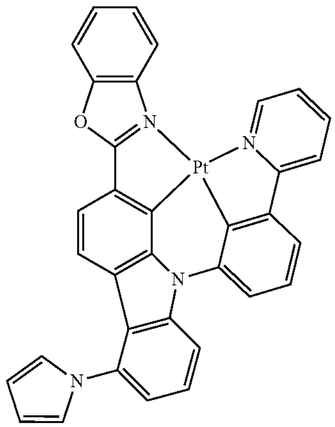
-continued
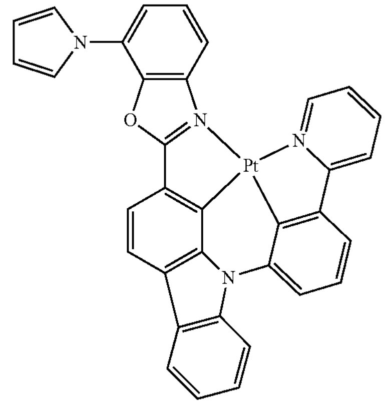
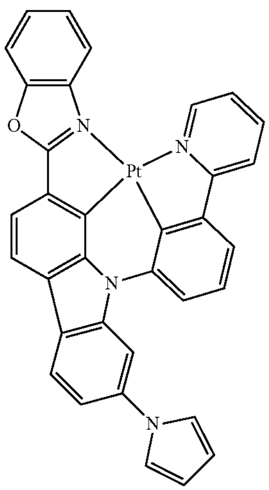
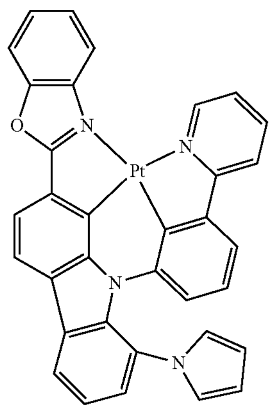
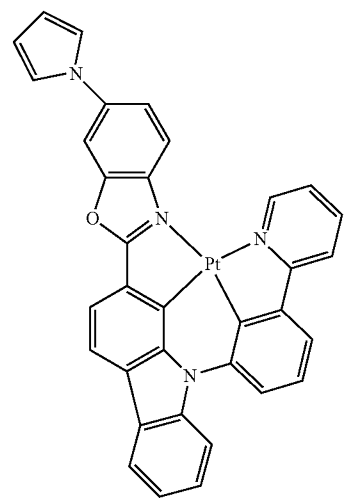
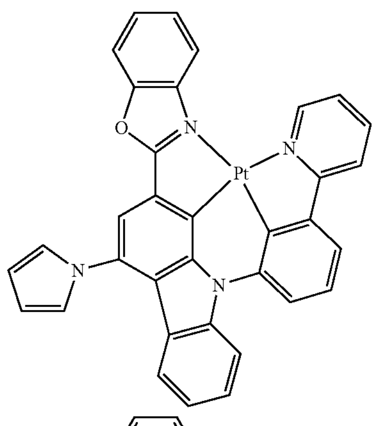
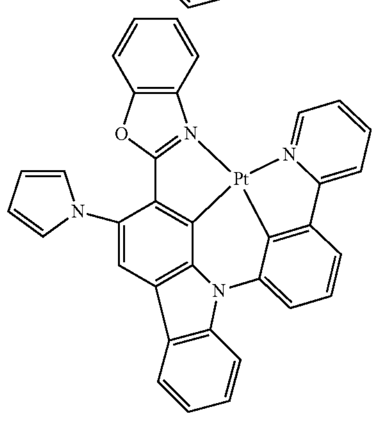
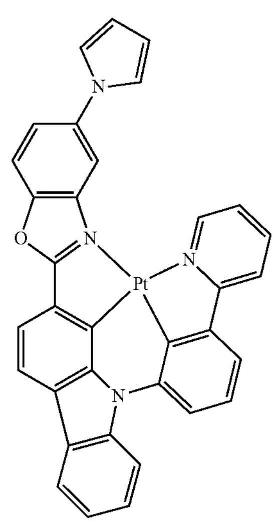
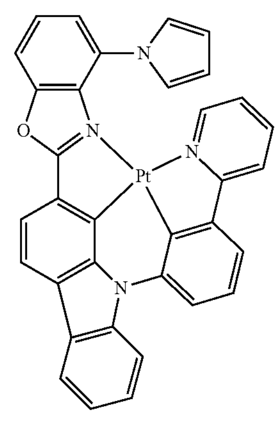

-continued
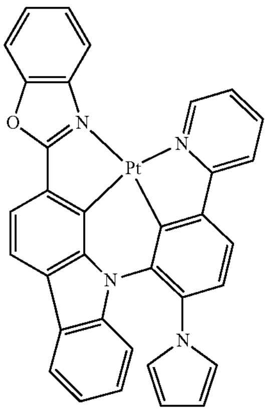
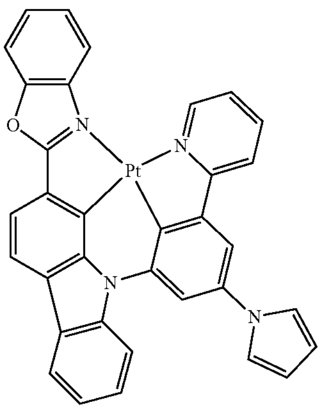
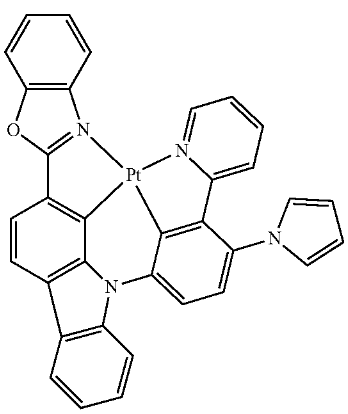
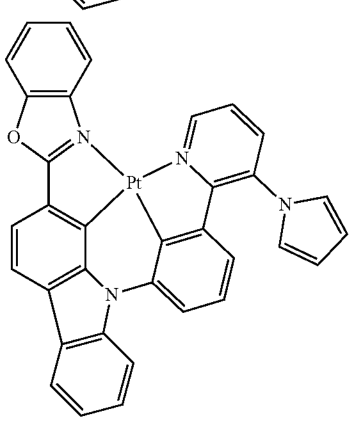
-continued
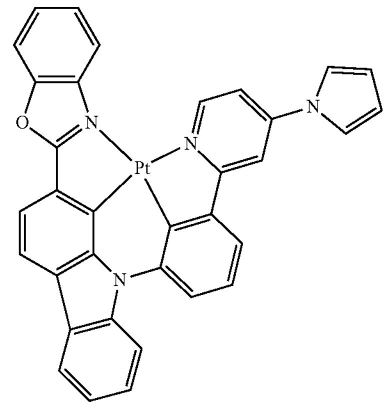
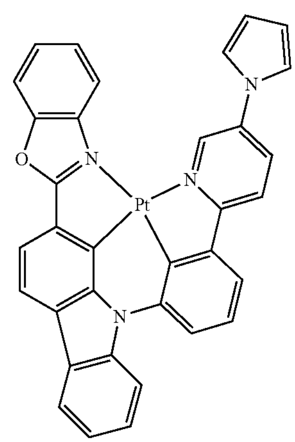
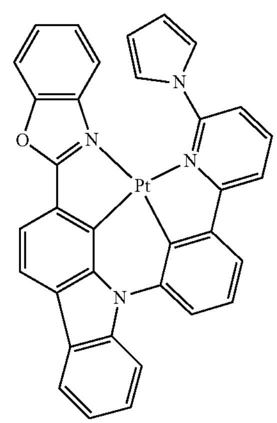
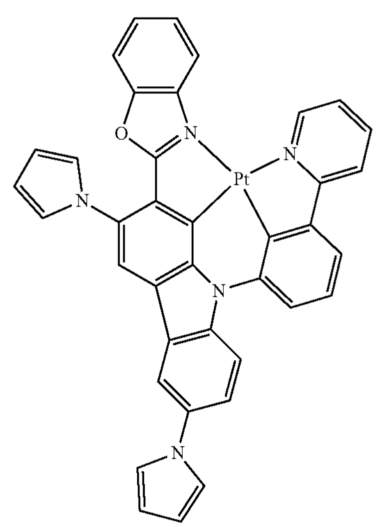

-continued
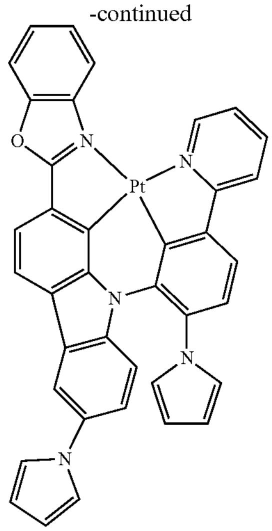
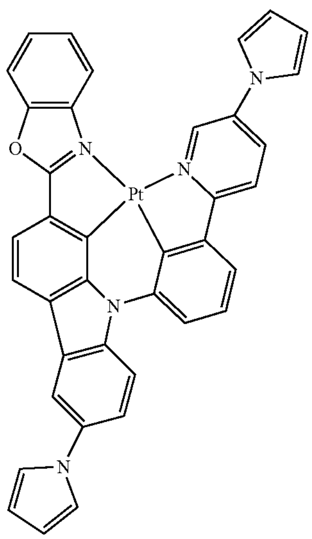
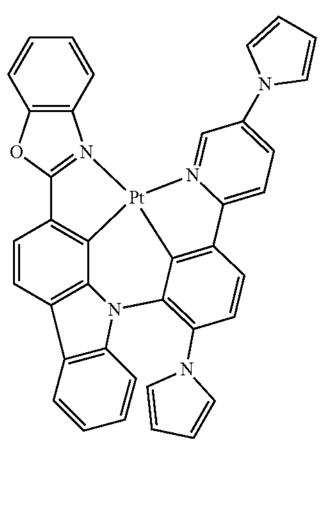
-continued
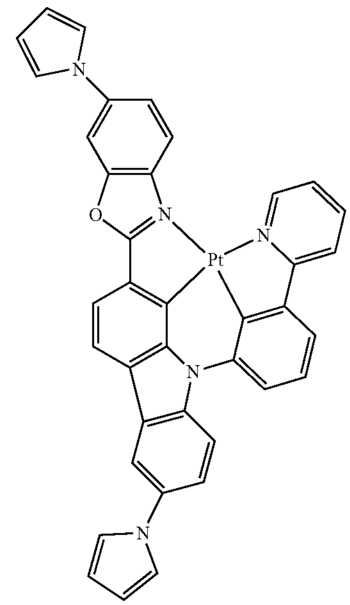
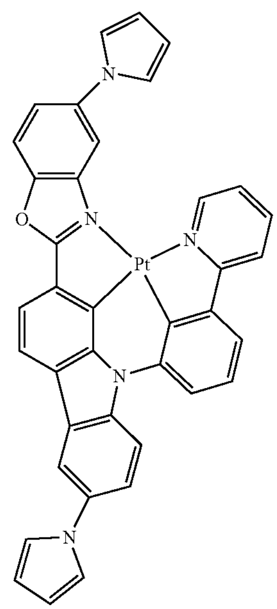
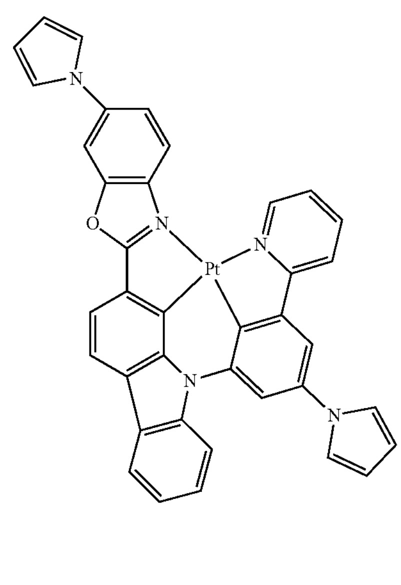

-continued
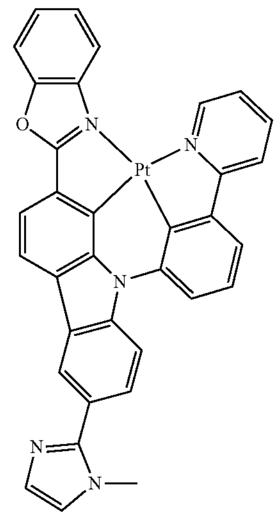
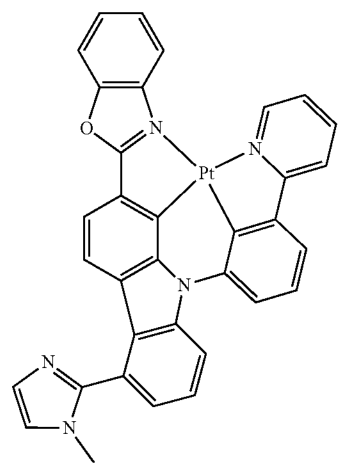
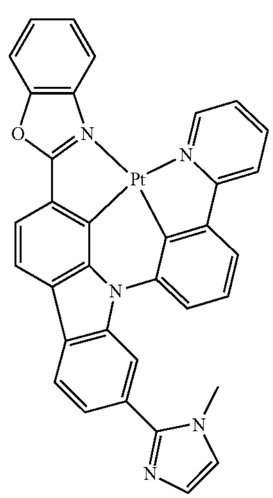
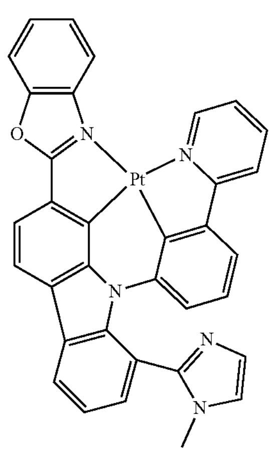
-continued
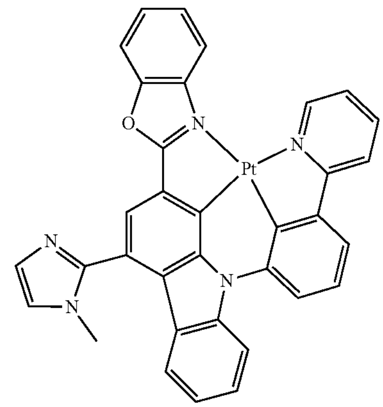
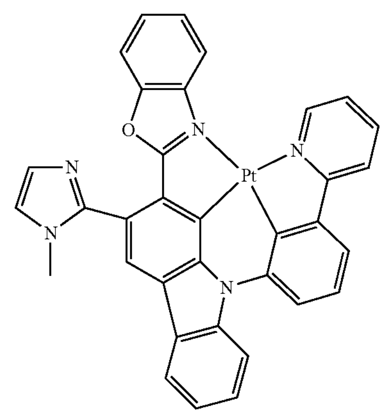
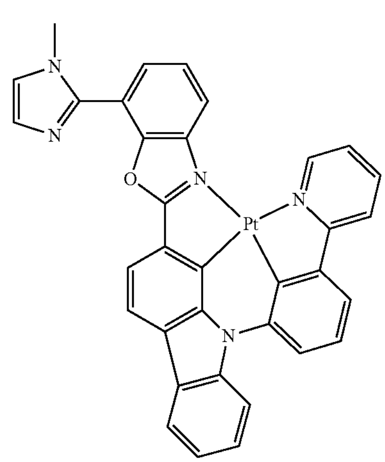

-continued
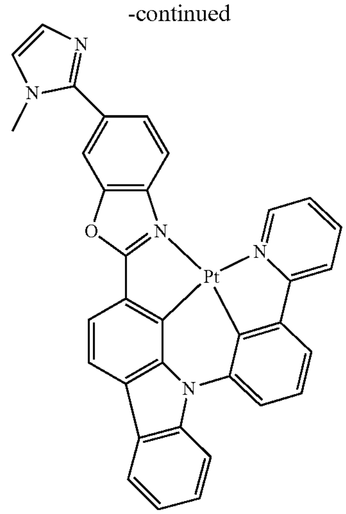
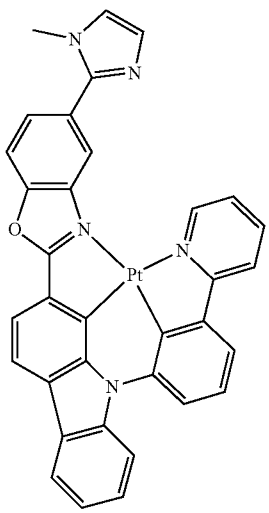
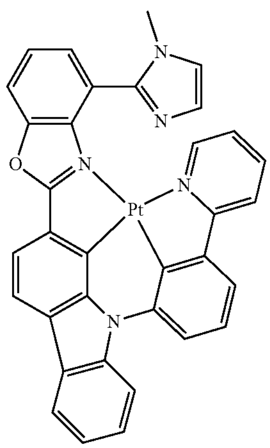
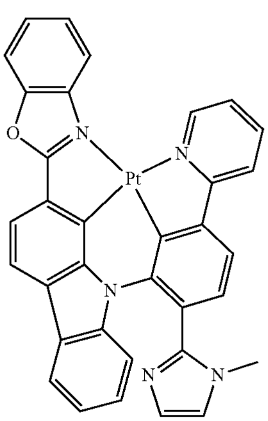
-continued
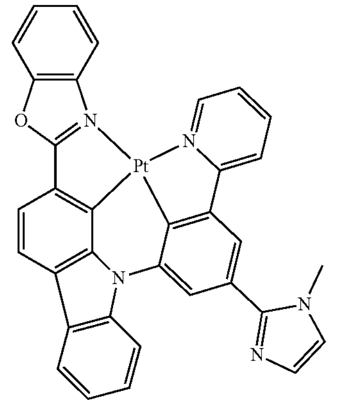
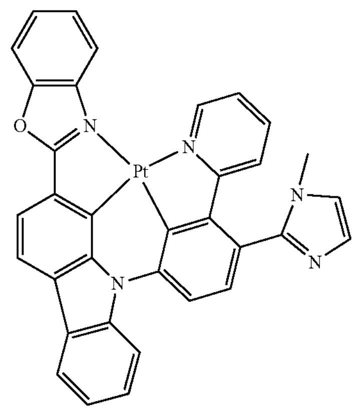
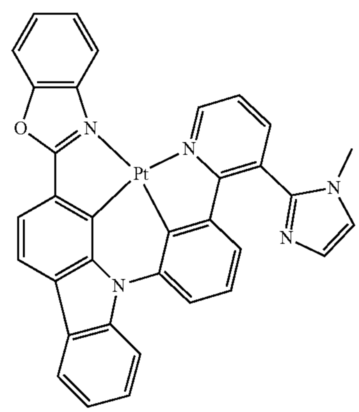
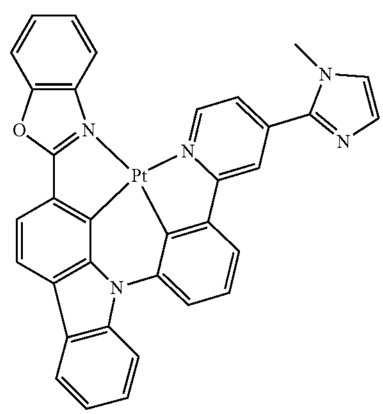

-continued
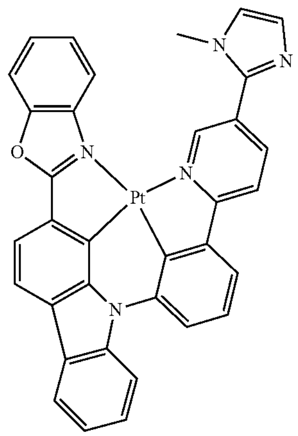
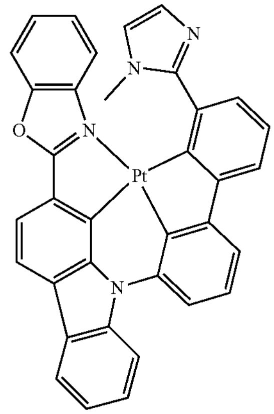
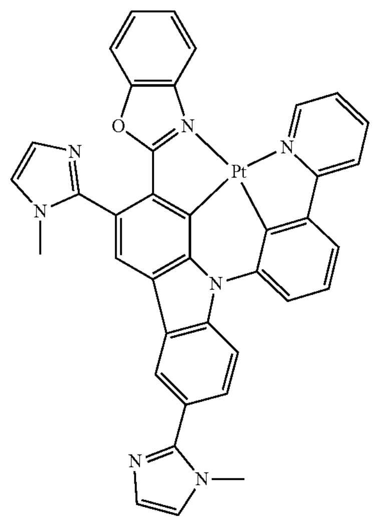
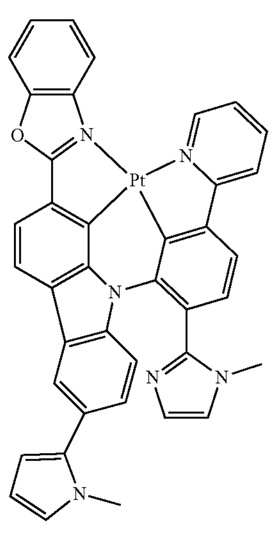
-continued
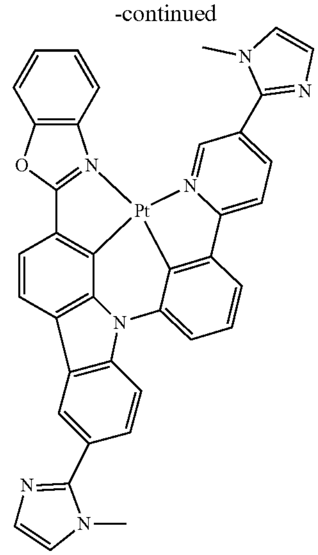
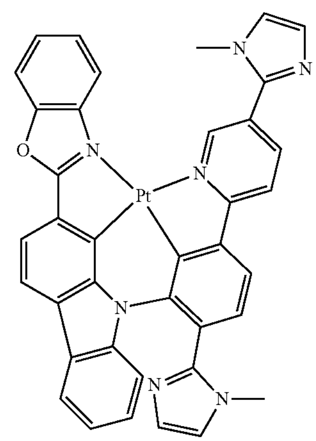
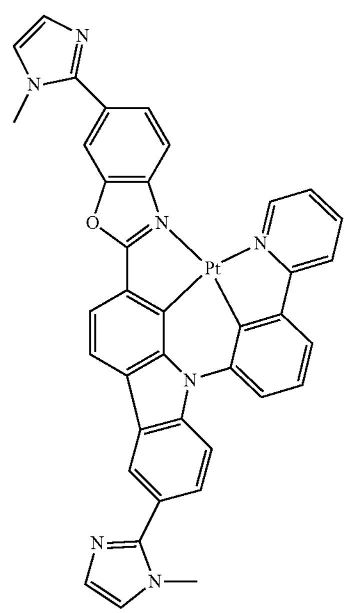

-continued
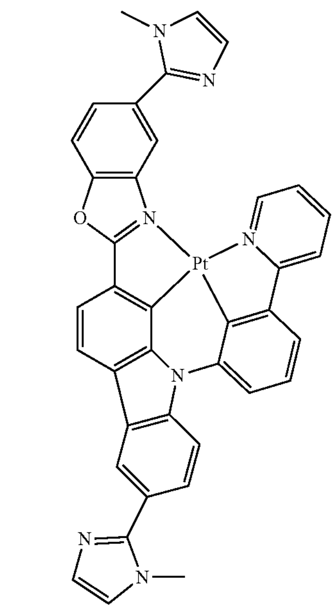
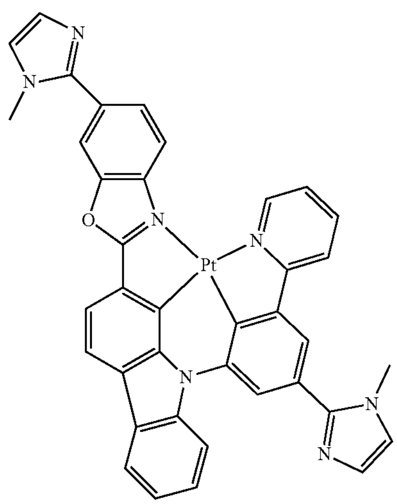
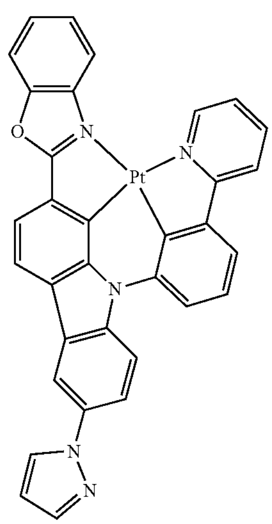
-continued
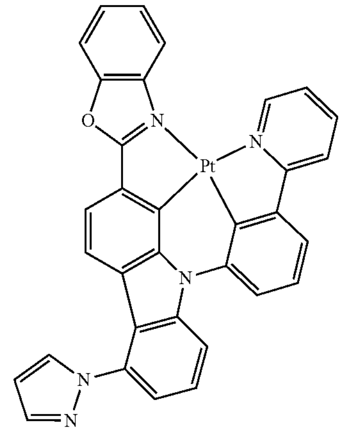
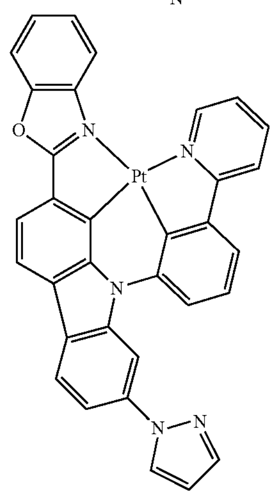
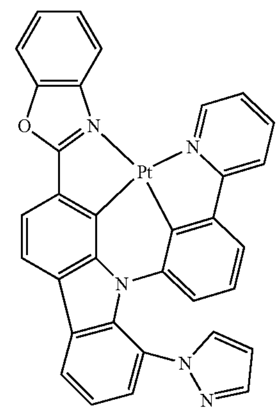
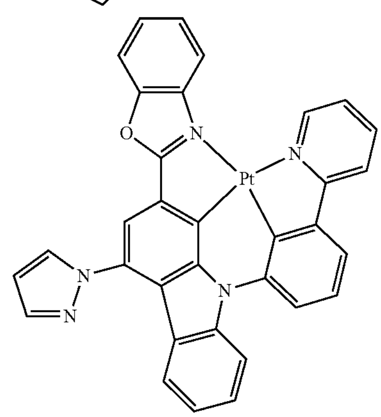
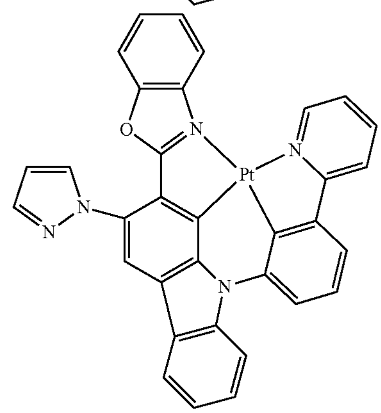

-continued
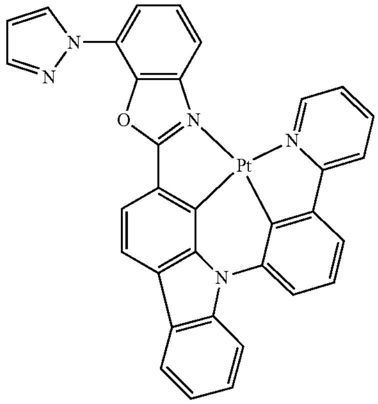
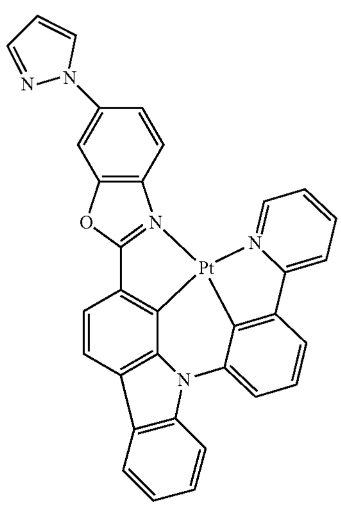
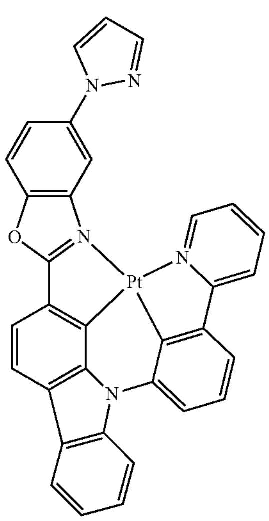
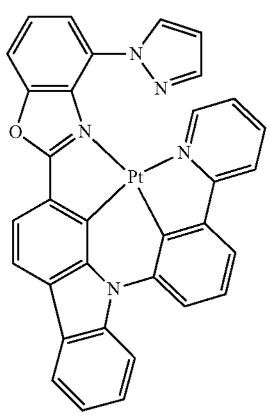
-continued
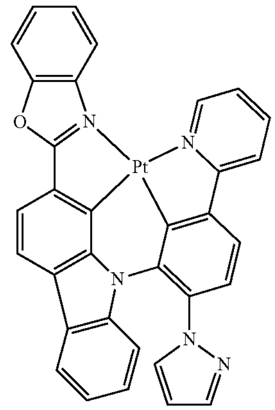
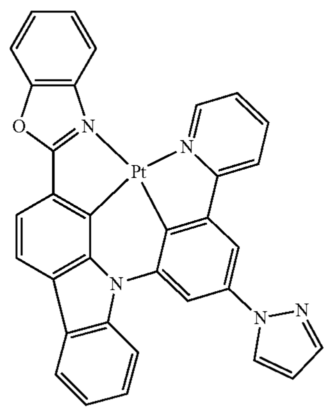
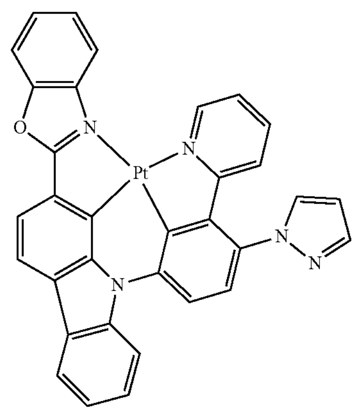
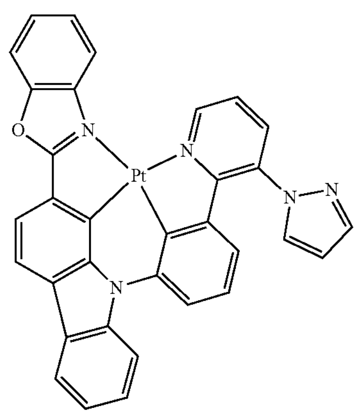

-continued
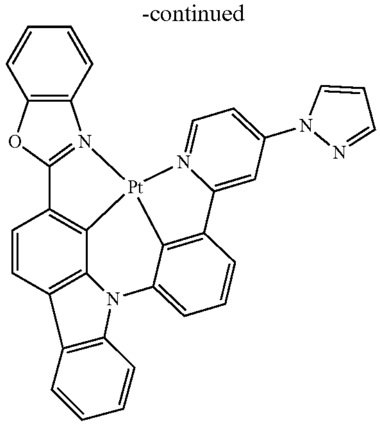
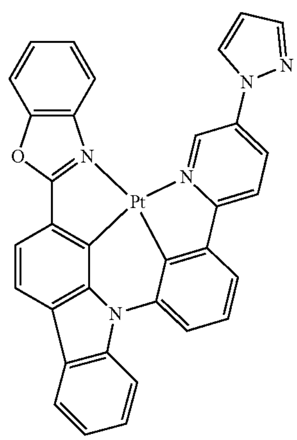
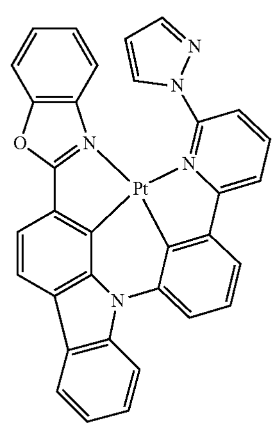
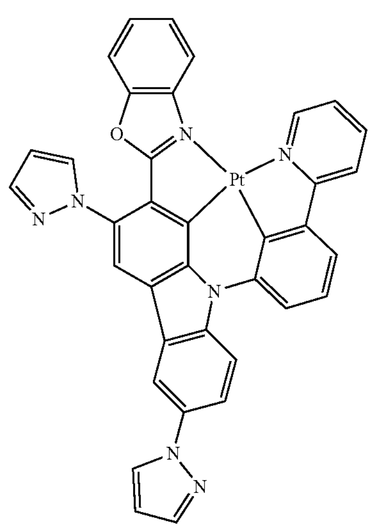
-continued
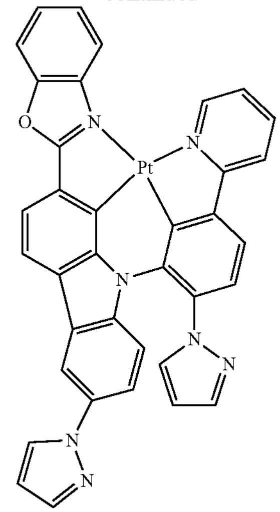
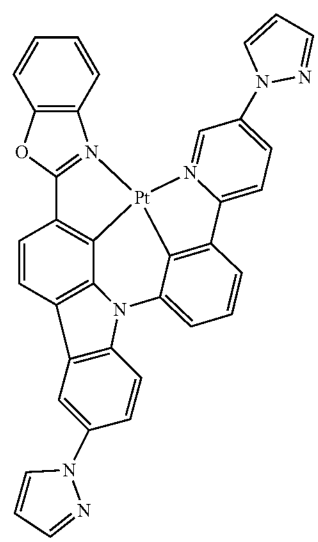
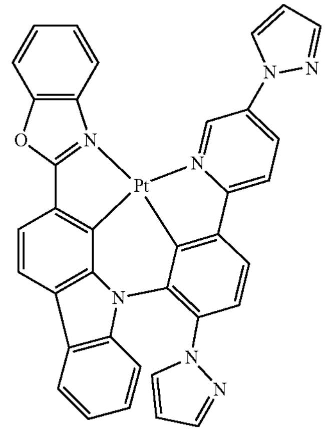

-continued
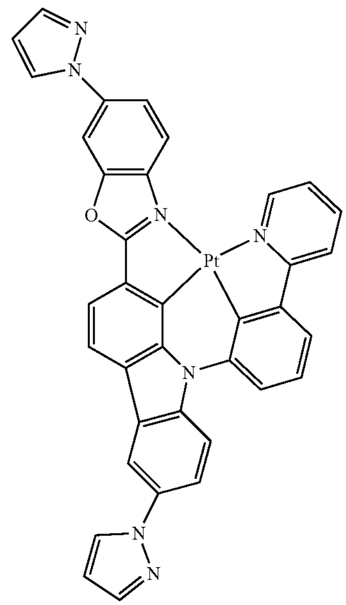
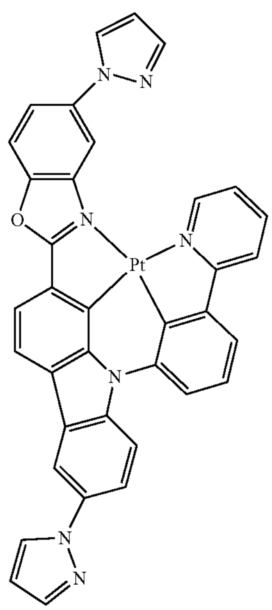
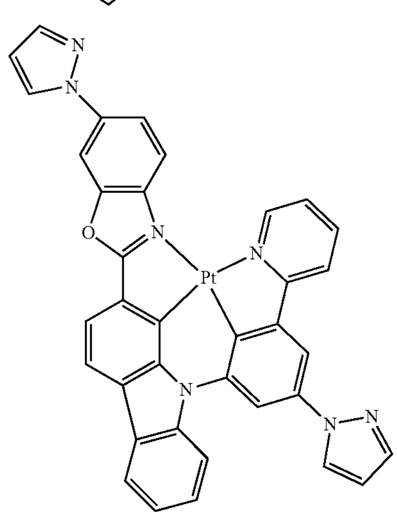
-continued
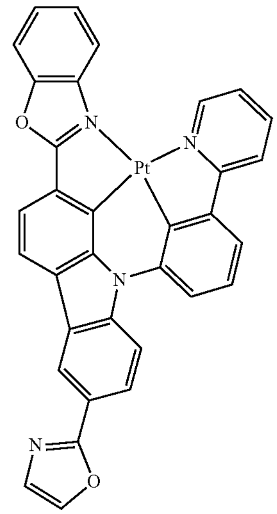
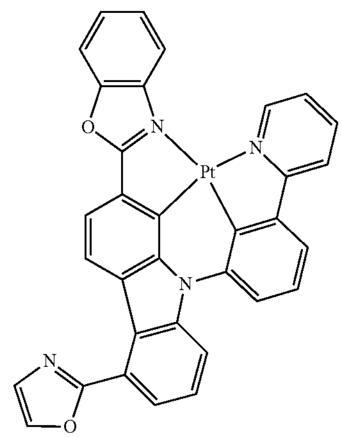
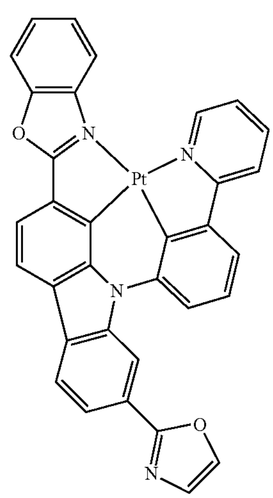
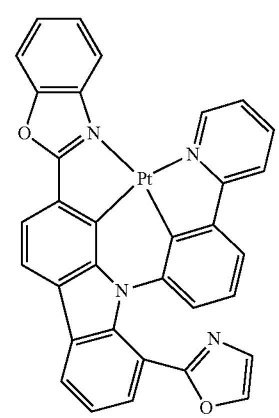

-continued
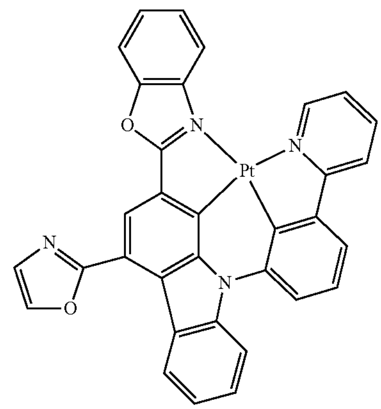
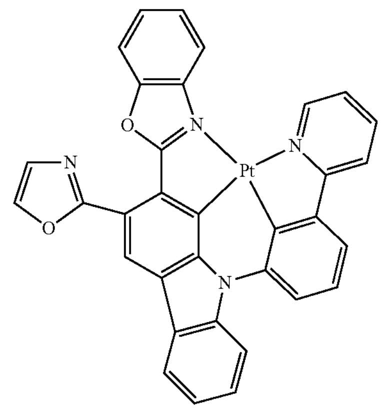
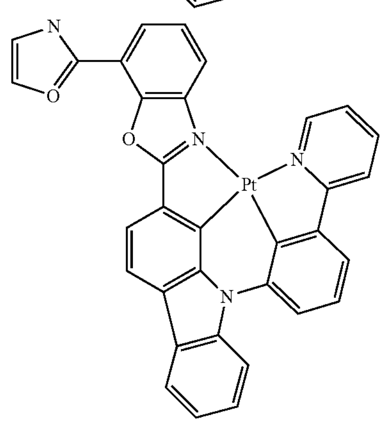
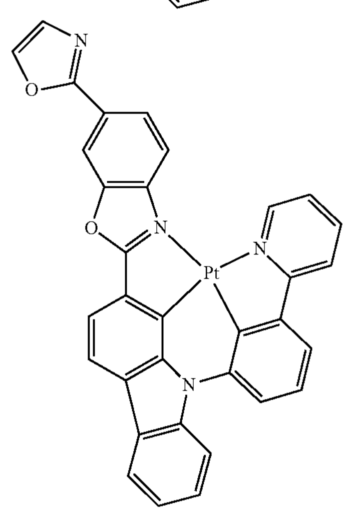
-continued
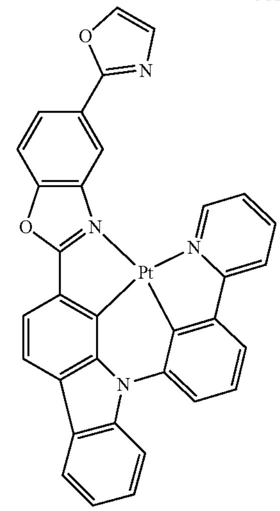
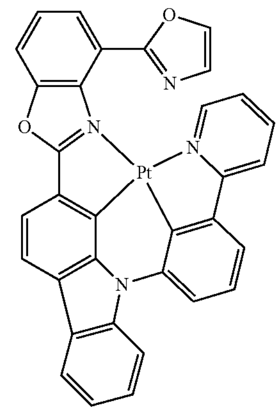
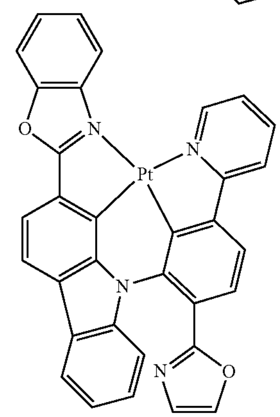
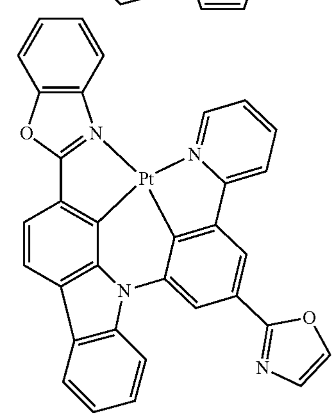
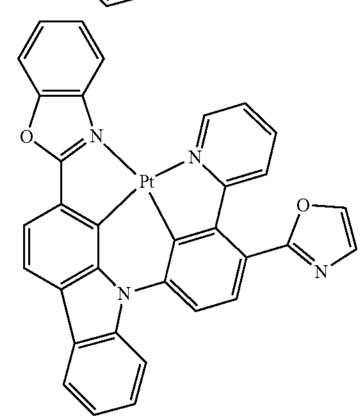

-continued
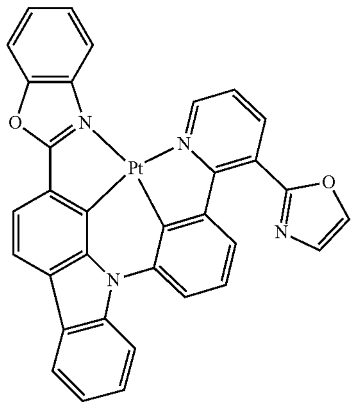
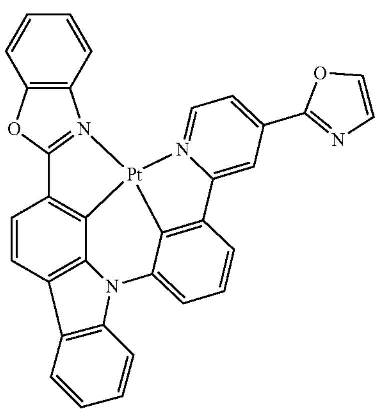
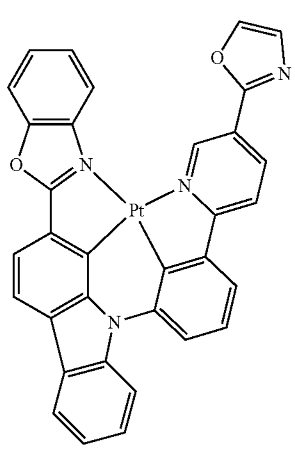
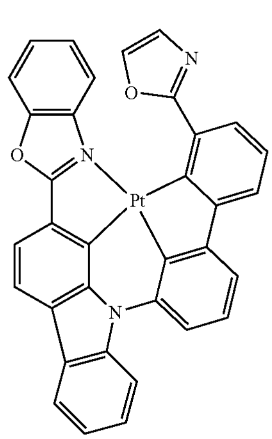
-continued
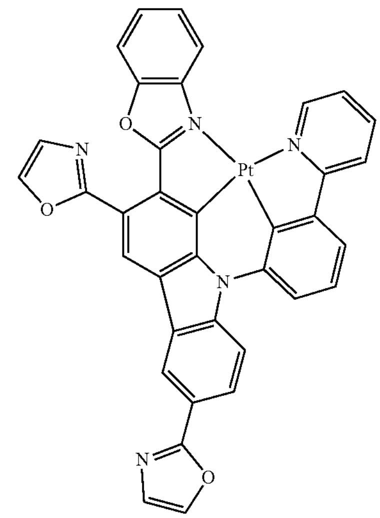
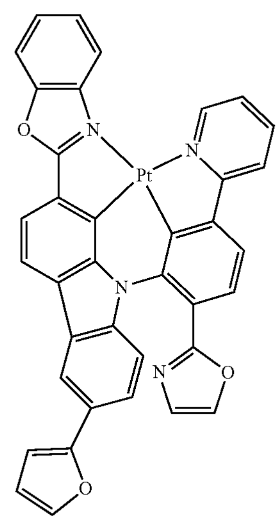
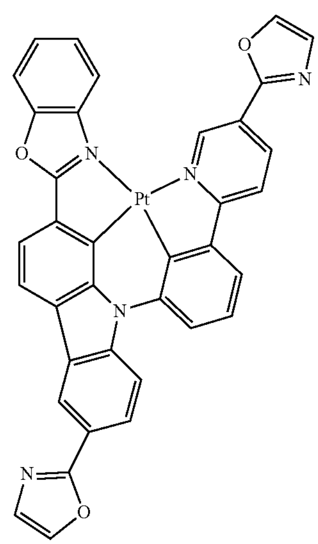

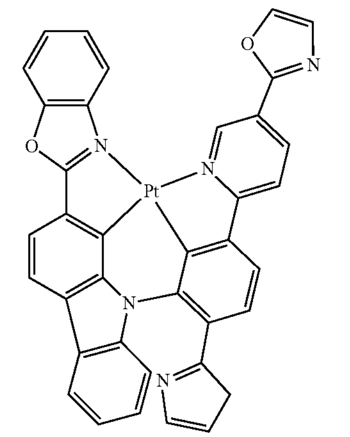
O
N
O
N
Pt
N
N
N
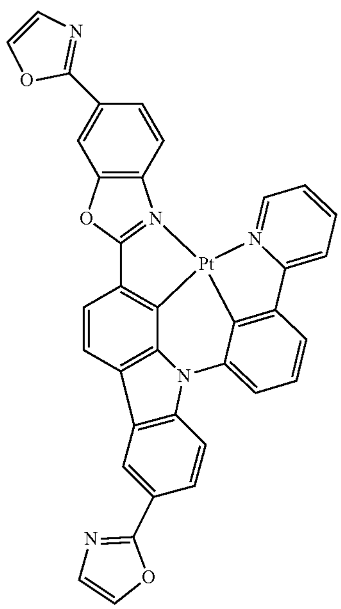
N
O
O
N
Pt
N
N
N
O
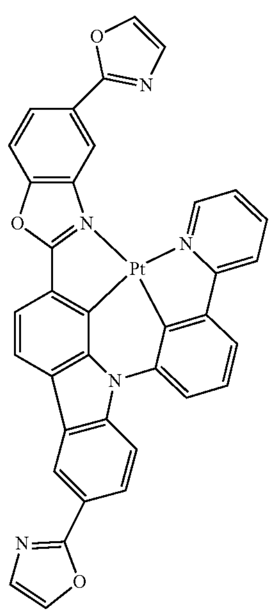
O
N
O
N
Pt
N
N
N
O
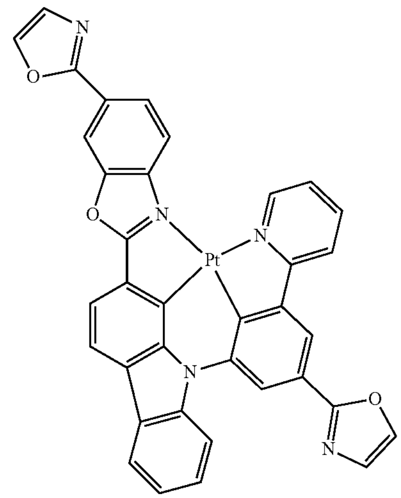
N
O
O
N
Pt
N
N
O
N
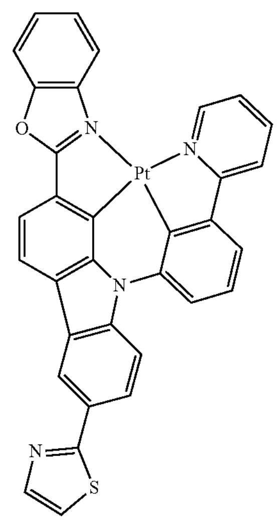
O
N
Pt
N
N
N
S
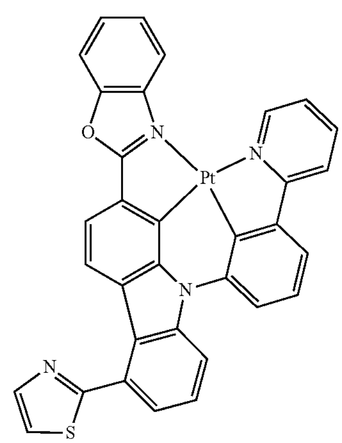
O
N
Pt
N
N
N
S -continued
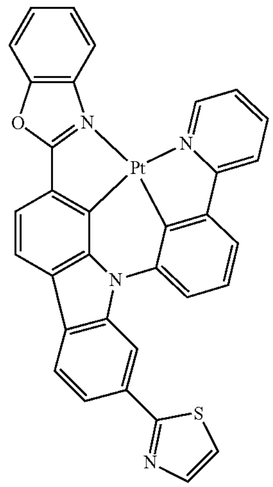
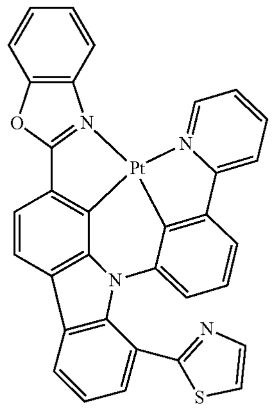
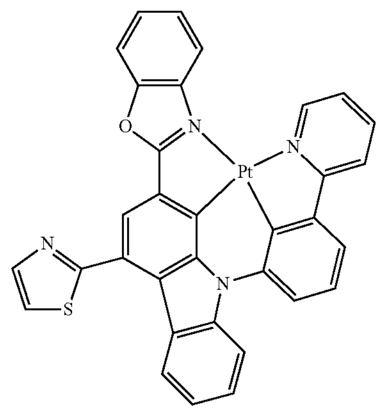
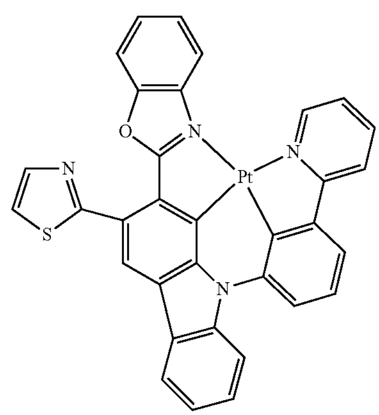
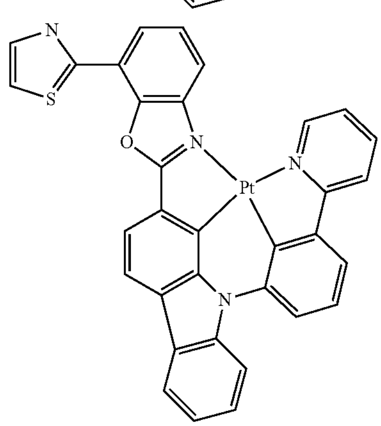
-continued
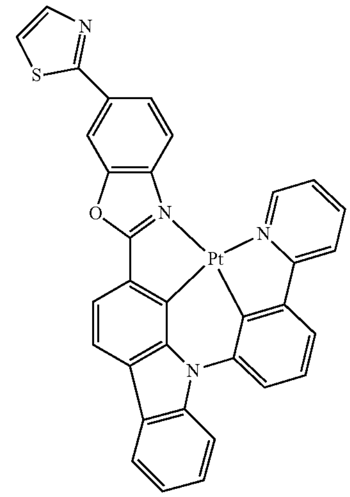
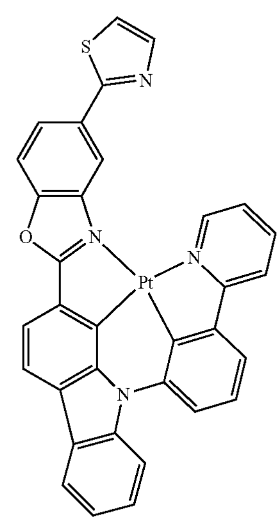
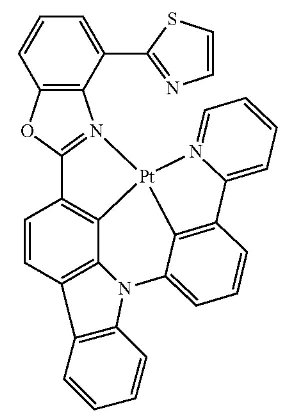
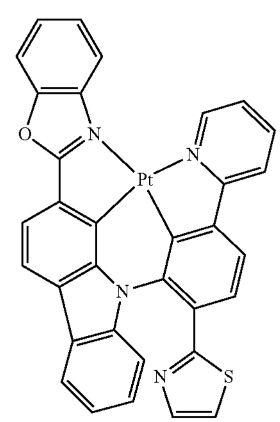

-continued
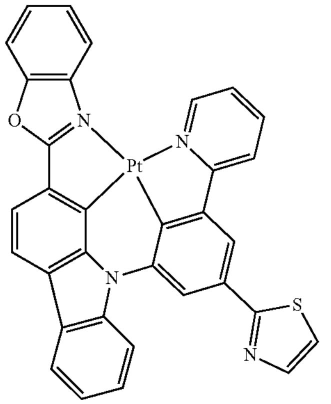
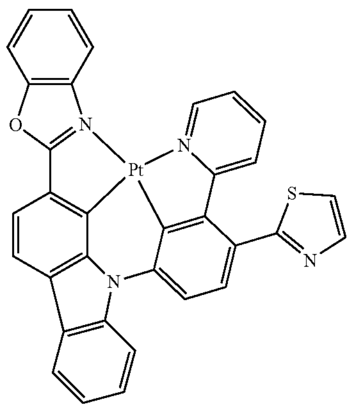
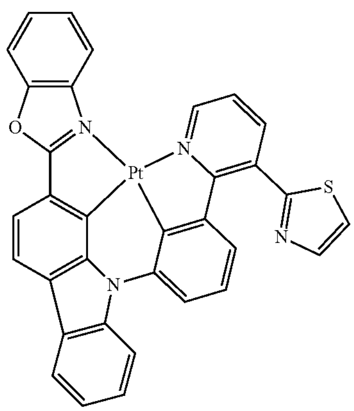
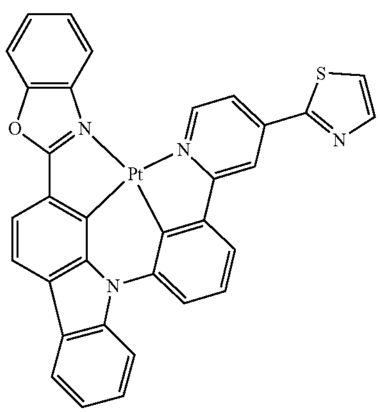
-continued
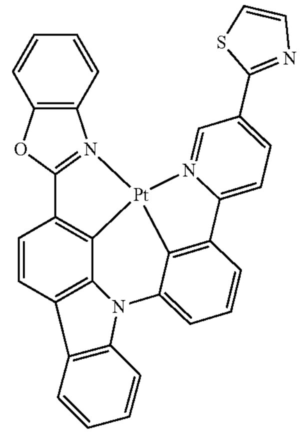
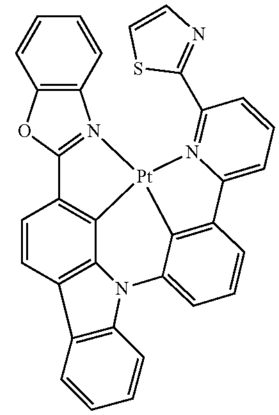
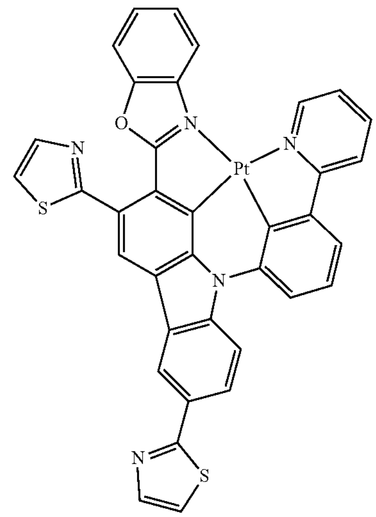
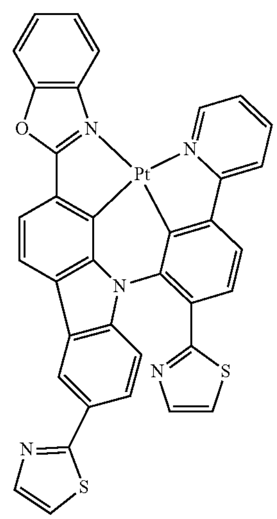

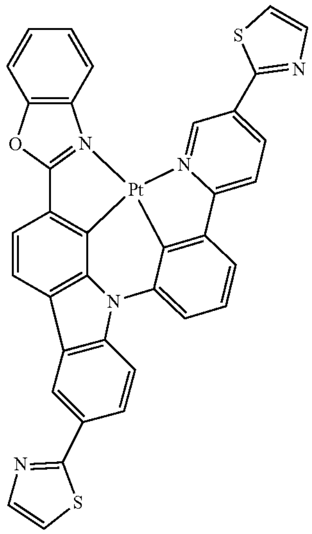
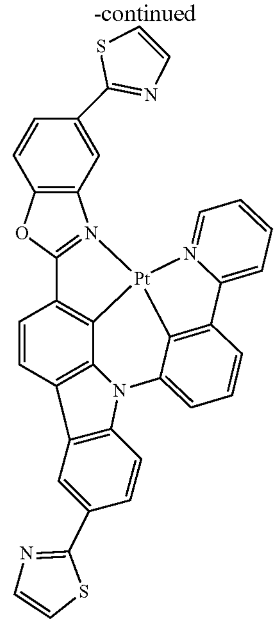
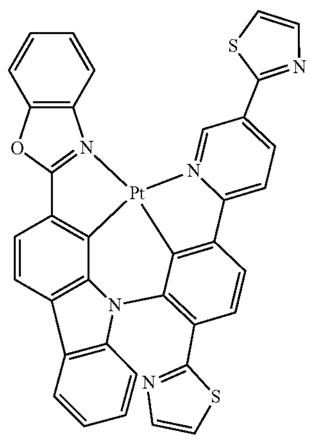
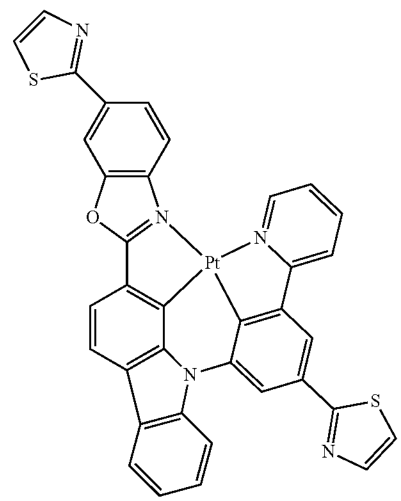
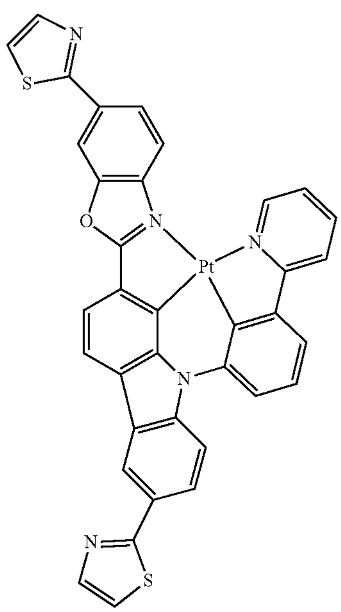
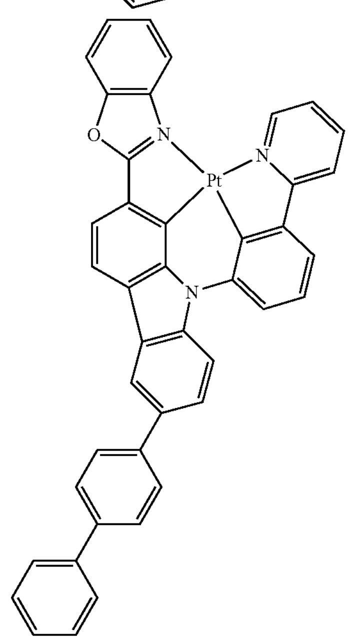

-continued
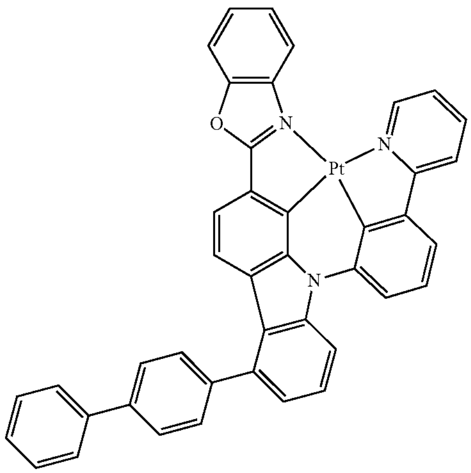
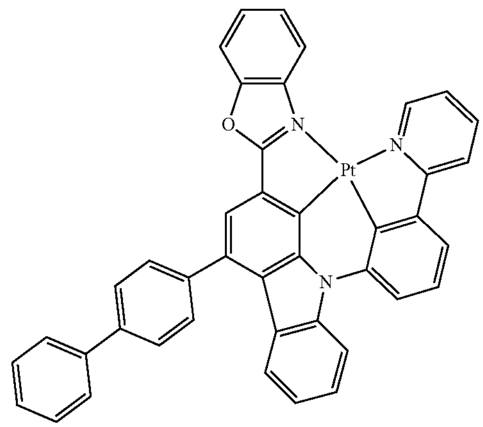
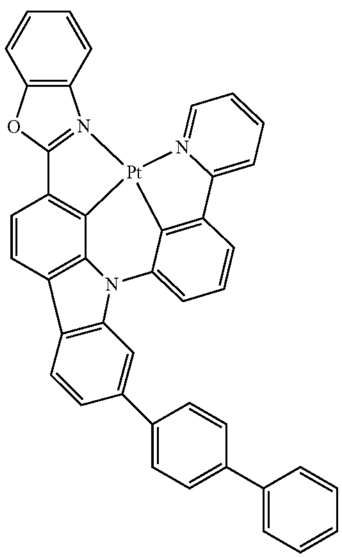
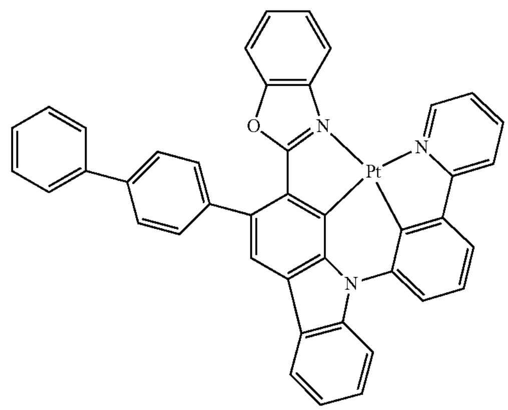
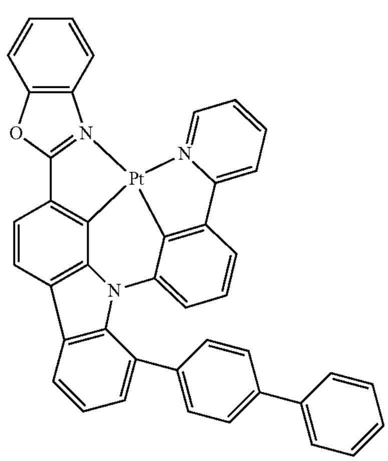
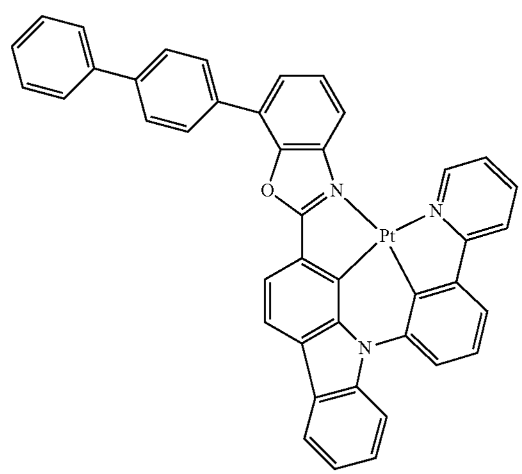
-continued -continued
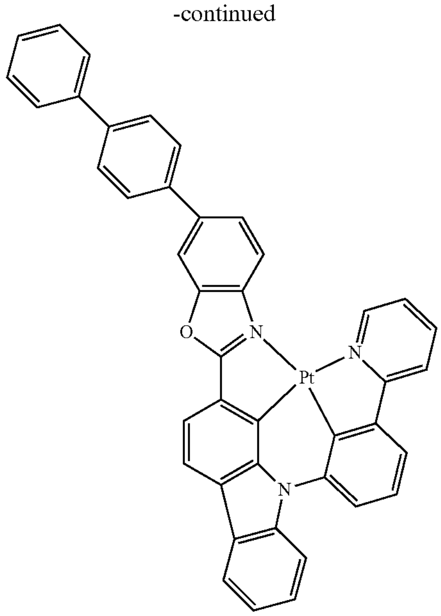
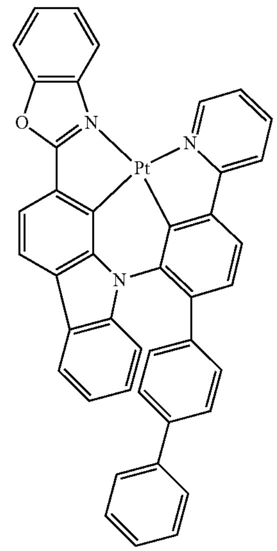
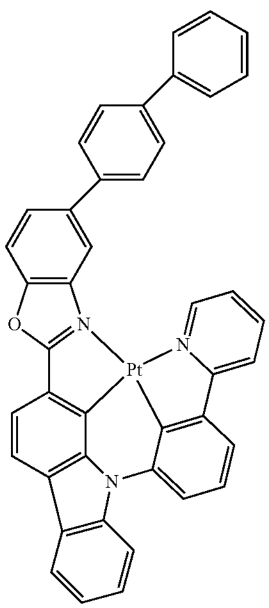
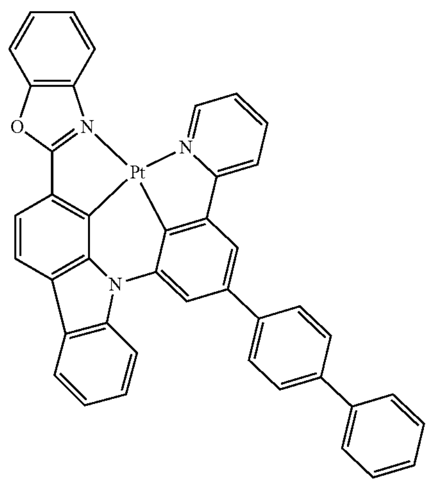
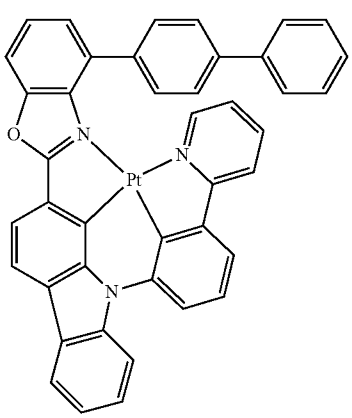
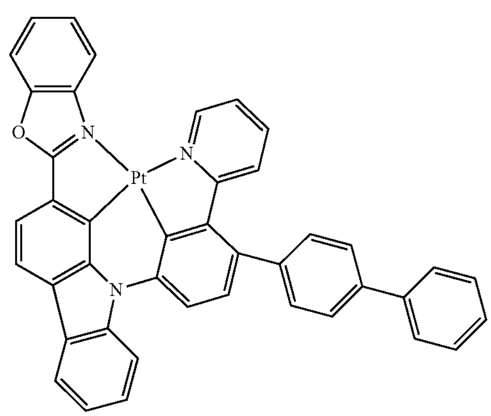
-continued

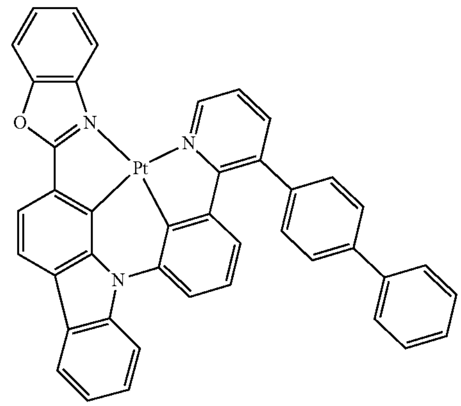
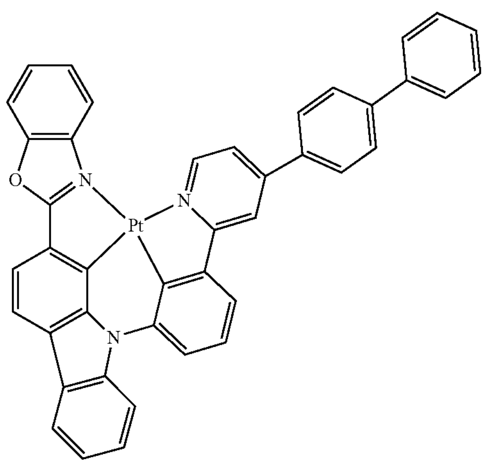
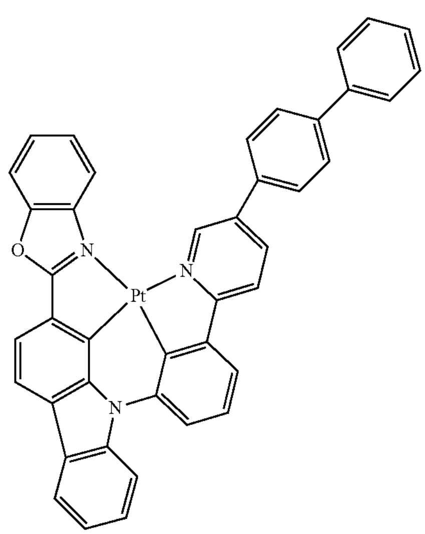
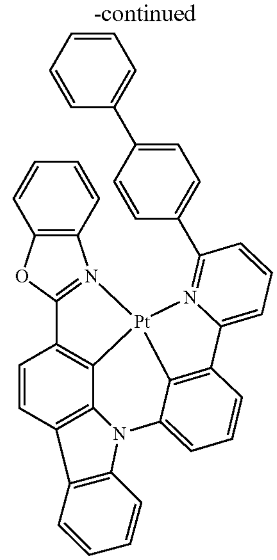
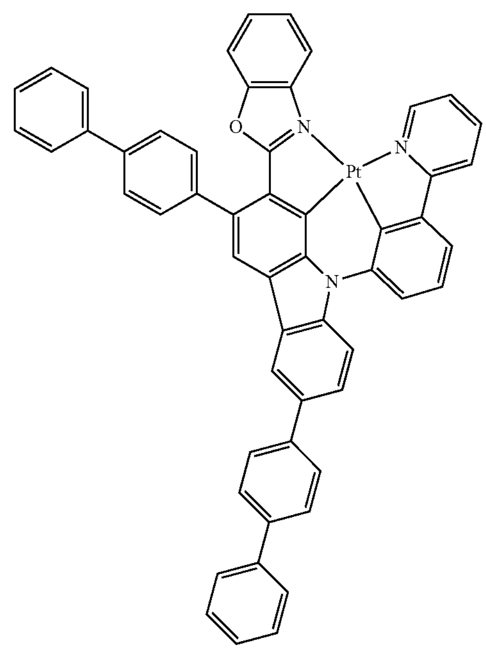

-continued
-continued
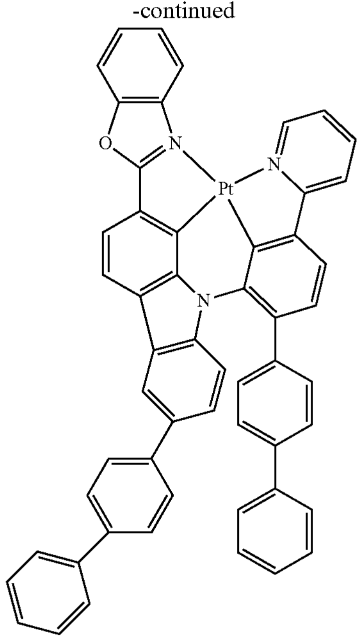
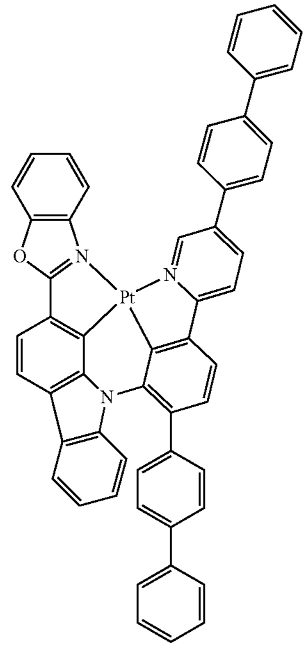
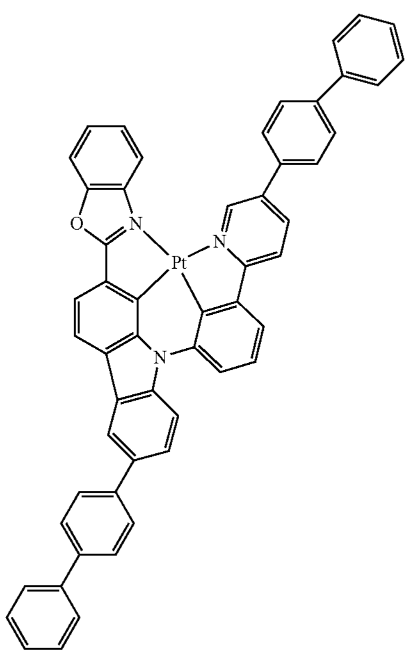
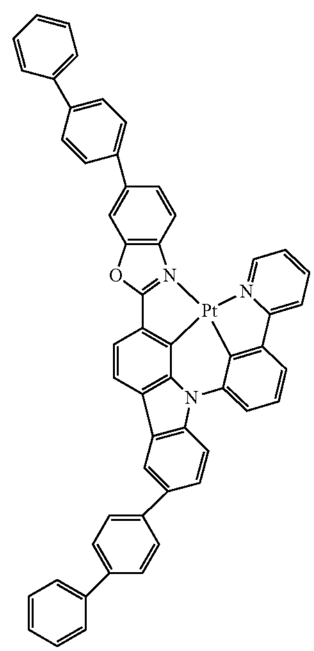

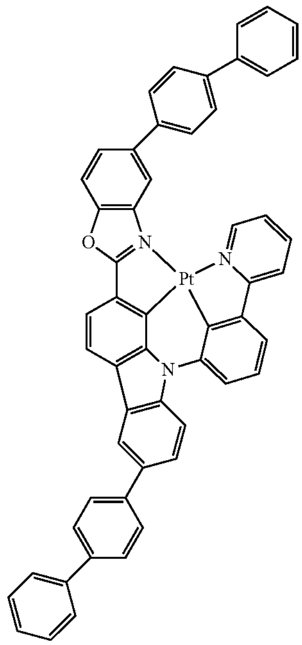
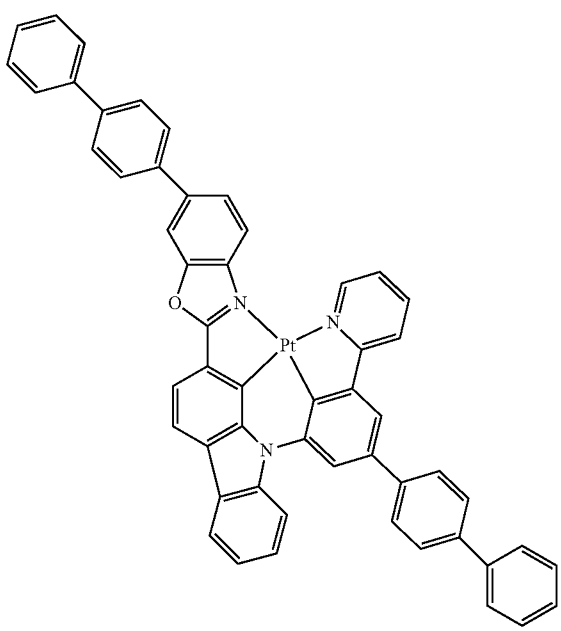
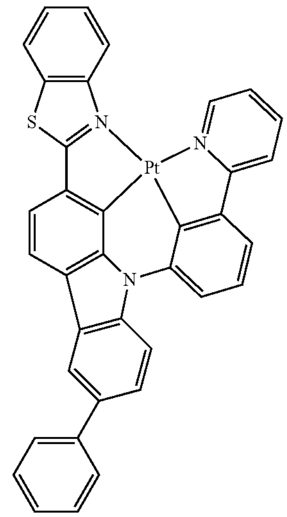
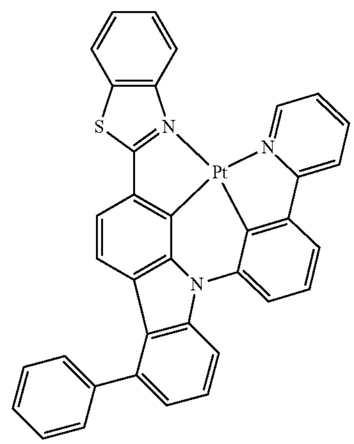
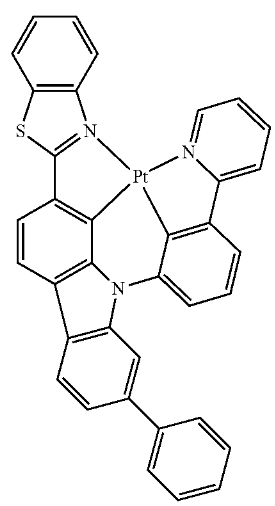
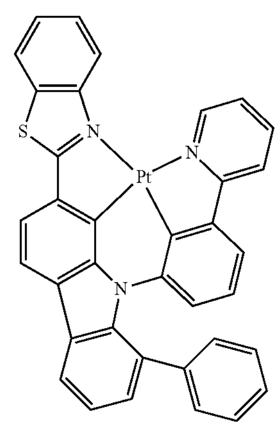

-continued
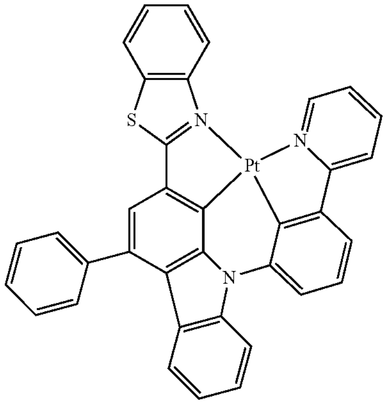
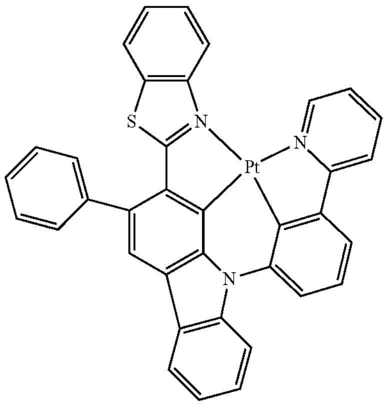
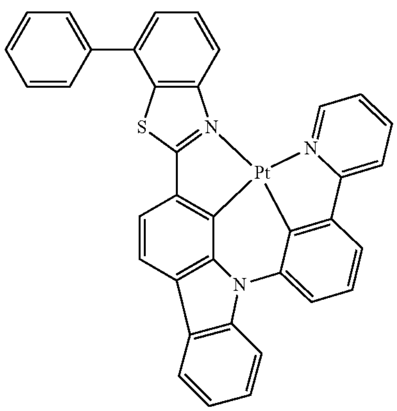
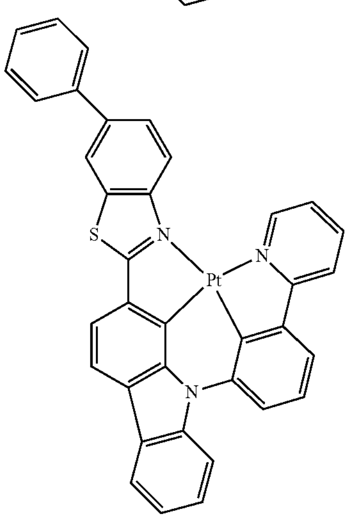
-continued
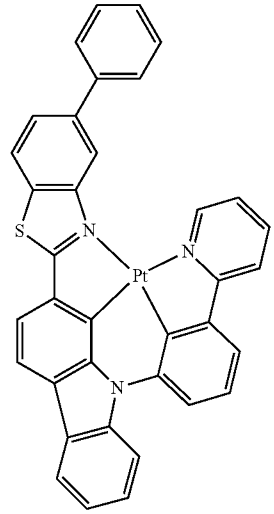
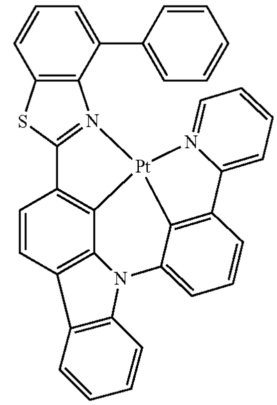
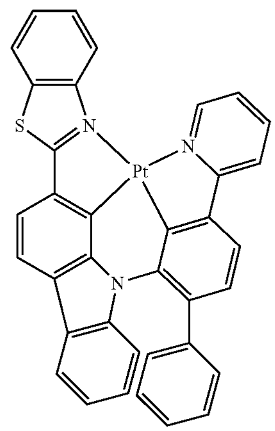
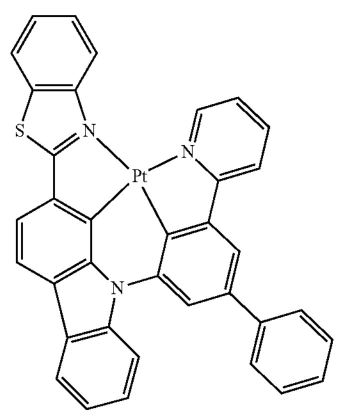

-continued
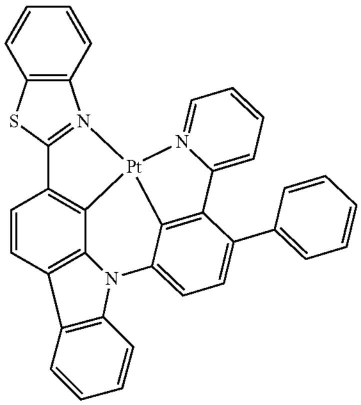
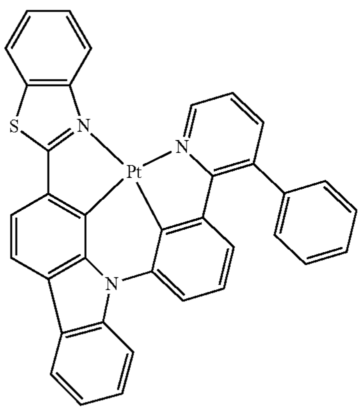
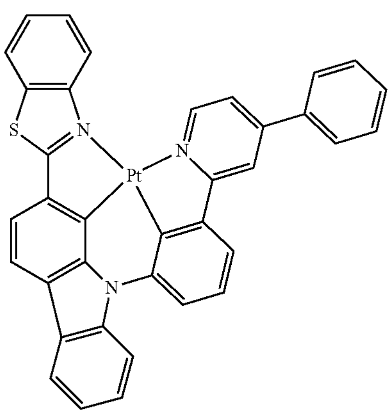
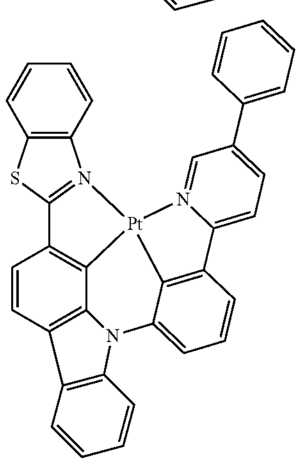
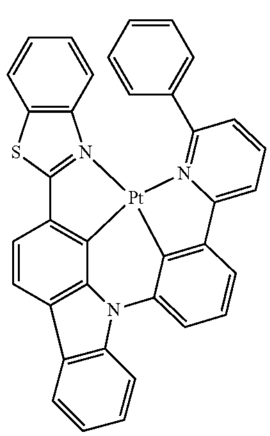
-continued
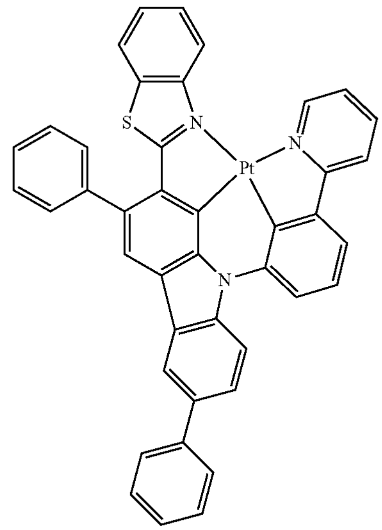
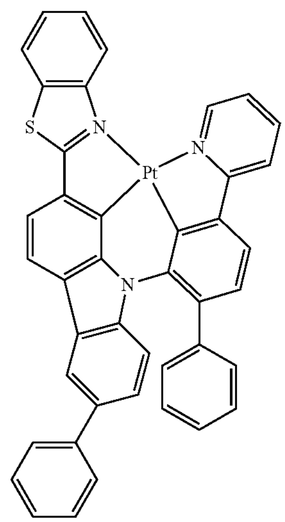
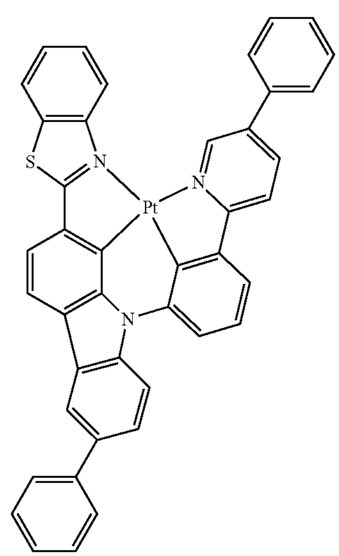

-continued
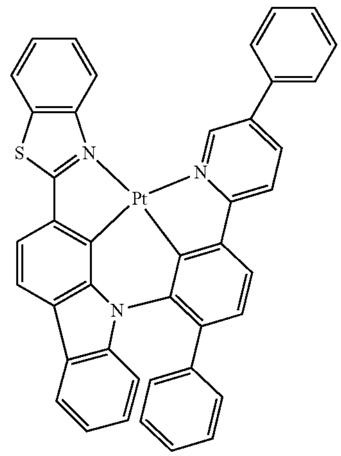
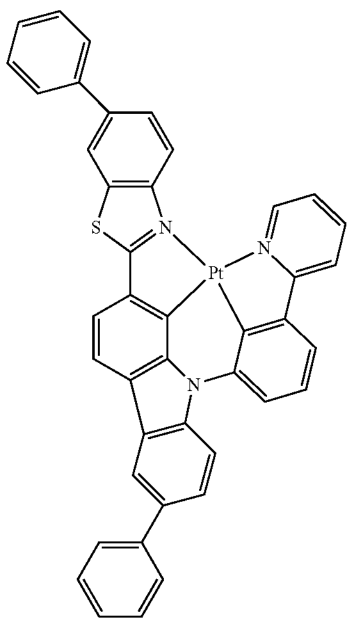
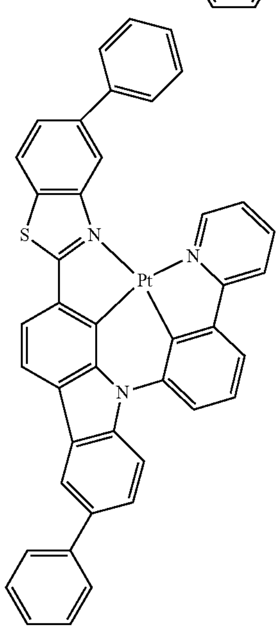
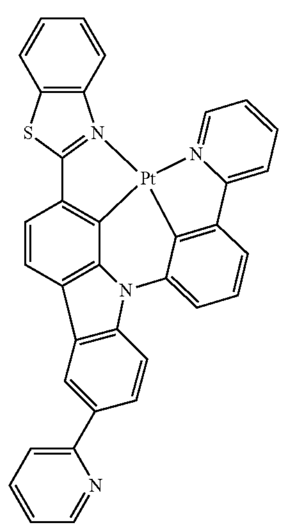
-continued
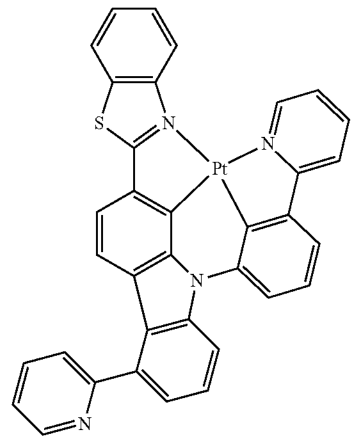
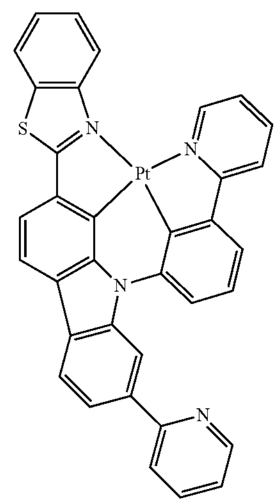
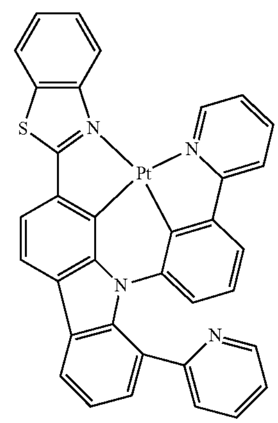
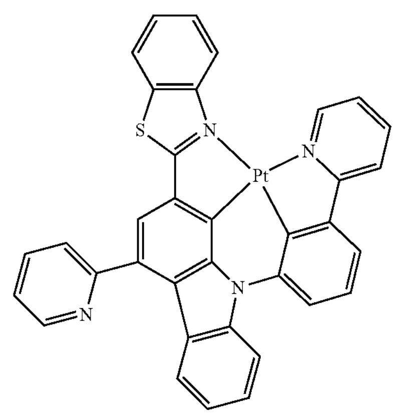

-continued
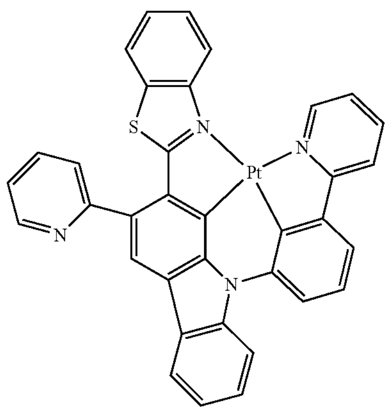
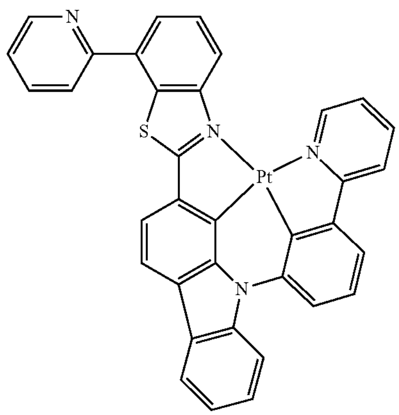
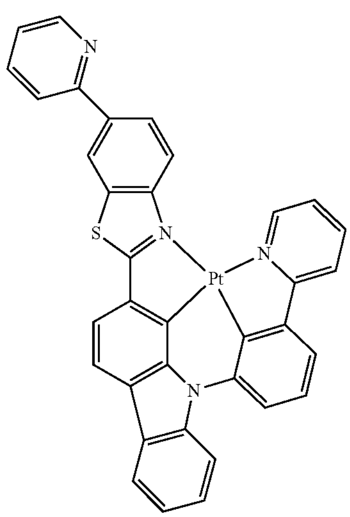
-continued
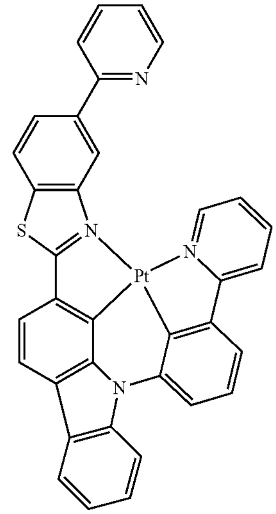
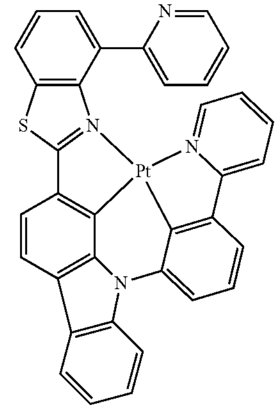
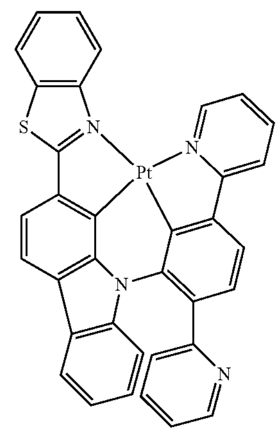
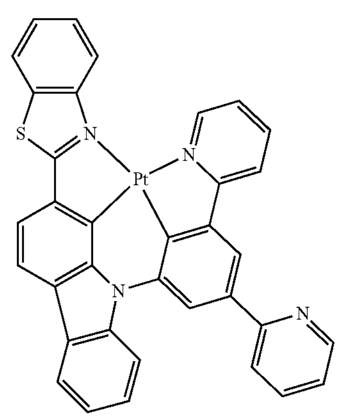

-continued
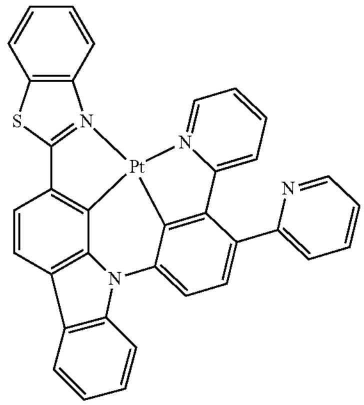
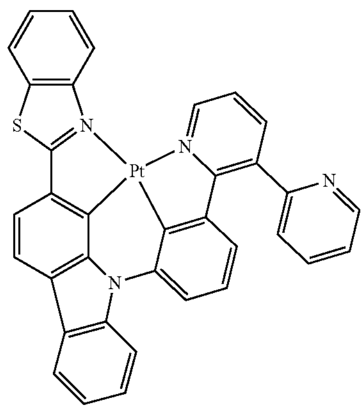
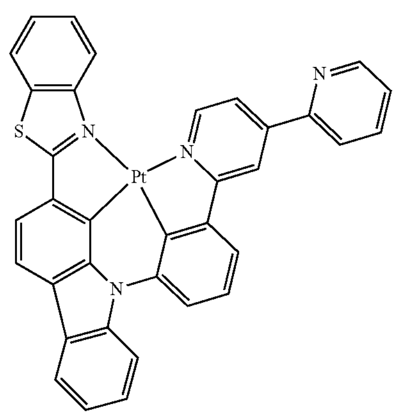
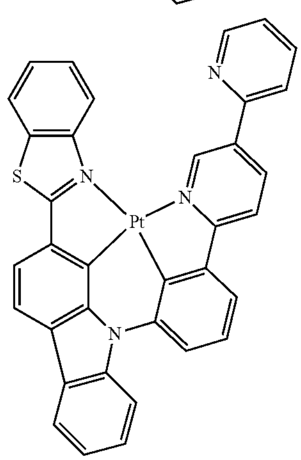
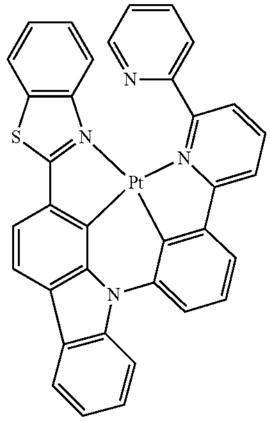
-continued
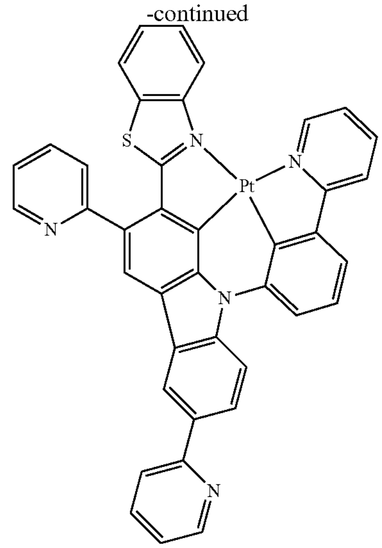
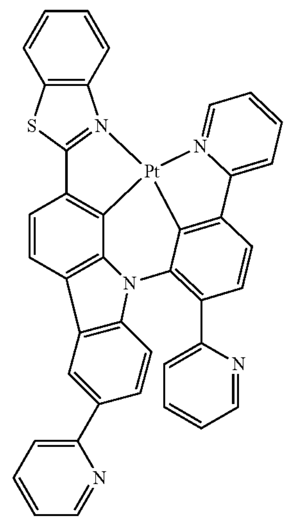
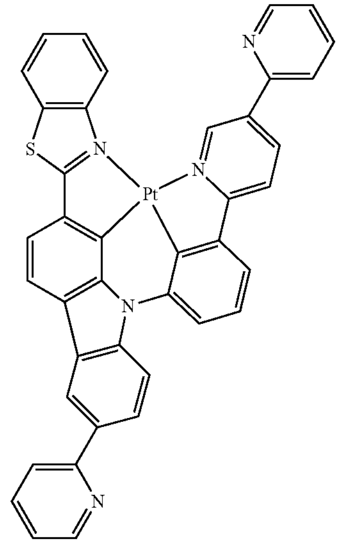

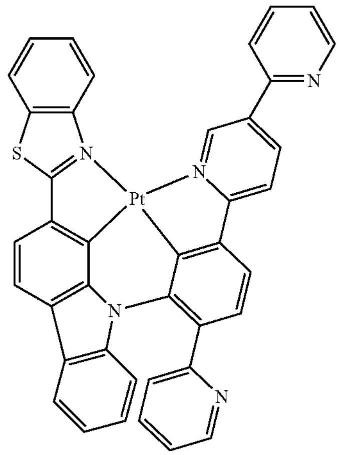
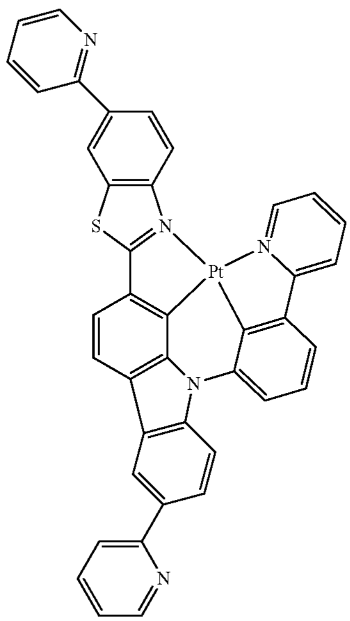
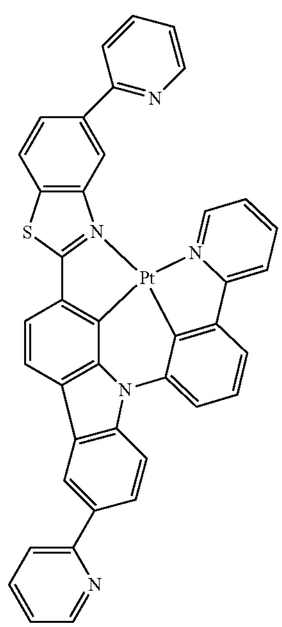
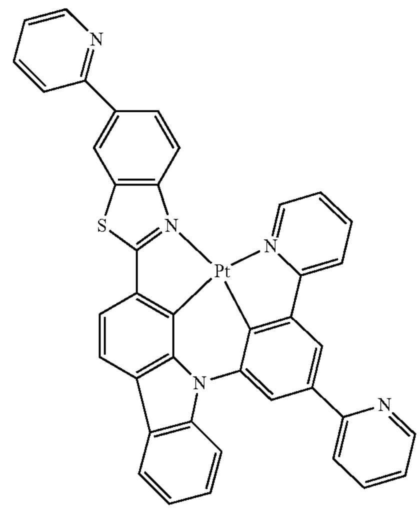
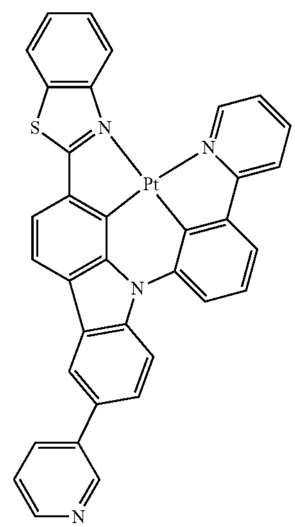
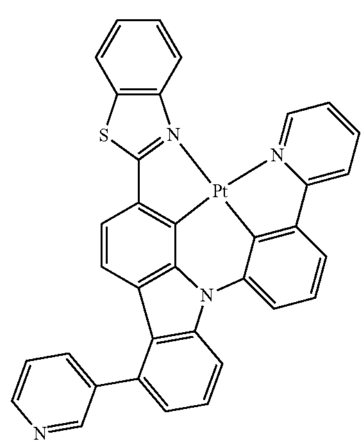

-continued
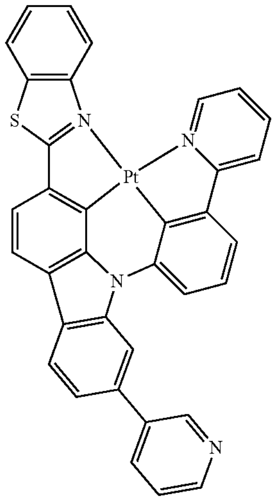
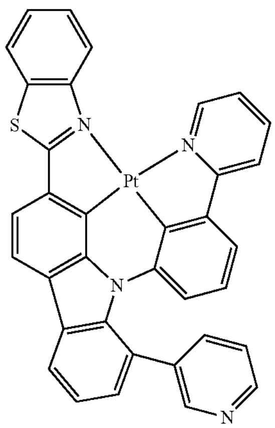
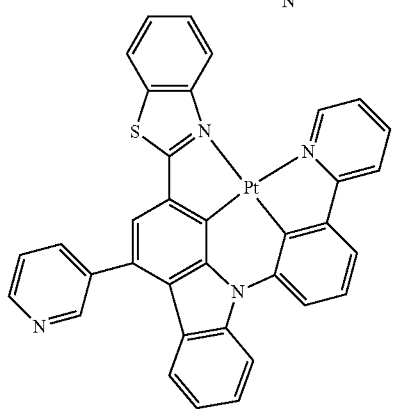
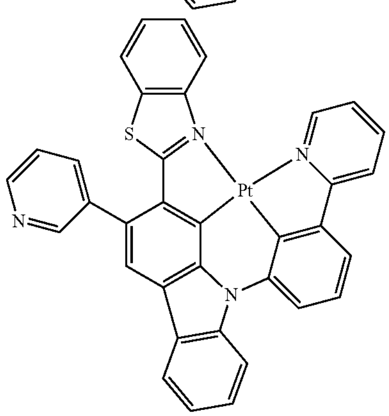
-continued
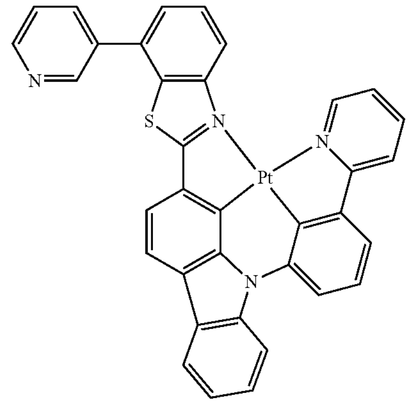
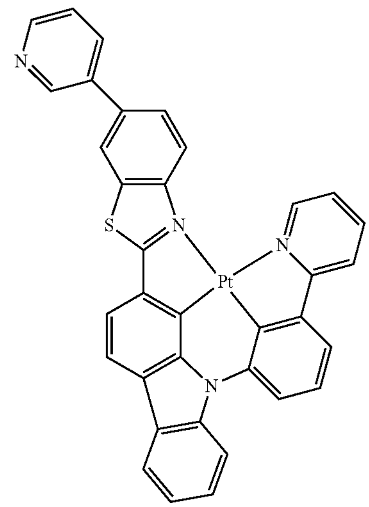
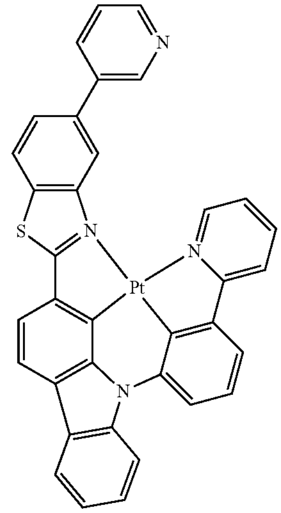

-continued
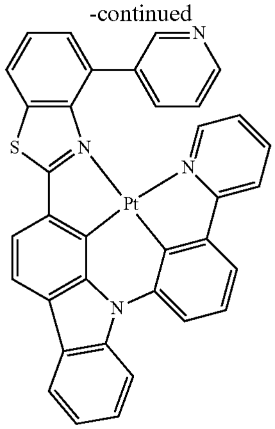
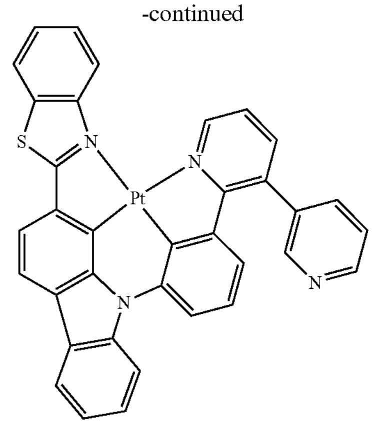
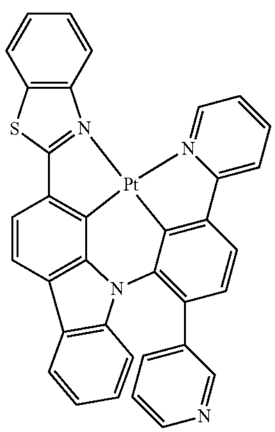
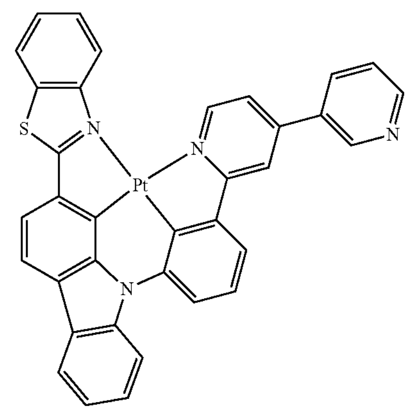
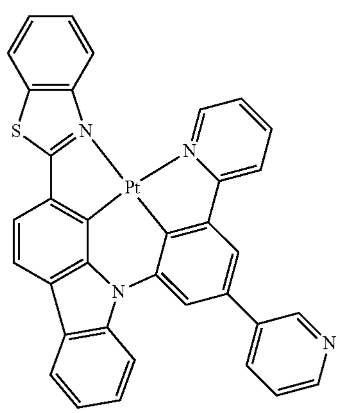
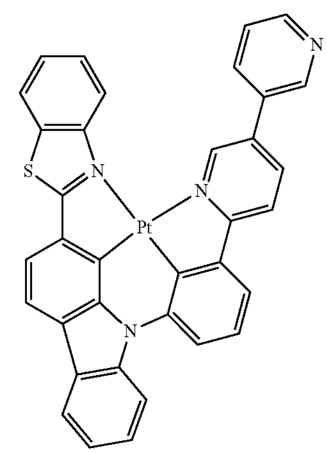
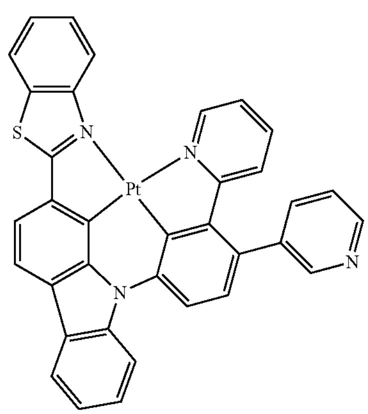
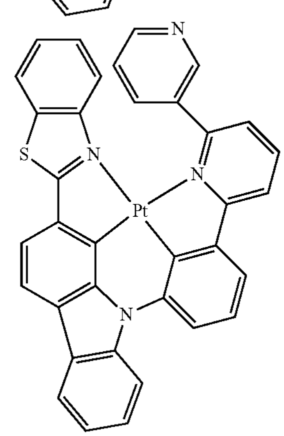
-continued -continued
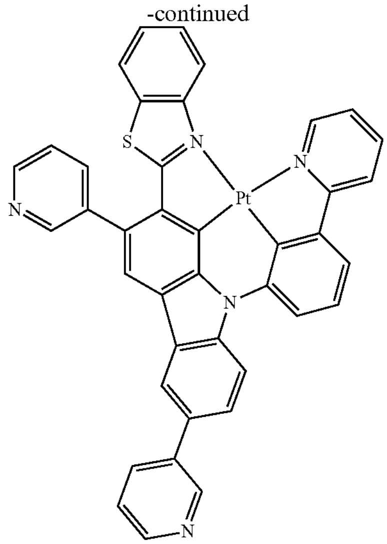
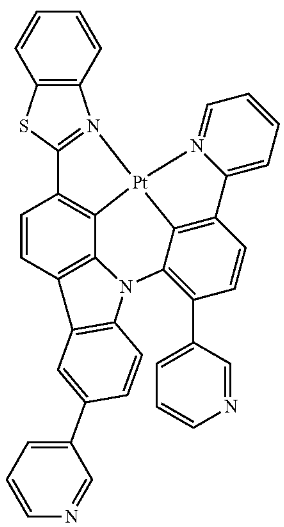
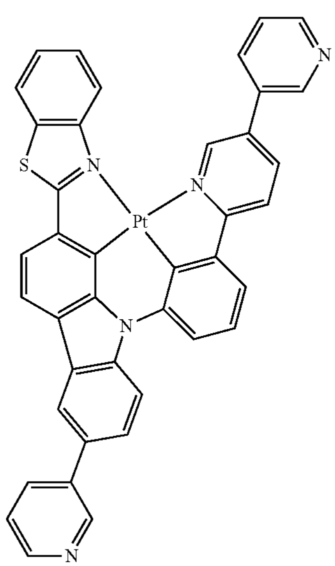
-continued
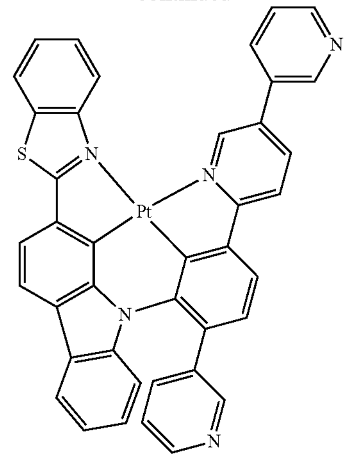
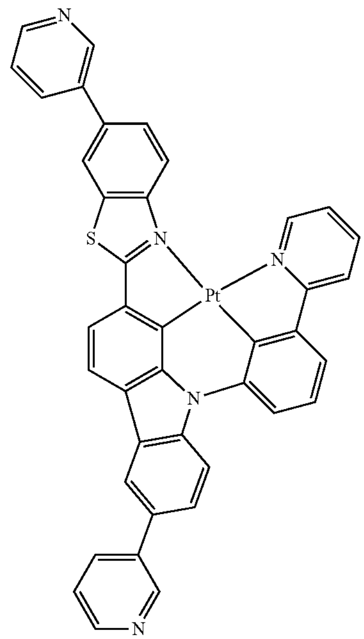
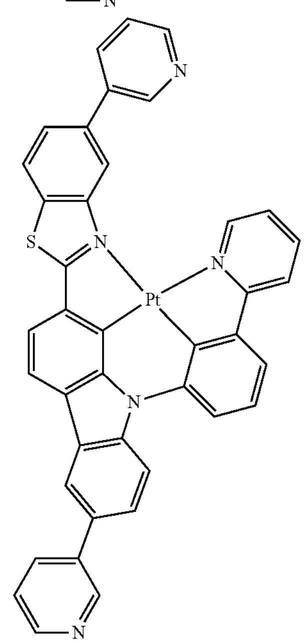

-continued
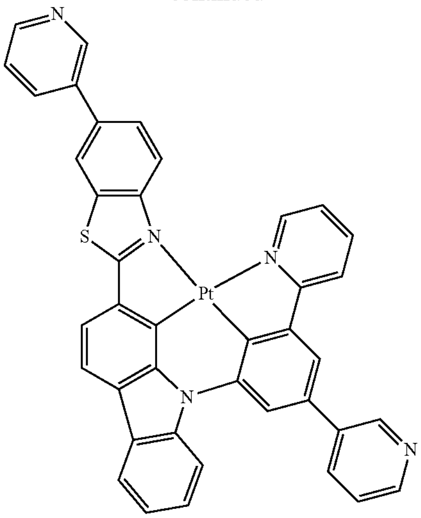
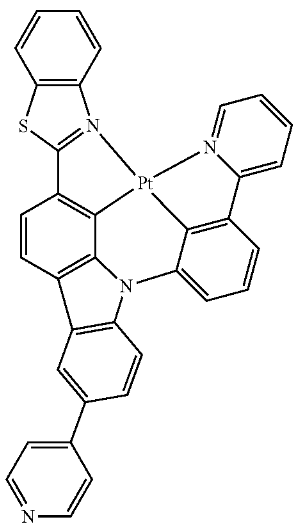
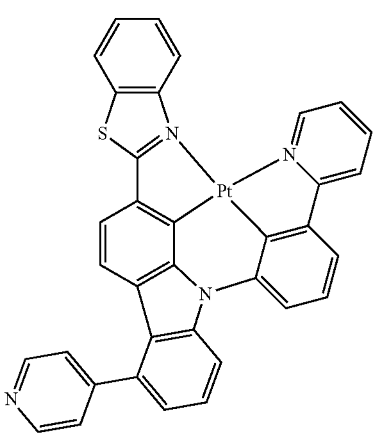
-continued
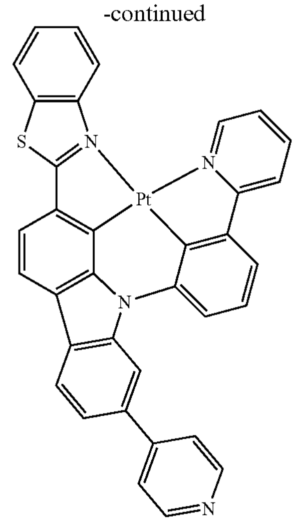
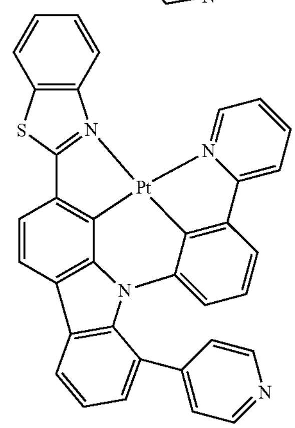
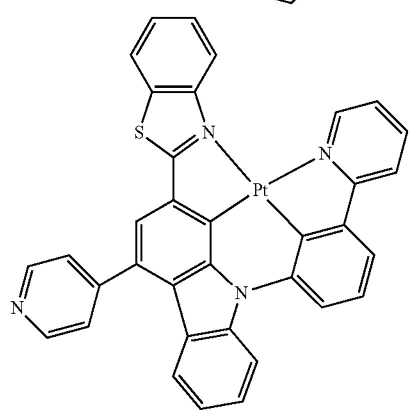
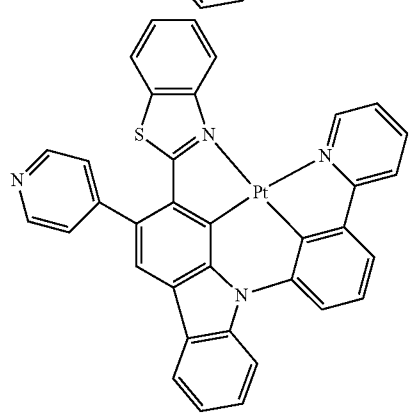

-continued
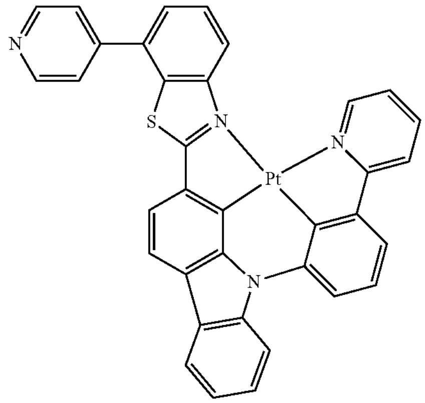
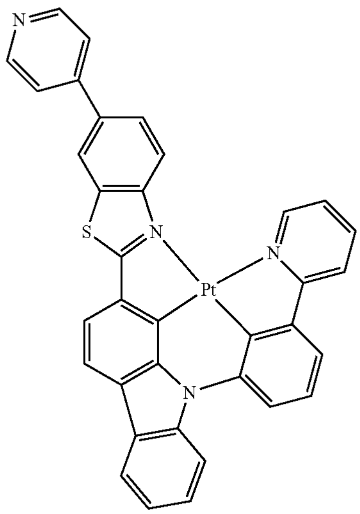
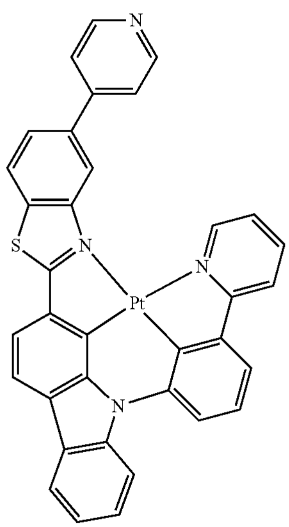
-continued
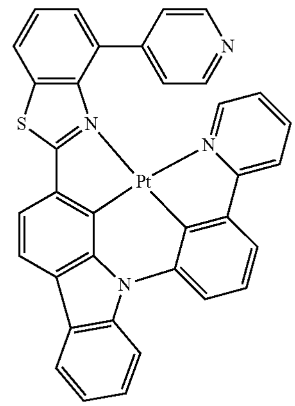
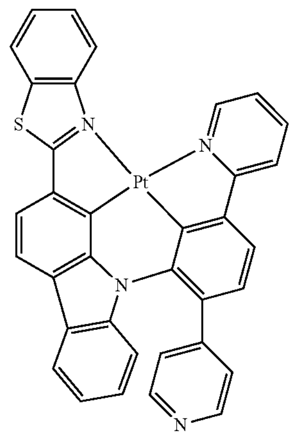
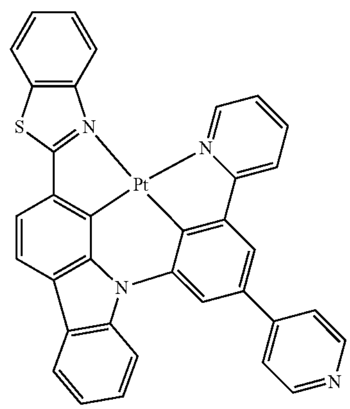
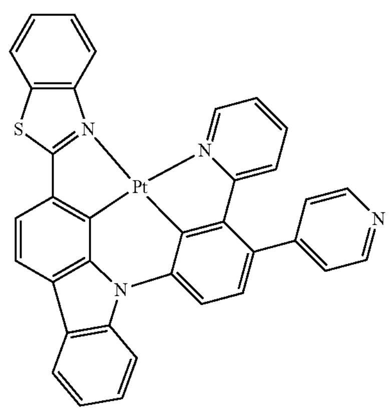

-continued
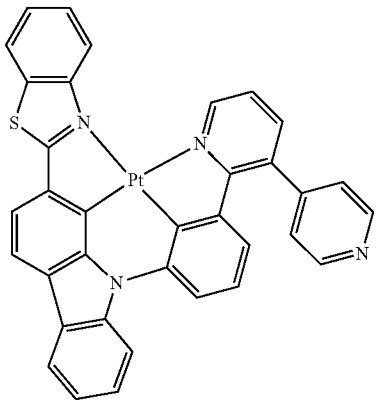
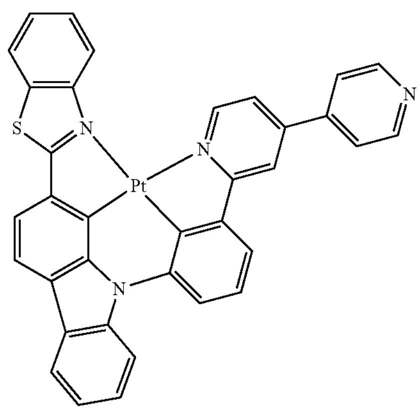
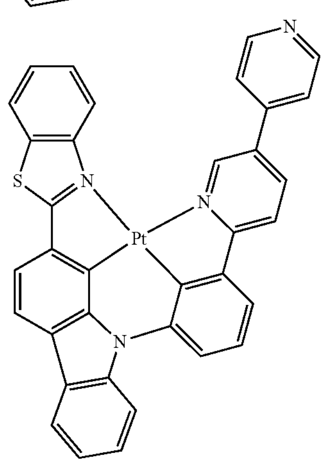
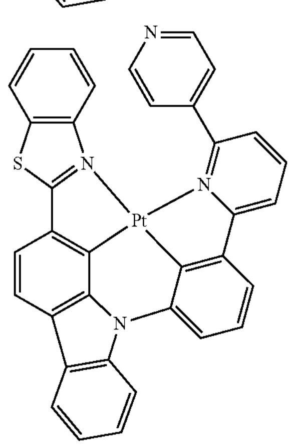
-continued
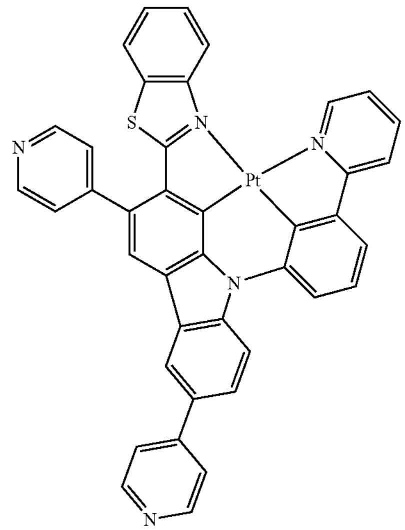
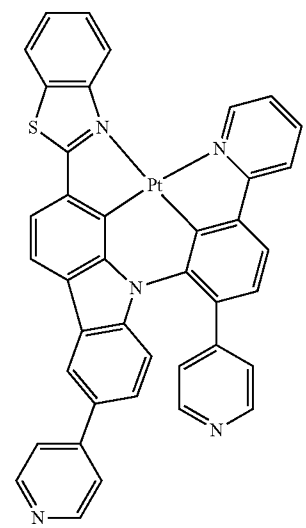
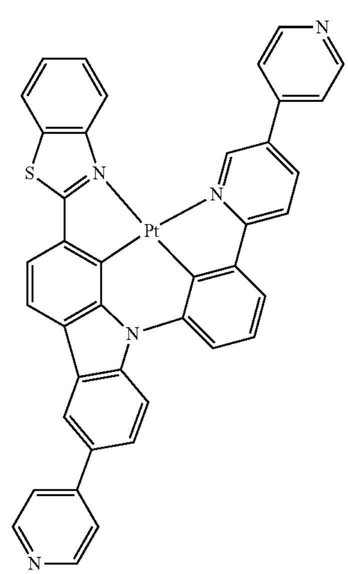

-continued
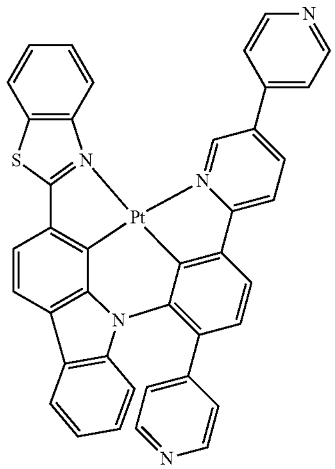
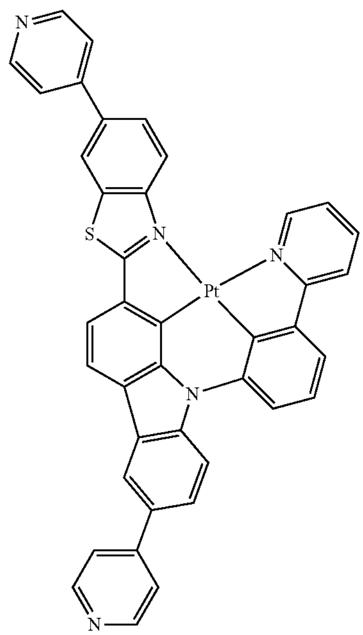
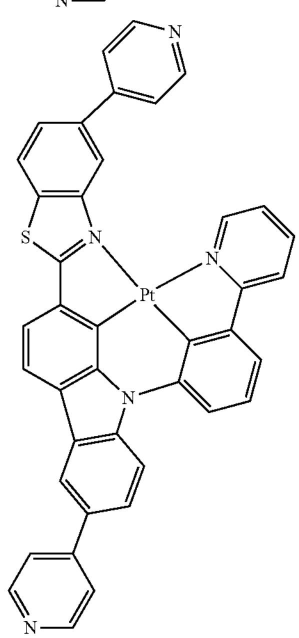
-continued
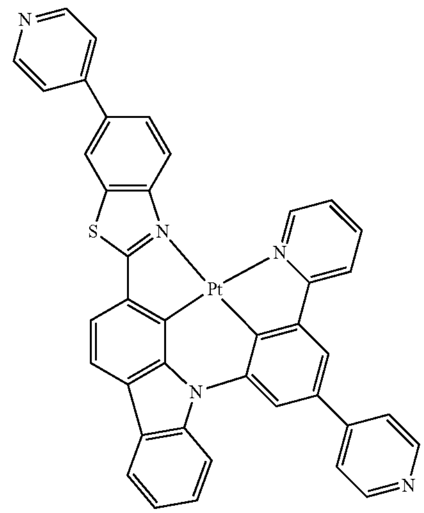
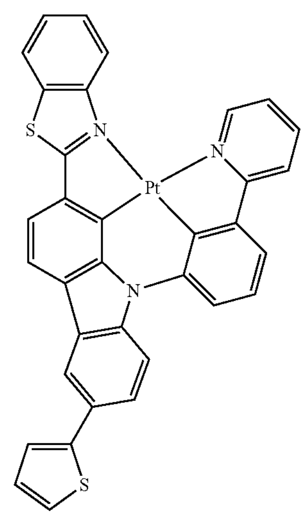
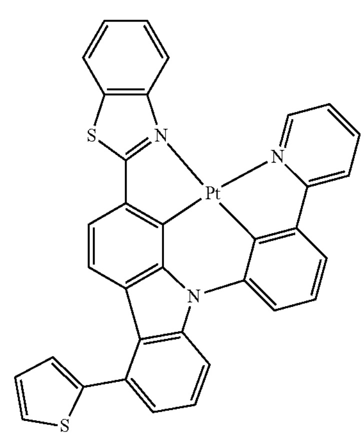

-continued
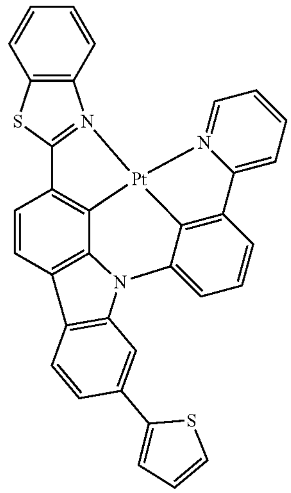
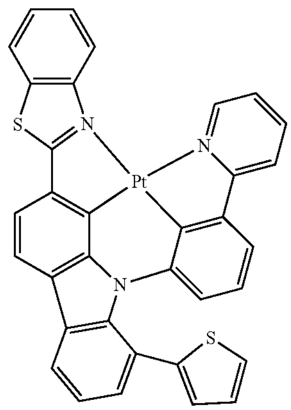
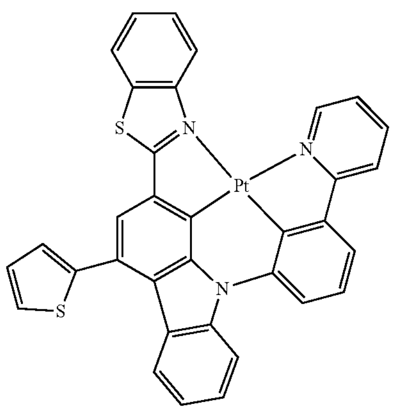
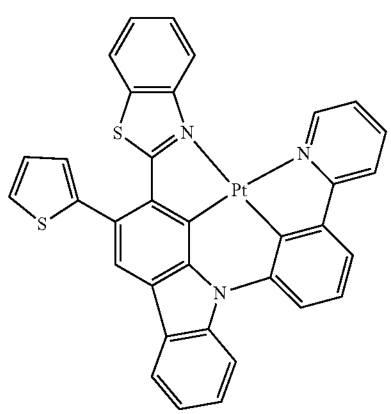
-continued
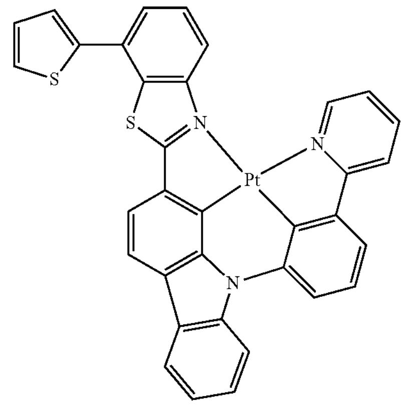
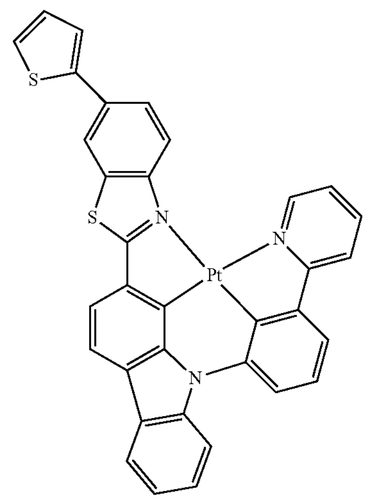
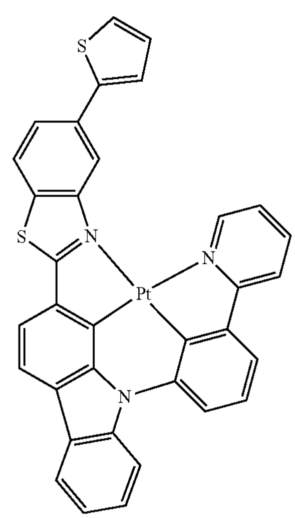

-continued
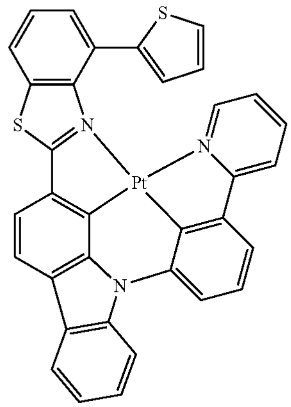
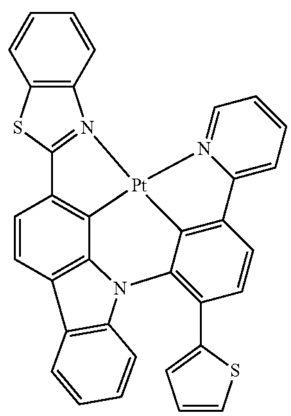
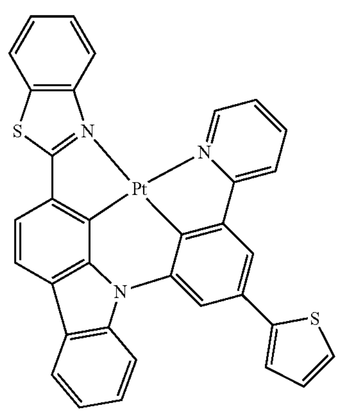
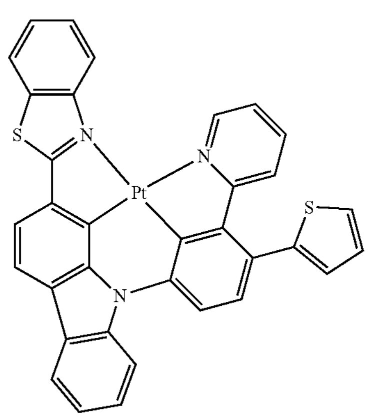
-continued
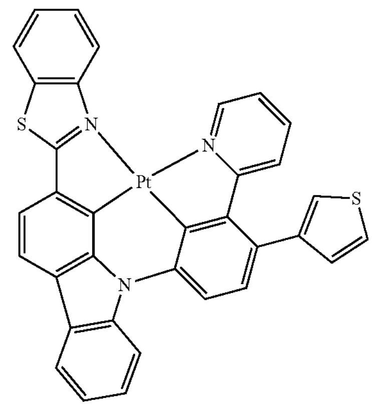
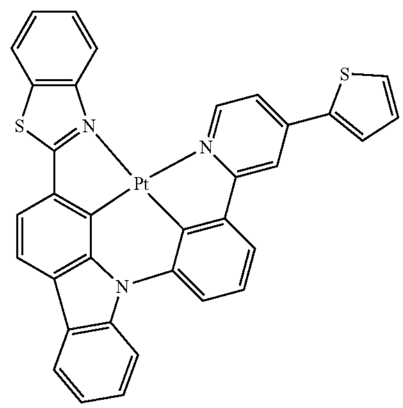
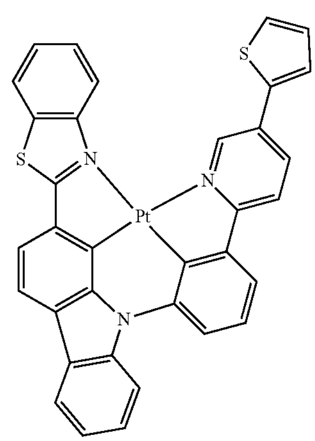
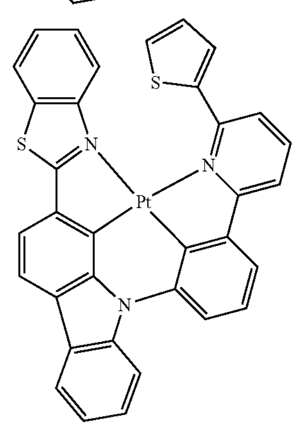

-continued
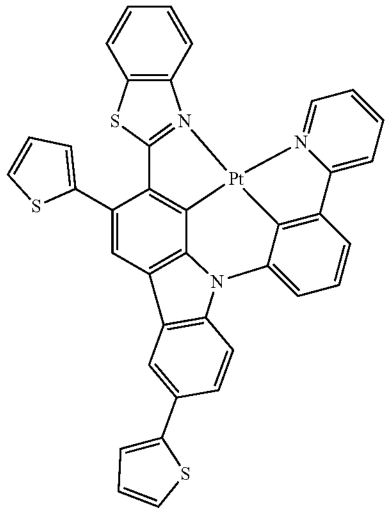
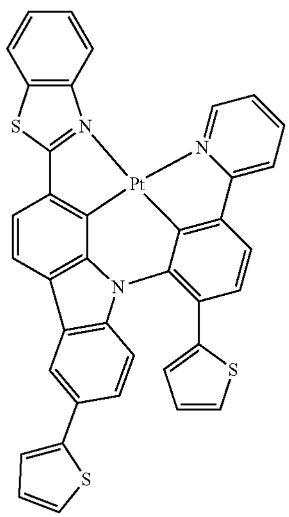
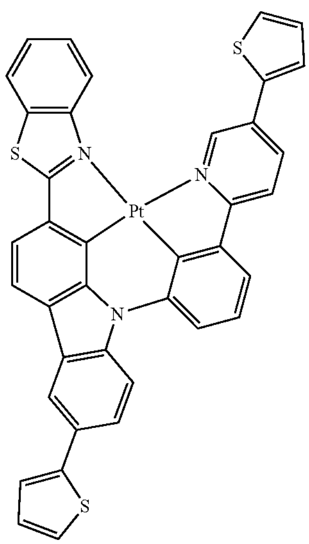
-continued
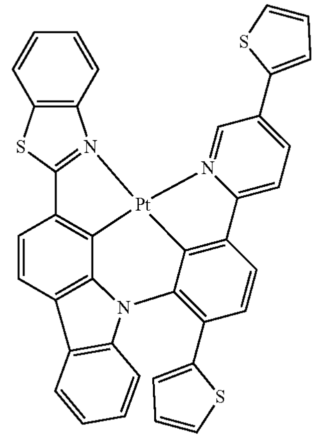
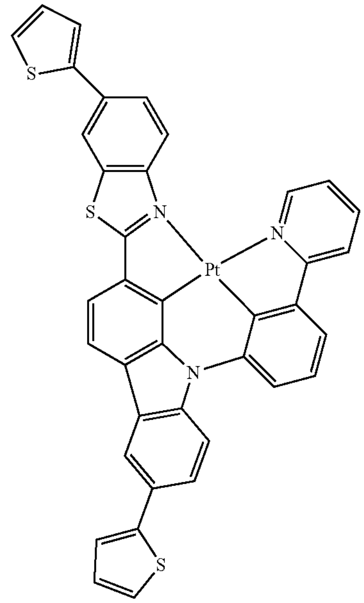
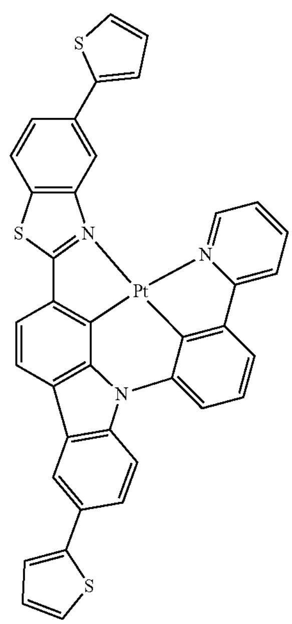

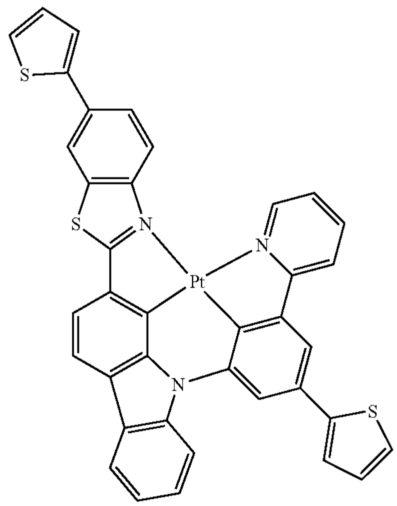
S
S
N
N
Pt
N
S
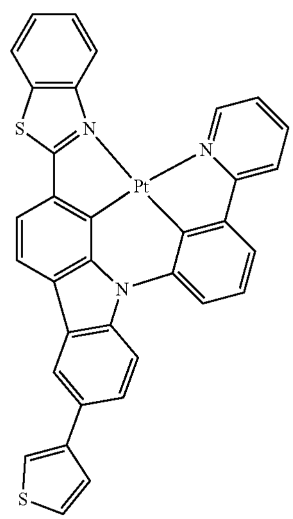
S
N
N
Pt
N
S
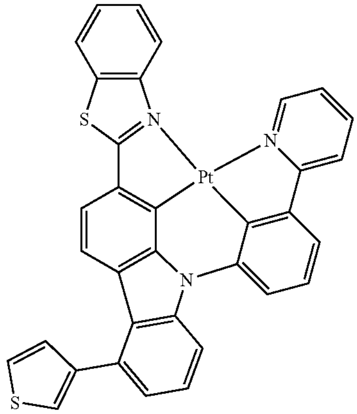
S
N
N
Pt
N
S
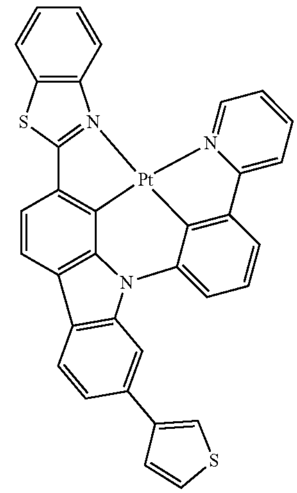
S
N
N
Pt
N
S
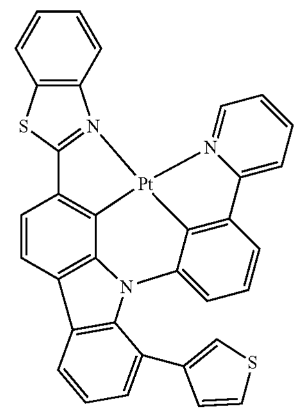
S
N
N
Pt
N
S
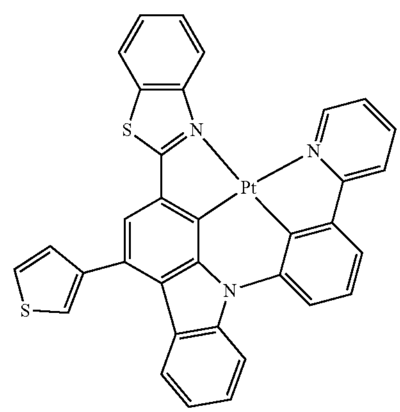
S
N
N
Pt
S
N
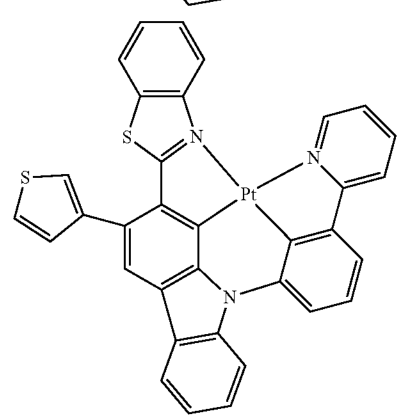
S
N
S
N
Pt
N

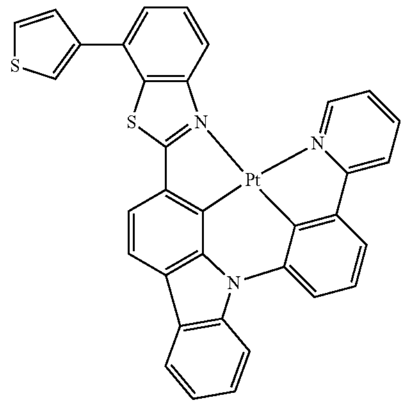
S
S
N
Pt
N
N
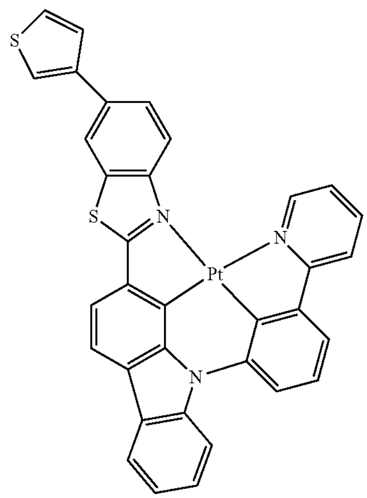
S
S
N
Pt
N
N
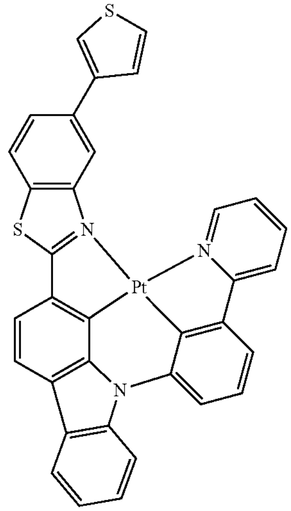
S
S
N
Pt
N
N
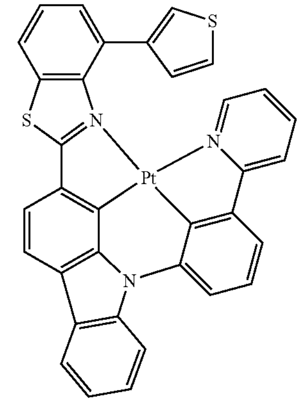
S
S
N
Pt
N
N
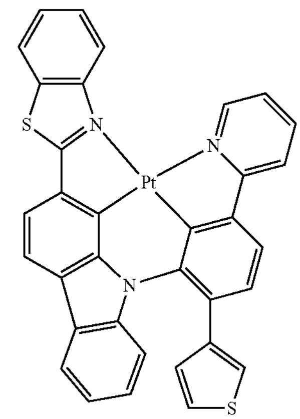
S
N
Pt
N
N
S
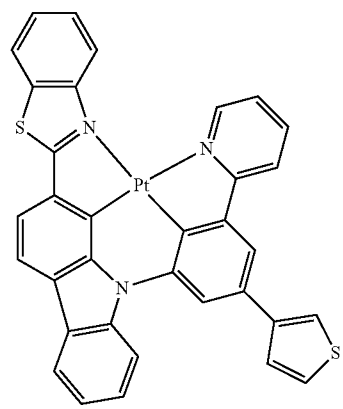
S
N
Pt
N
N
S
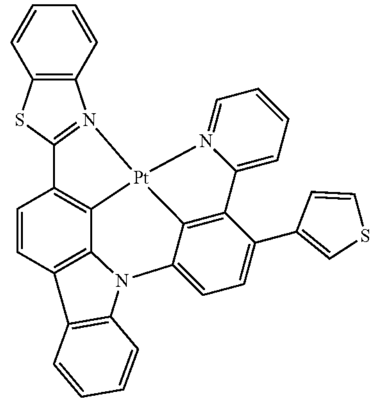
S
N
Pt
N
S
N -continued
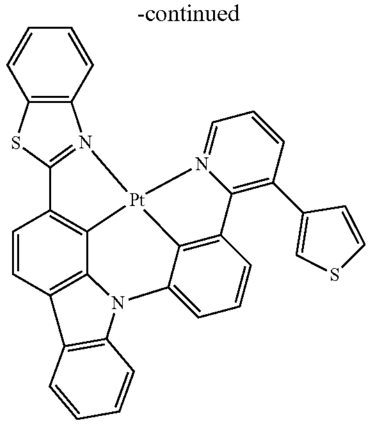
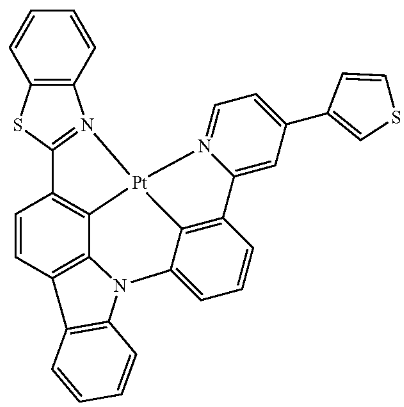
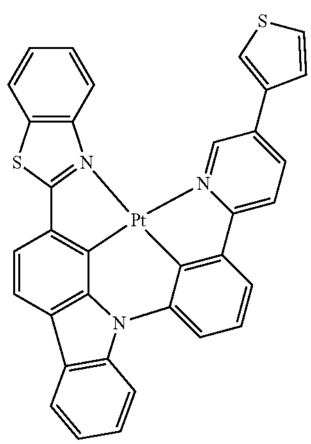
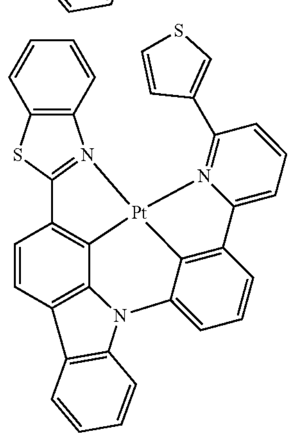
-continued
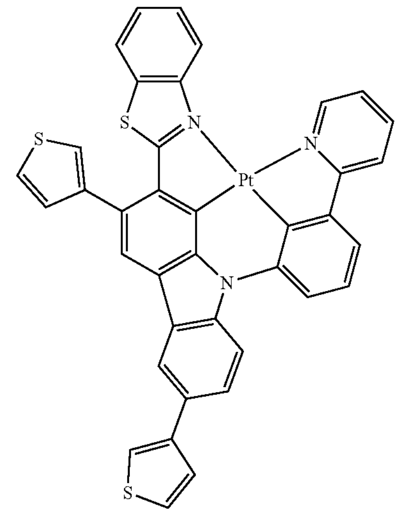
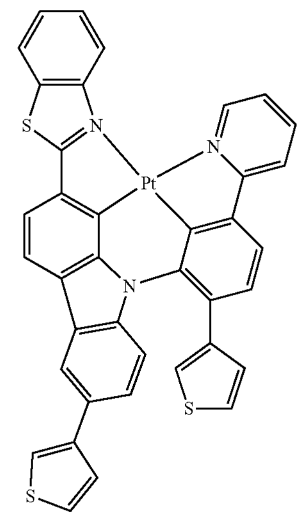
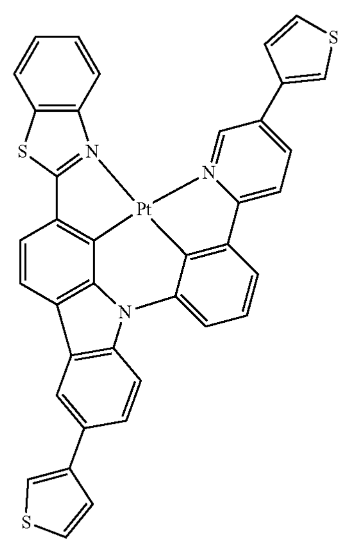

-continued
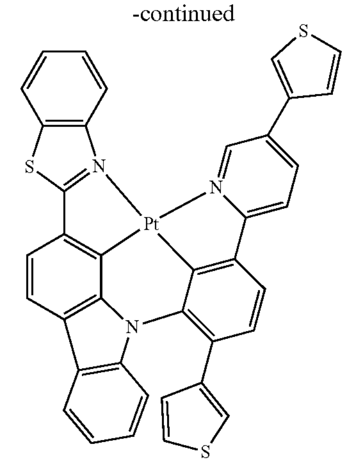
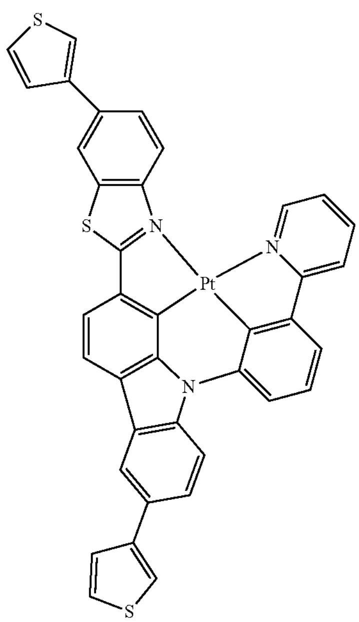
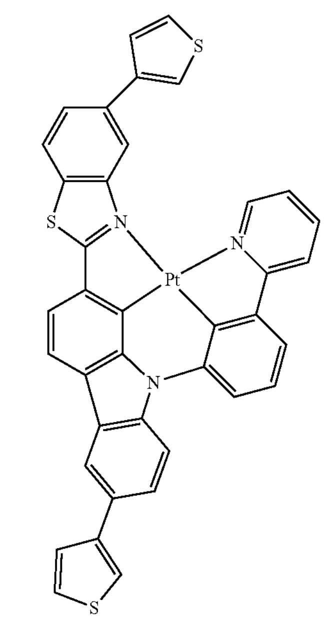
-continued
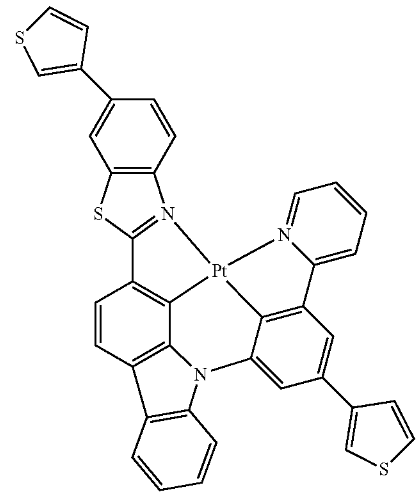
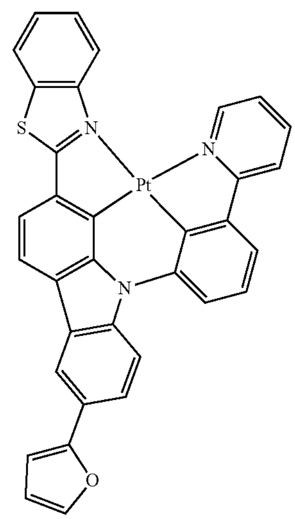
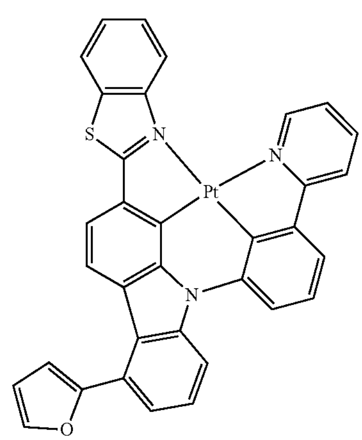

-continued
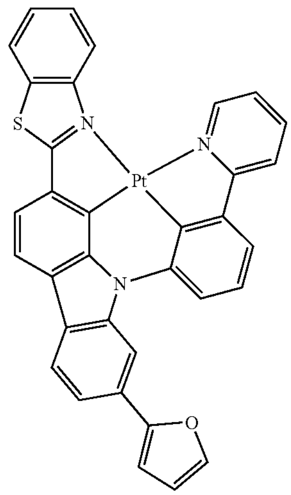
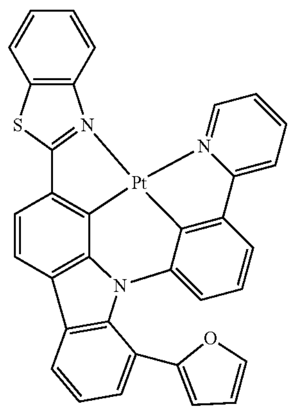
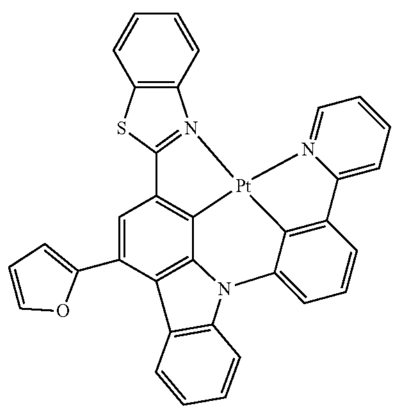
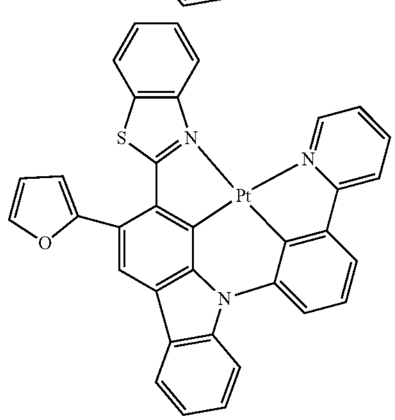
-continued
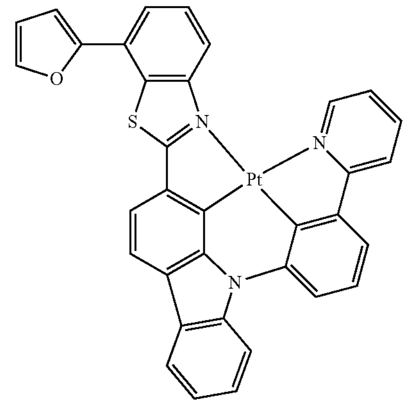
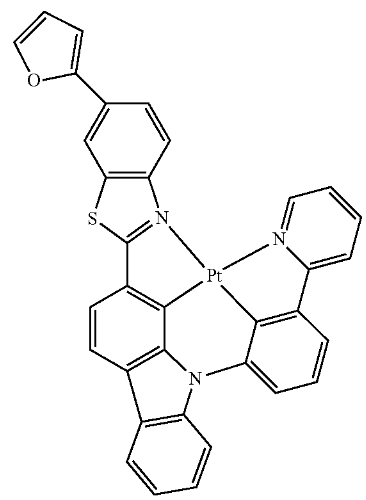
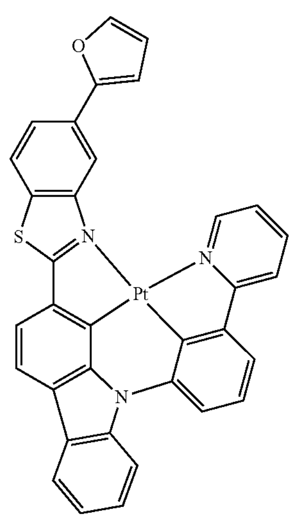

-continued
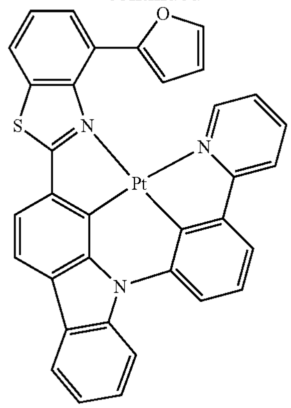
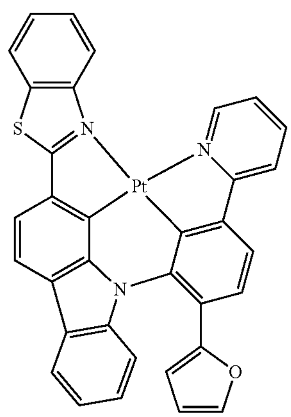
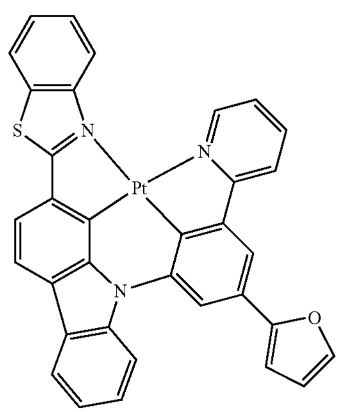
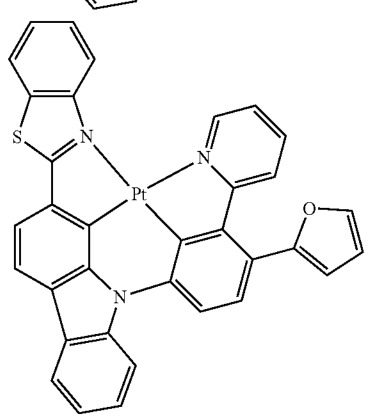
-continued
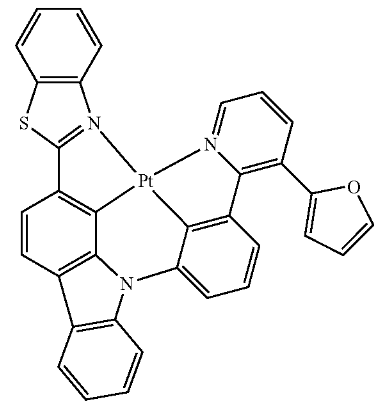
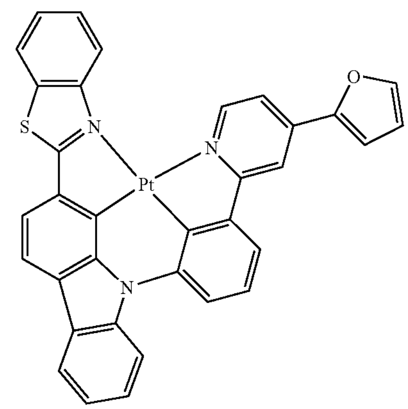
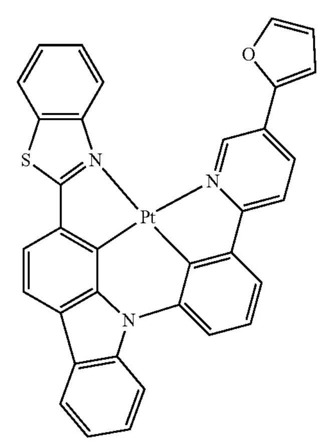
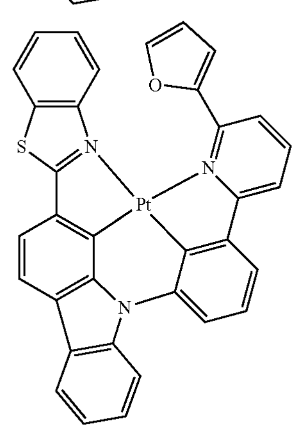

-continued
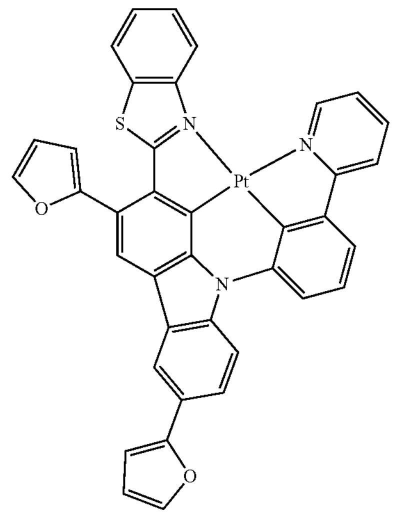
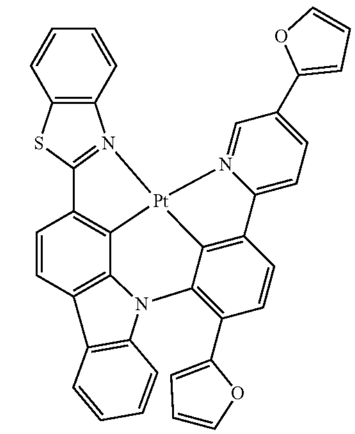
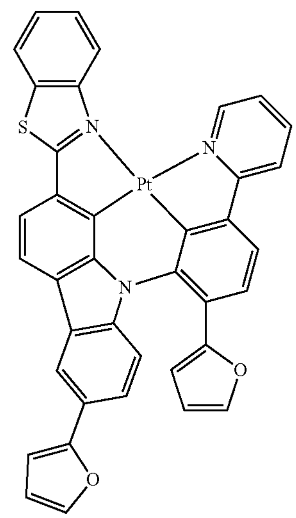
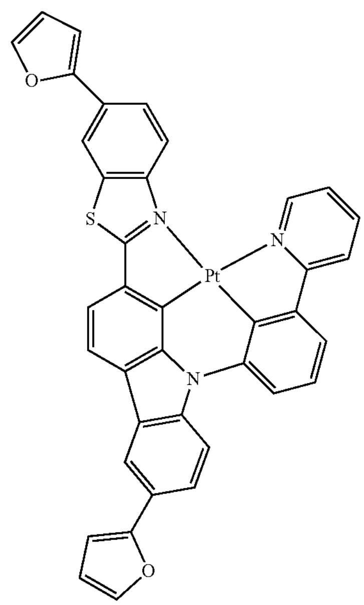
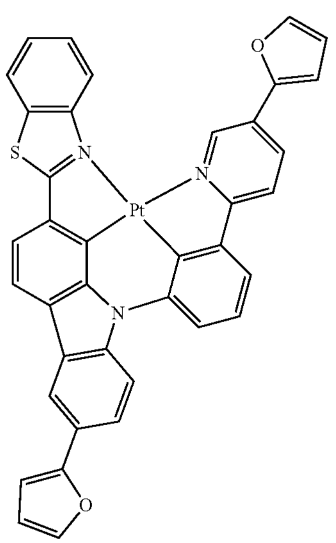
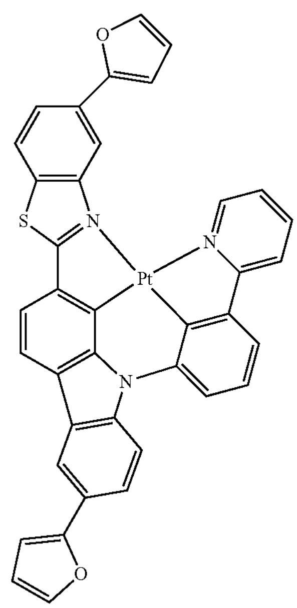

-continued
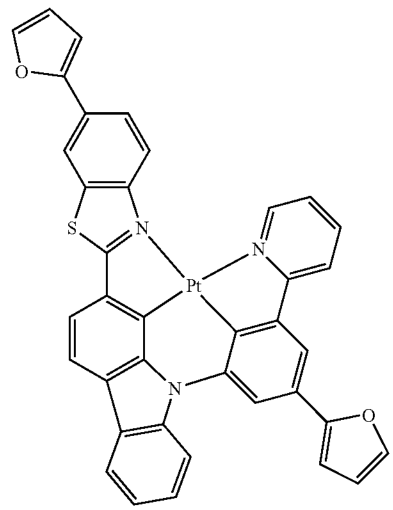
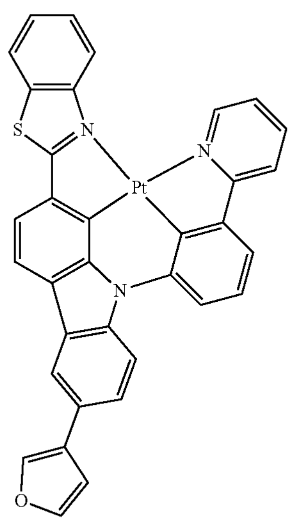
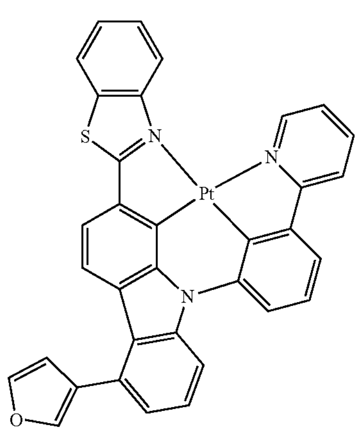
-continued
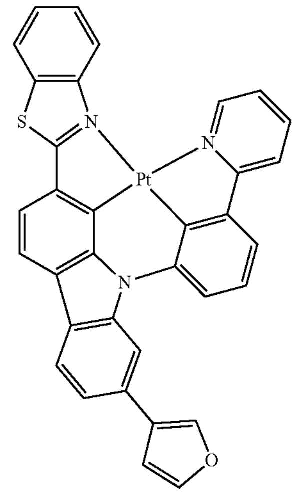
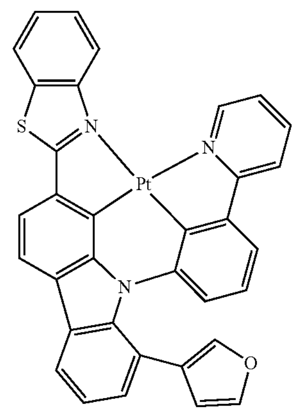
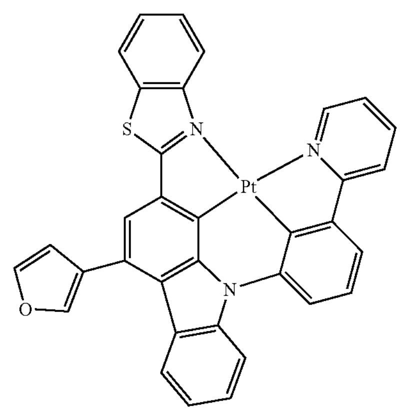
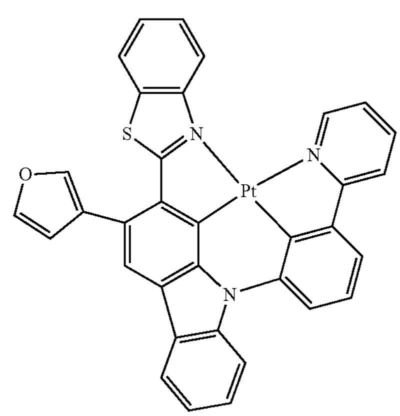

-continued
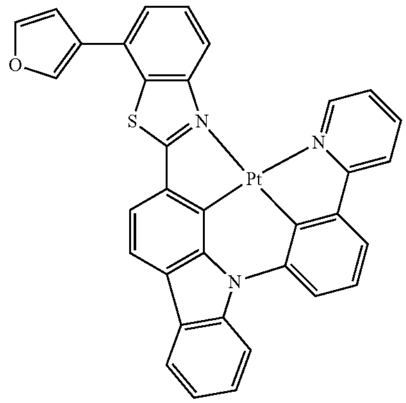
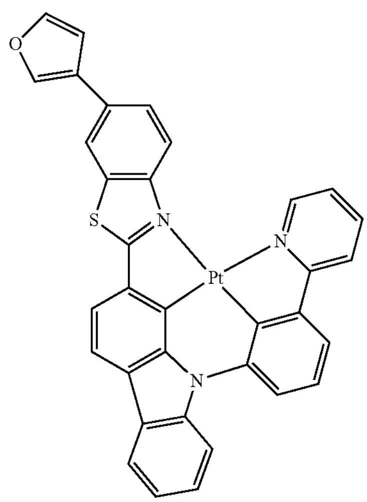
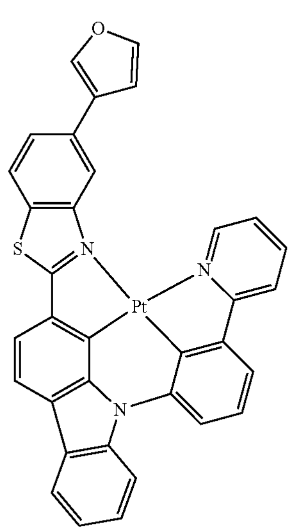
-continued
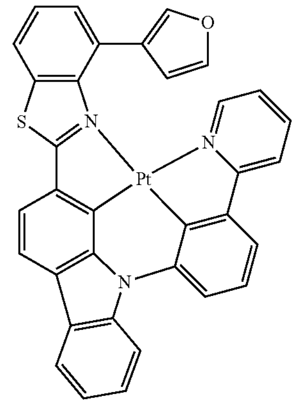
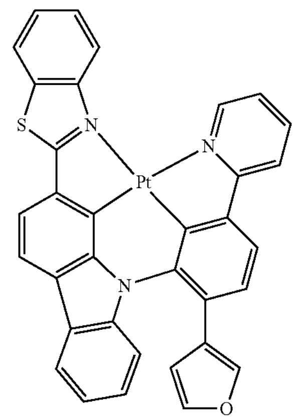
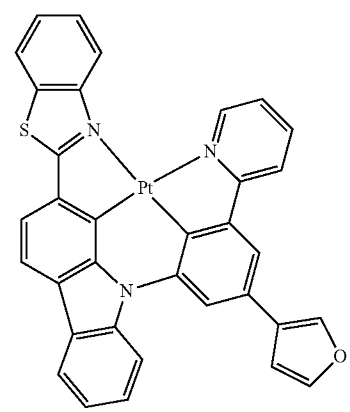
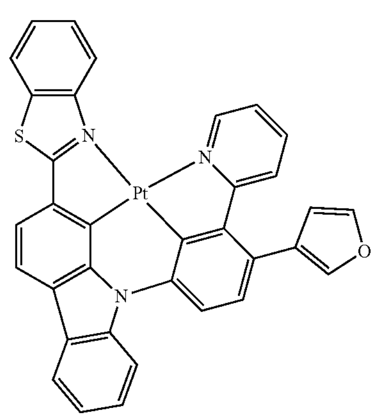

-continued
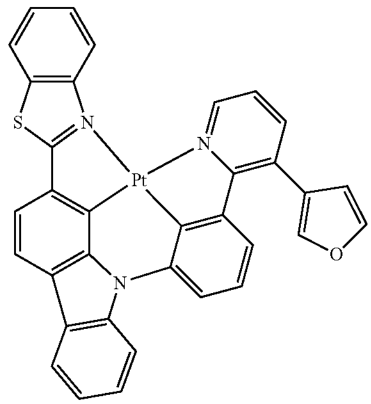
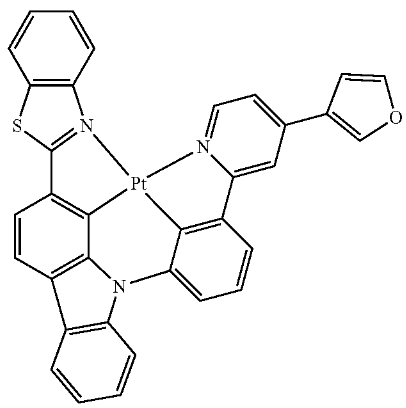
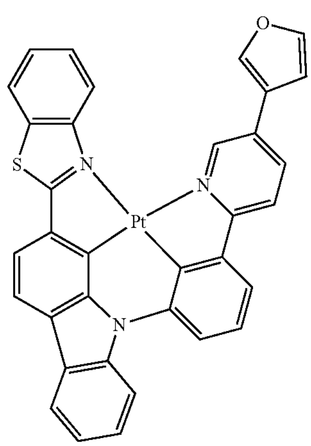
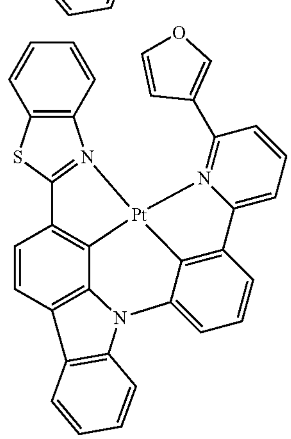
-continued
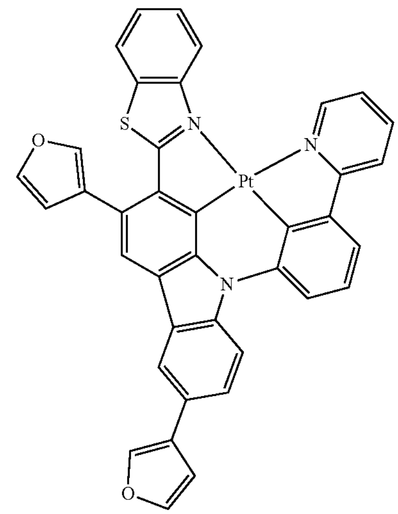
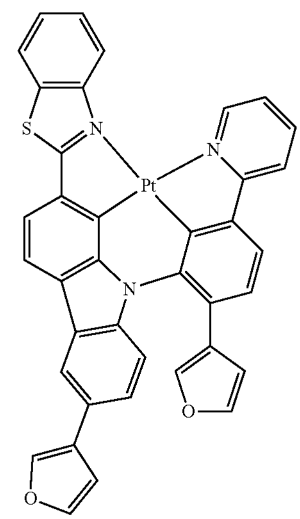
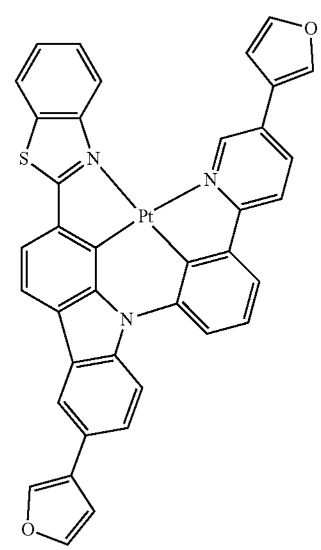

-continued
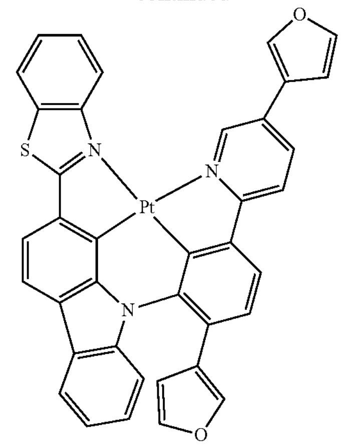
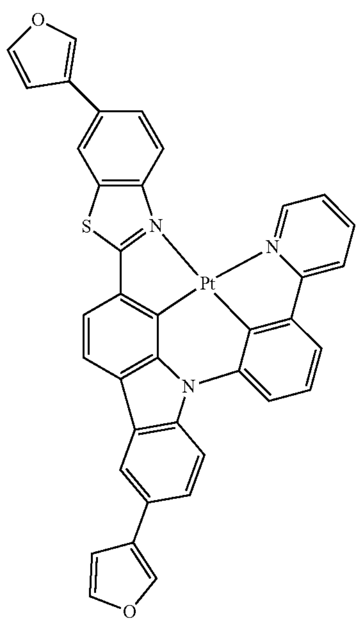
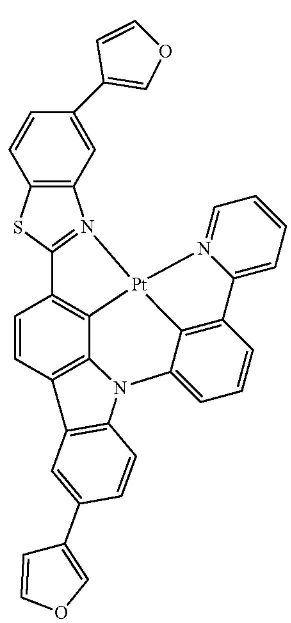
-continued
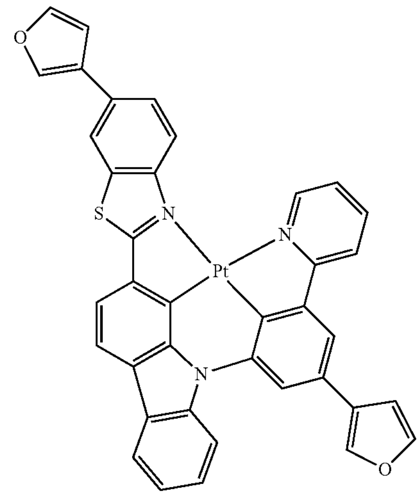
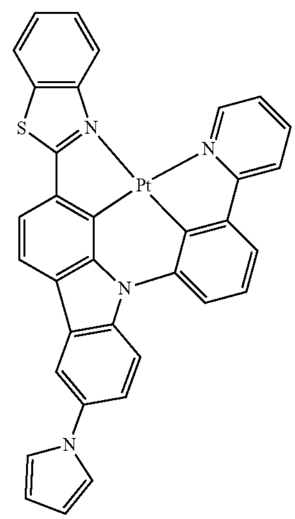
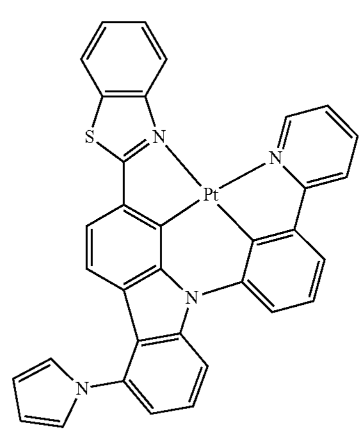

-continued
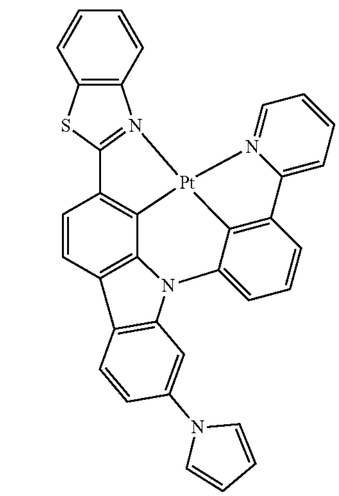
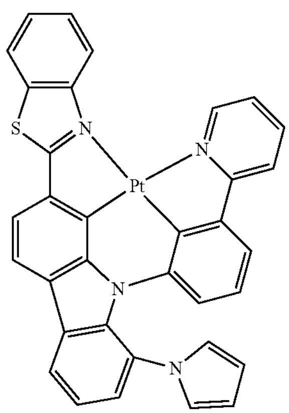
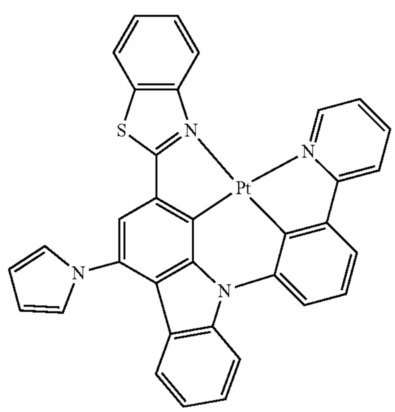
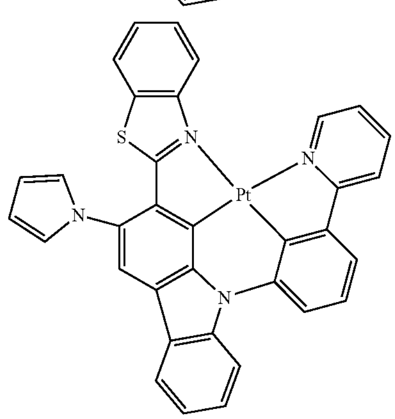
-continued
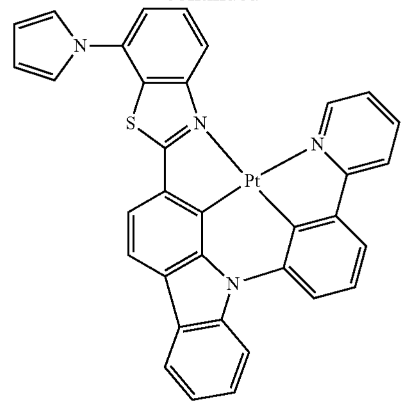
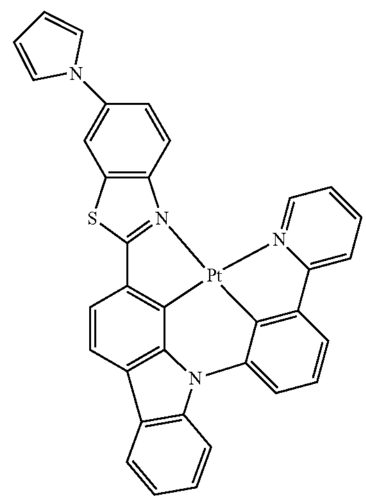
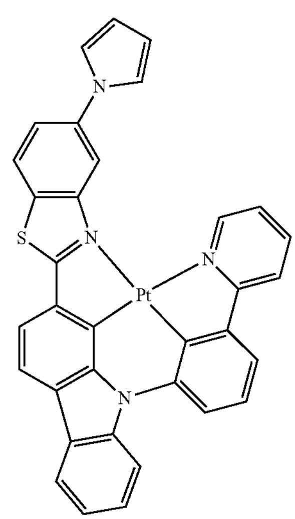

-continued
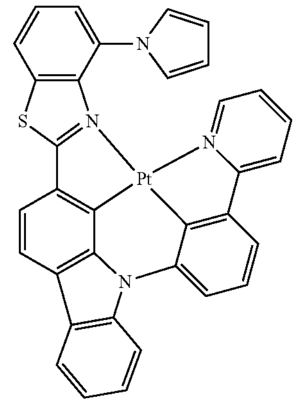
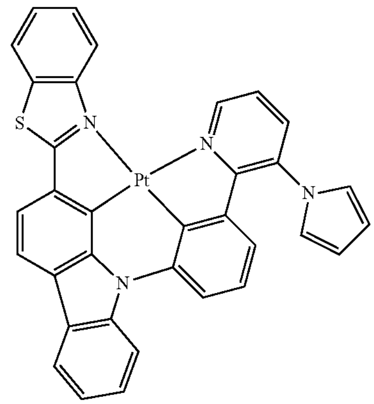
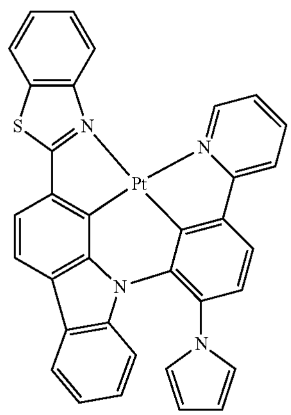
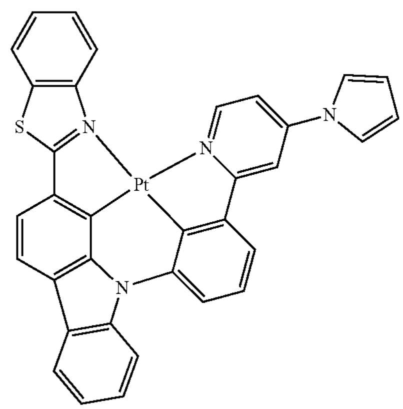
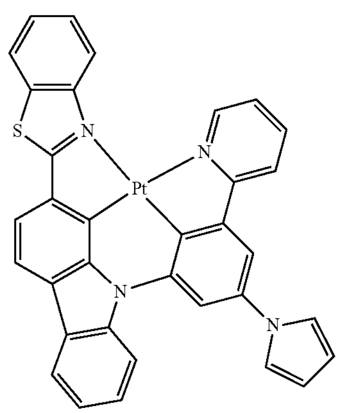
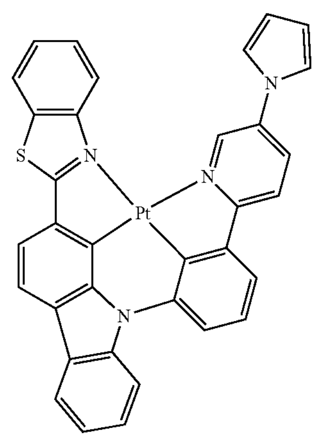
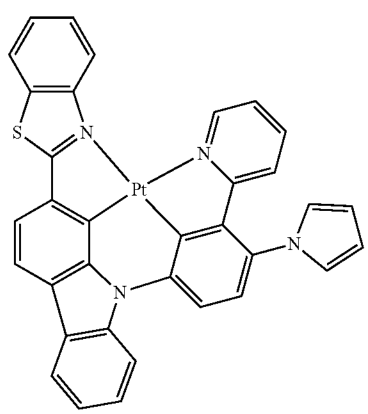
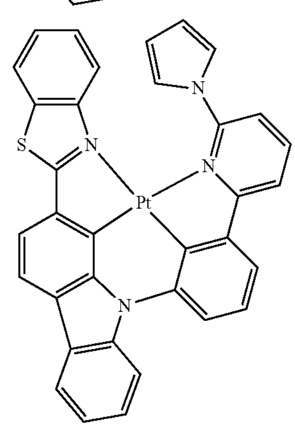

-continued
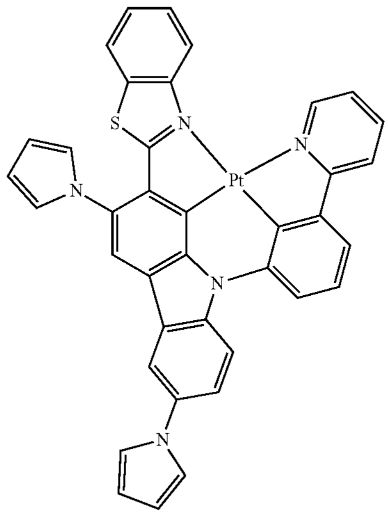
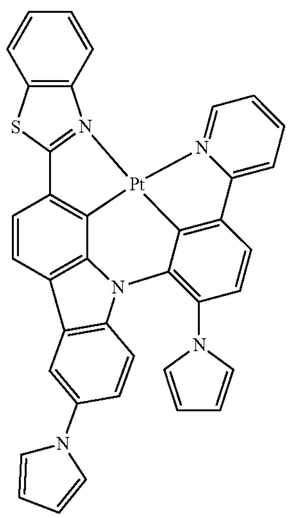
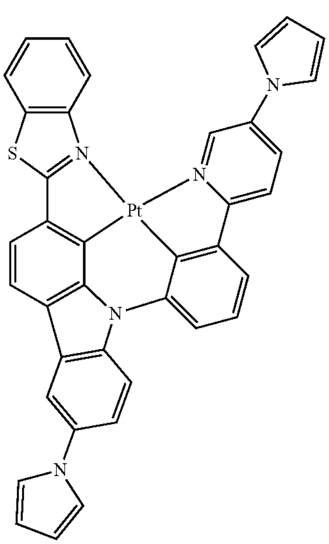
-continued
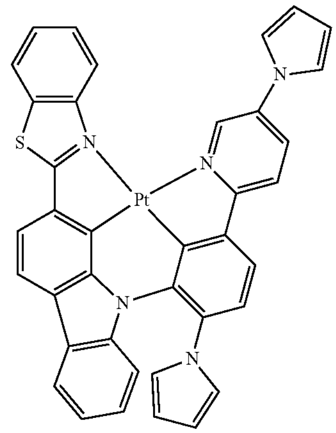
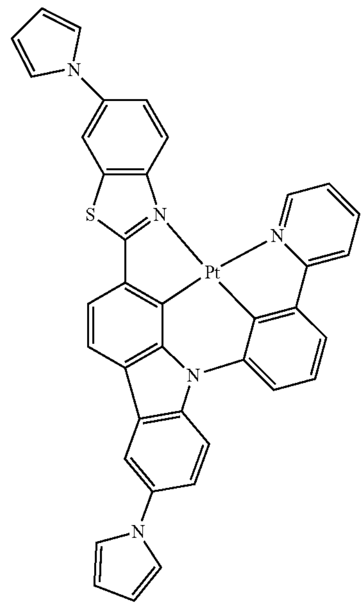
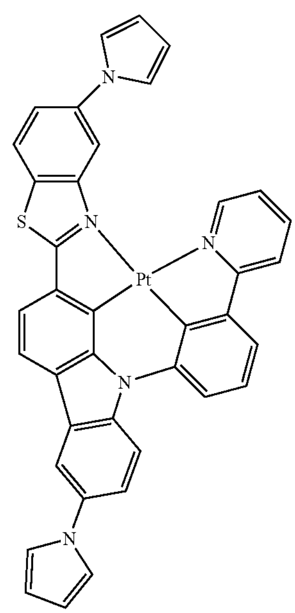

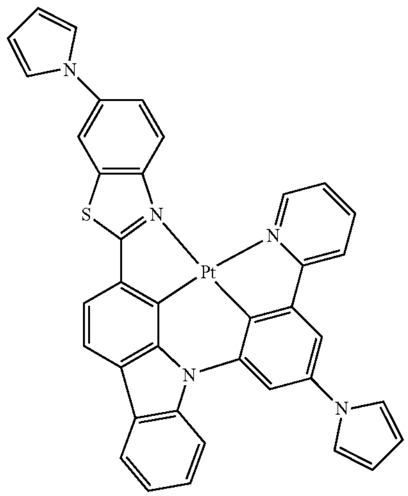
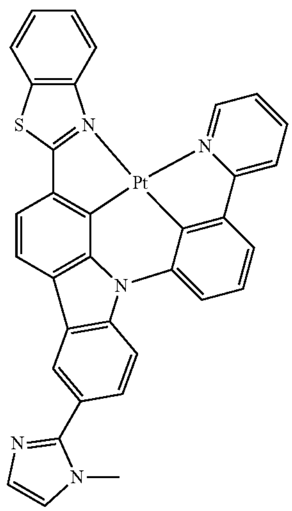
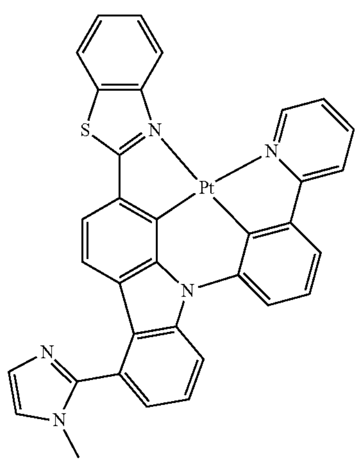
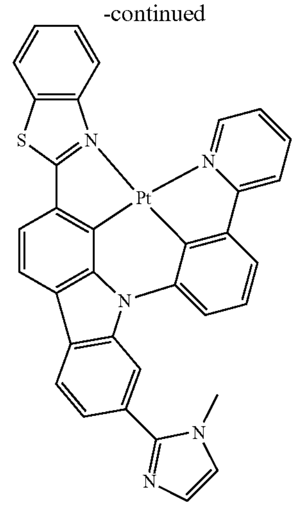
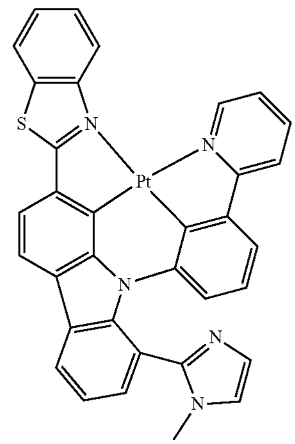
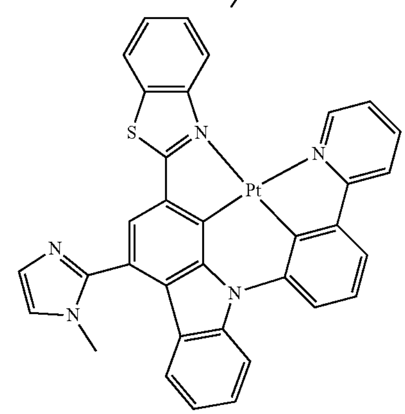
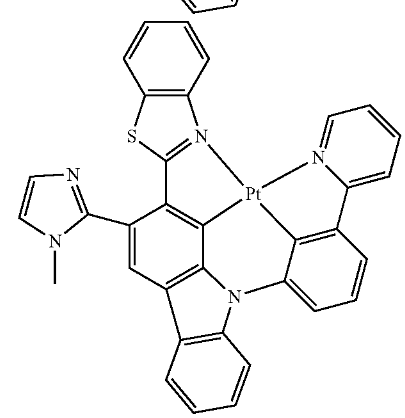

-continued
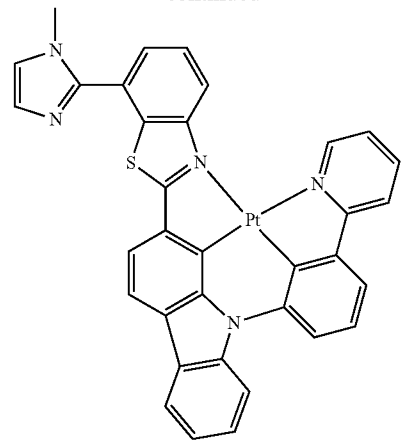
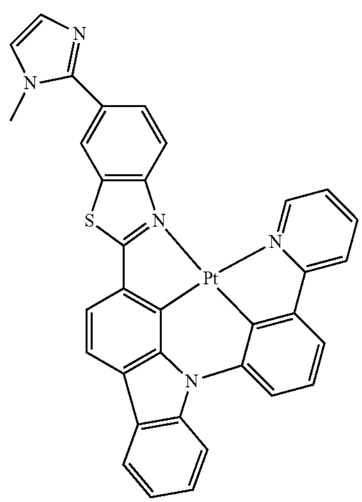
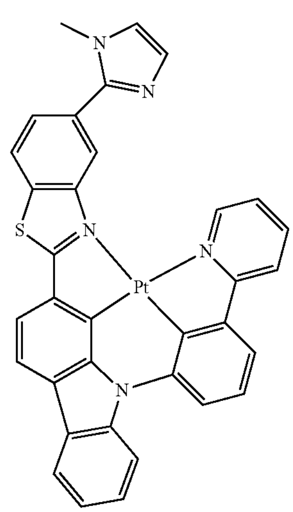
-continued
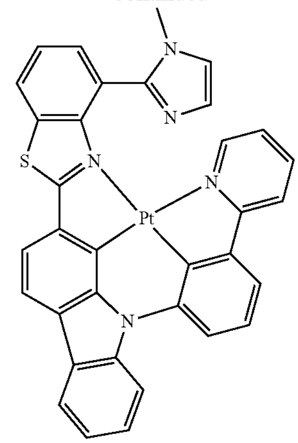
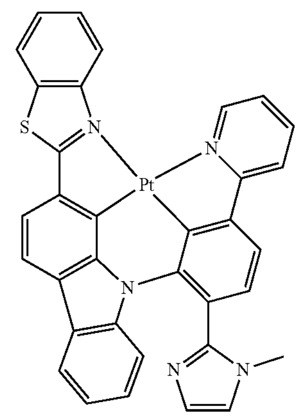
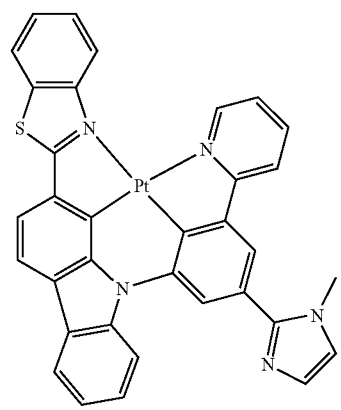
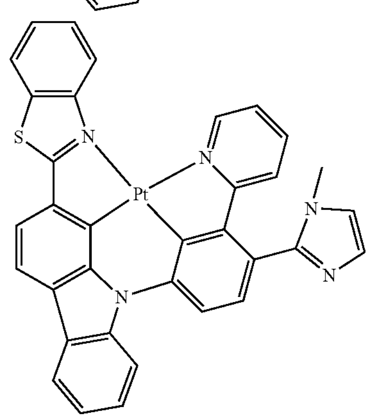

-continued
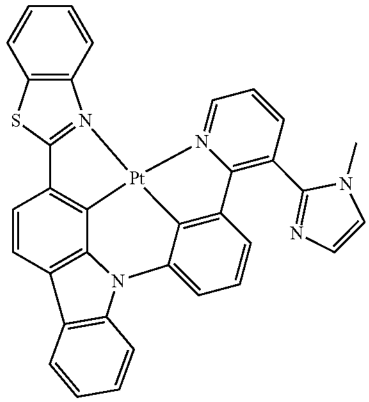
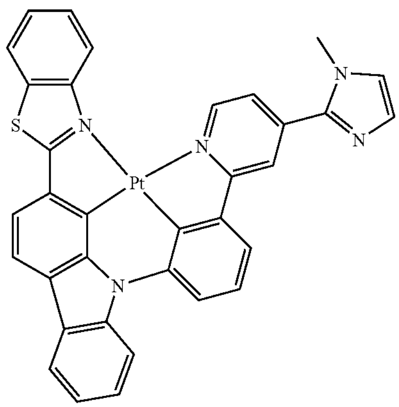
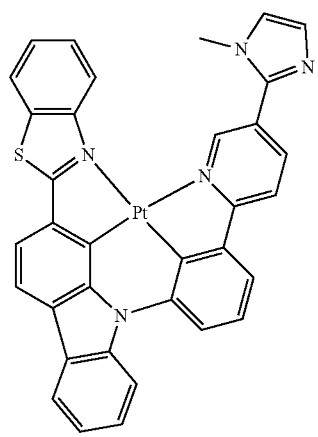
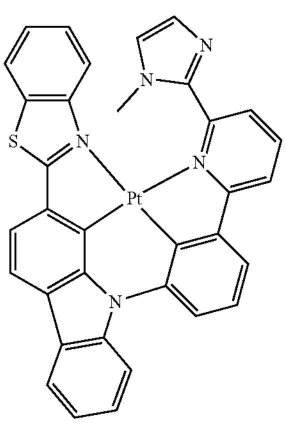
-continued
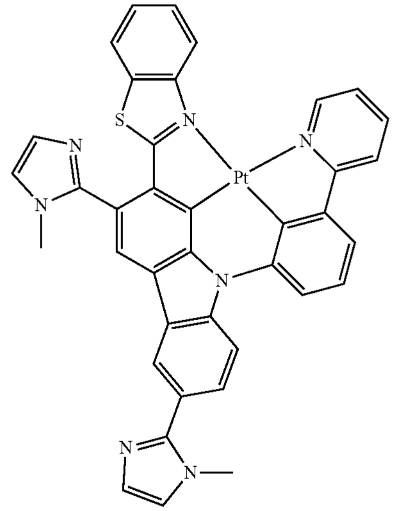
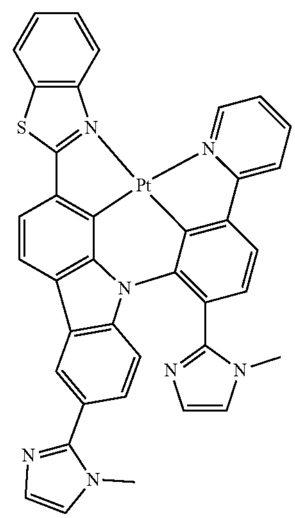
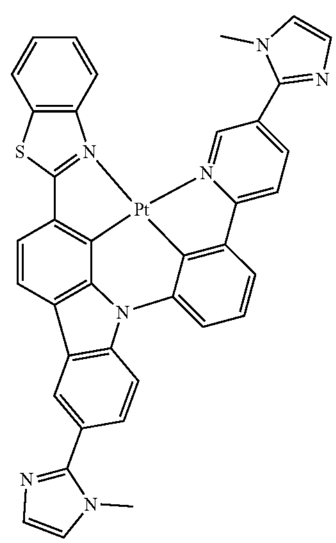

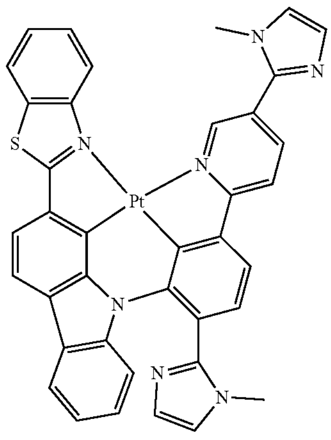
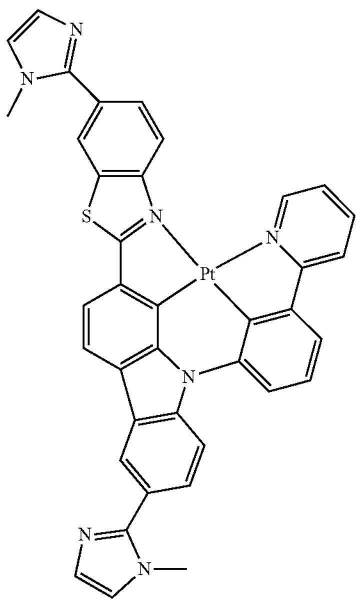
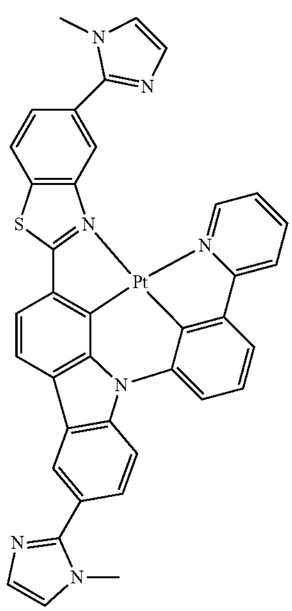
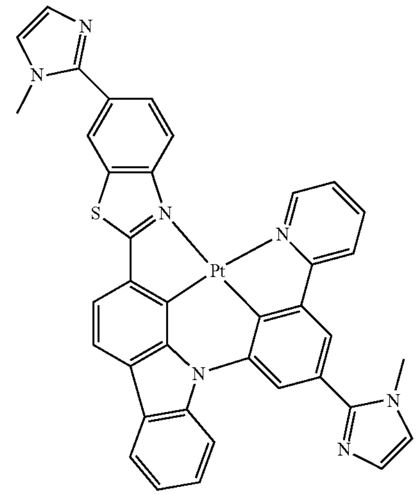
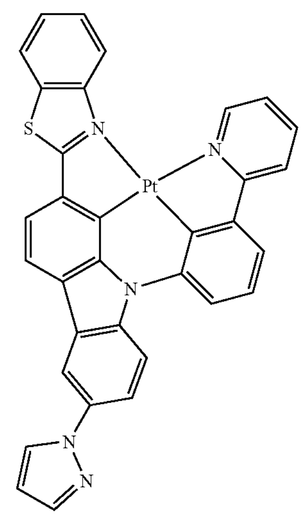
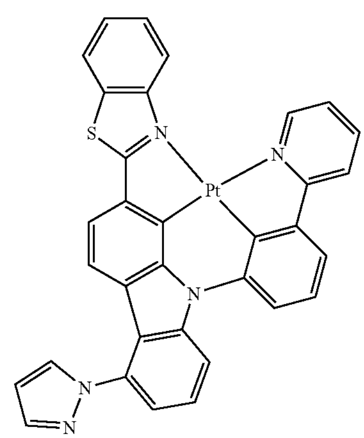

-continued
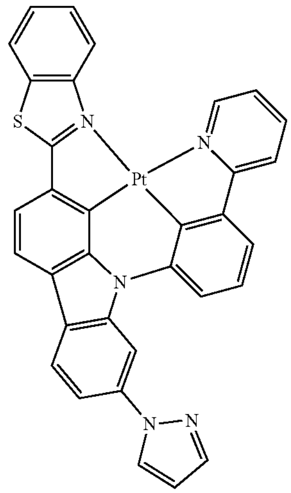
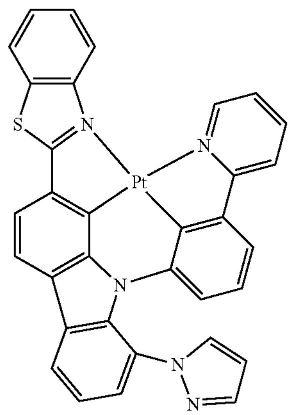
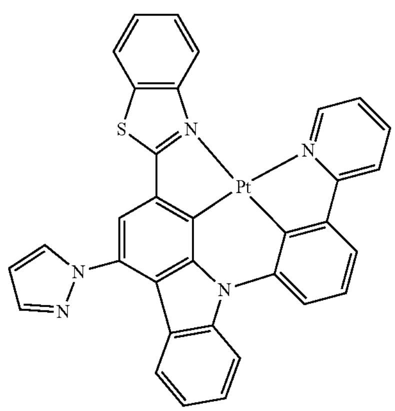
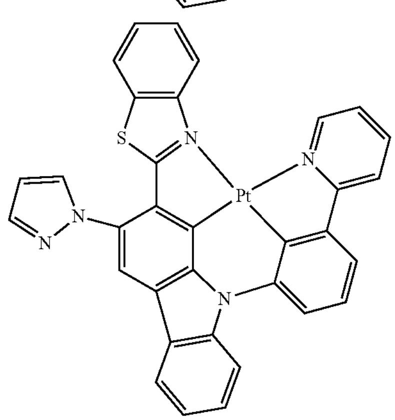
-continued
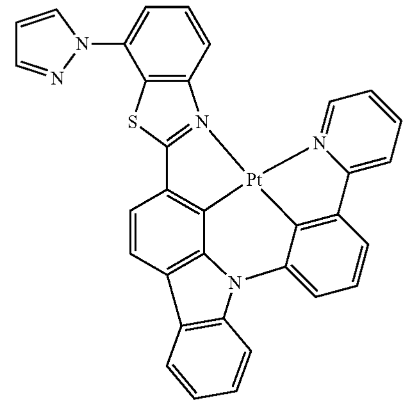
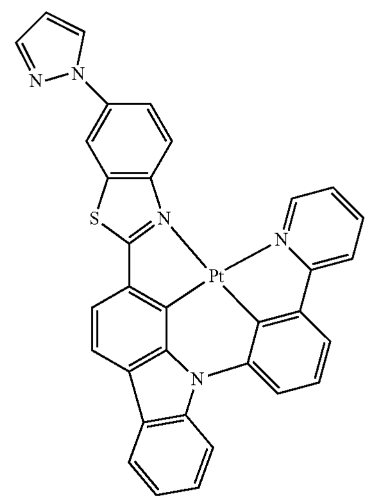
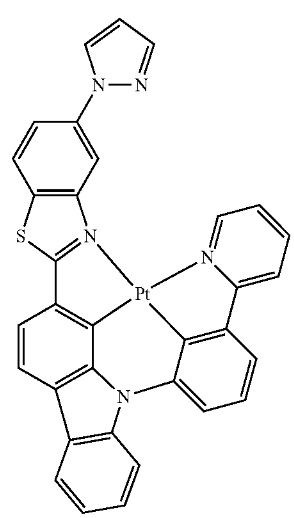

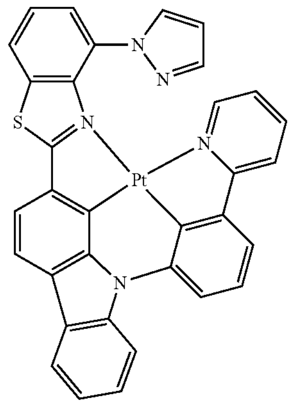
N
N
S
N
N
Pt
N
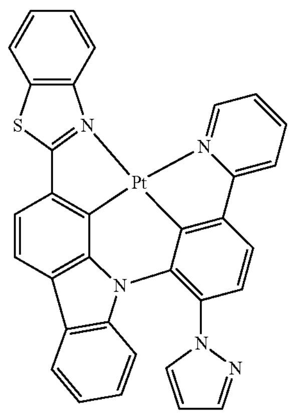
S
N
N
Pt
N
N
N
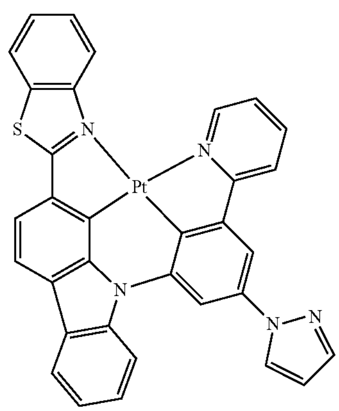
S
N
N
Pt
N
N
N
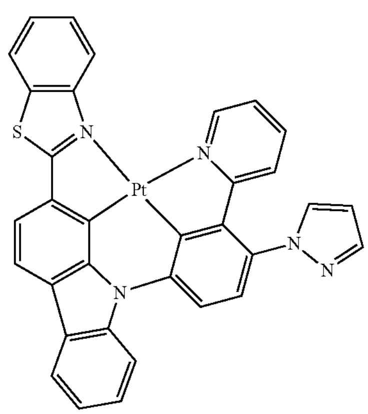
S
N
N
Pt
N
N
N
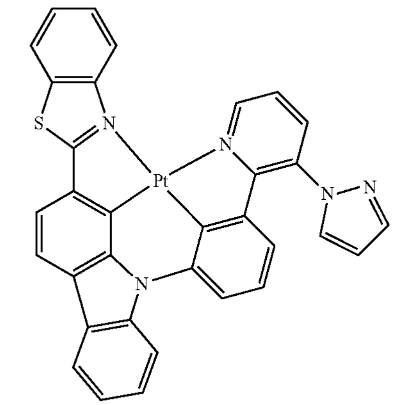
S
N
N
Pt
N
N
N
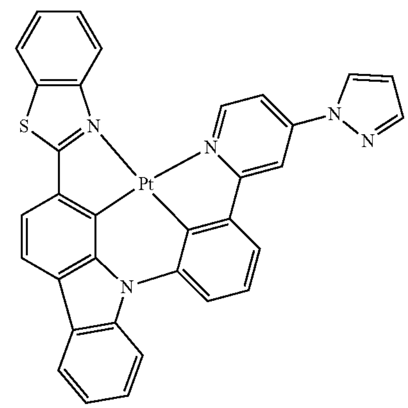
S
N
N
Pt
N
N
N
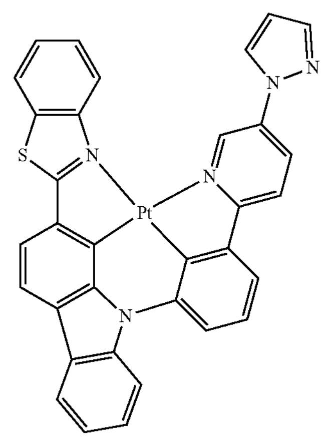
N
N
S
N
N
Pt
N
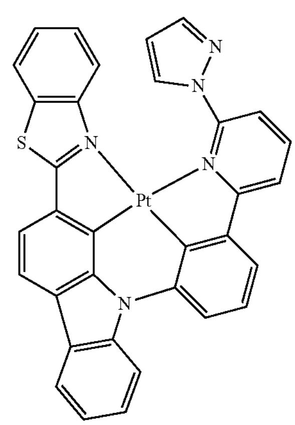
N
N
S
N
N
Pt
N -continued
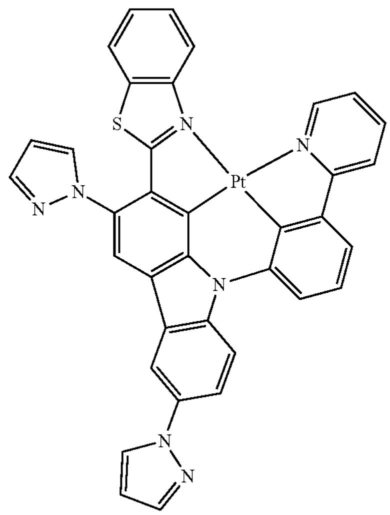
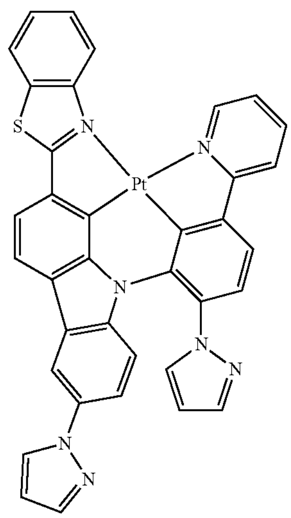
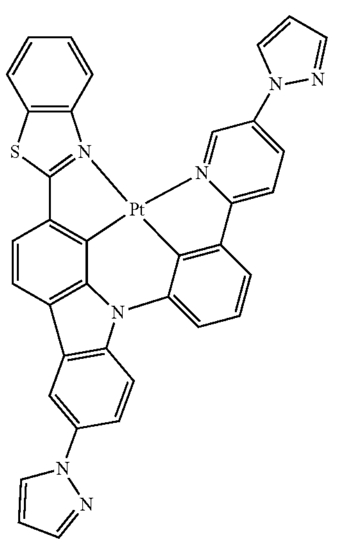
-continued
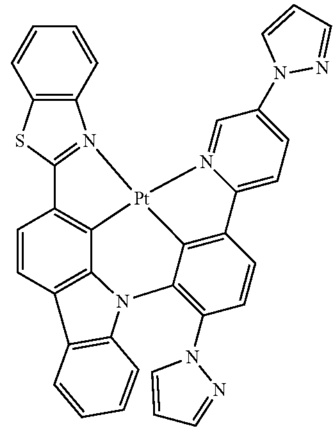
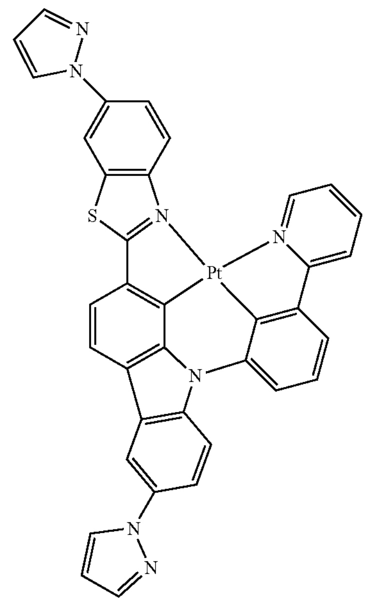
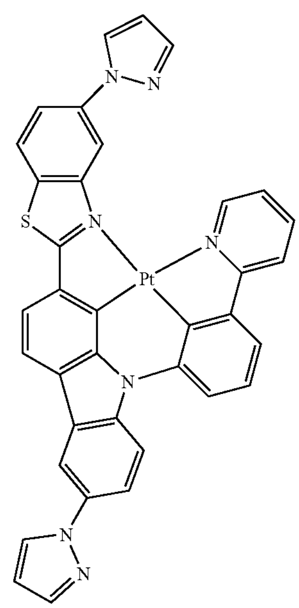

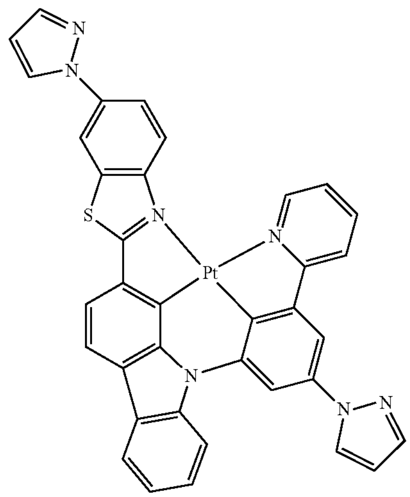
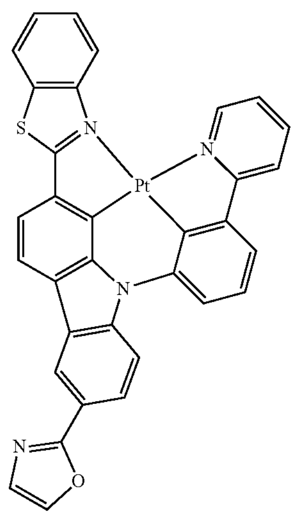
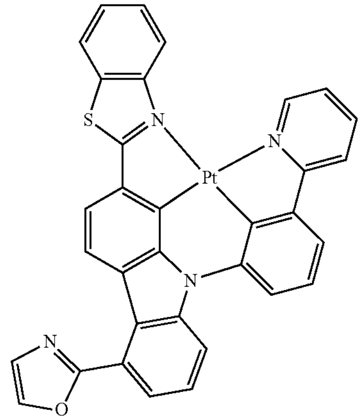
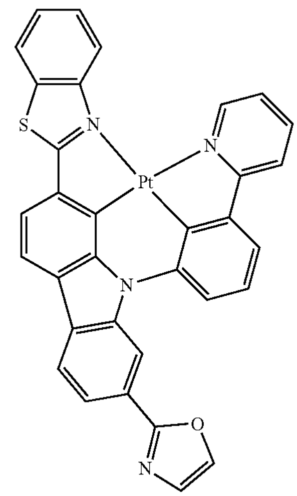
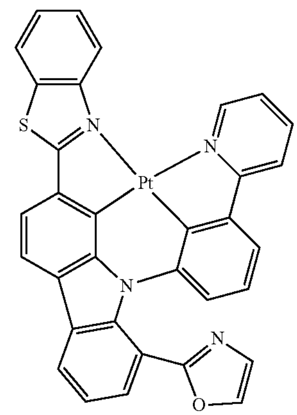
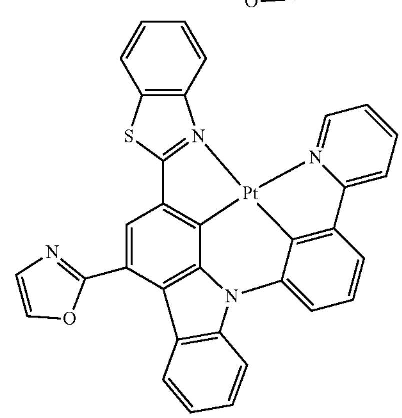
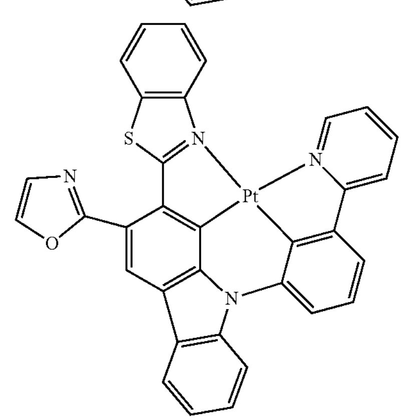

-continued
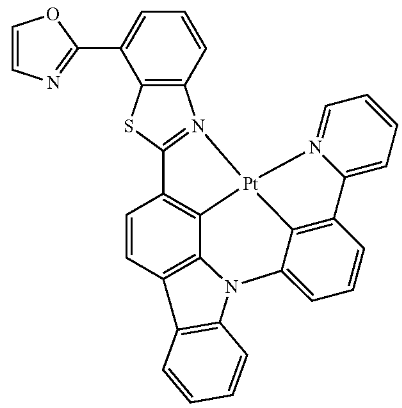
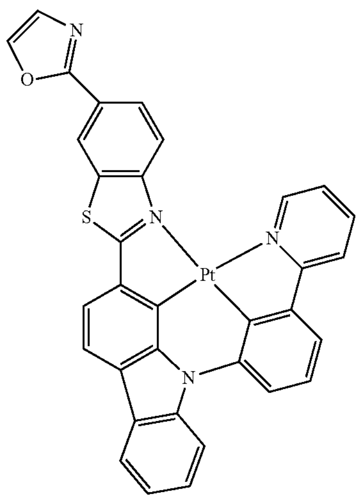
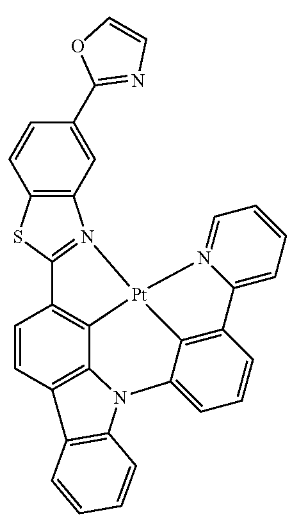
-continued
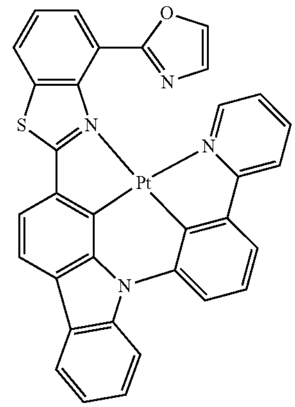
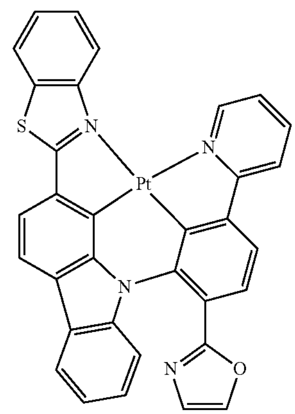
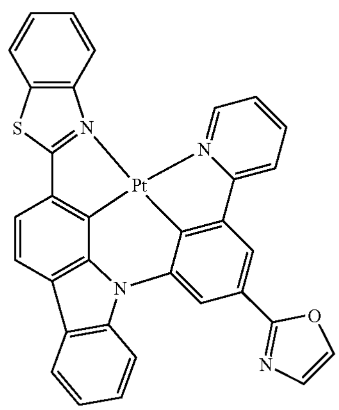
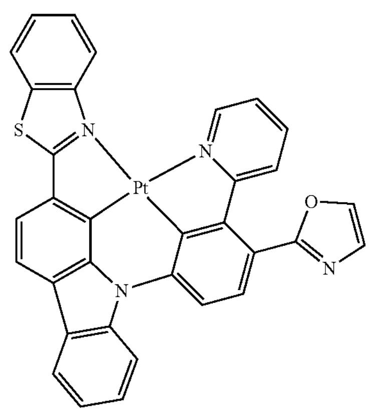

-continued
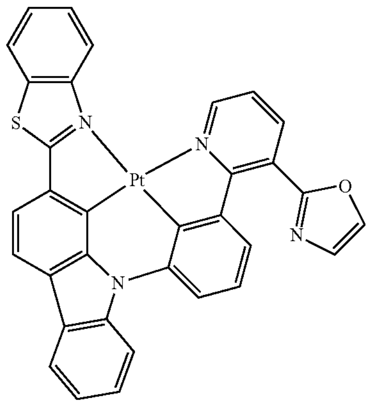
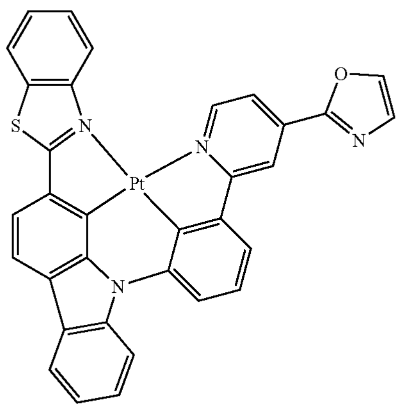
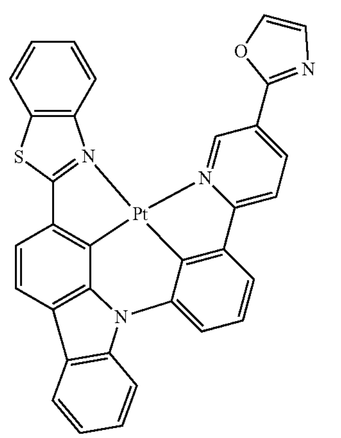
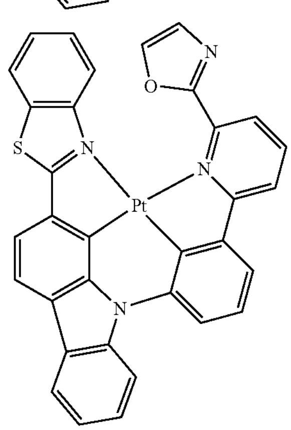
-continued
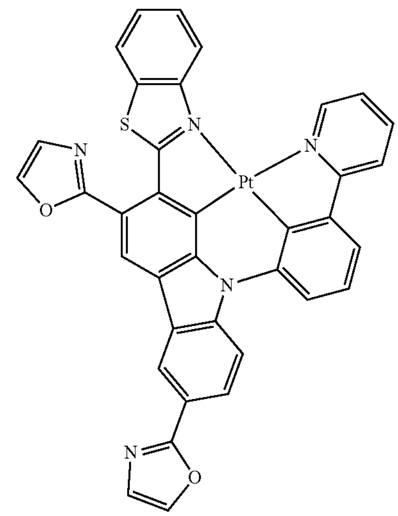
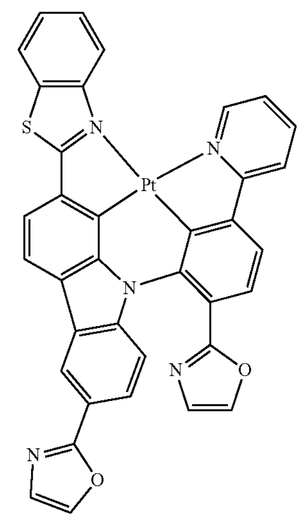
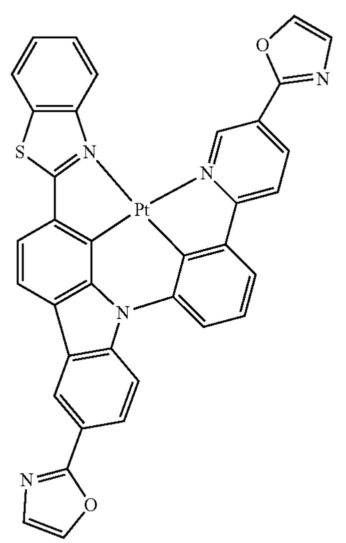

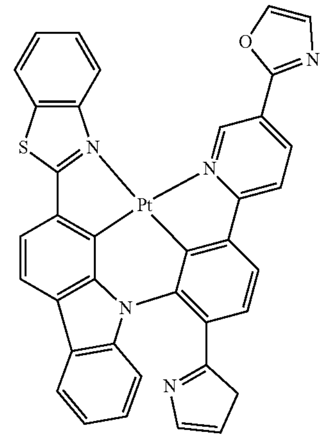
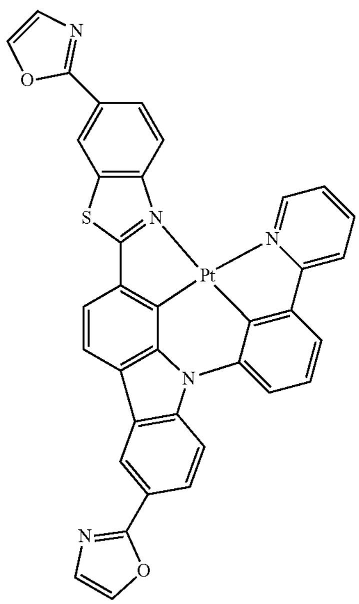
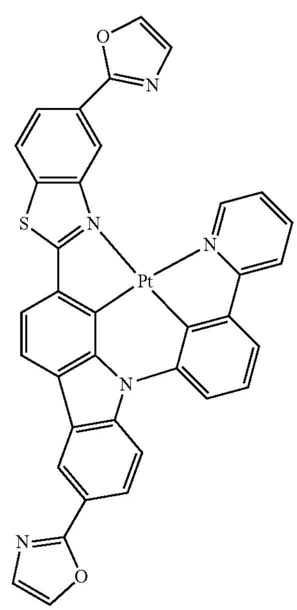
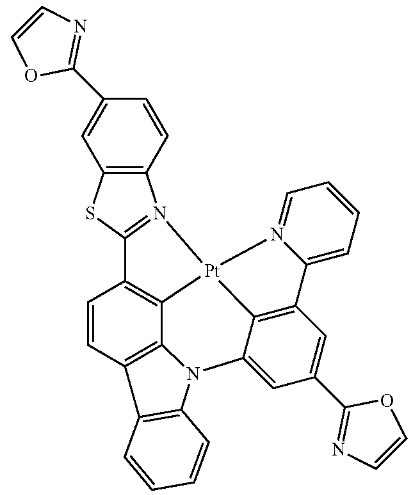
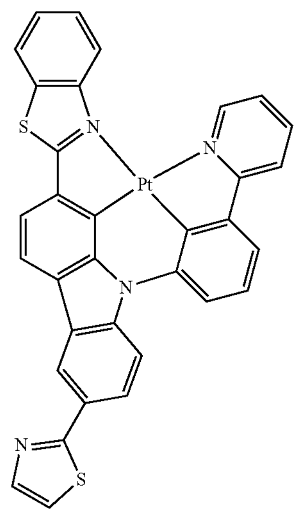
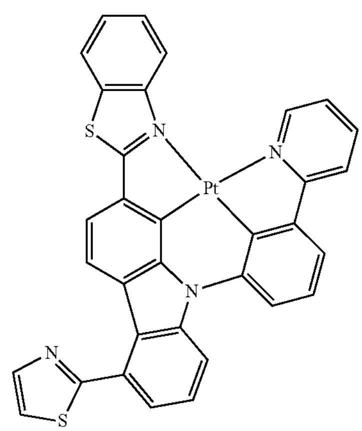

-continued
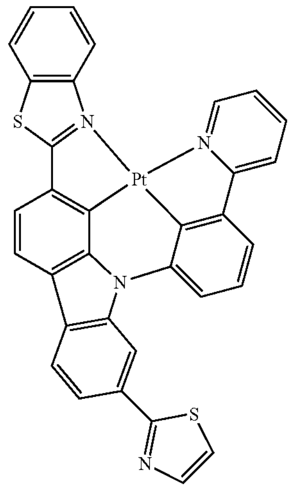
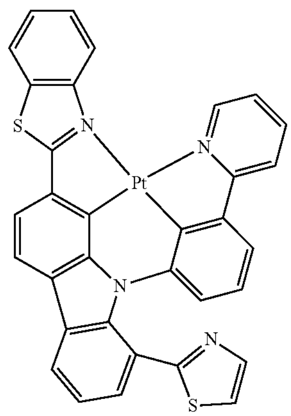
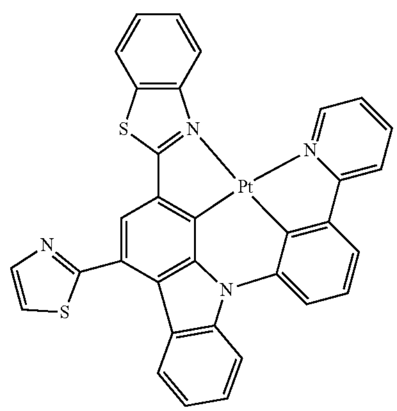
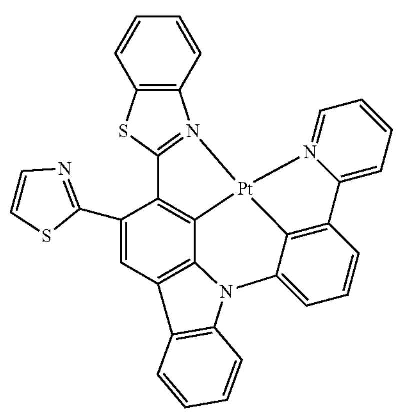
-continued
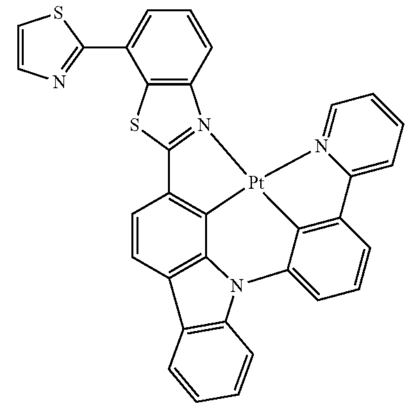
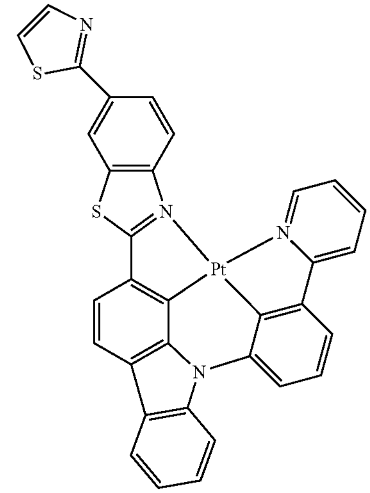
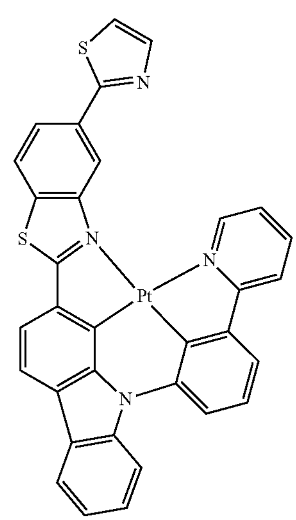

-continued
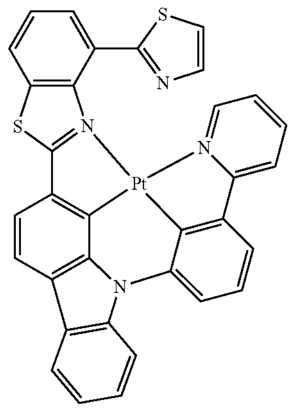
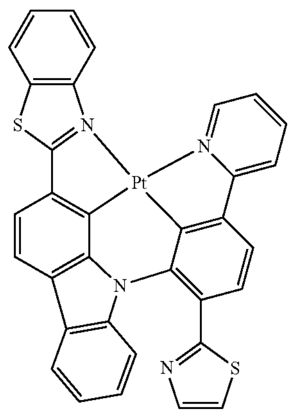
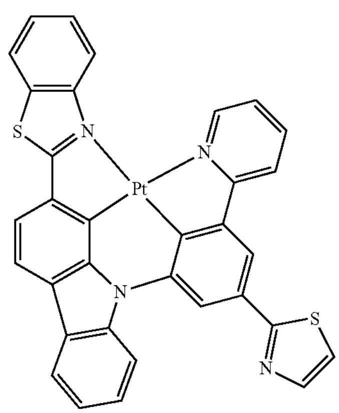
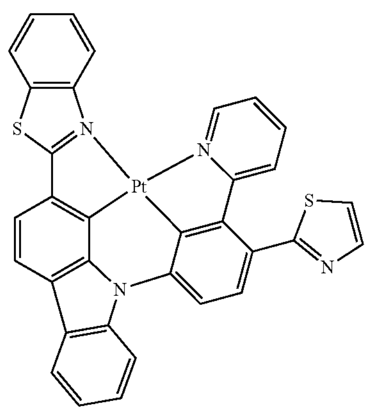
-continued
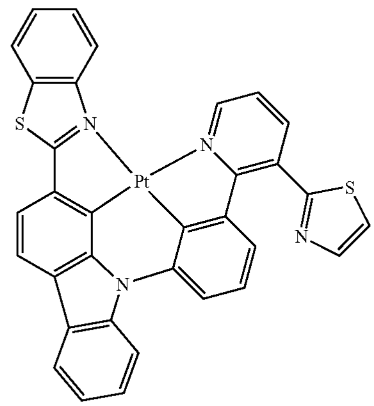
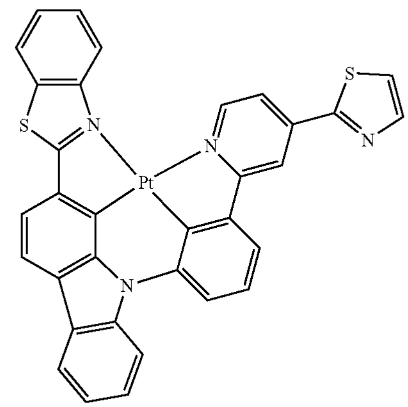
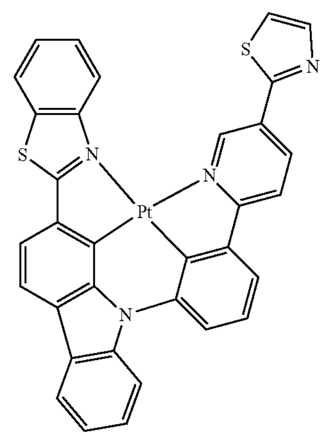
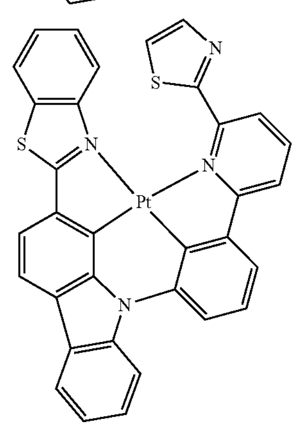

-continued
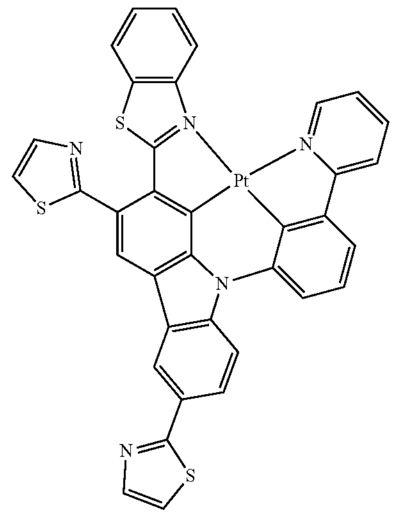
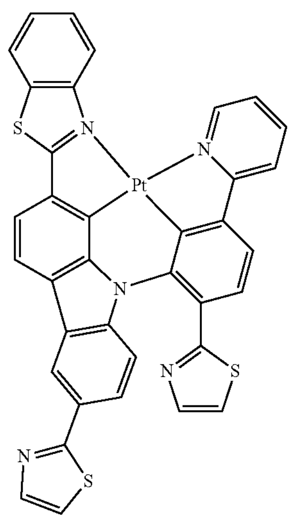
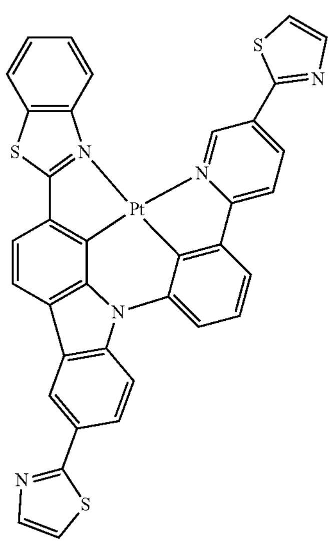
-continued
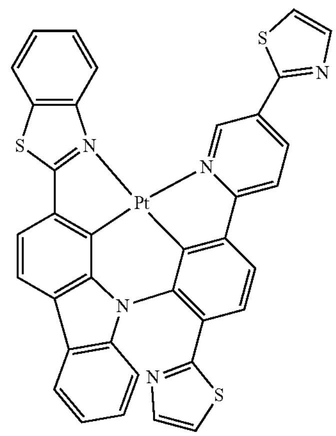
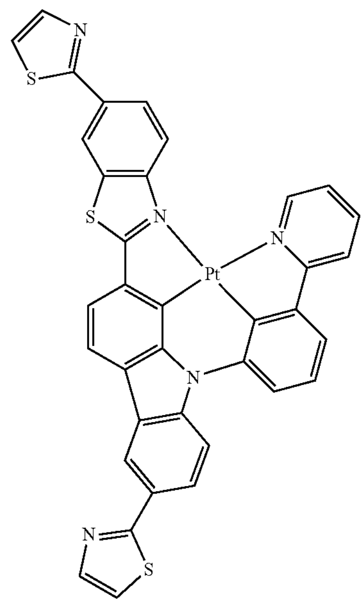
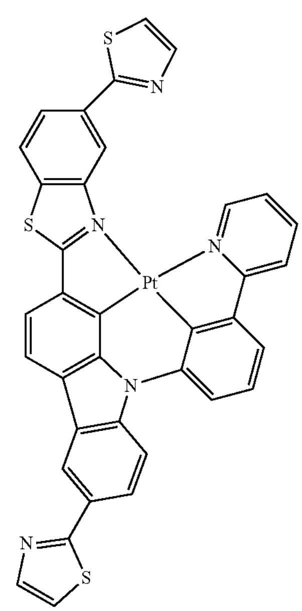

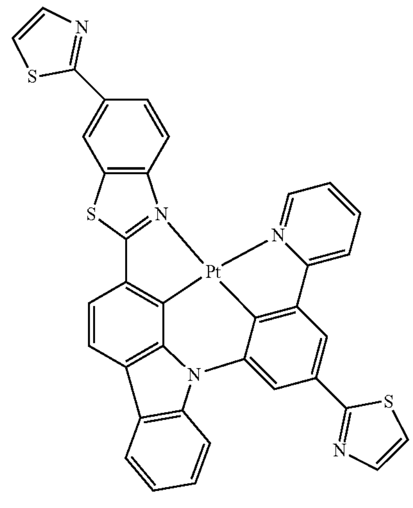
N
S
S
N
Pt
N
N
S
N
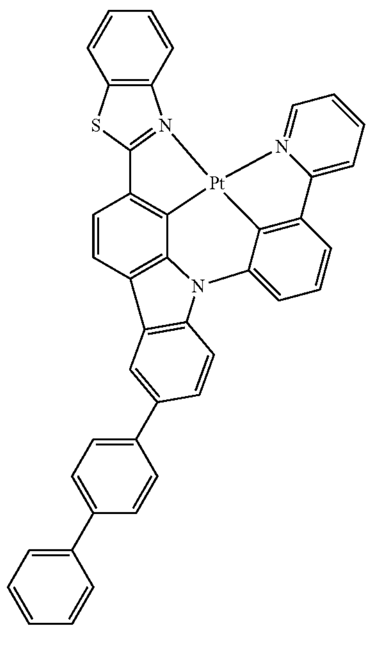
S
N
Pt
N
N
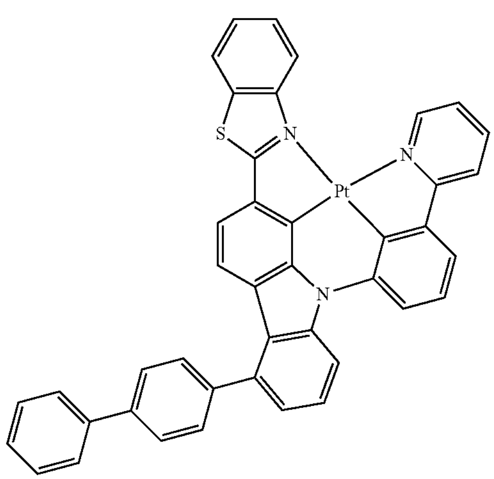
S
N
Pt
N
N
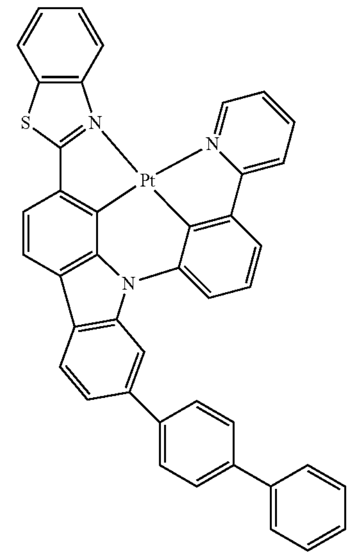
S
N
N
Pt
N
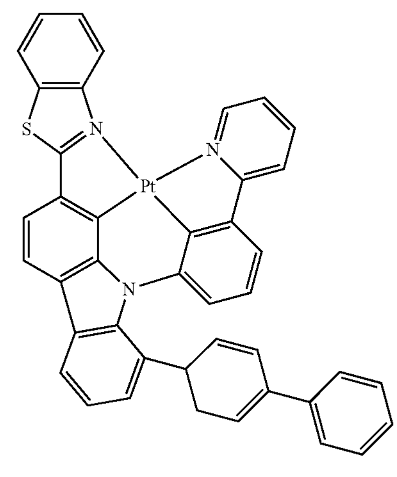
S
N
N
Pt
N
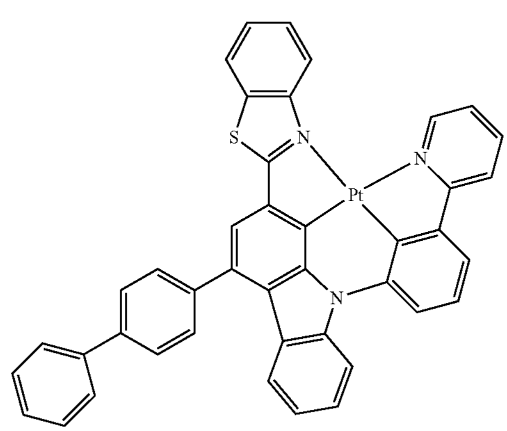
S
N
N
Pt
N

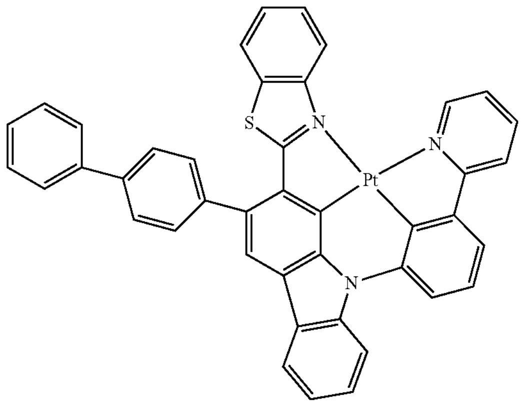
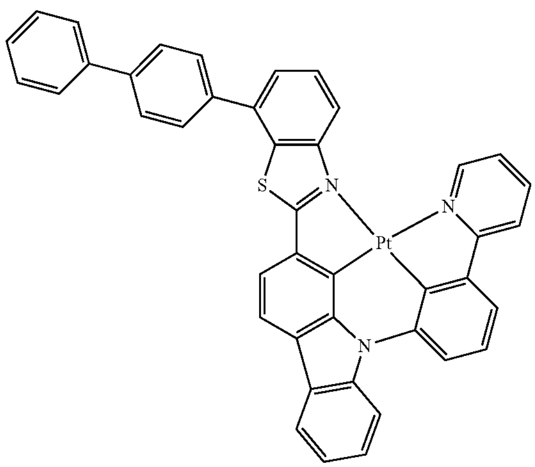
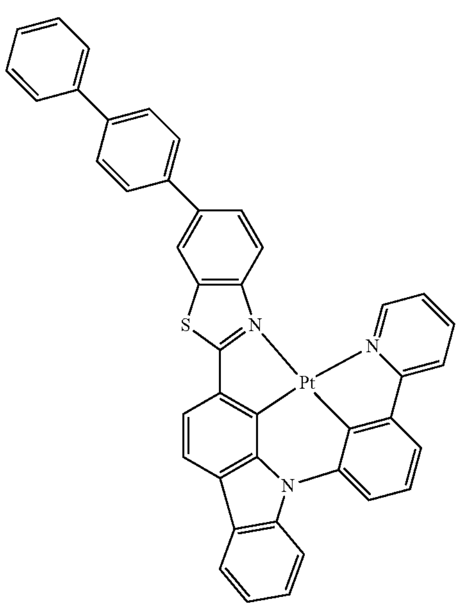
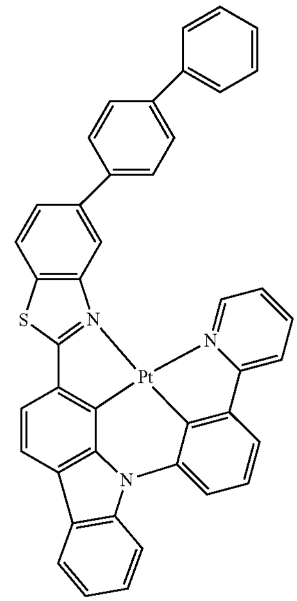
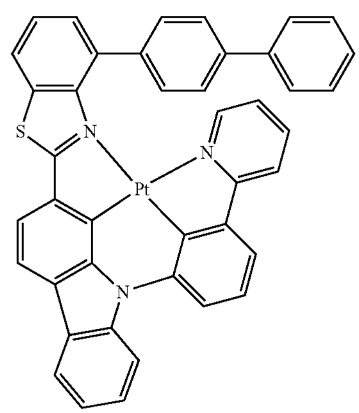
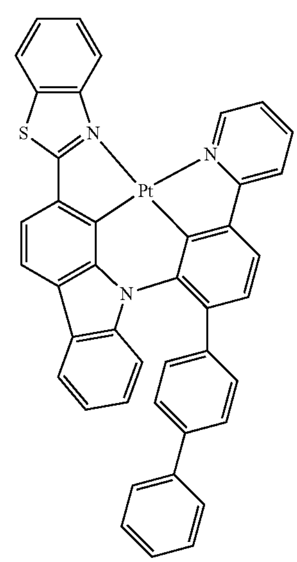

-continued
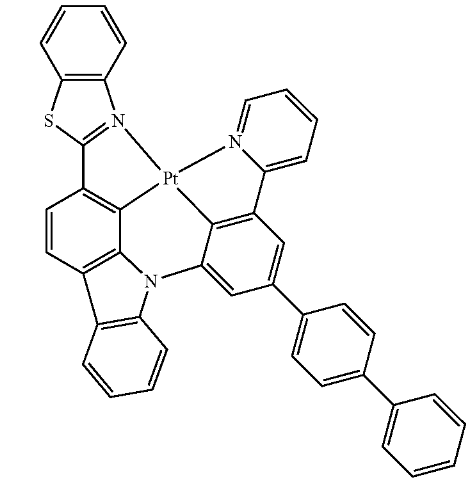
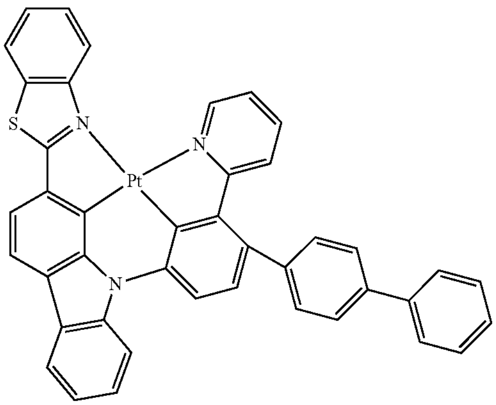
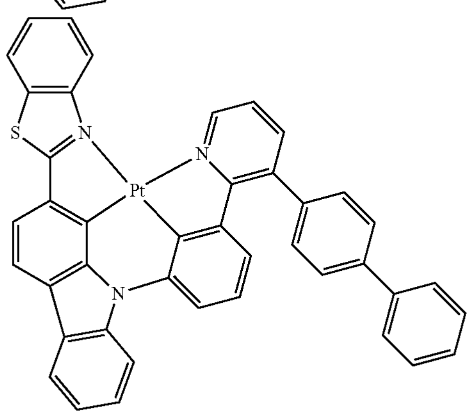
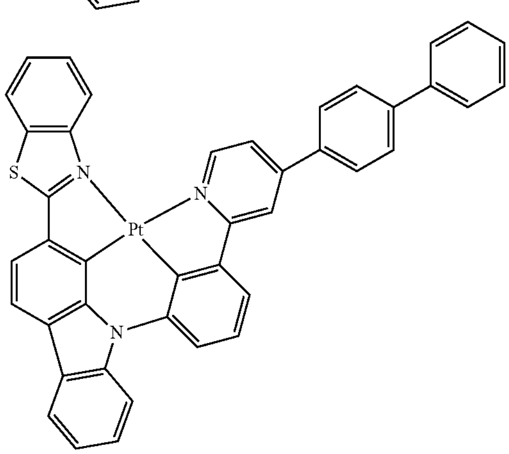
-continued
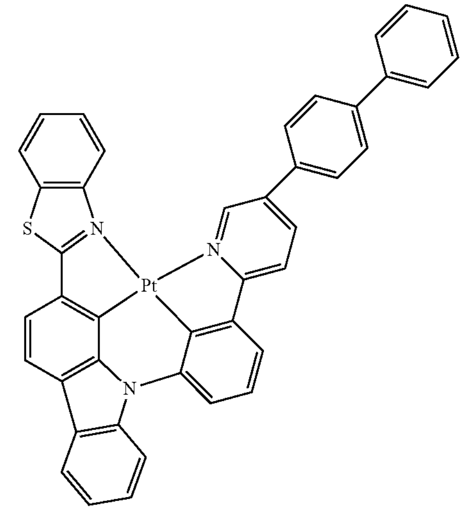
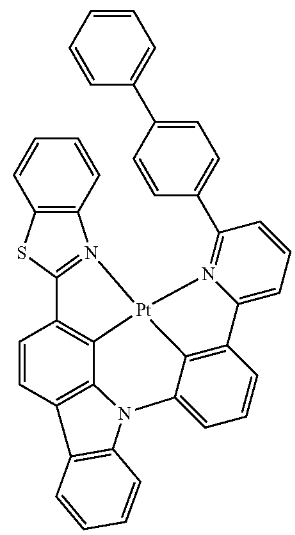
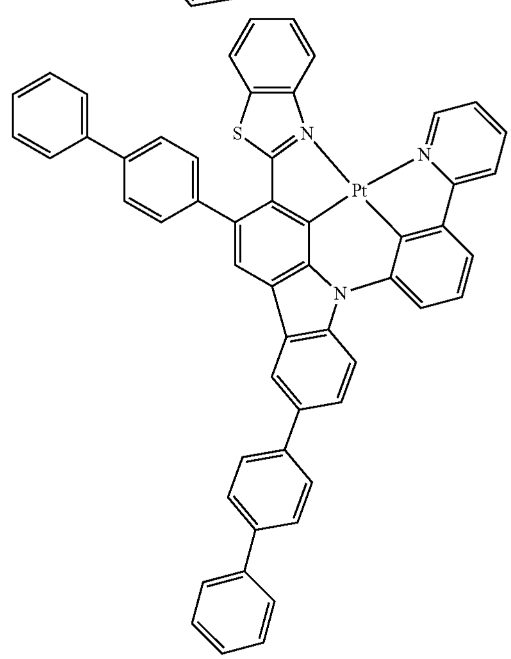

-continued
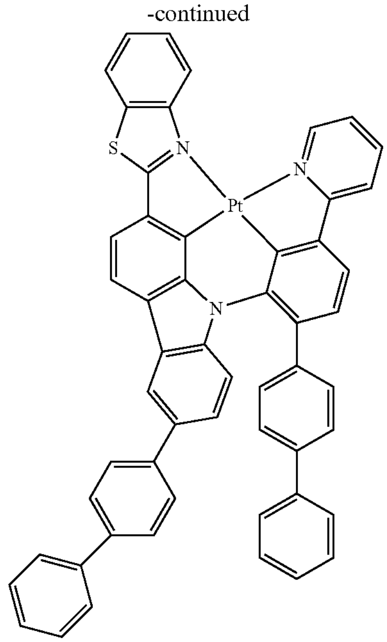
-continued
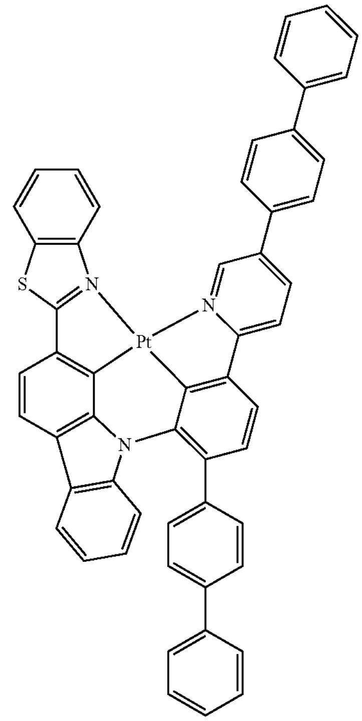
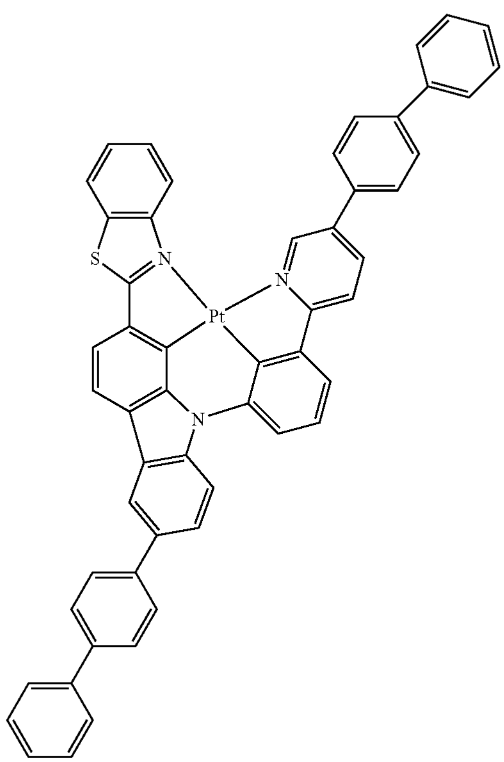
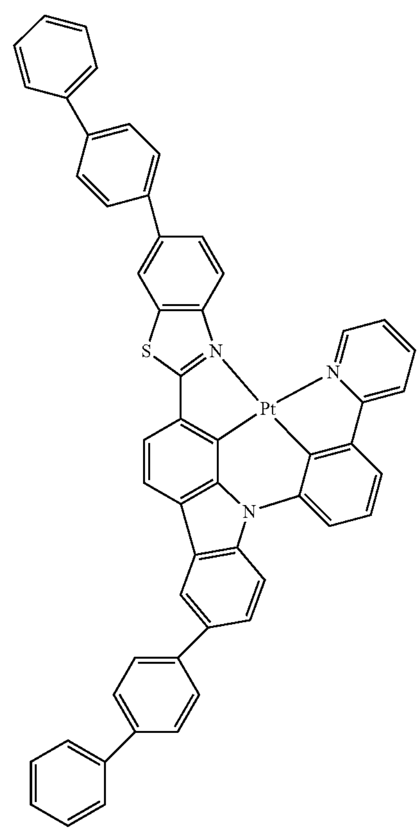

-continued
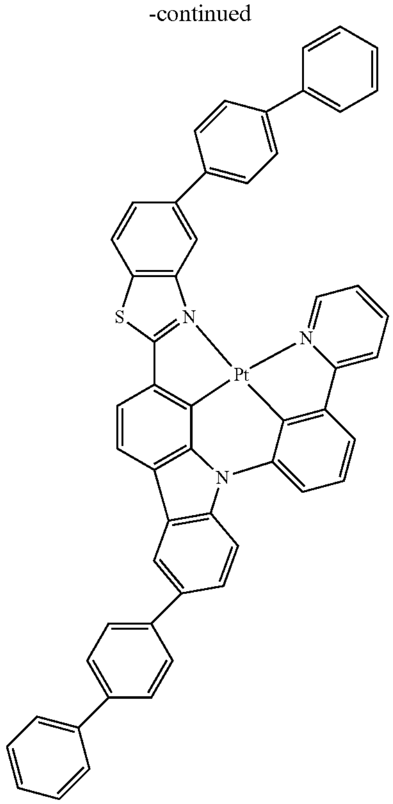
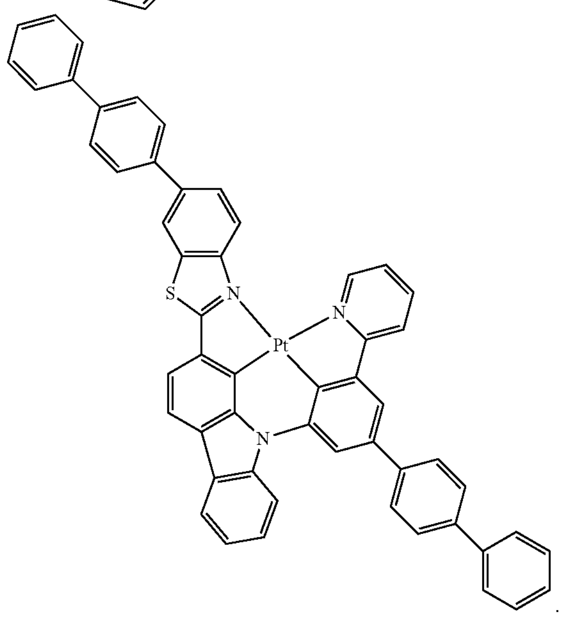
12. The complex of claim 1, wherein the complex has the following structure:
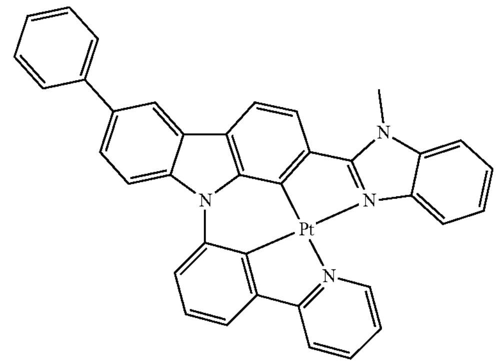
13. A complex having the following structure:
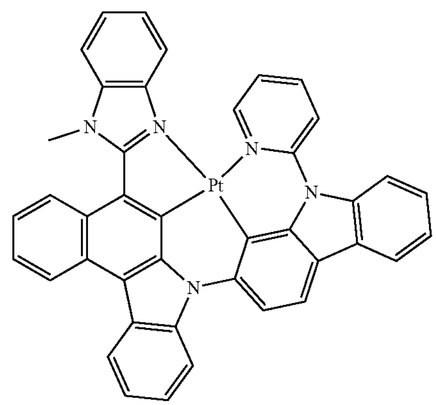
14. A light emitting device comprising the complex of claim 1.
15. A complex having the following structure:
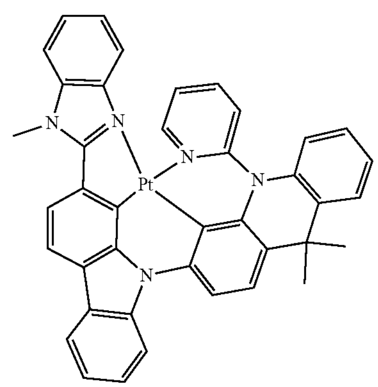
* * * * *